US011711969B2

(12) United States Patent
Boudreault et al.

(10) Patent No.: US 11,711,969 B2
(45) **Date of Patent: *Jul. 25, 2023**

(54) ORGANIC ELECTROLUMINESCENT MATERIALS AND DEVICES

(71) Applicant: UNIVERSAL DISPLAY CORPORATION, Ewing, NJ (US)

(72) Inventors: Pierre-Luc T. Boudreault, Pennington, NJ (US); Bert Alleyne, Newtown, PA (US); Zhiqiang Ji, Chalfont, PA (US)

(73) Assignee: Universal Display Corporation, Ewing, NJ (US)

( * ) Notice: Subject to any disclaimer, the term of this patent is extended or adjusted under 35 U.S.C. 154(b) by 54 days.

This patent is subject to a terminal disclaimer.

(21) Appl. No.: 17/343,138

(22) Filed: Jun. 9, 2021

(65) Prior Publication Data

US 2022/0367821 A1 Nov. 17, 2022

Related U.S. Application Data

(63) Continuation of application No. 16/828,080, filed on Mar. 24, 2020, now Pat. No. 11,081,658, which is a (Continued)

(51) Int. Cl.
*H01L 51/00* (2006.01)
*H10K 85/30* (2023.01)

(Continued)

(52) U.S. Cl.
CPC ....... *H10K 85/342* (2023.02); *C07F 15/0033* (2013.01); *C09K 11/06* (2013.01);

(Continued)

(58) Field of Classification Search
CPC ............ H01L 51/0085; C07F 15/0033; C09K 2211/1037; C09K 2211/185
See application file for complete search history.

(56) References Cited

U.S. PATENT DOCUMENTS 4,769,292 A 9/1988 Tang et al.
5,061,569 A 10/1991 VanSlyke et al.

(Continued)

FOREIGN PATENT DOCUMENTS

CN 108059644 A 5/2018
CN 109608500 4/2019

(Continued)

OTHER PUBLICATIONS

Richard J. Lewis, Sr. "Hawley's Condensed Chemical Dictionary, 12th Edition", John Wiley & Sons, Inc., New York p. 796 (1993).*

(Continued)

*Primary Examiner* — Alexander C Kollias
(74) *Attorney, Agent, or Firm* — Duane Morris LLP

(57) ABSTRACT

A novel compound is disclosed which includes a ligand $L_A$ of Formula II,

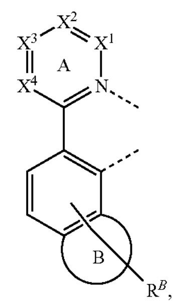

wherein:

ring B is independently a 5-membered or 6-membered carbocyclic or heterocyclic ring;

(Continued)

$X^1$ to $X^4$ are each independently selected from the group consisting of C, N, and CR;

at least one pair of adjacent $X^1$ to $X^4$ are each C and fused to Formula V

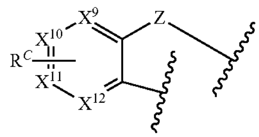

where indicated by "~~~~"; $X^5$ to $X^{12}$ are each independently C or N; the maximum number of N within a ring is two; Z and Y are each independently selected from the group consisting of O, S, Se, NR', CR'R", SiR'R", and GeR'R"; $R^B$ and $R^C$ each independently represents zero, mono, or up to a maximum allowed substitutions to its associated ring; each of $R^B$, $R^C$, R, R', and R" is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; and two substituents can be joined or fused to form a ring; the ligand $L_A$ is complexed to a metal M through the two indicated dash lines of each Formula; and the ligand $L_A$ can be joined with other ligands to form a tridentate, tetradentate, pentadentate, or hexadentate ligand.

20 Claims, 3 Drawing Sheets

Related U.S. Application Data continuation-in-part of application No. 16/375,467, filed on Apr. 4, 2019, now Pat. No. 11,127,906, which is a continuation-in-part of application No. 15/950,351, filed on Apr. 11, 2018, now Pat. No. 11,189,804, which is a continuation-in-part of application No. 15/825,297, filed on Nov. 29, 2017, now Pat. No. 11,183,642, which is a continuation-in-part of application No. 15/706,186, filed on Sep. 15, 2017, now Pat. No. 11,196,010.

(60) Provisional application No. 62/930,837, filed on Nov. 5, 2019, provisional application No. 62/403,424, filed on Oct. 3, 2016.

(51) Int. Cl.

| | |
|---|---|
| ***C07F 15/00*** | (2006.01) |
| ***C09K 11/06*** | (2006.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 101/10* | (2023.01) |
| *H10K 101/30* | (2023.01) |
| *H10K 101/40* | (2023.01) |

(52) U.S. Cl.

CPC ................. *C09K 2211/1011* (2013.01); *C09K 2211/1037* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02); *H10K 2101/30* (2023.02); *H10K 2101/40* (2023.02)

(56) References Cited

U.S. PATENT DOCUMENTS 5,247,190 A 9/1993 Friend et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,468,819 B1 10/2002 Kim et al.
6,528,187 B1 3/2003 Okada
6,687,266 B1 2/2004 Ma et al.
6,835,469 B2 12/2004 Kwong et al.
6,921,915 B2 7/2005 Takiguchi et al.
7,087,821 B2 8/2006 Kwong et al.
7,090,928 B2 8/2006 Thompson et al.
7,154,114 B2 12/2006 Brooks et al.
7,250,226 B2 7/2007 Tokito et al.
7,279,704 B2 10/2007 Walters et al.
7,332,232 B2 2/2008 Ma et al.
7,338,722 B2 3/2008 Thompson et al.
7,393,599 B2 7/2008 Thompson et al.
7,398,698 B2 7/2008 Takeuchi et al.
7,431,988 B2 10/2008 Shtein et al.
7,445,855 B2 11/2008 Mackenzie et al.
7,534,505 B2 5/2009 Lin et al.
8,946,697 B1 2/2015 Ma
10,205,106 B2 2/2019 Stoessel et al.
11,081,658 B2 * 8/2021 Boudreault ......... H01L 51/0085
11,127,906 B2 * 9/2021 Boudreault ............ C09K 11/06
11,183,642 B2 * 11/2021 Boudreault ......... H01L 51/0073
11,196,010 B2 * 12/2021 Boudreault ........ C07D 491/048
2002/0034658 A1 3/2002 Thompson et al.
2002/0134984 A1 9/2002 Igarashi
2002/0158242 A1 10/2002 Son et al.
2003/0072964 A1 4/2003 Kwong
2003/0138657 A1 7/2003 Li et al.
2003/0152802 A1 8/2003 Tsuboyama et al.
2003/0182053 A1 8/2003 Marks et al.
2003/0175553 A1 9/2003 Thompson et al.
2003/0230980 A1 12/2003 Forrest et al.
2004/0036077 A1 2/2004 Ise
2004/0137267 A1 7/2004 Igarashi et al.
2004/0137268 A1 7/2004 Igarashi et al.
2004/0174116 A1 9/2004 Lu et al.
2004/0214038 A1 * 10/2004 Kwong .................. C09K 11/06 428/917
2005/0025993 A1 2/2005 Thompson et al.
2005/0112407 A1 5/2005 Ogasawara et al.
2005/0238919 A1 10/2005 Ogasawara
2005/0244673 A1 11/2005 Satoh et al.
2005/0260441 A1 11/2005 Thompson et al.
2005/0260449 A1 11/2005 Walters et al.
2006/0008670 A1 1/2006 Lin et al.
2006/0202194 A1 9/2006 Jeong et al.
2006/0240279 A1 10/2006 Adamovich et al.
2006/0251923 A1 11/2006 Lin et al.
2006/0263635 A1 11/2006 Ise
2006/0280965 A1 12/2006 Kwong et al.
2007/0190359 A1 8/2007 Knowles et al.
2007/0278938 A1 12/2007 Yabunouchi et al.
2008/0015355 A1 1/2008 Schafer et al.
2008/0018221 A1 1/2008 Egen et al.
2008/0106190 A1 5/2008 Yabunouchi et al.
2008/0124572 A1 5/2008 Mizuki et al.

(56) References Cited

U.S. PATENT DOCUMENTS

| | | | | |
|---|---|---|---|---|
| 2008/0220265 | A1 | 9/2008 | Xia et al. | |
| 2008/0297033 | A1 | 12/2008 | Knowles et al. | |
| 2009/0008605 | A1 | 1/2009 | Kawamura et al. | |
| 2009/0009065 | A1 | 1/2009 | Nishimura et al. | |
| 2009/0017330 | A1 | 1/2009 | Iwakuma et al. | |
| 2009/0030202 | A1 | 1/2009 | Iwakuma et al. | |
| 2009/0039776 | A1 | 2/2009 | Yamada et al. | |
| 2009/0045730 | A1 | 2/2009 | Nishimura et al. | |
| 2009/0045731 | A1 | 2/2009 | Nishimura et al. | |
| 2009/0101870 | A1 | 4/2009 | Prakash et al. | |
| 2009/0108737 | A1 | 4/2009 | Kwong et al. | |
| 2009/0115316 | A1 | 5/2009 | Zheng et al. | |
| 2009/0165846 | A1 | 7/2009 | Johannes et al. | |
| 2009/0167162 | A1 | 7/2009 | Lin et al. | |
| 2009/0179554 | A1 | 7/2009 | Kuma et al. | |
| 2010/0283043 | A1* | 11/2010 | Nishimura | H01L 51/0054 257/E51.026 |
| 2012/0061854 | A1 | 3/2012 | Rayabarapu et al. | |
| 2012/0068165 | A1 | 3/2012 | Hayashi | |
| 2012/0098417 | A1 | 4/2012 | Inoue | |
| 2012/0280218 | A1 | 11/2012 | Watanabe | |
| 2015/0001472 | A1* | 1/2015 | Boudreault | H01L 51/0085 546/4 |
| 2015/0090974 | A1 | 4/2015 | Kim | |
| 2015/0171348 | A1 | 6/2015 | Stoessel | |
| 2015/0236276 | A1* | 8/2015 | Boudreault | H01L 51/0085 257/40 |
| 2016/0204358 | A1 | 7/2016 | Stoessel | |
| 2016/0268521 | A1 | 9/2016 | Lee | |
| 2018/0097179 | A1 | 4/2018 | Boudreault | |
| 2019/0237683 | A1 | 8/2019 | Boudreault | |

FOREIGN PATENT DOCUMENTS

| | | |
|---|---|---|
| EP | 0650955 | 5/1995 |
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03080956 | 7/2003 |
| WO | 2004093207 | 10/2004 |
| WO | 2004107822 | 12/2004 |
| WO | 2005814551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063764 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009060290 | 4/2009 |
| WO | 2009003833 | 5/2009 |
| WO | 2009062578 | 5/2009 |
| WO | 2009066778 | 5/2009 |
| WO | 2009686779 | 5/2009 |
| WO | 2009088028 | 7/2009 |
| WO | 2009100991 | 8/2009 |
| WO | 2015/000546 A1 | 1/2015 |

OTHER PUBLICATIONS

Adachi, Chiheya et al., "Organic Electroluminescent Device Having a Hole Conductor as an Emitting Layer," Appl. Phys. Lett., 55(15): 1489-1491 (1989).

Adachi, Chiheya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-163503-3.

Baldo et el., Highly Efficient Phosphorescent Emission from Organic Electroluminescent Devices, Nature, vol. 395, 151-154, (1998).

Baldo et al., Very high-efficiency green organic light-emitting devices based on electrophosphorescence, Appl. Phys. Lett., vol. 75, No. 1, 4-6 (1999).

Gao, Zhialang et al., "Bright-Blue Electroluminescence From a Silyl-Substiluted ter-(phenylene-vinlene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter, " Chem. Lett., 905-906 (1993).

Holmes, R.J. et al., "Blue Organic Electrophosphorescence Using Exothermic Host-Guest Energy Transfer." Appl. Phys. Lett., 82(15):2422-2424 (2003).

Hu, Nao-Xing et al., "Novel High Tg Hole-Transport Molecules Based on Indolo[3,2-b]carbazoles for Organic Light-Emitting Devices," Synthetic Metals, 111-112.421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19 739-743 (2007).

Huang, Wei-Sheng et al., "Highly Phosphorescent Bis-Cyclometalaled Iridium Complexes Containing Benzoimidazole-Based Ligands," Chem. Mater., 16(12):2480-2488 (2004).

Hung, L.S. et al., "Anode Modification in Organic Light-Emitting Diodes by Law-Frequency Plasma Polymerization of CHF3," Appl. Phys. Lett., 78(5):673-675 (2001).

Ikai, Masamichi et al., "Highly Efficient Phosphorescence From Organic Light-Emitling Devices with an Exciton-Block Layer," Appl. Phys. Lett., 79(2):156-158 (2001).

Ikeda, Hisao et al., "P.185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstiluted Derivatives as a Novel Class of Amorphous Molecular Materials," J. Mater. Chem., 3(3):319-320 (1993).

Kanno, Hiroshi et al. "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido. Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al.,, "Thermally Stable Multilayered Organic Electroluminescent Devices Using Novel Starburst Molecules, 4,4',4"-Tri(N-carbazolyl)triphenylamine (TCTA) and 4,4',4"-Tris(3-

(56) References Cited

OTHER PUBLICATIONS methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinudlear-Gold(I) Complex-Based Light-Emitting Diodes with Low Turn-On voltage," Appl. Phys. Lett., 74(10):1361-1363 (1999).
Mi, Bao-Xiu et al.m "Thermally Stable Hole-Transporting Material for Organic Light-Emitting Diode an Isoindole Derivative," Chem. Mater., 15(16):3148-3161 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesityiboryl)-2,2-bithlophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063804-1-063504-3 (2006).
Palilis, Leonidas C., "High Efficacy Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazalato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al. "Low Molecular Organic Glasses for Blue Electroluminescence," Synthetic Metals, 91: 209-215 (1997).
Shirota, Yasuhiko at al., "Starbuest Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett. 91:263503-1-263503-3 (2007).
T. Östergärd et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminesoent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(6)1059-1064 (2005).
Van Slyke, S A. et al., "Organic Electroluminescent Devices with Improved Stability." Appl. Phys. Lett., 69 (15):2160-2162 (1996).
Wang, Y. et al. "Highly Efficient Electroluminesoent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Mullifunctional Iridium Complexes Based on Carbazole Modules as Highly Efficient Electrophosphors," Angew. Chem. Int. Ed., 45:7800-7803 (2006).
Seo, Jeong-A et al., "High efficiency yellowish green phosphorescent emitter derived from phenylbenzothienopyridine ligand", Organic Electronics, 15, 2014, pp. 2068-2072.

* cited by examiner

ORGANIC ELECTROLUMINESCENT MATERIALS AND DEVICES

CROSS-REFERENCE TO RELATED CASES

This application is a continuation of U.S. patent application Ser. No. 16/828,080, filed Mar. 24, 2020, which (i) claims priority under U.S.C. § 1.119(e) to U.S. Provisional application No. 62/930,837, filed on Nov. 5, 2019, and (ii) is a continuation-in-part of U.S. patent application Ser. No. 16/375,467, filed on Apr. 4, 2019, which is a continuation-in-part of U.S. patent application Ser. No. 15/950,351, filed on Apr. 11, 2018, which is a continuation-in-part of U.S. patent application Ser. No. 15/825,297, filed on Nov. 29, 2017, which is a continuation-in-part of co-pending U.S. patent application Ser. No. 15/706,186, filed on Sep. 15, 2017, that claims priority to U.S. Provisional application No. 62/403,424, filed Oct. 3, 2016, the disclosure of which is encorporated herein by reference.

FIELD

The present disclosure generally relates to organometallic compounds and formulations and their various uses including as emitters in devices such as organic light emitting diodes and related electronic devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

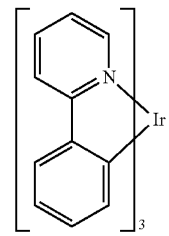

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

In one aspect, the present disclosure provides a compound comprising a ligand $L_A$ of Formula I, Formula II, Formula III, or Formula IV:

Formula I

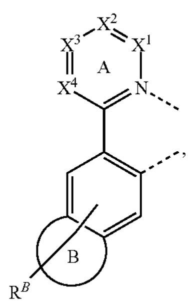

Formula II

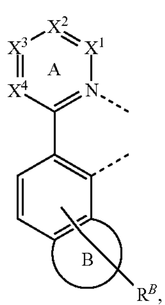

,

Formula III

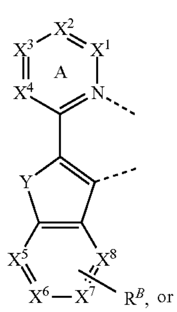

, or

-continued

Formula IV

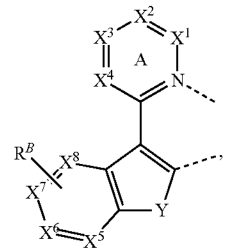

where: ring B is independently a 5-membered or 6-membered carbocyclic or heterocyclic ring; $X^1$ to $X^4$ are each independently selected from the group consisting of C, N, and CR; at least one pair of adjacent $X^1$ to $X^4$ are each C and fused to a structure of Formula V

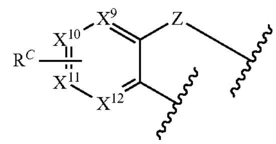

where indicated by "〰"; "$X^5$ to $X^{12}$ are each independently C or N; Z and Y are each independently selected from the group consisting of O, S, Se, NR', CR'R", SiR'R", and GeR'R"; $R^B$ and $R^C$ each independently represents zero, mono, or up to a maximum allowed substitutions to its associated ring; each of $R^B$, $R^C$, R, R', and R" is independently a hydrogen or a substituent selected from the group consisting of the general substituents defined herein; and two substituents can be joined or fused to form a ring; the ligand $L_A$ is complexed to a metal M through the two indicated dash lines of each Formula I, Formula II, Formula III, and Formula IV; and the ligand $L_A$ can be joined with other ligands to form a tridentate, tetradentate, pentadentate, or hexadentate ligand.

In another aspect, the present disclosure provides a formulation of a compound comprising a ligand $L_A$ of Formula I, Formula II, Formula III, or Formula IV as described herein.

In yet another aspect, the present disclosure provides an OLED having an organic layer comprising a compound comprising a ligand $L_A$ of Formula I, Formula II, Formula III, or Formula IV as described herein.

In yet another aspect, the present disclosure provides a consumer product comprising an OLED with an organic layer comprising a compound comprising a ligand $L_A$ of Formula I, Formula II, Formula III, or Formula IV as described herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
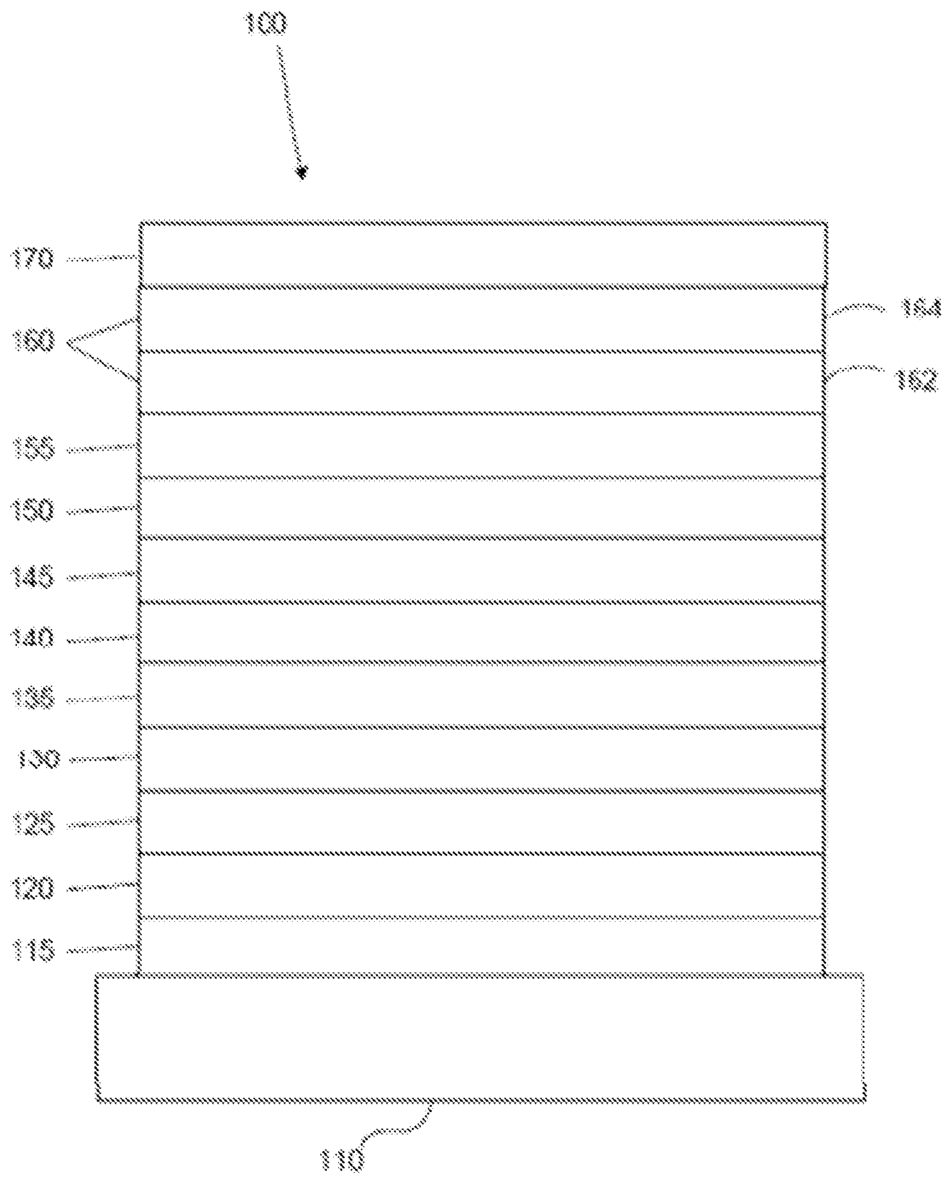
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
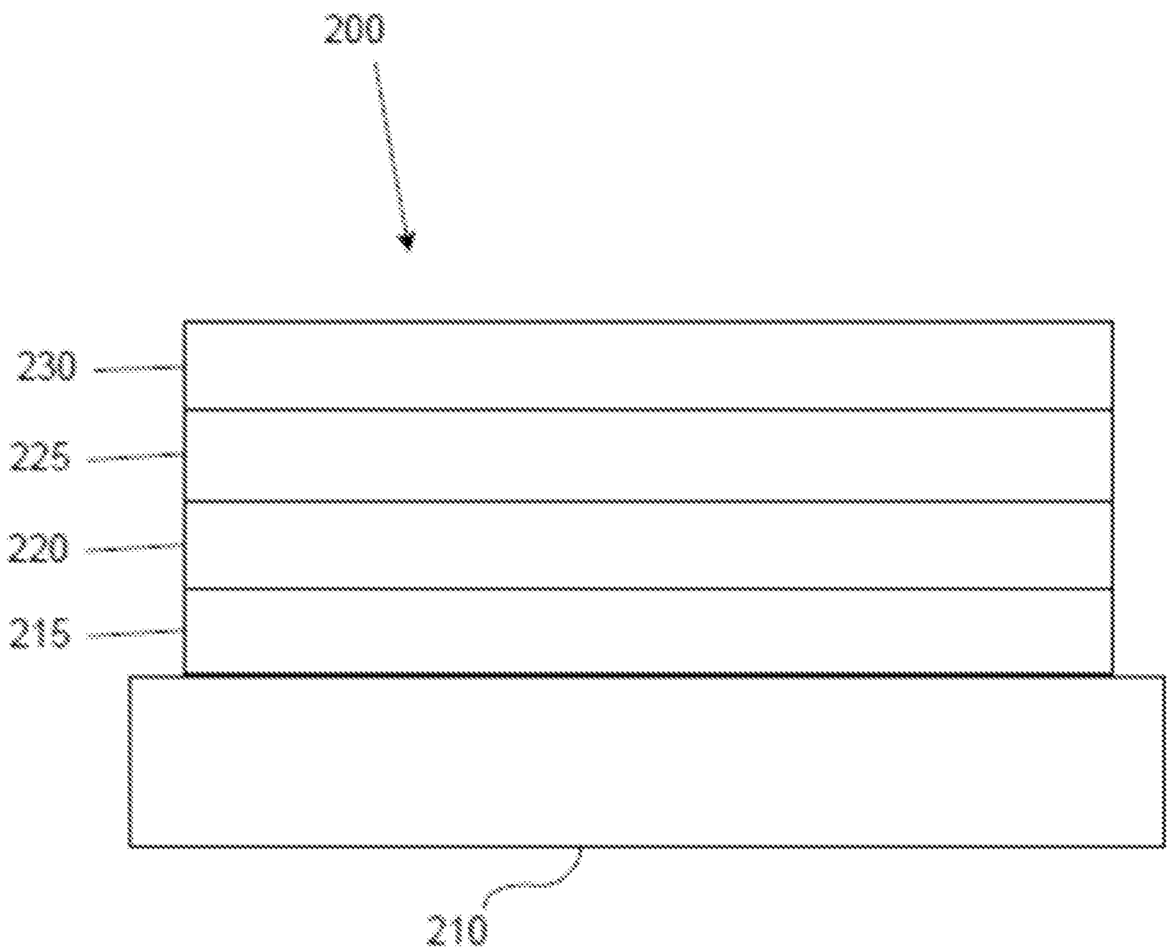
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical ($C(O)—R_S$).

The term "ester" refers to a substituted oxycarbonyl ($—O—C(O)—R_S$ or $—C(O)—O—R_S$) radical.

The term "ether" refers to an $—OR_S$ radical.

The terms "sulfanyl" or "thio-ether" are used interchangeably and refer to a $—SR_S$ radical.

The term "sulfinyl" refers to a $—S(O)—R_S$ radical.

The term "sulfonyl" refers to a $—SO_2—R_S$ radical.

The term "phosphino" refers to a $—P(R_S)_3$ radical, wherein each $R_S$ can be same or different.

The term "silyl" refers to a $—Si(R_S)_3$ radical, wherein each $R_S$ can be same or different.

The term "boryl" refers to a $—B(R_s)_2$ radical or its Lewis adduct $—B(R_s)_3$ radical, wherein $R_s$ can be same or different.

In each of the above, $R_S$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2, 2' positions in a biphenyl, or 1, 8 position in a naphthalene, as long as they can form a stable fused ring system.

The Compounds of the Present Disclosure

In one aspect, the present disclosure provides a compound comprising a ligand $L_A$ of Formula I, Formula II, Formula III, or Formula IV:

Formula I

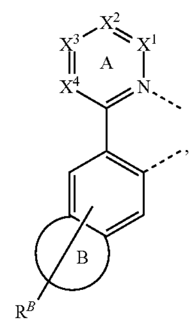

Formula II

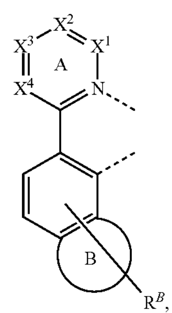

Formula III

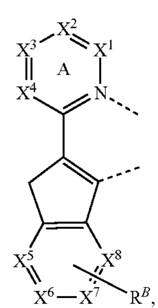

or

-continued

Formula IV

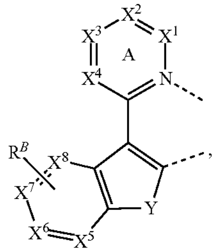

where: ring B is independently a 5-membered or 6-membered carbocyclic or heterocyclic ring; $X^1$ to $X^4$ are each independently selected from the group consisting of C, N, and CR; at least one pair of adjacent $X^1$ to $X^4$ are each C and fused to a structure of Formula V

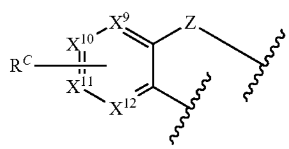

where indicated by "〰"; $X^5$ to $X^{12}$ are each independently C or N; Z and Y are each independently selected from the group consisting of O, S, Se, NR', CR'R", SiR'R", and GeR'R"; $R^B$ and $R^C$ each independently represents zero, mono, or up to a maximum allowed substitutions to its associated ring; each of $R^B$, $R^C$, R, R', and R" is independently a hydrogen or a substituent selected from the group consisting of the general substituents defined herein; and two substituents can be joined or fused to form a ring; the ligand $L_A$ is complexed to a metal M through the two indicated dash lines of each Formula I, Formula II, Formula III, and Formula IV; and the ligand $L_A$ can be joined with other ligands to form a tridentate, tetradentate, pentadentate, or hexadentate ligand.

In some embodiments of the compound, the maximum number of N within a ring in the ligand $L_A$ is two.

In some embodiments of the compound, each of $R^B$, $R^C$, R, R', and R" is independently a hydrogen or a substituent selected from the group consisting of the preferred general substituents defined herein.

In some embodiments of the compound, ring B is a 6-membered ring. In some embodiments where ring B is a 6-membered ring, each R is H.

In some embodiments of the compound, the ligand $L_A$ is selected from the group consisting of the following structures:

Formula VI

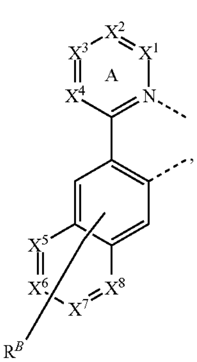

and

-continued

Formula VII

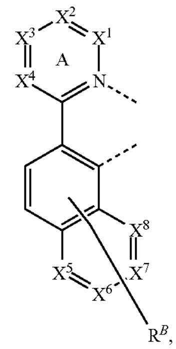

wherein the relevant provisos for Formulas I and II apply to Formulas VI and VII.

In any of the embodiments of the compound mentioned above, each of $X^1$ to $X^4$ is independently C or CR.

In some embodiments of the compound, at least one of $X^1$ to $X^4$ in each formula is N.

In some embodiments of the compound, each of $X^5$ to $X^8$ is C.

In some embodiments of the compound, each of $X^9$ to $X^{12}$ is C.

In some embodiments of the compound, each of $X^5$ to $X^{12}$ is C.

In some embodiments of the compound, at least one of $X^5$ to $X^{12}$ in each formula is N.

In some embodiments of the compound, at least one of $X^5$ to $X^8$ in each formula is N.

In some embodiments of the compound, at least one of $X^9$ to $X^{12}$ in each formula is N.

In some embodiments of the compound, Z for each occurrence independently forms a direct bond to $X^1$. In some embodiments, Z for each occurrence independently forms a direct bond to $X^2$. In some embodiments, Z for each occurrence independently forms a direct bond to $X^3$. In some embodiments, Z for each occurrence independently forms a direct bond to $X^4$. In some embodiments, Z for each occurrence is independently O or S.

In some embodiments of the compound, each $R^C$ in each of the Formulas I, II, III, and IV is H. In some embodiments, at least one $R^B$ in each of the Formulas I, II, III, IV, VI, and VII is independently an alkyl or cycloalkyl group. In some embodiments, at least one $R^B$ in each of the Formulas I, II, III, and IV is independently a tertiary alkyl group.

In some embodiments of the compound, Y for each occurrence is independently O or S.

In some embodiments of the compound, the ligand $L_A$ is selected from the Ligand Group A consisting of the following structures:

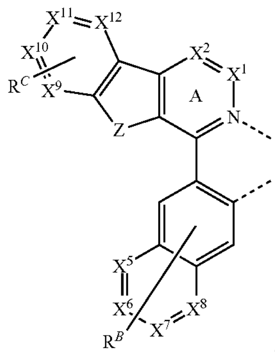
,
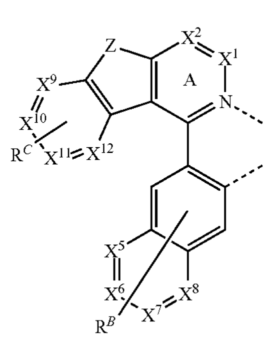
,
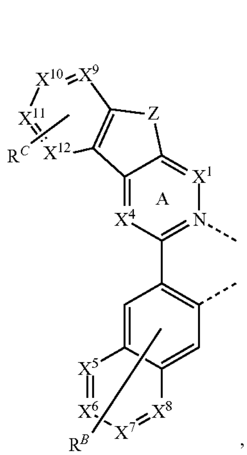
,
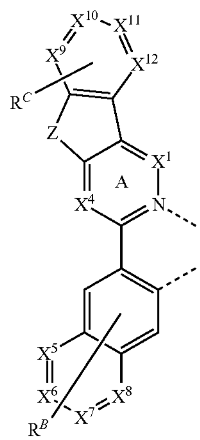
,
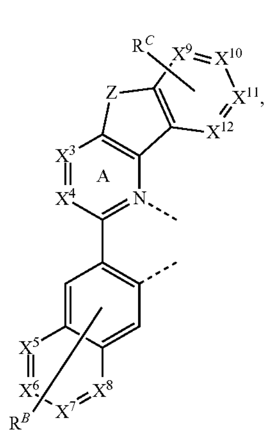
, and
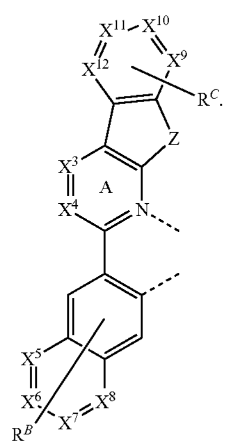
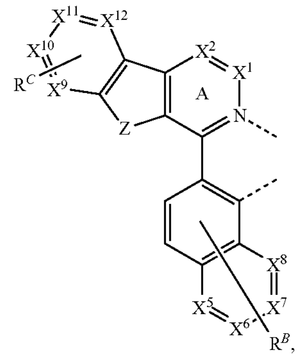
,
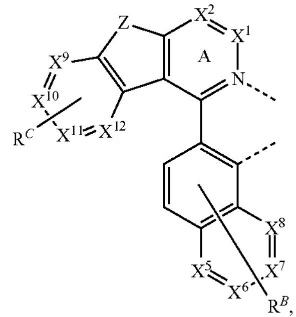
,
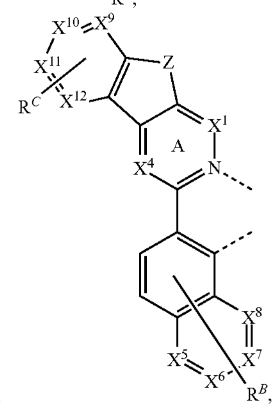
,
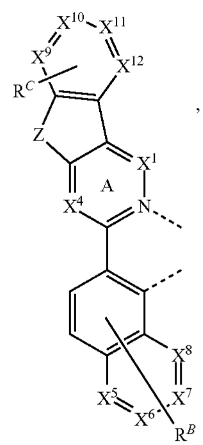
,
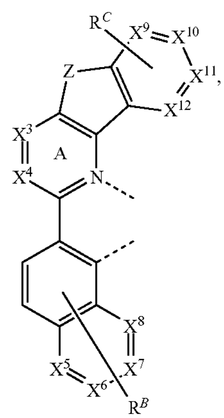
, and
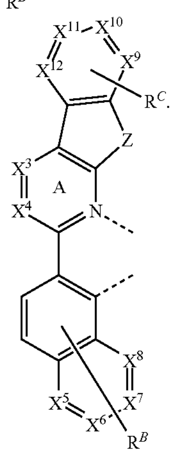
In some embodiments of the compound, the compound comprises the ligand $L_A$ selected from the Ligand Group B consisting of the following structures:
In some embodiments of the compound where the ligand $L_A$ is selected from the Ligand Group A or the Ligand Group B, each of $R^B$, $R^C$, R, R', and R" for each Formula is independently hydrogen or a substituent selected from the group consisting of the preferred general substituents defined herein.

In some embodiments of the compound where the ligand $L_A$ is selected from the Ligand Group B, the $R^B$ substituent is para to the metal and is selected from the group consisting of alkyl, cycloalkyl, and combination thereof.

In some embodiments of the compound where the ligand $L_A$ is selected from the Ligand Group B, the $R^B$ substituent is para to the metal and is a tertiary alkyl. In some embodiments, the $R^B$ substituent is para to the metal and is tert-butyl.

In some embodiments of the compound where the ligand $L_A$ is selected from the Ligand Group A, $X^1$ to $X^4$ for each formula in Ligand Group A are independently C or CR. In some embodiments, each R for each formula in Ligand Group A is independently H. In some embodiments, each of $X^5$ to $X^8$ for each formula in Ligand Group A is independently C. In some embodiments, each of $X^9$ to $X^{12}$ for each formula in Ligand Group A is independently C. In some embodiments, each of $X^5$ to $X^{12}$ for each formula in Ligand Group A is independently C. In some embodiments, at least one of $X^5$ to $X^{12}$ for each formula in Ligand Group A is independently N. In some embodiments, at least one of $X^5$ to $X^8$ for each formula in Ligand Group A is independently N. In some embodiments, at least one of $X^9$ to $X^{12}$ for each formula in Ligand Group A is independently N. In some embodiments, each $R^C$ for each formula in Ligand Group A is independently H. In some embodiments, at least one $R^B$ for each formula in Ligand Group A is independently an alkyl, cycloalkyl, or combination thereof. In some embodiments, at least one $R^B$ for each formula in Ligand Group A is independently a tertiary alkyl group. In some embodiments, Z for each occurrence is independently O or S.

In some embodiments of the compound, the compound comprises a substituted or unsubstituted acetylacetonate ligand. In some embodiments of the compound, the metal M is selected from the group consisting of Os, Ir, Pd, Pt, Cu, Ag, and Au. In some embodiments of the compound, the metal M is selected from the group consisting of Ir and Pt. In some embodiments of the compound, the compound comprises the ligand $L_A$ selected from the group consisting of:

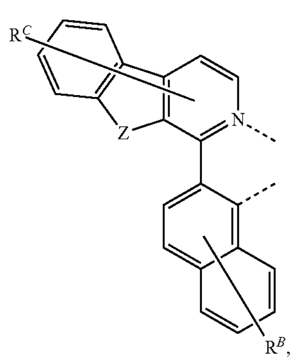

-continued

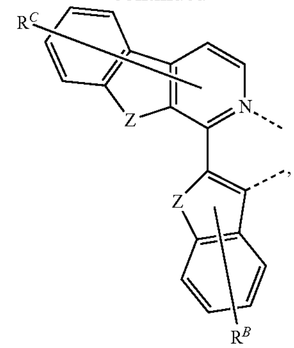

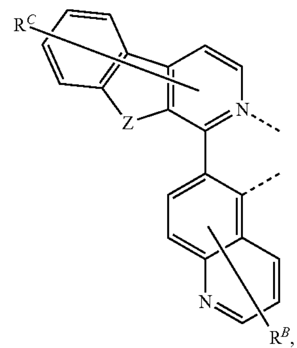

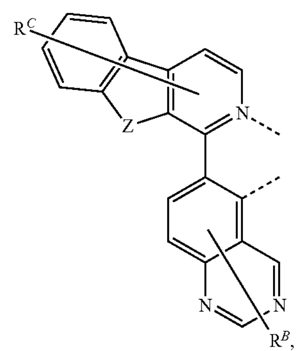

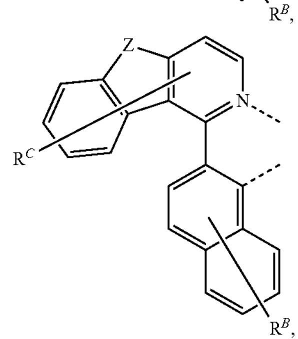

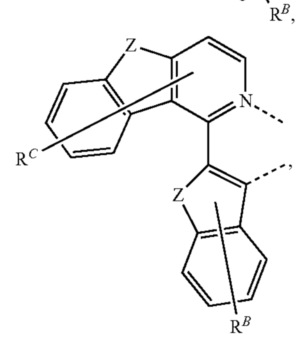

-continued
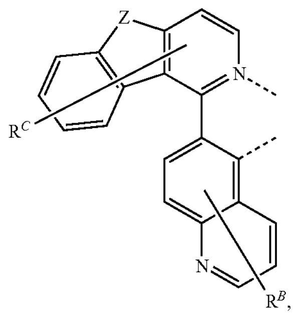
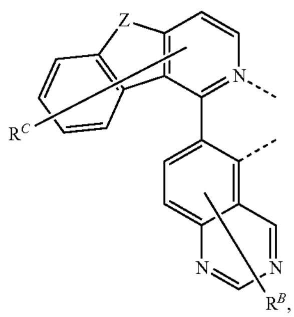
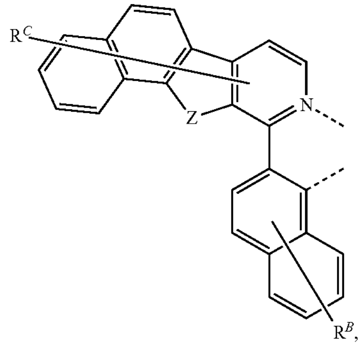
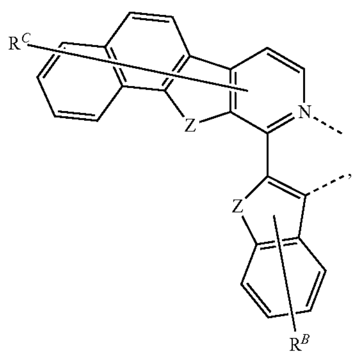
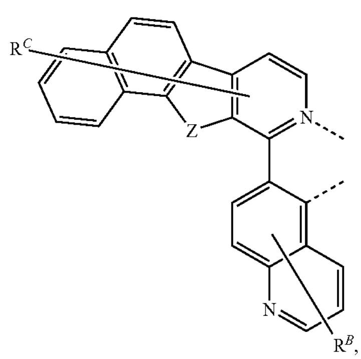
-continued
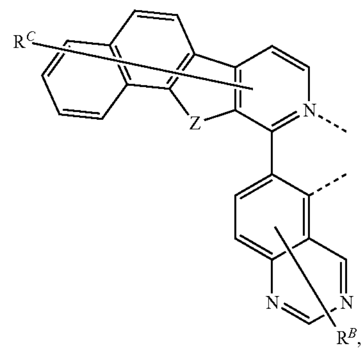
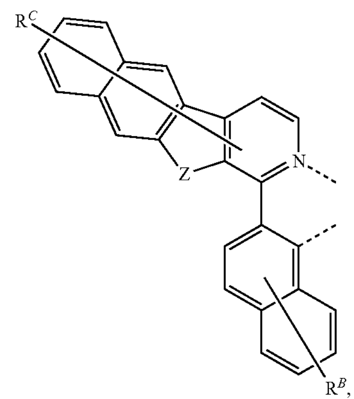
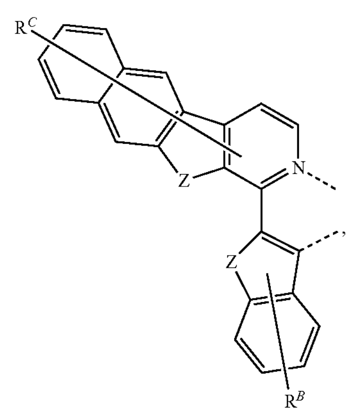
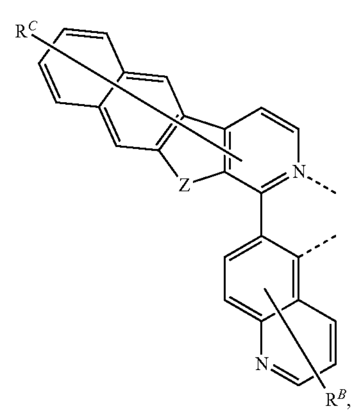

-continued

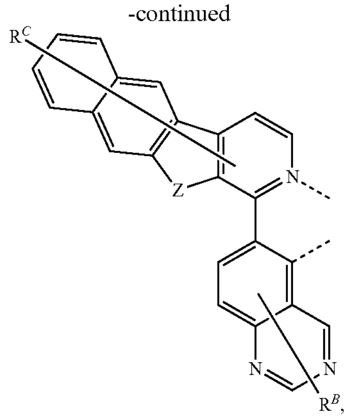

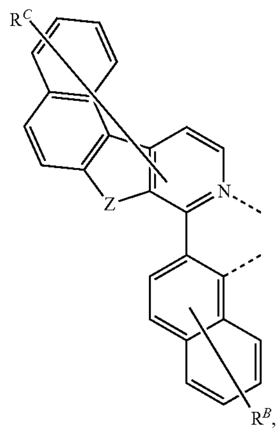

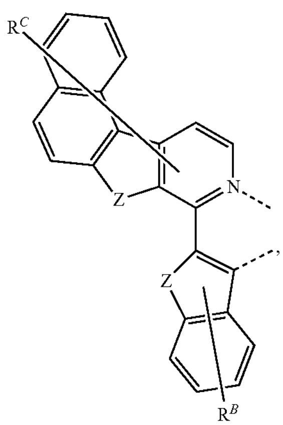

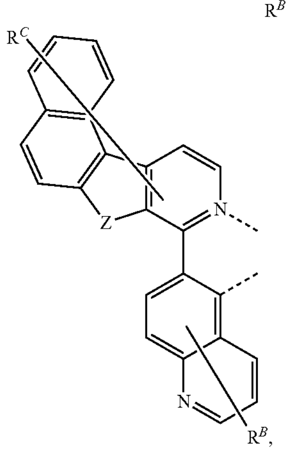

and

-continued

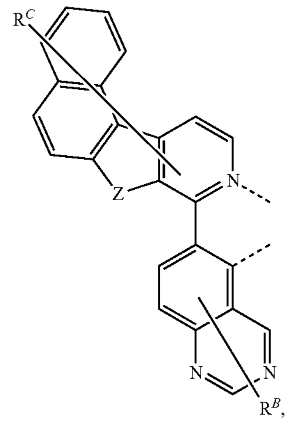

where each of $R^B$ can be the same or different, each of $R^C$ can be the same or different, and $R^B$ and $R^C$ for each occurrence is independently selected from the group consisting of the general substituents defined herein.

In some embodiments of the compound, the compound comprises the ligand $L_A$ selected from the group consisting of $L_{Ai-1}$ based on Structure 1:

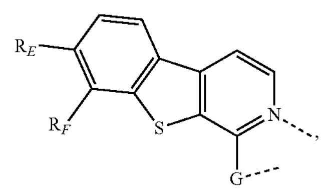

$L_{Ai-2}$ based on Structure 2:

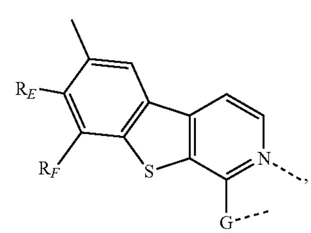

$L_{Ai-3}$ based on Structure 3:

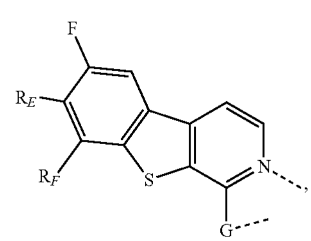

$L_{Ai\text{-}4}$ based on Structure 4:
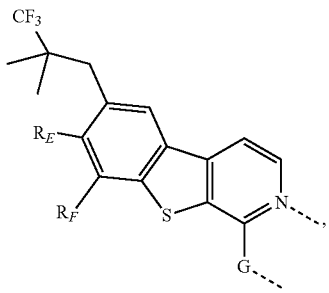
$L_{Ai\text{-}5}$ based on Structure 5:
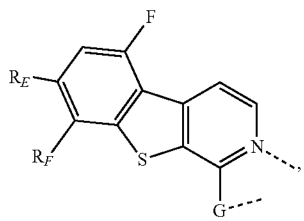
$L_{Ai\text{-}6}$ based on Structure 6:
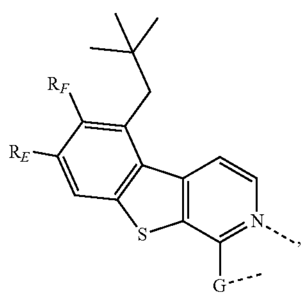
$L_{Ai\text{-}7}$ based on Structure 7:
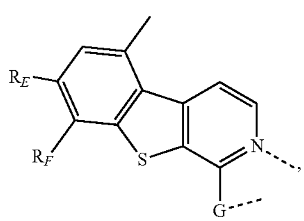
$L_{Ai\text{-}8}$ based on Structure 8:
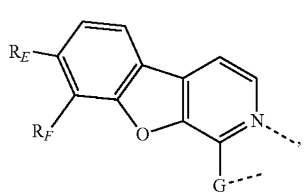
$L_{Ai\text{-}9}$ based on Structure 9:
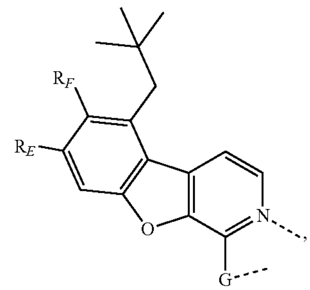
$L_{Ai\text{-}10}$ based on Structure 10:
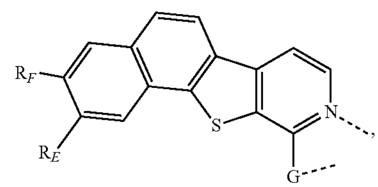
$L_{Ai\text{-}11}$ based on Structure 11:
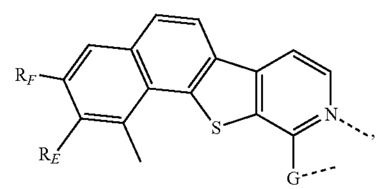
$L_{Ai\text{-}12}$ based on Structure 12:
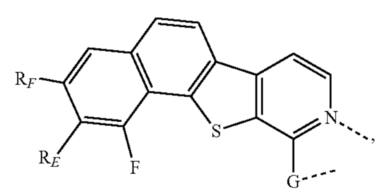
$L_{Ai\text{-}13}$ based on Structure 13:
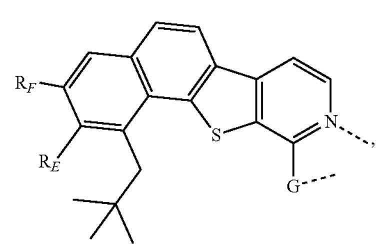

$L_{Ai\text{-}14}$ based on Structure 14:
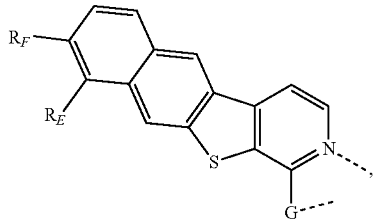
$L_{Ai\text{-}15}$ based on Structure 15:
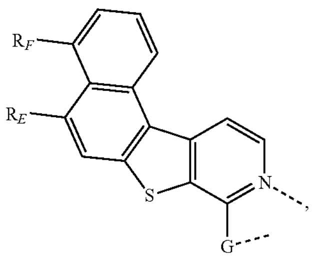
$L_{Ai\text{-}16}$ based on Structure 16:
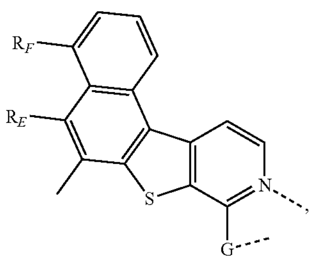
$L_{Ai\text{-}17}$ based on Structure 17:
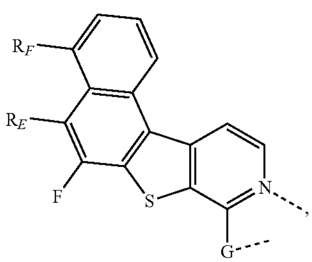
$L_{Ai\text{-}18}$ based on Structure 18:
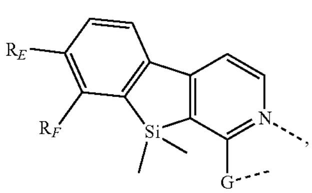
$L_{Ai\text{-}19}$ based on Structure 19:
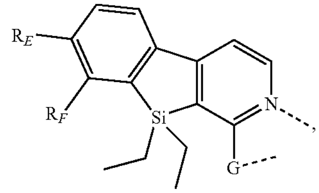
$L_{Ai\text{-}20}$ based on Structure 20:
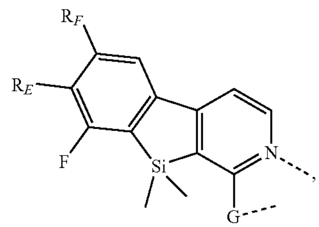
$L_{Ai\text{-}21}$ based on Structure 21:
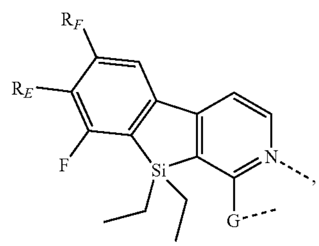
$L_{Ai\text{-}22}$ based on Structure 22:
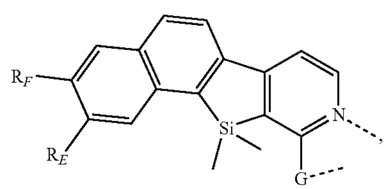
$L_{Ai\text{-}23}$ based on Structure 23:
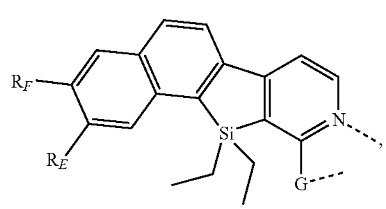

$L_{Ai-24}$ based on Structure 24:
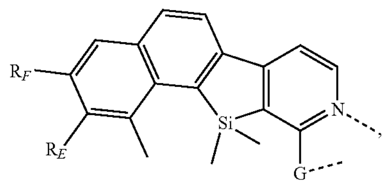
$L_{Ai-25}$ based on Structure 25:
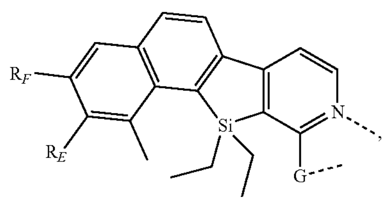
$L_{Ai-26}$ based on Structure 26:
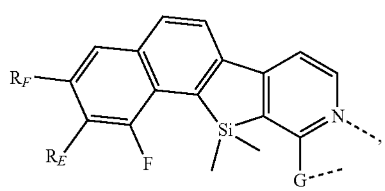
$L_{Ai-27}$ based on Structure 27:
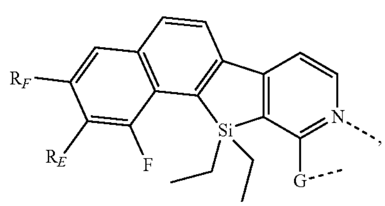
$L_{Ai-28}$ based on Structure 28:
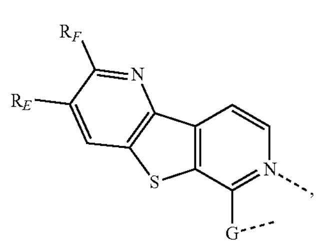
$L_{Ai-29}$ based on Structure 29:
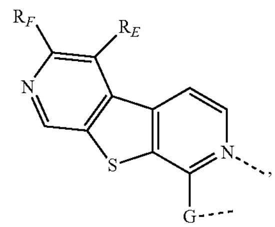
$L_{Ai-30}$ based on Structure 30:
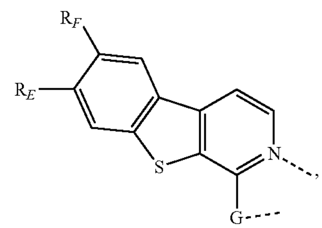
$L_{Ai-31}$ based on Structure 31:
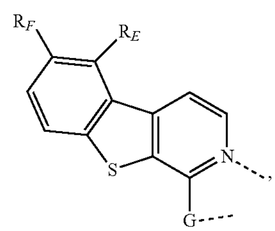
$L_{Ai-32}$ based on Structure 32:
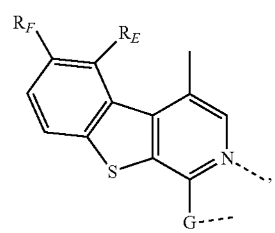
$L_{Ai-33}$ based on Structure 33:
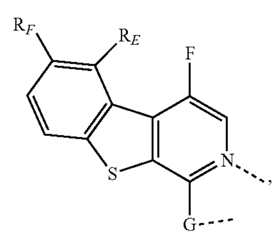

$L_{Ai\text{-}34}$ based on Structure 34:

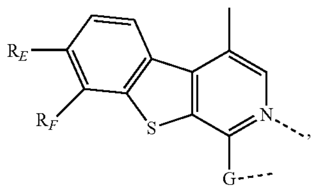

$L_{Ai\text{-}35}$ based on Structure 35:

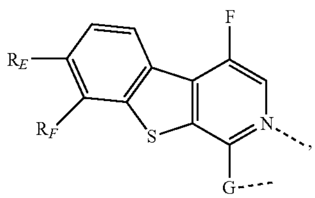

wherein i is an integer from 1 to 1336, and for each i, $R_E$, $R_F$, and G are defined as below:

| i | $R_E$ | $R_F$ | G |
|---|---|---|---|
| 1 | $R^{1}$ | $R^{1}$ | $G^{5}$ |
| 2 | $R^{2}$ | $R^{2}$ | $G^{5}$ |
| 3 | $R^{3}$ | $R^{3}$ | $G^{5}$ |
| 4 | $R^{4}$ | $R^{4}$ | $G^{5}$ |
| 5 | $R^{5}$ | $R^{5}$ | $G^{5}$ |
| 6 | $R^{6}$ | $R^{6}$ | $G^{5}$ |
| 7 | $R^{7}$ | $R^{7}$ | $G^{5}$ |
| 8 | $R^{8}$ | $R^{8}$ | $G^{5}$ |
| 9 | $R^{9}$ | $R^{9}$ | $G^{5}$ |
| 10 | $R^{10}$ | $R^{10}$ | $G^{5}$ |
| 11 | $R^{11}$ | $R^{11}$ | $G^{5}$ |
| 12 | $R^{12}$ | $R^{12}$ | $G^{5}$ |
| 13 | $R^{13}$ | $R^{13}$ | $G^{5}$ |
| 14 | $R^{14}$ | $R^{14}$ | $G^{5}$ |
| 15 | $R^{15}$ | $R^{15}$ | $G^{5}$ |
| 16 | $R^{16}$ | $R^{16}$ | $G^{5}$ |
| 17 | $R^{17}$ | $R^{17}$ | $G^{5}$ |
| 18 | $R^{18}$ | $R^{18}$ | $G^{5}$ |
| 19 | $R^{19}$ | $R^{19}$ | $G^{5}$ |
| 20 | $R^{20}$ | $R^{20}$ | $G^{5}$ |
| 21 | $R^{21}$ | $R^{21}$ | $G^{5}$ |
| 22 | $R^{22}$ | $R^{22}$ | $G^{5}$ |
| 23 | $R^{23}$ | $R^{23}$ | $G^{5}$ |
| 24 | $R^{24}$ | $R^{24}$ | $G^{5}$ |
| 25 | $R^{25}$ | $R^{25}$ | $G^{5}$ |
| 26 | $R^{26}$ | $R^{26}$ | $G^{5}$ |
| 27 | $R^{27}$ | $R^{27}$ | $G^{5}$ |
| 28 | $R^{28}$ | $R^{28}$ | $G^{5}$ |
| 29 | $R^{29}$ | $R^{29}$ | $G^{5}$ |
| 30 | $R^{30}$ | $R^{30}$ | $G^{5}$ |
| 31 | $R^{31}$ | $R^{31}$ | $G^{5}$ |
| 32 | $R^{32}$ | $R^{32}$ | $G^{5}$ |
| 31 | $R^{2}$ | $R^{1}$ | $G^{5}$ |
| 32 | $R^{3}$ | $R^{1}$ | $G^{5}$ |
| 33 | $R^{4}$ | $R^{1}$ | $G^{5}$ |
| 34 | $R^{5}$ | $R^{1}$ | $G^{5}$ |
| 35 | $R^{6}$ | $R^{1}$ | $G^{5}$ |
| 36 | $R^{7}$ | $R^{1}$ | $G^{5}$ |
| 37 | $R^{8}$ | $R^{1}$ | $G^{5}$ |
| 38 | $R^{9}$ | $R^{1}$ | $G^{5}$ |
| 39 | $R^{10}$ | $R^{1}$ | $G^{5}$ |
| 40 | $R^{11}$ | $R^{1}$ | $G^{5}$ |
| 41 | $R^{12}$ | $R^{1}$ | $G^{5}$ |
| 42 | $R^{13}$ | $R^{1}$ | $G^{5}$ |
| 43 | $R^{14}$ | $R^{1}$ | $G^{5}$ |
| 44 | $R^{15}$ | $R^{1}$ | $G^{5}$ |
| 45 | $R^{16}$ | $R^{1}$ | $G^{5}$ |

-continued

| i | $R_E$ | $R_F$ | G |
|---|---|---|---|
| 46 | $R^{17}$ | $R^{1}$ | $G^{5}$ |
| 47 | $R^{18}$ | $R^{1}$ | $G^{5}$ |
| 48 | $R^{19}$ | $R^{1}$ | $G^{5}$ |
| 49 | $R^{20}$ | $R^{1}$ | $G^{5}$ |
| 50 | $R^{21}$ | $R^{1}$ | $G^{5}$ |
| 51 | $R^{22}$ | $R^{1}$ | $G^{5}$ |
| 52 | $R^{23}$ | $R^{1}$ | $G^{5}$ |
| 53 | $R^{24}$ | $R^{1}$ | $G^{5}$ |
| 54 | $R^{25}$ | $R^{1}$ | $G^{5}$ |
| 55 | $R^{26}$ | $R^{1}$ | $G^{5}$ |
| 56 | $R^{27}$ | $R^{1}$ | $G^{5}$ |
| 57 | $R^{28}$ | $R^{1}$ | $G^{5}$ |
| 58 | $R^{29}$ | $R^{1}$ | $G^{5}$ |
| 59 | $R^{30}$ | $R^{1}$ | $G^{5}$ |
| 60 | $R^{31}$ | $R^{1}$ | $G^{5}$ |
| 61 | $R^{32}$ | $R^{1}$ | $G^{5}$ |
| 62 | $R^{1}$ | $R^{2}$ | $G^{5}$ |
| 63 | $R^{1}$ | $R^{3}$ | $G^{5}$ |
| 64 | $R^{1}$ | $R^{4}$ | $G^{5}$ |
| 65 | $R^{1}$ | $R^{5}$ | $G^{5}$ |
| 66 | $R^{1}$ | $R^{6}$ | $G^{5}$ |
| 67 | $R^{1}$ | $R^{7}$ | $G^{5}$ |
| 68 | $R^{1}$ | $R^{8}$ | $G^{5}$ |
| 69 | $R^{1}$ | $R^{9}$ | $G^{5}$ |
| 70 | $R^{1}$ | $R^{10}$ | $G^{5}$ |
| 71 | $R^{1}$ | $R^{11}$ | $G^{5}$ |
| 72 | $R^{1}$ | $R^{12}$ | $G^{5}$ |
| 73 | $R^{1}$ | $R^{13}$ | $G^{5}$ |
| 74 | $R^{1}$ | $R^{14}$ | $G^{5}$ |
| 75 | $R^{1}$ | $R^{15}$ | $G^{5}$ |
| 76 | $R^{1}$ | $R^{16}$ | $G^{5}$ |
| 77 | $R^{1}$ | $R^{17}$ | $G^{5}$ |
| 78 | $R^{1}$ | $R^{18}$ | $G^{5}$ |
| 79 | $R^{1}$ | $R^{19}$ | $G^{5}$ |
| 80 | $R^{1}$ | $R^{20}$ | $G^{5}$ |
| 81 | $R^{1}$ | $R^{21}$ | $G^{5}$ |
| 82 | $R^{1}$ | $R^{22}$ | $G^{5}$ |
| 83 | $R^{1}$ | $R^{23}$ | $G^{5}$ |
| 84 | $R^{1}$ | $R^{24}$ | $G^{5}$ |
| 85 | $R^{1}$ | $R^{25}$ | $G^{5}$ |
| 86 | $R^{1}$ | $R^{26}$ | $G^{5}$ |
| 87 | $R^{1}$ | $R^{27}$ | $G^{5}$ |
| 88 | $R^{1}$ | $R^{28}$ | $G^{5}$ |
| 89 | $R^{1}$ | $R^{29}$ | $G^{5}$ |
| 90 | $R^{1}$ | $R^{30}$ | $G^{5}$ |
| 91 | $R^{1}$ | $R^{31}$ | $G^{5}$ |
| 92 | $R^{1}$ | $R^{32}$ | $G^{5}$ |
| 93 | $R^{3}$ | $R^{2}$ | $G^{5}$ |
| 94 | $R^{4}$ | $R^{2}$ | $G^{5}$ |
| 95 | $R^{5}$ | $R^{2}$ | $G^{5}$ |
| 96 | $R^{6}$ | $R^{2}$ | $G^{5}$ |
| 97 | $R^{7}$ | $R^{2}$ | $G^{5}$ |
| 98 | $R^{8}$ | $R^{2}$ | $G^{5}$ |
| 99 | $R^{9}$ | $R^{2}$ | $G^{5}$ |
| 100 | $R^{10}$ | $R^{2}$ | $G^{5}$ |
| 101 | $R^{11}$ | $R^{2}$ | $G^{5}$ |
| 102 | $R^{12}$ | $R^{2}$ | $G^{5}$ |
| 103 | $R^{13}$ | $R^{2}$ | $G^{5}$ |
| 104 | $R^{14}$ | $R^{2}$ | $G^{5}$ |
| 105 | $R^{15}$ | $R^{2}$ | $G^{5}$ |
| 106 | $R^{16}$ | $R^{2}$ | $G^{5}$ |
| 107 | $R^{17}$ | $R^{2}$ | $G^{5}$ |
| 108 | $R^{18}$ | $R^{2}$ | $G^{5}$ |
| 109 | $R^{19}$ | $R^{2}$ | $G^{5}$ |
| 110 | $R^{20}$ | $R^{2}$ | $G^{5}$ |
| 111 | $R^{21}$ | $R^{2}$ | $G^{5}$ |
| 112 | $R^{22}$ | $R^{2}$ | $G^{5}$ |
| 113 | $R^{23}$ | $R^{2}$ | $G^{5}$ |
| 114 | $R^{24}$ | $R^{2}$ | $G^{5}$ |
| 115 | $R^{25}$ | $R^{2}$ | $G^{5}$ |
| 116 | $R^{26}$ | $R^{2}$ | $G^{5}$ |
| 117 | $R^{27}$ | $R^{2}$ | $G^{5}$ |
| 118 | $R^{28}$ | $R^{2}$ | $G^{5}$ |
| 119 | $R^{29}$ | $R^{2}$ | $G^{5}$ |
| 120 | $R^{30}$ | $R^{2}$ | $G^{5}$ |
| 121 | $R^{31}$ | $R^{2}$ | $G^{5}$ |
| 122 | $R^{32}$ | $R^{2}$ | $G^{5}$ |

-continued

| i | $R_E$ | $R_F$ | G |
|---|---|---|---|
| 123 | $R^2$ | $R^3$ | $G^5$ |
| 124 | $R^2$ | $R^4$ | $G^5$ |
| 125 | $R^2$ | $R^5$ | $G^5$ |
| 126 | $R^2$ | $R^6$ | $G^5$ |
| 127 | $R^2$ | $R^7$ | $G^5$ |
| 128 | $R^2$ | $R^8$ | $G^5$ |
| 129 | $R^2$ | $R^9$ | $G^5$ |
| 130 | $R^2$ | $R^{10}$ | $G^5$ |
| 131 | $R^2$ | $R^{11}$ | $G^5$ |
| 132 | $R^2$ | $R^{12}$ | $G^5$ |
| 133 | $R^2$ | $R^{13}$ | $G^5$ |
| 134 | $R^2$ | $R^{14}$ | $G^5$ |
| 135 | $R^2$ | $R^{15}$ | $G^5$ |
| 136 | $R^2$ | $R^{16}$ | $G^5$ |
| 137 | $R^2$ | $R^{17}$ | $G^5$ |
| 138 | $R^2$ | $R^{18}$ | $G^5$ |
| 139 | $R^2$ | $R^{19}$ | $G^5$ |
| 140 | $R^2$ | $R^{20}$ | $G^5$ |
| 141 | $R^2$ | $R^{21}$ | $G^5$ |
| 142 | $R^2$ | $R^{22}$ | $G^5$ |
| 143 | $R^2$ | $R^{23}$ | $G^5$ |
| 144 | $R^2$ | $R^{24}$ | $G^5$ |
| 145 | $R^2$ | $R^{25}$ | $G^5$ |
| 146 | $R^2$ | $R^{26}$ | $G^5$ |
| 147 | $R^2$ | $R^{27}$ | $G^5$ |
| 148 | $R^2$ | $R^{28}$ | $G^5$ |
| 149 | $R^2$ | $R^{29}$ | $G^5$ |
| 150 | $R^2$ | $R^{30}$ | $G^5$ |
| 151 | $R^2$ | $R^{31}$ | $G^5$ |
| 152 | $R^2$ | $R^{32}$ | $G^5$ |
| 153 | $R^2$ | $R^{32}$ | $G^5$ |
| 154 | $R^3$ | $R^{32}$ | $G^5$ |
| 155 | $R^4$ | $R^{32}$ | $G^5$ |
| 156 | $R^5$ | $R^{32}$ | $G^5$ |
| 157 | $R^6$ | $R^{32}$ | $G^5$ |
| 158 | $R^7$ | $R^{32}$ | $G^5$ |
| 159 | $R^8$ | $R^{32}$ | $G^5$ |
| 160 | $R^9$ | $R^{32}$ | $G^5$ |
| 161 | $R^{10}$ | $R^{32}$ | $G^5$ |
| 162 | $R^{11}$ | $R^{32}$ | $G^5$ |
| 163 | $R^{12}$ | $R^{32}$ | $G^5$ |
| 164 | $R^{13}$ | $R^{32}$ | $G^5$ |
| 165 | $R^{14}$ | $R^{32}$ | $G^5$ |
| 166 | $R^{15}$ | $R^{32}$ | $G^5$ |
| 167 | $R^{16}$ | $R^{32}$ | $G^5$ |
| 168 | $R^{17}$ | $R^{32}$ | $G^5$ |
| 169 | $R^{18}$ | $R^{32}$ | $G^5$ |
| 170 | $R^{19}$ | $R^{32}$ | $G^5$ |
| 171 | $R^{20}$ | $R^{32}$ | $G^5$ |
| 172 | $R^{21}$ | $R^{32}$ | $G^5$ |
| 173 | $R^{22}$ | $R^{32}$ | $G^5$ |
| 174 | $R^{23}$ | $R^{32}$ | $G^5$ |
| 175 | $R^{24}$ | $R^{32}$ | $G^5$ |
| 176 | $R^{25}$ | $R^{32}$ | $G^5$ |
| 177 | $R^{26}$ | $R^{32}$ | $G^5$ |
| 178 | $R^{27}$ | $R^{32}$ | $G^5$ |
| 179 | $R^{28}$ | $R^{32}$ | $G^5$ |
| 180 | $R^{29}$ | $R^{32}$ | $G^5$ |
| 181 | $R^{30}$ | $R^{32}$ | $G^5$ |
| 182 | $R^{31}$ | $R^{32}$ | $G^5$ |
| 183 | $R^{32}$ | $R^2$ | $G^5$ |
| 184 | $R^{32}$ | $R^3$ | $G^5$ |
| 185 | $R^{32}$ | $R^4$ | $G^5$ |
| 186 | $R^{32}$ | $R^5$ | $G^5$ |
| 187 | $R^{32}$ | $R^6$ | $G^5$ |
| 188 | $R^{32}$ | $R^7$ | $G^5$ |
| 189 | $R^{32}$ | $R^8$ | $G^5$ |
| 190 | $R^{32}$ | $R^9$ | $G^5$ |
| 191 | $R^{32}$ | $R^{10}$ | $G^5$ |
| 192 | $R^{32}$ | $R^{11}$ | $G^5$ |
| 193 | $R^{32}$ | $R^{12}$ | $G^5$ |
| 194 | $R^{32}$ | $R^{13}$ | $G^5$ |
| 195 | $R^{32}$ | $R^{14}$ | $G^5$ |
| 196 | $R^{32}$ | $R^{15}$ | $G^5$ |
| 197 | $R^{32}$ | $R^{16}$ | $G^5$ |
| 198 | $R^{32}$ | $R^{17}$ | $G^5$ |
| 199 | $R^{32}$ | $R^{18}$ | $G^5$ |
| 200 | $R^{32}$ | $R^{19}$ | $G^5$ |
| 201 | $R^{32}$ | $R^{20}$ | $G^5$ |
| 202 | $R^{32}$ | $R^{21}$ | $G^5$ |
| 203 | $R^{32}$ | $R^{22}$ | $G^5$ |
| 204 | $R^{32}$ | $R^{23}$ | $G^5$ |
| 205 | $R^{32}$ | $R^{24}$ | $G^5$ |
| 206 | $R^{32}$ | $R^{25}$ | $G^5$ |
| 207 | $R^{32}$ | $R^{26}$ | $G^5$ |
| 208 | $R^{32}$ | $R^{27}$ | $G^5$ |
| 209 | $R^{32}$ | $R^{28}$ | $G^5$ |
| 210 | $R^{32}$ | $R^{29}$ | $G^5$ |
| 211 | $R^{32}$ | $R^{30}$ | $G^5$ |
| 212 | $R^{32}$ | $R^{31}$ | $G^5$ |
| 213 | $R^1$ | $R^1$ | $G^6$ |
| 214 | $R^2$ | $R^2$ | $G^6$ |
| 215 | $R^3$ | $R^3$ | $G^6$ |
| 216 | $R^4$ | $R^4$ | $G^6$ |
| 217 | $R^5$ | $R^5$ | $G^6$ |
| 218 | $R^6$ | $R^6$ | $G^6$ |
| 219 | $R^7$ | $R^7$ | $G^6$ |
| 220 | $R^8$ | $R^8$ | $G^6$ |
| 221 | $R^9$ | $R^9$ | $G^6$ |
| 222 | $R^{10}$ | $R^{10}$ | $G^6$ |
| 223 | $R^{11}$ | $R^{11}$ | $G^6$ |
| 224 | $R^{12}$ | $R^{12}$ | $G^6$ |
| 225 | $R^{13}$ | $R^{13}$ | $G^6$ |
| 226 | $R^{14}$ | $R^{14}$ | $G^6$ |
| 227 | $R^{15}$ | $R^{15}$ | $G^6$ |
| 228 | $R^{16}$ | $R^{16}$ | $G^6$ |
| 229 | $R^{17}$ | $R^{17}$ | $G^6$ |
| 230 | $R^{18}$ | $R^{18}$ | $G^6$ |
| 231 | $R^{19}$ | $R^{19}$ | $G^6$ |
| 232 | $R^{20}$ | $R^{20}$ | $G^6$ |
| 233 | $R^{21}$ | $R^{21}$ | $G^6$ |
| 234 | $R^{22}$ | $R^{22}$ | $G^6$ |
| 235 | $R^{23}$ | $R^{23}$ | $G^6$ |
| 236 | $R^{24}$ | $R^{24}$ | $G^6$ |
| 237 | $R^{25}$ | $R^{25}$ | $G^6$ |
| 238 | $R^{26}$ | $R^{26}$ | $G^6$ |
| 239 | $R^{27}$ | $R^{27}$ | $G^6$ |
| 240 | $R^{28}$ | $R^{28}$ | $G^6$ |
| 241 | $R^{29}$ | $R^{29}$ | $G^6$ |
| 242 | $R^{30}$ | $R^{30}$ | $G^6$ |
| 243 | $R^{31}$ | $R^{31}$ | $G^6$ |
| 244 | $R^{32}$ | $R^{32}$ | $G^6$ |
| 245 | $R^2$ | $R^1$ | $G^6$ |
| 246 | $R^3$ | $R^1$ | $G^6$ |
| 247 | $R^4$ | $R^1$ | $G^6$ |
| 248 | $R^5$ | $R^1$ | $G^6$ |
| 249 | $R^6$ | $R^1$ | $G^6$ |
| 250 | $R^7$ | $R^1$ | $G^6$ |
| 251 | $R^8$ | $R^1$ | $G^6$ |
| 252 | $R^9$ | $R^1$ | $G^6$ |
| 253 | $R^{10}$ | $R^1$ | $G^6$ |
| 254 | $R^{11}$ | $R^1$ | $G^6$ |
| 255 | $R^{12}$ | $R^1$ | $G^6$ |
| 256 | $R^{13}$ | $R^1$ | $G^6$ |
| 257 | $R^{14}$ | $R^1$ | $G^6$ |
| 258 | $R^{15}$ | $R^1$ | $G^6$ |
| 259 | $R^{16}$ | $R^1$ | $G^6$ |
| 260 | $R^{17}$ | $R^1$ | $G^6$ |
| 261 | $R^{18}$ | $R^1$ | $G^6$ |
| 262 | $R^{19}$ | $R^1$ | $G^6$ |
| 263 | $R^{20}$ | $R^1$ | $G^6$ |
| 264 | $R^{21}$ | $R^1$ | $G^6$ |
| 265 | $R^{22}$ | $R^1$ | $G^6$ |
| 266 | $R^{23}$ | $R^1$ | $G^6$ |
| 267 | $R^{24}$ | $R^1$ | $G^6$ |
| 268 | $R^{25}$ | $R^1$ | $G^6$ |
| 269 | $R^{26}$ | $R^1$ | $G^6$ |
| 270 | $R^{27}$ | $R^1$ | $G^6$ |
| 271 | $R^{28}$ | $R^1$ | $G^6$ |
| 272 | $R^{29}$ | $R^1$ | $G^6$ |
| 273 | $R^{30}$ | $R^1$ | $G^6$ |
| 274 | $R^{31}$ | $R^1$ | $G^6$ |
| 275 | $R^{32}$ | $R^1$ | $G^6$ |
| 276 | $R^1$ | $R^2$ | $G^6$ |

-continued

| i | $R_E$ | $R_F$ | G |
|---|---|---|---|
| 277 | $R^1$ | $R^3$ | $G^6$ |
| 278 | $R^1$ | $R^4$ | $G^6$ |
| 279 | $R^1$ | $R^5$ | $G^6$ |
| 280 | $R^1$ | $R^6$ | $G^6$ |
| 281 | $R^1$ | $R^7$ | $G^6$ |
| 282 | $R^1$ | $R^8$ | $G^6$ |
| 283 | $R^1$ | $R^9$ | $G^6$ |
| 284 | $R^1$ | $R^{10}$ | $G^6$ |
| 285 | $R^1$ | $R^{11}$ | $G^6$ |
| 286 | $R^1$ | $R^{12}$ | $G^6$ |
| 287 | $R^1$ | $R^{13}$ | $G^6$ |
| 288 | $R^1$ | $R^{14}$ | $G^6$ |
| 289 | $R^1$ | $R^{15}$ | $G^6$ |
| 290 | $R^1$ | $R^{16}$ | $G^6$ |
| 291 | $R^1$ | $R^{17}$ | $G^6$ |
| 292 | $R^1$ | $R^{18}$ | $G^6$ |
| 293 | $R^1$ | $R^{19}$ | $G^6$ |
| 294 | $R^1$ | $R^{20}$ | $G^6$ |
| 295 | $R^1$ | $R^{21}$ | $G^6$ |
| 296 | $R^1$ | $R^{22}$ | $G^6$ |
| 297 | $R^1$ | $R^{23}$ | $G^6$ |
| 298 | $R^1$ | $R^{24}$ | $G^6$ |
| 299 | $R^1$ | $R^{25}$ | $G^6$ |
| 300 | $R^1$ | $R^{26}$ | $G^6$ |
| 301 | $R^1$ | $R^{27}$ | $G^6$ |
| 302 | $R^1$ | $R^{28}$ | $G^6$ |
| 303 | $R^1$ | $R^{29}$ | $G^6$ |
| 304 | $R^1$ | $R^{30}$ | $G^6$ |
| 305 | $R^1$ | $R^{31}$ | $G^6$ |
| 306 | $R^1$ | $R^{32}$ | $G^6$ |
| 307 | $R^3$ | $R^2$ | $G^6$ |
| 308 | $R^4$ | $R^2$ | $G^6$ |
| 309 | $R^5$ | $R^2$ | $G^6$ |
| 310 | $R^6$ | $R^2$ | $G^6$ |
| 311 | $R^7$ | $R^2$ | $G^6$ |
| 312 | $R^8$ | $R^2$ | $G^6$ |
| 313 | $R^9$ | $R^2$ | $G^6$ |
| 314 | $R^{10}$ | $R^2$ | $G^6$ |
| 315 | $R^{11}$ | $R^2$ | $G^6$ |
| 316 | $R^{12}$ | $R^2$ | $G^6$ |
| 317 | $R^{13}$ | $R^2$ | $G^6$ |
| 318 | $R^{14}$ | $R^2$ | $G^6$ |
| 319 | $R^{15}$ | $R^2$ | $G^6$ |
| 320 | $R^{16}$ | $R^2$ | $G^6$ |
| 321 | $R^{17}$ | $R^2$ | $G^6$ |
| 322 | $R^{18}$ | $R^2$ | $G^6$ |
| 323 | $R^{19}$ | $R^2$ | $G^6$ |
| 324 | $R^{20}$ | $R^2$ | $G^6$ |
| 325 | $R^{21}$ | $R^2$ | $G^6$ |
| 326 | $R^{22}$ | $R^2$ | $G^6$ |
| 327 | $R^{23}$ | $R^2$ | $G^6$ |
| 328 | $R^{24}$ | $R^2$ | $G^6$ |
| 329 | $R^{25}$ | $R^2$ | $G^6$ |
| 330 | $R^{26}$ | $R^2$ | $G^6$ |
| 331 | $R^{27}$ | $R^2$ | $G^6$ |
| 332 | $R^{28}$ | $R^2$ | $G^6$ |
| 333 | $R^{29}$ | $R^2$ | $G^6$ |
| 334 | $R^{30}$ | $R^2$ | $G^6$ |
| 335 | $R^{31}$ | $R^2$ | $G^6$ |
| 336 | $R^{32}$ | $R^2$ | $G^6$ |
| 337 | $R^2$ | $R^3$ | $G^6$ |
| 338 | $R^2$ | $R^4$ | $G^6$ |
| 339 | $R^2$ | $R^5$ | $G^6$ |
| 340 | $R^2$ | $R^6$ | $G^6$ |
| 341 | $R^2$ | $R^7$ | $G^6$ |
| 342 | $R^2$ | $R^8$ | $G^6$ |
| 343 | $R^2$ | $R^9$ | $G^6$ |
| 344 | $R^2$ | $R^{10}$ | $G^6$ |
| 345 | $R^2$ | $R^{11}$ | $G^6$ |
| 346 | $R^2$ | $R^{12}$ | $G^6$ |
| 347 | $R^2$ | $R^{13}$ | $G^6$ |
| 348 | $R^2$ | $R^{14}$ | $G^6$ |
| 349 | $R^2$ | $R^{15}$ | $G^6$ |
| 350 | $R^2$ | $R^{16}$ | $G^6$ |
| 351 | $R^2$ | $R^{17}$ | $G^6$ |
| 352 | $R^2$ | $R^{18}$ | $G^6$ |
| 353 | $R^2$ | $R^{19}$ | $G^6$ |

-continued

| i | $R_E$ | $R_F$ | G |
|---|---|---|---|
| 354 | $R^2$ | $R^{20}$ | $G^6$ |
| 355 | $R^2$ | $R^{21}$ | $G^6$ |
| 356 | $R^2$ | $R^{22}$ | $G^6$ |
| 357 | $R^2$ | $R^{23}$ | $G^6$ |
| 358 | $R^2$ | $R^{24}$ | $G^6$ |
| 359 | $R^2$ | $R^{25}$ | $G^6$ |
| 360 | $R^2$ | $R^{26}$ | $G^6$ |
| 361 | $R^2$ | $R^{27}$ | $G^6$ |
| 362 | $R^2$ | $R^{28}$ | $G^6$ |
| 363 | $R^2$ | $R^{29}$ | $G^6$ |
| 364 | $R^2$ | $R^{30}$ | $G^6$ |
| 365 | $R^2$ | $R^{31}$ | $G^6$ |
| 366 | $R^2$ | $R^{32}$ | $G^6$ |
| 367 | $R^2$ | $R^{32}$ | $G^6$ |
| 368 | $R^3$ | $R^{32}$ | $G^6$ |
| 369 | $R^4$ | $R^{32}$ | $G^6$ |
| 370 | $R^5$ | $R^{32}$ | $G^6$ |
| 371 | $R^6$ | $R^{32}$ | $G^6$ |
| 372 | $R^7$ | $R^{32}$ | $G^6$ |
| 373 | $R^8$ | $R^{32}$ | $G^6$ |
| 374 | $R^9$ | $R^{32}$ | $G^6$ |
| 375 | $R^{10}$ | $R^{32}$ | $G^6$ |
| 376 | $R^{11}$ | $R^{32}$ | $G^6$ |
| 377 | $R^{12}$ | $R^{32}$ | $G^6$ |
| 378 | $R^{13}$ | $R^{32}$ | $G^6$ |
| 379 | $R^{14}$ | $R^{32}$ | $G^6$ |
| 380 | $R^{15}$ | $R^{32}$ | $G^6$ |
| 381 | $R^{16}$ | $R^{32}$ | $G^6$ |
| 382 | $R^{17}$ | $R^{32}$ | $G^6$ |
| 383 | $R^{18}$ | $R^{32}$ | $G^6$ |
| 384 | $R^{19}$ | $R^{32}$ | $G^6$ |
| 385 | $R^{20}$ | $R^{32}$ | $G^6$ |
| 386 | $R^{21}$ | $R^{32}$ | $G^6$ |
| 387 | $R^{22}$ | $R^{32}$ | $G^6$ |
| 388 | $R^{23}$ | $R^{32}$ | $G^6$ |
| 389 | $R^{24}$ | $R^{32}$ | $G^6$ |
| 390 | $R^{25}$ | $R^{32}$ | $G^6$ |
| 391 | $R^{26}$ | $R^{32}$ | $G^6$ |
| 392 | $R^{27}$ | $R^{32}$ | $G^6$ |
| 393 | $R^{28}$ | $R^{32}$ | $G^6$ |
| 394 | $R^{29}$ | $R^{32}$ | $G^6$ |
| 395 | $R^{30}$ | $R^{32}$ | $G^6$ |
| 396 | $R^{31}$ | $R^{32}$ | $G^6$ |
| 397 | $R^{32}$ | $R^2$ | $G^6$ |
| 398 | $R^{32}$ | $R^3$ | $G^6$ |
| 399 | $R^{32}$ | $R^4$ | $G^6$ |
| 400 | $R^{32}$ | $R^5$ | $G^6$ |
| 401 | $R^{32}$ | $R^6$ | $G^6$ |
| 402 | $R^{32}$ | $R^7$ | $G^6$ |
| 403 | $R^{32}$ | $R^8$ | $G^6$ |
| 404 | $R^{32}$ | $R^9$ | $G^6$ |
| 405 | $R^{32}$ | $R^{10}$ | $G^6$ |
| 406 | $R^{32}$ | $R^{11}$ | $G^6$ |
| 407 | $R^{32}$ | $R^{12}$ | $G^6$ |
| 408 | $R^{32}$ | $R^{13}$ | $G^6$ |
| 409 | $R^{32}$ | $R^{14}$ | $G^6$ |
| 410 | $R^{32}$ | $R^{15}$ | $G^6$ |
| 411 | $R^{32}$ | $R^{16}$ | $G^6$ |
| 412 | $R^{32}$ | $R^{17}$ | $G^6$ |
| 413 | $R^{32}$ | $R^{18}$ | $G^6$ |
| 414 | $R^{32}$ | $R^{19}$ | $G^6$ |
| 415 | $R^{32}$ | $R^{20}$ | $G^6$ |
| 416 | $R^{32}$ | $R^{21}$ | $G^6$ |
| 417 | $R^{32}$ | $R^{22}$ | $G^6$ |
| 418 | $R^{32}$ | $R^{23}$ | $G^6$ |
| 419 | $R^{32}$ | $R^{24}$ | $G^6$ |
| 420 | $R^{32}$ | $R^{25}$ | $G^6$ |
| 421 | $R^{32}$ | $R^{26}$ | $G^6$ |
| 422 | $R^{32}$ | $R^{27}$ | $G^6$ |
| 423 | $R^{32}$ | $R^{28}$ | $G^6$ |
| 424 | $R^{32}$ | $R^{29}$ | $G^6$ |
| 425 | $R^{32}$ | $R^{30}$ | $G^6$ |
| 426 | $R^{32}$ | $R^{31}$ | $G^6$ |
| 427 | $R^1$ | $R^{33}$ | $G^5$ |
| 428 | $R^1$ | $R^{34}$ | $G^5$ |
| 429 | $R^1$ | $R^{35}$ | $G^5$ |
| 430 | $R^1$ | $R^{36}$ | $G^5$ |

-continued

| i | $R_E$ | $R_F$ | G |
|---|---|---|---|
| 431 | $R^{1}$ | $R^{37}$ | $G^{5}$ |
| 432 | $R^{1}$ | $R^{38}$ | $G^{5}$ |
| 433 | $R^{1}$ | $R^{39}$ | $G^{5}$ |
| 434 | $R^{1}$ | $R^{40}$ | $G^{5}$ |
| 435 | $R^{1}$ | $R^{41}$ | $G^{5}$ |
| 436 | $R^{33}$ | $R^{1}$ | $G^{5}$ |
| 437 | $R^{34}$ | $R^{1}$ | $G^{5}$ |
| 438 | $R^{35}$ | $R^{1}$ | $G^{5}$ |
| 439 | $R^{36}$ | $R^{1}$ | $G^{5}$ |
| 440 | $R^{37}$ | $R^{1}$ | $G^{5}$ |
| 441 | $R^{38}$ | $R^{1}$ | $G^{5}$ |
| 442 | $R^{39}$ | $R^{1}$ | $G^{5}$ |
| 443 | $R^{40}$ | $R^{1}$ | $G^{5}$ |
| 444 | $R^{41}$ | $R^{1}$ | $G^{5}$ |
| 445 | $R^{1}$ | $R^{1}$ | $G^{8}$ |
| 446 | $R^{2}$ | $R^{2}$ | $G^{8}$ |
| 447 | $R^{3}$ | $R^{3}$ | $G^{8}$ |
| 448 | $R^{4}$ | $R^{4}$ | $G^{8}$ |
| 449 | $R^{5}$ | $R^{5}$ | $G^{8}$ |
| 450 | $R^{6}$ | $R^{6}$ | $G^{8}$ |
| 451 | $R^{7}$ | $R^{7}$ | $G^{8}$ |
| 452 | $R^{8}$ | $R^{8}$ | $G^{8}$ |
| 453 | $R^{9}$ | $R^{9}$ | $G^{8}$ |
| 454 | $R^{10}$ | $R^{10}$ | $G^{8}$ |
| 455 | $R^{11}$ | $R^{11}$ | $G^{8}$ |
| 456 | $R^{12}$ | $R^{12}$ | $G^{8}$ |
| 457 | $R^{13}$ | $R^{13}$ | $G^{8}$ |
| 458 | $R^{14}$ | $R^{14}$ | $G^{8}$ |
| 459 | $R^{15}$ | $R^{15}$ | $G^{8}$ |
| 460 | $R^{16}$ | $R^{16}$ | $G^{8}$ |
| 461 | $R^{17}$ | $R^{17}$ | $G^{8}$ |
| 462 | $R^{18}$ | $R^{18}$ | $G^{8}$ |
| 463 | $R^{19}$ | $R^{19}$ | $G^{8}$ |
| 464 | $R^{20}$ | $R^{20}$ | $G^{8}$ |
| 465 | $R^{21}$ | $R^{21}$ | $G^{8}$ |
| 466 | $R^{22}$ | $R^{22}$ | $G^{8}$ |
| 467 | $R^{23}$ | $R^{23}$ | $G^{8}$ |
| 468 | $R^{24}$ | $R^{24}$ | $G^{8}$ |
| 469 | $R^{25}$ | $R^{25}$ | $G^{8}$ |
| 470 | $R^{26}$ | $R^{26}$ | $G^{8}$ |
| 471 | $R^{27}$ | $R^{27}$ | $G^{8}$ |
| 472 | $R^{28}$ | $R^{28}$ | $G^{8}$ |
| 473 | $R^{29}$ | $R^{29}$ | $G^{8}$ |
| 474 | $R^{30}$ | $R^{30}$ | $G^{8}$ |
| 475 | $R^{31}$ | $R^{31}$ | $G^{8}$ |
| 476 | $R^{32}$ | $R^{32}$ | $G^{8}$ |
| 477 | $R^{2}$ | $R^{1}$ | $G^{8}$ |
| 478 | $R^{3}$ | $R^{1}$ | $G^{8}$ |
| 479 | $R^{4}$ | $R^{1}$ | $G^{8}$ |
| 480 | $R^{5}$ | $R^{1}$ | $G^{8}$ |
| 481 | $R^{6}$ | $R^{1}$ | $G^{8}$ |
| 482 | $R^{7}$ | $R^{1}$ | $G^{8}$ |
| 483 | $R^{8}$ | $R^{1}$ | $G^{8}$ |
| 484 | $R^{9}$ | $R^{1}$ | $G^{8}$ |
| 485 | $R^{10}$ | $R^{1}$ | $G^{8}$ |
| 486 | $R^{11}$ | $R^{1}$ | $G^{8}$ |
| 487 | $R^{12}$ | $R^{1}$ | $G^{8}$ |
| 488 | $R^{13}$ | $R^{1}$ | $G^{8}$ |
| 489 | $R^{14}$ | $R^{1}$ | $G^{8}$ |
| 490 | $R^{15}$ | $R^{1}$ | $G^{8}$ |
| 491 | $R^{16}$ | $R^{1}$ | $G^{8}$ |
| 492 | $R^{17}$ | $R^{1}$ | $G^{8}$ |
| 493 | $R^{18}$ | $R^{1}$ | $G^{8}$ |
| 494 | $R^{19}$ | $R^{1}$ | $G^{8}$ |
| 495 | $R^{20}$ | $R^{1}$ | $G^{8}$ |
| 496 | $R^{21}$ | $R^{1}$ | $G^{8}$ |
| 497 | $R^{22}$ | $R^{1}$ | $G^{8}$ |
| 498 | $R^{23}$ | $R^{1}$ | $G^{8}$ |
| 499 | $R^{24}$ | $R^{1}$ | $G^{8}$ |
| 500 | $R^{25}$ | $R^{1}$ | $G^{8}$ |
| 501 | $R^{26}$ | $R^{1}$ | $G^{8}$ |
| 502 | $R^{27}$ | $R^{1}$ | $G^{8}$ |
| 503 | $R^{28}$ | $R^{1}$ | $G^{8}$ |
| 504 | $R^{29}$ | $R^{1}$ | $G^{8}$ |
| 505 | $R^{30}$ | $R^{1}$ | $G^{8}$ |
| 506 | $R^{31}$ | $R^{1}$ | $G^{8}$ |
| 507 | $R^{32}$ | $R^{1}$ | $G^{8}$ |

-continued

| i | $R_E$ | $R_F$ | G |
|---|---|---|---|
| 508 | $R^{1}$ | $R^{2}$ | $G^{8}$ |
| 509 | $R^{1}$ | $R^{3}$ | $G^{8}$ |
| 510 | $R^{1}$ | $R^{4}$ | $G^{8}$ |
| 511 | $R^{1}$ | $R^{5}$ | $G^{8}$ |
| 512 | $R^{1}$ | $R^{6}$ | $G^{8}$ |
| 513 | $R^{1}$ | $R^{7}$ | $G^{8}$ |
| 514 | $R^{1}$ | $R^{8}$ | $G^{8}$ |
| 515 | $R^{1}$ | $R^{9}$ | $G^{8}$ |
| 516 | $R^{1}$ | $R^{10}$ | $G^{8}$ |
| 517 | $R^{1}$ | $R^{11}$ | $G^{8}$ |
| 518 | $R^{1}$ | $R^{12}$ | $G^{8}$ |
| 519 | $R^{1}$ | $R^{13}$ | $G^{8}$ |
| 520 | $R^{1}$ | $R^{14}$ | $G^{8}$ |
| 521 | $R^{1}$ | $R^{15}$ | $G^{8}$ |
| 522 | $R^{1}$ | $R^{16}$ | $G^{8}$ |
| 523 | $R^{1}$ | $R^{17}$ | $G^{8}$ |
| 524 | $R^{1}$ | $R^{18}$ | $G^{8}$ |
| 525 | $R^{1}$ | $R^{19}$ | $G^{8}$ |
| 526 | $R^{1}$ | $R^{20}$ | $G^{8}$ |
| 527 | $R^{1}$ | $R^{21}$ | $G^{8}$ |
| 528 | $R^{1}$ | $R^{22}$ | $G^{8}$ |
| 529 | $R^{1}$ | $R^{23}$ | $G^{8}$ |
| 530 | $R^{1}$ | $R^{24}$ | $G^{8}$ |
| 531 | $R^{1}$ | $R^{25}$ | $G^{8}$ |
| 532 | $R^{1}$ | $R^{26}$ | $G^{8}$ |
| 533 | $R^{1}$ | $R^{27}$ | $G^{8}$ |
| 534 | $R^{1}$ | $R^{28}$ | $G^{8}$ |
| 535 | $R^{1}$ | $R^{29}$ | $G^{8}$ |
| 536 | $R^{1}$ | $R^{30}$ | $G^{8}$ |
| 537 | $R^{1}$ | $R^{31}$ | $G^{8}$ |
| 538 | $R^{1}$ | $R^{32}$ | $G^{8}$ |
| 539 | $R^{3}$ | $R^{2}$ | $G^{8}$ |
| 540 | $R^{4}$ | $R^{2}$ | $G^{8}$ |
| 541 | $R^{5}$ | $R^{2}$ | $G^{8}$ |
| 542 | $R^{6}$ | $R^{2}$ | $G^{8}$ |
| 543 | $R^{7}$ | $R^{2}$ | $G^{8}$ |
| 544 | $R^{8}$ | $R^{2}$ | $G^{8}$ |
| 545 | $R^{9}$ | $R^{2}$ | $G^{8}$ |
| 546 | $R^{10}$ | $R^{2}$ | $G^{8}$ |
| 547 | $R^{11}$ | $R^{2}$ | $G^{8}$ |
| 548 | $R^{12}$ | $R^{2}$ | $G^{8}$ |
| 549 | $R^{13}$ | $R^{2}$ | $G^{8}$ |
| 550 | $R^{14}$ | $R^{2}$ | $G^{8}$ |
| 551 | $R^{15}$ | $R^{2}$ | $G^{8}$ |
| 552 | $R^{16}$ | $R^{2}$ | $G^{8}$ |
| 553 | $R^{17}$ | $R^{2}$ | $G^{8}$ |
| 554 | $R^{18}$ | $R^{2}$ | $G^{8}$ |
| 555 | $R^{19}$ | $R^{2}$ | $G^{8}$ |
| 556 | $R^{20}$ | $R^{2}$ | $G^{8}$ |
| 557 | $R^{21}$ | $R^{2}$ | $G^{8}$ |
| 558 | $R^{22}$ | $R^{2}$ | $G^{8}$ |
| 559 | $R^{23}$ | $R^{2}$ | $G^{8}$ |
| 560 | $R^{24}$ | $R^{2}$ | $G^{8}$ |
| 561 | $R^{25}$ | $R^{2}$ | $G^{8}$ |
| 562 | $R^{26}$ | $R^{2}$ | $G^{8}$ |
| 563 | $R^{27}$ | $R^{2}$ | $G^{8}$ |
| 564 | $R^{28}$ | $R^{2}$ | $G^{8}$ |
| 565 | $R^{29}$ | $R^{2}$ | $G^{8}$ |
| 566 | $R^{30}$ | $R^{2}$ | $G^{8}$ |
| 567 | $R^{31}$ | $R^{2}$ | $G^{8}$ |
| 568 | $R^{32}$ | $R^{2}$ | $G^{8}$ |
| 569 | $R^{2}$ | $R^{3}$ | $G^{8}$ |
| 570 | $R^{2}$ | $R^{4}$ | $G^{8}$ |
| 571 | $R^{2}$ | $R^{5}$ | $G^{8}$ |
| 572 | $R^{2}$ | $R^{6}$ | $G^{8}$ |
| 573 | $R^{2}$ | $R^{7}$ | $G^{8}$ |
| 574 | $R^{2}$ | $R^{8}$ | $G^{8}$ |
| 575 | $R^{2}$ | $R^{9}$ | $G^{8}$ |
| 576 | $R^{2}$ | $R^{10}$ | $G^{8}$ |
| 577 | $R^{2}$ | $R^{11}$ | $G^{8}$ |
| 578 | $R^{2}$ | $R^{12}$ | $G^{8}$ |
| 579 | $R^{2}$ | $R^{13}$ | $G^{8}$ |
| 580 | $R^{2}$ | $R^{14}$ | $G^{8}$ |
| 581 | $R^{2}$ | $R^{15}$ | $G^{8}$ |
| 582 | $R^{2}$ | $R^{16}$ | $G^{8}$ |
| 583 | $R^{2}$ | $R^{17}$ | $G^{8}$ |
| 584 | $R^{2}$ | $R^{18}$ | $G^{8}$ |

-continued

| i | $R_E$ | $R_F$ | G |
|---|---|---|---|
| 585 | $R^2$ | $R^{19}$ | $G^8$ |
| 586 | $R^2$ | $R^{20}$ | $G^8$ |
| 587 | $R^2$ | $R^{21}$ | $G^8$ |
| 588 | $R^2$ | $R^{22}$ | $G^8$ |
| 589 | $R^2$ | $R^{23}$ | $G^8$ |
| 590 | $R^2$ | $R^{24}$ | $G^8$ |
| 591 | $R^2$ | $R^{25}$ | $G^8$ |
| 592 | $R^2$ | $R^{26}$ | $G^8$ |
| 593 | $R^2$ | $R^{27}$ | $G^8$ |
| 594 | $R^2$ | $R^{28}$ | $G^8$ |
| 595 | $R^2$ | $R^{29}$ | $G^8$ |
| 596 | $R^2$ | $R^{30}$ | $G^8$ |
| 597 | $R^2$ | $R^{31}$ | $G^8$ |
| 598 | $R^2$ | $R^{32}$ | $G^8$ |
| 599 | $R^2$ | $R^{32}$ | $G^8$ |
| 600 | $R^3$ | $R^{32}$ | $G^8$ |
| 601 | $R^4$ | $R^{32}$ | $G^8$ |
| 602 | $R^5$ | $R^{32}$ | $G^8$ |
| 603 | $R^6$ | $R^{32}$ | $G^8$ |
| 604 | $R^7$ | $R^{32}$ | $G^8$ |
| 605 | $R^8$ | $R^{32}$ | $G^8$ |
| 606 | $R^9$ | $R^{32}$ | $G^8$ |
| 607 | $R^{10}$ | $R^{32}$ | $G^8$ |
| 608 | $R^{11}$ | $R^{32}$ | $G^8$ |
| 609 | $R^{12}$ | $R^{32}$ | $G^8$ |
| 610 | $R^{13}$ | $R^{32}$ | $G^8$ |
| 611 | $R^{14}$ | $R^{32}$ | $G^8$ |
| 612 | $R^{15}$ | $R^{32}$ | $G^8$ |
| 613 | $R^{16}$ | $R^{32}$ | $G^8$ |
| 614 | $R^{17}$ | $R^{32}$ | $G^8$ |
| 615 | $R^{18}$ | $R^{32}$ | $G^8$ |
| 616 | $R^{19}$ | $R^{32}$ | $G^8$ |
| 617 | $R^{20}$ | $R^{32}$ | $G^8$ |
| 618 | $R^{21}$ | $R^{32}$ | $G^8$ |
| 619 | $R^{22}$ | $R^{32}$ | $G^8$ |
| 620 | $R^{23}$ | $R^{32}$ | $G^8$ |
| 621 | $R^{24}$ | $R^{32}$ | $G^8$ |
| 622 | $R^{25}$ | $R^{32}$ | $G^8$ |
| 623 | $R^{26}$ | $R^{32}$ | $G^8$ |
| 624 | $R^{27}$ | $R^{32}$ | $G^8$ |
| 625 | $R^{28}$ | $R^{32}$ | $G^8$ |
| 626 | $R^{29}$ | $R^{32}$ | $G^8$ |
| 627 | $R^{30}$ | $R^{32}$ | $G^8$ |
| 628 | $R^{31}$ | $R^{32}$ | $G^8$ |
| 629 | $R^{32}$ | $R^2$ | $G^8$ |
| 630 | $R^{32}$ | $R^3$ | $G^8$ |
| 631 | $R^{32}$ | $R^4$ | $G^8$ |
| 632 | $R^{32}$ | $R^5$ | $G^8$ |
| 633 | $R^{32}$ | $R^6$ | $G^8$ |
| 634 | $R^{32}$ | $R^7$ | $G^8$ |
| 635 | $R^{32}$ | $R^8$ | $G^8$ |
| 636 | $R^{32}$ | $R^9$ | $G^8$ |
| 637 | $R^{32}$ | $R^{10}$ | $G^8$ |
| 638 | $R^{32}$ | $R^{11}$ | $G^8$ |
| 639 | $R^{32}$ | $R^{12}$ | $G^8$ |
| 640 | $R^{32}$ | $R^{13}$ | $G^8$ |
| 641 | $R^{32}$ | $R^{14}$ | $G^8$ |
| 642 | $R^{32}$ | $R^{15}$ | $G^8$ |
| 643 | $R^{32}$ | $R^{16}$ | $G^8$ |
| 644 | $R^{32}$ | $R^{17}$ | $G^8$ |
| 645 | $R^{32}$ | $R^{18}$ | $G^8$ |
| 646 | $R^{32}$ | $R^{19}$ | $G^8$ |
| 647 | $R^{32}$ | $R^{20}$ | $G^8$ |
| 648 | $R^{32}$ | $R^{21}$ | $G^8$ |
| 649 | $R^{32}$ | $R^{22}$ | $G^8$ |
| 650 | $R^{32}$ | $R^{23}$ | $G^8$ |
| 651 | $R^{32}$ | $R^{24}$ | $G^8$ |
| 652 | $R^{32}$ | $R^{25}$ | $G^8$ |
| 653 | $R^{32}$ | $R^{26}$ | $G^8$ |
| 654 | $R^{32}$ | $R^{27}$ | $G^8$ |
| 655 | $R^{32}$ | $R^{28}$ | $G^8$ |
| 656 | $R^{32}$ | $R^{29}$ | $G^8$ |
| 657 | $R^{32}$ | $R^{30}$ | $G^8$ |
| 658 | $R^{32}$ | $R^{31}$ | $G^8$ |
| 659 | $R^1$ | $R^1$ | $G^9$ |
| 660 | $R^2$ | $R^2$ | $G^9$ |
| 661 | $R^3$ | $R^3$ | $G^9$ |

-continued

| i | $R_E$ | $R_F$ | G |
|---|---|---|---|
| 662 | $R^4$ | $R^4$ | $G^9$ |
| 663 | $R^5$ | $R^5$ | $G^9$ |
| 664 | $R^6$ | $R^6$ | $G^9$ |
| 665 | $R^7$ | $R^7$ | $G^9$ |
| 666 | $R^8$ | $R^8$ | $G^9$ |
| 667 | $R^9$ | $R^9$ | $G^9$ |
| 668 | $R^{10}$ | $R^{10}$ | $G^9$ |
| 669 | $R^{11}$ | $R^{11}$ | $G^9$ |
| 670 | $R^{12}$ | $R^{12}$ | $G^9$ |
| 671 | $R^{13}$ | $R^{13}$ | $G^9$ |
| 672 | $R^{14}$ | $R^{14}$ | $G^9$ |
| 673 | $R^{15}$ | $R^{15}$ | $G^9$ |
| 674 | $R^{16}$ | $R^{16}$ | $G^9$ |
| 675 | $R^{17}$ | $R^{17}$ | $G^9$ |
| 676 | $R^{18}$ | $R^{18}$ | $G^9$ |
| 677 | $R^{19}$ | $R^{19}$ | $G^9$ |
| 678 | $R^{20}$ | $R^{20}$ | $G^9$ |
| 679 | $R^{21}$ | $R^{21}$ | $G^9$ |
| 680 | $R^{22}$ | $R^{22}$ | $G^9$ |
| 681 | $R^{23}$ | $R^{23}$ | $G^9$ |
| 682 | $R^{24}$ | $R^{24}$ | $G^9$ |
| 683 | $R^{25}$ | $R^{25}$ | $G^9$ |
| 684 | $R^{26}$ | $R^{26}$ | $G^9$ |
| 685 | $R^{27}$ | $R^{27}$ | $G^9$ |
| 686 | $R^{28}$ | $R^{28}$ | $G^9$ |
| 687 | $R^{29}$ | $R^{29}$ | $G^9$ |
| 688 | $R^{30}$ | $R^{30}$ | $G^9$ |
| 689 | $R^{31}$ | $R^{31}$ | $G^9$ |
| 690 | $R^{32}$ | $R^{32}$ | $G^9$ |
| 691 | $R^2$ | $R^1$ | $G^9$ |
| 692 | $R^3$ | $R^1$ | $G^9$ |
| 693 | $R^4$ | $R^1$ | $G^9$ |
| 694 | $R^5$ | $R^1$ | $G^9$ |
| 695 | $R^6$ | $R^1$ | $G^9$ |
| 696 | $R^7$ | $R^1$ | $G^9$ |
| 697 | $R^8$ | $R^1$ | $G^9$ |
| 698 | $R^9$ | $R^1$ | $G^9$ |
| 699 | $R^{10}$ | $R^1$ | $G^9$ |
| 700 | $R^{11}$ | $R^1$ | $G^9$ |
| 701 | $R^{12}$ | $R^1$ | $G^9$ |
| 702 | $R^{13}$ | $R^1$ | $G^9$ |
| 703 | $R^{14}$ | $R^1$ | $G^9$ |
| 704 | $R^{15}$ | $R^1$ | $G^9$ |
| 705 | $R^{16}$ | $R^1$ | $G^9$ |
| 706 | $R^{17}$ | $R^1$ | $G^9$ |
| 707 | $R^{18}$ | $R^1$ | $G^9$ |
| 708 | $R^{19}$ | $R^1$ | $G^9$ |
| 709 | $R^{20}$ | $R^1$ | $G^9$ |
| 710 | $R^{21}$ | $R^1$ | $G^9$ |
| 711 | $R^{22}$ | $R^1$ | $G^9$ |
| 712 | $R^{23}$ | $R^1$ | $G^9$ |
| 713 | $R^{24}$ | $R^1$ | $G^9$ |
| 714 | $R^{25}$ | $R^1$ | $G^9$ |
| 715 | $R^{26}$ | $R^1$ | $G^9$ |
| 716 | $R^{27}$ | $R^1$ | $G^9$ |
| 717 | $R^{28}$ | $R^1$ | $G^9$ |
| 718 | $R^{29}$ | $R^1$ | $G^9$ |
| 719 | $R^{30}$ | $R^1$ | $G^9$ |
| 720 | $R^{31}$ | $R^1$ | $G^9$ |
| 721 | $R^{32}$ | $R^1$ | $G^9$ |
| 722 | $R^1$ | $R^2$ | $G^9$ |
| 723 | $R^1$ | $R^3$ | $G^9$ |
| 724 | $R^1$ | $R^4$ | $G^9$ |
| 725 | $R^1$ | $R^5$ | $G^9$ |
| 726 | $R^1$ | $R^6$ | $G^9$ |
| 727 | $R^1$ | $R^7$ | $G^9$ |
| 728 | $R^1$ | $R^8$ | $G^9$ |
| 729 | $R^1$ | $R^9$ | $G^9$ |
| 730 | $R^1$ | $R^{10}$ | $G^9$ |
| 731 | $R^1$ | $R^{11}$ | $G^9$ |
| 732 | $R^1$ | $R^{12}$ | $G^9$ |
| 733 | $R^1$ | $R^{13}$ | $G^9$ |
| 734 | $R^1$ | $R^{14}$ | $G^9$ |
| 735 | $R^1$ | $R^{15}$ | $G^9$ |
| 736 | $R^1$ | $R^{16}$ | $G^9$ |
| 737 | $R^1$ | $R^{17}$ | $G^9$ |
| 738 | $R^1$ | $R^{18}$ | $G^9$ |

-continued

| i | $R_E$ | $R_F$ | G |
|---|---|---|---|
| 739 | $R^1$ | $R^{19}$ | $G^9$ |
| 740 | $R^1$ | $R^{20}$ | $G^9$ |
| 741 | $R^1$ | $R^{21}$ | $G^9$ |
| 742 | $R^1$ | $R^{22}$ | $G^9$ |
| 743 | $R^1$ | $R^{23}$ | $G^9$ |
| 744 | $R^1$ | $R^{24}$ | $G^9$ |
| 745 | $R^1$ | $R^{25}$ | $G^9$ |
| 746 | $R^1$ | $R^{26}$ | $G^9$ |
| 747 | $R^1$ | $R^{27}$ | $G^9$ |
| 748 | $R^1$ | $R^{28}$ | $G^9$ |
| 749 | $R^1$ | $R^{29}$ | $G^9$ |
| 750 | $R^1$ | $R^{30}$ | $G^9$ |
| 751 | $R^1$ | $R^{31}$ | $G^9$ |
| 752 | $R^1$ | $R^{32}$ | $G^9$ |
| 753 | $R^3$ | $R^2$ | $G^9$ |
| 754 | $R^4$ | $R^2$ | $G^9$ |
| 755 | $R^5$ | $R^2$ | $G^9$ |
| 756 | $R^6$ | $R^2$ | $G^9$ |
| 757 | $R^7$ | $R^2$ | $G^9$ |
| 758 | $R^8$ | $R^2$ | $G^9$ |
| 759 | $R^9$ | $R^2$ | $G^9$ |
| 760 | $R^{10}$ | $R^2$ | $G^9$ |
| 761 | $R^{11}$ | $R^2$ | $G^9$ |
| 762 | $R^{12}$ | $R^2$ | $G^9$ |
| 763 | $R^{13}$ | $R^2$ | $G^9$ |
| 764 | $R^{14}$ | $R^2$ | $G^9$ |
| 765 | $R^{15}$ | $R^2$ | $G^9$ |
| 766 | $R^{16}$ | $R^2$ | $G^9$ |
| 767 | $R^{17}$ | $R^2$ | $G^9$ |
| 768 | $R^{18}$ | $R^2$ | $G^9$ |
| 769 | $R^{19}$ | $R^2$ | $G^9$ |
| 770 | $R^{20}$ | $R^2$ | $G^9$ |
| 771 | $R^{21}$ | $R^2$ | $G^9$ |
| 772 | $R^{22}$ | $R^2$ | $G^9$ |
| 773 | $R^{23}$ | $R^2$ | $G^9$ |
| 774 | $R^{24}$ | $R^2$ | $G^9$ |
| 775 | $R^{25}$ | $R^2$ | $G^9$ |
| 776 | $R^{26}$ | $R^2$ | $G^9$ |
| 777 | $R^{27}$ | $R^2$ | $G^9$ |
| 778 | $R^{28}$ | $R^2$ | $G^9$ |
| 779 | $R^{29}$ | $R^2$ | $G^9$ |
| 780 | $R^{30}$ | $R^2$ | $G^9$ |
| 781 | $R^{31}$ | $R^2$ | $G^9$ |
| 782 | $R^{32}$ | $R^2$ | $G^9$ |
| 783 | $R^2$ | $R^3$ | $G^9$ |
| 784 | $R^2$ | $R^4$ | $G^9$ |
| 785 | $R^2$ | $R^5$ | $G^9$ |
| 786 | $R^2$ | $R^6$ | $G^9$ |
| 787 | $R^2$ | $R^7$ | $G^9$ |
| 788 | $R^2$ | $R^8$ | $G^9$ |
| 789 | $R^2$ | $R^9$ | $G^9$ |
| 790 | $R^2$ | $R^{10}$ | $G^9$ |
| 791 | $R^2$ | $R^{11}$ | $G^9$ |
| 792 | $R^2$ | $R^{12}$ | $G^9$ |
| 793 | $R^2$ | $R^{13}$ | $G^9$ |
| 794 | $R^2$ | $R^{14}$ | $G^9$ |
| 795 | $R^2$ | $R^{15}$ | $G^9$ |
| 796 | $R^2$ | $R^{16}$ | $G^9$ |
| 797 | $R^2$ | $R^{17}$ | $G^9$ |
| 798 | $R^2$ | $R^{18}$ | $G^9$ |
| 799 | $R^2$ | $R^{19}$ | $G^9$ |
| 800 | $R^2$ | $R^{20}$ | $G^9$ |
| 801 | $R^2$ | $R^{21}$ | $G^9$ |
| 802 | $R^2$ | $R^{22}$ | $G^9$ |
| 803 | $R^2$ | $R^{23}$ | $G^9$ |
| 804 | $R^2$ | $R^{24}$ | $G^9$ |
| 805 | $R^2$ | $R^{25}$ | $G^9$ |
| 806 | $R^2$ | $R^{26}$ | $G^9$ |
| 807 | $R^2$ | $R^{27}$ | $G^9$ |
| 808 | $R^2$ | $R^{28}$ | $G^9$ |
| 809 | $R^2$ | $R^{29}$ | $G^9$ |
| 810 | $R^2$ | $R^{30}$ | $G^9$ |
| 811 | $R^2$ | $R^{31}$ | $G^9$ |
| 812 | $R^2$ | $R^{32}$ | $G^9$ |
| 813 | $R^2$ | $R^{32}$ | $G^9$ |
| 814 | $R^3$ | $R^{32}$ | $G^9$ |
| 815 | $R^4$ | $R^{32}$ | $G^9$ |

-continued

| i | $R_E$ | $R_F$ | G |
|---|---|---|---|
| 816 | $R^5$ | $R^{32}$ | $G^9$ |
| 817 | $R^6$ | $R^{32}$ | $G^9$ |
| 818 | $R^7$ | $R^{32}$ | $G^9$ |
| 819 | $R^8$ | $R^{32}$ | $G^9$ |
| 820 | $R^9$ | $R^{32}$ | $G^9$ |
| 821 | $R^{10}$ | $R^{32}$ | $G^9$ |
| 822 | $R^{11}$ | $R^{32}$ | $G^9$ |
| 823 | $R^{12}$ | $R^{32}$ | $G^9$ |
| 824 | $R^{13}$ | $R^{32}$ | $G^9$ |
| 825 | $R^{14}$ | $R^{32}$ | $G^9$ |
| 826 | $R^{15}$ | $R^{32}$ | $G^9$ |
| 827 | $R^{16}$ | $R^{32}$ | $G^9$ |
| 828 | $R^{17}$ | $R^{32}$ | $G^9$ |
| 829 | $R^{18}$ | $R^{32}$ | $G^9$ |
| 830 | $R^{19}$ | $R^{32}$ | $G^9$ |
| 831 | $R^{20}$ | $R^{32}$ | $G^9$ |
| 832 | $R^{21}$ | $R^{32}$ | $G^9$ |
| 833 | $R^{22}$ | $R^{32}$ | $G^9$ |
| 834 | $R^{23}$ | $R^{32}$ | $G^9$ |
| 835 | $R^{24}$ | $R^{32}$ | $G^9$ |
| 836 | $R^{25}$ | $R^{32}$ | $G^9$ |
| 837 | $R^{26}$ | $R^{32}$ | $G^9$ |
| 838 | $R^{27}$ | $R^{32}$ | $G^9$ |
| 839 | $R^{28}$ | $R^{32}$ | $G^9$ |
| 840 | $R^{29}$ | $R^{32}$ | $G^9$ |
| 841 | $R^{30}$ | $R^{32}$ | $G^9$ |
| 842 | $R^{31}$ | $R^{32}$ | $G^9$ |
| 843 | $R^{32}$ | $R^2$ | $G^9$ |
| 844 | $R^{32}$ | $R^3$ | $G^9$ |
| 845 | $R^{32}$ | $R^4$ | $G^9$ |
| 846 | $R^{32}$ | $R^5$ | $G^9$ |
| 847 | $R^{32}$ | $R^6$ | $G^9$ |
| 848 | $R^{32}$ | $R^7$ | $G^9$ |
| 849 | $R^{32}$ | $R^8$ | $G^9$ |
| 850 | $R^{32}$ | $R^9$ | $G^9$ |
| 851 | $R^{32}$ | $R^{10}$ | $G^9$ |
| 852 | $R^{32}$ | $R^{11}$ | $G^9$ |
| 853 | $R^{32}$ | $R^{12}$ | $G^9$ |
| 854 | $R^{32}$ | $R^{13}$ | $G^9$ |
| 855 | $R^{32}$ | $R^{14}$ | $G^9$ |
| 856 | $R^{32}$ | $R^{15}$ | $G^9$ |
| 857 | $R^{32}$ | $R^{16}$ | $G^9$ |
| 858 | $R^{32}$ | $R^{17}$ | $G^9$ |
| 859 | $R^{32}$ | $R^{18}$ | $G^9$ |
| 860 | $R^{32}$ | $R^{19}$ | $G^9$ |
| 861 | $R^{32}$ | $R^{20}$ | $G^9$ |
| 862 | $R^{32}$ | $R^{21}$ | $G^9$ |
| 863 | $R^{32}$ | $R^{22}$ | $G^9$ |
| 864 | $R^{32}$ | $R^{23}$ | $G^9$ |
| 865 | $R^{32}$ | $R^{24}$ | $G^9$ |
| 866 | $R^{32}$ | $R^{25}$ | $G^9$ |
| 867 | $R^{32}$ | $R^{26}$ | $G^9$ |
| 868 | $R^{32}$ | $R^{27}$ | $G^9$ |
| 869 | $R^{32}$ | $R^{28}$ | $G^9$ |
| 870 | $R^{32}$ | $R^{29}$ | $G^9$ |
| 871 | $R^{32}$ | $R^{30}$ | $G^9$ |
| 872 | $R^{32}$ | $R^{31}$ | $G^9$ |
| 873 | $R^1$ | $R^{33}$ | $G^{11}$ |
| 874 | $R^1$ | $R^{34}$ | $G^{11}$ |
| 875 | $R^1$ | $R^{35}$ | $G^{11}$ |
| 876 | $R^1$ | $R^{36}$ | $G^{11}$ |
| 877 | $R^1$ | $R^{37}$ | $G^{11}$ |
| 878 | $R^1$ | $R^{38}$ | $G^{11}$ |
| 879 | $R^1$ | $R^{39}$ | $G^{11}$ |
| 880 | $R^1$ | $R^{40}$ | $G^{11}$ |
| 881 | $R^1$ | $R^{41}$ | $G^{11}$ |
| 882 | $R^{33}$ | $R^1$ | $G^{11}$ |
| 883 | $R^{34}$ | $R^1$ | $G^{11}$ |
| 884 | $R^{35}$ | $R^1$ | $G^{11}$ |
| 885 | $R^{36}$ | $R^1$ | $G^{11}$ |
| 886 | $R^{37}$ | $R^1$ | $G^{11}$ |
| 887 | $R^{38}$ | $R^1$ | $G^{11}$ |
| 888 | $R^{39}$ | $R^1$ | $G^{11}$ |
| 889 | $R^{40}$ | $R^1$ | $G^{11}$ |
| 890 | $R^{41}$ | $R^1$ | $G^{11}$ |
| 891 | $R^1$ | $R^1$ | $G^{11}$ |
| 892 | $R^2$ | $R^2$ | $G^{11}$ |

-continued

| i | $R_E$ | $R_F$ | G |
|---|---|---|---|
| 893 | $R^{3}$ | $R^{3}$ | $G^{11}$ |
| 894 | $R^{4}$ | $R^{4}$ | $G^{11}$ |
| 895 | $R^{5}$ | $R^{5}$ | $G^{11}$ |
| 896 | $R^{6}$ | $R^{6}$ | $G^{11}$ |
| 897 | $R^{7}$ | $R^{7}$ | $G^{11}$ |
| 898 | $R^{8}$ | $R^{8}$ | $G^{11}$ |
| 899 | $R^{9}$ | $R^{9}$ | $G^{11}$ |
| 900 | $R^{10}$ | $R^{10}$ | $G^{11}$ |
| 901 | $R^{11}$ | $R^{11}$ | $G^{11}$ |
| 902 | $R^{12}$ | $R^{12}$ | $G^{11}$ |
| 903 | $R^{13}$ | $R^{13}$ | $G^{11}$ |
| 904 | $R^{14}$ | $R^{14}$ | $G^{11}$ |
| 905 | $R^{15}$ | $R^{15}$ | $G^{11}$ |
| 906 | $R^{16}$ | $R^{16}$ | $G^{11}$ |
| 907 | $R^{17}$ | $R^{17}$ | $G^{11}$ |
| 908 | $R^{18}$ | $R^{18}$ | $G^{11}$ |
| 909 | $R^{19}$ | $R^{19}$ | $G^{11}$ |
| 910 | $R^{20}$ | $R^{20}$ | $G^{11}$ |
| 911 | $R^{21}$ | $R^{21}$ | $G^{11}$ |
| 912 | $R^{22}$ | $R^{22}$ | $G^{11}$ |
| 913 | $R^{23}$ | $R^{23}$ | $G^{11}$ |
| 914 | $R^{24}$ | $R^{24}$ | $G^{11}$ |
| 915 | $R^{25}$ | $R^{25}$ | $G^{11}$ |
| 916 | $R^{26}$ | $R^{26}$ | $G^{11}$ |
| 917 | $R^{27}$ | $R^{27}$ | $G^{11}$ |
| 918 | $R^{28}$ | $R^{28}$ | $G^{11}$ |
| 919 | $R^{29}$ | $R^{29}$ | $G^{11}$ |
| 920 | $R^{30}$ | $R^{30}$ | $G^{11}$ |
| 921 | $R^{31}$ | $R^{31}$ | $G^{11}$ |
| 922 | $R^{32}$ | $R^{32}$ | $G^{11}$ |
| 923 | $R^{2}$ | $R^{1}$ | $G^{11}$ |
| 924 | $R^{3}$ | $R^{1}$ | $G^{11}$ |
| 925 | $R^{4}$ | $R^{1}$ | $G^{11}$ |
| 926 | $R^{5}$ | $R^{1}$ | $G^{11}$ |
| 927 | $R^{6}$ | $R^{1}$ | $G^{11}$ |
| 928 | $R^{7}$ | $R^{1}$ | $G^{11}$ |
| 929 | $R^{8}$ | $R^{1}$ | $G^{11}$ |
| 930 | $R^{9}$ | $R^{1}$ | $G^{11}$ |
| 931 | $R^{10}$ | $R^{1}$ | $G^{11}$ |
| 932 | $R^{11}$ | $R^{1}$ | $G^{11}$ |
| 933 | $R^{12}$ | $R^{1}$ | $G^{11}$ |
| 934 | $R^{13}$ | $R^{1}$ | $G^{11}$ |
| 935 | $R^{14}$ | $R^{1}$ | $G^{11}$ |
| 936 | $R^{15}$ | $R^{1}$ | $G^{11}$ |
| 937 | $R^{16}$ | $R^{1}$ | $G^{11}$ |
| 938 | $R^{17}$ | $R^{1}$ | $G^{11}$ |
| 939 | $R^{18}$ | $R^{1}$ | $G^{11}$ |
| 940 | $R^{19}$ | $R^{1}$ | $G^{11}$ |
| 941 | $R^{20}$ | $R^{1}$ | $G^{11}$ |
| 942 | $R^{21}$ | $R^{1}$ | $G^{11}$ |
| 943 | $R^{22}$ | $R^{1}$ | $G^{11}$ |
| 944 | $R^{23}$ | $R^{1}$ | $G^{11}$ |
| 945 | $R^{24}$ | $R^{1}$ | $G^{11}$ |
| 946 | $R^{25}$ | $R^{1}$ | $G^{11}$ |
| 947 | $R^{26}$ | $R^{1}$ | $G^{11}$ |
| 948 | $R^{27}$ | $R^{1}$ | $G^{11}$ |
| 949 | $R^{28}$ | $R^{1}$ | $G^{11}$ |
| 950 | $R^{29}$ | $R^{1}$ | $G^{11}$ |
| 951 | $R^{30}$ | $R^{1}$ | $G^{11}$ |
| 952 | $R^{31}$ | $R^{1}$ | $G^{11}$ |
| 953 | $R^{32}$ | $R^{1}$ | $G^{11}$ |
| 954 | $R^{1}$ | $R^{2}$ | $G^{11}$ |
| 955 | $R^{1}$ | $R^{3}$ | $G^{11}$ |
| 956 | $R^{1}$ | $R^{4}$ | $G^{11}$ |
| 957 | $R^{1}$ | $R^{5}$ | $G^{11}$ |
| 958 | $R^{1}$ | $R^{6}$ | $G^{11}$ |
| 959 | $R^{1}$ | $R^{7}$ | $G^{11}$ |
| 960 | $R^{1}$ | $R^{8}$ | $G^{11}$ |
| 961 | $R^{1}$ | $R^{9}$ | $G^{11}$ |
| 962 | $R^{1}$ | $R^{10}$ | $G^{11}$ |
| 963 | $R^{1}$ | $R^{11}$ | $G^{11}$ |
| 964 | $R^{1}$ | $R^{12}$ | $G^{11}$ |
| 965 | $R^{1}$ | $R^{13}$ | $G^{11}$ |
| 966 | $R^{1}$ | $R^{14}$ | $G^{11}$ |
| 967 | $R^{1}$ | $R^{15}$ | $G^{11}$ |
| 968 | $R^{1}$ | $R^{16}$ | $G^{11}$ |
| 969 | $R^{1}$ | $R^{17}$ | $G^{11}$ |

-continued

| i | $R_E$ | $R_F$ | G |
|---|---|---|---|
| 970 | $R^{1}$ | $R^{18}$ | $G^{11}$ |
| 971 | $R^{1}$ | $R^{19}$ | $G^{11}$ |
| 972 | $R^{1}$ | $R^{20}$ | $G^{11}$ |
| 973 | $R^{1}$ | $R^{21}$ | $G^{11}$ |
| 974 | $R^{1}$ | $R^{22}$ | $G^{11}$ |
| 975 | $R^{1}$ | $R^{23}$ | $G^{11}$ |
| 976 | $R^{1}$ | $R^{24}$ | $G^{11}$ |
| 977 | $R^{1}$ | $R^{25}$ | $G^{11}$ |
| 978 | $R^{1}$ | $R^{26}$ | $G^{11}$ |
| 979 | $R^{1}$ | $R^{27}$ | $G^{11}$ |
| 980 | $R^{1}$ | $R^{28}$ | $G^{11}$ |
| 981 | $R^{1}$ | $R^{29}$ | $G^{11}$ |
| 982 | $R^{1}$ | $R^{30}$ | $G^{11}$ |
| 983 | $R^{1}$ | $R^{31}$ | $G^{11}$ |
| 984 | $R^{1}$ | $R^{32}$ | $G^{11}$ |
| 985 | $R^{3}$ | $R^{2}$ | $G^{11}$ |
| 986 | $R^{4}$ | $R^{2}$ | $G^{11}$ |
| 987 | $R^{5}$ | $R^{2}$ | $G^{11}$ |
| 988 | $R^{6}$ | $R^{2}$ | $G^{11}$ |
| 989 | $R^{7}$ | $R^{2}$ | $G^{11}$ |
| 990 | $R^{8}$ | $R^{2}$ | $G^{11}$ |
| 991 | $R^{9}$ | $R^{2}$ | $G^{11}$ |
| 992 | $R^{10}$ | $R^{2}$ | $G^{11}$ |
| 993 | $R^{11}$ | $R^{2}$ | $G^{11}$ |
| 994 | $R^{12}$ | $R^{2}$ | $G^{11}$ |
| 995 | $R^{13}$ | $R^{2}$ | $G^{11}$ |
| 996 | $R^{14}$ | $R^{2}$ | $G^{11}$ |
| 997 | $R^{15}$ | $R^{2}$ | $G^{11}$ |
| 998 | $R^{16}$ | $R^{2}$ | $G^{11}$ |
| 999 | $R^{17}$ | $R^{2}$ | $G^{11}$ |
| 1000 | $R^{18}$ | $R^{2}$ | $G^{11}$ |
| 1001 | $R^{19}$ | $R^{2}$ | $G^{11}$ |
| 1002 | $R^{20}$ | $R^{2}$ | $G^{11}$ |
| 1003 | $R^{21}$ | $R^{2}$ | $G^{11}$ |
| 1004 | $R^{22}$ | $R^{2}$ | $G^{11}$ |
| 1005 | $R^{23}$ | $R^{2}$ | $G^{11}$ |
| 1006 | $R^{24}$ | $R^{2}$ | $G^{11}$ |
| 1007 | $R^{25}$ | $R^{2}$ | $G^{11}$ |
| 1008 | $R^{26}$ | $R^{2}$ | $G^{11}$ |
| 1009 | $R^{27}$ | $R^{2}$ | $G^{11}$ |
| 1010 | $R^{28}$ | $R^{2}$ | $G^{11}$ |
| 1011 | $R^{29}$ | $R^{2}$ | $G^{11}$ |
| 1012 | $R^{30}$ | $R^{2}$ | $G^{11}$ |
| 1013 | $R^{31}$ | $R^{2}$ | $G^{11}$ |
| 1014 | $R^{32}$ | $R^{2}$ | $G^{11}$ |
| 1015 | $R^{2}$ | $R^{3}$ | $G^{11}$ |
| 1016 | $R^{2}$ | $R^{4}$ | $G^{11}$ |
| 1017 | $R^{2}$ | $R^{5}$ | $G^{11}$ |
| 1018 | $R^{2}$ | $R^{6}$ | $G^{11}$ |
| 1019 | $R^{2}$ | $R^{7}$ | $G^{11}$ |
| 1020 | $R^{2}$ | $R^{8}$ | $G^{11}$ |
| 1021 | $R^{2}$ | $R^{9}$ | $G^{11}$ |
| 1022 | $R^{2}$ | $R^{10}$ | $G^{11}$ |
| 1023 | $R^{2}$ | $R^{11}$ | $G^{11}$ |
| 1024 | $R^{2}$ | $R^{12}$ | $G^{11}$ |
| 1025 | $R^{2}$ | $R^{13}$ | $G^{11}$ |
| 1026 | $R^{2}$ | $R^{14}$ | $G^{11}$ |
| 1027 | $R^{2}$ | $R^{15}$ | $G^{11}$ |
| 1028 | $R^{2}$ | $R^{16}$ | $G^{11}$ |
| 1029 | $R^{2}$ | $R^{17}$ | $G^{11}$ |
| 1030 | $R^{2}$ | $R^{18}$ | $G^{11}$ |
| 1031 | $R^{2}$ | $R^{19}$ | $G^{11}$ |
| 1032 | $R^{2}$ | $R^{20}$ | $G^{11}$ |
| 1033 | $R^{2}$ | $R^{21}$ | $G^{11}$ |
| 1034 | $R^{2}$ | $R^{22}$ | $G^{11}$ |
| 1035 | $R^{2}$ | $R^{23}$ | $G^{11}$ |
| 1036 | $R^{2}$ | $R^{24}$ | $G^{11}$ |
| 1037 | $R^{2}$ | $R^{25}$ | $G^{11}$ |
| 1038 | $R^{2}$ | $R^{26}$ | $G^{11}$ |
| 1039 | $R^{2}$ | $R^{27}$ | $G^{11}$ |
| 1040 | $R^{2}$ | $R^{28}$ | $G^{11}$ |
| 1041 | $R^{2}$ | $R^{29}$ | $G^{11}$ |
| 1042 | $R^{2}$ | $R^{30}$ | $G^{11}$ |
| 1043 | $R^{2}$ | $R^{31}$ | $G^{11}$ |
| 1044 | $R^{2}$ | $R^{32}$ | $G^{11}$ |
| 1045 | $R^{2}$ | $R^{32}$ | $G^{11}$ |
| 1046 | $R^{3}$ | $R^{32}$ | $G^{11}$ |

-continued

| i | $R_E$ | $R_F$ | G |
|---|---|---|---|
| 1047 | $R^{4}$ | $R^{32}$ | $G^{11}$ |
| 1048 | $R^{5}$ | $R^{32}$ | $G^{11}$ |
| 1049 | $R^{6}$ | $R^{32}$ | $G^{11}$ |
| 1050 | $R^{7}$ | $R^{32}$ | $G^{11}$ |
| 1051 | $R^{8}$ | $R^{32}$ | $G^{11}$ |
| 1052 | $R^{9}$ | $R^{32}$ | $G^{11}$ |
| 1053 | $R^{10}$ | $R^{32}$ | $G^{11}$ |
| 1054 | $R^{11}$ | $R^{32}$ | $G^{11}$ |
| 1055 | $R^{12}$ | $R^{32}$ | $G^{11}$ |
| 1056 | $R^{13}$ | $R^{32}$ | $G^{11}$ |
| 1057 | $R^{14}$ | $R^{32}$ | $G^{11}$ |
| 1058 | $R^{15}$ | $R^{32}$ | $G^{11}$ |
| 1059 | $R^{16}$ | $R^{32}$ | $G^{11}$ |
| 1060 | $R^{17}$ | $R^{32}$ | $G^{11}$ |
| 1061 | $R^{18}$ | $R^{32}$ | $G^{11}$ |
| 1062 | $R^{19}$ | $R^{32}$ | $G^{11}$ |
| 1063 | $R^{20}$ | $R^{32}$ | $G^{11}$ |
| 1064 | $R^{21}$ | $R^{32}$ | $G^{11}$ |
| 1065 | $R^{22}$ | $R^{32}$ | $G^{11}$ |
| 1066 | $R^{23}$ | $R^{32}$ | $G^{11}$ |
| 1067 | $R^{24}$ | $R^{32}$ | $G^{11}$ |
| 1068 | $R^{25}$ | $R^{32}$ | $G^{11}$ |
| 1069 | $R^{26}$ | $R^{32}$ | $G^{11}$ |
| 1070 | $R^{27}$ | $R^{32}$ | $G^{11}$ |
| 1071 | $R^{28}$ | $R^{32}$ | $G^{11}$ |
| 1072 | $R^{29}$ | $R^{32}$ | $G^{11}$ |
| 1073 | $R^{30}$ | $R^{32}$ | $G^{11}$ |
| 1074 | $R^{31}$ | $R^{32}$ | $G^{11}$ |
| 1075 | $R^{32}$ | $R^{2}$ | $G^{11}$ |
| 1076 | $R^{32}$ | $R^{3}$ | $G^{11}$ |
| 1077 | $R^{32}$ | $R^{4}$ | $G^{11}$ |
| 1078 | $R^{32}$ | $R^{5}$ | $G^{11}$ |
| 1079 | $R^{32}$ | $R^{6}$ | $G^{11}$ |
| 1080 | $R^{32}$ | $R^{7}$ | $G^{11}$ |
| 1081 | $R^{32}$ | $R^{8}$ | $G^{11}$ |
| 1082 | $R^{32}$ | $R^{9}$ | $G^{11}$ |
| 1083 | $R^{32}$ | $R^{10}$ | $G^{11}$ |
| 1084 | $R^{32}$ | $R^{11}$ | $G^{11}$ |
| 1085 | $R^{32}$ | $R^{12}$ | $G^{11}$ |
| 1086 | $R^{32}$ | $R^{13}$ | $G^{11}$ |
| 1087 | $R^{32}$ | $R^{14}$ | $G^{11}$ |
| 1088 | $R^{32}$ | $R^{15}$ | $G^{11}$ |
| 1089 | $R^{32}$ | $R^{16}$ | $G^{11}$ |
| 1090 | $R^{32}$ | $R^{17}$ | $G^{11}$ |
| 1091 | $R^{32}$ | $R^{18}$ | $G^{11}$ |
| 1092 | $R^{32}$ | $R^{19}$ | $G^{11}$ |
| 1093 | $R^{32}$ | $R^{20}$ | $G^{11}$ |
| 1094 | $R^{32}$ | $R^{21}$ | $G^{11}$ |
| 1095 | $R^{32}$ | $R^{22}$ | $G^{11}$ |
| 1096 | $R^{32}$ | $R^{23}$ | $G^{11}$ |
| 1097 | $R^{32}$ | $R^{24}$ | $G^{11}$ |
| 1098 | $R^{32}$ | $R^{25}$ | $G^{11}$ |
| 1099 | $R^{32}$ | $R^{26}$ | $G^{11}$ |
| 1100 | $R^{32}$ | $R^{27}$ | $G^{11}$ |
| 1101 | $R^{32}$ | $R^{28}$ | $G^{11}$ |
| 1102 | $R^{32}$ | $R^{29}$ | $G^{11}$ |
| 1103 | $R^{32}$ | $R^{30}$ | $G^{11}$ |
| 1104 | $R^{32}$ | $R^{31}$ | $G^{11}$ |
| 1105 | $R^{1}$ | $R^{1}$ | $G^{13}$ |
| 1106 | $R^{2}$ | $R^{2}$ | $G^{13}$ |
| 1107 | $R^{3}$ | $R^{3}$ | $G^{13}$ |
| 1108 | $R^{4}$ | $R^{4}$ | $G^{13}$ |
| 1109 | $R^{5}$ | $R^{5}$ | $G^{13}$ |
| 1110 | $R^{6}$ | $R^{6}$ | $G^{13}$ |
| 1111 | $R^{7}$ | $R^{7}$ | $G^{13}$ |
| 1112 | $R^{8}$ | $R^{8}$ | $G^{13}$ |
| 1113 | $R^{9}$ | $R^{9}$ | $G^{13}$ |
| 1114 | $R^{10}$ | $R^{10}$ | $G^{13}$ |
| 1115 | $R^{11}$ | $R^{11}$ | $G^{13}$ |
| 1116 | $R^{12}$ | $R^{12}$ | $G^{13}$ |
| 1117 | $R^{13}$ | $R^{13}$ | $G^{13}$ |
| 1118 | $R^{14}$ | $R^{14}$ | $G^{13}$ |
| 1119 | $R^{15}$ | $R^{15}$ | $G^{13}$ |
| 1120 | $R^{16}$ | $R^{16}$ | $G^{13}$ |
| 1121 | $R^{17}$ | $R^{17}$ | $G^{13}$ |
| 1122 | $R^{18}$ | $R^{18}$ | $G^{13}$ |
| 1123 | $R^{19}$ | $R^{19}$ | $G^{13}$ |

-continued

| i | $R_E$ | $R_F$ | G |
|---|---|---|---|
| 1124 | $R^{20}$ | $R^{20}$ | $G^{13}$ |
| 1125 | $R^{21}$ | $R^{21}$ | $G^{13}$ |
| 1126 | $R^{22}$ | $R^{22}$ | $G^{13}$ |
| 1127 | $R^{23}$ | $R^{23}$ | $G^{13}$ |
| 1128 | $R^{24}$ | $R^{24}$ | $G^{13}$ |
| 1129 | $R^{25}$ | $R^{25}$ | $G^{13}$ |
| 1130 | $R^{26}$ | $R^{26}$ | $G^{13}$ |
| 1131 | $R^{27}$ | $R^{27}$ | $G^{13}$ |
| 1132 | $R^{28}$ | $R^{28}$ | $G^{13}$ |
| 1133 | $R^{29}$ | $R^{29}$ | $G^{13}$ |
| 1134 | $R^{30}$ | $R^{30}$ | $G^{13}$ |
| 1135 | $R^{31}$ | $R^{31}$ | $G^{13}$ |
| 1136 | $R^{32}$ | $R^{32}$ | $G^{13}$ |
| 1137 | $R^{2}$ | $R^{1}$ | $G^{13}$ |
| 1138 | $R^{3}$ | $R^{1}$ | $G^{13}$ |
| 1139 | $R^{4}$ | $R^{1}$ | $G^{13}$ |
| 1140 | $R^{5}$ | $R^{1}$ | $G^{13}$ |
| 1141 | $R^{6}$ | $R^{1}$ | $G^{13}$ |
| 1142 | $R^{7}$ | $R^{1}$ | $G^{13}$ |
| 1143 | $R^{8}$ | $R^{1}$ | $G^{13}$ |
| 1144 | $R^{9}$ | $R^{1}$ | $G^{13}$ |
| 1145 | $R^{10}$ | $R^{1}$ | $G^{13}$ |
| 1146 | $R^{11}$ | $R^{1}$ | $G^{13}$ |
| 1147 | $R^{12}$ | $R^{1}$ | $G^{13}$ |
| 1148 | $R^{13}$ | $R^{1}$ | $G^{13}$ |
| 1149 | $R^{14}$ | $R^{1}$ | $G^{13}$ |
| 1150 | $R^{15}$ | $R^{1}$ | $G^{13}$ |
| 1151 | $R^{16}$ | $R^{1}$ | $G^{13}$ |
| 1152 | $R^{17}$ | $R^{1}$ | $G^{13}$ |
| 1153 | $R^{18}$ | $R^{1}$ | $G^{13}$ |
| 1154 | $R^{19}$ | $R^{1}$ | $G^{13}$ |
| 1155 | $R^{20}$ | $R^{1}$ | $G^{13}$ |
| 1156 | $R^{21}$ | $R^{1}$ | $G^{13}$ |
| 1157 | $R^{22}$ | $R^{1}$ | $G^{13}$ |
| 1158 | $R^{23}$ | $R^{1}$ | $G^{13}$ |
| 1159 | $R^{24}$ | $R^{1}$ | $G^{13}$ |
| 1160 | $R^{25}$ | $R^{1}$ | $G^{13}$ |
| 1161 | $R^{26}$ | $R^{1}$ | $G^{13}$ |
| 1162 | $R^{27}$ | $R^{1}$ | $G^{13}$ |
| 1163 | $R^{28}$ | $R^{1}$ | $G^{13}$ |
| 1164 | $R^{29}$ | $R^{1}$ | $G^{13}$ |
| 1165 | $R^{30}$ | $R^{1}$ | $G^{13}$ |
| 1166 | $R^{31}$ | $R^{1}$ | $G^{13}$ |
| 1167 | $R^{32}$ | $R^{1}$ | $G^{13}$ |
| 1168 | $R^{1}$ | $R^{2}$ | $G^{13}$ |
| 1169 | $R^{1}$ | $R^{3}$ | $G^{13}$ |
| 1170 | $R^{1}$ | $R^{4}$ | $G^{13}$ |
| 1171 | $R^{1}$ | $R^{5}$ | $G^{13}$ |
| 1172 | $R^{1}$ | $R^{6}$ | $G^{13}$ |
| 1173 | $R^{1}$ | $R^{7}$ | $G^{13}$ |
| 1174 | $R^{1}$ | $R^{8}$ | $G^{13}$ |
| 1175 | $R^{1}$ | $R^{9}$ | $G^{13}$ |
| 1176 | $R^{1}$ | $R^{10}$ | $G^{13}$ |
| 1177 | $R^{1}$ | $R^{11}$ | $G^{13}$ |
| 1178 | $R^{1}$ | $R^{12}$ | $G^{13}$ |
| 1179 | $R^{1}$ | $R^{13}$ | $G^{13}$ |
| 1180 | $R^{1}$ | $R^{14}$ | $G^{13}$ |
| 1181 | $R^{1}$ | $R^{15}$ | $G^{13}$ |
| 1182 | $R^{1}$ | $R^{16}$ | $G^{13}$ |
| 1183 | $R^{1}$ | $R^{17}$ | $G^{13}$ |
| 1184 | $R^{1}$ | $R^{18}$ | $G^{13}$ |
| 1185 | $R^{1}$ | $R^{19}$ | $G^{13}$ |
| 1186 | $R^{1}$ | $R^{20}$ | $G^{13}$ |
| 1187 | $R^{1}$ | $R^{21}$ | $G^{13}$ |
| 1188 | $R^{1}$ | $R^{22}$ | $G^{13}$ |
| 1189 | $R^{1}$ | $R^{23}$ | $G^{13}$ |
| 1190 | $R^{1}$ | $R^{24}$ | $G^{13}$ |
| 1191 | $R^{1}$ | $R^{25}$ | $G^{13}$ |
| 1192 | $R^{1}$ | $R^{26}$ | $G^{13}$ |
| 1193 | $R^{1}$ | $R^{27}$ | $G^{13}$ |
| 1194 | $R^{1}$ | $R^{28}$ | $G^{13}$ |
| 1195 | $R^{1}$ | $R^{29}$ | $G^{13}$ |
| 1196 | $R^{1}$ | $R^{30}$ | $G^{13}$ |
| 1197 | $R^{1}$ | $R^{31}$ | $G^{13}$ |
| 1198 | $R^{1}$ | $R^{32}$ | $G^{13}$ |
| 1199 | $R^{3}$ | $R^{2}$ | $G^{13}$ |
| 1200 | $R^{4}$ | $R^{2}$ | $G^{13}$ |

-continued

| i | $R_E$ | $R_F$ | G |
|---|---|---|---|
| 1201 | $R^5$ | $R^2$ | $G^{13}$ |
| 1202 | $R^6$ | $R^2$ | $G^{13}$ |
| 1203 | $R^7$ | $R^2$ | $G^{13}$ |
| 1204 | $R^8$ | $R^2$ | $G^{13}$ |
| 1205 | $R^9$ | $R^2$ | $G^{13}$ |
| 1206 | $R^{10}$ | $R^2$ | $G^{13}$ |
| 1207 | $R^{11}$ | $R^2$ | $G^{13}$ |
| 1208 | $R^{12}$ | $R^2$ | $G^{13}$ |
| 1209 | $R^{13}$ | $R^2$ | $G^{13}$ |
| 1210 | $R^{14}$ | $R^2$ | $G^{13}$ |
| 1211 | $R^{15}$ | $R^2$ | $G^{13}$ |
| 1212 | $R^{16}$ | $R^2$ | $G^{13}$ |
| 1213 | $R^{17}$ | $R^2$ | $G^{13}$ |
| 1214 | $R^{18}$ | $R^2$ | $G^{13}$ |
| 1215 | $R^{19}$ | $R^2$ | $G^{13}$ |
| 1216 | $R^{20}$ | $R^2$ | $G^{13}$ |
| 1217 | $R^{21}$ | $R^2$ | $G^{13}$ |
| 1218 | $R^{22}$ | $R^2$ | $G^{13}$ |
| 1219 | $R^{23}$ | $R^2$ | $G^{13}$ |
| 1220 | $R^{24}$ | $R^2$ | $G^{13}$ |
| 1221 | $R^{25}$ | $R^2$ | $G^{13}$ |
| 1222 | $R^{26}$ | $R^2$ | $G^{13}$ |
| 1223 | $R^{27}$ | $R^2$ | $G^{13}$ |
| 1224 | $R^{28}$ | $R^2$ | $G^{13}$ |
| 1225 | $R^{29}$ | $R^2$ | $G^{13}$ |
| 1226 | $R^{30}$ | $R^2$ | $G^{13}$ |
| 1227 | $R^{31}$ | $R^2$ | $G^{13}$ |
| 1228 | $R^{32}$ | $R^2$ | $G^{13}$ |
| 1229 | $R^2$ | $R^3$ | $G^{13}$ |
| 1230 | $R^2$ | $R^4$ | $G^{13}$ |
| 1231 | $R^2$ | $R^5$ | $G^{13}$ |
| 1232 | $R^2$ | $R^6$ | $G^{13}$ |
| 1233 | $R^2$ | $R^7$ | $G^{13}$ |
| 1234 | $R^2$ | $R^8$ | $G^{13}$ |
| 1235 | $R^2$ | $R^9$ | $G^{13}$ |
| 1236 | $R^2$ | $R^{10}$ | $G^{13}$ |
| 1237 | $R^2$ | $R^{11}$ | $G^{13}$ |
| 1238 | $R^2$ | $R^{12}$ | $G^{13}$ |
| 1239 | $R^2$ | $R^{13}$ | $G^{13}$ |
| 1240 | $R^2$ | $R^{14}$ | $G^{13}$ |
| 1241 | $R^2$ | $R^{15}$ | $G^{13}$ |
| 1242 | $R^2$ | $R^{16}$ | $G^{13}$ |
| 1243 | $R^2$ | $R^{17}$ | $G^{13}$ |
| 1244 | $R^2$ | $R^{18}$ | $G^{13}$ |
| 1245 | $R^2$ | $R^{19}$ | $G^{13}$ |
| 1246 | $R^2$ | $R^{20}$ | $G^{13}$ |
| 1247 | $R^2$ | $R^{21}$ | $G^{13}$ |
| 1248 | $R^2$ | $R^{22}$ | $G^{13}$ |
| 1249 | $R^2$ | $R^{23}$ | $G^{13}$ |
| 1250 | $R^2$ | $R^{24}$ | $G^{13}$ |
| 1251 | $R^2$ | $R^{25}$ | $G^{13}$ |
| 1252 | $R^2$ | $R^{26}$ | $G^{13}$ |
| 1253 | $R^2$ | $R^{27}$ | $G^{13}$ |
| 1254 | $R^2$ | $R^{28}$ | $G^{13}$ |
| 1255 | $R^2$ | $R^{29}$ | $G^{13}$ |
| 1256 | $R^2$ | $R^{30}$ | $G^{13}$ |
| 1257 | $R^2$ | $R^{31}$ | $G^{13}$ |
| 1258 | $R^2$ | $R^{32}$ | $G^{13}$ |
| 1259 | $R^2$ | $R^{32}$ | $G^{13}$ |
| 1260 | $R^3$ | $R^{32}$ | $G^{13}$ |
| 1261 | $R^4$ | $R^{32}$ | $G^{13}$ |
| 1262 | $R^5$ | $R^{32}$ | $G^{13}$ |
| 1263 | $R^6$ | $R^{32}$ | $G^{13}$ |
| 1264 | $R^7$ | $R^{32}$ | $G^{13}$ |
| 1265 | $R^8$ | $R^{32}$ | $G^{13}$ |
| 1266 | $R^9$ | $R^{32}$ | $G^{13}$ |
| 1267 | $R^{10}$ | $R^{32}$ | $G^{13}$ |
| 1268 | $R^{11}$ | $R^{32}$ | $G^{13}$ |
| 1269 | $R^{12}$ | $R^{32}$ | $G^{13}$ |
| 1270 | $R^{13}$ | $R^{32}$ | $G^{13}$ |
| 1271 | $R^{14}$ | $R^{32}$ | $G^{13}$ |
| 1272 | $R^{15}$ | $R^{32}$ | $G^{13}$ |
| 1273 | $R^{16}$ | $R^{32}$ | $G^{13}$ |
| 1274 | $R^{17}$ | $R^{32}$ | $G^{13}$ |
| 1275 | $R^{18}$ | $R^{32}$ | $G^{13}$ |
| 1276 | $R^{19}$ | $R^{32}$ | $G^{13}$ |
| 1277 | $R^{20}$ | $R^{32}$ | $G^{13}$ |
| 1278 | $R^{21}$ | $R^{32}$ | $G^{13}$ |
| 1279 | $R^{22}$ | $R^{32}$ | $G^{13}$ |
| 1280 | $R^{23}$ | $R^{32}$ | $G^{13}$ |
| 1281 | $R^{24}$ | $R^{32}$ | $G^{13}$ |
| 1282 | $R^{25}$ | $R^{32}$ | $G^{13}$ |
| 1283 | $R^{26}$ | $R^{32}$ | $G^{13}$ |
| 1284 | $R^{27}$ | $R^{32}$ | $G^{13}$ |
| 1285 | $R^{28}$ | $R^{32}$ | $G^{13}$ |
| 1286 | $R^{29}$ | $R^{32}$ | $G^{13}$ |
| 1287 | $R^{30}$ | $R^{32}$ | $G^{13}$ |
| 1288 | $R^{31}$ | $R^{32}$ | $G^{13}$ |
| 1289 | $R^{32}$ | $R^2$ | $G^{13}$ |
| 1290 | $R^{32}$ | $R^3$ | $G^{13}$ |
| 1291 | $R^{32}$ | $R^4$ | $G^{13}$ |
| 1292 | $R^{32}$ | $R^5$ | $G^{13}$ |
| 1293 | $R^{32}$ | $R^6$ | $G^{13}$ |
| 1294 | $R^{32}$ | $R^7$ | $G^{13}$ |
| 1295 | $R^{32}$ | $R^8$ | $G^{13}$ |
| 1296 | $R^{32}$ | $R^9$ | $G^{13}$ |
| 1297 | $R^{32}$ | $R^{10}$ | $G^{13}$ |
| 1298 | $R^{32}$ | $R^{11}$ | $G^{13}$ |
| 1299 | $R^{32}$ | $R^{12}$ | $G^{13}$ |
| 1300 | $R^{32}$ | $R^{13}$ | $G^{13}$ |
| 1301 | $R^{32}$ | $R^{14}$ | $G^{13}$ |
| 1302 | $R^{32}$ | $R^{15}$ | $G^{13}$ |
| 1303 | $R^{32}$ | $R^{16}$ | $G^{13}$ |
| 1304 | $R^{32}$ | $R^{17}$ | $G^{13}$ |
| 1305 | $R^{32}$ | $R^{18}$ | $G^{13}$ |
| 1306 | $R^{32}$ | $R^{19}$ | $G^{13}$ |
| 1307 | $R^{32}$ | $R^{20}$ | $G^{13}$ |
| 1308 | $R^{32}$ | $R^{21}$ | $G^{13}$ |
| 1309 | $R^{32}$ | $R^{22}$ | $G^{13}$ |
| 1310 | $R^{32}$ | $R^{23}$ | $G^{13}$ |
| 1311 | $R^{32}$ | $R^{24}$ | $G^{13}$ |
| 1312 | $R^{32}$ | $R^{25}$ | $G^{13}$ |
| 1313 | $R^{32}$ | $R^{26}$ | $G^{13}$ |
| 1314 | $R^{32}$ | $R^{27}$ | $G^{13}$ |
| 1315 | $R^{32}$ | $R^{28}$ | $G^{13}$ |
| 1316 | $R^{32}$ | $R^{29}$ | $G^{13}$ |
| 1317 | $R^{32}$ | $R^{30}$ | $G^{13}$ |
| 1318 | $R^{32}$ | $R^{31}$ | $G^{13}$ |
| 1319 | $R^1$ | $R^{33}$ | $G^{11}$ |
| 1320 | $R^1$ | $R^{34}$ | $G^{11}$ |
| 1321 | $R^1$ | $R^{35}$ | $G^{11}$ |
| 1322 | $R^1$ | $R^{36}$ | $G^{11}$ |
| 1323 | $R^1$ | $R^{37}$ | $G^{11}$ |
| 1324 | $R^1$ | $R^{38}$ | $G^{11}$ |
| 1325 | $R^1$ | $R^{39}$ | $G^{11}$ |
| 1326 | $R^1$ | $R^{40}$ | $G^{11}$ |
| 1327 | $R^1$ | $R^{41}$ | $G^{11}$ |
| 1328 | $R^{33}$ | $R^1$ | $G^{11}$ |
| 1329 | $R^{34}$ | $R^1$ | $G^{11}$ |
| 1330 | $R^{35}$ | $R^1$ | $G^{11}$ |
| 1331 | $R^{36}$ | $R^1$ | $G^{11}$ |
| 1332 | $R^{37}$ | $R^1$ | $G^{11}$ |
| 1333 | $R^{38}$ | $R^1$ | $G^{11}$ |
| 1334 | $R^{39}$ | $R^1$ | $G^{11}$ |
| 1335 | $R^{40}$ | $R^1$ | $G^{11}$ |
| 1336 | $R^{41}$ | $R^1$ | $G^{11}$ |

where $R_E$ and $R_F$ have the following structures:

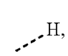

$R^1$

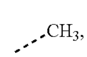

$R^2$

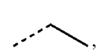

$R^3$

-continued
R[4]
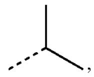
R[5]
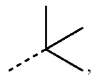
R[6]
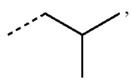
R[7]
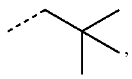
R[8]
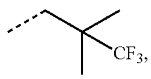
R[9]
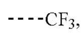
R[10]
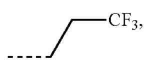
R[11]
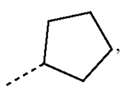
R[12]
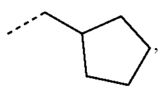
R[13]
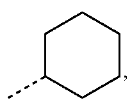
R[14]
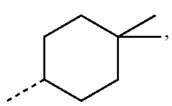
R[15]
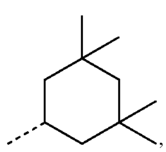
R[16]
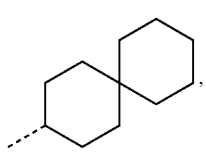
R[17]
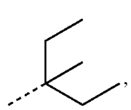
R[18]
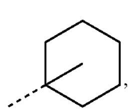
-continued
R[19]
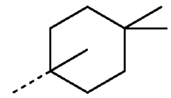
R[20]
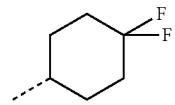
R[21]
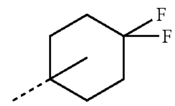
R[22]
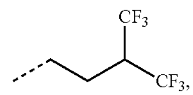
R[23]
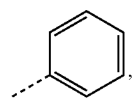
R[24]
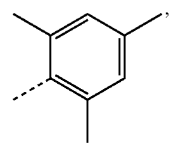
R[25]
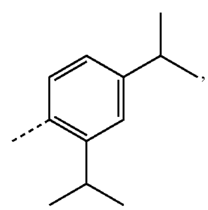
R[26]
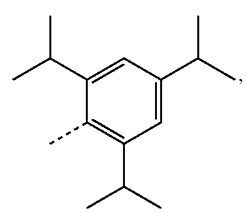
R[27]
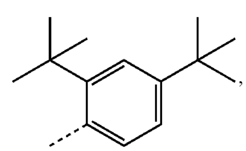
R[28]
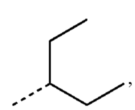
R[29]
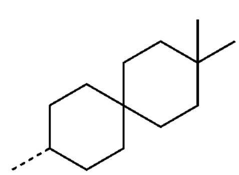

-continued
R[30]
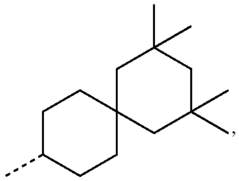
R[31]
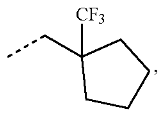
R[32]
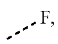
R[33]
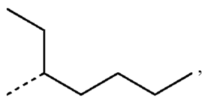
R[34]
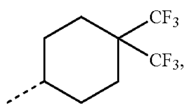
R[35]
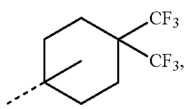
R[36]
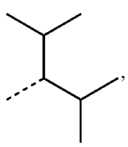
R[37]
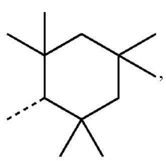
R[38]
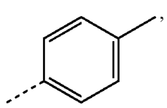
R[39]
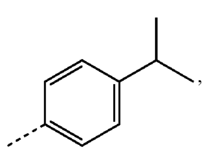
R[40]
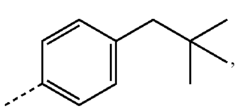
and
R[41]
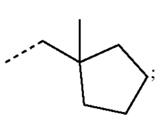
wherein $G^1$ to $G^{14}$ have the following structures:
$G^1$
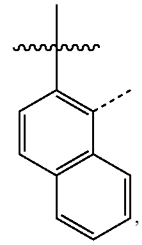
$G^2$
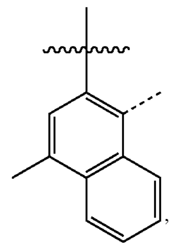
$G^3$
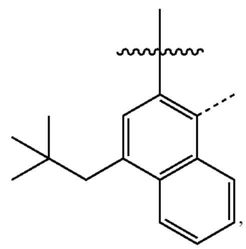
$G^4$
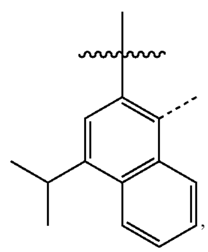
$G^5$
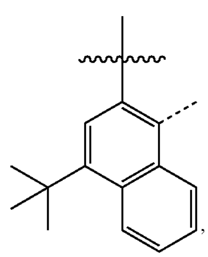
$G^6$
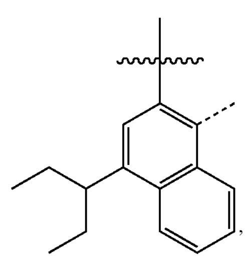

-continued
G[7]
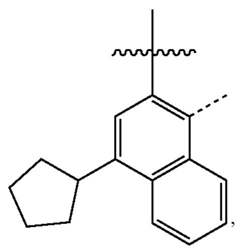
G[8]
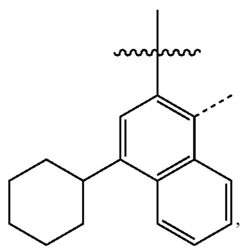
G[9]
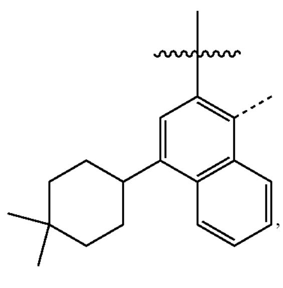
G[10]
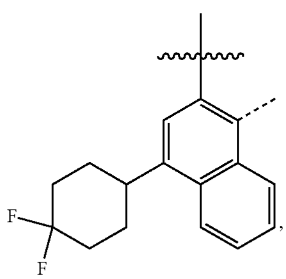
G[11]
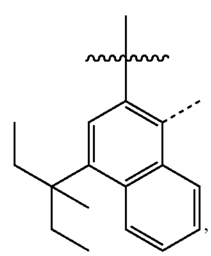
G[12]
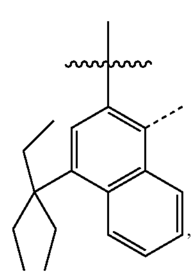
-continued
G[13]
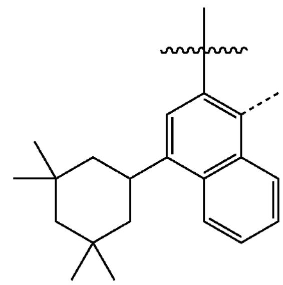
and
G[14]
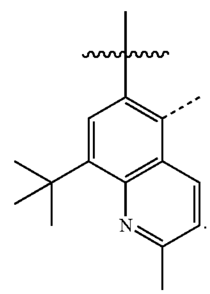
In some embodiments of the compound where the compound has a formula of $M(L_A)_p(L_B)_q(L_C)_r$ wherein $L_B$ and $L_C$ are each a bidentate ligand; and wherein p is 1, 2, or 3; q is 0, 1, or 2; r is 0, 1, or 2; and p+q+r is the oxidation state of the metal M, $L_B$ and $L_C$ can each be independently selected from the group consisting of the Ligand Group C:
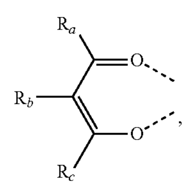
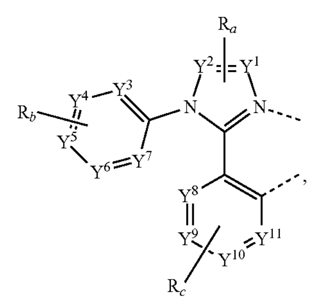
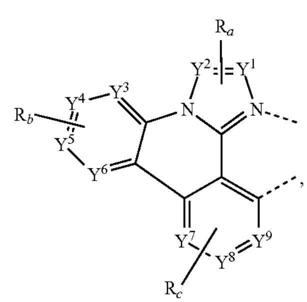

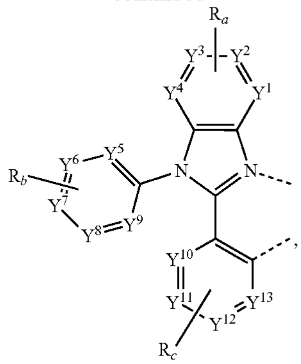
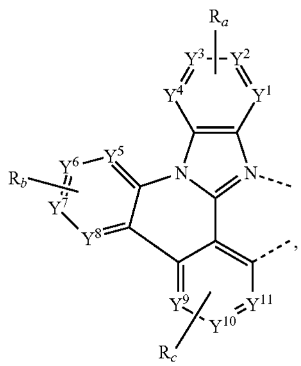
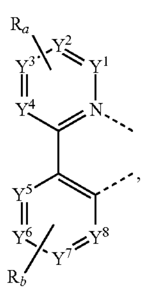
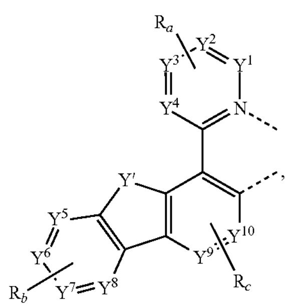
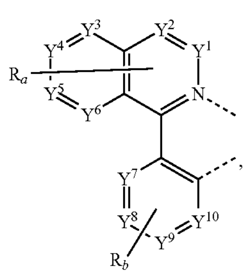
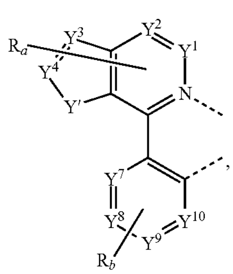
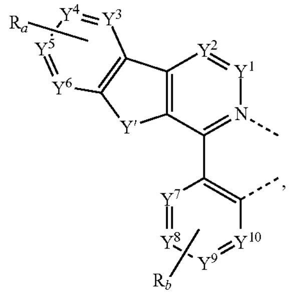
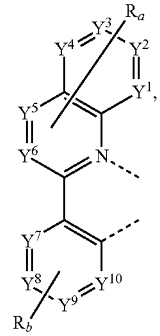
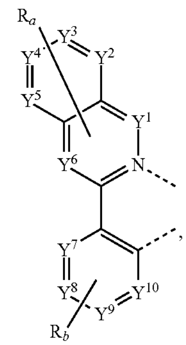
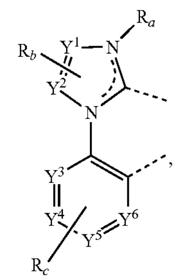
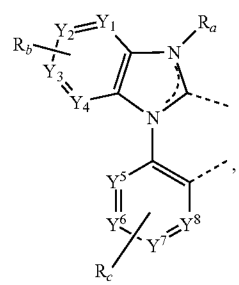
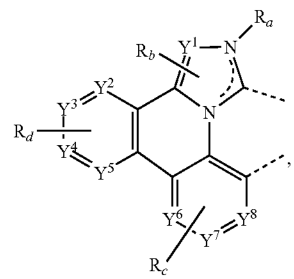
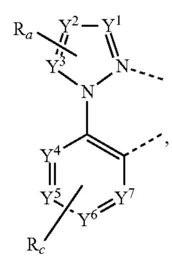
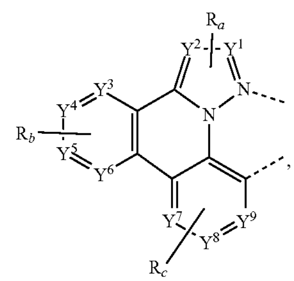
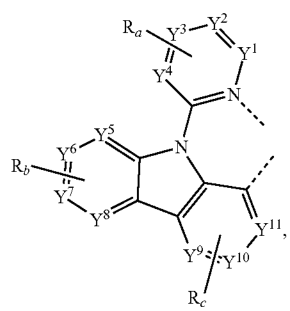
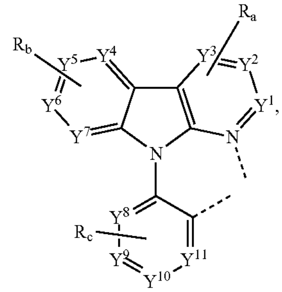
and -continued

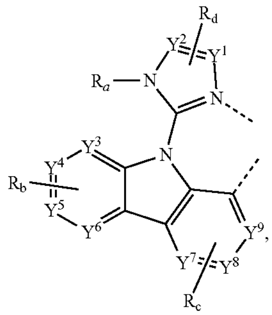

where:

each $Y^1$ to $Y^{13}$ are independently selected from the group consisting of carbon and nitrogen; Y' is selected from the group consisting of $BR_e$, $NR_e$, $PR_e$, O, S, Se, C═O, S═O, $SO_2$, $CR_eR_f$, $SiR_eR_f$, and $GeR_eR_f$;

$R_e$ and $R_f$ can be fused or joined to form a ring;

each $R_a$, $R_b$, $R_c$, and $R_d$ independently represent zero, mono, or up to a maximum allowed substitution to its associated ring; each of $R_a$, $R_b$, $R_c$, $R_d$, $R_e$ and $R_f$ is independently a hydrogen or a substituent selected from the group consisting of the general substituents defined herein; and two adjacent substituents of $R_a$, $R_b$, $R_c$, and $R_d$ can be fused or joined to form a ring or form a multidentate ligand.

In some embodiments of the compound where the compound has a formula of $M(L_A)_p(L_B)_q(L_C)^r$ wherein $L_B$ and $L_C$ are each a bidentate ligand; and wherein p is 1, 2, or 3; q is 0, 1, or 2; r is 0, 1, or 2; and p+q+r is the oxidation state of the metal M, $L_B$ and $L_C$ can each be independently selected from the group consisting of the Ligand Group D:

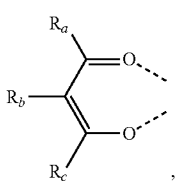

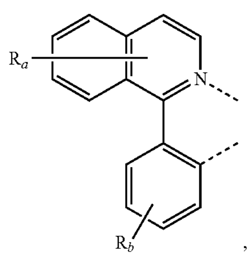

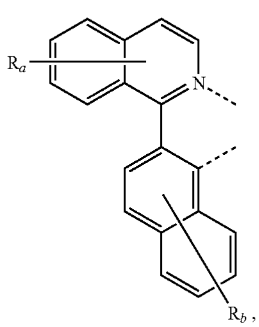

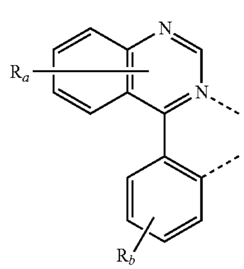

-continued

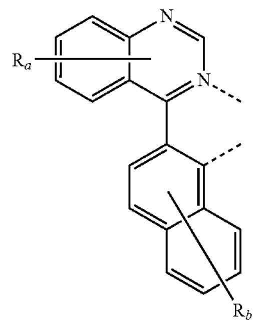

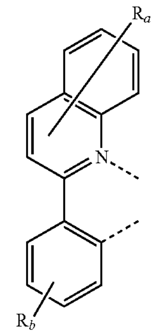

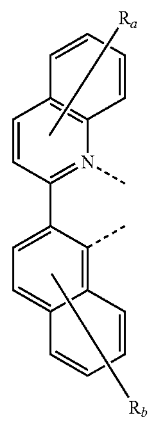

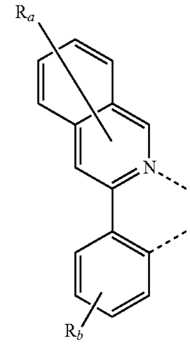

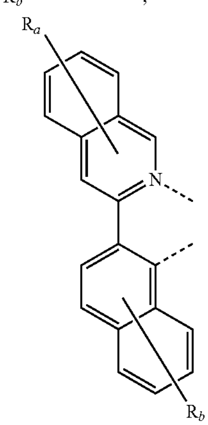

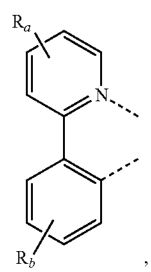

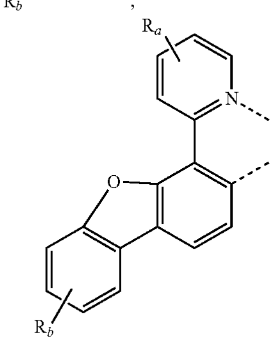

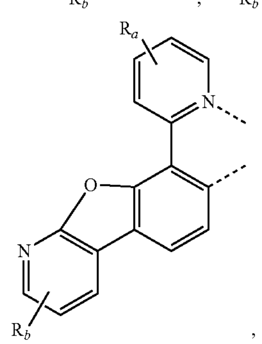

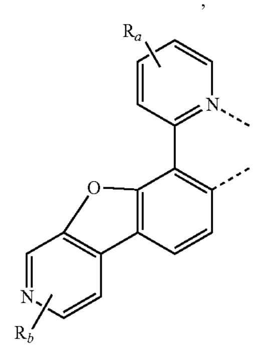

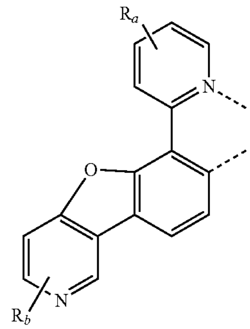

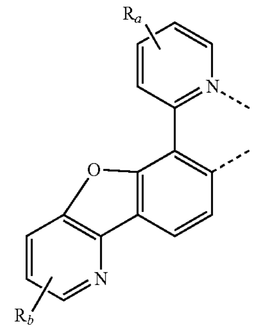

-continued
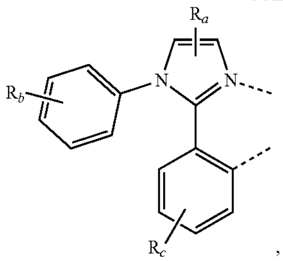
,
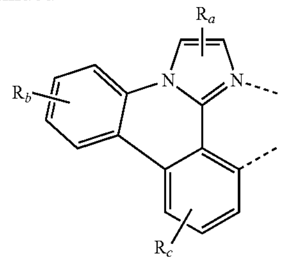
,
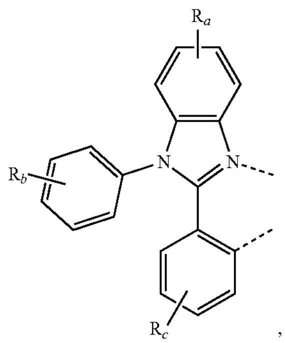
,
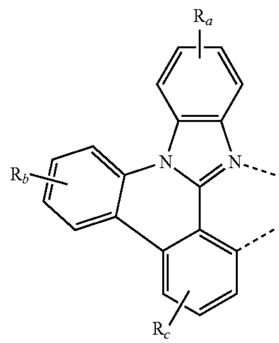
,
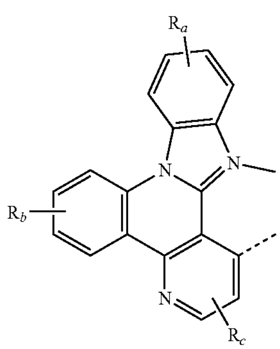
,
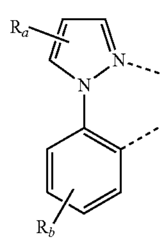
,
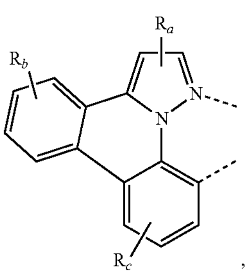
,
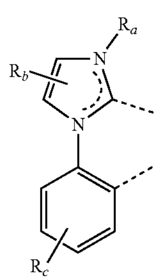
,
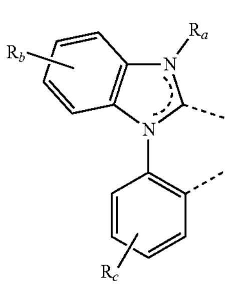
,
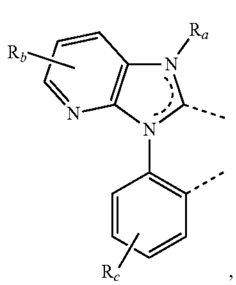
,
-continued
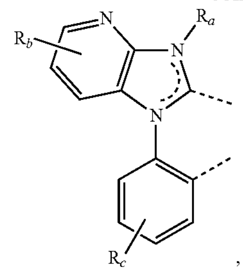
,
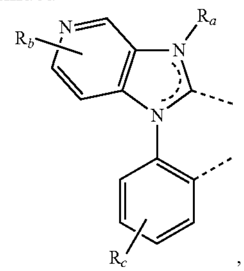
,
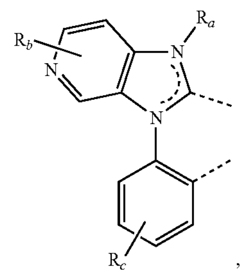
,
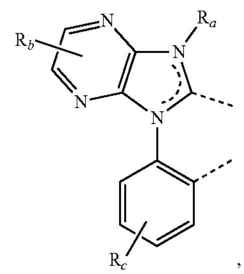
,
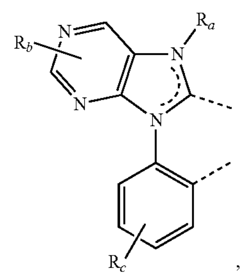
,
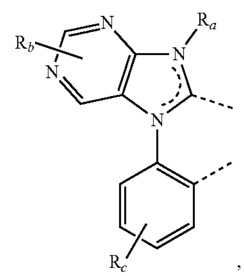
,
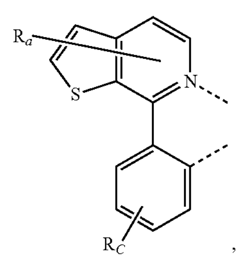
,
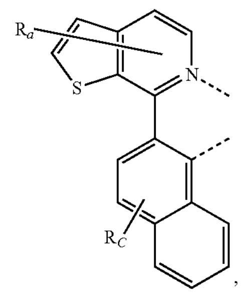
,
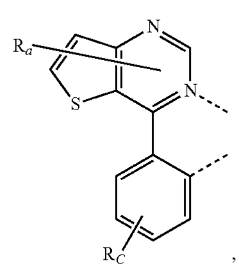
,
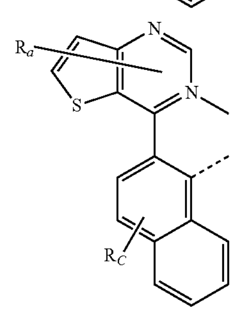
,
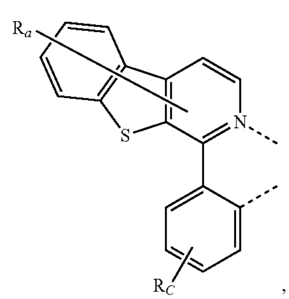
,
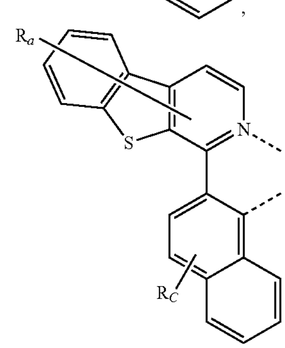
, -continued
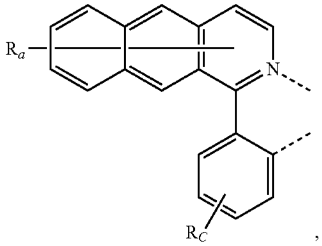
,
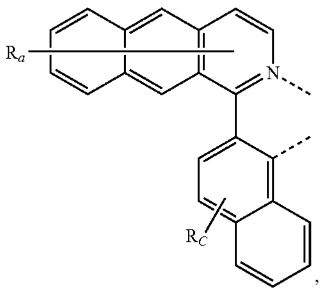
,
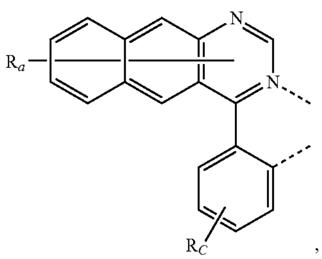
,
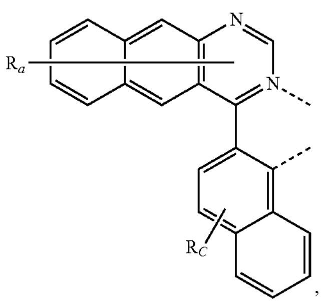
,
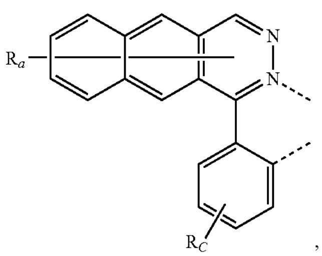
,
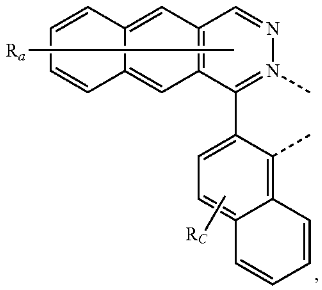
,
-continued
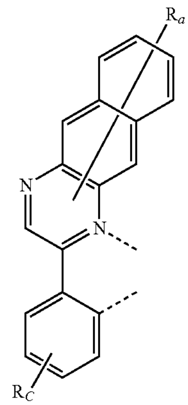
,
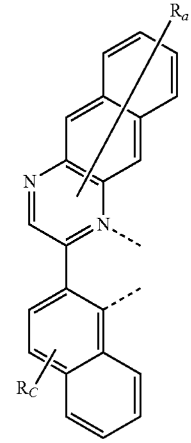
,
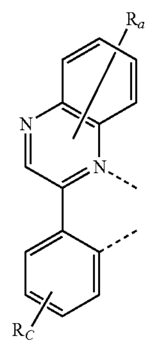
,
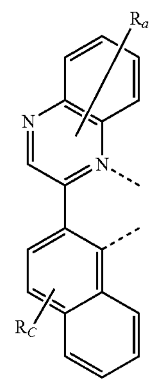
,
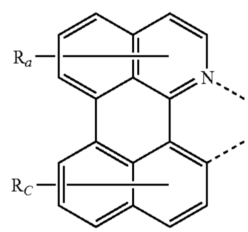
, and
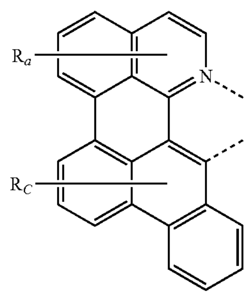
.
In some embodiments, the compound is selected from the group consisting of:
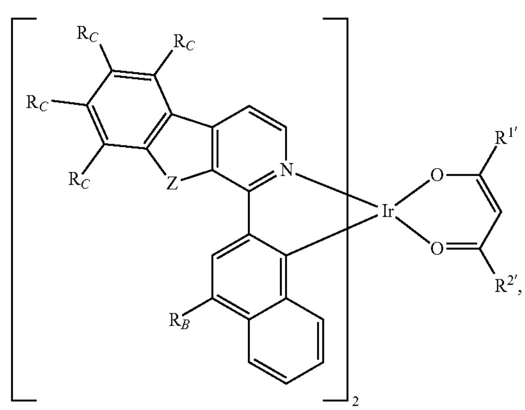

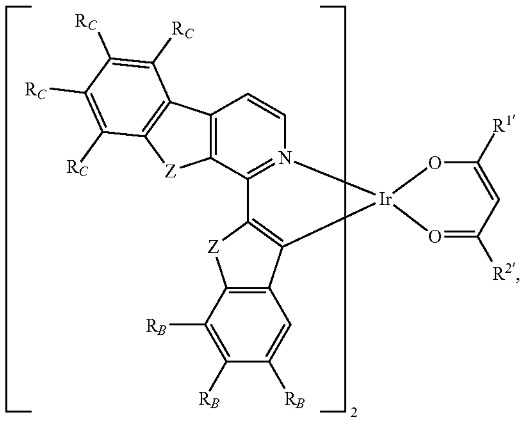
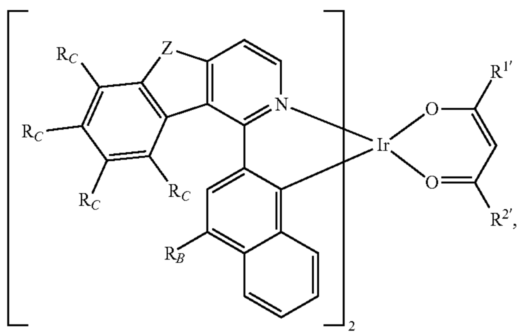
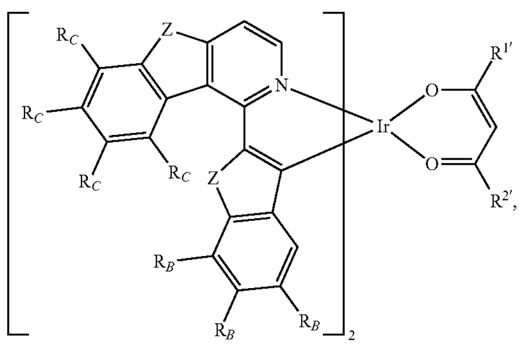
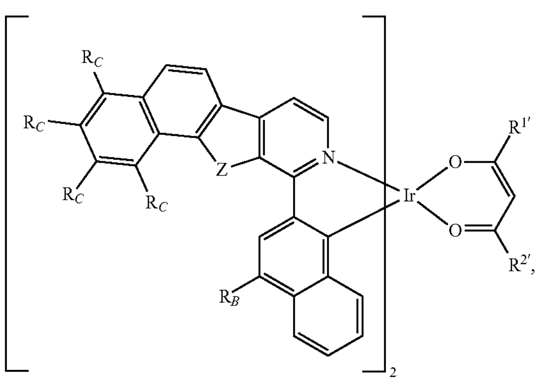
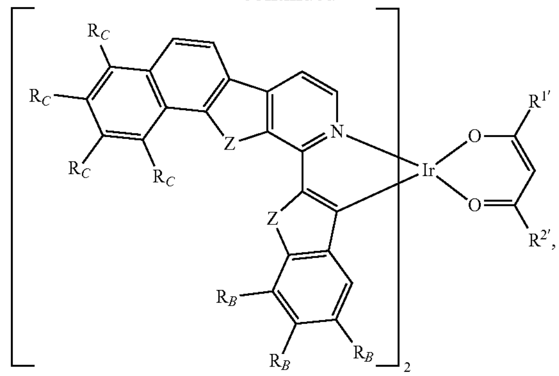
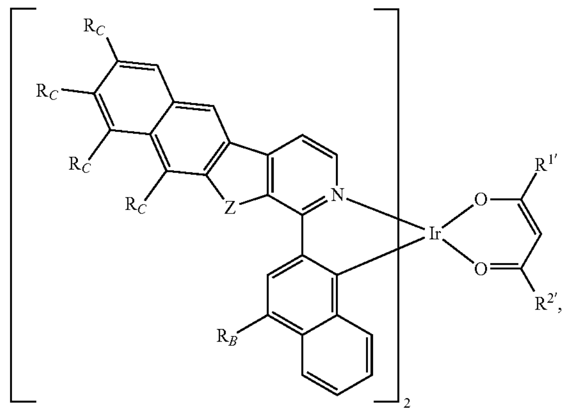
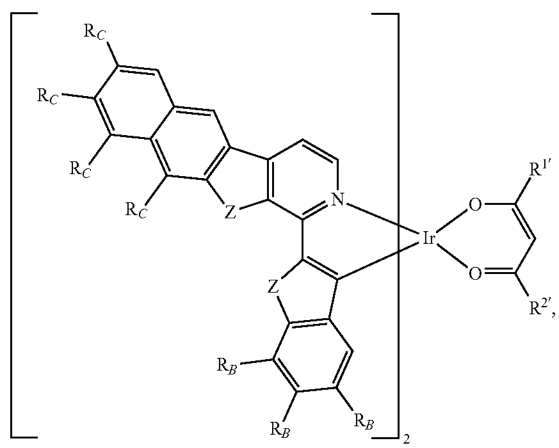
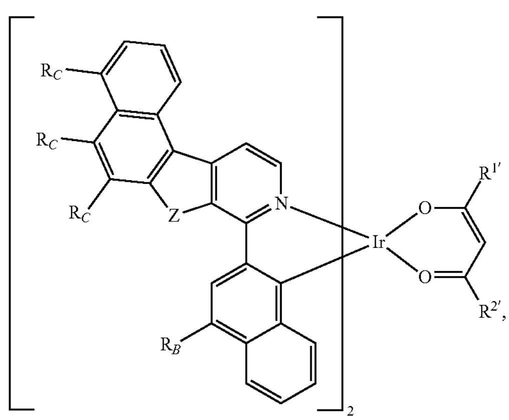
and -continued
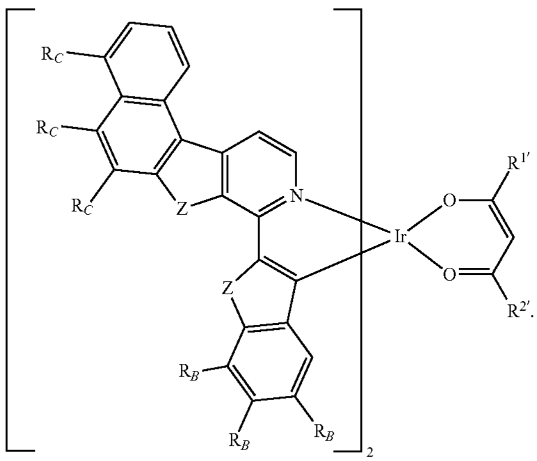
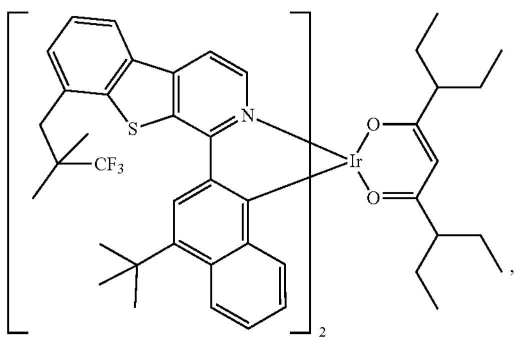
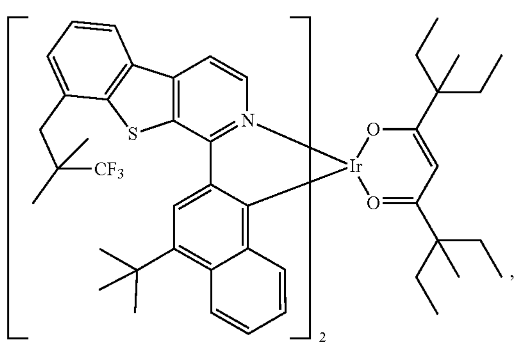
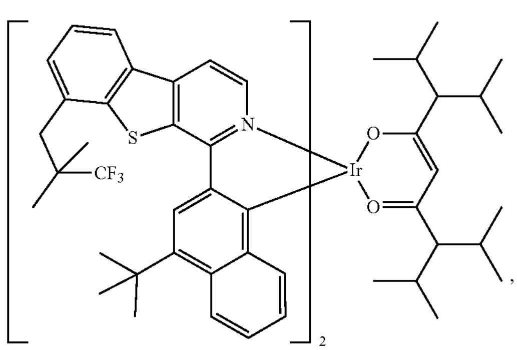
-continued
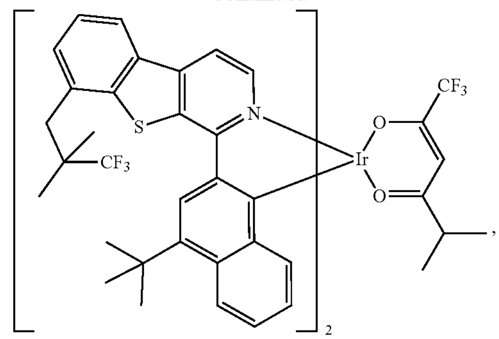
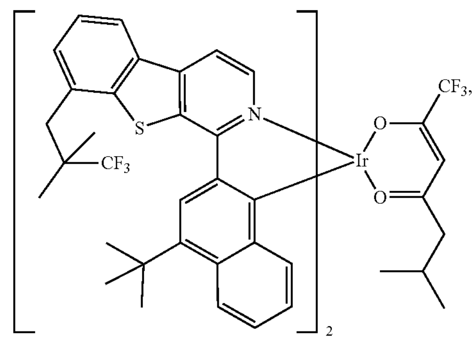
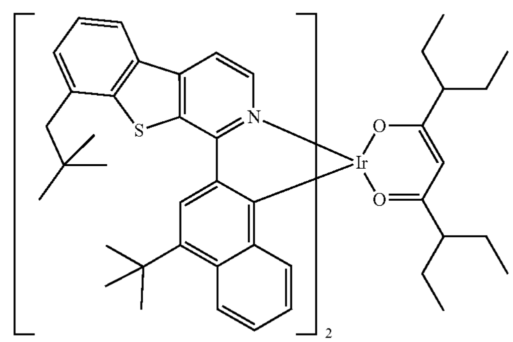
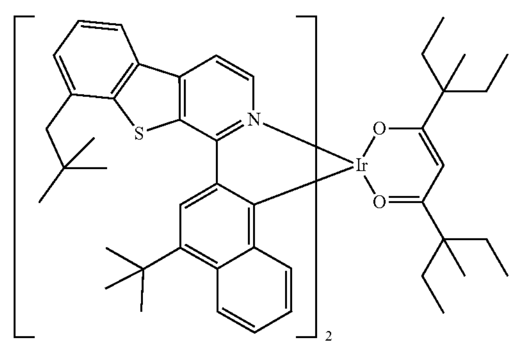
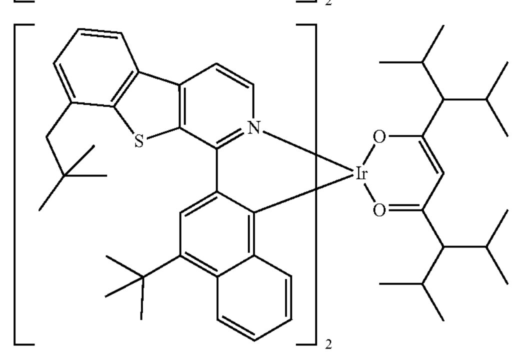

-continued
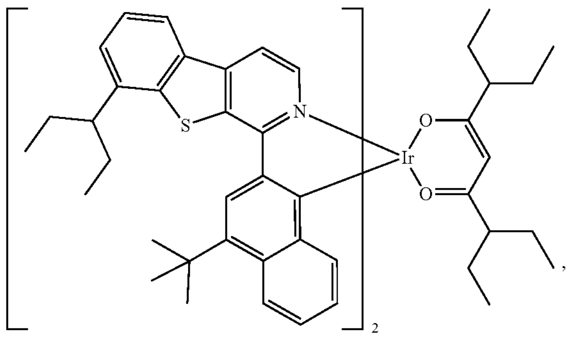
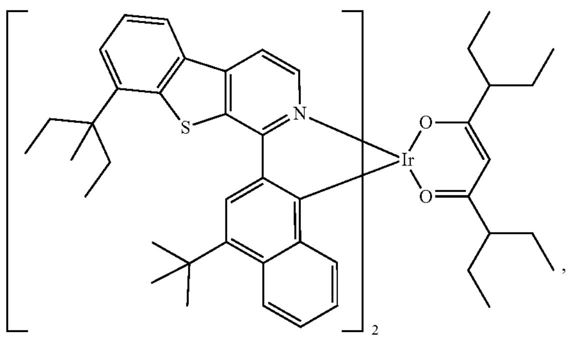
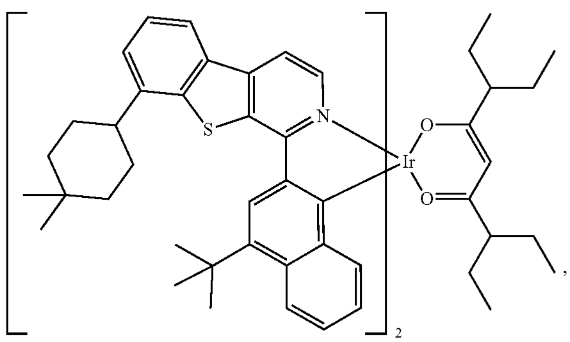
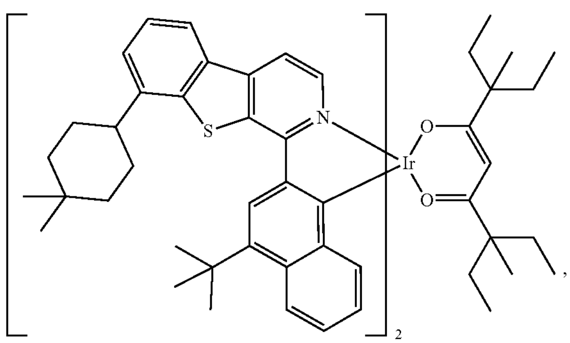
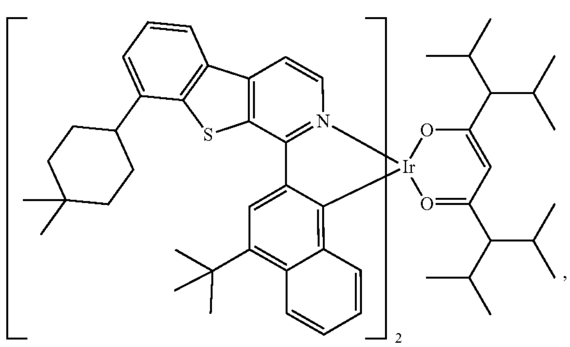
-continued
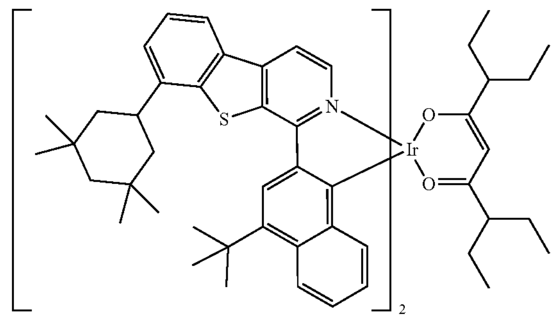
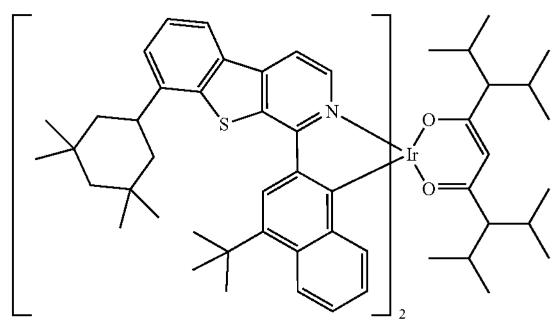
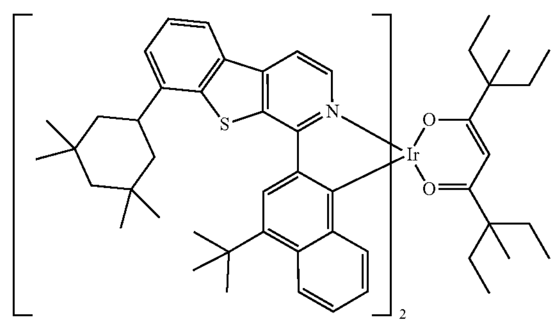
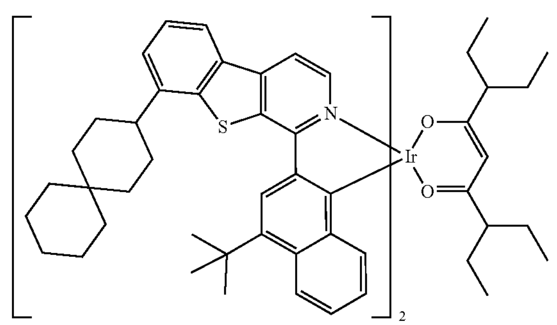
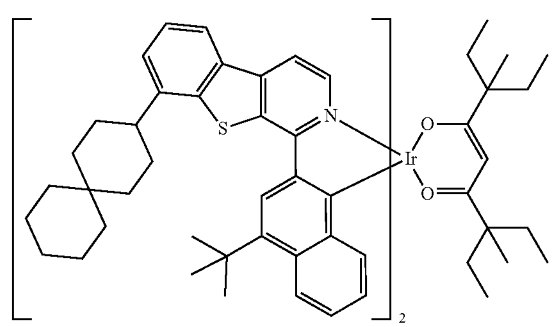

-continued
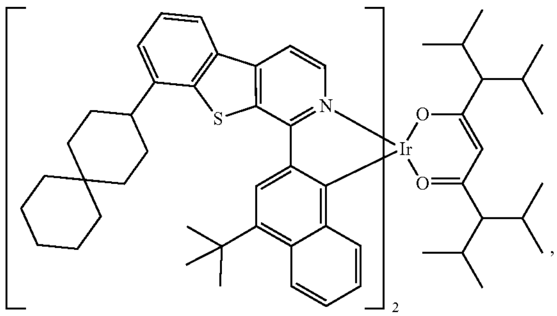
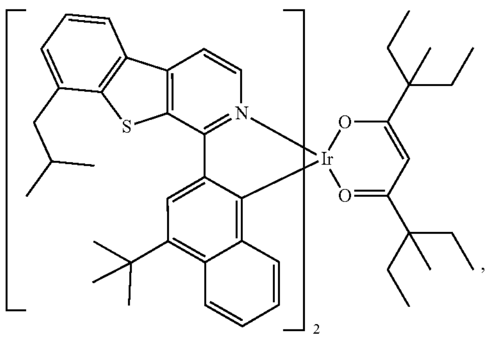
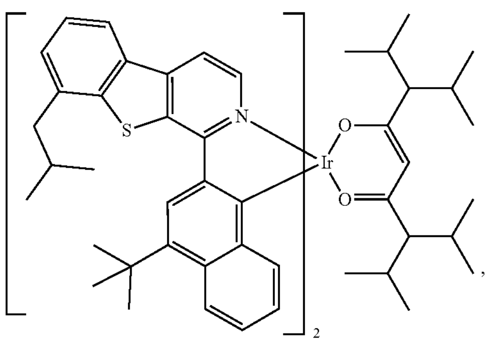
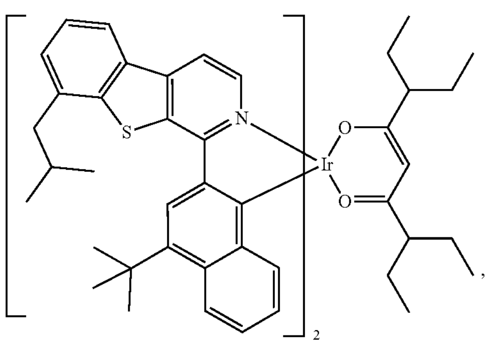
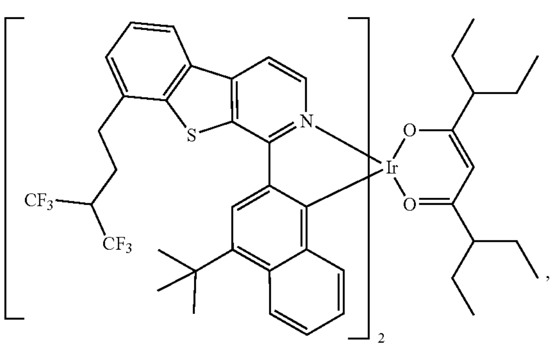
-continued
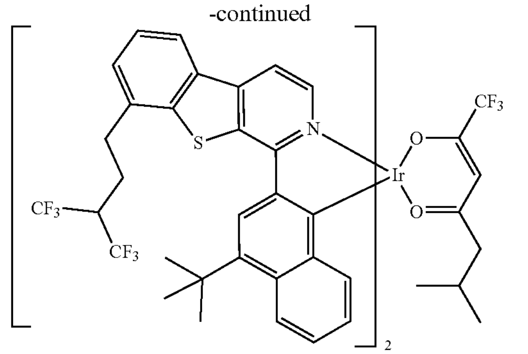
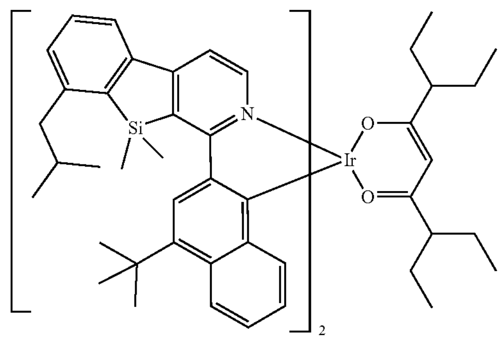
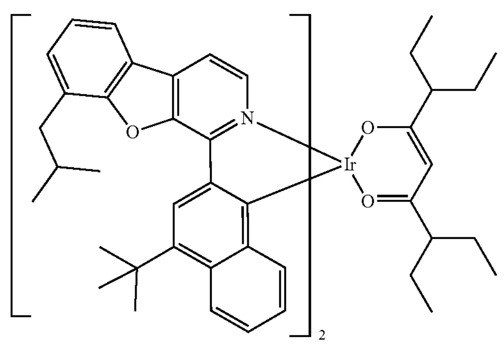
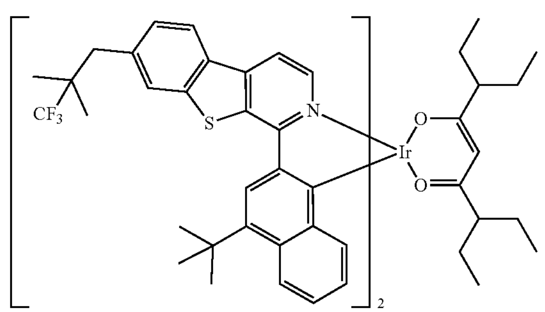
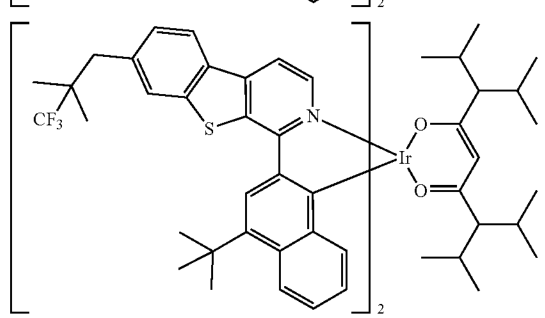

-continued
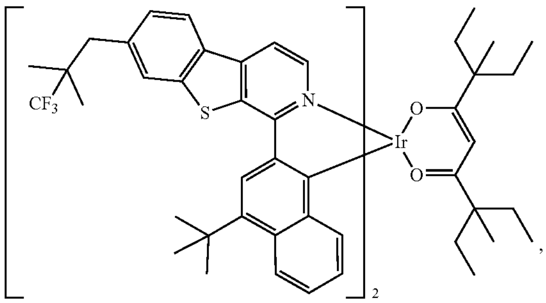
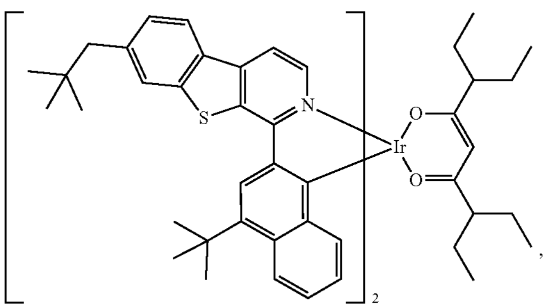
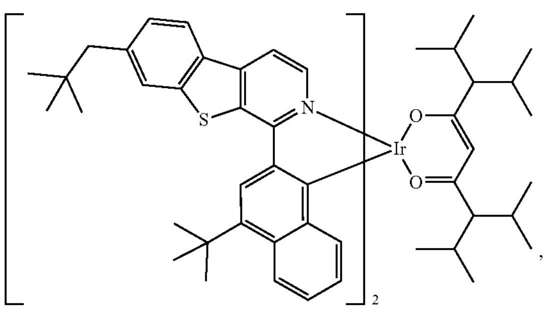
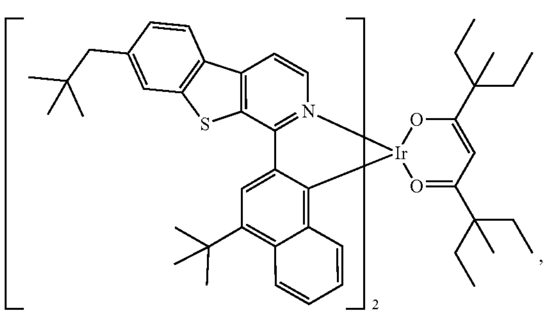
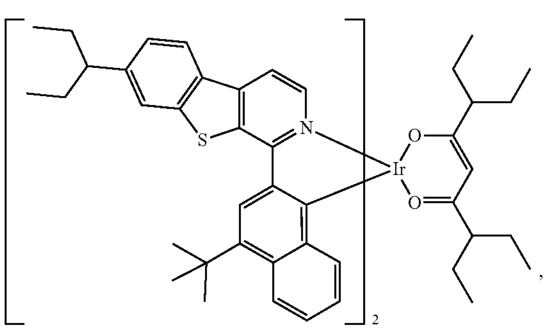
-continued
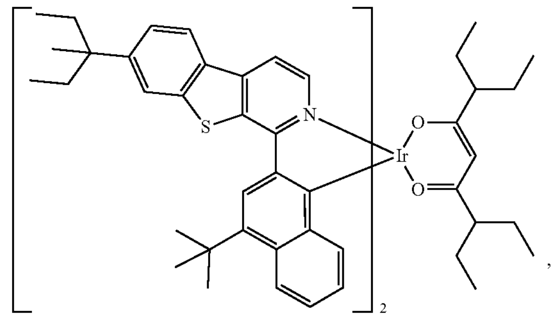
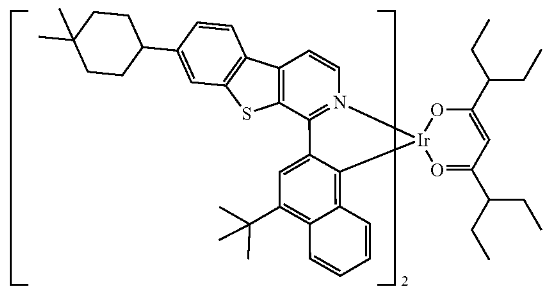
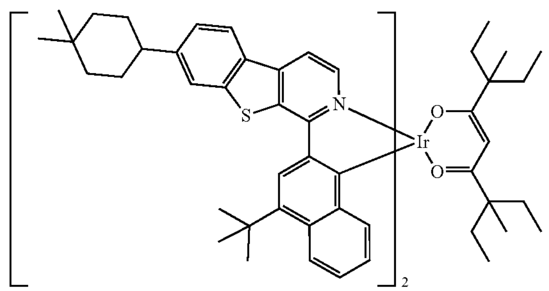
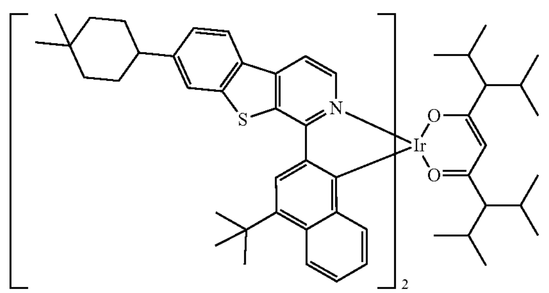
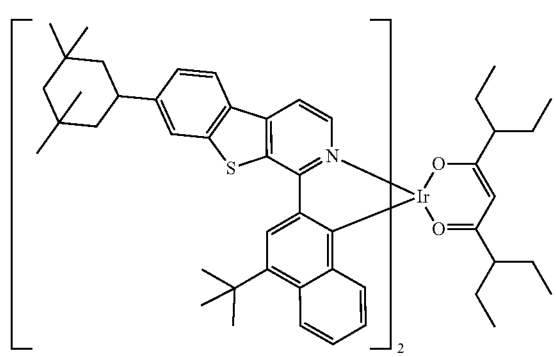

-continued
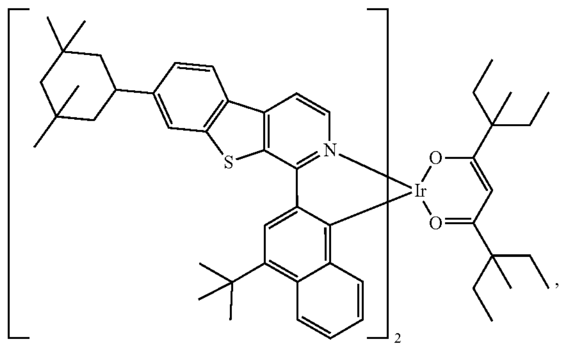
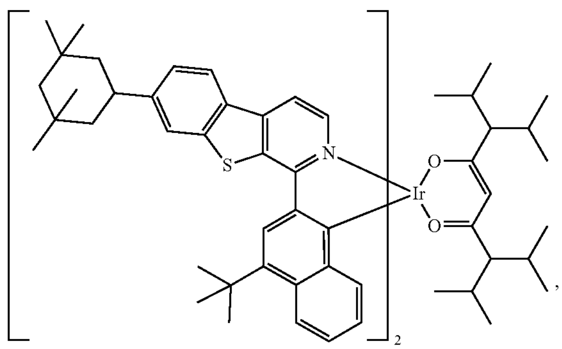
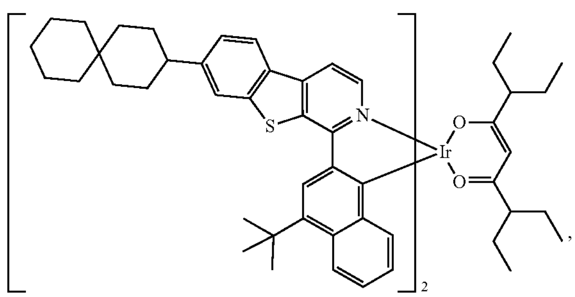
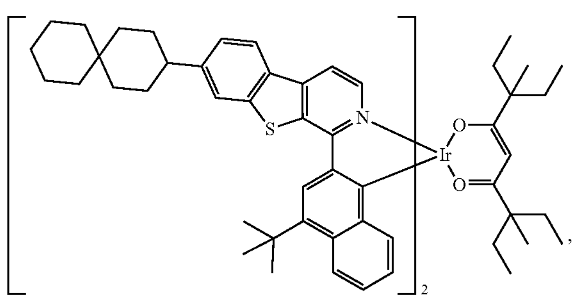
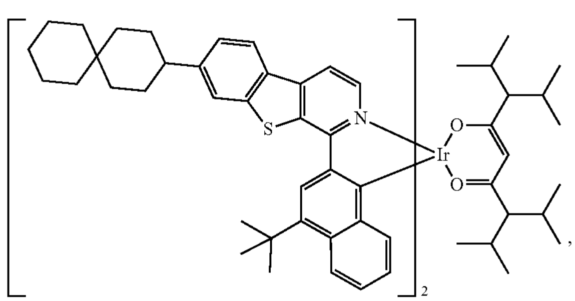
-continued
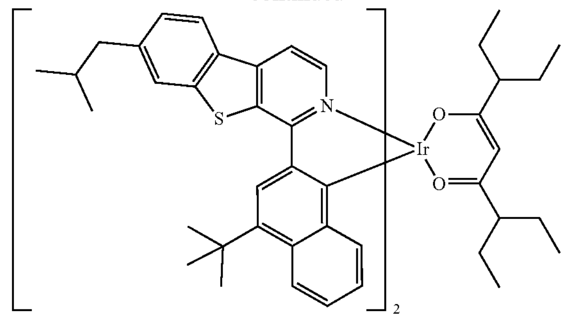
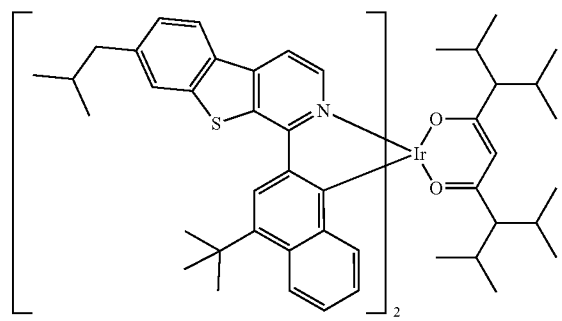
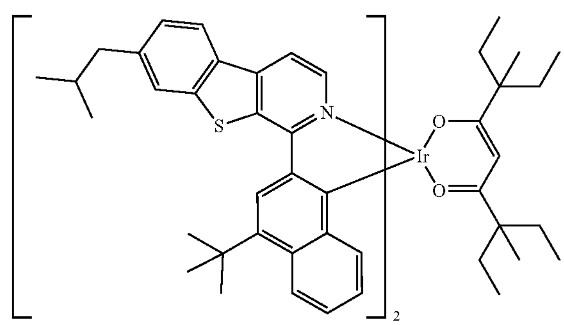
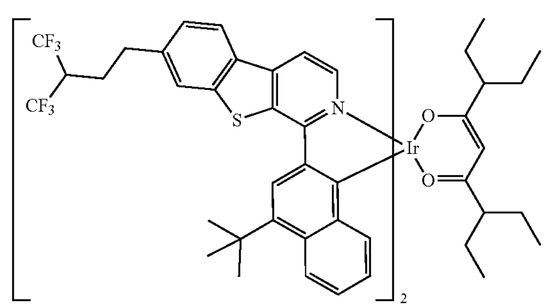
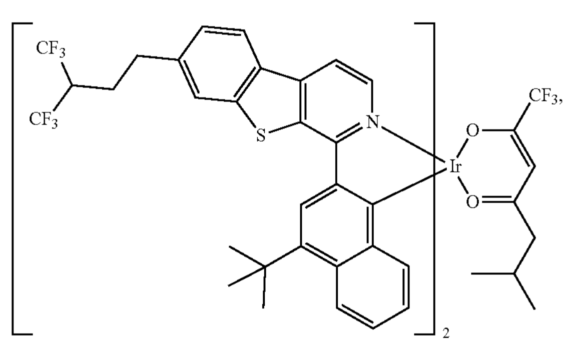

-continued
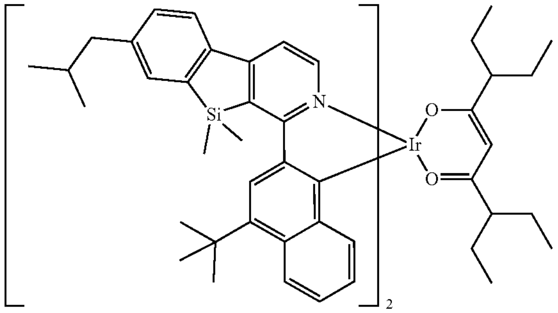
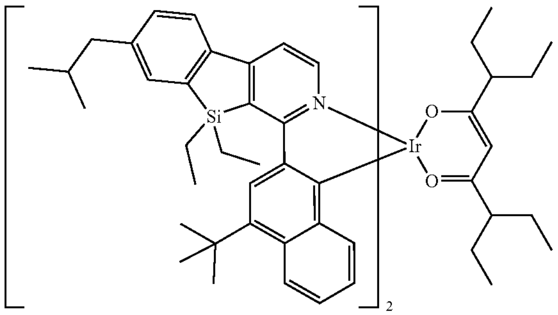
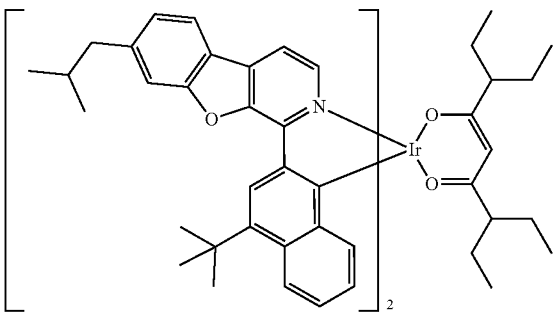
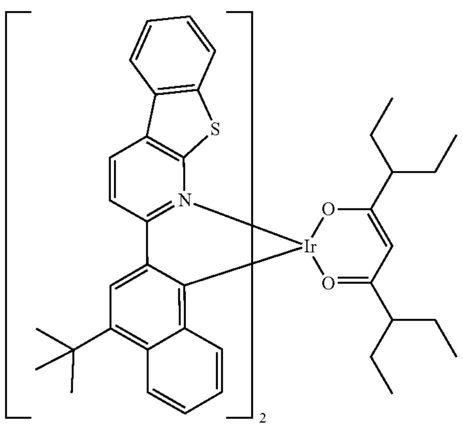
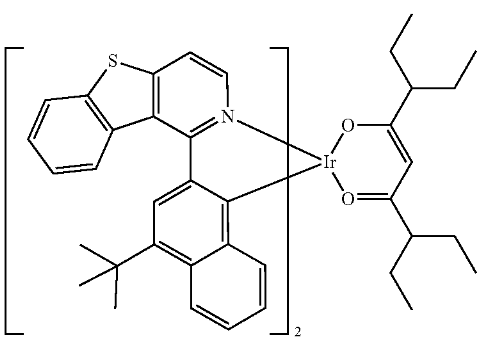
-continued
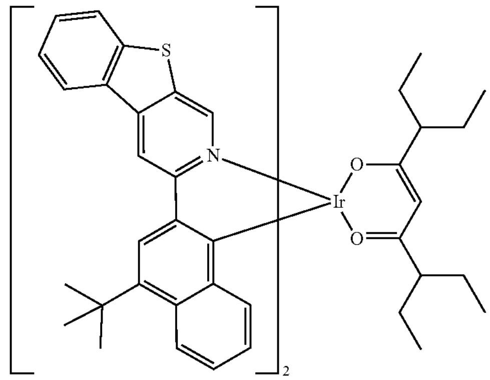
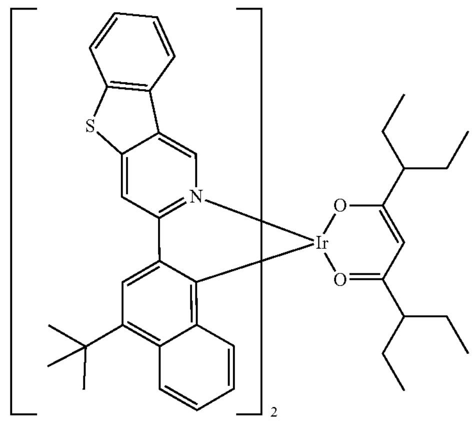
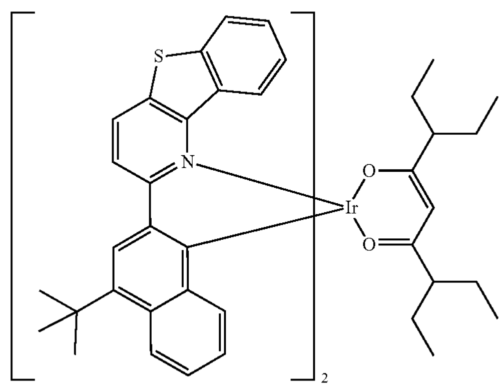
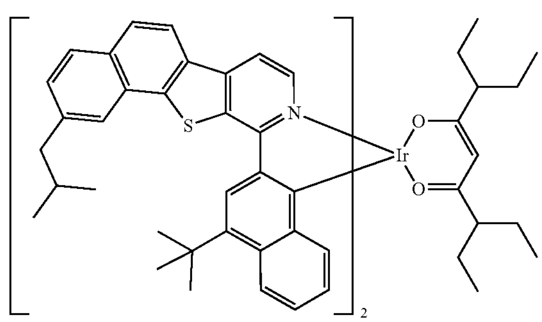

-continued
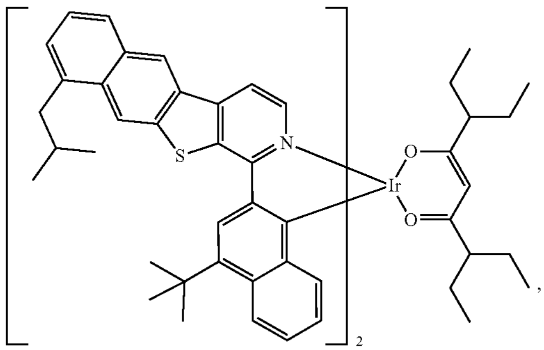
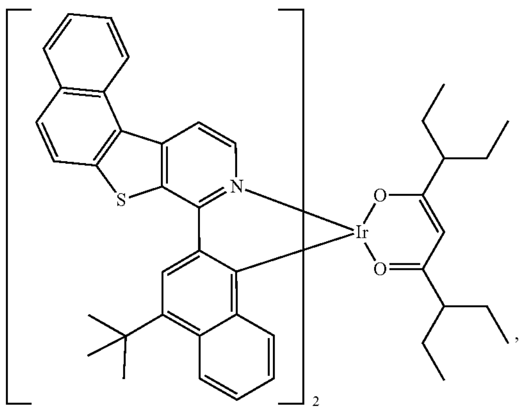
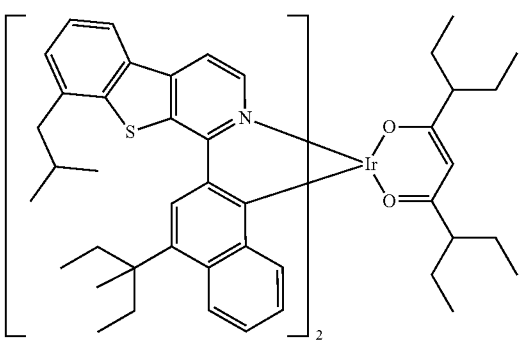
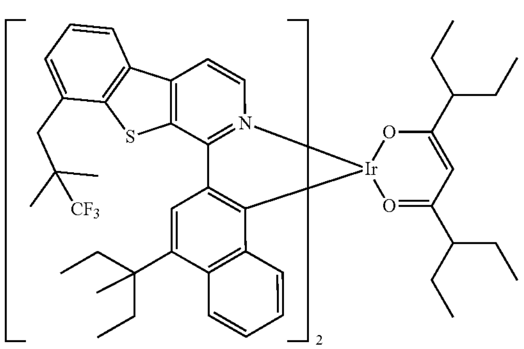
-continued
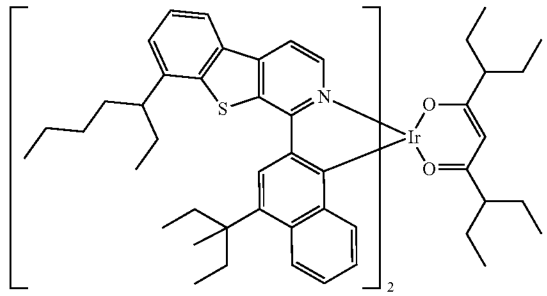
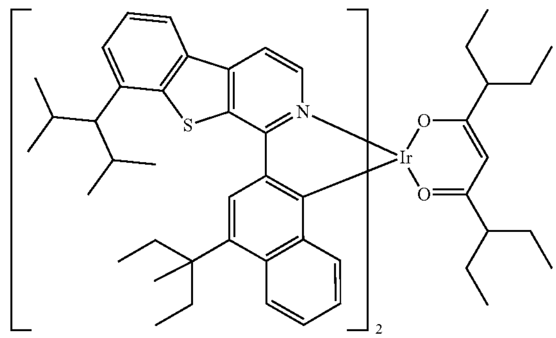
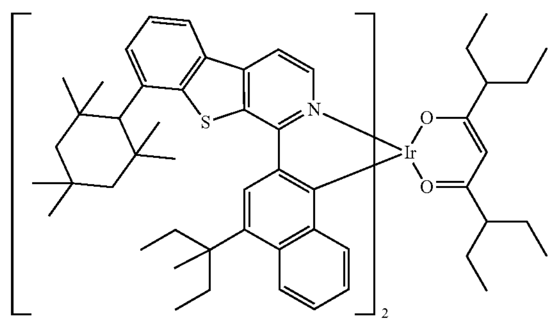
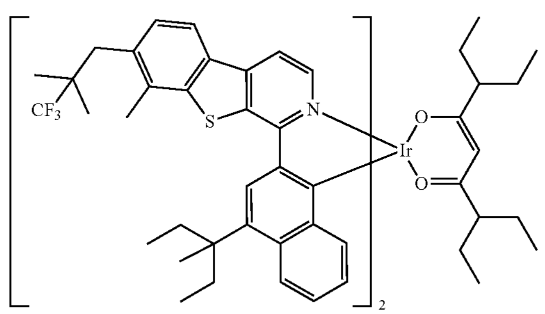
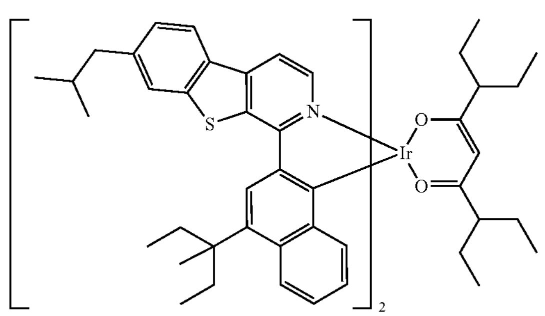

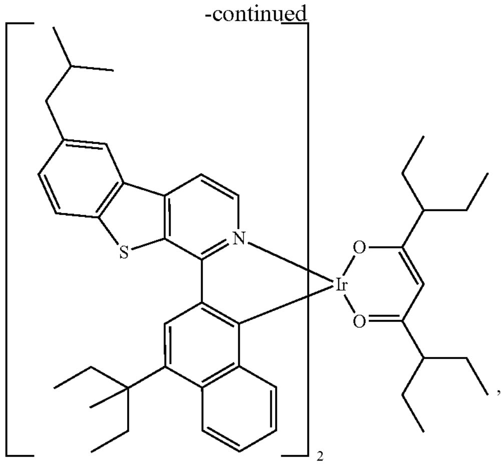
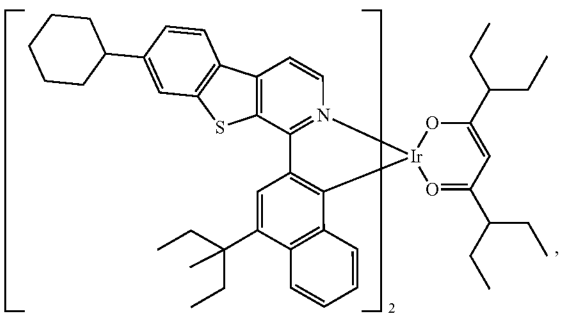
In some embodiments, the compound is selected from the group consisting of:
In another aspect, the compound is selected from the group consisting of:
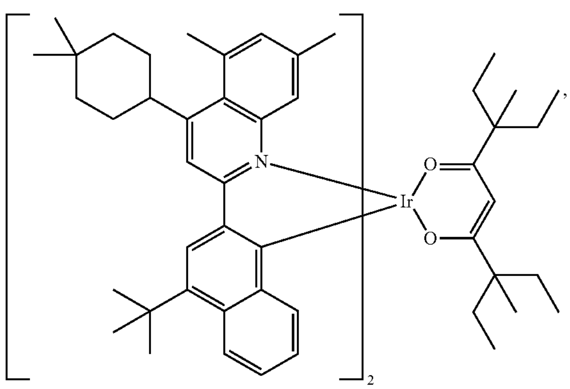
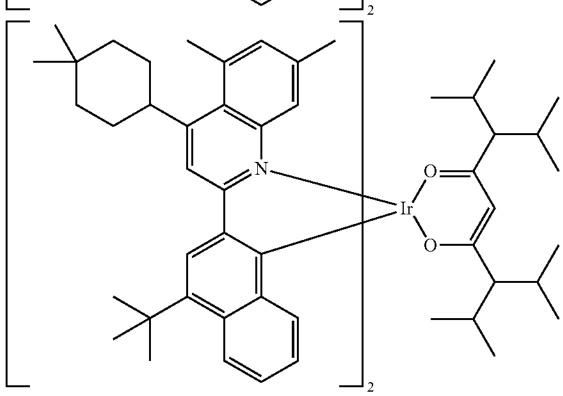
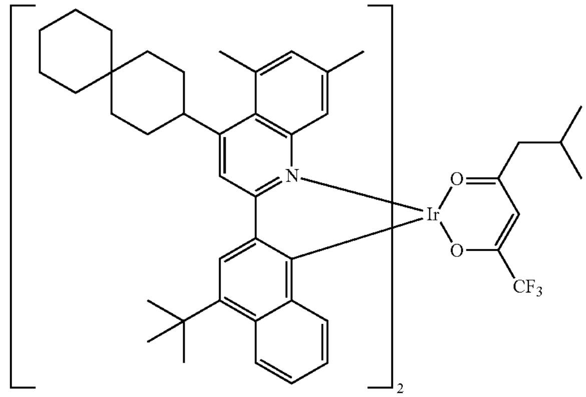
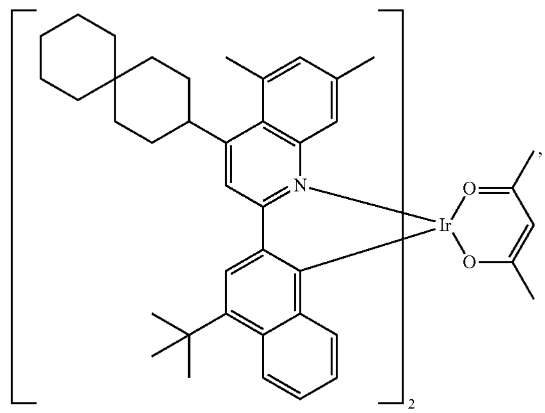
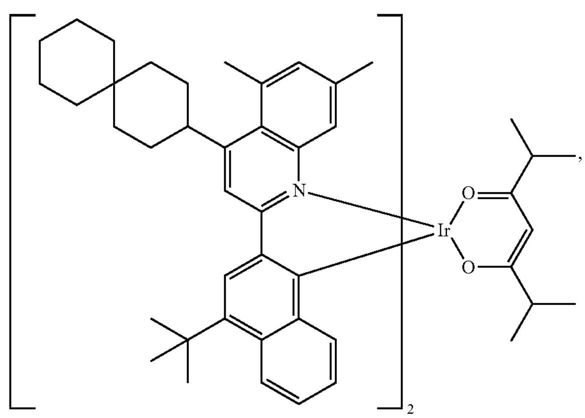
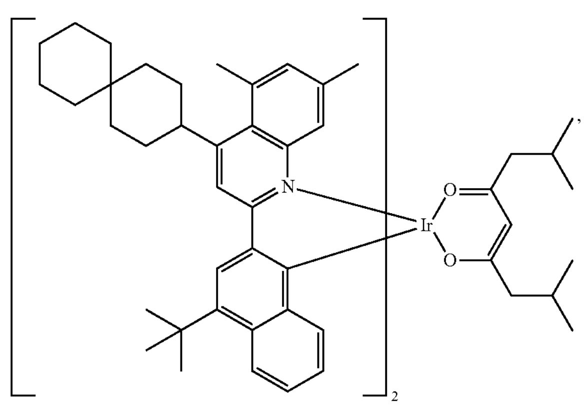

-continued
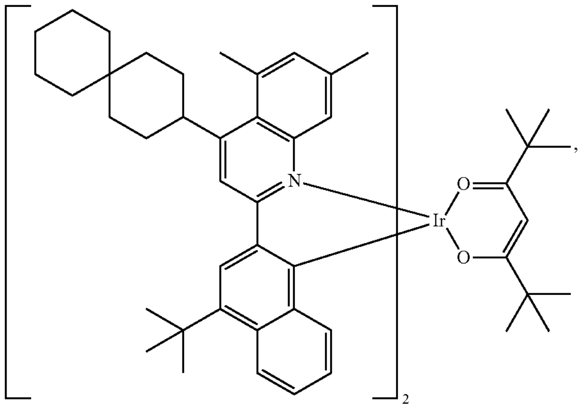
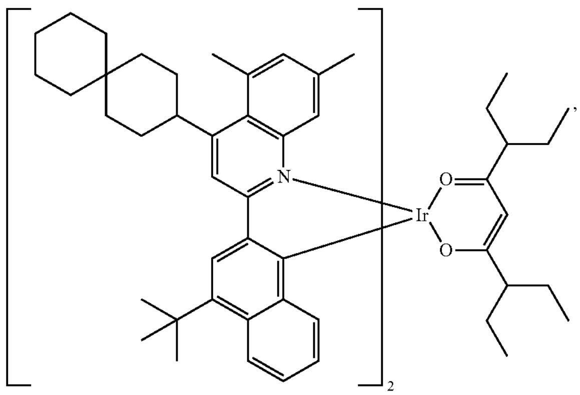
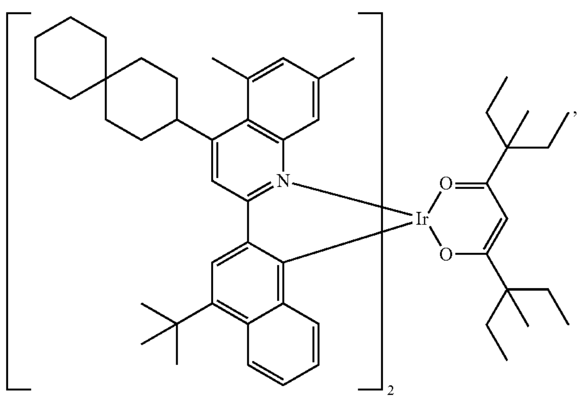
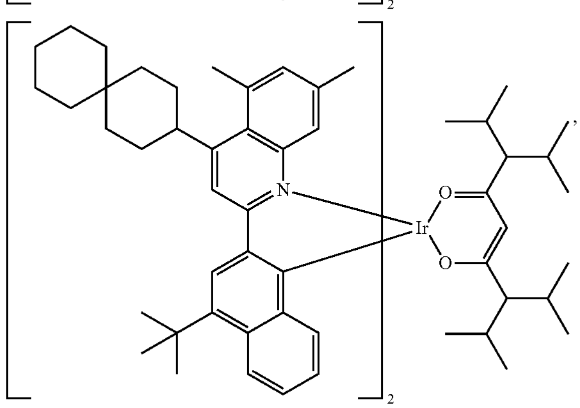
-continued
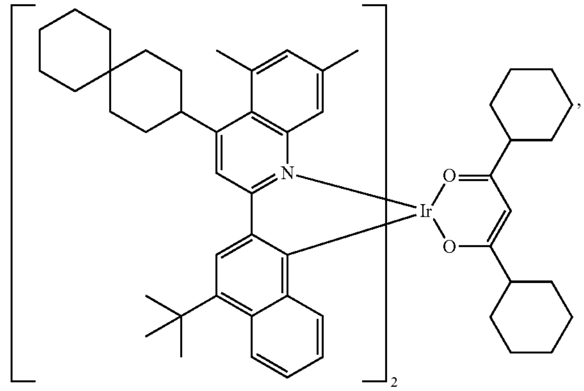
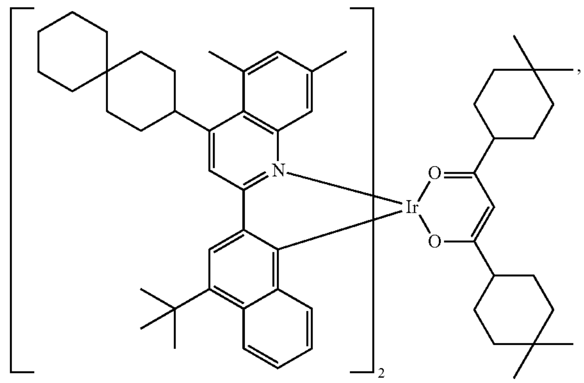
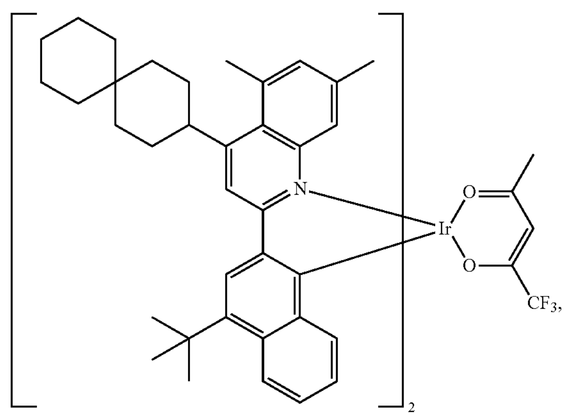
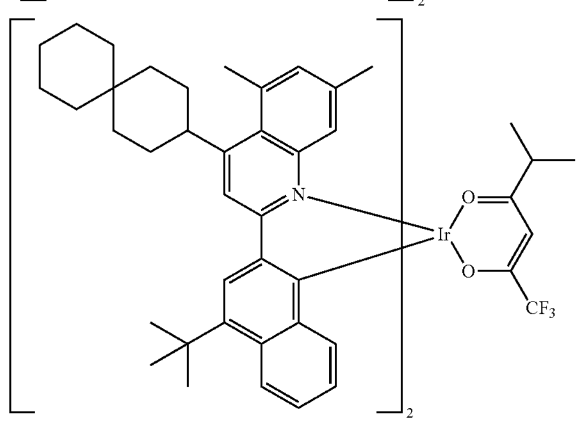

-continued
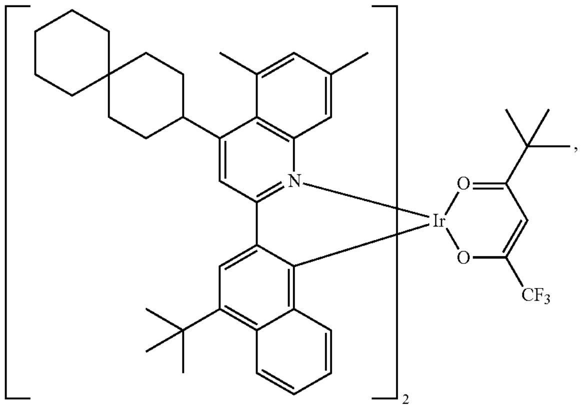
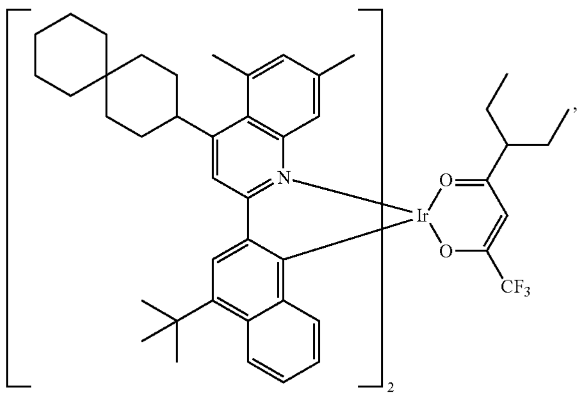
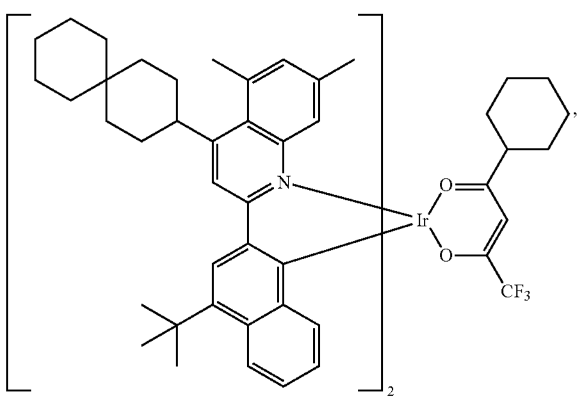
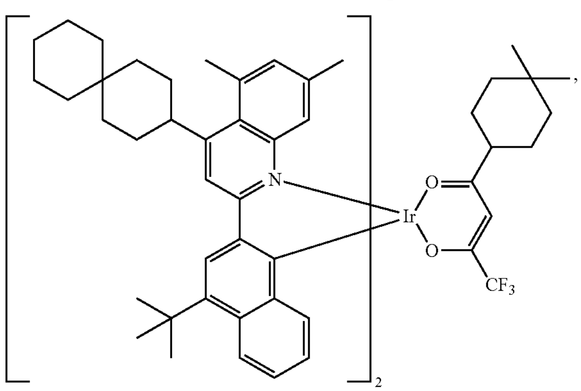
-continued
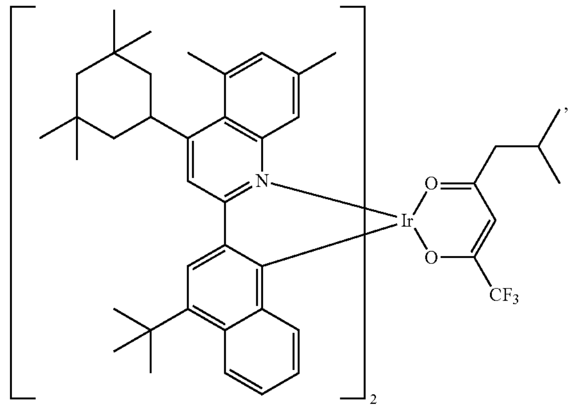
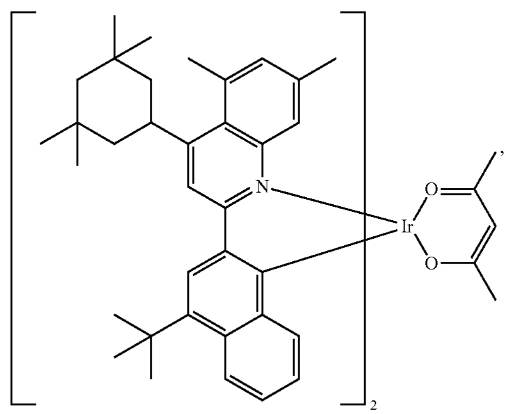
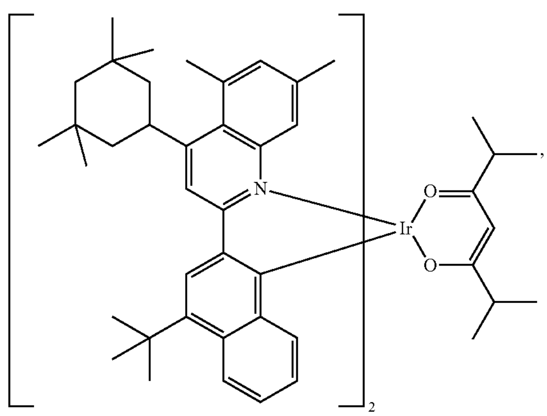
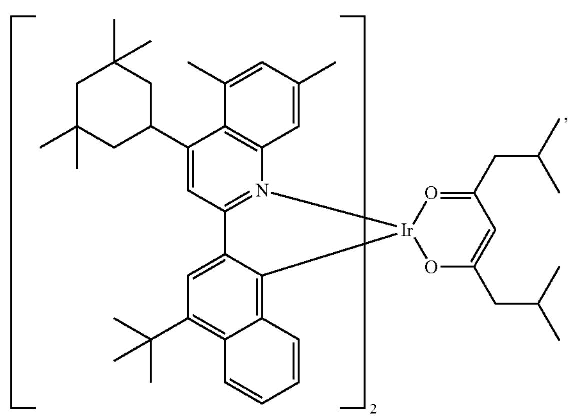

-continued
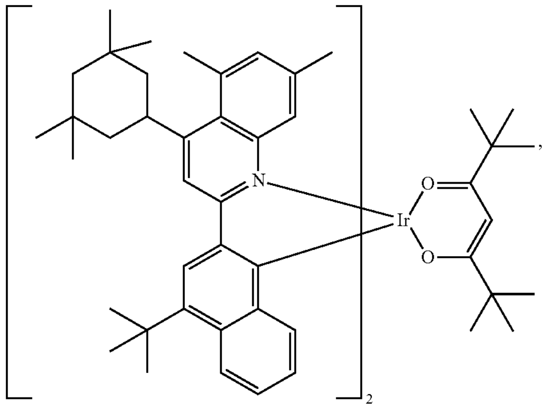
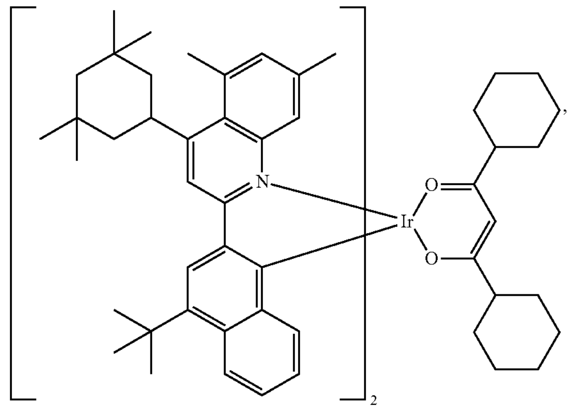
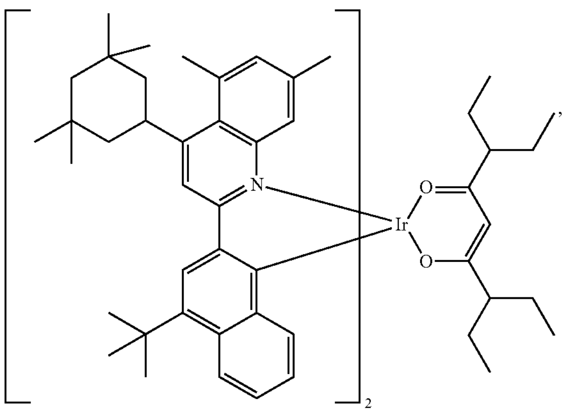
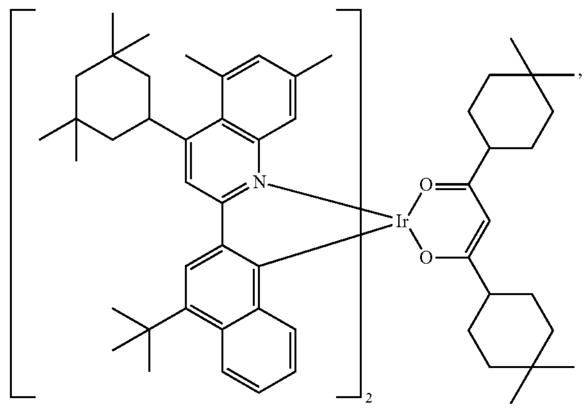
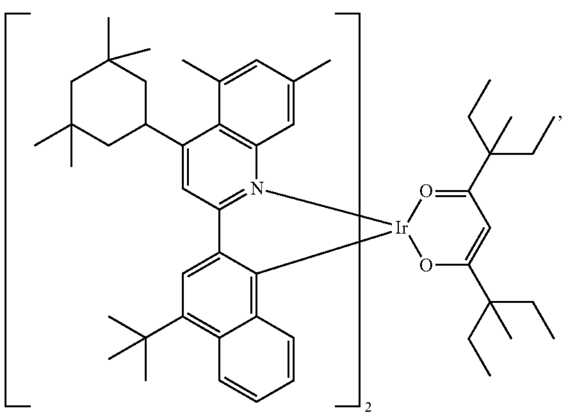
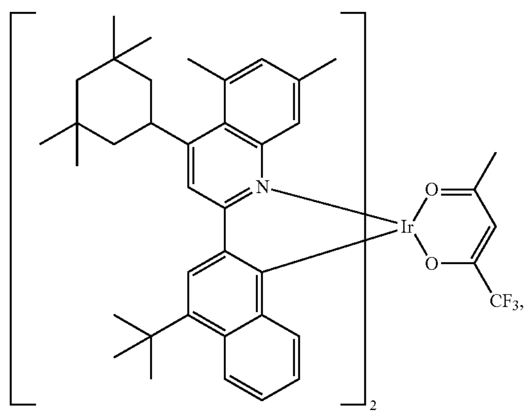
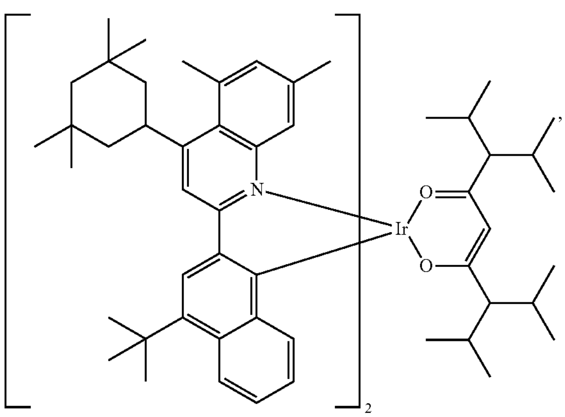
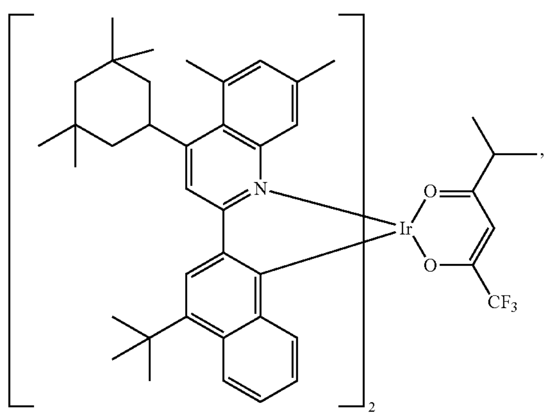

-continued
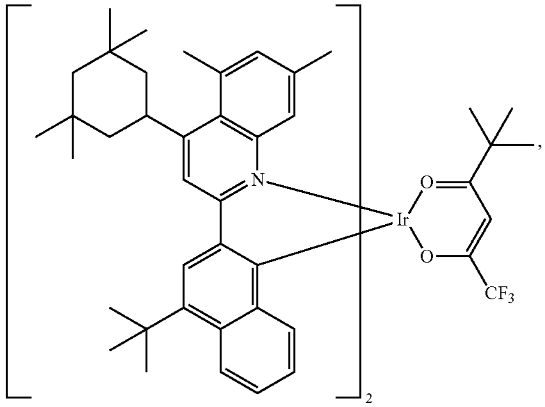
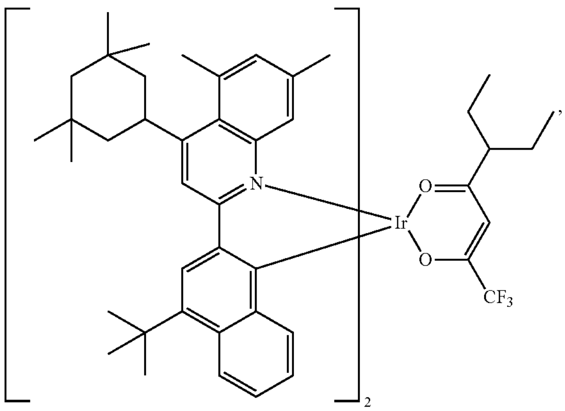
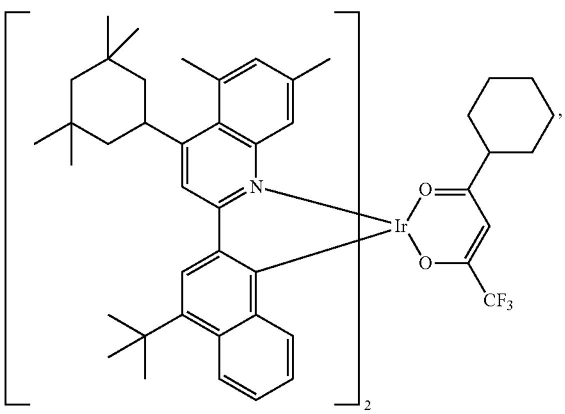
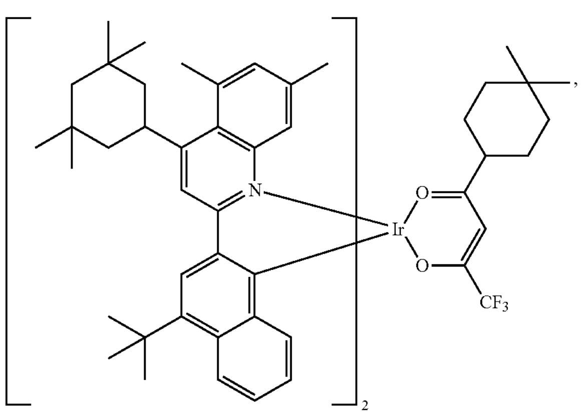
-continued
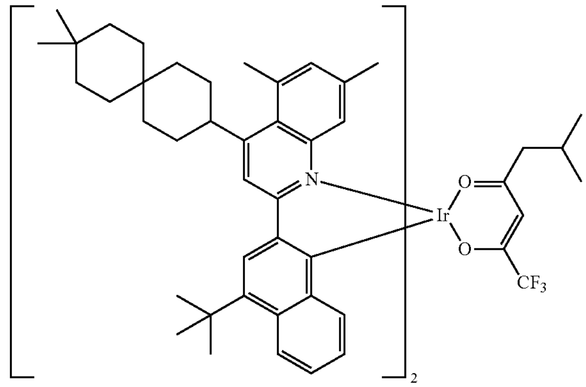
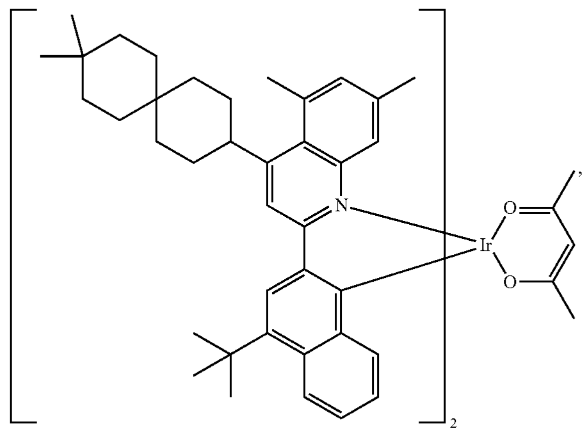
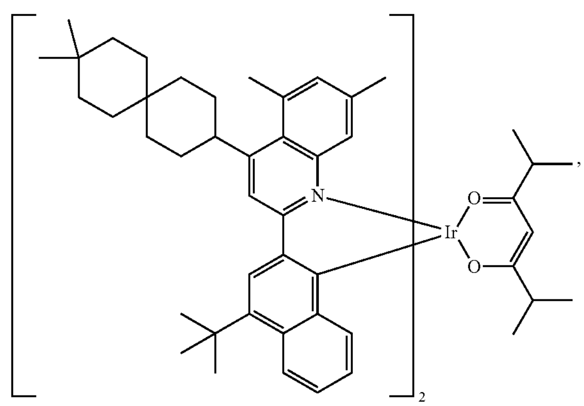
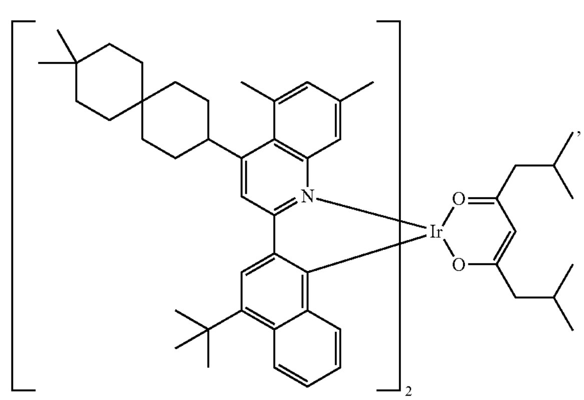

-continued
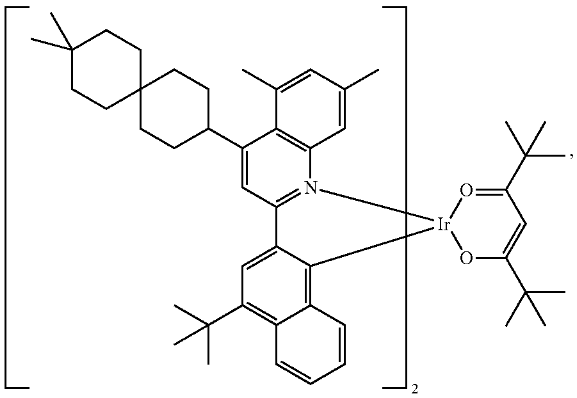
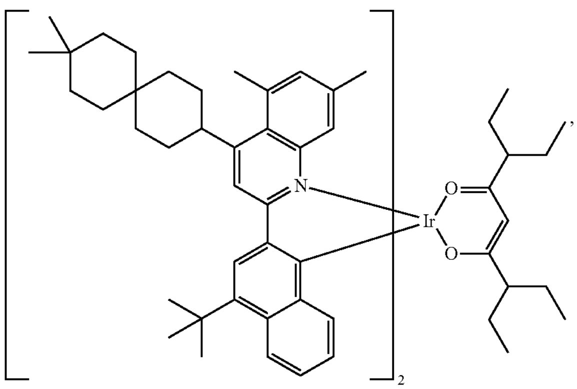
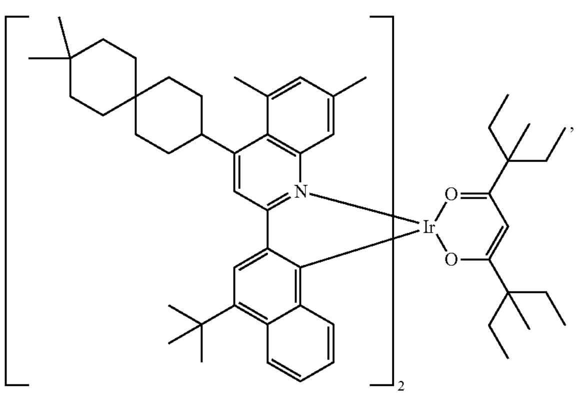
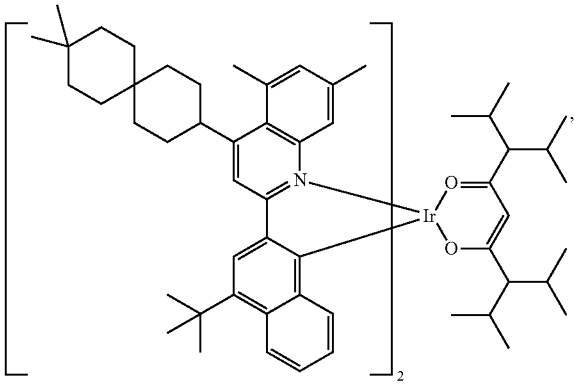
-continued
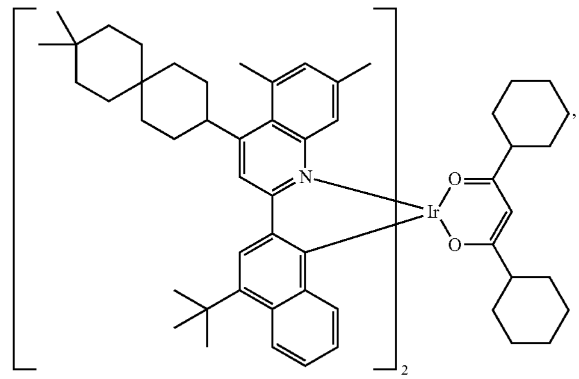
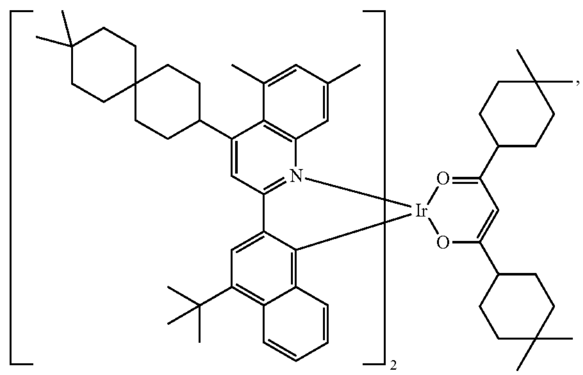
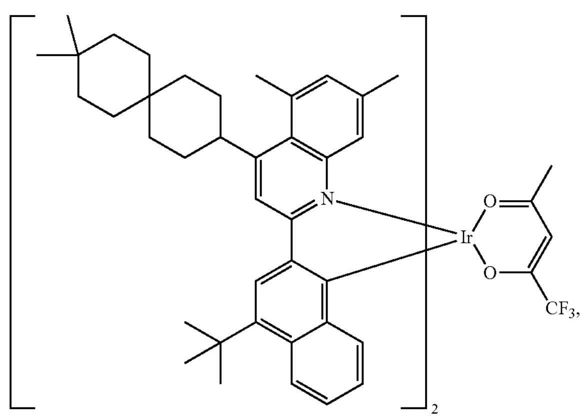
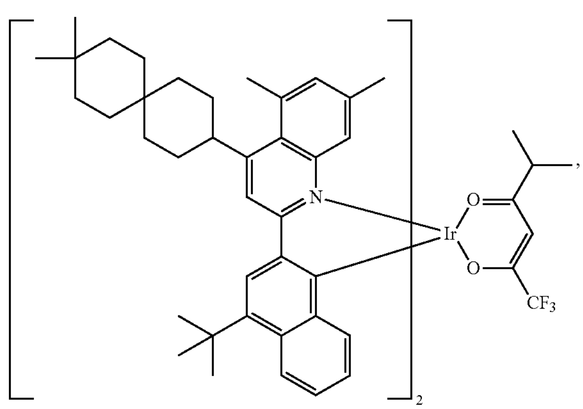

-continued
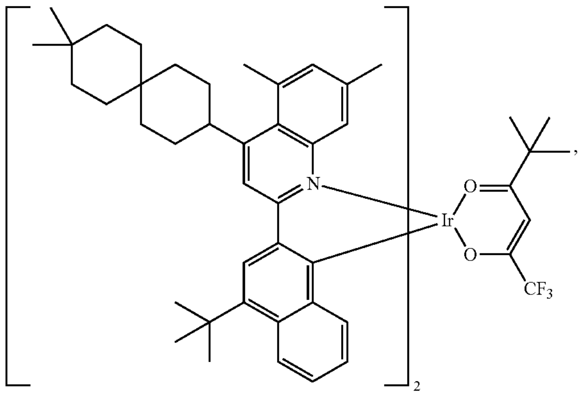
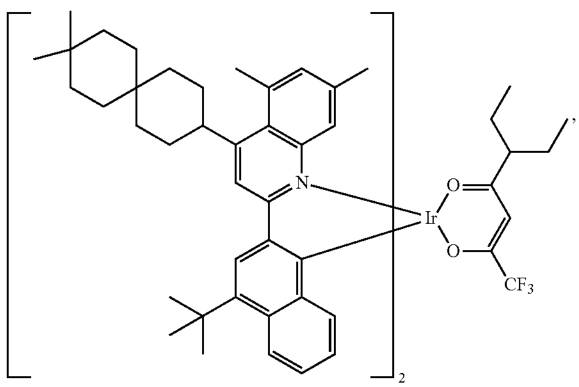
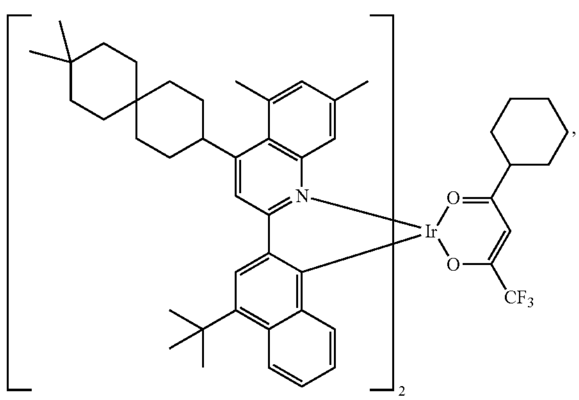
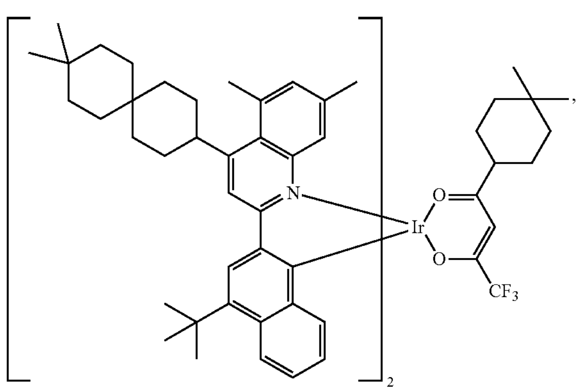
-continued
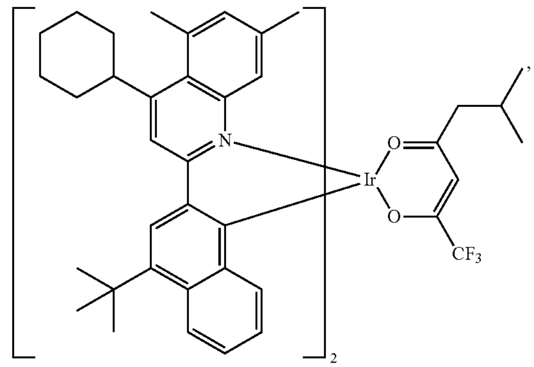
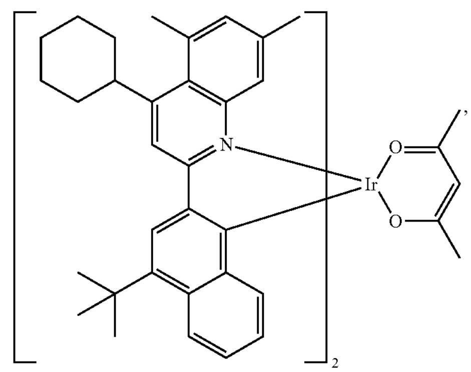
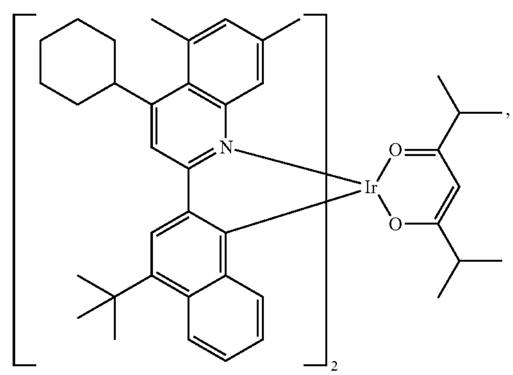
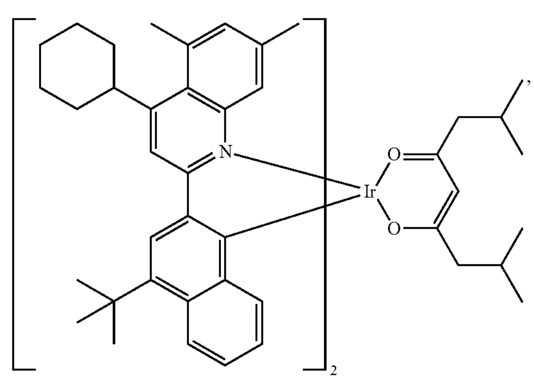

-continued
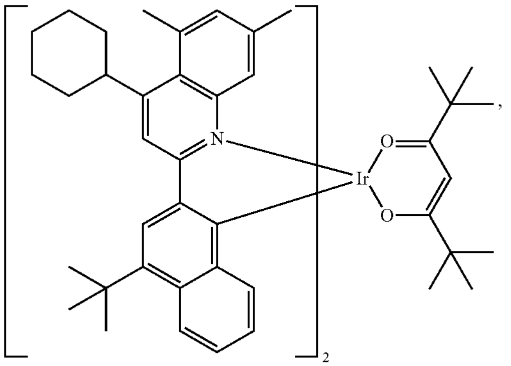
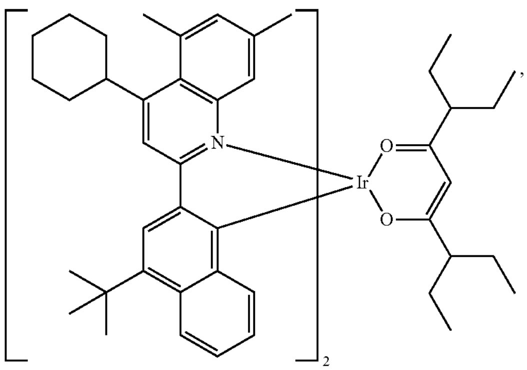
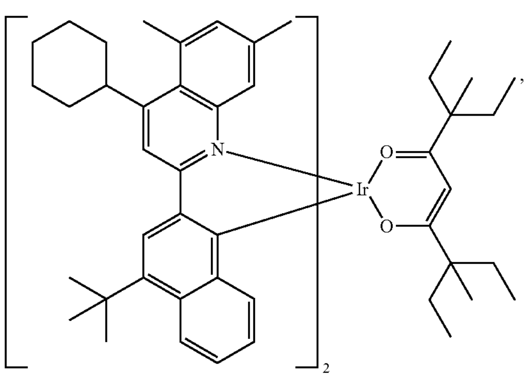
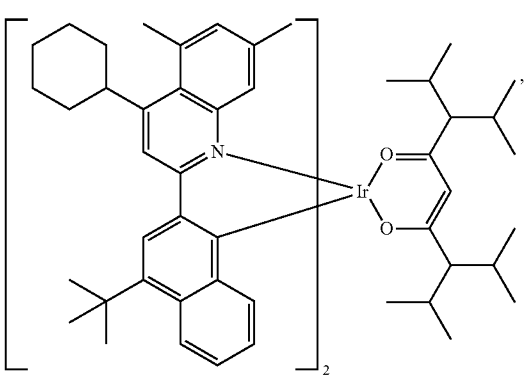
-continued
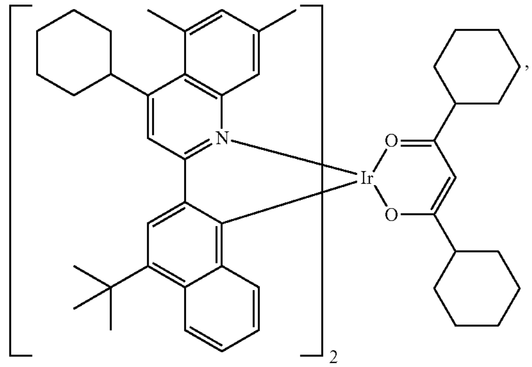
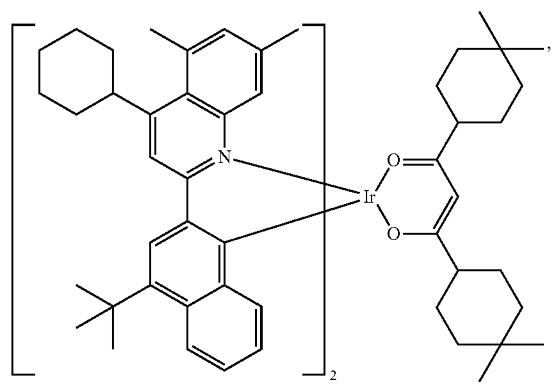
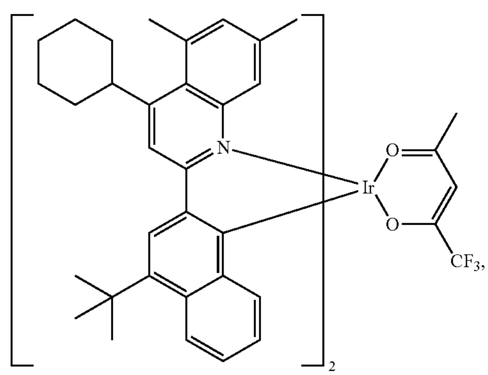
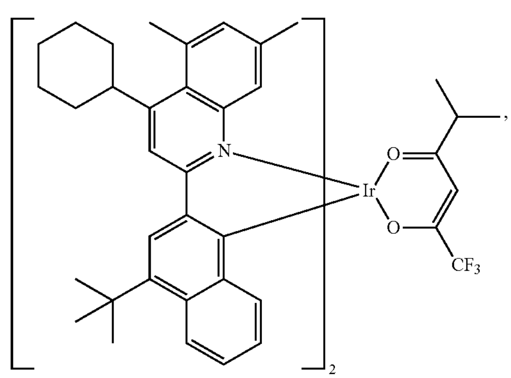

-continued
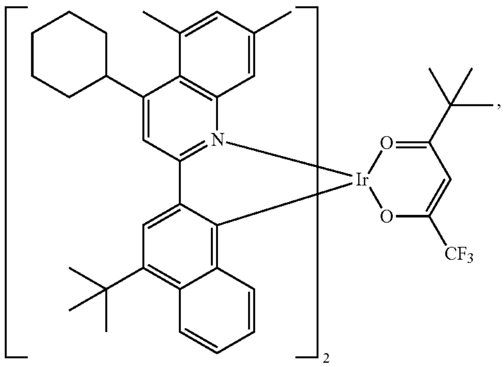
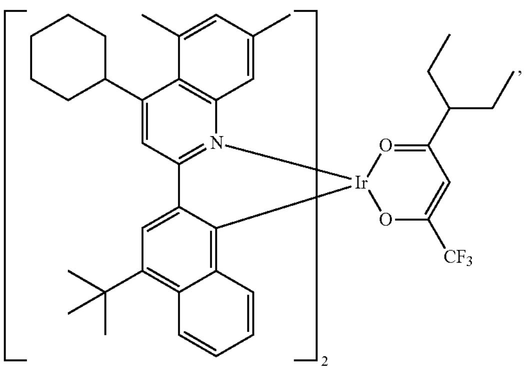
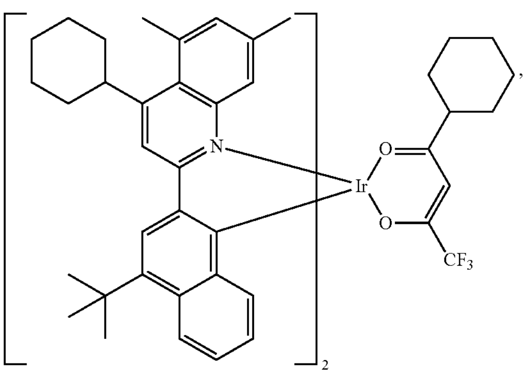
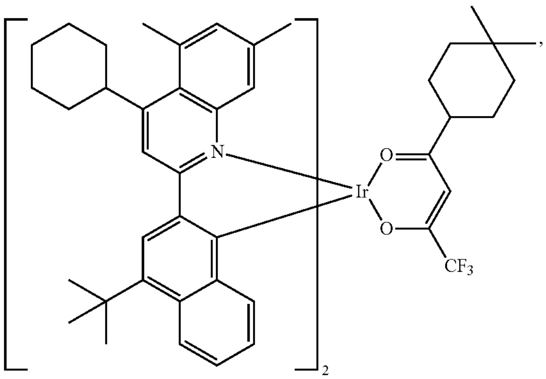
-continued
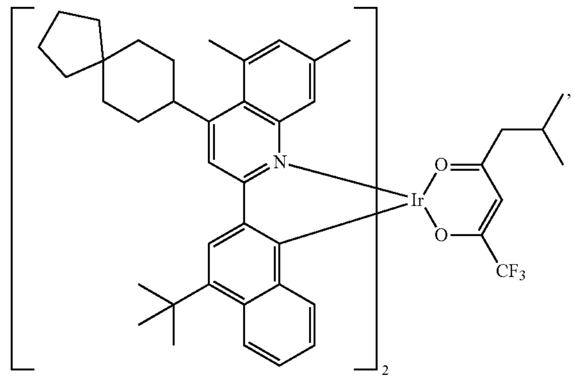
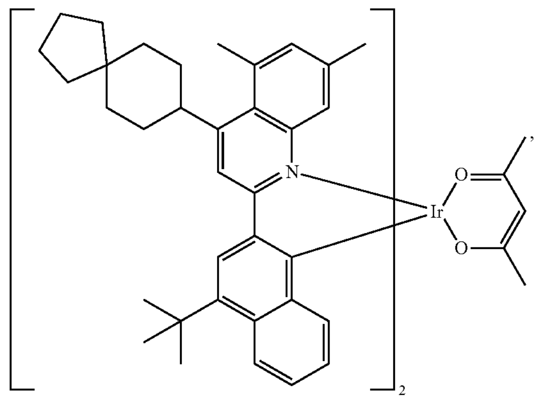
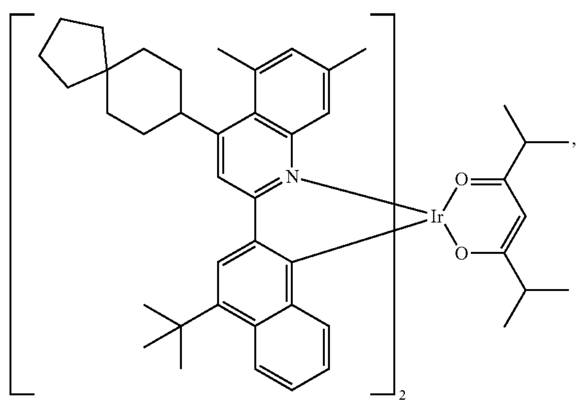
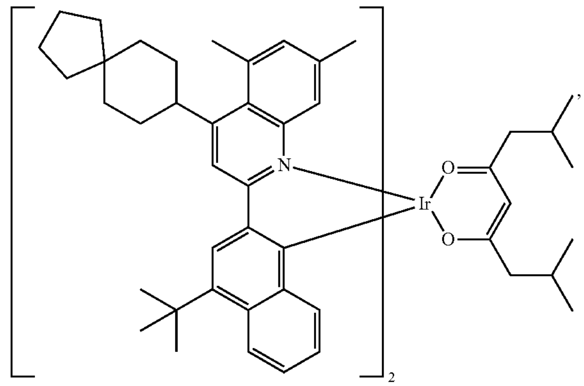

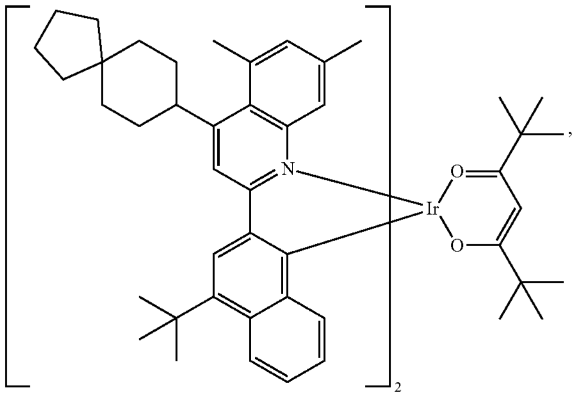
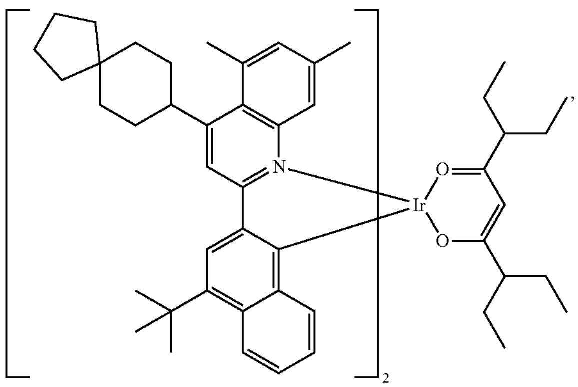
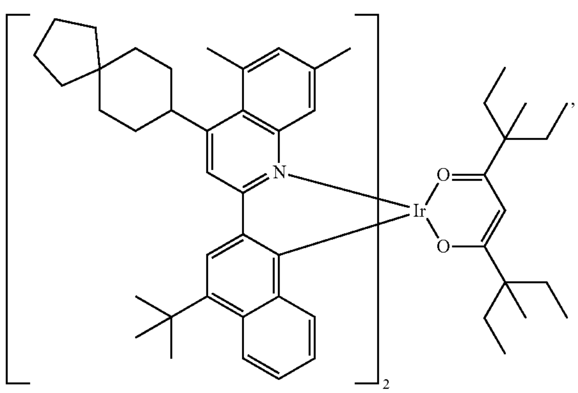
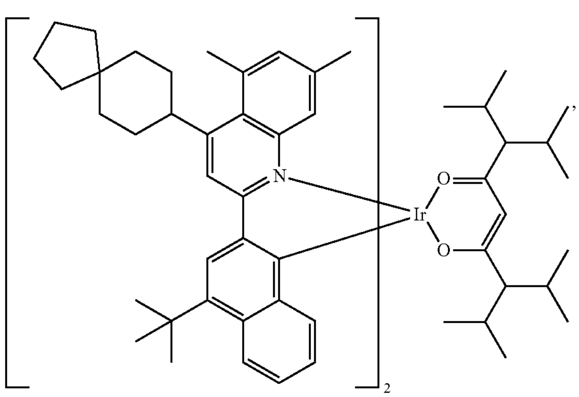
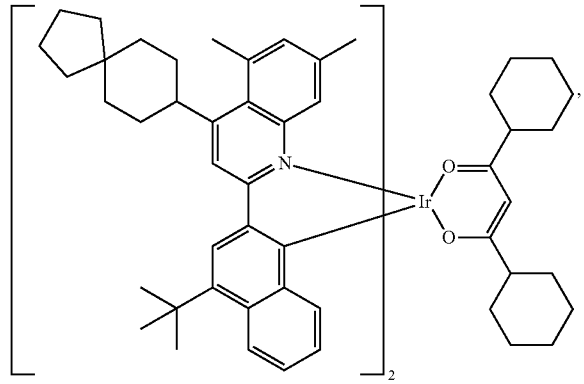
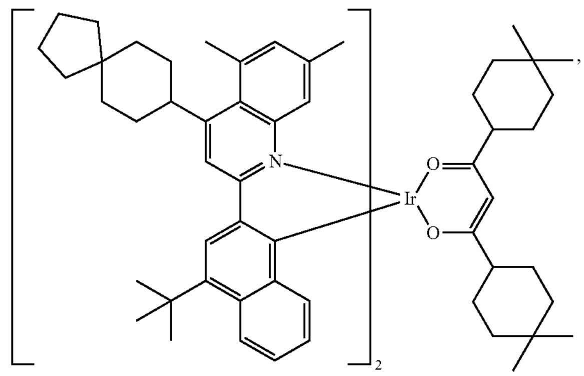
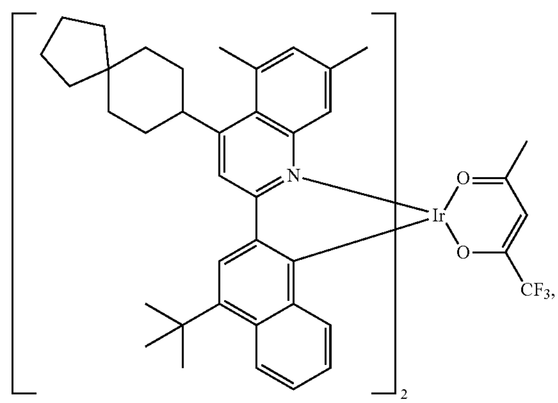
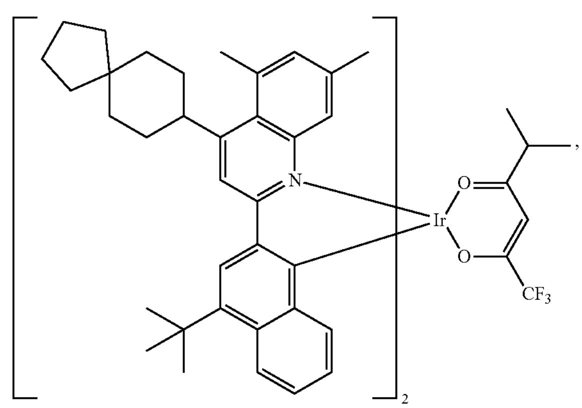

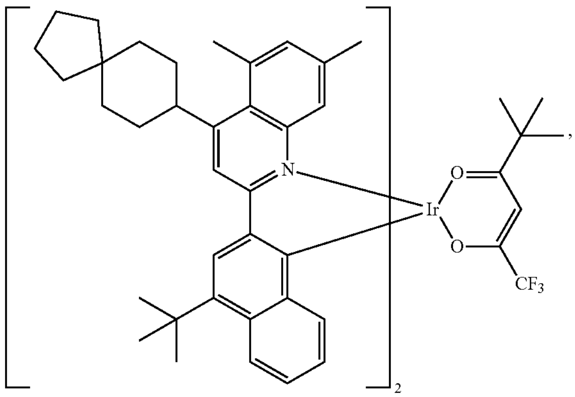
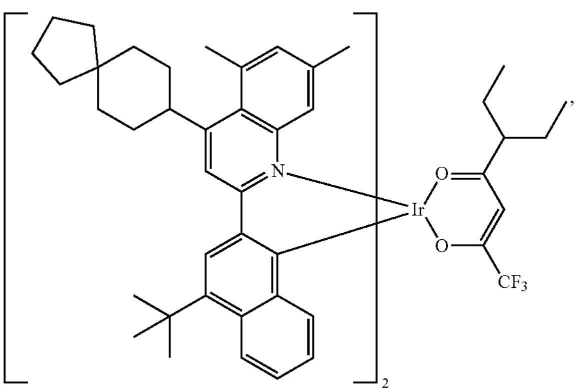
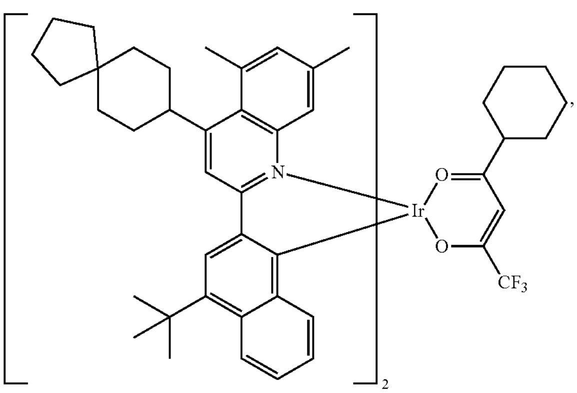
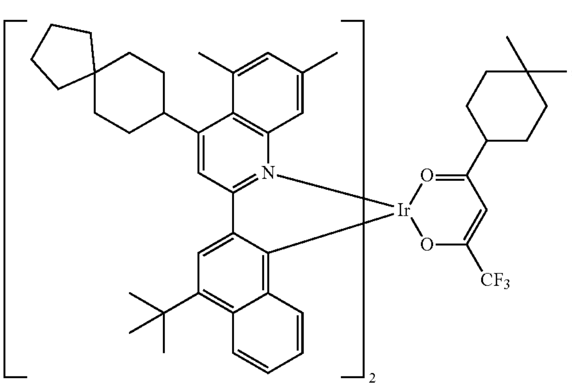
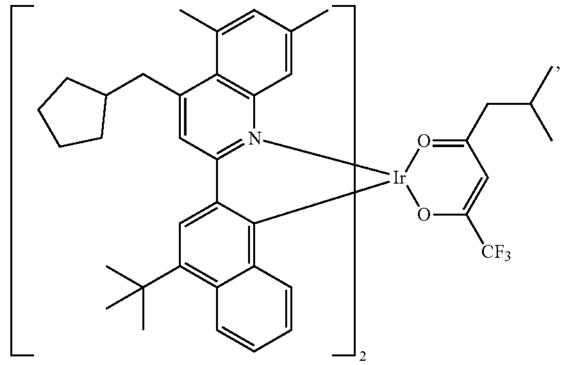
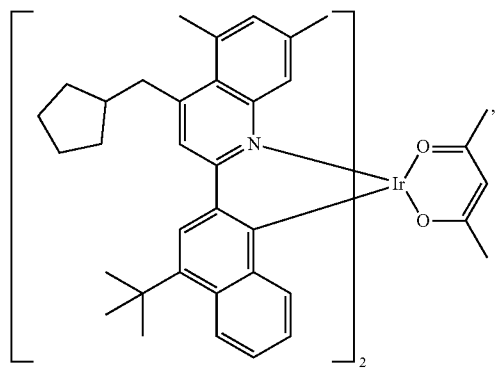
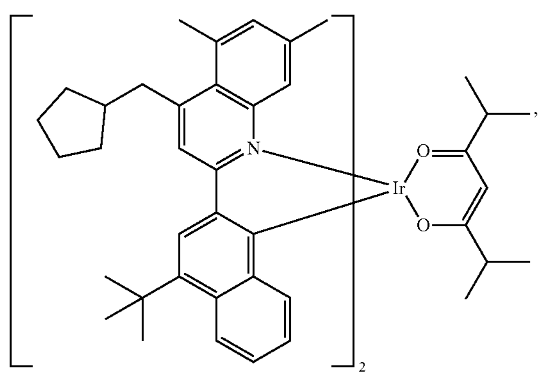
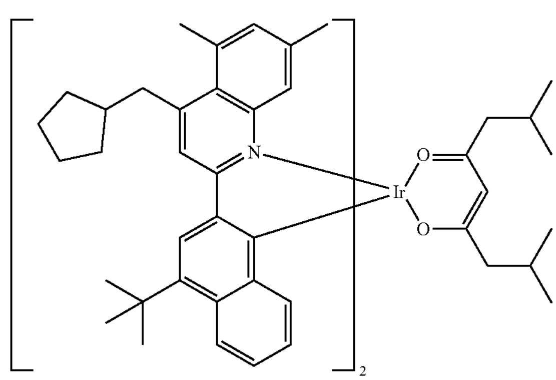

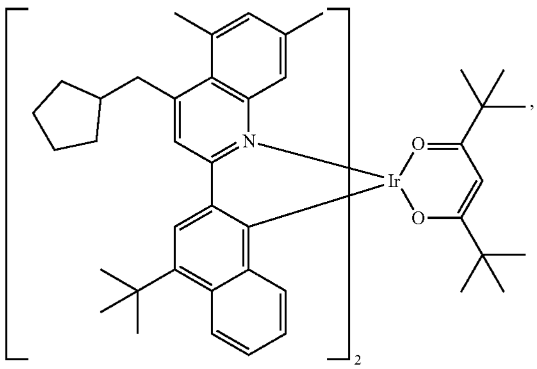
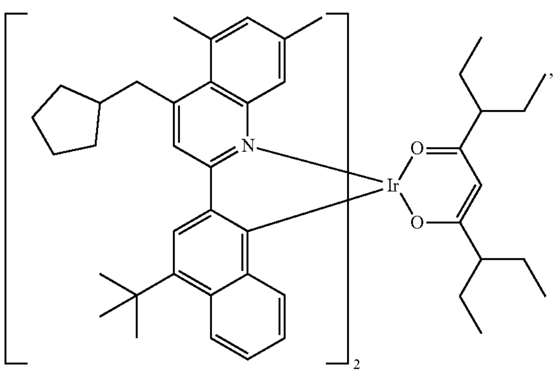
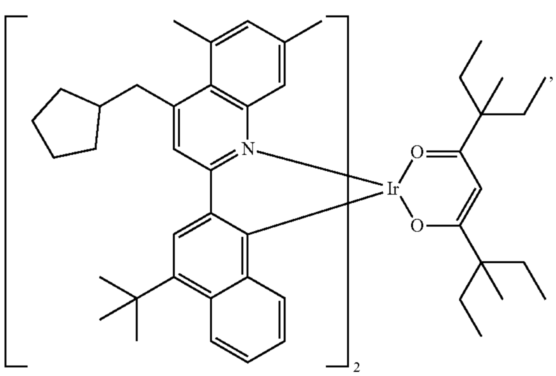
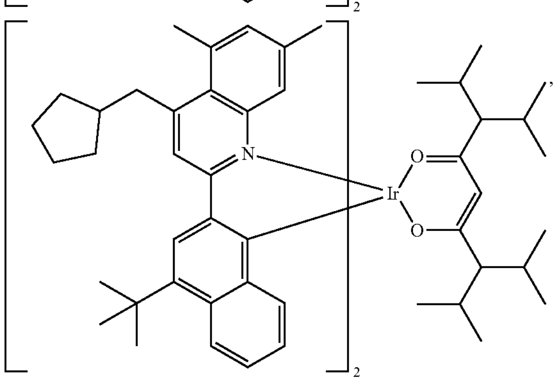
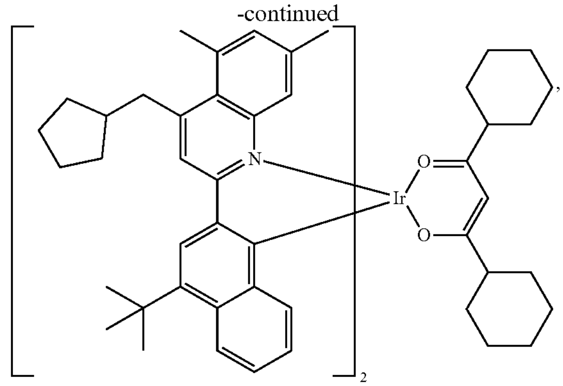
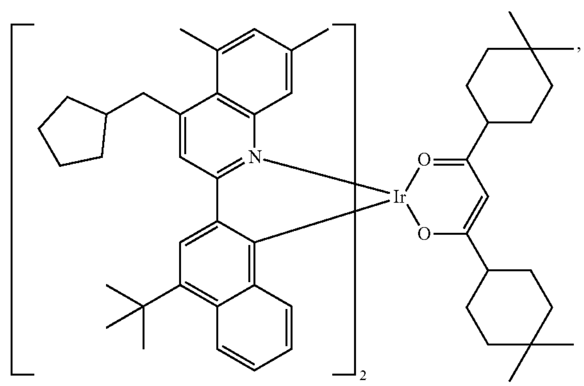
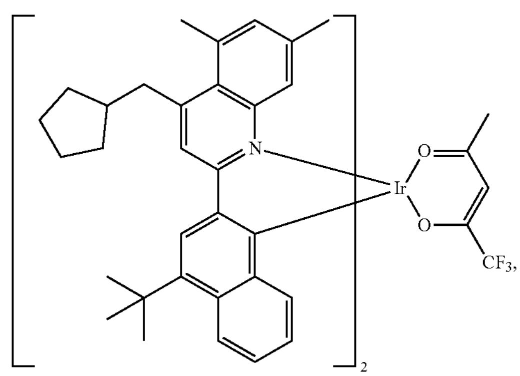
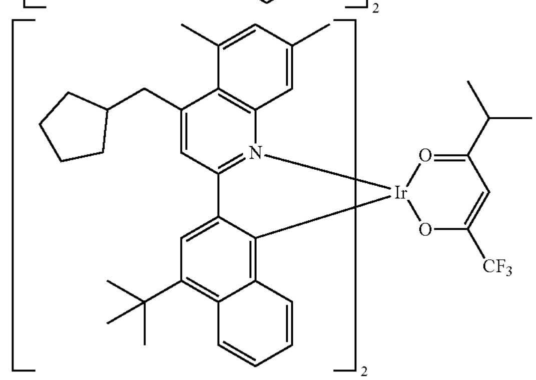

-continued
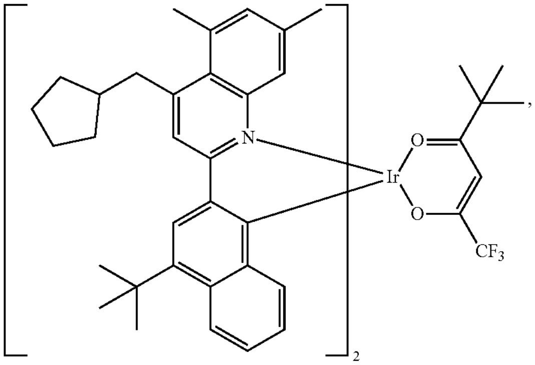
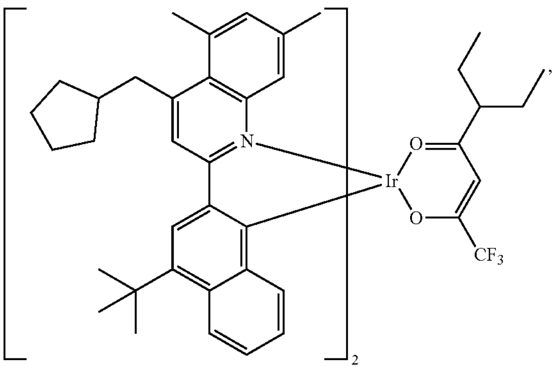
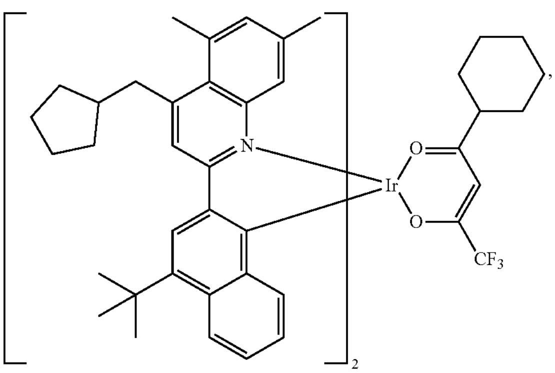
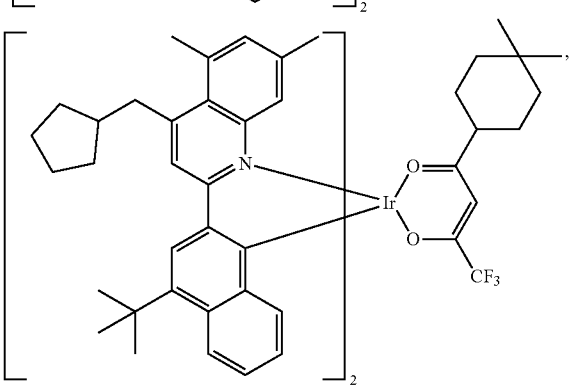
-continued
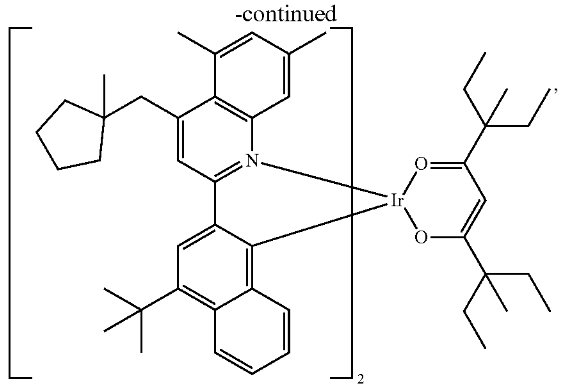
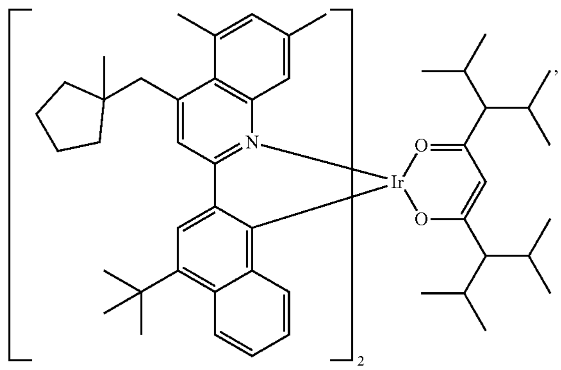
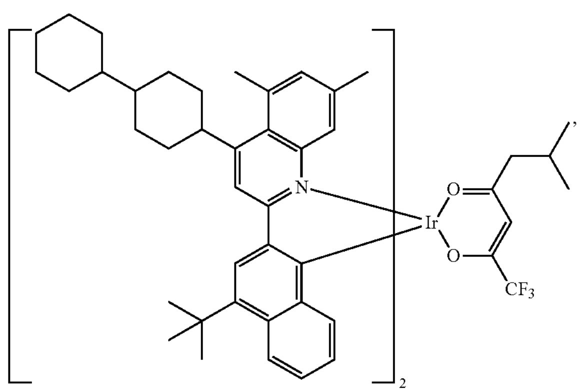
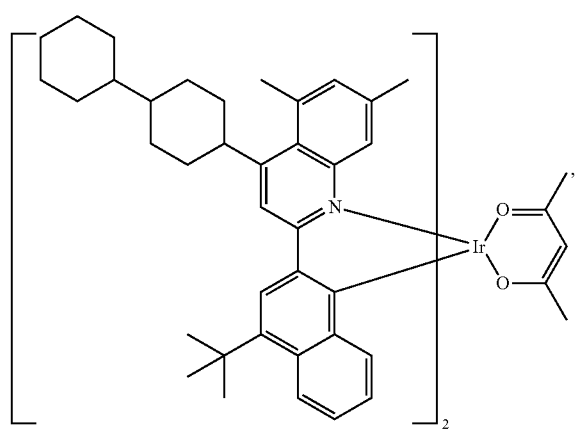

-continued
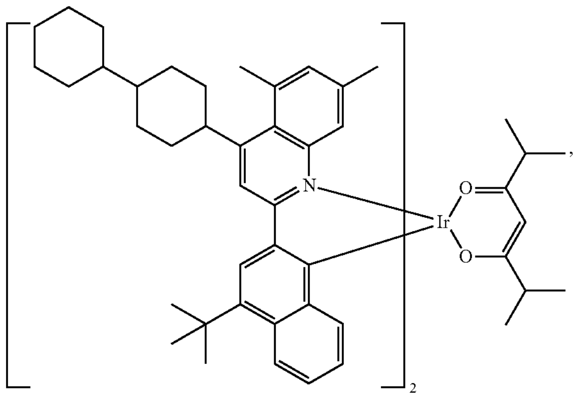
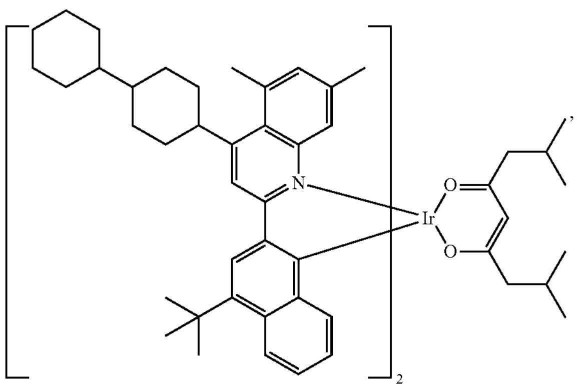
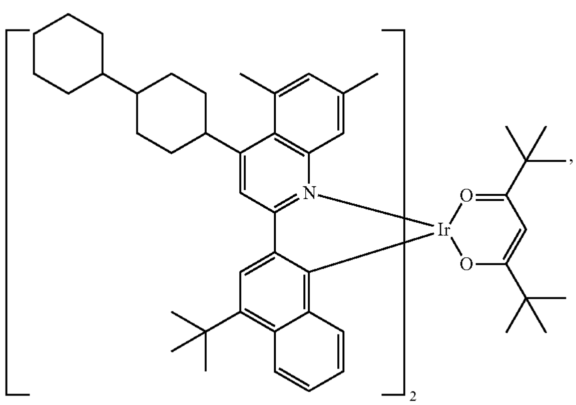
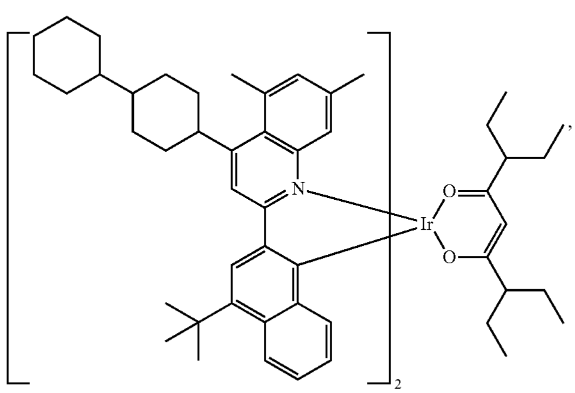
-continued
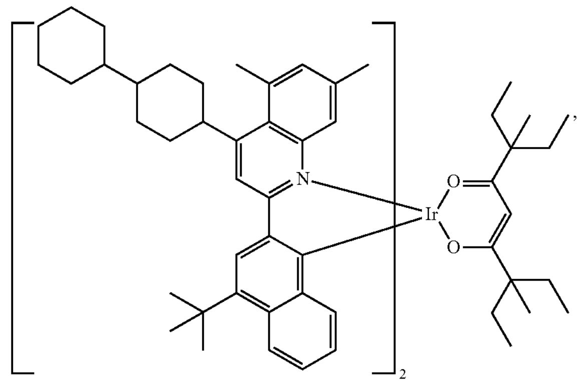
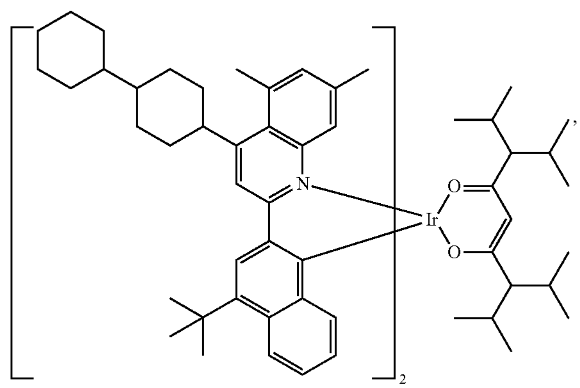
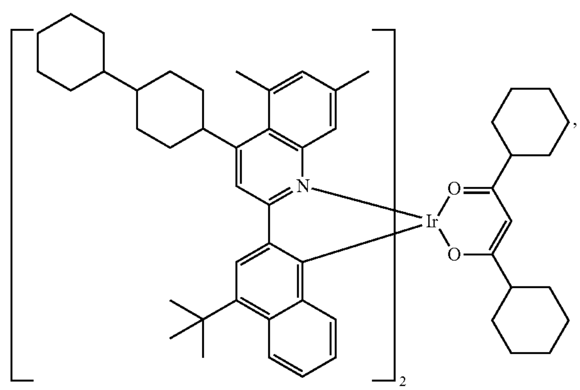
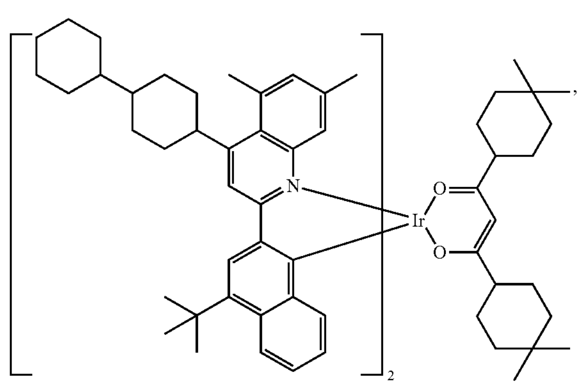

-continued
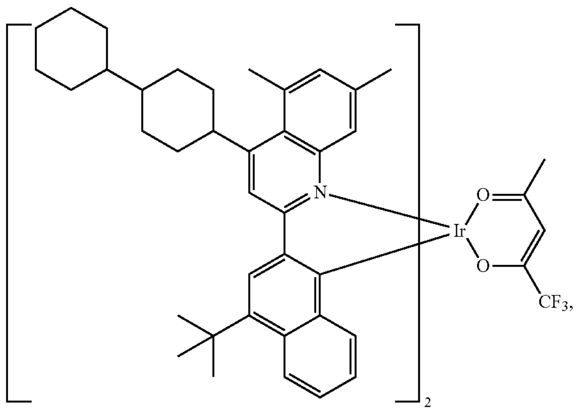
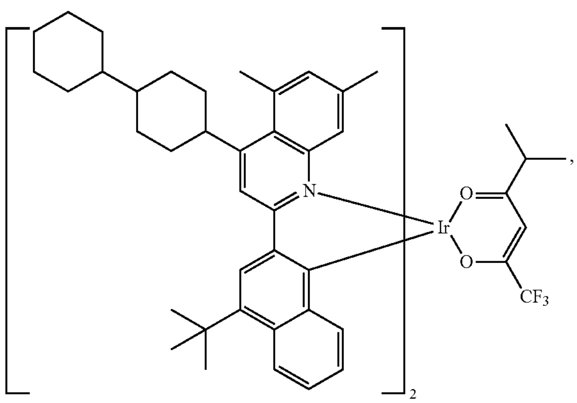
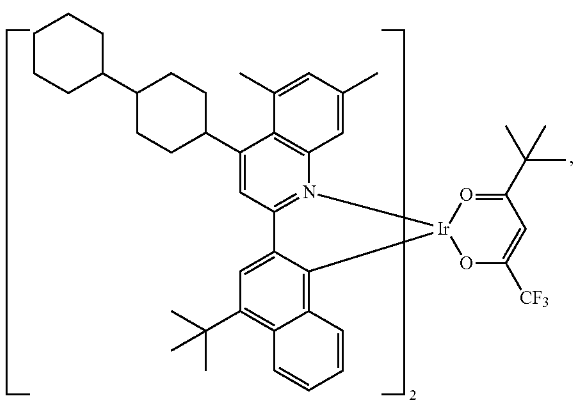
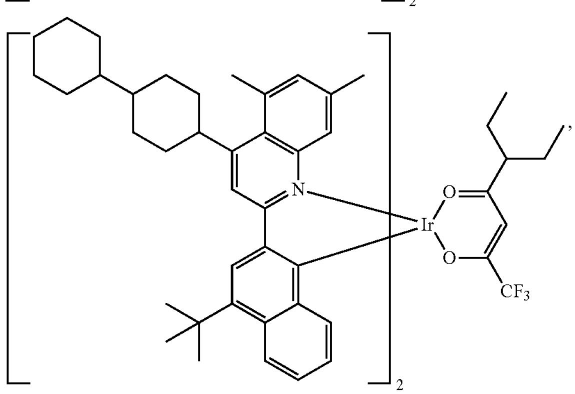
-continued
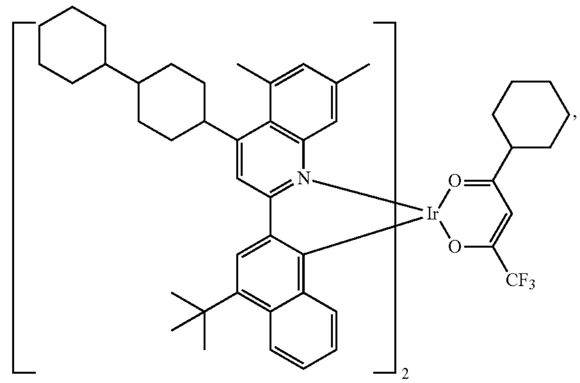
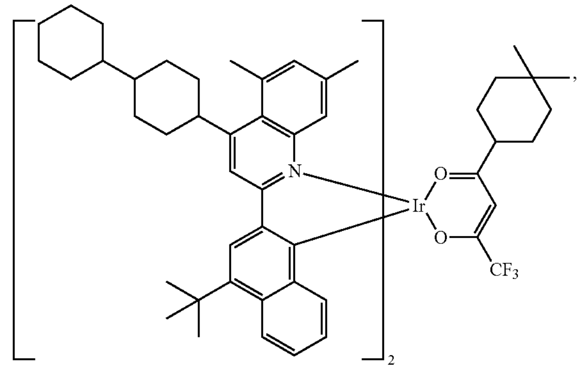
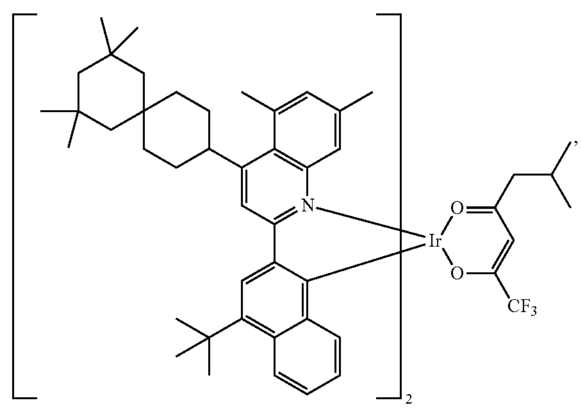
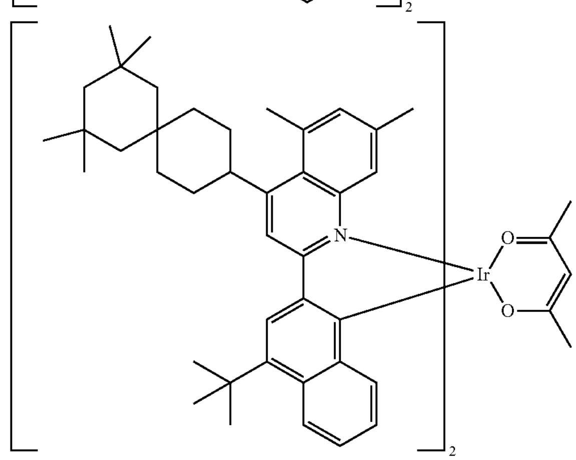

-continued
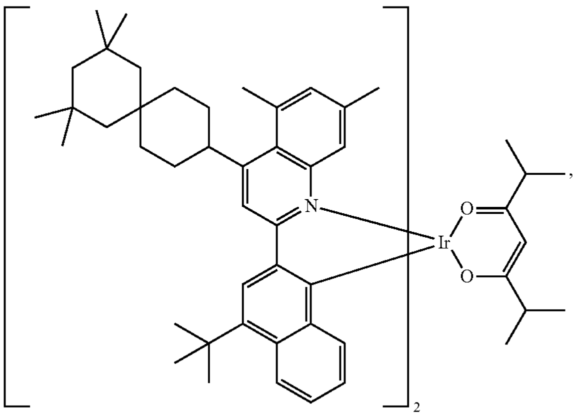
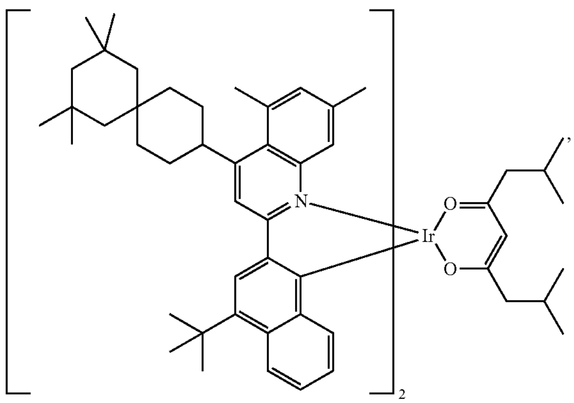
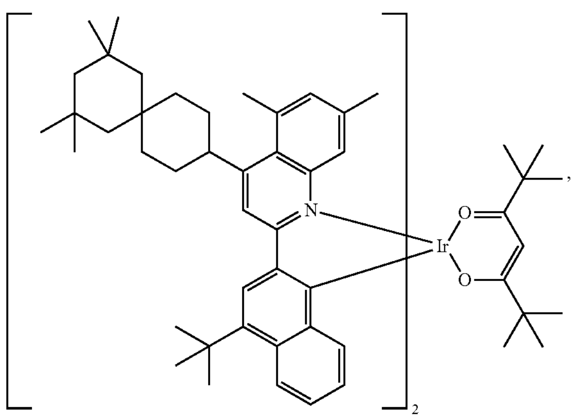
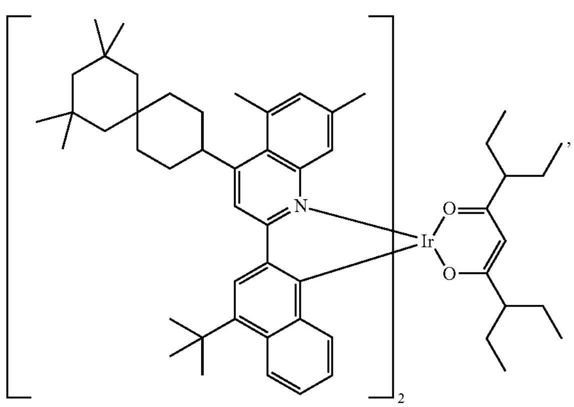
-continued
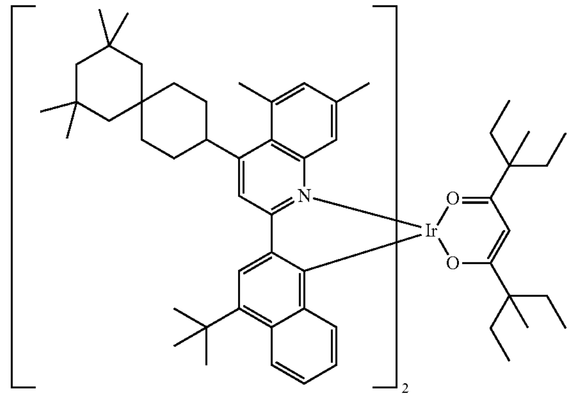
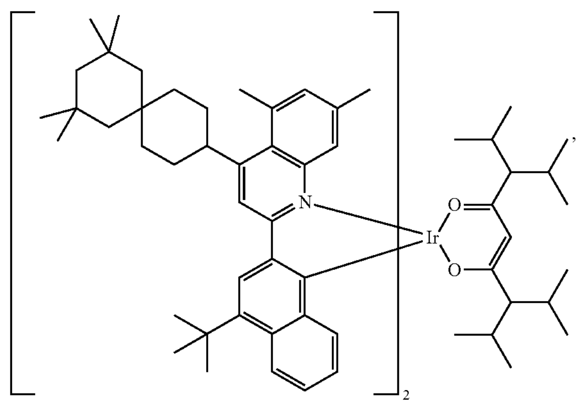
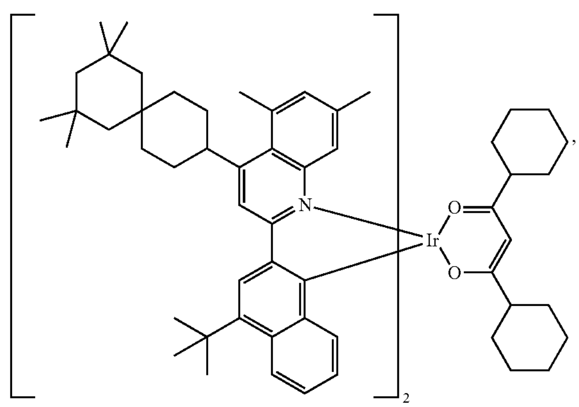
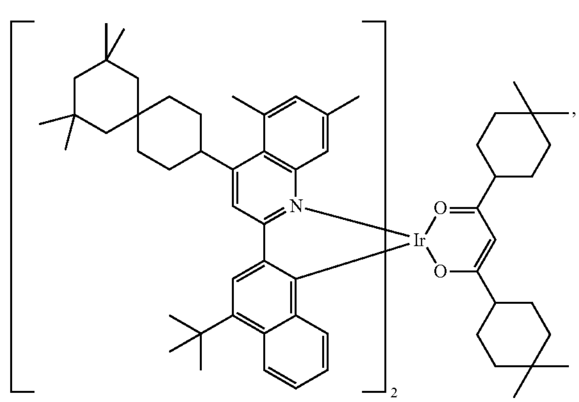

-continued
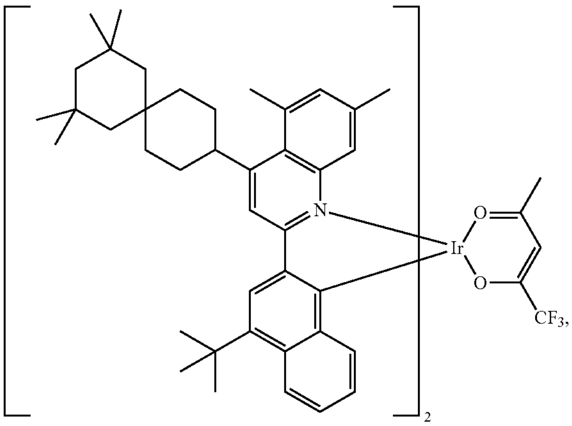
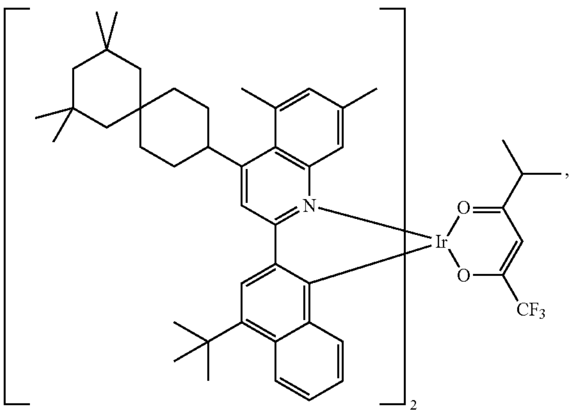
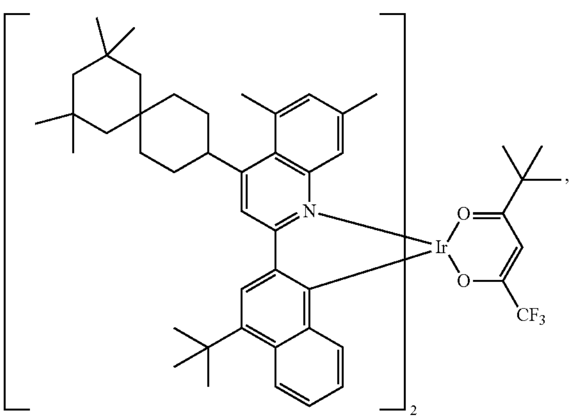
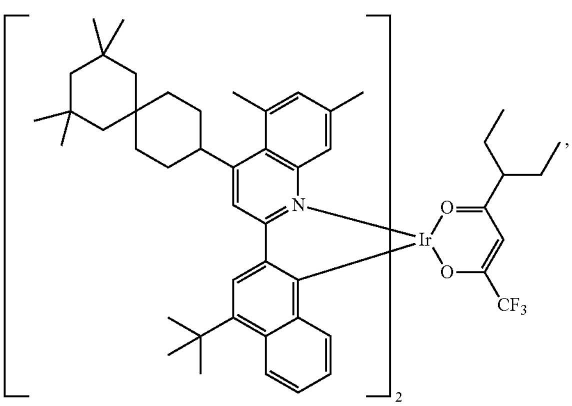
-continued
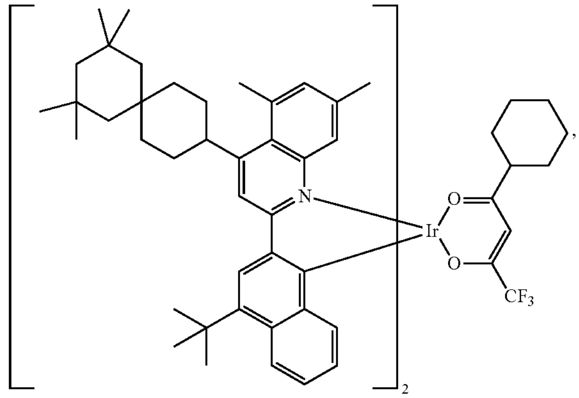
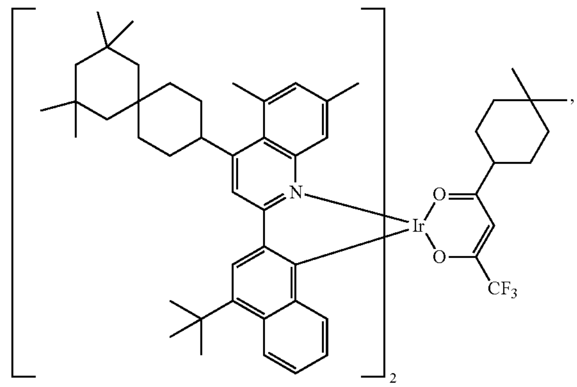
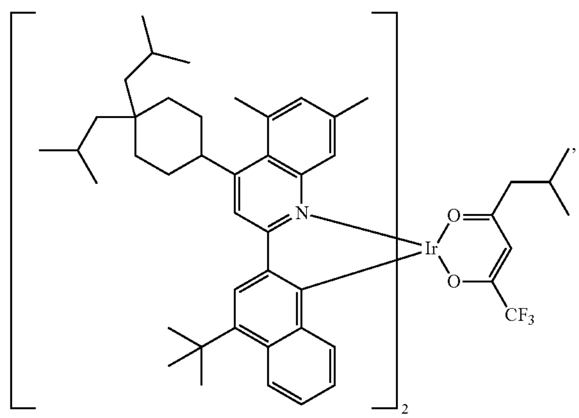
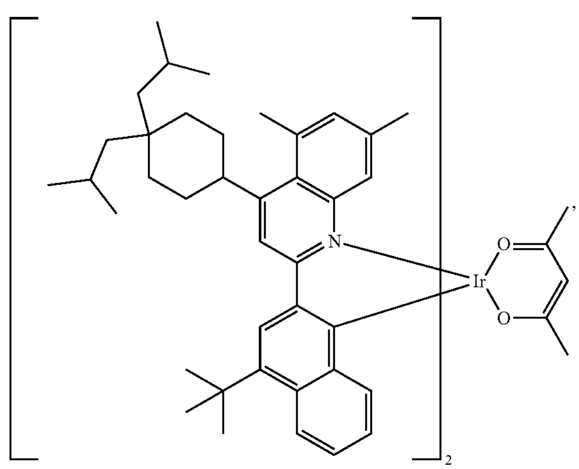

-continued
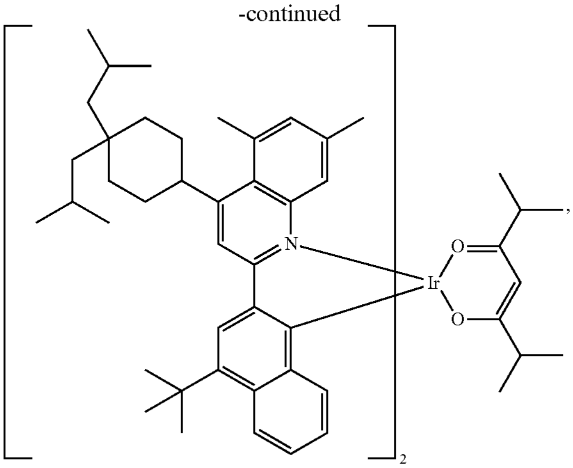
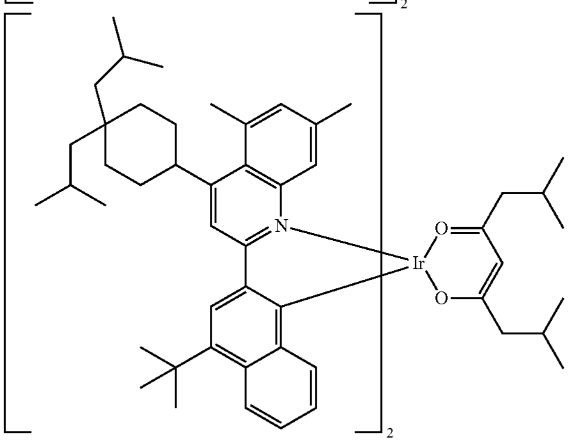
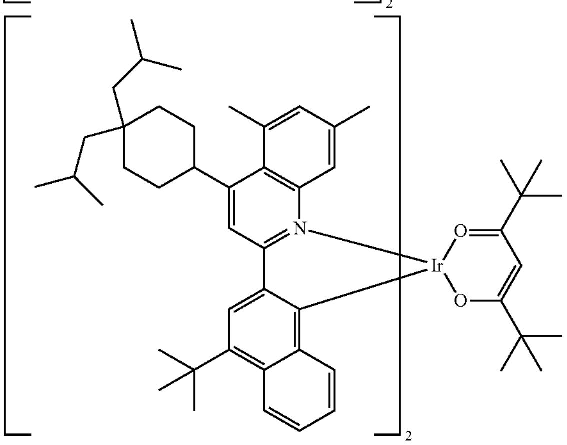
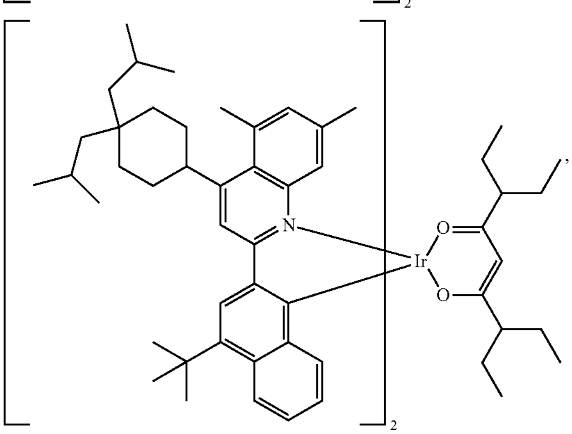
-continued
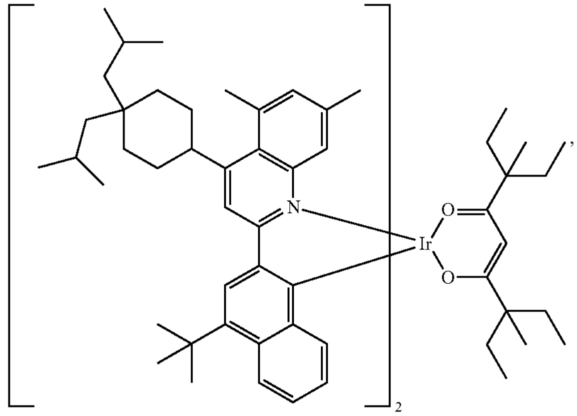
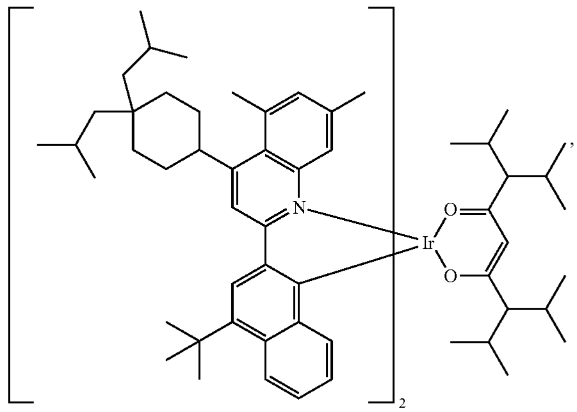
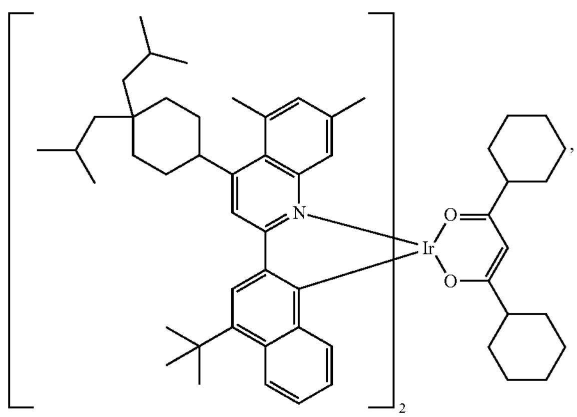
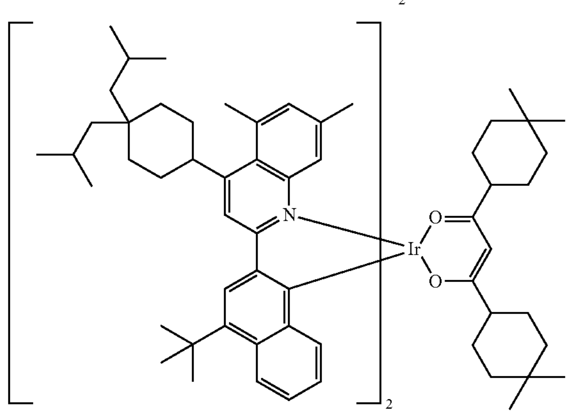

-continued

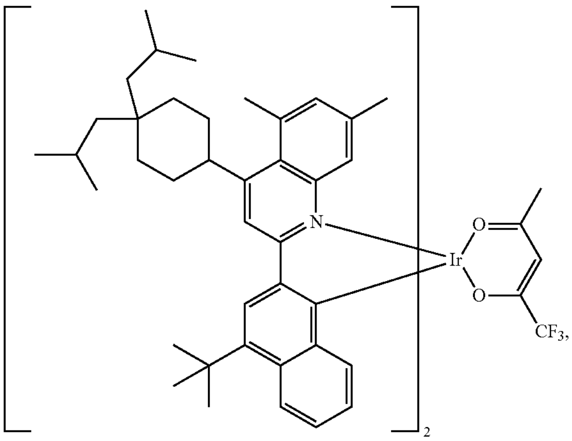

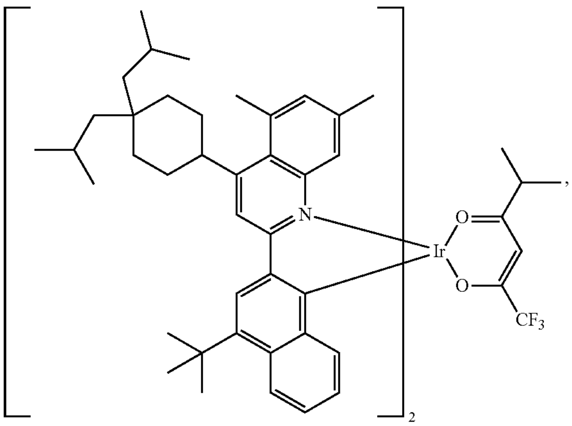

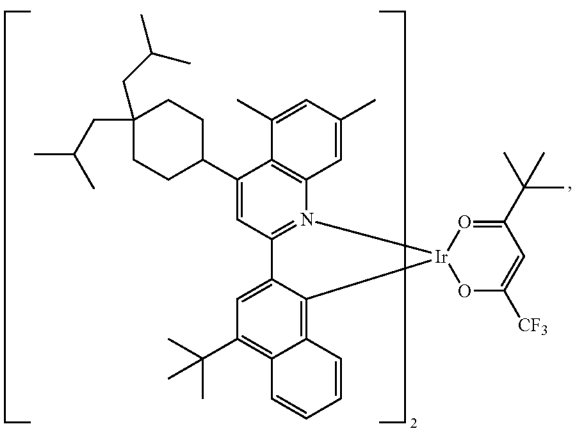

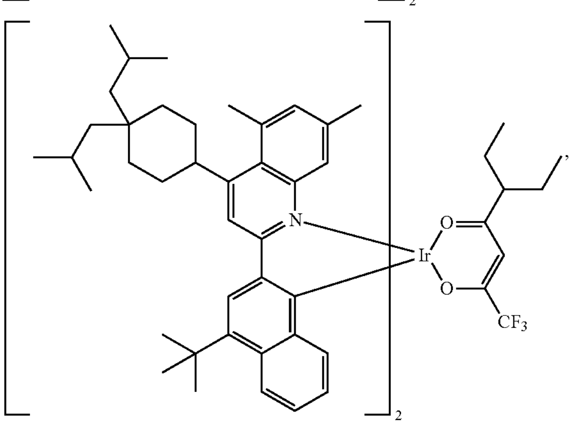

-continued

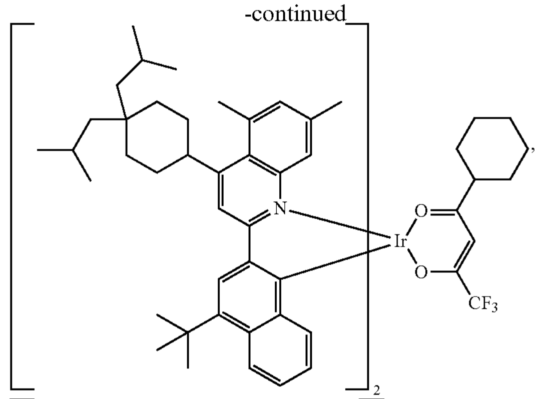

and

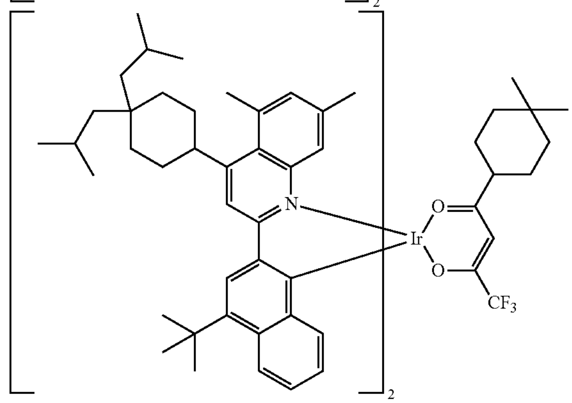

According to an aspect of the present disclosure, a compound comprising a ligand $L_A$ of the Formula IA

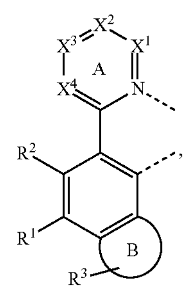

is disclosed, where Ring B represents a five- or six-membered aromatic ring; $R^3$ represents from none to the maximum possible number of substitutions;

$X^1$, $X^2$, $X^3$, and $X^4$ are each independently a CR or N; wherein:

(1) at least two adjacent ones of $X^1$, $X^2$, $X^3$, and $X^4$ are CR and fused into a five or six-membered aromatic ring, or (2) at least one of $X^1$, $X^2$, $X^3$, and $X^4$ is nitrogen, or (3) both (1) and (2) are true;

wherein (a) $R^1$ is $CR^{11}R^{12}R^{13}$ or join with $R^2$ to form into a ring; or (b) $R^2$ is not hydrogen; or (c) both (a) and (b) are true;

wherein each of R, $R^1$, $R^2$, $R^3$, $R^{11}$, $R^{12}$, and $R^{13}$ is independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

any two substituents among R, $R^1$, $R^2$, $R^3$, $R^{11}$, $R^{12}$, and $R^{13}$ are optionally joined to form into a ring;

$L_A$ is coordinated to a metal M;

$L_A$ is optionally linked with other ligands to comprise a tridentate, tetradentate, pentadentate, or hexadentate ligand; and M is optionally coordinated to other ligands.

In some embodiments of Formula IA, each of R, $R^1$, $R^2$, $R^3$, $R^{11}$, $R^{12}$, and $R^{13}$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof.

In some embodiments of Formula IA, each of R, $R^1$, $R^2$, $R^3$, $R^{11}$, $R^{12}$, and $R^{13}$ is independently selected from the group consisting of hydrogen, deuterium, fluorine, alkyl, cycloalkyl, and combinations thereof.

In some embodiments of Formula IA, M is selected from the group consisting of Ir, Rh, Re, Ru, Os, Pt, Au, and Cu. In some embodiments, M is Ir or Pt.

In some embodiments of Formula IA, at least one of $X^1$, $X^2$, $X^3$, and $X^4$ is nitrogen.

In some embodiments of Formula IA, $R^1$ is tert-butyl or substituted tert-butyl. In some embodiments of the compound, $R^1$ and $R^2$ form into an aromatic ring, which can be further substituted.

In some embodiments of Formula IA, Ring B is phenyl.

In some embodiments of Formula IA, the ligand $L_A$ is selected from the group consisting of:

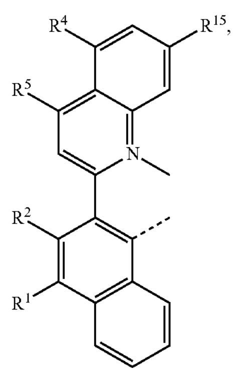

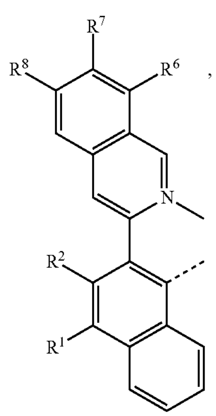

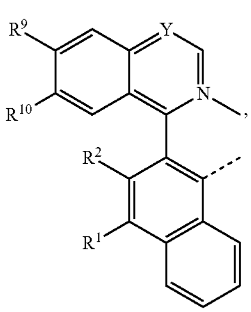

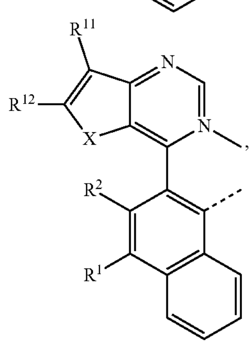

-continued

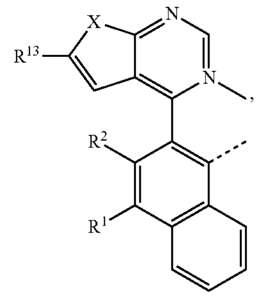

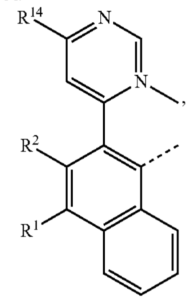

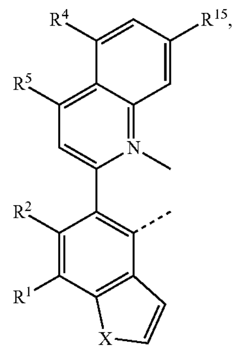

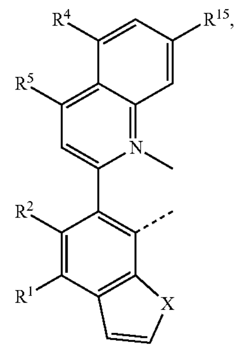

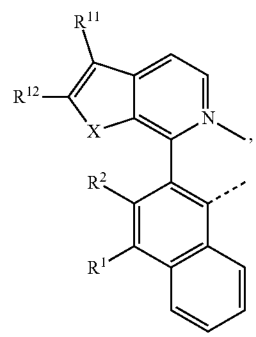

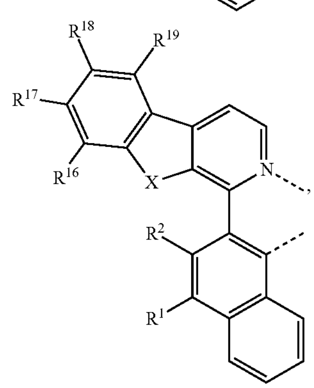

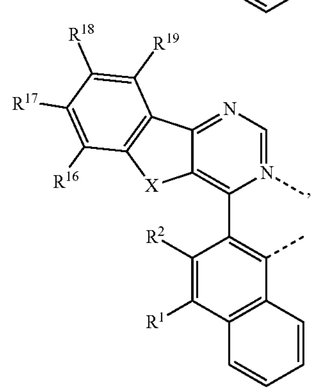

-continued

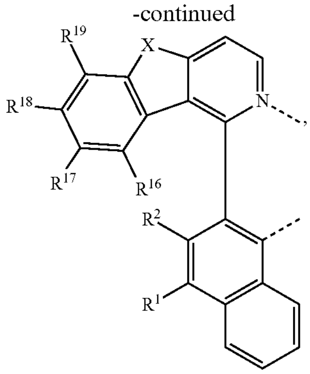

and

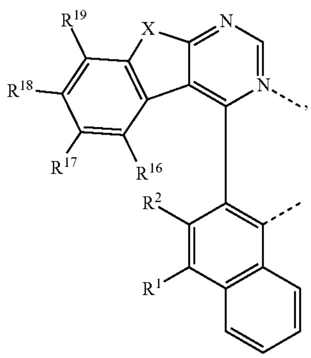

where each of $R^1$, $R^2$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, and $R^{19}$ is independently selected from the group consisting of hydrogen, deuterium, halogen, alkyl, cycloalkyl, heteroalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof; wherein any two substituents are optionally joined to form into a ring.

In some embodiments of Formula IA, each of $R^1$, $R^2$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, and $R^{19}$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, and combinations thereof; where any two substituents are optionally joined to form into a ring.

In some embodiments of Formula IA, each of $R^1$, $R^2$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, and $R^{19}$ is independently selected from the group consisting of hydrogen, deuterium, fluorine, alkyl, cycloalkyl, and combinations thereof; wherein any two substituents are optionally joined to form into a ring.

In some embodiments of Formula IA, the ligand $L_A$ is selected from the group ligands I-$L_{Ai}$ that are based on a structure of Formula I

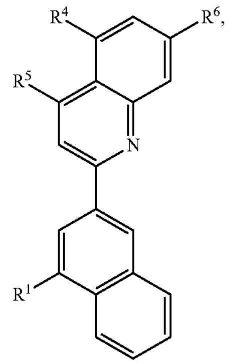

ligands II-$L_{Ai}$ that are based on a structure of Formula II

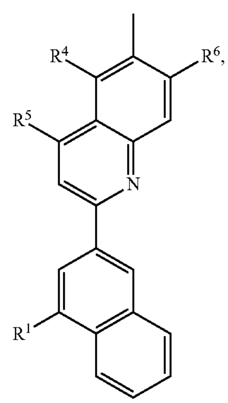

ligands III-$L_{Ai}$ that are based on a structure of Formula III

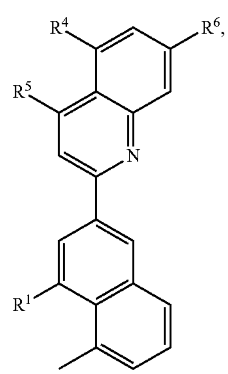

ligands IV-$L_{Ai}$ that are based on a structure of Formula IV

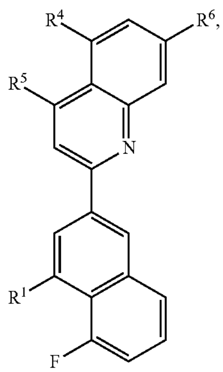

ligands V-$L_{Ai}$ that are based on a structure of Formula V

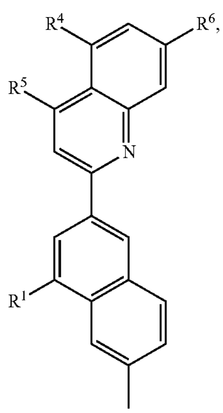

ligands VI-$L_{Ai}$ that are based on a structure of Formula VI

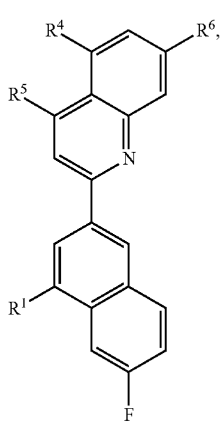

ligands VII-$L_{Ai}$ that are based on a structure of Formula VII

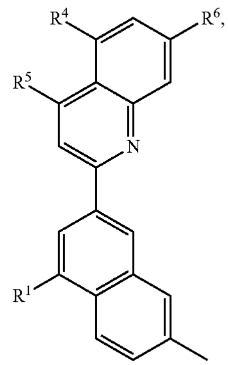

ligands VIII-$L_{Ai}$ that are based on a structure of Formula VI II

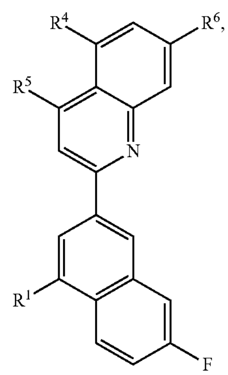

ligands XIX-$L_{Ai}$ that are based on a structure of Formula XIX

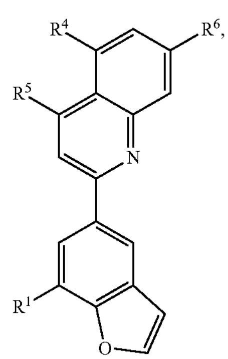

ligands X-$L_{Ai}$ that are based on a structure of Formula

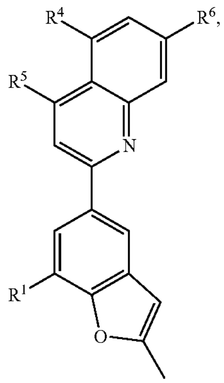

ligands XI-$L_{Ai}$ that are based on a structure of Formula XI

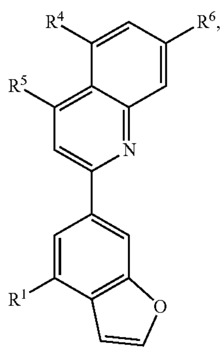

ligands XII-$L_{Ai}$ that are based on a structure of Formula XII

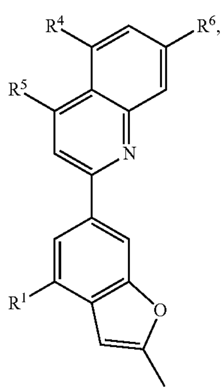

wherein i is an integer from 1 to 618 and for each i, $R^1$, $R^4$, $R^5$, and $R^6$ in the formula I, II, III, IV, V, VI, VII, VIII, XIX, X, XI, and XII are defined as follows:

| $L_{Ai}$ | $R^1$ | $R^4$ | $R^5$ | $R^6$ |
|---|---|---|---|---|
| $L_{A1}$ | $R_{B3}$ | H | H | H |
| $L_{A2}$ | $R_{B3}$ | $R_{B1}$ | H | H |
| $L_{A3}$ | $R_{B3}$ | $R_{B3}$ | H | H |
| $L_{A4}$ | $R_{B3}$ | $R_{B4}$ | H | H |
| $L_{A5}$ | $R_{B3}$ | $R_{B5}$ | H | H |
| $L_{A6}$ | $R_{B3}$ | $R_{B6}$ | H | H |

-continued

| $L_{Ai}$ | $R^1$ | $R^4$ | $R^5$ | $R^6$ |
|---|---|---|---|---|
| $L_{A7}$ | $R_{B3}$ | $R_{B7}$ | H | H |
| $L_{A8}$ | $R_{B3}$ | $R_{B24}$ | H | H |
| $L_{A9}$ | $R_{B3}$ | $R_{B25}$ | H | H |
| $L_{A10}$ | $R_{B3}$ | $R_{A3}$ | H | H |
| $L_{A11}$ | $R_{B3}$ | $R_{A34}$ | H | H |
| $L_{A12}$ | $R_{B3}$ | $R_{A44}$ | H | H |
| $L_{A13}$ | $R_{B3}$ | $R_{A52}$ | H | H |
| $L_{A14}$ | $R_{B3}$ | $R_{A53}$ | H | H |
| $L_{A15}$ | $R_{B3}$ | $R_{A54}$ | H | H |
| $L_{A16}$ | $R_{B3}$ | $R_{C3}$ | H | H |
| $L_{A17}$ | $R_{B3}$ | $R_{C4}$ | H | H |
| $L_{A18}$ | $R_{B3}$ | $R_{C8}$ | H | H |
| $L_{A19}$ | $R_{B3}$ | H | $R_{B1}$ | H |
| $L_{A20}$ | $R_{B3}$ | H | $R_{B3}$ | H |
| $L_{A21}$ | $R_{B3}$ | H | $R_{B4}$ | H |
| $L_{A22}$ | $R_{B3}$ | H | $R_{B5}$ | H |
| $L_{A23}$ | $R_{B3}$ | H | $R_{B6}$ | H |
| $L_{A24}$ | $R_{B3}$ | H | $R_{B7}$ | H |
| $L_{A25}$ | $R_{B3}$ | H | $R_{B24}$ | H |
| $L_{A26}$ | $R_{B3}$ | H | $R_{B25}$ | H |
| $L_{A27}$ | $R_{B3}$ | H | $R_{A3}$ | H |
| $L_{A28}$ | $R_{B3}$ | H | $R_{A34}$ | H |
| $L_{A29}$ | $R_{B3}$ | H | $R_{A44}$ | H |
| $L_{A30}$ | $R_{B3}$ | H | $R_{A52}$ | H |
| $L_{A31}$ | $R_{B3}$ | H | $R_{A53}$ | H |
| $L_{A32}$ | $R_{B3}$ | H | $R_{A54}$ | H |
| $L_{A33}$ | $R_{B3}$ | H | $R_{C3}$ | H |
| $L_{A34}$ | $R_{B3}$ | H | $R_{C4}$ | H |
| $L_{A35}$ | $R_{B3}$ | H | $R_{C8}$ | H |
| $L_{A36}$ | $R_{B3}$ | $R_{B1}$ | $R_{B1}$ | H |
| $L_{A37}$ | $R_{B3}$ | $R_{B3}$ | $R_{B1}$ | H |
| $L_{A38}$ | $R_{B3}$ | $R_{B4}$ | $R_{B1}$ | H |
| $L_{A39}$ | $R_{B3}$ | $R_{B5}$ | $R_{B1}$ | H |
| $L_{A40}$ | $R_{B3}$ | $R_{B6}$ | $R_{B1}$ | H |
| $L_{A41}$ | $R_{B3}$ | $R_{B7}$ | $R_{B1}$ | H |
| $L_{A42}$ | $R_{B3}$ | $R_{B24}$ | $R_{B1}$ | H |
| $L_{A43}$ | $R_{B3}$ | $R_{B25}$ | $R_{B1}$ | H |
| $L_{A44}$ | $R_{B3}$ | $R_{A3}$ | $R_{B1}$ | H |
| $L_{A45}$ | $R_{B3}$ | $R_{A34}$ | $R_{B1}$ | H |
| $L_{A46}$ | $R_{B3}$ | $R_{A44}$ | $R_{B1}$ | H |
| $L_{A47}$ | $R_{B3}$ | $R_{A52}$ | $R_{B1}$ | H |
| $L_{A48}$ | $R_{B3}$ | $R_{A53}$ | $R_{B1}$ | H |
| $L_{A49}$ | $R_{B3}$ | $R_{A54}$ | $R_{B1}$ | H |
| $L_{A50}$ | $R_{B3}$ | $R_{C3}$ | $R_{B1}$ | H |
| $L_{A51}$ | $R_{B3}$ | $R_{C4}$ | $R_{B1}$ | H |
| $L_{A52}$ | $R_{B3}$ | $R_{C8}$ | $R_{B1}$ | H |
| $L_{A53}$ | $R_{B3}$ | $R_{B1}$ | $R_{B1}$ | H |
| $L_{A54}$ | $R_{B3}$ | $R_{B1}$ | $R_{B3}$ | H |
| $L_{A55}$ | $R_{B3}$ | $R_{B1}$ | $R_{B4}$ | H |
| $L_{A56}$ | $R_{B3}$ | $R_{B1}$ | $R_{B5}$ | H |
| $L_{A57}$ | $R_{B3}$ | $R_{B1}$ | $R_{B6}$ | H |
| $L_{A58}$ | $R_{B3}$ | $R_{B1}$ | $R_{B7}$ | H |
| $L_{A59}$ | $R_{B3}$ | $R_{B1}$ | $R_{B24}$ | H |
| $L_{A60}$ | $R_{B3}$ | $R_{B1}$ | $R_{B25}$ | H |
| $L_{A61}$ | $R_{B3}$ | $R_{B1}$ | $R_{A3}$ | H |
| $L_{A62}$ | $R_{B3}$ | $R_{B1}$ | $R_{A34}$ | H |
| $L_{A63}$ | $R_{B3}$ | $R_{B1}$ | $R_{A44}$ | H |
| $L_{A64}$ | $R_{B3}$ | $R_{B1}$ | $R_{A52}$ | H |
| $L_{A65}$ | $R_{B3}$ | $R_{B1}$ | $R_{A53}$ | H |
| $L_{A66}$ | $R_{B3}$ | $R_{B1}$ | $R_{A54}$ | H |
| $L_{A67}$ | $R_{B3}$ | $R_{B1}$ | $R_{C3}$ | H |
| $L_{A68}$ | $R_{B3}$ | $R_{B1}$ | $R_{C4}$ | H |
| $L_{A69}$ | $R_{B3}$ | $R_{B1}$ | $R_{C8}$ | H |
| $L_{A70}$ | $R_{B3}$ | $R_{B1}$ | $R_{B1}$ | $R_{B1}$ |
| $L_{A71}$ | $R_{B3}$ | $R_{B1}$ | $R_{B3}$ | $R_{B1}$ |
| $L_{A72}$ | $R_{B3}$ | $R_{B1}$ | $R_{B4}$ | $R_{B1}$ |
| $L_{A73}$ | $R_{B3}$ | $R_{B1}$ | $R_{B5}$ | $R_{B1}$ |
| $L_{A74}$ | $R_{B3}$ | $R_{B1}$ | $R_{B6}$ | $R_{B1}$ |
| $L_{A75}$ | $R_{B3}$ | $R_{B1}$ | $R_{B7}$ | $R_{B1}$ |
| $L_{A76}$ | $R_{B3}$ | $R_{B1}$ | $R_{B24}$ | $R_{B1}$ |
| $L_{A77}$ | $R_{B3}$ | $R_{B1}$ | $R_{B25}$ | $R_{B1}$ |
| $L_{A78}$ | $R_{B3}$ | $R_{B1}$ | $R_{A3}$ | $R_{B1}$ |
| $L_{A79}$ | $R_{B3}$ | $R_{B1}$ | $R_{A34}$ | $R_{B1}$ |
| $L_{A80}$ | $R_{B3}$ | $R_{B1}$ | $R_{A44}$ | $R_{B1}$ |
| $L_{A81}$ | $R_{B3}$ | $R_{B1}$ | $R_{A52}$ | $R_{B1}$ |
| $L_{A82}$ | $R_{B3}$ | $R_{B1}$ | $R_{A53}$ | $R_{B1}$ |
| $L_{A83}$ | $R_{B3}$ | $R_{B1}$ | $R_{A54}$ | $R_{B1}$ |

-continued

| $L_{Ai}$ | $R^1$ | $R^4$ | $R^5$ | $R^6$ |
|---|---|---|---|---|
| $L_{A84}$ | $R_{B3}$ | $R_{B1}$ | $R_{C3}$ | $R_{B1}$ |
| $L_{A85}$ | $R_{B3}$ | $R_{B1}$ | $R_{C4}$ | $R_{B1}$ |
| $L_{A86}$ | $R_{B3}$ | $R_{B1}$ | $R_{C8}$ | $R_{B1}$ |
| $L_{A87}$ | $R_{B3}$ | $R_{B1}$ | $R_{B1}$ | $R_{B1}$ |
| $L_{A88}$ | $R_{B3}$ | $R_{B3}$ | $R_{B1}$ | $R_{B1}$ |
| $L_{A89}$ | $R_{B3}$ | $R_{B4}$ | $R_{B1}$ | $R_{B1}$ |
| $L_{A90}$ | $R_{B3}$ | $R_{B5}$ | $R_{B1}$ | $R_{B1}$ |
| $L_{A91}$ | $R_{B3}$ | $R_{B6}$ | $R_{B1}$ | $R_{B1}$ |
| $L_{A92}$ | $R_{B3}$ | $R_{B7}$ | $R_{B1}$ | $R_{B1}$ |
| $L_{A93}$ | $R_{B3}$ | $R_{B24}$ | $R_{B1}$ | $R_{B1}$ |
| $L_{A94}$ | $R_{B3}$ | $R_{B25}$ | $R_{B1}$ | $R_{B1}$ |
| $L_{A95}$ | $R_{B3}$ | $R_{A3}$ | $R_{B1}$ | $R_{B1}$ |
| $L_{A96}$ | $R_{B3}$ | $R_{A34}$ | $R_{B1}$ | $R_{B1}$ |
| $L_{A97}$ | $R_{B3}$ | $R_{A44}$ | $R_{B1}$ | $R_{B1}$ |
| $L_{A98}$ | $R_{B3}$ | $R_{A52}$ | $R_{B1}$ | $R_{B1}$ |
| $L_{A99}$ | $R_{B3}$ | $R_{A53}$ | $R_{B1}$ | $R_{B1}$ |
| $L_{A100}$ | $R_{B3}$ | $R_{A54}$ | $R_{B1}$ | $R_{B1}$ |
| $L_{A101}$ | $R_{B3}$ | $R_{C3}$ | $R_{B1}$ | $R_{B1}$ |
| $L_{A102}$ | $R_{B3}$ | $R_{C4}$ | $R_{B1}$ | $R_{B1}$ |
| $L_{A103}$ | $R_{B3}$ | $R_{C8}$ | $R_{B1}$ | $R_{B1}$ |
| $L_{A104}$ | $R_{B6}$ | H | H | H |
| $L_{A105}$ | $R_{B6}$ | $R_{B1}$ | H | H |
| $L_{A106}$ | $R_{B6}$ | $R_{B3}$ | H | H |
| $L_{A107}$ | $R_{B6}$ | $R_{B4}$ | H | H |
| $L_{A108}$ | $R_{B6}$ | $R_{B5}$ | H | H |
| $L_{A109}$ | $R_{B6}$ | $R_{B6}$ | H | H |
| $L_{A110}$ | $R_{B6}$ | $R_{B7}$ | H | H |
| $L_{A111}$ | $R_{B6}$ | $R_{B24}$ | H | H |
| $L_{A112}$ | $R_{B6}$ | $R_{B25}$ | H | H |
| $L_{A113}$ | $R_{B6}$ | $R_{A3}$ | H | H |
| $L_{A114}$ | $R_{B6}$ | $R_{A34}$ | H | H |
| $L_{A115}$ | $R_{B6}$ | $R_{A44}$ | H | H |
| $L_{A116}$ | $R_{B6}$ | $R_{A52}$ | H | H |
| $L_{A117}$ | $R_{B6}$ | $R_{A53}$ | H | H |
| $L_{A118}$ | $R_{B6}$ | $R_{A54}$ | H | H |
| $L_{A119}$ | $R_{B6}$ | $R_{C3}$ | H | H |
| $L_{A120}$ | $R_{B6}$ | $R_{C4}$ | H | H |
| $L_{A121}$ | $R_{B6}$ | $R_{C8}$ | H | H |
| $L_{A122}$ | $R_{B6}$ | H | $R_{B1}$ | H |
| $L_{A123}$ | $R_{B6}$ | H | $R_{B3}$ | H |
| $L_{A124}$ | $R_{B6}$ | H | $R_{B4}$ | H |
| $L_{A125}$ | $R_{B6}$ | H | $R_{B5}$ | H |
| $L_{A126}$ | $R_{B6}$ | H | $R_{B6}$ | H |
| $L_{A127}$ | $R_{B6}$ | H | $R_{B7}$ | H |
| $L_{A128}$ | $R_{B6}$ | H | $R_{B24}$ | H |
| $L_{A129}$ | $R_{B6}$ | H | $R_{B25}$ | H |
| $L_{A130}$ | $R_{B6}$ | H | $R_{A3}$ | H |
| $L_{A131}$ | $R_{B6}$ | H | $R_{A34}$ | H |
| $L_{A132}$ | $R_{B6}$ | H | $R_{A44}$ | H |
| $L_{A133}$ | $R_{B6}$ | H | $R_{A52}$ | H |
| $L_{A134}$ | $R_{B6}$ | H | $R_{A53}$ | H |
| $L_{A135}$ | $R_{B6}$ | H | $R_{A54}$ | H |
| $L_{A136}$ | $R_{B6}$ | H | $R_{C3}$ | H |
| $L_{A137}$ | $R_{B6}$ | H | $R_{C4}$ | H |
| $L_{A138}$ | $R_{B6}$ | H | $R_{C8}$ | H |
| $L_{A139}$ | $R_{B6}$ | $R_{B1}$ | $R_{B1}$ | H |
| $L_{A140}$ | $R_{B6}$ | $R_{B3}$ | $R_{B1}$ | H |
| $L_{A141}$ | $R_{B6}$ | $R_{B4}$ | $R_{B1}$ | H |
| $L_{A142}$ | $R_{B6}$ | $R_{B5}$ | $R_{B1}$ | H |
| $L_{A143}$ | $R_{B6}$ | $R_{B6}$ | $R_{B1}$ | H |
| $L_{A144}$ | $R_{B6}$ | $R_{B7}$ | $R_{B1}$ | H |
| $L_{A145}$ | $R_{B6}$ | $R_{B24}$ | $R_{B1}$ | H |
| $L_{A146}$ | $R_{B6}$ | $R_{B25}$ | $R_{B1}$ | H |
| $L_{A147}$ | $R_{B6}$ | $R_{A3}$ | $R_{B1}$ | H |
| $L_{A148}$ | $R_{B6}$ | $R_{A34}$ | $R_{B1}$ | H |
| $L_{A149}$ | $R_{B6}$ | $R_{A44}$ | $R_{B1}$ | H |
| $L_{A150}$ | $R_{B6}$ | $R_{A52}$ | $R_{B1}$ | H |
| $L_{A151}$ | $R_{B6}$ | $R_{A53}$ | $R_{B1}$ | H |
| $L_{A152}$ | $R_{B6}$ | $R_{A54}$ | $R_{B1}$ | H |
| $L_{A153}$ | $R_{B6}$ | $R_{C3}$ | $R_{B1}$ | H |
| $L_{A154}$ | $R_{B6}$ | $R_{C4}$ | $R_{B1}$ | H |
| $L_{A155}$ | $R_{B6}$ | $R_{C8}$ | $R_{B1}$ | H |
| $L_{A156}$ | $R_{B6}$ | $R_{B1}$ | $R_{B1}$ | H |
| $L_{A157}$ | $R_{B6}$ | $R_{B1}$ | $R_{B3}$ | H |
| $L_{A158}$ | $R_{B6}$ | $R_{B1}$ | $R_{B4}$ | H |
| $L_{A159}$ | $R_{B6}$ | $R_{B1}$ | $R_{B5}$ | H |
| $L_{A160}$ | $R_{B6}$ | $R_{B1}$ | $R_{B6}$ | H |
| $L_{A161}$ | $R_{B6}$ | $R_{B1}$ | $R_{B7}$ | H |
| $L_{A162}$ | $R_{B6}$ | $R_{B1}$ | $R_{B24}$ | H |
| $L_{A163}$ | $R_{B6}$ | $R_{B1}$ | $R_{B25}$ | H |
| $L_{A164}$ | $R_{B6}$ | $R_{B1}$ | $R_{A3}$ | H |
| $L_{A165}$ | $R_{B6}$ | $R_{B1}$ | $R_{A34}$ | H |
| $L_{A166}$ | $R_{B6}$ | $R_{B1}$ | $R_{A44}$ | H |
| $L_{A167}$ | $R_{B6}$ | $R_{B1}$ | $R_{A52}$ | H |
| $L_{A168}$ | $R_{B6}$ | $R_{B1}$ | $R_{A53}$ | H |
| $L_{A169}$ | $R_{B6}$ | $R_{B1}$ | $R_{A54}$ | H |
| $L_{A170}$ | $R_{B6}$ | $R_{B1}$ | $R_{C3}$ | H |
| $L_{A171}$ | $R_{B6}$ | $R_{B1}$ | $R_{C4}$ | H |
| $L_{A172}$ | $R_{B6}$ | $R_{B1}$ | $R_{C8}$ | H |
| $L_{A173}$ | $R_{B6}$ | $R_{B1}$ | $R_{B1}$ | $R_{B1}$ |
| $L_{A174}$ | $R_{B6}$ | $R_{B1}$ | $R_{B3}$ | $R_{B1}$ |
| $L_{A175}$ | $R_{B6}$ | $R_{B1}$ | $R_{B4}$ | $R_{B1}$ |
| $L_{A176}$ | $R_{B6}$ | $R_{B1}$ | $R_{B5}$ | $R_{B1}$ |
| $L_{A177}$ | $R_{B6}$ | $R_{B1}$ | $R_{B6}$ | $R_{B1}$ |
| $L_{A178}$ | $R_{B6}$ | $R_{B1}$ | $R_{B7}$ | $R_{B1}$ |
| $L_{A179}$ | $R_{B6}$ | $R_{B1}$ | $R_{B24}$ | $R_{B1}$ |
| $L_{A180}$ | $R_{B6}$ | $R_{B1}$ | $R_{B25}$ | $R_{B1}$ |
| $L_{A181}$ | $R_{B6}$ | $R_{B1}$ | $R_{A3}$ | $R_{B1}$ |
| $L_{A182}$ | $R_{B6}$ | $R_{B1}$ | $R_{A34}$ | $R_{B1}$ |
| $L_{A183}$ | $R_{B6}$ | $R_{B1}$ | $R_{A44}$ | $R_{B1}$ |
| $L_{A184}$ | $R_{B6}$ | $R_{B1}$ | $R_{A52}$ | $R_{B1}$ |
| $L_{A185}$ | $R_{B6}$ | $R_{B1}$ | $R_{A53}$ | $R_{B1}$ |
| $L_{A186}$ | $R_{B6}$ | $R_{B1}$ | $R_{A54}$ | $R_{B1}$ |
| $L_{A187}$ | $R_{B6}$ | $R_{B1}$ | $R_{C3}$ | $R_{B1}$ |
| $L_{A188}$ | $R_{B6}$ | $R_{B1}$ | $R_{C4}$ | $R_{B1}$ |
| $L_{A189}$ | $R_{B6}$ | $R_{B1}$ | $R_{C8}$ | $R_{B1}$ |
| $L_{A190}$ | $R_{B6}$ | $R_{B1}$ | $R_{B1}$ | $R_{B1}$ |
| $L_{A191}$ | $R_{B6}$ | $R_{B3}$ | $R_{B1}$ | $R_{B1}$ |
| $L_{A192}$ | $R_{B6}$ | $R_{B4}$ | $R_{B1}$ | $R_{B1}$ |
| $L_{A193}$ | $R_{B6}$ | $R_{B5}$ | $R_{B1}$ | $R_{B1}$ |
| $L_{A194}$ | $R_{B6}$ | $R_{B6}$ | $R_{B1}$ | $R_{B1}$ |
| $L_{A195}$ | $R_{B6}$ | $R_{B7}$ | $R_{B1}$ | $R_{B1}$ |
| $L_{A196}$ | $R_{B6}$ | $R_{B24}$ | $R_{B1}$ | $R_{B1}$ |
| $L_{A197}$ | $R_{B6}$ | $R_{B25}$ | $R_{B1}$ | $R_{B1}$ |
| $L_{A198}$ | $R_{B6}$ | $R_{A3}$ | $R_{B1}$ | $R_{B1}$ |
| $L_{A199}$ | $R_{B6}$ | $R_{A34}$ | $R_{B1}$ | $R_{B1}$ |
| $L_{A200}$ | $R_{B6}$ | $R_{A44}$ | $R_{B1}$ | $R_{B1}$ |
| $L_{A201}$ | $R_{B6}$ | $R_{A52}$ | $R_{B1}$ | $R_{B1}$ |
| $L_{A202}$ | $R_{B6}$ | $R_{A53}$ | $R_{B1}$ | $R_{B1}$ |
| $L_{A203}$ | $R_{B6}$ | $R_{A54}$ | $R_{B1}$ | $R_{B1}$ |
| $L_{A204}$ | $R_{B6}$ | $R_{C3}$ | $R_{B1}$ | $R_{B1}$ |
| $L_{A205}$ | $R_{B6}$ | $R_{C4}$ | $R_{B1}$ | $R_{B1}$ |
| $L_{A206}$ | $R_{B6}$ | $R_{C8}$ | $R_{B1}$ | $R_{B1}$ |
| $L_{A207}$ | $R_{B7}$ | H | H | H |
| $L_{A208}$ | $R_{B7}$ | $R_{B1}$ | H | H |
| $L_{A209}$ | $R_{B7}$ | $R_{B3}$ | H | H |
| $L_{A210}$ | $R_{B7}$ | $R_{B4}$ | H | H |
| $L_{A211}$ | $R_{B7}$ | $R_{B5}$ | H | H |
| $L_{A212}$ | $R_{B7}$ | $R_{B6}$ | H | H |
| $L_{A213}$ | $R_{B7}$ | $R_{B7}$ | H | H |
| $L_{A214}$ | $R_{B7}$ | $R_{B24}$ | H | H |
| $L_{A215}$ | $R_{B7}$ | $R_{B25}$ | H | H |
| $L_{A216}$ | $R_{B7}$ | $R_{A3}$ | H | H |
| $L_{A217}$ | $R_{B7}$ | $R_{A34}$ | H | H |
| $L_{A218}$ | $R_{B7}$ | $R_{A44}$ | H | H |
| $L_{A219}$ | $R_{B7}$ | $R_{A52}$ | H | H |
| $L_{A220}$ | $R_{B7}$ | $R_{A53}$ | H | H |
| $L_{A221}$ | $R_{B7}$ | $R_{A54}$ | H | H |
| $L_{A222}$ | $R_{B7}$ | $R_{C3}$ | H | H |
| $L_{A223}$ | $R_{B7}$ | $R_{C4}$ | H | H |
| $L_{A224}$ | $R_{B7}$ | $R_{C8}$ | H | H |
| $L_{A225}$ | $R_{B7}$ | H | $R_{B1}$ | H |
| $L_{A226}$ | $R_{B7}$ | H | $R_{B3}$ | H |
| $L_{A227}$ | $R_{B7}$ | H | $R_{B4}$ | H |
| $L_{A228}$ | $R_{B7}$ | H | $R_{B5}$ | H |
| $L_{A229}$ | $R_{B7}$ | H | $R_{B6}$ | H |
| $L_{A230}$ | $R_{B7}$ | H | $R_{B7}$ | H |
| $L_{A231}$ | $R_{B7}$ | H | $R_{B24}$ | H |
| $L_{A232}$ | $R_{B7}$ | H | $R_{B25}$ | H |
| $L_{A233}$ | $R_{B7}$ | H | $R_{A3}$ | H |
| $L_{A234}$ | $R_{B7}$ | H | $R_{A34}$ | H |
| $L_{A235}$ | $R_{B7}$ | H | $R_{A44}$ | H |
| $L_{A236}$ | $R_{B7}$ | H | $R_{A52}$ | H |
| $L_{A237}$ | $R_{B7}$ | H | $R_{A53}$ | H |

-continued

| $L_{Ai}$ | $R^1$ | $R^4$ | $R^5$ | $R^6$ |
|---|---|---|---|---|
| $L_{A238}$ | $R_{B7}$ | H | $R_{A454}$ | H |
| $L_{A239}$ | $R_{B7}$ | H | $R_{C3}$ | H |
| $L_{A240}$ | $R_{B7}$ | H | $R_{C4}$ | H |
| $L_{A241}$ | $R_{B7}$ | H | $R_{C8}$ | H |
| $L_{A242}$ | $R_{B7}$ | $R_{B1}$ | $R_{B1}$ | H |
| $L_{A243}$ | $R_{B7}$ | $R_{B3}$ | $R_{B1}$ | H |
| $L_{A244}$ | $R_{B7}$ | $R_{B4}$ | $R_{B1}$ | H |
| $L_{A245}$ | $R_{B7}$ | $R_{B5}$ | $R_{B1}$ | H |
| $L_{A246}$ | $R_{B7}$ | $R_{B6}$ | $R_{B1}$ | H |
| $L_{A247}$ | $R_{B7}$ | $R_{B7}$ | $R_{B1}$ | H |
| $L_{A248}$ | $R_{B7}$ | $R_{B24}$ | $R_{B1}$ | H |
| $L_{A249}$ | $R_{B7}$ | $R_{B25}$ | $R_{B1}$ | H |
| $L_{A250}$ | $R_{B7}$ | $R_{A3}$ | $R_{B1}$ | H |
| $L_{A251}$ | $R_{B7}$ | $R_{A434}$ | $R_{B1}$ | H |
| $L_{A252}$ | $R_{B7}$ | $R_{A444}$ | $R_{B1}$ | H |
| $L_{A253}$ | $R_{B7}$ | $R_{A452}$ | $R_{B1}$ | H |
| $L_{A254}$ | $R_{B7}$ | $R_{A453}$ | $R_{B1}$ | H |
| $L_{A255}$ | $R_{B7}$ | $R_{A454}$ | $R_{B1}$ | H |
| $L_{A256}$ | $R_{B7}$ | $R_{C3}$ | $R_{B1}$ | H |
| $L_{A257}$ | $R_{B7}$ | $R_{C4}$ | $R_{B1}$ | H |
| $L_{A258}$ | $R_{B7}$ | $R_{C8}$ | $R_{B1}$ | H |
| $L_{A259}$ | $R_{B7}$ | $R_{B1}$ | $R_{B1}$ | H |
| $L_{A260}$ | $R_{B7}$ | $R_{B1}$ | $R_{B3}$ | H |
| $L_{A261}$ | $R_{B7}$ | $R_{B1}$ | $R_{B4}$ | H |
| $L_{A262}$ | $R_{B7}$ | $R_{B1}$ | $R_{B5}$ | H |
| $L_{A263}$ | $R_{B7}$ | $R_{B1}$ | $R_{B6}$ | H |
| $L_{A264}$ | $R_{B7}$ | $R_{B1}$ | $R_{B7}$ | H |
| $L_{A265}$ | $R_{B7}$ | $R_{B1}$ | $R_{B24}$ | H |
| $L_{A266}$ | $R_{B7}$ | $R_{B1}$ | $R_{B25}$ | H |
| $L_{A267}$ | $R_{B7}$ | $R_{B1}$ | $R_{A3}$ | H |
| $L_{A268}$ | $R_{B7}$ | $R_{B1}$ | $R_{A434}$ | H |
| $L_{A269}$ | $R_{B7}$ | $R_{B1}$ | $R_{A444}$ | H |
| $L_{A270}$ | $R_{B7}$ | $R_{B1}$ | $R_{A452}$ | H |
| $L_{A271}$ | $R_{B7}$ | $R_{B1}$ | $R_{A453}$ | H |
| $L_{A272}$ | $R_{B7}$ | $R_{B1}$ | $R_{A454}$ | H |
| $L_{A273}$ | $R_{B7}$ | $R_{B1}$ | $R_{C3}$ | H |
| $L_{A274}$ | $R_{B7}$ | $R_{B1}$ | $R_{C4}$ | H |
| $L_{A275}$ | $R_{B7}$ | $R_{B1}$ | $R_{C8}$ | H |
| $L_{A276}$ | $R_{B7}$ | $R_{B1}$ | $R_{B1}$ | $R_{B1}$ |
| $L_{A277}$ | $R_{B7}$ | $R_{B1}$ | $R_{B3}$ | $R_{B1}$ |
| $L_{A278}$ | $R_{B7}$ | $R_{B1}$ | $R_{B4}$ | $R_{B1}$ |
| $L_{A279}$ | $R_{B7}$ | $R_{B1}$ | $R_{B5}$ | $R_{B1}$ |
| $L_{A280}$ | $R_{B7}$ | $R_{B1}$ | $R_{B6}$ | $R_{B1}$ |
| $L_{A281}$ | $R_{B7}$ | $R_{B1}$ | $R_{B7}$ | $R_{B1}$ |
| $L_{A282}$ | $R_{B7}$ | $R_{B1}$ | $R_{B24}$ | $R_{B1}$ |
| $L_{A283}$ | $R_{B7}$ | $R_{B1}$ | $R_{B25}$ | $R_{B1}$ |
| $L_{A284}$ | $R_{B7}$ | $R_{B1}$ | $R_{A3}$ | $R_{B1}$ |
| $L_{A285}$ | $R_{B7}$ | $R_{B1}$ | $R_{A434}$ | $R_{B1}$ |
| $L_{A286}$ | $R_{B7}$ | $R_{B1}$ | $R_{A444}$ | $R_{B1}$ |
| $L_{A287}$ | $R_{B7}$ | $R_{B1}$ | $R_{A452}$ | $R_{B1}$ |
| $L_{A288}$ | $R_{B7}$ | $R_{B1}$ | $R_{A453}$ | $R_{B1}$ |
| $L_{A289}$ | $R_{B7}$ | $R_{B1}$ | $R_{A454}$ | $R_{B1}$ |
| $L_{A290}$ | $R_{B7}$ | $R_{B1}$ | $R_{C3}$ | $R_{B1}$ |
| $L_{A291}$ | $R_{B7}$ | $R_{B1}$ | $R_{C4}$ | $R_{B1}$ |
| $L_{A292}$ | $R_{B7}$ | $R_{B1}$ | $R_{C8}$ | $R_{B1}$ |
| $L_{A293}$ | $R_{B7}$ | $R_{B1}$ | $R_{B1}$ | $R_{B1}$ |
| $L_{A294}$ | $R_{B7}$ | $R_{B3}$ | $R_{B1}$ | $R_{B1}$ |
| $L_{A295}$ | $R_{B7}$ | $R_{B4}$ | $R_{B1}$ | $R_{B1}$ |
| $L_{A296}$ | $R_{B7}$ | $R_{B5}$ | $R_{B1}$ | $R_{B1}$ |
| $L_{A297}$ | $R_{B7}$ | $R_{B6}$ | $R_{B1}$ | $R_{B1}$ |
| $L_{A298}$ | $R_{B7}$ | $R_{B7}$ | $R_{B1}$ | $R_{B1}$ |
| $L_{A299}$ | $R_{B7}$ | $R_{B24}$ | $R_{B1}$ | $R_{B1}$ |
| $L_{A300}$ | $R_{B7}$ | $R_{B25}$ | $R_{B1}$ | $R_{B1}$ |
| $L_{A301}$ | $R_{B7}$ | $R_{A3}$ | $R_{B1}$ | $R_{B1}$ |
| $L_{A302}$ | $R_{B7}$ | $R_{A434}$ | $R_{B1}$ | $R_{B1}$ |
| $L_{A303}$ | $R_{B7}$ | $R_{A444}$ | $R_{B1}$ | $R_{B1}$ |
| $L_{A304}$ | $R_{B7}$ | $R_{A452}$ | $R_{B1}$ | $R_{B1}$ |
| $L_{A305}$ | $R_{B7}$ | $R_{A453}$ | $R_{B1}$ | $R_{B1}$ |
| $L_{A306}$ | $R_{B7}$ | $R_{A454}$ | $R_{B1}$ | $R_{B1}$ |
| $L_{A307}$ | $R_{B7}$ | $R_{C3}$ | $R_{B1}$ | $R_{B1}$ |
| $L_{A308}$ | $R_{B7}$ | $R_{C4}$ | $R_{B1}$ | $R_{B1}$ |
| $L_{A309}$ | $R_{B7}$ | $R_{C8}$ | $R_{B1}$ | $R_{B1}$ |
| $L_{A310}$ | $R_{B9}$ | H | H | H |
| $L_{A311}$ | $R_{B9}$ | $R_{B1}$ | H | H |
| $L_{A312}$ | $R_{B9}$ | $R_{B3}$ | H | H |
| $L_{A313}$ | $R_{B9}$ | $R_{B4}$ | H | H |
| $L_{A314}$ | $R_{B9}$ | $R_{B5}$ | H | H |
| $L_{A315}$ | $R_{B9}$ | $R_{B6}$ | H | H |
| $L_{A316}$ | $R_{B9}$ | $R_{B7}$ | H | H |
| $L_{A317}$ | $R_{B9}$ | $R_{B24}$ | H | H |
| $L_{A318}$ | $R_{B9}$ | $R_{B25}$ | H | H |
| $L_{A319}$ | $R_{B9}$ | $R_{A3}$ | H | H |
| $L_{A320}$ | $R_{B9}$ | $R_{A434}$ | H | H |
| $L_{A321}$ | $R_{B9}$ | $R_{A444}$ | H | H |
| $L_{A322}$ | $R_{B9}$ | $R_{A452}$ | H | H |
| $L_{A323}$ | $R_{B9}$ | $R_{A453}$ | H | H |
| $L_{A324}$ | $R_{B9}$ | $R_{A454}$ | H | H |
| $L_{A325}$ | $R_{B9}$ | $R_{C3}$ | H | H |
| $L_{A326}$ | $R_{B9}$ | $R_{C4}$ | H | H |
| $L_{A327}$ | $R_{B9}$ | $R_{C8}$ | H | H |
| $L_{A328}$ | $R_{B9}$ | H | $R_{B1}$ | H |
| $L_{A329}$ | $R_{B9}$ | H | $R_{B3}$ | H |
| $L_{A330}$ | $R_{B9}$ | H | $R_{B4}$ | H |
| $L_{A331}$ | $R_{B9}$ | H | $R_{B5}$ | H |
| $L_{A332}$ | $R_{B9}$ | H | $R_{B6}$ | H |
| $L_{A333}$ | $R_{B9}$ | H | $R_{B7}$ | H |
| $L_{A334}$ | $R_{B9}$ | H | $R_{B24}$ | H |
| $L_{A335}$ | $R_{B9}$ | H | $R_{B25}$ | H |
| $L_{A336}$ | $R_{B9}$ | H | $R_{A3}$ | H |
| $L_{A337}$ | $R_{B9}$ | H | $R_{A434}$ | H |
| $L_{A338}$ | $R_{B9}$ | H | $R_{A444}$ | H |
| $L_{A339}$ | $R_{B9}$ | H | $R_{A452}$ | H |
| $L_{A340}$ | $R_{B9}$ | H | $R_{A453}$ | H |
| $L_{A341}$ | $R_{B9}$ | H | $R_{A454}$ | H |
| $L_{A342}$ | $R_{B9}$ | H | $R_{C3}$ | H |
| $L_{A343}$ | $R_{B9}$ | H | $R_{C4}$ | H |
| $L_{A344}$ | $R_{B9}$ | H | $R_{C8}$ | H |
| $L_{A345}$ | $R_{B9}$ | $R_{B1}$ | $R_{B1}$ | H |
| $L_{A346}$ | $R_{B9}$ | $R_{B3}$ | $R_{B1}$ | H |
| $L_{A347}$ | $R_{B9}$ | $R_{B4}$ | $R_{B1}$ | H |
| $L_{A348}$ | $R_{B9}$ | $R_{B5}$ | $R_{B1}$ | H |
| $L_{A349}$ | $R_{B9}$ | $R_{B6}$ | $R_{B1}$ | H |
| $L_{A350}$ | $R_{B9}$ | $R_{B7}$ | $R_{B1}$ | H |
| $L_{A351}$ | $R_{B9}$ | $R_{B24}$ | $R_{B1}$ | H |
| $L_{A352}$ | $R_{B9}$ | $R_{B25}$ | $R_{B1}$ | H |
| $L_{A353}$ | $R_{B9}$ | $R_{A3}$ | $R_{B1}$ | H |
| $L_{A354}$ | $R_{B9}$ | $R_{A434}$ | $R_{B1}$ | H |
| $L_{A355}$ | $R_{B9}$ | $R_{A444}$ | $R_{B1}$ | H |
| $L_{A356}$ | $R_{B9}$ | $R_{A452}$ | $R_{B1}$ | H |
| $L_{A357}$ | $R_{B9}$ | $R_{A453}$ | $R_{B1}$ | H |
| $L_{A358}$ | $R_{B9}$ | $R_{A454}$ | $R_{B1}$ | H |
| $L_{A359}$ | $R_{B9}$ | $R_{C3}$ | $R_{B1}$ | H |
| $L_{A360}$ | $R_{B9}$ | $R_{C4}$ | $R_{B1}$ | H |
| $L_{A361}$ | $R_{B9}$ | $R_{C8}$ | $R_{B1}$ | H |
| $L_{A362}$ | $R_{B9}$ | $R_{B1}$ | $R_{B1}$ | H |
| $L_{A363}$ | $R_{B9}$ | $R_{B1}$ | $R_{B3}$ | H |
| $L_{A364}$ | $R_{B9}$ | $R_{B1}$ | $R_{B4}$ | H |
| $L_{A365}$ | $R_{B9}$ | $R_{B1}$ | $R_{B5}$ | H |
| $L_{A366}$ | $R_{B9}$ | $R_{B1}$ | $R_{B6}$ | H |
| $L_{A367}$ | $R_{B9}$ | $R_{B1}$ | $R_{B7}$ | H |
| $L_{A368}$ | $R_{B9}$ | $R_{B1}$ | $R_{B24}$ | H |
| $L_{A369}$ | $R_{B9}$ | $R_{B1}$ | $R_{B25}$ | H |
| $L_{A370}$ | $R_{B9}$ | $R_{B1}$ | $R_{A3}$ | H |
| $L_{A371}$ | $R_{B9}$ | $R_{B1}$ | $R_{A434}$ | H |
| $L_{A372}$ | $R_{B9}$ | $R_{B1}$ | $R_{A444}$ | H |
| $L_{A373}$ | $R_{B9}$ | $R_{B1}$ | $R_{A452}$ | H |
| $L_{A374}$ | $R_{B9}$ | $R_{B1}$ | $R_{A453}$ | H |
| $L_{A375}$ | $R_{B9}$ | $R_{B1}$ | $R_{A454}$ | H |
| $L_{A376}$ | $R_{B9}$ | $R_{B1}$ | $R_{C3}$ | H |
| $L_{A377}$ | $R_{B9}$ | $R_{B1}$ | $R_{C4}$ | H |
| $L_{A378}$ | $R_{B9}$ | $R_{B1}$ | $R_{C8}$ | H |
| $L_{A379}$ | $R_{B9}$ | $R_{B1}$ | $R_{B1}$ | $R_{B1}$ |
| $L_{A380}$ | $R_{B9}$ | $R_{B1}$ | $R_{B3}$ | $R_{B1}$ |
| $L_{A381}$ | $R_{B9}$ | $R_{B1}$ | $R_{B4}$ | $R_{B1}$ |
| $L_{A382}$ | $R_{B9}$ | $R_{B1}$ | $R_{B5}$ | $R_{B1}$ |
| $L_{A383}$ | $R_{B9}$ | $R_{B1}$ | $R_{B6}$ | $R_{B1}$ |
| $L_{A384}$ | $R_{B9}$ | $R_{B1}$ | $R_{B7}$ | $R_{B1}$ |
| $L_{A385}$ | $R_{B9}$ | $R_{B1}$ | $R_{B24}$ | $R_{B1}$ |
| $L_{A386}$ | $R_{B9}$ | $R_{B1}$ | $R_{B25}$ | $R_{B1}$ |
| $L_{A387}$ | $R_{B9}$ | $R_{B1}$ | $R_{A3}$ | $R_{B1}$ |
| $L_{A388}$ | $R_{B9}$ | $R_{B1}$ | $R_{A434}$ | $R_{B1}$ |
| $L_{A389}$ | $R_{B9}$ | $R_{B1}$ | $R_{A444}$ | $R_{B1}$ |
| $L_{A390}$ | $R_{B9}$ | $R_{B1}$ | $R_{A452}$ | $R_{B1}$ |
| $L_{A391}$ | $R_{B9}$ | $R_{B1}$ | $R_{A453}$ | $R_{B1}$ |

| $L_{Ai}$ | $R^1$ | $R^4$ | $R^5$ | $R^6$ |
|---|---|---|---|---|
| $L_{A4392}$ | $R_{B9}$ | $R_{B1}$ | $R_{A54}$ | $R_{B1}$ |
| $L_{A4393}$ | $R_{B9}$ | $R_{B1}$ | $R_{C3}$ | $R_{B1}$ |
| $L_{A4394}$ | $R_{B9}$ | $R_{B1}$ | $R_{C4}$ | $R_{B1}$ |
| $L_{A4395}$ | $R_{B9}$ | $R_{B1}$ | $R_{C8}$ | $R_{B1}$ |
| $L_{A4396}$ | $R_{B9}$ | $R_{B1}$ | $R_{B1}$ | $R_{B1}$ |
| $L_{A4397}$ | $R_{B9}$ | $R_{B3}$ | $R_{B1}$ | $R_{B1}$ |
| $L_{A4398}$ | $R_{B9}$ | $R_{B4}$ | $R_{B1}$ | $R_{B1}$ |
| $L_{A4399}$ | $R_{B9}$ | $R_{B5}$ | $R_{B1}$ | $R_{B1}$ |
| $L_{A4400}$ | $R_{B9}$ | $R_{B6}$ | $R_{B1}$ | $R_{B1}$ |
| $L_{A4401}$ | $R_{B9}$ | $R_{B7}$ | $R_{B1}$ | $R_{B1}$ |
| $L_{A4402}$ | $R_{B9}$ | $R_{B24}$ | $R_{B1}$ | $R_{B1}$ |
| $L_{A4403}$ | $R_{B9}$ | $R_{B25}$ | $R_{B1}$ | $R_{B1}$ |
| $L_{A4404}$ | $R_{B9}$ | $R_{A3}$ | $R_{B1}$ | $R_{B1}$ |
| $L_{A4405}$ | $R_{B9}$ | $R_{A34}$ | $R_{B1}$ | $R_{B1}$ |
| $L_{A4406}$ | $R_{B9}$ | $R_{A44}$ | $R_{B1}$ | $R_{B1}$ |
| $L_{A4407}$ | $R_{B9}$ | $R_{A52}$ | $R_{B1}$ | $R_{B1}$ |
| $L_{A4408}$ | $R_{B9}$ | $R_{A53}$ | $R_{B1}$ | $R_{B1}$ |
| $L_{A4409}$ | $R_{B9}$ | $R_{A54}$ | $R_{B1}$ | $R_{B1}$ |
| $L_{A4410}$ | $R_{B9}$ | $R_{C3}$ | $R_{B1}$ | $R_{B1}$ |
| $L_{A4411}$ | $R_{B9}$ | $R_{C4}$ | $R_{B1}$ | $R_{B1}$ |
| $L_{A4412}$ | $R_{B9}$ | $R_{C8}$ | $R_{B1}$ | $R_{B1}$ |
| $L_{A4413}$ | $R_{B15}$ | H | H | H |
| $L_{A4414}$ | $R_{B15}$ | $R_{B1}$ | H | H |
| $L_{A4415}$ | $R_{B15}$ | $R_{B3}$ | H | H |
| $L_{A4416}$ | $R_{B15}$ | $R_{B4}$ | H | H |
| $L_{A4417}$ | $R_{B15}$ | $R_{B5}$ | H | H |
| $L_{A4418}$ | $R_{B15}$ | $R_{B6}$ | H | H |
| $L_{A4419}$ | $R_{B15}$ | $R_{B7}$ | H | H |
| $L_{A4420}$ | $R_{B15}$ | $R_{B24}$ | H | H |
| $L_{A4421}$ | $R_{B15}$ | $R_{B25}$ | H | H |
| $L_{A4422}$ | $R_{B15}$ | $R_{A3}$ | H | H |
| $L_{A4423}$ | $R_{B15}$ | $R_{A34}$ | H | H |
| $L_{A4424}$ | $R_{B15}$ | $R_{A44}$ | H | H |
| $L_{A4425}$ | $R_{B15}$ | $R_{A52}$ | H | H |
| $L_{A4426}$ | $R_{B15}$ | $R_{A53}$ | H | H |
| $L_{A4427}$ | $R_{B15}$ | $R_{A54}$ | H | H |
| $L_{A4428}$ | $R_{B15}$ | $R_{C3}$ | H | H |
| $L_{A4429}$ | $R_{B15}$ | $R_{C4}$ | H | H |
| $L_{A4430}$ | $R_{B15}$ | $R_{C8}$ | H | H |
| $L_{A4431}$ | $R_{B15}$ | H | $R_{B1}$ | H |
| $L_{A4432}$ | $R_{B15}$ | H | $R_{B3}$ | H |
| $L_{A4433}$ | $R_{B15}$ | H | $R_{B4}$ | H |
| $L_{A4434}$ | $R_{B15}$ | H | $R_{B5}$ | H |
| $L_{A4435}$ | $R_{B15}$ | H | $R_{B6}$ | H |
| $L_{A4436}$ | $R_{B15}$ | H | $R_{B7}$ | H |
| $L_{A4437}$ | $R_{B15}$ | H | $R_{B24}$ | H |
| $L_{A4438}$ | $R_{B15}$ | H | $R_{B25}$ | H |
| $L_{A4439}$ | $R_{B15}$ | H | $R_{A3}$ | H |
| $L_{A4440}$ | $R_{B15}$ | H | $R_{A34}$ | H |
| $L_{A4441}$ | $R_{B15}$ | H | $R_{A44}$ | H |
| $L_{A4442}$ | $R_{B15}$ | H | $R_{A52}$ | H |
| $L_{A4443}$ | $R_{B15}$ | H | $R_{A53}$ | H |
| $L_{A4444}$ | $R_{B15}$ | H | $R_{A54}$ | H |
| $L_{A4445}$ | $R_{B15}$ | H | $R_{C3}$ | H |
| $L_{A4446}$ | $R_{B15}$ | H | $R_{C4}$ | H |
| $L_{A4447}$ | $R_{B15}$ | H | $R_{C8}$ | H |
| $L_{A4448}$ | $R_{B15}$ | $R_{B1}$ | $R_{B1}$ | H |
| $L_{A4449}$ | $R_{B15}$ | $R_{B3}$ | $R_{B1}$ | H |
| $L_{A4450}$ | $R_{B15}$ | $R_{B4}$ | $R_{B1}$ | H |
| $L_{A4451}$ | $R_{B15}$ | $R_{B5}$ | $R_{B1}$ | H |
| $L_{A4452}$ | $R_{B15}$ | $R_{B6}$ | $R_{B1}$ | H |
| $L_{A4453}$ | $R_{B15}$ | $R_{B7}$ | $R_{B1}$ | H |
| $L_{A4454}$ | $R_{B15}$ | $R_{B24}$ | $R_{B1}$ | H |
| $L_{A4455}$ | $R_{B15}$ | $R_{B25}$ | $R_{B1}$ | H |
| $L_{A4456}$ | $R_{B15}$ | $R_{A3}$ | $R_{B1}$ | H |
| $L_{A4457}$ | $R_{B15}$ | $R_{A34}$ | $R_{B1}$ | H |
| $L_{A4458}$ | $R_{B15}$ | $R_{A44}$ | $R_{B1}$ | H |
| $L_{A4459}$ | $R_{B15}$ | $R_{A52}$ | $R_{B1}$ | H |
| $L_{A4460}$ | $R_{B15}$ | $R_{A53}$ | $R_{B1}$ | H |
| $L_{A4461}$ | $R_{B15}$ | $R_{A54}$ | $R_{B1}$ | H |
| $L_{A4462}$ | $R_{B15}$ | $R_{C3}$ | $R_{B1}$ | H |
| $L_{A4463}$ | $R_{B15}$ | $R_{C4}$ | $R_{B1}$ | H |
| $L_{A4464}$ | $R_{B15}$ | $R_{C8}$ | $R_{B1}$ | H |
| $L_{A4465}$ | $R_{B15}$ | $R_{B1}$ | $R_{B1}$ | H |
| $L_{A4466}$ | $R_{B15}$ | $R_{B1}$ | $R_{B3}$ | H |
| $L_{A4467}$ | $R_{B15}$ | $R_{B1}$ | $R_{B4}$ | H |
| $L_{A4468}$ | $R_{B15}$ | $R_{B1}$ | $R_{B5}$ | H |

| $L_{Ai}$ | $R^1$ | $R^4$ | $R^5$ | $R^6$ |
|---|---|---|---|---|
| $L_{A4469}$ | $R_{B15}$ | $R_{B1}$ | $R_{B6}$ | H |
| $L_{A4470}$ | $R_{B15}$ | $R_{B1}$ | $R_{B7}$ | H |
| $L_{A4471}$ | $R_{B15}$ | $R_{B1}$ | $R_{B24}$ | H |
| $L_{A4472}$ | $R_{B15}$ | $R_{B1}$ | $R_{B25}$ | H |
| $L_{A4473}$ | $R_{B15}$ | $R_{B1}$ | $R_{A3}$ | H |
| $L_{A4474}$ | $R_{B15}$ | $R_{B1}$ | $R_{A34}$ | H |
| $L_{A4475}$ | $R_{B15}$ | $R_{B1}$ | $R_{A44}$ | H |
| $L_{A4476}$ | $R_{B15}$ | $R_{B1}$ | $R_{A52}$ | H |
| $L_{A4477}$ | $R_{B15}$ | $R_{B1}$ | $R_{A53}$ | H |
| $L_{A4478}$ | $R_{B15}$ | $R_{B1}$ | $R_{A54}$ | H |
| $L_{A4479}$ | $R_{B15}$ | $R_{B1}$ | $R_{C3}$ | H |
| $L_{A4480}$ | $R_{B15}$ | $R_{B1}$ | $R_{C4}$ | H |
| $L_{A4481}$ | $R_{B15}$ | $R_{B1}$ | $R_{C8}$ | H |
| $L_{A4482}$ | $R_{B15}$ | $R_{B1}$ | $R_{B1}$ | $R_{B1}$ |
| $L_{A4483}$ | $R_{B15}$ | $R_{B1}$ | $R_{B3}$ | $R_{B1}$ |
| $L_{A4484}$ | $R_{B15}$ | $R_{B1}$ | $R_{B4}$ | $R_{B1}$ |
| $L_{A4485}$ | $R_{B15}$ | $R_{B1}$ | $R_{B5}$ | $R_{B1}$ |
| $L_{A4486}$ | $R_{B15}$ | $R_{B1}$ | $R_{B6}$ | $R_{B1}$ |
| $L_{A4487}$ | $R_{B15}$ | $R_{B1}$ | $R_{B7}$ | $R_{B1}$ |
| $L_{A4488}$ | $R_{B15}$ | $R_{B1}$ | $R_{B24}$ | $R_{B1}$ |
| $L_{A4489}$ | $R_{B15}$ | $R_{B1}$ | $R_{B25}$ | $R_{B1}$ |
| $L_{A4490}$ | $R_{B15}$ | $R_{B1}$ | $R_{A3}$ | $R_{B1}$ |
| $L_{A4491}$ | $R_{B15}$ | $R_{B1}$ | $R_{A34}$ | $R_{B1}$ |
| $L_{A4492}$ | $R_{B15}$ | $R_{B1}$ | $R_{A44}$ | $R_{B1}$ |
| $L_{A4493}$ | $R_{B15}$ | $R_{B1}$ | $R_{A52}$ | $R_{B1}$ |
| $L_{A4494}$ | $R_{B15}$ | $R_{B1}$ | $R_{A53}$ | $R_{B1}$ |
| $L_{A4495}$ | $R_{B15}$ | $R_{B1}$ | $R_{A54}$ | $R_{B1}$ |
| $L_{A4496}$ | $R_{B15}$ | $R_{B1}$ | $R_{C3}$ | $R_{B1}$ |
| $L_{A4497}$ | $R_{B15}$ | $R_{B1}$ | $R_{C4}$ | $R_{B1}$ |
| $L_{A4498}$ | $R_{B15}$ | $R_{B1}$ | $R_{C8}$ | $R_{B1}$ |
| $L_{A4499}$ | $R_{B15}$ | $R_{B1}$ | $R_{B1}$ | $R_{B1}$ |
| $L_{A4500}$ | $R_{B15}$ | $R_{B3}$ | $R_{B1}$ | $R_{B1}$ |
| $L_{A4501}$ | $R_{B15}$ | $R_{B4}$ | $R_{B1}$ | $R_{B1}$ |
| $L_{A4502}$ | $R_{B15}$ | $R_{B5}$ | $R_{B1}$ | $R_{B1}$ |
| $L_{A4503}$ | $R_{B15}$ | $R_{B6}$ | $R_{B1}$ | $R_{B1}$ |
| $L_{A4504}$ | $R_{B15}$ | $R_{B7}$ | $R_{B1}$ | $R_{B1}$ |
| $L_{A4505}$ | $R_{B15}$ | $R_{B24}$ | $R_{B1}$ | $R_{B1}$ |
| $L_{A4506}$ | $R_{B15}$ | $R_{B25}$ | $R_{B1}$ | $R_{B1}$ |
| $L_{A4507}$ | $R_{B15}$ | $R_{A3}$ | $R_{B1}$ | $R_{B1}$ |
| $L_{A4508}$ | $R_{B15}$ | $R_{A34}$ | $R_{B1}$ | $R_{B1}$ |
| $L_{A4509}$ | $R_{B15}$ | $R_{A44}$ | $R_{B1}$ | $R_{B1}$ |
| $L_{A4510}$ | $R_{B15}$ | $R_{A52}$ | $R_{B1}$ | $R_{B1}$ |
| $L_{A4511}$ | $R_{B15}$ | $R_{A53}$ | $R_{B1}$ | $R_{B1}$ |
| $L_{A4512}$ | $R_{B15}$ | $R_{A54}$ | $R_{B1}$ | $R_{B1}$ |
| $L_{A4513}$ | $R_{B15}$ | $R_{C3}$ | $R_{B1}$ | $R_{B1}$ |
| $L_{A4514}$ | $R_{B15}$ | $R_{C4}$ | $R_{B1}$ | $R_{B1}$ |
| $L_{A4515}$ | $R_{B15}$ | $R_{C8}$ | $R_{B1}$ | $R_{B1}$ |
| $L_{A4516}$ | $R_{A44}$ | H | H | H |
| $L_{A4517}$ | $R_{A44}$ | $R_{B1}$ | H | H |
| $L_{A4518}$ | $R_{A44}$ | $R_{B3}$ | H | H |
| $L_{A4519}$ | $R_{A44}$ | $R_{B4}$ | H | H |
| $L_{A4520}$ | $R_{A44}$ | $R_{B5}$ | H | H |
| $L_{A4521}$ | $R_{A44}$ | $R_{B6}$ | H | H |
| $L_{A4522}$ | $R_{A44}$ | $R_{B7}$ | H | H |
| $L_{A4523}$ | $R_{A44}$ | $R_{B24}$ | H | H |
| $L_{A4524}$ | $R_{A44}$ | $R_{B25}$ | H | H |
| $L_{A4525}$ | $R_{A44}$ | $R_{A3}$ | H | H |
| $L_{A4526}$ | $R_{A44}$ | $R_{A34}$ | H | H |
| $L_{A4527}$ | $R_{A44}$ | $R_{A44}$ | H | H |
| $L_{A4528}$ | $R_{A44}$ | $R_{A52}$ | H | H |
| $L_{A4529}$ | $R_{A44}$ | $R_{A53}$ | H | H |
| $L_{A4530}$ | $R_{A44}$ | $R_{A54}$ | H | H |
| $L_{A4531}$ | $R_{A44}$ | $R_{C3}$ | H | H |
| $L_{A4532}$ | $R_{A44}$ | $R_{C4}$ | H | H |
| $L_{A4533}$ | $R_{A44}$ | $R_{C8}$ | H | H |
| $L_{A4534}$ | $R_{A44}$ | H | $R_{B1}$ | H |
| $L_{A4535}$ | $R_{A44}$ | H | $R_{B3}$ | H |
| $L_{A4536}$ | $R_{A44}$ | H | $R_{B4}$ | H |
| $L_{A4537}$ | $R_{A44}$ | H | $R_{B5}$ | H |
| $L_{A4538}$ | $R_{A44}$ | H | $R_{B6}$ | H |
| $L_{A4539}$ | $R_{A44}$ | H | $R_{B7}$ | H |
| $L_{A4540}$ | $R_{A44}$ | H | $R_{B24}$ | H |
| $L_{A4541}$ | $R_{A44}$ | H | $R_{B25}$ | H |
| $L_{A4542}$ | $R_{A44}$ | H | $R_{A3}$ | H |
| $L_{A4543}$ | $R_{A44}$ | H | $R_{A34}$ | H |
| $L_{A4544}$ | $R_{A44}$ | H | $R_{A44}$ | H |
| $L_{A4545}$ | $R_{A44}$ | H | $R_{A52}$ | H |

-continued

| $L_{Ai}$ | $R^1$ | $R^4$ | $R^5$ | $R^6$ |
|---|---|---|---|---|
| $L_{A546}$ | $R_{A44}$ | H | $R_{A53}$ | H |
| $L_{A547}$ | $R_{A44}$ | H | $R_{A54}$ | H |
| $L_{A548}$ | $R_{A44}$ | H | $R_{C3}$ | H |
| $L_{A549}$ | $R_{A44}$ | H | $R_{C4}$ | H |
| $L_{A550}$ | $R_{A44}$ | H | $R_{C8}$ | H |
| $L_{A551}$ | $R_{A44}$ | $R_{B1}$ | $R_{B1}$ | H |
| $L_{A552}$ | $R_{A44}$ | $R_{B3}$ | $R_{B1}$ | H |
| $L_{A553}$ | $R_{A44}$ | $R_{B4}$ | $R_{B1}$ | H |
| $L_{A554}$ | $R_{A44}$ | $R_{B5}$ | $R_{B1}$ | H |
| $L_{A555}$ | $R_{A44}$ | $R_{B6}$ | $R_{B1}$ | H |
| $L_{A556}$ | $R_{A44}$ | $R_{B7}$ | $R_{B1}$ | H |
| $L_{A557}$ | $R_{A44}$ | $R_{B24}$ | $R_{B1}$ | H |
| $L_{A558}$ | $R_{A44}$ | $R_{B25}$ | $R_{B1}$ | H |
| $L_{A559}$ | $R_{A44}$ | $R_{A3}$ | $R_{B1}$ | H |
| $L_{A560}$ | $R_{A44}$ | $R_{A34}$ | $R_{B1}$ | H |
| $L_{A561}$ | $R_{A44}$ | $R_{A44}$ | $R_{B1}$ | H |
| $L_{A562}$ | $R_{A44}$ | $R_{A52}$ | $R_{B1}$ | H |
| $L_{A563}$ | $R_{A44}$ | $R_{A53}$ | $R_{B1}$ | H |
| $L_{A564}$ | $R_{A44}$ | $R_{A54}$ | $R_{B1}$ | H |
| $L_{A565}$ | $R_{A44}$ | $R_{C3}$ | $R_{B1}$ | H |
| $L_{A566}$ | $R_{A44}$ | $R_{C4}$ | $R_{B1}$ | H |
| $L_{A567}$ | $R_{A44}$ | $R_{C8}$ | $R_{B1}$ | H |
| $L_{A568}$ | $R_{A44}$ | $R_{B1}$ | $R_{B1}$ | H |
| $L_{A569}$ | $R_{A44}$ | $R_{B1}$ | $R_{B3}$ | H |
| $L_{A570}$ | $R_{A44}$ | $R_{B1}$ | $R_{B4}$ | H |
| $L_{A571}$ | $R_{A44}$ | $R_{B1}$ | $R_{B5}$ | H |
| $L_{A572}$ | $R_{A44}$ | $R_{B1}$ | $R_{B6}$ | H |
| $L_{A573}$ | $R_{A44}$ | $R_{B1}$ | $R_{B7}$ | H |
| $L_{A574}$ | $R_{A44}$ | $R_{B1}$ | $R_{B24}$ | H |
| $L_{A575}$ | $R_{A44}$ | $R_{B1}$ | $R_{B25}$ | H |
| $L_{A576}$ | $R_{A44}$ | $R_{B1}$ | $R_{A3}$ | H |
| $L_{A577}$ | $R_{A44}$ | $R_{B1}$ | $R_{A34}$ | H |
| $L_{A578}$ | $R_{A44}$ | $R_{B1}$ | $R_{A44}$ | H |
| $L_{A579}$ | $R_{A44}$ | $R_{B1}$ | $R_{A52}$ | H |
| $L_{A580}$ | $R_{A44}$ | $R_{B1}$ | $R_{A53}$ | H |
| $L_{A581}$ | $R_{A44}$ | $R_{B1}$ | $R_{A54}$ | H |
| $L_{A582}$ | $R_{A44}$ | $R_{B1}$ | $R_{C3}$ | H |
| $L_{A583}$ | $R_{A44}$ | $R_{B1}$ | $R_{C4}$ | H |
| $L_{A584}$ | $R_{A44}$ | $R_{B1}$ | $R_{C8}$ | H |
| $L_{A585}$ | $R_{A44}$ | $R_{B1}$ | $R_{B1}$ | $R_{B1}$ |
| $L_{A586}$ | $R_{A44}$ | $R_{B1}$ | $R_{B3}$ | $R_{B1}$ |
| $L_{A587}$ | $R_{A44}$ | $R_{B1}$ | $R_{B4}$ | $R_{B1}$ |
| $L_{A588}$ | $R_{A44}$ | $R_{B1}$ | $R_{B5}$ | $R_{B1}$ |
| $L_{A589}$ | $R_{A44}$ | $R_{B1}$ | $R_{B6}$ | $R_{B1}$ |
| $L_{A590}$ | $R_{A44}$ | $R_{B1}$ | $R_{B7}$ | $R_{B1}$ |
| $L_{A591}$ | $R_{A44}$ | $R_{B1}$ | $R_{B24}$ | $R_{B1}$ |
| $L_{A592}$ | $R_{A44}$ | $R_{B1}$ | $R_{B25}$ | $R_{B1}$ |
| $L_{A593}$ | $R_{A44}$ | $R_{B1}$ | $R_{A3}$ | $R_{B1}$ |
| $L_{A594}$ | $R_{A44}$ | $R_{B1}$ | $R_{A34}$ | $R_{B1}$ |
| $L_{A595}$ | $R_{A44}$ | $R_{B1}$ | $R_{A44}$ | $R_{B1}$ |
| $L_{A596}$ | $R_{A44}$ | $R_{B1}$ | $R_{A52}$ | $R_{B1}$ |
| $L_{A597}$ | $R_{A44}$ | $R_{B1}$ | $R_{A53}$ | $R_{B1}$ |
| $L_{A598}$ | $R_{A44}$ | $R_{B1}$ | $R_{A54}$ | $R_{B1}$ |
| $L_{A599}$ | $R_{A44}$ | $R_{B1}$ | $R_{C3}$ | $R_{B1}$ |
| $L_{A600}$ | $R_{A44}$ | $R_{B1}$ | $R_{C4}$ | $R_{B1}$ |
| $L_{A601}$ | $R_{A44}$ | $R_{B1}$ | $R_{C8}$ | $R_{B1}$ |
| $L_{A602}$ | $R_{A44}$ | $R_{B1}$ | $R_{B1}$ | $R_{B1}$ |
| $L_{A603}$ | $R_{A44}$ | $R_{B3}$ | $R_{B1}$ | $R_{B1}$ |
| $L_{A604}$ | $R_{A44}$ | $R_{B4}$ | $R_{B1}$ | $R_{B1}$ |
| $L_{A605}$ | $R_{A44}$ | $R_{B5}$ | $R_{B1}$ | $R_{B1}$ |
| $L_{A606}$ | $R_{A44}$ | $R_{B6}$ | $R_{B1}$ | $R_{B1}$ |
| $L_{A607}$ | $R_{A44}$ | $R_{B7}$ | $R_{B1}$ | $R_{B1}$ |
| $L_{A608}$ | $R_{A44}$ | $R_{B24}$ | $R_{B1}$ | $R_{B1}$ |
| $L_{A609}$ | $R_{A44}$ | $R_{B25}$ | $R_{B1}$ | $R_{B1}$ |
| $L_{A610}$ | $R_{A44}$ | $R_{A3}$ | $R_{B1}$ | $R_{B1}$ |
| $L_{A611}$ | $R_{A44}$ | $R_{A34}$ | $R_{B1}$ | $R_{B1}$ |
| $L_{A612}$ | $R_{A44}$ | $R_{A44}$ | $R_{B1}$ | $R_{B1}$ |
| $L_{A613}$ | $R_{A44}$ | $R_{A52}$ | $R_{B1}$ | $R_{B1}$ |
| $L_{A614}$ | $R_{A44}$ | $R_{A53}$ | $R_{B1}$ | $R_{B1}$ |
| $L_{A615}$ | $R_{A44}$ | $R_{A54}$ | $R_{B1}$ | $R_{B1}$ |
| $L_{A616}$ | $R_{A44}$ | $R_{C3}$ | $R_{B1}$ | $R_{B1}$ |
| $L_{A617}$ | $R_{A44}$ | $R_{C4}$ | $R_{B1}$ | $R_{B1}$ |
| $L_{A618}$ | $R_{A44}$ | $R_{C8}$ | $R_{B1}$ | $R_{B1}$ |

In some embodiments of the compound, the first ligand $L_A$ is selected from the group consisting of:

ligands XIII-$L_{Ai}$ that are based on a structure of Formula XIII

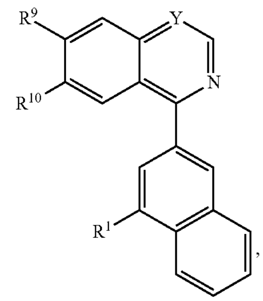

ligands XIV-$L_{Ai}$ that are based on a structure of Formula XIV

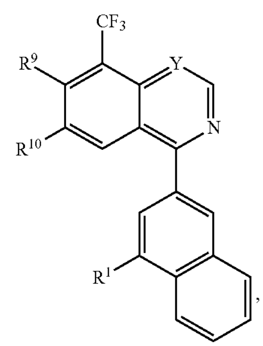

ligands XV-$L_{Ai}$ that are based on a structure of Formula XV

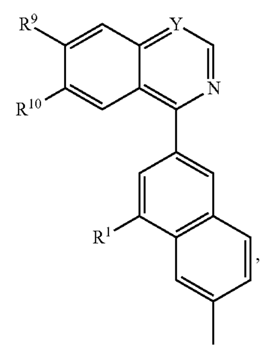

ligands XVI-$L_{Ai}$ that are based on a structure of Formula XVI

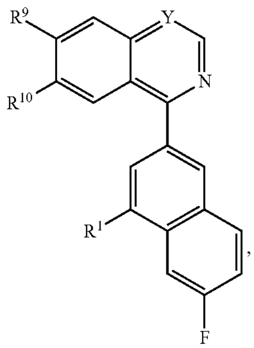

ligands XVII-$L_{Ai}$ that are based on a structure of Formula XVII

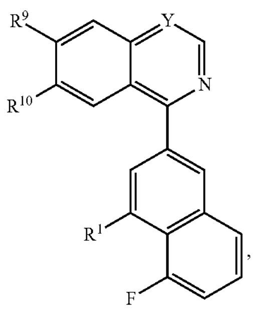

wherein i is an integer from 619 to 1170 and for each i, $R^1$, $R^9$, $R^{10}$, and Y in the formulas XIII, XIV, XV, XVI, and XVII are defined as follows:

| $L_{Ai}$ | $R^1$ | $R^9$ | $R^{10}$ | Y |
|---|---|---|---|---|
| $L_{A619}$ | $R_{B6}$ | H | H | CH |
| $L_{A620}$ | $R_{B6}$ | $R_{B1}$ | H | CH |
| $L_{A621}$ | $R_{B6}$ | $R_{B3}$ | H | CH |
| $L_{A622}$ | $R_{B6}$ | $R_{B4}$ | H | CH |
| $L_{A623}$ | $R_{B6}$ | $R_{B5}$ | H | CH |
| $L_{A624}$ | $R_{B6}$ | $R_{B6}$ | H | CH |
| $L_{A625}$ | $R_{B6}$ | $R_{B7}$ | H | CH |
| $L_{A626}$ | $R_{B6}$ | $R_{B24}$ | H | CH |
| $L_{A627}$ | $R_{B6}$ | $R_{B25}$ | H | CH |
| $L_{A628}$ | $R_{B6}$ | $R_{A3}$ | H | CH |
| $L_{A629}$ | $R_{B6}$ | $R_{A34}$ | H | CH |
| $L_{A630}$ | $R_{B6}$ | $R_{A44}$ | H | CH |
| $L_{A631}$ | $R_{B6}$ | $R_{A52}$ | H | CH |
| $L_{A632}$ | $R_{B6}$ | $R_{A53}$ | H | CH |
| $L_{A633}$ | $R_{B6}$ | $R_{A54}$ | H | CH |
| $L_{A634}$ | $R_{B6}$ | $R_{C3}$ | H | CH |
| $L_{A635}$ | $R_{B6}$ | $R_{C4}$ | H | CH |
| $L_{A636}$ | $R_{B6}$ | $R_{C8}$ | H | CH |
| $L_{A637}$ | $R_{B6}$ | H | $R_{B1}$ | CH |
| $L_{A638}$ | $R_{B6}$ | H | $R_{B3}$ | CH |
| $L_{A639}$ | $R_{B6}$ | H | $R_{B4}$ | CH |
| $L_{A640}$ | $R_{B6}$ | H | $R_{B5}$ | CH |
| $L_{A641}$ | $R_{B6}$ | H | $R_{B6}$ | CH |
| $L_{A642}$ | $R_{B6}$ | H | $R_{B7}$ | CH |
| $L_{A643}$ | $R_{B6}$ | H | $R_{B24}$ | CH |
| $L_{A644}$ | $R_{B6}$ | H | $R_{B25}$ | CH |
| $L_{A645}$ | $R_{B6}$ | H | $R_{A3}$ | CH |
| $L_{A646}$ | $R_{B6}$ | H | $R_{A34}$ | CH |
| $L_{A647}$ | $R_{B6}$ | H | $R_{A44}$ | CH |
| $L_{A648}$ | $R_{B6}$ | H | $R_{A52}$ | CH |

-continued

| $L_{Ai}$ | $R^1$ | $R^9$ | $R^{10}$ | Y |
|---|---|---|---|---|
| $L_{A649}$ | $R_{B6}$ | H | $R_{A53}$ | CH |
| $L_{A650}$ | $R_{B6}$ | H | $R_{A54}$ | CH |
| $L_{A651}$ | $R_{B6}$ | H | $R_{C3}$ | CH |
| $L_{A652}$ | $R_{B6}$ | H | $R_{C4}$ | CH |
| $L_{A653}$ | $R_{B6}$ | H | $R_{C8}$ | CH |
| $L_{A654}$ | $R_{B6}$ | $R_{B1}$ | $R_{B1}$ | CH |
| $L_{A655}$ | $R_{B6}$ | $R_{B3}$ | $R_{B1}$ | CH |
| $L_{A656}$ | $R_{B6}$ | $R_{B4}$ | $R_{B1}$ | CH |
| $L_{A657}$ | $R_{B6}$ | $R_{B5}$ | $R_{B1}$ | CH |
| $L_{A658}$ | $R_{B6}$ | $R_{B6}$ | $R_{B1}$ | CH |
| $L_{A659}$ | $R_{B6}$ | $R_{B7}$ | $R_{B1}$ | CH |
| $L_{A660}$ | $R_{B6}$ | $R_{B24}$ | $R_{B1}$ | CH |
| $L_{A661}$ | $R_{B6}$ | $R_{B25}$ | $R_{B1}$ | CH |
| $L_{A662}$ | $R_{B6}$ | $R_{A3}$ | $R_{B1}$ | CH |
| $L_{A663}$ | $R_{B6}$ | $R_{A34}$ | $R_{B1}$ | CH |
| $L_{A664}$ | $R_{B6}$ | $R_{A44}$ | $R_{B1}$ | CH |
| $L_{A665}$ | $R_{B6}$ | $R_{A52}$ | $R_{B1}$ | CH |
| $L_{A666}$ | $R_{B6}$ | $R_{A53}$ | $R_{B1}$ | CH |
| $L_{A667}$ | $R_{B6}$ | $R_{A54}$ | $R_{B1}$ | CH |
| $L_{A668}$ | $R_{B6}$ | $R_{C3}$ | $R_{B1}$ | CH |
| $L_{A669}$ | $R_{B6}$ | $R_{C4}$ | $R_{B1}$ | CH |
| $L_{A670}$ | $R_{B6}$ | $R_{C8}$ | $R_{B1}$ | CH |
| $L_{A671}$ | $R_{B6}$ | $R_{B1}$ | $R_{B1}$ | CH |
| $L_{A672}$ | $R_{B6}$ | $R_{B1}$ | $R_{B3}$ | CH |
| $L_{A673}$ | $R_{B6}$ | $R_{B1}$ | $R_{B4}$ | CH |
| $L_{A674}$ | $R_{B6}$ | $R_{B1}$ | $R_{B5}$ | CH |
| $L_{A675}$ | $R_{B6}$ | $R_{B1}$ | $R_{B6}$ | CH |
| $L_{A676}$ | $R_{B6}$ | $R_{B1}$ | $R_{B7}$ | CH |
| $L_{A677}$ | $R_{B6}$ | $R_{B1}$ | $R_{B24}$ | CH |
| $L_{A678}$ | $R_{B6}$ | $R_{B1}$ | $R_{B25}$ | CH |
| $L_{A679}$ | $R_{B6}$ | $R_{B1}$ | $R_{A3}$ | CH |
| $L_{A680}$ | $R_{B6}$ | $R_{B1}$ | $R_{A34}$ | CH |
| $L_{A681}$ | $R_{B6}$ | $R_{B1}$ | $R_{A44}$ | CH |
| $L_{A682}$ | $R_{B6}$ | $R_{B1}$ | $R_{A52}$ | CH |
| $L_{A683}$ | $R_{B6}$ | $R_{B1}$ | $R_{A53}$ | CH |
| $L_{A684}$ | $R_{B6}$ | $R_{B1}$ | $R_{A54}$ | CH |
| $L_{A685}$ | $R_{B6}$ | $R_{B1}$ | $R_{C3}$ | CH |
| $L_{A686}$ | $R_{B6}$ | $R_{B1}$ | $R_{C4}$ | CH |
| $L_{A687}$ | $R_{B6}$ | $R_{B1}$ | $R_{C8}$ | CH |
| $L_{A688}$ | $R_{B7}$ | H | H | CH |
| $L_{A689}$ | $R_{B7}$ | $R_{B1}$ | H | CH |
| $L_{A690}$ | $R_{B7}$ | $R_{B3}$ | H | CH |
| $L_{A691}$ | $R_{B7}$ | $R_{B4}$ | H | CH |
| $L_{A692}$ | $R_{B7}$ | $R_{B5}$ | H | CH |
| $L_{A693}$ | $R_{B7}$ | $R_{B6}$ | H | CH |
| $L_{A694}$ | $R_{B7}$ | $R_{B7}$ | H | CH |
| $L_{A695}$ | $R_{B7}$ | $R_{B24}$ | H | CH |
| $L_{A696}$ | $R_{B7}$ | $R_{B25}$ | H | CH |
| $L_{A697}$ | $R_{B7}$ | $R_{A3}$ | H | CH |
| $L_{A698}$ | $R_{B7}$ | $R_{A34}$ | H | CH |
| $L_{A699}$ | $R_{B7}$ | $R_{A44}$ | H | CH |
| $L_{A700}$ | $R_{B7}$ | $R_{A52}$ | H | CH |
| $L_{A701}$ | $R_{B7}$ | $R_{A53}$ | H | CH |
| $L_{A702}$ | $R_{B7}$ | $R_{A54}$ | H | CH |
| $L_{A703}$ | $R_{B7}$ | $R_{C3}$ | H | CH |
| $L_{A704}$ | $R_{B7}$ | $R_{C4}$ | H | CH |
| $L_{A705}$ | $R_{B7}$ | $R_{C8}$ | H | CH |
| $L_{A706}$ | $R_{B7}$ | H | $R_{B1}$ | CH |
| $L_{A707}$ | $R_{B7}$ | H | $R_{B3}$ | CH |
| $L_{A708}$ | $R_{B7}$ | H | $R_{B4}$ | CH |
| $L_{A709}$ | $R_{B7}$ | H | $R_{B5}$ | CH |
| $L_{A710}$ | $R_{B7}$ | H | $R_{B6}$ | CH |
| $L_{A711}$ | $R_{B7}$ | H | $R_{B7}$ | CH |
| $L_{A712}$ | $R_{B7}$ | H | $R_{B24}$ | CH |
| $L_{A713}$ | $R_{B7}$ | H | $R_{B25}$ | CH |
| $L_{A714}$ | $R_{B7}$ | H | $R_{A3}$ | CH |
| $L_{A715}$ | $R_{B7}$ | H | $R_{A34}$ | CH |
| $L_{A716}$ | $R_{B7}$ | H | $R_{A44}$ | CH |
| $L_{A717}$ | $R_{B7}$ | H | $R_{A52}$ | CH |
| $L_{A718}$ | $R_{B7}$ | H | $R_{A53}$ | CH |
| $L_{A719}$ | $R_{B7}$ | H | $R_{A54}$ | CH |
| $L_{A720}$ | $R_{B7}$ | H | $R_{C3}$ | CH |
| $L_{A721}$ | $R_{B7}$ | H | $R_{C4}$ | CH |
| $L_{A722}$ | $R_{B7}$ | H | $R_{C8}$ | CH |
| $L_{A723}$ | $R_{B7}$ | $R_{B1}$ | $R_{B1}$ | CH |
| $L_{A724}$ | $R_{B7}$ | $R_{B3}$ | $R_{B1}$ | CH |
| $L_{A725}$ | $R_{B7}$ | $R_{B4}$ | $R_{B1}$ | CH |

-continued

| $L_{Ai}$ | $R^1$ | $R^9$ | $R^{10}$ | Y |
|---|---|---|---|---|
| $L_{A726}$ | $R_{B7}$ | $R_{B5}$ | $R_{B1}$ | CH |
| $L_{A727}$ | $R_{B7}$ | $R_{B6}$ | $R_{B1}$ | CH |
| $L_{A728}$ | $R_{B7}$ | $R_{B7}$ | $R_{B1}$ | CH |
| $L_{A729}$ | $R_{B7}$ | $R_{B24}$ | $R_{B1}$ | CH |
| $L_{A730}$ | $R_{B7}$ | $R_{B25}$ | $R_{B1}$ | CH |
| $L_{A731}$ | $R_{B7}$ | $R_{A3}$ | $R_{B1}$ | CH |
| $L_{A732}$ | $R_{B7}$ | $R_{A34}$ | $R_{B1}$ | CH |
| $L_{A733}$ | $R_{B7}$ | $R_{A44}$ | $R_{B1}$ | CH |
| $L_{A734}$ | $R_{B7}$ | $R_{A52}$ | $R_{B1}$ | CH |
| $L_{A735}$ | $R_{B7}$ | $R_{A53}$ | $R_{B1}$ | CH |
| $L_{A736}$ | $R_{B7}$ | $R_{A54}$ | $R_{B1}$ | CH |
| $L_{A737}$ | $R_{B7}$ | $R_{C3}$ | $R_{B1}$ | CH |
| $L_{A738}$ | $R_{B7}$ | $R_{C4}$ | $R_{B1}$ | CH |
| $L_{A739}$ | $R_{B7}$ | $R_{C8}$ | $R_{B1}$ | CH |
| $L_{A740}$ | $R_{B7}$ | $R_{B1}$ | $R_{B1}$ | CH |
| $L_{A741}$ | $R_{B7}$ | $R_{B1}$ | $R_{B3}$ | CH |
| $L_{A742}$ | $R_{B7}$ | $R_{B1}$ | $R_{B4}$ | CH |
| $L_{A743}$ | $R_{B7}$ | $R_{B1}$ | $R_{B5}$ | CH |
| $L_{A744}$ | $R_{B7}$ | $R_{B1}$ | $R_{B6}$ | CH |
| $L_{A745}$ | $R_{B7}$ | $R_{B1}$ | $R_{B7}$ | CH |
| $L_{A746}$ | $R_{B7}$ | $R_{B1}$ | $R_{B24}$ | CH |
| $L_{A747}$ | $R_{B7}$ | $R_{B1}$ | $R_{B25}$ | CH |
| $L_{A748}$ | $R_{B7}$ | $R_{B1}$ | $R_{A3}$ | CH |
| $L_{A749}$ | $R_{B7}$ | $R_{B1}$ | $R_{A34}$ | CH |
| $L_{A750}$ | $R_{B7}$ | $R_{B1}$ | $R_{A44}$ | CH |
| $L_{A751}$ | $R_{B7}$ | $R_{B1}$ | $R_{A52}$ | CH |
| $L_{A752}$ | $R_{B7}$ | $R_{B1}$ | $R_{A53}$ | CH |
| $L_{A753}$ | $R_{B7}$ | $R_{B1}$ | $R_{A54}$ | CH |
| $L_{A754}$ | $R_{B7}$ | $R_{B1}$ | $R_{C3}$ | CH |
| $L_{A755}$ | $R_{B7}$ | $R_{B1}$ | $R_{C4}$ | CH |
| $L_{A756}$ | $R_{B7}$ | $R_{B1}$ | $R_{C8}$ | CH |
| $L_{A757}$ | $R_{B9}$ | H | H | CH |
| $L_{A758}$ | $R_{B9}$ | $R_{B1}$ | H | CH |
| $L_{A759}$ | $R_{B9}$ | $R_{B3}$ | H | CH |
| $L_{A760}$ | $R_{B9}$ | $R_{B4}$ | H | CH |
| $L_{A761}$ | $R_{B9}$ | $R_{B5}$ | H | CH |
| $L_{A762}$ | $R_{B9}$ | $R_{B6}$ | H | CH |
| $L_{A763}$ | $R_{B9}$ | $R_{B7}$ | H | CH |
| $L_{A764}$ | $R_{B9}$ | $R_{B24}$ | H | CH |
| $L_{A765}$ | $R_{B9}$ | $R_{B25}$ | H | CH |
| $L_{A766}$ | $R_{B9}$ | $R_{A3}$ | H | CH |
| $L_{A767}$ | $R_{B9}$ | $R_{A34}$ | H | CH |
| $L_{A768}$ | $R_{B9}$ | $R_{A44}$ | H | CH |
| $L_{A769}$ | $R_{B9}$ | $R_{A52}$ | H | CH |
| $L_{A770}$ | $R_{B9}$ | $R_{A53}$ | H | CH |
| $L_{A771}$ | $R_{B9}$ | $R_{A54}$ | H | CH |
| $L_{A772}$ | $R_{B9}$ | $R_{C3}$ | H | CH |
| $L_{A773}$ | $R_{B9}$ | $R_{C4}$ | H | CH |
| $L_{A774}$ | $R_{B9}$ | $R_{C8}$ | H | CH |
| $L_{A775}$ | $R_{B9}$ | H | $R_{B1}$ | CH |
| $L_{A776}$ | $R_{B9}$ | H | $R_{B3}$ | CH |
| $L_{A777}$ | $R_{B9}$ | H | $R_{B4}$ | CH |
| $L_{A778}$ | $R_{B9}$ | H | $R_{B5}$ | CH |
| $L_{A779}$ | $R_{B9}$ | H | $R_{B6}$ | CH |
| $L_{A780}$ | $R_{B9}$ | H | $R_{B7}$ | CH |
| $L_{A781}$ | $R_{B9}$ | H | $R_{B24}$ | CH |
| $L_{A782}$ | $R_{B9}$ | H | $R_{B25}$ | CH |
| $L_{A783}$ | $R_{B9}$ | H | $R_{A3}$ | CH |
| $L_{A784}$ | $R_{B9}$ | H | $R_{A34}$ | CH |
| $L_{A785}$ | $R_{B9}$ | H | $R_{A44}$ | CH |
| $L_{A786}$ | $R_{B9}$ | H | $R_{A52}$ | CH |
| $L_{A787}$ | $R_{B9}$ | H | $R_{A53}$ | CH |
| $L_{A788}$ | $R_{B9}$ | H | $R_{A54}$ | CH |
| $L_{A789}$ | $R_{B9}$ | H | $R_{C3}$ | CH |
| $L_{A790}$ | $R_{B9}$ | H | $R_{C4}$ | CH |
| $L_{A791}$ | $R_{B9}$ | H | $R_{C8}$ | CH |
| $L_{A792}$ | $R_{B9}$ | $R_{B1}$ | $R_{B1}$ | CH |
| $L_{A793}$ | $R_{B9}$ | $R_{B3}$ | $R_{B1}$ | CH |
| $L_{A794}$ | $R_{B9}$ | $R_{B4}$ | $R_{B1}$ | CH |
| $L_{A795}$ | $R_{B9}$ | $R_{B5}$ | $R_{B1}$ | CH |
| $L_{A796}$ | $R_{B9}$ | $R_{B6}$ | $R_{B1}$ | CH |
| $L_{A797}$ | $R_{B9}$ | $R_{B7}$ | $R_{B1}$ | CH |
| $L_{A798}$ | $R_{B9}$ | $R_{B24}$ | $R_{B1}$ | CH |
| $L_{A799}$ | $R_{B9}$ | $R_{B25}$ | $R_{B1}$ | CH |
| $L_{A800}$ | $R_{B9}$ | $R_{A3}$ | $R_{B1}$ | CH |
| $L_{A801}$ | $R_{B9}$ | $R_{A34}$ | $R_{B1}$ | CH |
| $L_{A802}$ | $R_{B9}$ | $R_{A44}$ | $R_{B1}$ | CH |

-continued

| $L_{Ai}$ | $R^1$ | $R^9$ | $R^{10}$ | Y |
|---|---|---|---|---|
| $L_{A803}$ | $R_{B9}$ | $R_{A52}$ | $R_{B1}$ | CH |
| $L_{A804}$ | $R_{B9}$ | $R_{A53}$ | $R_{B1}$ | CH |
| $L_{A805}$ | $R_{B9}$ | $R_{A54}$ | $R_{B1}$ | CH |
| $L_{A806}$ | $R_{B9}$ | $R_{C3}$ | $R_{B1}$ | CH |
| $L_{A807}$ | $R_{B9}$ | $R_{C4}$ | $R_{B1}$ | CH |
| $L_{A808}$ | $R_{B9}$ | $R_{C8}$ | $R_{B1}$ | CH |
| $L_{A809}$ | $R_{B9}$ | $R_{B1}$ | $R_{B1}$ | CH |
| $L_{A810}$ | $R_{B9}$ | $R_{B1}$ | $R_{B3}$ | CH |
| $L_{A811}$ | $R_{B9}$ | $R_{B1}$ | $R_{B4}$ | CH |
| $L_{A812}$ | $R_{B9}$ | $R_{B1}$ | $R_{B5}$ | CH |
| $L_{A813}$ | $R_{B9}$ | $R_{B1}$ | $R_{B6}$ | CH |
| $L_{A814}$ | $R_{B9}$ | $R_{B1}$ | $R_{B7}$ | CH |
| $L_{A815}$ | $R_{B9}$ | $R_{B1}$ | $R_{B24}$ | CH |
| $L_{A816}$ | $R_{B9}$ | $R_{B1}$ | $R_{B25}$ | CH |
| $L_{A817}$ | $R_{B9}$ | $R_{B1}$ | $R_{A3}$ | CH |
| $L_{A818}$ | $R_{B9}$ | $R_{B1}$ | $R_{A34}$ | CH |
| $L_{A819}$ | $R_{B9}$ | $R_{B1}$ | $R_{A44}$ | CH |
| $L_{A820}$ | $R_{B9}$ | $R_{B1}$ | $R_{A52}$ | CH |
| $L_{A821}$ | $R_{B9}$ | $R_{B1}$ | $R_{A53}$ | CH |
| $L_{A822}$ | $R_{B9}$ | $R_{B1}$ | $R_{A54}$ | CH |
| $L_{A823}$ | $R_{B9}$ | $R_{B1}$ | $R_{C3}$ | CH |
| $L_{A824}$ | $R_{B9}$ | $R_{B1}$ | $R_{C4}$ | CH |
| $L_{A825}$ | $R_{B9}$ | $R_{B1}$ | $R_{C8}$ | CH |
| $L_{A826}$ | $R_{B44}$ | H | H | CH |
| $L_{A827}$ | $R_{B44}$ | $R_{B1}$ | H | CH |
| $L_{A828}$ | $R_{B44}$ | $R_{B3}$ | H | CH |
| $L_{A829}$ | $R_{B44}$ | $R_{B4}$ | H | CH |
| $L_{A830}$ | $R_{B44}$ | $R_{B5}$ | H | CH |
| $L_{A831}$ | $R_{B44}$ | $R_{B6}$ | H | CH |
| $L_{A832}$ | $R_{B44}$ | $R_{B7}$ | H | CH |
| $L_{A833}$ | $R_{B44}$ | $R_{B24}$ | H | CH |
| $L_{A834}$ | $R_{B44}$ | $R_{B25}$ | H | CH |
| $L_{A835}$ | $R_{B44}$ | $R_{A3}$ | H | CH |
| $L_{A836}$ | $R_{B44}$ | $R_{A34}$ | H | CH |
| $L_{A837}$ | $R_{B44}$ | $R_{A44}$ | H | CH |
| $L_{A838}$ | $R_{B44}$ | $R_{A52}$ | H | CH |
| $L_{A839}$ | $R_{B44}$ | $R_{A53}$ | H | CH |
| $L_{A840}$ | $R_{B44}$ | $R_{A54}$ | H | CH |
| $L_{A841}$ | $R_{B44}$ | $R_{C3}$ | H | CH |
| $L_{A842}$ | $R_{B44}$ | $R_{C4}$ | H | CH |
| $L_{A843}$ | $R_{B44}$ | $R_{C8}$ | H | CH |
| $L_{A844}$ | $R_{B44}$ | H | $R_{B1}$ | CH |
| $L_{A845}$ | $R_{B44}$ | H | $R_{B3}$ | CH |
| $L_{A846}$ | $R_{B44}$ | H | $R_{B4}$ | CH |
| $L_{A847}$ | $R_{B44}$ | H | $R_{B5}$ | CH |
| $L_{A848}$ | $R_{B44}$ | H | $R_{B6}$ | CH |
| $L_{A849}$ | $R_{B44}$ | H | $R_{B7}$ | CH |
| $L_{A850}$ | $R_{B44}$ | H | $R_{B24}$ | CH |
| $L_{A851}$ | $R_{B44}$ | H | $R_{B25}$ | CH |
| $L_{A852}$ | $R_{B44}$ | H | $R_{A3}$ | CH |
| $L_{A853}$ | $R_{B44}$ | H | $R_{A34}$ | CH |
| $L_{A854}$ | $R_{B44}$ | H | $R_{A44}$ | CH |
| $L_{A855}$ | $R_{B44}$ | H | $R_{A52}$ | CH |
| $L_{A856}$ | $R_{B44}$ | H | $R_{A53}$ | CH |
| $L_{A857}$ | $R_{B44}$ | H | $R_{A54}$ | CH |
| $L_{A858}$ | $R_{B44}$ | H | $R_{C3}$ | CH |
| $L_{A859}$ | $R_{B44}$ | H | $R_{C4}$ | CH |
| $L_{A860}$ | $R_{B44}$ | H | $R_{C8}$ | CH |
| $L_{A861}$ | $R_{B44}$ | $R_{B1}$ | $R_{B1}$ | CH |
| $L_{A862}$ | $R_{B44}$ | $R_{B3}$ | $R_{B1}$ | CH |
| $L_{A863}$ | $R_{B44}$ | $R_{B4}$ | $R_{B1}$ | CH |
| $L_{A864}$ | $R_{B44}$ | $R_{B5}$ | $R_{B1}$ | CH |
| $L_{A865}$ | $R_{B44}$ | $R_{B6}$ | $R_{B1}$ | CH |
| $L_{A866}$ | $R_{B44}$ | $R_{B7}$ | $R_{B1}$ | CH |
| $L_{A867}$ | $R_{B44}$ | $R_{B24}$ | $R_{B1}$ | CH |
| $L_{A868}$ | $R_{B44}$ | $R_{B25}$ | $R_{B1}$ | CH |
| $L_{A869}$ | $R_{B44}$ | $R_{A3}$ | $R_{B1}$ | CH |
| $L_{A870}$ | $R_{B44}$ | $R_{A34}$ | $R_{B1}$ | CH |
| $L_{A871}$ | $R_{B44}$ | $R_{A44}$ | $R_{B1}$ | CH |
| $L_{A872}$ | $R_{B44}$ | $R_{A52}$ | $R_{B1}$ | CH |
| $L_{A873}$ | $R_{B44}$ | $R_{A53}$ | $R_{B1}$ | CH |
| $L_{A874}$ | $R_{B44}$ | $R_{A54}$ | $R_{B1}$ | CH |
| $L_{A875}$ | $R_{B44}$ | $R_{C3}$ | $R_{B1}$ | CH |
| $L_{A876}$ | $R_{B44}$ | $R_{C4}$ | $R_{B1}$ | CH |
| $L_{A877}$ | $R_{B44}$ | $R_{C8}$ | $R_{B1}$ | CH |
| $L_{A878}$ | $R_{B44}$ | $R_{B1}$ | $R_{B1}$ | CH |
| $L_{A879}$ | $R_{B44}$ | $R_{B1}$ | $R_{B3}$ | CH |

-continued

| $L_{Ai}$ | $R^1$ | $R^9$ | $R^{10}$ | Y |
|---|---|---|---|---|
| $L_{A4880}$ | $R_{B44}$ | $R_{B1}$ | $R_{B4}$ | CH |
| $L_{A4881}$ | $R_{B44}$ | $R_{B1}$ | $R_{B5}$ | CH |
| $L_{A4882}$ | $R_{B44}$ | $R_{B1}$ | $R_{B6}$ | CH |
| $L_{A4883}$ | $R_{B44}$ | $R_{B1}$ | $R_{B7}$ | CH |
| $L_{A4884}$ | $R_{B44}$ | $R_{B1}$ | $R_{B24}$ | CH |
| $L_{A4885}$ | $R_{B44}$ | $R_{B1}$ | $R_{B25}$ | CH |
| $L_{A4886}$ | $R_{B44}$ | $R_{B1}$ | $R_{A3}$ | CH |
| $L_{A4887}$ | $R_{B44}$ | $R_{B1}$ | $R_{A34}$ | CH |
| $L_{A4888}$ | $R_{B44}$ | $R_{B1}$ | $R_{A44}$ | CH |
| $L_{A4889}$ | $R_{B44}$ | $R_{B1}$ | $R_{A52}$ | CH |
| $L_{A4890}$ | $R_{B44}$ | $R_{B1}$ | $R_{A53}$ | CH |
| $L_{A4891}$ | $R_{B44}$ | $R_{B1}$ | $R_{A54}$ | CH |
| $L_{A4892}$ | $R_{B44}$ | $R_{B1}$ | $R_{C3}$ | CH |
| $L_{A4893}$ | $R_{B44}$ | $R_{B1}$ | $R_{C4}$ | CH |
| $L_{A4894}$ | $R_{B44}$ | $R_{B1}$ | $R_{C8}$ | CH |
| $L_{A4895}$ | $R_{B6}$ | H | H | N |
| $L_{A4896}$ | $R_{B6}$ | $R_{B1}$ | H | N |
| $L_{A4897}$ | $R_{B6}$ | $R_{B3}$ | H | N |
| $L_{A4898}$ | $R_{B6}$ | $R_{B4}$ | H | N |
| $L_{A4899}$ | $R_{B6}$ | $R_{B5}$ | H | N |
| $L_{A4900}$ | $R_{B6}$ | $R_{B6}$ | H | N |
| $L_{A4901}$ | $R_{B6}$ | $R_{B7}$ | H | N |
| $L_{A4902}$ | $R_{B6}$ | $R_{B24}$ | H | N |
| $L_{A4903}$ | $R_{B6}$ | $R_{B25}$ | H | N |
| $L_{A4904}$ | $R_{B6}$ | $R_{A3}$ | H | N |
| $L_{A4905}$ | $R_{B6}$ | $R_{A34}$ | H | N |
| $L_{A4906}$ | $R_{B6}$ | $R_{A44}$ | H | N |
| $L_{A4907}$ | $R_{B6}$ | $R_{A52}$ | H | N |
| $L_{A4908}$ | $R_{B6}$ | $R_{A53}$ | H | N |
| $L_{A4909}$ | $R_{B6}$ | $R_{A54}$ | H | N |
| $L_{A4910}$ | $R_{B6}$ | $R_{C3}$ | H | N |
| $L_{A4911}$ | $R_{B6}$ | $R_{C4}$ | H | N |
| $L_{A4912}$ | $R_{B6}$ | $R_{C8}$ | H | N |
| $L_{A4913}$ | $R_{B6}$ | H | $R_{B1}$ | N |
| $L_{A4914}$ | $R_{B6}$ | H | $R_{B3}$ | N |
| $L_{A4915}$ | $R_{B6}$ | H | $R_{B4}$ | N |
| $L_{A4916}$ | $R_{B6}$ | H | $R_{B5}$ | N |
| $L_{A4917}$ | $R_{B6}$ | H | $R_{B6}$ | N |
| $L_{A4918}$ | $R_{B6}$ | H | $R_{B7}$ | N |
| $L_{A4919}$ | $R_{B6}$ | H | $R_{B24}$ | N |
| $L_{A4920}$ | $R_{B6}$ | H | $R_{B25}$ | N |
| $L_{A4921}$ | $R_{B6}$ | H | $R_{A3}$ | N |
| $L_{A4922}$ | $R_{B6}$ | H | $R_{A34}$ | N |
| $L_{A4923}$ | $R_{B6}$ | H | $R_{A44}$ | N |
| $L_{A4924}$ | $R_{B6}$ | H | $R_{A52}$ | N |
| $L_{A4925}$ | $R_{B6}$ | H | $R_{A53}$ | N |
| $L_{A4926}$ | $R_{B6}$ | H | $R_{A54}$ | N |
| $L_{A4927}$ | $R_{B6}$ | H | $R_{C3}$ | N |
| $L_{A4928}$ | $R_{B6}$ | H | $R_{C4}$ | N |
| $L_{A4929}$ | $R_{B6}$ | H | $R_{C8}$ | N |
| $L_{A4930}$ | $R_{B6}$ | $R_{B1}$ | $R_{B1}$ | N |
| $L_{A4931}$ | $R_{B6}$ | $R_{B3}$ | $R_{B1}$ | N |
| $L_{A4932}$ | $R_{B6}$ | $R_{B4}$ | $R_{B1}$ | N |
| $L_{A4933}$ | $R_{B6}$ | $R_{B5}$ | $R_{B1}$ | N |
| $L_{A4934}$ | $R_{B6}$ | $R_{B6}$ | $R_{B1}$ | N |
| $L_{A4935}$ | $R_{B6}$ | $R_{B7}$ | $R_{B1}$ | N |
| $L_{A4936}$ | $R_{B6}$ | $R_{B24}$ | $R_{B1}$ | N |
| $L_{A4937}$ | $R_{B6}$ | $R_{B25}$ | $R_{B1}$ | N |
| $L_{A4938}$ | $R_{B6}$ | $R_{A3}$ | $R_{B1}$ | N |
| $L_{A4939}$ | $R_{B6}$ | $R_{A34}$ | $R_{B1}$ | N |
| $L_{A4940}$ | $R_{B6}$ | $R_{A44}$ | $R_{B1}$ | N |
| $L_{A4941}$ | $R_{B6}$ | $R_{A52}$ | $R_{B1}$ | N |
| $L_{A4942}$ | $R_{B6}$ | $R_{A53}$ | $R_{B1}$ | N |
| $L_{A4943}$ | $R_{B6}$ | $R_{A54}$ | $R_{B1}$ | N |
| $L_{A4944}$ | $R_{B6}$ | $R_{C3}$ | $R_{B1}$ | N |
| $L_{A4945}$ | $R_{B6}$ | $R_{C4}$ | $R_{B1}$ | N |
| $L_{A4946}$ | $R_{B6}$ | $R_{C8}$ | $R_{B1}$ | N |
| $L_{A4947}$ | $R_{B6}$ | $R_{B1}$ | $R_{B1}$ | N |
| $L_{A4948}$ | $R_{B6}$ | $R_{B1}$ | $R_{B3}$ | N |
| $L_{A4949}$ | $R_{B6}$ | $R_{B1}$ | $R_{B4}$ | N |
| $L_{A4950}$ | $R_{B6}$ | $R_{B1}$ | $R_{B5}$ | N |
| $L_{A4951}$ | $R_{B6}$ | $R_{B1}$ | $R_{B6}$ | N |
| $L_{A4952}$ | $R_{B6}$ | $R_{B1}$ | $R_{B7}$ | N |
| $L_{A4953}$ | $R_{B6}$ | $R_{B1}$ | $R_{B24}$ | N |
| $L_{A4954}$ | $R_{B6}$ | $R_{B1}$ | $R_{B25}$ | N |
| $L_{A4955}$ | $R_{B6}$ | $R_{B1}$ | $R_{A3}$ | N |
| $L_{A4956}$ | $R_{B6}$ | $R_{B1}$ | $R_{A34}$ | N |

-continued

| $L_{Ai}$ | $R^1$ | $R^9$ | $R^{10}$ | Y |
|---|---|---|---|---|
| $L_{A4957}$ | $R_{B6}$ | $R_{B1}$ | $R_{A44}$ | N |
| $L_{A4958}$ | $R_{B6}$ | $R_{B1}$ | $R_{A52}$ | N |
| $L_{A4959}$ | $R_{B6}$ | $R_{B1}$ | $R_{A53}$ | N |
| $L_{A4960}$ | $R_{B6}$ | $R_{B1}$ | $R_{A54}$ | N |
| $L_{A4961}$ | $R_{B6}$ | $R_{B1}$ | $R_{C3}$ | N |
| $L_{A4962}$ | $R_{B6}$ | $R_{B1}$ | $R_{C4}$ | N |
| $L_{A4963}$ | $R_{B6}$ | $R_{B1}$ | $R_{C8}$ | N |
| $L_{A4964}$ | $R_{B7}$ | H | H | N |
| $L_{A4965}$ | $R_{B7}$ | $R_{B1}$ | H | N |
| $L_{A4966}$ | $R_{B7}$ | $R_{B3}$ | H | N |
| $L_{A4967}$ | $R_{B7}$ | $R_{B4}$ | H | N |
| $L_{A4968}$ | $R_{B7}$ | $R_{B5}$ | H | N |
| $L_{A4969}$ | $R_{B7}$ | $R_{B6}$ | H | N |
| $L_{A4970}$ | $R_{B7}$ | $R_{B7}$ | H | N |
| $L_{A4971}$ | $R_{B7}$ | $R_{B24}$ | H | N |
| $L_{A4972}$ | $R_{B7}$ | $R_{B25}$ | H | N |
| $L_{A4973}$ | $R_{B7}$ | $R_{A3}$ | H | N |
| $L_{A4974}$ | $R_{B7}$ | $R_{A34}$ | H | N |
| $L_{A4975}$ | $R_{B7}$ | $R_{A44}$ | H | N |
| $L_{A4976}$ | $R_{B7}$ | $R_{A52}$ | H | N |
| $L_{A4977}$ | $R_{B7}$ | $R_{A53}$ | H | N |
| $L_{A4978}$ | $R_{B7}$ | $R_{A54}$ | H | N |
| $L_{A4979}$ | $R_{B7}$ | $R_{C3}$ | H | N |
| $L_{A4980}$ | $R_{B7}$ | $R_{C4}$ | H | N |
| $L_{A4981}$ | $R_{B7}$ | $R_{C8}$ | H | N |
| $L_{A4982}$ | $R_{B7}$ | H | $R_{B1}$ | N |
| $L_{A4983}$ | $R_{B7}$ | H | $R_{B3}$ | N |
| $L_{A4984}$ | $R_{B7}$ | H | $R_{B4}$ | N |
| $L_{A4985}$ | $R_{B7}$ | H | $R_{B5}$ | N |
| $L_{A4986}$ | $R_{B7}$ | H | $R_{B6}$ | N |
| $L_{A4987}$ | $R_{B7}$ | H | $R_{B7}$ | N |
| $L_{A4988}$ | $R_{B7}$ | H | $R_{B24}$ | N |
| $L_{A4989}$ | $R_{B7}$ | H | $R_{B25}$ | N |
| $L_{A4990}$ | $R_{B7}$ | H | $R_{A3}$ | N |
| $L_{A4991}$ | $R_{B7}$ | H | $R_{A34}$ | N |
| $L_{A4992}$ | $R_{B7}$ | H | $R_{A44}$ | N |
| $L_{A4993}$ | $R_{B7}$ | H | $R_{A52}$ | N |
| $L_{A4994}$ | $R_{B7}$ | H | $R_{A53}$ | N |
| $L_{A4995}$ | $R_{B7}$ | H | $R_{A54}$ | N |
| $L_{A4996}$ | $R_{B7}$ | H | $R_{C3}$ | N |
| $L_{A4997}$ | $R_{B7}$ | H | $R_{C4}$ | N |
| $L_{A4998}$ | $R_{B7}$ | H | $R_{C8}$ | N |
| $L_{A4999}$ | $R_{B7}$ | $R_{B1}$ | $R_{B1}$ | N |
| $L_{A1000}$ | $R_{B7}$ | $R_{B3}$ | $R_{B1}$ | N |
| $L_{A1001}$ | $R_{B7}$ | $R_{B4}$ | $R_{B1}$ | N |
| $L_{A1002}$ | $R_{B7}$ | $R_{B5}$ | $R_{B1}$ | N |
| $L_{A1003}$ | $R_{B7}$ | $R_{B6}$ | $R_{B1}$ | N |
| $L_{A1004}$ | $R_{B7}$ | $R_{B7}$ | $R_{B1}$ | N |
| $L_{A1005}$ | $R_{B7}$ | $R_{B24}$ | $R_{B1}$ | N |
| $L_{A1006}$ | $R_{B7}$ | $R_{B25}$ | $R_{B1}$ | N |
| $L_{A1007}$ | $R_{B7}$ | $R_{A3}$ | $R_{B1}$ | N |
| $L_{A1008}$ | $R_{B7}$ | $R_{A34}$ | $R_{B1}$ | N |
| $L_{A1009}$ | $R_{B7}$ | $R_{A44}$ | $R_{B1}$ | N |
| $L_{A1010}$ | $R_{B7}$ | $R_{A52}$ | $R_{B1}$ | N |
| $L_{A1011}$ | $R_{B7}$ | $R_{A53}$ | $R_{B1}$ | N |
| $L_{A1012}$ | $R_{B7}$ | $R_{A54}$ | $R_{B1}$ | N |
| $L_{A1013}$ | $R_{B7}$ | $R_{C3}$ | $R_{B1}$ | N |
| $L_{A1014}$ | $R_{B7}$ | $R_{C4}$ | $R_{B1}$ | N |
| $L_{A1015}$ | $R_{B7}$ | $R_{C8}$ | $R_{B1}$ | N |
| $L_{A1016}$ | $R_{B7}$ | $R_{B1}$ | $R_{B1}$ | N |
| $L_{A1017}$ | $R_{B7}$ | $R_{B1}$ | $R_{B3}$ | N |
| $L_{A1018}$ | $R_{B7}$ | $R_{B1}$ | $R_{B4}$ | N |
| $L_{A1019}$ | $R_{B7}$ | $R_{B1}$ | $R_{B5}$ | N |
| $L_{A1020}$ | $R_{B7}$ | $R_{B1}$ | $R_{B6}$ | N |
| $L_{A1021}$ | $R_{B7}$ | $R_{B1}$ | $R_{B7}$ | N |
| $L_{A1022}$ | $R_{B7}$ | $R_{B1}$ | $R_{B24}$ | N |
| $L_{A1023}$ | $R_{B7}$ | $R_{B1}$ | $R_{B25}$ | N |
| $L_{A1024}$ | $R_{B7}$ | $R_{B1}$ | $R_{A3}$ | N |
| $L_{A1025}$ | $R_{B7}$ | $R_{B1}$ | $R_{A34}$ | N |
| $L_{A1026}$ | $R_{B7}$ | $R_{B1}$ | $R_{A44}$ | N |
| $L_{A1027}$ | $R_{B7}$ | $R_{B1}$ | $R_{A52}$ | N |
| $L_{A1028}$ | $R_{B7}$ | $R_{B1}$ | $R_{A53}$ | N |
| $L_{A1029}$ | $R_{B7}$ | $R_{B1}$ | $R_{A54}$ | N |
| $L_{A1030}$ | $R_{B7}$ | $R_{B1}$ | $R_{C3}$ | N |
| $L_{A1031}$ | $R_{B7}$ | $R_{B1}$ | $R_{C4}$ | N |
| $L_{A1032}$ | $R_{B7}$ | $R_{B1}$ | $R_{C8}$ | N |
| $L_{A1033}$ | $R_{B9}$ | H | H | N |

-continued

| $L_{Ai}$ | $R^1$ | $R^9$ | $R^{10}$ | Y |
|---|---|---|---|---|
| $L_{A1034}$ | $R_{B9}$ | $R_{B1}$ | H | N |
| $L_{A1035}$ | $R_{B9}$ | $R_{B3}$ | H | N |
| $L_{A1036}$ | $R_{B9}$ | $R_{B4}$ | H | N |
| $L_{A1037}$ | $R_{B9}$ | $R_{B5}$ | H | N |
| $L_{A1038}$ | $R_{B9}$ | $R_{B6}$ | H | N |
| $L_{A1039}$ | $R_{B9}$ | $R_{B7}$ | H | N |
| $L_{A1040}$ | $R_{B9}$ | $R_{B24}$ | H | N |
| $L_{A1041}$ | $R_{B9}$ | $R_{B25}$ | H | N |
| $L_{A1042}$ | $R_{B9}$ | $R_{A3}$ | H | N |
| $L_{A1043}$ | $R_{B9}$ | $R_{A34}$ | H | N |
| $L_{A1044}$ | $R_{B9}$ | $R_{A44}$ | H | N |
| $L_{A1045}$ | $R_{B9}$ | $R_{A52}$ | H | N |
| $L_{A1046}$ | $R_{B9}$ | $R_{A53}$ | H | N |
| $L_{A1047}$ | $R_{B9}$ | $R_{A54}$ | H | N |
| $L_{A1048}$ | $R_{B9}$ | $R_{C3}$ | H | N |
| $L_{A1049}$ | $R_{B9}$ | $R_{C4}$ | H | N |
| $L_{A1050}$ | $R_{B9}$ | $R_{C8}$ | H | N |
| $L_{A1051}$ | $R_{B9}$ | H | $R_{B1}$ | N |
| $L_{A1052}$ | $R_{B9}$ | H | $R_{B3}$ | N |
| $L_{A1053}$ | $R_{B9}$ | H | $R_{B4}$ | N |
| $L_{A1054}$ | $R_{B9}$ | H | $R_{B5}$ | N |
| $L_{A1055}$ | $R_{B9}$ | H | $R_{B6}$ | N |
| $L_{A1056}$ | $R_{B9}$ | H | $R_{B7}$ | N |
| $L_{A1057}$ | $R_{B9}$ | H | $R_{B24}$ | N |
| $L_{A1058}$ | $R_{B9}$ | H | $R_{B25}$ | N |
| $L_{A1059}$ | $R_{B9}$ | H | $R_{A3}$ | N |
| $L_{A1060}$ | $R_{B9}$ | H | $R_{A34}$ | N |
| $L_{A1061}$ | $R_{B9}$ | H | $R_{A44}$ | N |
| $L_{A1062}$ | $R_{B9}$ | H | $R_{A52}$ | N |
| $L_{A1063}$ | $R_{B9}$ | H | $R_{A53}$ | N |
| $L_{A1064}$ | $R_{B9}$ | H | $R_{A54}$ | N |
| $L_{A1065}$ | $R_{B9}$ | H | $R_{C3}$ | N |
| $L_{A1066}$ | $R_{B9}$ | H | $R_{C4}$ | N |
| $L_{A1067}$ | $R_{B9}$ | H | $R_{C8}$ | N |
| $L_{A1068}$ | $R_{B9}$ | $R_{B1}$ | $R_{B1}$ | N |
| $L_{A1069}$ | $R_{B9}$ | $R_{B3}$ | $R_{B1}$ | N |
| $L_{A1070}$ | $R_{B9}$ | $R_{B4}$ | $R_{B1}$ | N |
| $L_{A1071}$ | $R_{B9}$ | $R_{B5}$ | $R_{B1}$ | N |
| $L_{A1072}$ | $R_{B9}$ | $R_{B6}$ | $R_{B1}$ | N |
| $L_{A1073}$ | $R_{B9}$ | $R_{B7}$ | $R_{B1}$ | N |
| $L_{A1074}$ | $R_{B9}$ | $R_{B24}$ | $R_{B1}$ | N |
| $L_{A1075}$ | $R_{B9}$ | $R_{B25}$ | $R_{B1}$ | N |
| $L_{A1076}$ | $R_{B9}$ | $R_{A3}$ | $R_{B1}$ | N |
| $L_{A1077}$ | $R_{B9}$ | $R_{A34}$ | $R_{B1}$ | N |
| $L_{A1078}$ | $R_{B9}$ | $R_{A44}$ | $R_{B1}$ | N |
| $L_{A1079}$ | $R_{B9}$ | $R_{A52}$ | $R_{B1}$ | N |
| $L_{A1080}$ | $R_{B9}$ | $R_{A53}$ | $R_{B1}$ | N |
| $L_{A1081}$ | $R_{B9}$ | $R_{A54}$ | $R_{B1}$ | N |
| $L_{A1082}$ | $R_{B9}$ | $R_{C3}$ | $R_{B1}$ | N |
| $L_{A1083}$ | $R_{B9}$ | $R_{C4}$ | $R_{B1}$ | N |
| $L_{A1084}$ | $R_{B9}$ | $R_{C8}$ | $R_{B1}$ | N |
| $L_{A1085}$ | $R_{B9}$ | $R_{B1}$ | $R_{B1}$ | N |
| $L_{A1086}$ | $R_{B9}$ | $R_{B1}$ | $R_{B3}$ | N |
| $L_{A1087}$ | $R_{B9}$ | $R_{B1}$ | $R_{B4}$ | N |
| $L_{A1088}$ | $R_{B9}$ | $R_{B1}$ | $R_{B5}$ | N |
| $L_{A1089}$ | $R_{B9}$ | $R_{B1}$ | $R_{B6}$ | N |
| $L_{A1090}$ | $R_{B9}$ | $R_{B1}$ | $R_{B7}$ | N |
| $L_{A1091}$ | $R_{B9}$ | $R_{B1}$ | $R_{B24}$ | N |
| $L_{A1092}$ | $R_{B9}$ | $R_{B1}$ | $R_{B25}$ | N |
| $L_{A1093}$ | $R_{B9}$ | $R_{B1}$ | $R_{A3}$ | N |
| $L_{A1094}$ | $R_{B9}$ | $R_{B1}$ | $R_{A34}$ | N |
| $L_{A1095}$ | $R_{B9}$ | $R_{B1}$ | $R_{A44}$ | N |
| $L_{A1096}$ | $R_{B9}$ | $R_{B1}$ | $R_{A52}$ | N |
| $L_{A1097}$ | $R_{B9}$ | $R_{B1}$ | $R_{A53}$ | N |
| $L_{A1098}$ | $R_{B9}$ | $R_{B1}$ | $R_{A54}$ | N |
| $L_{A1099}$ | $R_{B9}$ | $R_{B1}$ | $R_{C3}$ | N |
| $L_{A1100}$ | $R_{B9}$ | $R_{B1}$ | $R_{C4}$ | N |
| $L_{A1101}$ | $R_{B9}$ | $R_{B1}$ | $R_{C8}$ | N |
| $L_{A1102}$ | $R_{B44}$ | H | H | N |
| $L_{A1103}$ | $R_{B44}$ | $R_{B1}$ | H | N |
| $L_{A1104}$ | $R_{B44}$ | $R_{B3}$ | H | N |
| $L_{A1105}$ | $R_{B44}$ | $R_{B4}$ | H | N |
| $L_{A1106}$ | $R_{B44}$ | $R_{B5}$ | H | N |
| $L_{A1107}$ | $R_{B44}$ | $R_{B6}$ | H | N |
| $L_{A1108}$ | $R_{B44}$ | $R_{B7}$ | H | N |
| $L_{A1109}$ | $R_{B44}$ | $R_{B24}$ | H | N |
| $L_{A1110}$ | $R_{B44}$ | $R_{B25}$ | H | N |

-continued

| $L_{Ai}$ | $R^1$ | $R^9$ | $R^{10}$ | Y |
|---|---|---|---|---|
| $L_{A1111}$ | $R_{B44}$ | $R_{A3}$ | H | N |
| $L_{A1112}$ | $R_{B44}$ | $R_{A34}$ | H | N |
| $L_{A1113}$ | $R_{B44}$ | $R_{A44}$ | H | N |
| $L_{A1114}$ | $R_{B44}$ | $R_{A52}$ | H | N |
| $L_{A1115}$ | $R_{B44}$ | $R_{A53}$ | H | N |
| $L_{A1116}$ | $R_{B44}$ | $R_{A54}$ | H | N |
| $L_{A1117}$ | $R_{B44}$ | $R_{C3}$ | H | N |
| $L_{A1118}$ | $R_{B44}$ | $R_{C4}$ | H | N |
| $L_{A1119}$ | $R_{B44}$ | $R_{C8}$ | H | N |
| $L_{A1120}$ | $R_{B44}$ | H | $R_{B1}$ | N |
| $L_{A1121}$ | $R_{B44}$ | H | $R_{B3}$ | N |
| $L_{A1122}$ | $R_{B44}$ | H | $R_{B4}$ | N |
| $L_{A1123}$ | $R_{B44}$ | H | $R_{B5}$ | N |
| $L_{A1124}$ | $R_{B44}$ | H | $R_{B6}$ | N |
| $L_{A1125}$ | $R_{B44}$ | H | $R_{B7}$ | N |
| $L_{A1126}$ | $R_{B44}$ | H | $R_{B24}$ | N |
| $L_{A1127}$ | $R_{B44}$ | H | $R_{B25}$ | N |
| $L_{A1128}$ | $R_{B44}$ | H | $R_{A3}$ | N |
| $L_{A1129}$ | $R_{B44}$ | H | $R_{A34}$ | N |
| $L_{A1130}$ | $R_{B44}$ | H | $R_{A44}$ | N |
| $L_{A1131}$ | $R_{B44}$ | H | $R_{A52}$ | N |
| $L_{A1132}$ | $R_{B44}$ | H | $R_{A53}$ | N |
| $L_{A1133}$ | $R_{B44}$ | H | $R_{A54}$ | N |
| $L_{A1134}$ | $R_{B44}$ | H | $R_{C3}$ | N |
| $L_{A1135}$ | $R_{B44}$ | H | $R_{C4}$ | N |
| $L_{A1136}$ | $R_{B44}$ | H | $R_{C8}$ | N |
| $L_{A1137}$ | $R_{B44}$ | $R_{B1}$ | $R_{B1}$ | N |
| $L_{A1138}$ | $R_{B44}$ | $R_{B3}$ | $R_{B1}$ | N |
| $L_{A1139}$ | $R_{B44}$ | $R_{B4}$ | $R_{B1}$ | N |
| $L_{A1140}$ | $R_{B44}$ | $R_{B5}$ | $R_{B1}$ | N |
| $L_{A1141}$ | $R_{B44}$ | $R_{B6}$ | $R_{B1}$ | N |
| $L_{A1142}$ | $R_{B44}$ | $R_{B7}$ | $R_{B1}$ | N |
| $L_{A1143}$ | $R_{B44}$ | $R_{B24}$ | $R_{B1}$ | N |
| $L_{A1144}$ | $R_{B44}$ | $R_{B25}$ | $R_{B1}$ | N |
| $L_{A1145}$ | $R_{B44}$ | $R_{A3}$ | $R_{B1}$ | N |
| $L_{A1146}$ | $R_{B44}$ | $R_{A34}$ | $R_{B1}$ | N |
| $L_{A1147}$ | $R_{B44}$ | $R_{A44}$ | $R_{B1}$ | N |
| $L_{A1148}$ | $R_{B44}$ | $R_{A52}$ | $R_{B1}$ | N |
| $L_{A1149}$ | $R_{B44}$ | $R_{A53}$ | $R_{B1}$ | N |
| $L_{A1150}$ | $R_{B44}$ | $R_{A54}$ | $R_{B1}$ | N |
| $L_{A1151}$ | $R_{B44}$ | $R_{C3}$ | $R_{B1}$ | N |
| $L_{A1152}$ | $R_{B44}$ | $R_{C4}$ | $R_{B1}$ | N |
| $L_{A1153}$ | $R_{B44}$ | $R_{C8}$ | $R_{B1}$ | N |
| $L_{A1154}$ | $R_{B44}$ | $R_{B1}$ | $R_{B1}$ | N |
| $L_{A1155}$ | $R_{B44}$ | $R_{B1}$ | $R_{B3}$ | N |
| $L_{A1156}$ | $R_{B44}$ | $R_{B1}$ | $R_{B4}$ | N |
| $L_{A1157}$ | $R_{B44}$ | $R_{B1}$ | $R_{B5}$ | N |
| $L_{A1158}$ | $R_{B44}$ | $R_{B1}$ | $R_{B6}$ | N |
| $L_{A1159}$ | $R_{B44}$ | $R_{B1}$ | $R_{B7}$ | N |
| $L_{A1160}$ | $R_{B44}$ | $R_{B1}$ | $R_{B24}$ | N |
| $L_{A1161}$ | $R_{B44}$ | $R_{B1}$ | $R_{B25}$ | N |
| $L_{A1162}$ | $R_{B44}$ | $R_{B1}$ | $R_{A3}$ | N |
| $L_{A1163}$ | $R_{B44}$ | $R_{B1}$ | $R_{A34}$ | N |
| $L_{A1164}$ | $R_{B44}$ | $R_{B1}$ | $R_{A44}$ | N |
| $L_{A1165}$ | $R_{B44}$ | $R_{B1}$ | $R_{A52}$ | N |
| $L_{A1166}$ | $R_{B44}$ | $R_{B1}$ | $R_{A53}$ | N |
| $L_{A1167}$ | $R_{B44}$ | $R_{B1}$ | $R_{A54}$ | N |
| $L_{A1168}$ | $R_{B44}$ | $R_{B1}$ | $R_{C3}$ | N |
| $L_{A1169}$ | $R_{B44}$ | $R_{B1}$ | $R_{C4}$ | N |
| $L_{A1170}$ | $R_{B44}$ | $R_{B1}$ | $R_{C8}$ | N |

In some embodiments of the compound, the first ligand $L_A$ is selected from the group consisting of ligands XVIII-$L_{Ai}$ that are based on a structure of Formula XVIII

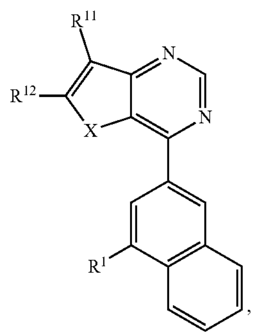

ligands XIX-$L_{Ai}$ that are based on a structure of Formula XIX

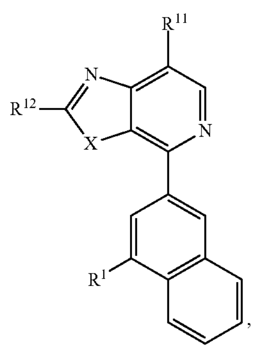

ligands XX-$L_{Ai}$ that are based on a structure of Formula XX

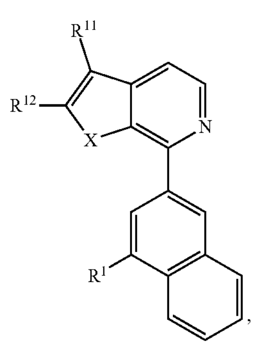

ligands XXI-$L_{Ai}$ that are based on a structure of Formula XXI

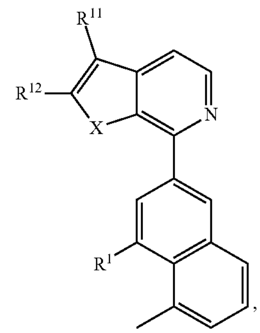

ligands XXII-$L_{Ai}$ that are based on a structure of Formula XXII

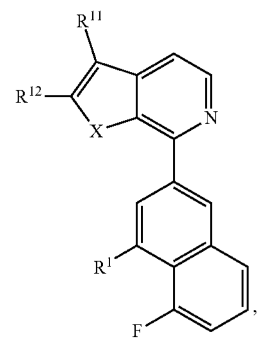

ligands XXIII-$L_{Ai}$ that are based on a structure of Formula XXIII

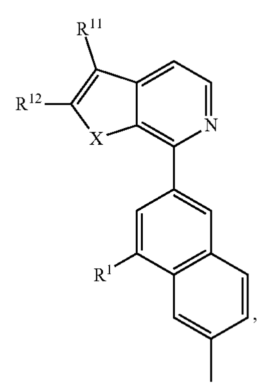

ligands XXIV-$L_{Ai}$ that are based on a structure of Formula XXIV

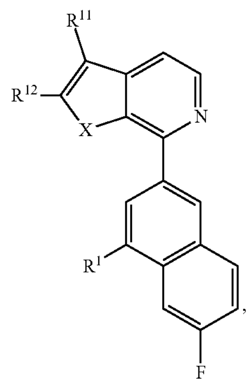

ligands XXV-$L_{Ai}$ that are based on a structure of Formula XXV

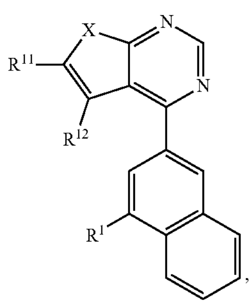

ligands XXVI-$L_{Ai}$ that are based on a structure of Formula XXVI

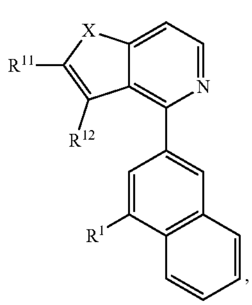

ligands XXVII-$L_{Ai}$ that are based on a structure of Formula XXVII

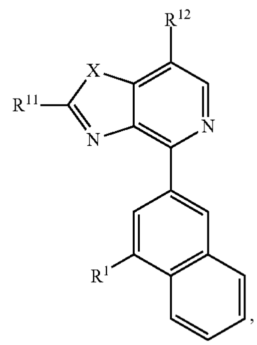

ligands XXVIII-$L_{Ai}$ that are based on a structure of Formula XXVIII

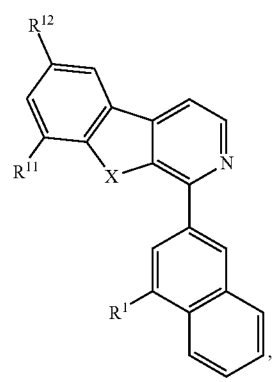

ligands XXIX-$L_{Ai}$ that are based on a structure of Formula XXIX

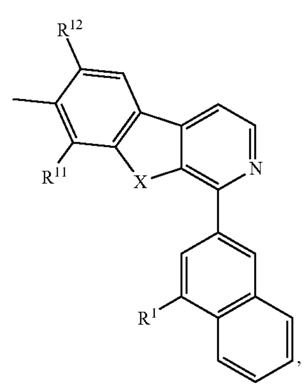

ligands XXX-$L_{Ai}$ that are based on a structure of Formula XXX

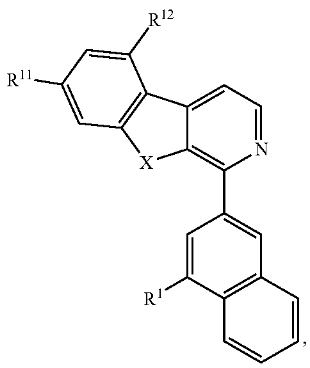

ligands XXXI-$L_{Ai}$ that are based on a structure of Formula XXXI

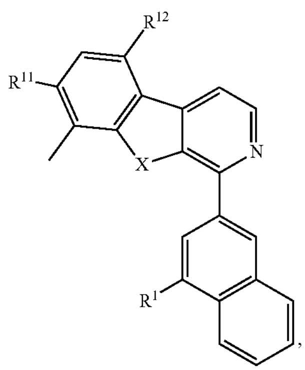

ligands XXXII-$L_{Ai}$ that are based on a structure of Formula XXXII

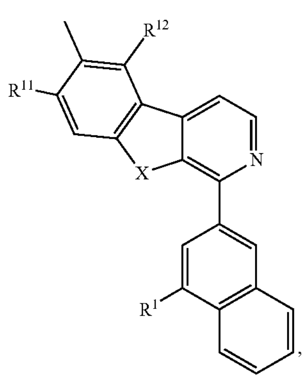

ligands XXXIII-$L_{Ai}$ that are based on a structure of Formula XXXIII

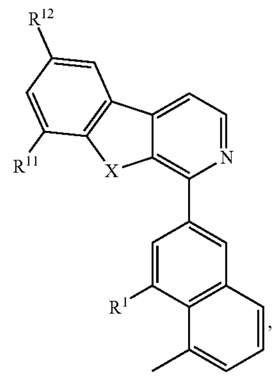

ligands XXXIV-$L_{Ai}$ that are based on a structure of Formula XXXIV

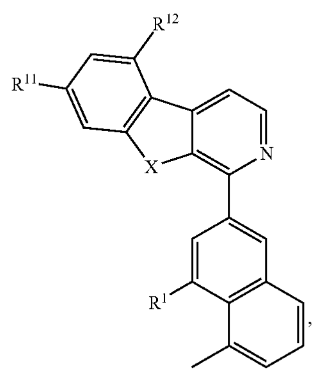

ligands XXXV-$L_{Ai}$ that are based on a structure of Formula XXXV

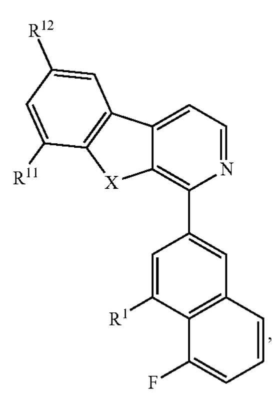

ligands XXXVI-$L_{Ai}$ that are based on a structure of Formula XXX VI

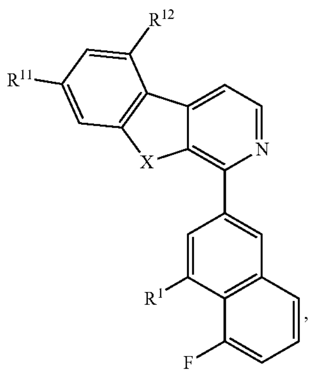

ligands XXXVII-$L_{Ai}$ that are based on a structure of Formula XXXVII

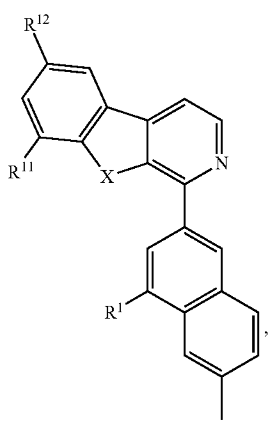

ligands XXXVIII-$L_{Ai}$ that are based on a structure of Formula XXXVIII

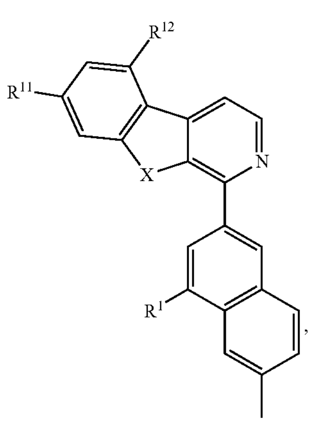

ligands XXXIX-$L_{Ai}$ that are based on a structure of Formula XXXIX

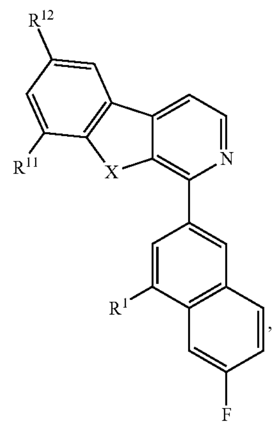

ligands XL-$L_{Ai}$ that are based on a structure of Formula XL

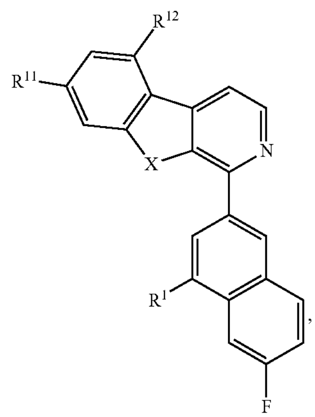

ligands XLI-$L_{Ai}$ that are based on a structure of Formula XLI

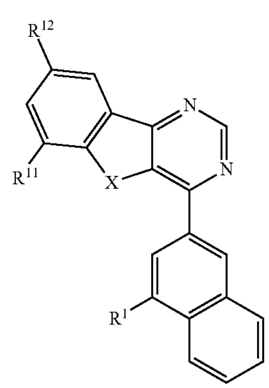

ligands XLII-$L_{Ai}$ that are based on a structure of Formula XLII

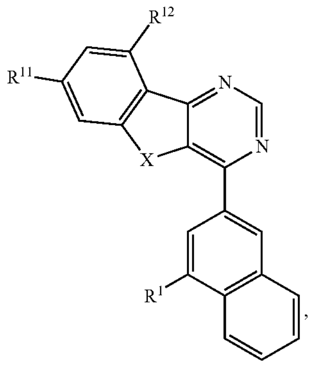

ligands XLIII-$L_{Ai}$ that are based on a structure of Formula XLIII

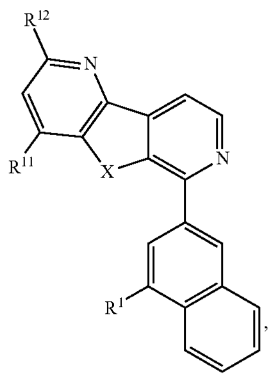

ligands XLIV-$L_{Ai}$ that are based on a structure of Formula XLIV

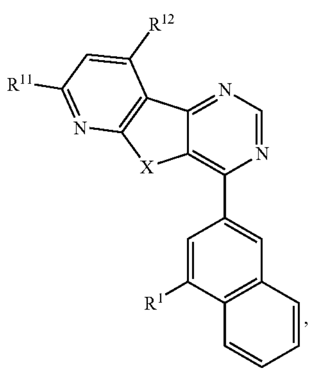

ligands LXII-$L_{Ai}$ that are based on a structure of Formula LXII

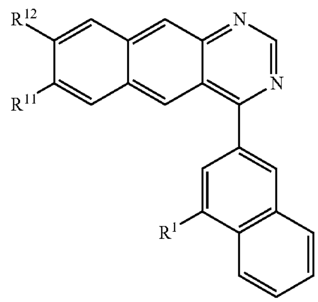

ligands LXIII-$L_{Ai}$ that are based on a structure of Formula LXIII

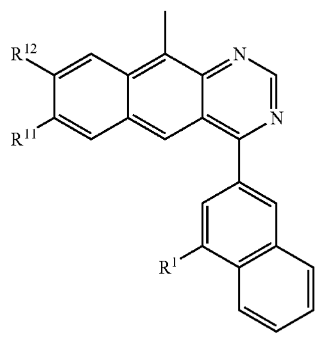

ligands LXIV-$L_{Ai}$ that are based on a structure of Formula LXIV

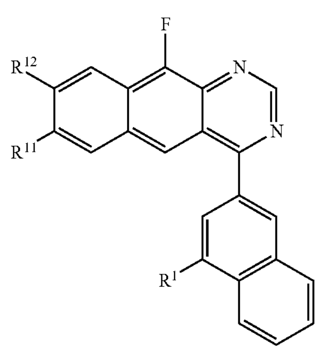

ligands LXV-$L_{Ai}$ that are based on a structure of Formula LXV

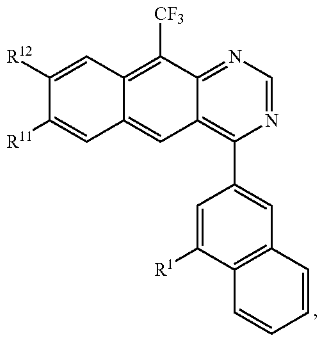

wherein i is an integer from 1171 to 1584 and for each i, $R^1$, $R^{11}$, and $R^{12}$ in the formulas XVIII through XLIV and Formulas LXII, LXIII, LXIV, and LXV are defined as follows:

| $L_{Ai}$ | $R^1$ | $R^{11}$ | $R^{12}$ | $L_{Ai}$ | $R^1$ | $R^{11}$ | $R^{12}$ | $L_{Ai}$ | $R^1$ | $R^{11}$ | $R^{12}$ |
|---|---|---|---|---|---|---|---|---|---|---|---|
| $L_{A1171}$ | $R_{B3}$ | H | H | $L_{A1309}$ | $R_{B7}$ | H | H | $L_{A1447}$ | $R_{B15}$ | H | H |
| $L_{A1172}$ | $R_{B3}$ | $R_{B1}$ | H | $L_{A1310}$ | $R_{B7}$ | $R_{B1}$ | H | $L_{A1448}$ | $R_{B15}$ | $R_{B1}$ | H |
| $L_{A1173}$ | $R_{B3}$ | $R_{B3}$ | H | $L_{A1311}$ | $R_{B7}$ | $R_{B3}$ | H | $L_{A1449}$ | $R_{B15}$ | $R_{B3}$ | H |
| $L_{A1174}$ | $R_{B3}$ | $R_{B4}$ | H | $L_{A1312}$ | $R_{B7}$ | $R_{B4}$ | H | $L_{A1450}$ | $R_{B15}$ | $R_{B4}$ | H |
| $L_{A1175}$ | $R_{B3}$ | $R_{B5}$ | H | $L_{A1313}$ | $R_{B7}$ | $R_{B5}$ | H | $L_{A1451}$ | $R_{B15}$ | $R_{B5}$ | H |
| $L_{A1176}$ | $R_{B3}$ | $R_{B6}$ | H | $L_{A1314}$ | $R_{B7}$ | $R_{B6}$ | H | $L_{A1452}$ | $R_{B15}$ | $R_{B6}$ | H |
| $L_{A1177}$ | $R_{B3}$ | $R_{B7}$ | H | $L_{A1315}$ | $R_{B7}$ | $R_{B7}$ | H | $L_{A1453}$ | $R_{B15}$ | $R_{B7}$ | H |
| $L_{A1178}$ | $R_{B3}$ | $R_{B24}$ | H | $L_{A1316}$ | $R_{B7}$ | $R_{B24}$ | H | $L_{A1454}$ | $R_{B15}$ | $R_{B24}$ | H |
| $L_{A1179}$ | $R_{B3}$ | $R_{B25}$ | H | $L_{A1317}$ | $R_{B7}$ | $R_{B25}$ | H | $L_{A1455}$ | $R_{B15}$ | $R_{B25}$ | H |
| $L_{A1180}$ | $R_{B3}$ | $R_{A3}$ | H | $L_{A1318}$ | $R_{B7}$ | $R_{A3}$ | H | $L_{A1456}$ | $R_{B15}$ | $R_{A3}$ | H |
| $L_{A1181}$ | $R_{B3}$ | $R_{A34}$ | H | $L_{A1319}$ | $R_{B7}$ | $R_{A34}$ | H | $L_{A1457}$ | $R_{B15}$ | $R_{A34}$ | H |
| $L_{A1182}$ | $R_{B3}$ | $R_{A44}$ | H | $L_{A1320}$ | $R_{B7}$ | $R_{A44}$ | H | $L_{A1458}$ | $R_{B15}$ | $R_{A44}$ | H |
| $L_{A1183}$ | $R_{B3}$ | $R_{A52}$ | H | $L_{A1321}$ | $R_{B7}$ | $R_{A52}$ | H | $L_{A1459}$ | $R_{B15}$ | $R_{A52}$ | H |
| $L_{A1184}$ | $R_{B3}$ | $R_{A53}$ | H | $L_{A1322}$ | $R_{B7}$ | $R_{A53}$ | H | $L_{A1460}$ | $R_{B15}$ | $R_{A53}$ | H |
| $L_{A1185}$ | $R_{B3}$ | $R_{A54}$ | H | $L_{A1323}$ | $R_{B7}$ | $R_{A54}$ | H | $L_{A1461}$ | $R_{B15}$ | $R_{A54}$ | H |
| $L_{A1186}$ | $R_{B3}$ | $R_{C3}$ | H | $L_{A1324}$ | $R_{B7}$ | $R_{C3}$ | H | $L_{A1462}$ | $R_{B15}$ | $R_{C3}$ | H |
| $L_{A1187}$ | $R_{B3}$ | $R_{C4}$ | H | $L_{A1325}$ | $R_{B7}$ | $R_{C4}$ | H | $L_{A1463}$ | $R_{B15}$ | $R_{C4}$ | H |
| $L_{A1188}$ | $R_{B3}$ | $R_{C8}$ | H | $L_{A1326}$ | $R_{B7}$ | $R_{C8}$ | H | $L_{A1464}$ | $R_{B15}$ | $R_{C8}$ | H |
| $L_{A1189}$ | $R_{B3}$ | H | $R_{B1}$ | $L_{A1327}$ | $R_{B7}$ | H | $R_{B1}$ | $L_{A1465}$ | $R_{B15}$ | H | $R_{B1}$ |
| $L_{A1190}$ | $R_{B3}$ | H | $R_{B3}$ | $L_{A1328}$ | $R_{B7}$ | H | $R_{B3}$ | $L_{A1466}$ | $R_{B15}$ | H | $R_{B3}$ |
| $L_{A1191}$ | $R_{B3}$ | H | $R_{B4}$ | $L_{A1329}$ | $R_{B7}$ | H | $R_{B4}$ | $L_{A1467}$ | $R_{B15}$ | H | $R_{B4}$ |
| $L_{A1192}$ | $R_{B3}$ | H | $R_{B5}$ | $L_{A1330}$ | $R_{B7}$ | H | $R_{B5}$ | $L_{A1468}$ | $R_{B15}$ | H | $R_{B5}$ |
| $L_{A1193}$ | $R_{B3}$ | H | $R_{B6}$ | $L_{A1331}$ | $R_{B7}$ | H | $R_{B6}$ | $L_{A1469}$ | $R_{B15}$ | H | $R_{B6}$ |
| $L_{A1194}$ | $R_{B3}$ | H | $R_{B7}$ | $L_{A1332}$ | $R_{B7}$ | H | $R_{B7}$ | $L_{A1470}$ | $R_{B15}$ | H | $R_{B7}$ |
| $L_{A1195}$ | $R_{B3}$ | H | $R_{B24}$ | $L_{A1333}$ | $R_{B7}$ | H | $R_{B24}$ | $L_{A1471}$ | $R_{B15}$ | H | $R_{B24}$ |
| $L_{A1196}$ | $R_{B3}$ | H | $R_{B25}$ | $L_{A1334}$ | $R_{B7}$ | H | $R_{B25}$ | $L_{A1472}$ | $R_{B15}$ | H | $R_{B25}$ |
| $L_{A1197}$ | $R_{B3}$ | H | $R_{A3}$ | $L_{A1335}$ | $R_{B7}$ | H | $R_{A3}$ | $L_{A1473}$ | $R_{B15}$ | H | $R_{A3}$ |
| $L_{A1198}$ | $R_{B3}$ | H | $R_{A34}$ | $L_{A1336}$ | $R_{B7}$ | H | $R_{A34}$ | $L_{A1474}$ | $R_{B15}$ | H | $R_{A34}$ |
| $L_{A1199}$ | $R_{B3}$ | H | $R_{A44}$ | $L_{A1337}$ | $R_{B7}$ | H | $R_{A44}$ | $L_{A1475}$ | $R_{B15}$ | H | $R_{A44}$ |
| $L_{A1200}$ | $R_{B3}$ | H | $R_{A52}$ | $L_{A1338}$ | $R_{B7}$ | H | $R_{A52}$ | $L_{A1476}$ | $R_{B15}$ | H | $R_{A52}$ |
| $L_{A1201}$ | $R_{B3}$ | H | $R_{A53}$ | $L_{A1339}$ | $R_{B7}$ | H | $R_{A53}$ | $L_{A1477}$ | $R_{B15}$ | H | $R_{A53}$ |
| $L_{A1202}$ | $R_{B3}$ | H | $R_{A54}$ | $L_{A1340}$ | $R_{B7}$ | H | $R_{A54}$ | $L_{A1478}$ | $R_{B15}$ | H | $R_{A54}$ |
| $L_{A1203}$ | $R_{B3}$ | H | $R_{C3}$ | $L_{A1341}$ | $R_{B7}$ | H | $R_{C3}$ | $L_{A1479}$ | $R_{B15}$ | H | $R_{C3}$ |
| $L_{A1204}$ | $R_{B3}$ | H | $R_{C4}$ | $L_{A1342}$ | $R_{B7}$ | H | $R_{C4}$ | $L_{A1480}$ | $R_{B15}$ | H | $R_{C4}$ |
| $L_{A1205}$ | $R_{B3}$ | H | $R_{C8}$ | $L_{A1343}$ | $R_{B7}$ | H | $R_{C8}$ | $L_{A1481}$ | $R_{B15}$ | H | $R_{C8}$ |
| $L_{A1206}$ | $R_{B3}$ | $R_{B1}$ | $R_{B1}$ | $L_{A1344}$ | $R_{B7}$ | $R_{B1}$ | $R_{B1}$ | $L_{A1482}$ | $R_{B15}$ | $R_{B1}$ | $R_{B1}$ |
| $L_{A1207}$ | $R_{B3}$ | $R_{B3}$ | $R_{B1}$ | $L_{A1345}$ | $R_{B7}$ | $R_{B3}$ | $R_{B1}$ | $L_{A1483}$ | $R_{B15}$ | $R_{B3}$ | $R_{B1}$ |
| $L_{A1208}$ | $R_{B3}$ | $R_{B4}$ | $R_{B1}$ | $L_{A1346}$ | $R_{B7}$ | $R_{B4}$ | $R_{B1}$ | $L_{A1484}$ | $R_{B15}$ | $R_{B4}$ | $R_{B1}$ |
| $L_{A1209}$ | $R_{B3}$ | $R_{B5}$ | $R_{B1}$ | $L_{A1347}$ | $R_{B7}$ | $R_{B5}$ | $R_{B1}$ | $L_{A1485}$ | $R_{B15}$ | $R_{B5}$ | $R_{B1}$ |
| $L_{A1210}$ | $R_{B3}$ | $R_{B6}$ | $R_{B1}$ | $L_{A1348}$ | $R_{B7}$ | $R_{B6}$ | $R_{B1}$ | $L_{A1486}$ | $R_{B15}$ | $R_{B6}$ | $R_{B1}$ |
| $L_{A1211}$ | $R_{B3}$ | $R_{B7}$ | $R_{B1}$ | $L_{A1349}$ | $R_{B7}$ | $R_{B7}$ | $R_{B1}$ | $L_{A1487}$ | $R_{B15}$ | $R_{B7}$ | $R_{B1}$ |
| $L_{A1212}$ | $R_{B3}$ | $R_{B24}$ | $R_{B1}$ | $L_{A1350}$ | $R_{B7}$ | $R_{B24}$ | $R_{B1}$ | $L_{A1488}$ | $R_{B15}$ | $R_{B24}$ | $R_{B1}$ |
| $L_{A1213}$ | $R_{B3}$ | $R_{B25}$ | $R_{B1}$ | $L_{A1351}$ | $R_{B7}$ | $R_{B25}$ | $R_{B1}$ | $L_{A1489}$ | $R_{B15}$ | $R_{B25}$ | $R_{B1}$ |
| $L_{A1214}$ | $R_{B3}$ | $R_{A3}$ | $R_{B1}$ | $L_{A1352}$ | $R_{B7}$ | $R_{A3}$ | $R_{B1}$ | $L_{A1490}$ | $R_{B15}$ | $R_{A3}$ | $R_{B1}$ |
| $L_{A1215}$ | $R_{B3}$ | $R_{A34}$ | $R_{B1}$ | $L_{A1353}$ | $R_{B7}$ | $R_{A34}$ | $R_{B1}$ | $L_{A1491}$ | $R_{B15}$ | $R_{A34}$ | $R_{B1}$ |
| $L_{A1216}$ | $R_{B3}$ | $R_{A44}$ | $R_{B1}$ | $L_{A1354}$ | $R_{B7}$ | $R_{A44}$ | $R_{B1}$ | $L_{A1492}$ | $R_{B15}$ | $R_{A44}$ | $R_{B1}$ |
| $L_{A1217}$ | $R_{B3}$ | $R_{A52}$ | $R_{B1}$ | $L_{A1355}$ | $R_{B7}$ | $R_{A52}$ | $R_{B1}$ | $L_{A1493}$ | $R_{B15}$ | $R_{A52}$ | $R_{B1}$ |
| $L_{A1218}$ | $R_{B3}$ | $R_{A53}$ | $R_{B1}$ | $L_{A1356}$ | $R_{B7}$ | $R_{A53}$ | $R_{B1}$ | $L_{A1494}$ | $R_{B15}$ | $R_{A53}$ | $R_{B1}$ |
| $L_{A1219}$ | $R_{B3}$ | $R_{A54}$ | $R_{B1}$ | $L_{A1357}$ | $R_{B7}$ | $R_{A54}$ | $R_{B1}$ | $L_{A1495}$ | $R_{B15}$ | $R_{A54}$ | $R_{B1}$ |
| $L_{A1220}$ | $R_{B3}$ | $R_{C3}$ | $R_{B1}$ | $L_{A1358}$ | $R_{B7}$ | $R_{C3}$ | $R_{B1}$ | $L_{A1496}$ | $R_{B15}$ | $R_{C3}$ | $R_{B1}$ |
| $L_{A1221}$ | $R_{B3}$ | $R_{C4}$ | $R_{B1}$ | $L_{A1359}$ | $R_{B7}$ | $R_{C4}$ | $R_{B1}$ | $L_{A1497}$ | $R_{B15}$ | $R_{C4}$ | $R_{B1}$ |

-continued

| $L_{Ai}$ | $R^1$ | $R^{11}$ | $R^{12}$ | $L_{Ai}$ | $R^1$ | $R^{11}$ | $R^{12}$ | $L_{Ai}$ | $R^1$ | $R^{11}$ | $R^{12}$ |
|---|---|---|---|---|---|---|---|---|---|---|---|
| $L_{A1222}$ | $R_{B3}$ | $R_{C8}$ | $R_{B1}$ | $L_{A1360}$ | $R_{B7}$ | $R_{C8}$ | $R_{B1}$ | $L_{A1498}$ | $R_{B15}$ | $R_{C8}$ | $R_{B1}$ |
| $L_{A1223}$ | $R_{B3}$ | $R_{B1}$ | $R_{B1}$ | $L_{A1361}$ | $R_{B7}$ | $R_{B1}$ | $R_{B1}$ | $L_{A1499}$ | $R_{B15}$ | $R_{B1}$ | $R_{B1}$ |
| $L_{A1224}$ | $R_{B3}$ | $R_{B1}$ | $R_{B3}$ | $L_{A1362}$ | $R_{B7}$ | $R_{B1}$ | $R_{B3}$ | $L_{A1500}$ | $R_{B15}$ | $R_{B1}$ | $R_{B3}$ |
| $L_{A1225}$ | $R_{B3}$ | $R_{B1}$ | $R_{B4}$ | $L_{A1363}$ | $R_{B7}$ | $R_{B1}$ | $R_{B4}$ | $L_{A1501}$ | $R_{B15}$ | $R_{B1}$ | $R_{B4}$ |
| $L_{A1226}$ | $R_{B3}$ | $R_{B1}$ | $R_{B5}$ | $L_{A1364}$ | $R_{B7}$ | $R_{B1}$ | $R_{B5}$ | $L_{A1502}$ | $R_{B15}$ | $R_{B1}$ | $R_{B5}$ |
| $L_{A1227}$ | $R_{B3}$ | $R_{B1}$ | $R_{B6}$ | $L_{A1365}$ | $R_{B7}$ | $R_{B1}$ | $R_{B6}$ | $L_{A1503}$ | $R_{B15}$ | $R_{B1}$ | $R_{B6}$ |
| $L_{A1228}$ | $R_{B3}$ | $R_{B1}$ | $R_{B7}$ | $L_{A1366}$ | $R_{B7}$ | $R_{B1}$ | $R_{B7}$ | $L_{A1504}$ | $R_{B15}$ | $R_{B1}$ | $R_{B7}$ |
| $L_{A1229}$ | $R_{B3}$ | $R_{B1}$ | $R_{B24}$ | $L_{A1367}$ | $R_{B7}$ | $R_{B1}$ | $R_{B24}$ | $L_{A1505}$ | $R_{B15}$ | $R_{B1}$ | $R_{B24}$ |
| $L_{A1230}$ | $R_{B3}$ | $R_{B1}$ | $R_{B25}$ | $L_{A1368}$ | $R_{B7}$ | $R_{B1}$ | $R_{B25}$ | $L_{A1506}$ | $R_{B15}$ | $R_{B1}$ | $R_{B25}$ |
| $L_{A1231}$ | $R_{B3}$ | $R_{B1}$ | $R_{A3}$ | $L_{A1369}$ | $R_{B7}$ | $R_{B1}$ | $R_{A3}$ | $L_{A1507}$ | $R_{B15}$ | $R_{B1}$ | $R_{A3}$ |
| $L_{A1232}$ | $R_{B3}$ | $R_{B1}$ | $R_{A34}$ | $L_{A1370}$ | $R_{B7}$ | $R_{B1}$ | $R_{A34}$ | $L_{A1508}$ | $R_{B15}$ | $R_{B1}$ | $R_{A34}$ |
| $L_{A1233}$ | $R_{B3}$ | $R_{B1}$ | $R_{A44}$ | $L_{A1371}$ | $R_{B7}$ | $R_{B1}$ | $R_{A44}$ | $L_{A1509}$ | $R_{B15}$ | $R_{B1}$ | $R_{A44}$ |
| $L_{A1234}$ | $R_{B3}$ | $R_{B1}$ | $R_{A52}$ | $L_{A1372}$ | $R_{B7}$ | $R_{B1}$ | $R_{A52}$ | $L_{A1510}$ | $R_{B15}$ | $R_{B1}$ | $R_{A52}$ |
| $L_{A1235}$ | $R_{B3}$ | $R_{B1}$ | $R_{A53}$ | $L_{A1373}$ | $R_{B7}$ | $R_{B1}$ | $R_{A53}$ | $L_{A1511}$ | $R_{B15}$ | $R_{B1}$ | $R_{A53}$ |
| $L_{A1236}$ | $R_{B3}$ | $R_{B1}$ | $R_{A54}$ | $L_{A1374}$ | $R_{B7}$ | $R_{B1}$ | $R_{A54}$ | $L_{A1512}$ | $R_{B15}$ | $R_{B1}$ | $R_{A54}$ |
| $L_{A1237}$ | $R_{B3}$ | $R_{B1}$ | $R_{C3}$ | $L_{A1375}$ | $R_{B7}$ | $R_{B1}$ | $R_{C3}$ | $L_{A1513}$ | $R_{B15}$ | $R_{B1}$ | $R_{C3}$ |
| $L_{A1238}$ | $R_{B3}$ | $R_{B1}$ | $R_{C4}$ | $L_{A1376}$ | $R_{B7}$ | $R_{B1}$ | $R_{C4}$ | $L_{A1514}$ | $R_{B15}$ | $R_{B1}$ | $R_{C4}$ |
| $L_{A1239}$ | $R_{B3}$ | $R_{B1}$ | $R_{C8}$ | $L_{A1377}$ | $R_{B7}$ | $R_{B1}$ | $R_{C8}$ | $L_{A1515}$ | $R_{B15}$ | $R_{B1}$ | $R_{C8}$ |
| $L_{A1240}$ | $R_{B6}$ | H | H | $L_{A1378}$ | $R_{B9}$ | H | H | $L_{A1516}$ | $R_{A44}$ | H | H |
| $L_{A1241}$ | $R_{B6}$ | $R_{B1}$ | H | $L_{A1379}$ | $R_{B9}$ | $R_{B1}$ | H | $L_{A1517}$ | $R_{A44}$ | $R_{B1}$ | H |
| $L_{A1242}$ | $R_{B6}$ | $R_{B3}$ | H | $L_{A1380}$ | $R_{B9}$ | $R_{B3}$ | H | $L_{A1518}$ | $R_{A44}$ | $R_{B3}$ | H |
| $L_{A1243}$ | $R_{B6}$ | $R_{B4}$ | H | $L_{A1381}$ | $R_{B9}$ | $R_{B4}$ | H | $L_{A1519}$ | $R_{A44}$ | $R_{B4}$ | H |
| $L_{A1244}$ | $R_{B6}$ | $R_{B5}$ | H | $L_{A1382}$ | $R_{B9}$ | $R_{B5}$ | H | $L_{A1520}$ | $R_{A44}$ | $R_{B5}$ | H |
| $L_{A1245}$ | $R_{B6}$ | $R_{B6}$ | H | $L_{A1383}$ | $R_{B9}$ | $R_{B6}$ | H | $L_{A1521}$ | $R_{A44}$ | $R_{B6}$ | H |
| $L_{A1246}$ | $R_{B6}$ | $R_{B7}$ | H | $L_{A1384}$ | $R_{B9}$ | $R_{B7}$ | H | $L_{A1522}$ | $R_{A44}$ | $R_{B7}$ | H |
| $L_{A1247}$ | $R_{B6}$ | $R_{B24}$ | H | $L_{A1385}$ | $R_{B9}$ | $R_{B24}$ | H | $L_{A1523}$ | $R_{A44}$ | $R_{B24}$ | H |
| $L_{A1248}$ | $R_{B6}$ | $R_{B25}$ | H | $L_{A1386}$ | $R_{B9}$ | $R_{B25}$ | H | $L_{A1524}$ | $R_{A44}$ | $R_{B25}$ | H |
| $L_{A1249}$ | $R_{B6}$ | $R_{A3}$ | H | $L_{A1387}$ | $R_{B9}$ | $R_{A3}$ | H | $L_{A1525}$ | $R_{A44}$ | $R_{A3}$ | H |
| $L_{A1250}$ | $R_{B6}$ | $R_{A34}$ | H | $L_{A1388}$ | $R_{B9}$ | $R_{A34}$ | H | $L_{A1526}$ | $R_{A44}$ | $R_{A34}$ | H |
| $L_{A1251}$ | $R_{B6}$ | $R_{A44}$ | H | $L_{A1389}$ | $R_{B9}$ | $R_{A44}$ | H | $L_{A1527}$ | $R_{A44}$ | $R_{A44}$ | H |
| $L_{A1252}$ | $R_{B6}$ | $R_{A52}$ | H | $L_{A1390}$ | $R_{B9}$ | $R_{A52}$ | H | $L_{A1528}$ | $R_{A44}$ | $R_{A52}$ | H |
| $L_{A1253}$ | $R_{B6}$ | $R_{A53}$ | H | $L_{A1391}$ | $R_{B9}$ | $R_{A53}$ | H | $L_{A1529}$ | $R_{A44}$ | $R_{A53}$ | H |
| $L_{A1254}$ | $R_{B6}$ | $R_{A54}$ | H | $L_{A1392}$ | $R_{B9}$ | $R_{A54}$ | H | $L_{A1530}$ | $R_{A44}$ | $R_{A54}$ | H |
| $L_{A1255}$ | $R_{B6}$ | $R_{C3}$ | H | $L_{A1393}$ | $R_{B9}$ | $R_{C3}$ | H | $L_{A1531}$ | $R_{A44}$ | $R_{C3}$ | H |
| $L_{A1256}$ | $R_{B6}$ | $R_{C4}$ | H | $L_{A1394}$ | $R_{B9}$ | $R_{C4}$ | H | $L_{A1532}$ | $R_{A44}$ | $R_{C4}$ | H |
| $L_{A1257}$ | $R_{B6}$ | $R_{C8}$ | H | $L_{A1395}$ | $R_{B9}$ | $R_{C8}$ | H | $L_{A1533}$ | $R_{A44}$ | $R_{C8}$ | H |
| $L_{A1258}$ | $R_{B6}$ | H | $R_{B1}$ | $L_{A1396}$ | $R_{B9}$ | H | $R_{B1}$ | $L_{A1534}$ | $R_{A44}$ | H | $R_{B1}$ |
| $L_{A1259}$ | $R_{B6}$ | H | $R_{B3}$ | $L_{A1397}$ | $R_{B9}$ | H | $R_{B3}$ | $L_{A1535}$ | $R_{A44}$ | H | $R_{B3}$ |
| $L_{A1260}$ | $R_{B6}$ | H | $R_{B4}$ | $L_{A1398}$ | $R_{B9}$ | H | $R_{B4}$ | $L_{A1536}$ | $R_{A44}$ | H | $R_{B4}$ |
| $L_{A1261}$ | $R_{B6}$ | H | $R_{B5}$ | $L_{A1399}$ | $R_{B9}$ | H | $R_{B5}$ | $L_{A1537}$ | $R_{A44}$ | H | $R_{B5}$ |
| $L_{A1262}$ | $R_{B6}$ | H | $R_{B6}$ | $L_{A1400}$ | $R_{B9}$ | H | $R_{B6}$ | $L_{A1538}$ | $R_{A44}$ | H | $R_{B6}$ |
| $L_{A1263}$ | $R_{B6}$ | H | $R_{B7}$ | $L_{A1401}$ | $R_{B9}$ | H | $R_{B7}$ | $L_{A1539}$ | $R_{A44}$ | H | $R_{B7}$ |
| $L_{A1264}$ | $R_{B6}$ | H | $R_{B24}$ | $L_{A1402}$ | $R_{B9}$ | H | $R_{B24}$ | $L_{A1540}$ | $R_{A44}$ | H | $R_{B24}$ |
| $L_{A1265}$ | $R_{B6}$ | H | $R_{B25}$ | $L_{A1403}$ | $R_{B9}$ | H | $R_{B25}$ | $L_{A1541}$ | $R_{A44}$ | H | $R_{B25}$ |
| $L_{A1266}$ | $R_{B6}$ | H | $R_{A3}$ | $L_{A1404}$ | $R_{B9}$ | H | $R_{A3}$ | $L_{A1542}$ | $R_{A44}$ | H | $R_{A3}$ |
| $L_{A1267}$ | $R_{B6}$ | H | $R_{A34}$ | $L_{A1405}$ | $R_{B9}$ | H | $R_{A34}$ | $L_{A1543}$ | $R_{A44}$ | H | $R_{A34}$ |
| $L_{A1268}$ | $R_{B6}$ | H | $R_{A44}$ | $L_{A1406}$ | $R_{B9}$ | H | $R_{A44}$ | $L_{A1544}$ | $R_{A44}$ | H | $R_{A44}$ |
| $L_{A1269}$ | $R_{B6}$ | H | $R_{A52}$ | $L_{A1407}$ | $R_{B9}$ | H | $R_{A52}$ | $L_{A1545}$ | $R_{A44}$ | H | $R_{A52}$ |
| $L_{A1270}$ | $R_{B6}$ | H | $R_{A53}$ | $L_{A1408}$ | $R_{B9}$ | H | $R_{A53}$ | $L_{A1546}$ | $R_{A44}$ | H | $R_{A53}$ |
| $L_{A1271}$ | $R_{B6}$ | H | $R_{A54}$ | $L_{A1409}$ | $R_{B9}$ | H | $R_{A54}$ | $L_{A1547}$ | $R_{A44}$ | H | $R_{A54}$ |
| $L_{A1272}$ | $R_{B6}$ | H | $R_{C3}$ | $L_{A1410}$ | $R_{B9}$ | H | $R_{C3}$ | $L_{A1548}$ | $R_{A44}$ | H | $R_{C3}$ |
| $L_{A1273}$ | $R_{B6}$ | H | $R_{C4}$ | $L_{A1411}$ | $R_{B9}$ | H | $R_{C4}$ | $L_{A1549}$ | $R_{A44}$ | H | $R_{C4}$ |
| $L_{A1274}$ | $R_{B6}$ | H | $R_{C8}$ | $L_{A1412}$ | $R_{B9}$ | H | $R_{C8}$ | $L_{A1550}$ | $R_{A44}$ | H | $R_{C8}$ |
| $L_{A1275}$ | $R_{B6}$ | $R_{B1}$ | $R_{B1}$ | $L_{A1413}$ | $R_{B9}$ | $R_{B1}$ | $R_{B1}$ | $L_{A1551}$ | $R_{A44}$ | $R_{B1}$ | $R_{B1}$ |
| $L_{A1276}$ | $R_{B6}$ | $R_{B3}$ | $R_{B1}$ | $L_{A1414}$ | $R_{B9}$ | $R_{B3}$ | $R_{B1}$ | $L_{A1552}$ | $R_{A44}$ | $R_{B3}$ | $R_{B1}$ |
| $L_{A1277}$ | $R_{B6}$ | $R_{B4}$ | $R_{B1}$ | $L_{A1415}$ | $R_{B9}$ | $R_{B4}$ | $R_{B1}$ | $L_{A1553}$ | $R_{A44}$ | $R_{B4}$ | $R_{B1}$ |
| $L_{A1278}$ | $R_{B6}$ | $R_{B5}$ | $R_{B1}$ | $L_{A1416}$ | $R_{B9}$ | $R_{B5}$ | $R_{B1}$ | $L_{A1554}$ | $R_{A44}$ | $R_{B5}$ | $R_{B1}$ |
| $L_{A1279}$ | $R_{B6}$ | $R_{B6}$ | $R_{B1}$ | $L_{A1417}$ | $R_{B9}$ | $R_{B6}$ | $R_{B1}$ | $L_{A1555}$ | $R_{A44}$ | $R_{B6}$ | $R_{B1}$ |
| $L_{A1280}$ | $R_{B6}$ | $R_{B7}$ | $R_{B1}$ | $L_{A1418}$ | $R_{B9}$ | $R_{B7}$ | $R_{B1}$ | $L_{A1556}$ | $R_{A44}$ | $R_{B7}$ | $R_{B1}$ |
| $L_{A1281}$ | $R_{B6}$ | $R_{B24}$ | $R_{B1}$ | $L_{A1419}$ | $R_{B9}$ | $R_{B24}$ | $R_{B1}$ | $L_{A1557}$ | $R_{A44}$ | $R_{B24}$ | $R_{B1}$ |
| $L_{A1282}$ | $R_{B6}$ | $R_{B25}$ | $R_{B1}$ | $L_{A1420}$ | $R_{B9}$ | $R_{B25}$ | $R_{B1}$ | $L_{A1558}$ | $R_{A44}$ | $R_{B25}$ | $R_{B1}$ |
| $L_{A1283}$ | $R_{B6}$ | $R_{A3}$ | $R_{B1}$ | $L_{A1421}$ | $R_{B9}$ | $R_{A3}$ | $R_{B1}$ | $L_{A1559}$ | $R_{A44}$ | $R_{A3}$ | $R_{B1}$ |
| $L_{A1284}$ | $R_{B6}$ | $R_{A34}$ | $R_{B1}$ | $L_{A1422}$ | $R_{B9}$ | $R_{A34}$ | $R_{B1}$ | $L_{A1560}$ | $R_{A44}$ | $R_{A34}$ | $R_{B1}$ |
| $L_{A1285}$ | $R_{B6}$ | $R_{A44}$ | $R_{B1}$ | $L_{A1423}$ | $R_{B9}$ | $R_{A44}$ | $R_{B1}$ | $L_{A1561}$ | $R_{A44}$ | $R_{A44}$ | $R_{B1}$ |
| $L_{A1286}$ | $R_{B6}$ | $R_{A52}$ | $R_{B1}$ | $L_{A1424}$ | $R_{B9}$ | $R_{A52}$ | $R_{B1}$ | $L_{A1562}$ | $R_{A44}$ | $R_{A52}$ | $R_{B1}$ |
| $L_{A1287}$ | $R_{B6}$ | $R_{A53}$ | $R_{B1}$ | $L_{A1425}$ | $R_{B9}$ | $R_{A53}$ | $R_{B1}$ | $L_{A1563}$ | $R_{A44}$ | $R_{A53}$ | $R_{B1}$ |
| $L_{A1288}$ | $R_{B6}$ | $R_{A54}$ | $R_{B1}$ | $L_{A1426}$ | $R_{B9}$ | $R_{A54}$ | $R_{B1}$ | $L_{A1564}$ | $R_{A44}$ | $R_{A54}$ | $R_{B1}$ |
| $L_{A1289}$ | $R_{B6}$ | $R_{C3}$ | $R_{B1}$ | $L_{A1427}$ | $R_{B9}$ | $R_{C3}$ | $R_{B1}$ | $L_{A1565}$ | $R_{A44}$ | $R_{C3}$ | $R_{B1}$ |
| $L_{A1290}$ | $R_{B6}$ | $R_{C4}$ | $R_{B1}$ | $L_{A1428}$ | $R_{B9}$ | $R_{C4}$ | $R_{B1}$ | $L_{A1566}$ | $R_{A44}$ | $R_{C4}$ | $R_{B1}$ |
| $L_{A1291}$ | $R_{B6}$ | $R_{C8}$ | $R_{B1}$ | $L_{A1429}$ | $R_{B9}$ | $R_{C8}$ | $R_{B1}$ | $L_{A1567}$ | $R_{A44}$ | $R_{C8}$ | $R_{B1}$ |
| $L_{A1292}$ | $R_{B6}$ | $R_{B1}$ | $R_{B1}$ | $L_{A1430}$ | $R_{B9}$ | $R_{B1}$ | $R_{B1}$ | $L_{A1568}$ | $R_{A44}$ | $R_{B1}$ | $R_{B1}$ |
| $L_{A1293}$ | $R_{B6}$ | $R_{B1}$ | $R_{B3}$ | $L_{A1431}$ | $R_{B9}$ | $R_{B1}$ | $R_{B3}$ | $L_{A1569}$ | $R_{A44}$ | $R_{B1}$ | $R_{B3}$ |
| $L_{A1294}$ | $R_{B6}$ | $R_{B1}$ | $R_{B4}$ | $L_{A1432}$ | $R_{B9}$ | $R_{B1}$ | $R_{B4}$ | $L_{A1570}$ | $R_{A44}$ | $R_{B1}$ | $R_{B4}$ |
| $L_{A1295}$ | $R_{B6}$ | $R_{B1}$ | $R_{B5}$ | $L_{A1433}$ | $R_{B9}$ | $R_{B1}$ | $R_{B5}$ | $L_{A1571}$ | $R_{A44}$ | $R_{B1}$ | $R_{B5}$ |
| $L_{A1296}$ | $R_{B6}$ | $R_{B1}$ | $R_{B6}$ | $L_{A1434}$ | $R_{B9}$ | $R_{B1}$ | $R_{B6}$ | $L_{A1572}$ | $R_{A44}$ | $R_{B1}$ | $R_{B6}$ |
| $L_{A1297}$ | $R_{B6}$ | $R_{B1}$ | $R_{B7}$ | $L_{A1435}$ | $R_{B9}$ | $R_{B1}$ | $R_{B7}$ | $L_{A1573}$ | $R_{A44}$ | $R_{B1}$ | $R_{B7}$ |
| $L_{A1298}$ | $R_{B6}$ | $R_{B1}$ | $R_{B24}$ | $L_{A1436}$ | $R_{B9}$ | $R_{B1}$ | $R_{B24}$ | $L_{A1574}$ | $R_{A44}$ | $R_{B1}$ | $R_{B24}$ |

-continued

| $L_{Ai}$ | $R^1$ | $R^{11}$ | $R^{12}$ | $L_{Ai}$ | $R^1$ | $R^{11}$ | $R^{12}$ | $L_{Ai}$ | $R^1$ | $R^{11}$ | $R^{12}$ |
|---|---|---|---|---|---|---|---|---|---|---|---|
| $L_{A1299}$ | $R_{B6}$ | $R_{B1}$ | $R_{B25}$ | $L_{A1437}$ | $R_{B9}$ | $R_{B1}$ | $R_{B25}$ | $L_{A1575}$ | $R_{A44}$ | $R_{B1}$ | $R_{B25}$ |
| $L_{A1300}$ | $R_{B6}$ | $R_{B1}$ | $R_{A3}$ | $L_{A1438}$ | $R_{B9}$ | $R_{B1}$ | $R_{A3}$ | $L_{A1576}$ | $R_{A44}$ | $R_{B1}$ | $R_{A3}$ |
| $L_{A1301}$ | $R_{B6}$ | $R_{B1}$ | $R_{A34}$ | $L_{A1439}$ | $R_{B9}$ | $R_{B1}$ | $R_{A34}$ | $L_{A1577}$ | $R_{A44}$ | $R_{B1}$ | $R_{A34}$ |
| $L_{A1302}$ | $R_{B6}$ | $R_{B1}$ | $R_{A44}$ | $L_{A1440}$ | $R_{B9}$ | $R_{B1}$ | $R_{A44}$ | $L_{A1578}$ | $R_{A44}$ | $R_{B1}$ | $R_{A44}$ |
| $L_{A1303}$ | $R_{B6}$ | $R_{B1}$ | $R_{A52}$ | $L_{A1441}$ | $R_{B9}$ | $R_{B1}$ | $R_{A52}$ | $L_{A1579}$ | $R_{A44}$ | $R_{B1}$ | $R_{A52}$ |
| $L_{A1304}$ | $R_{B6}$ | $R_{B1}$ | $R_{A53}$ | $L_{A1442}$ | $R_{B9}$ | $R_{B1}$ | $R_{A53}$ | $L_{A1580}$ | $R_{A44}$ | $R_{B1}$ | $R_{A53}$ |
| $L_{A1305}$ | $R_{B6}$ | $R_{B1}$ | $R_{A54}$ | $L_{A1443}$ | $R_{B9}$ | $R_{B1}$ | $R_{A54}$ | $L_{A1581}$ | $R_{A44}$ | $R_{B1}$ | $R_{A54}$ |
| $L_{A1306}$ | $R_{B6}$ | $R_{B1}$ | $R_{C3}$ | $L_{A1444}$ | $R_{B9}$ | $R_{B1}$ | $R_{C3}$ | $L_{A1582}$ | $R_{A44}$ | $R_{B1}$ | $R_{C3}$ |
| $L_{A1307}$ | $R_{B6}$ | $R_{B1}$ | $R_{C4}$ | $L_{A1445}$ | $R_{B9}$ | $R_{B1}$ | $R_{C4}$ | $L_{A1583}$ | $R_{A44}$ | $R_{B1}$ | $R_{C4}$ |
| $L_{A1308}$ | $R_{B6}$ | $R_{B1}$ | $R_{C8}$ | $L_{A1446}$ | $R_{B9}$ | $R_{B1}$ | $R_{C8}$ | $L_{A1584}$ | $R_{A44}$ | $R_{B1}$ | $R_{C8}$ |

In some embodiments of Formula IA, the first ligand $L_A$ is selected from the group consisting of:

ligands XLV-$L_{Ai}$ that are based on a structure of Formula XLV

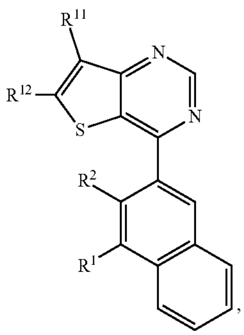

ligands XLVI-$L_{Ai}$ that are based on a structure of Formula XLVI

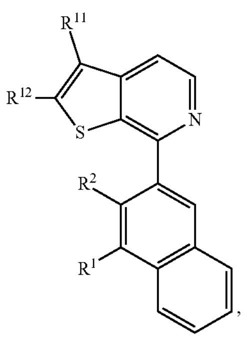

ligands XLVII-$L_{Ai}$ that are based on a structure of Formula XLVII

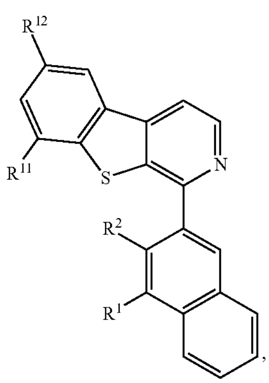

ligands XLVIII-$L_{Ai}$ that are based on a structure of Formula XLVIII

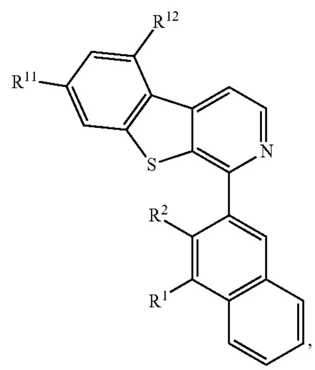

ligands XLIX-$L_{Ai}$ that are based on a structure of Formula XLIX

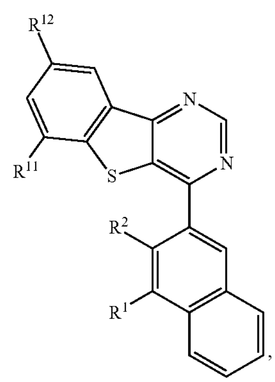

ligands L-$L_{Ai}$ that are based on a structure of Formula LI

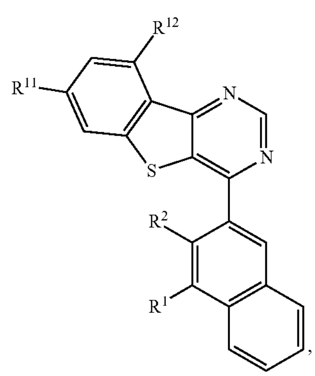

wherein i is an integer from 1585 to 1970 and for each i, $R^1$, $R^2$, $R^{11}$, and $R^{12}$ in the formulas XLV through LI are defined as follows:

| $L_{Ai}$ | $R^1$ | $R^{11}$ | $R^{12}$ | $R^2$ | $L_{Ai}$ | $R^1$ | $R^{11}$ | $R^{12}$ | $R^2$ |
|---|---|---|---|---|---|---|---|---|---|
| $L_{A1585}$ | H | H | H | $R_{B1}$ | $L_{A1778}$ | H | H | H | $R_{A54}$ |
| $L_{A1586}$ | H | $R_{B1}$ | H | $R_{B1}$ | $L_{A1779}$ | H | $R_{B1}$ | H | $R_{A54}$ |
| $L_{A1587}$ | H | $R_{B3}$ | H | $R_{B1}$ | $L_{A1780}$ | H | $R_{B3}$ | H | $R_{A54}$ |
| $L_{A1588}$ | H | $R_{B4}$ | H | $R_{B1}$ | $L_{A1781}$ | H | $R_{B4}$ | H | $R_{A54}$ |
| $L_{A1589}$ | H | $R_{B5}$ | H | $R_{B1}$ | $L_{A1782}$ | H | $R_{B5}$ | H | $R_{A54}$ |
| $L_{A1590}$ | H | $R_{B6}$ | H | $R_{B1}$ | $L_{A1783}$ | H | $R_{B6}$ | H | $R_{A54}$ |
| $L_{A1591}$ | H | $R_{B7}$ | H | $R_{B1}$ | $L_{A1784}$ | H | $R_{B7}$ | H | $R_{A54}$ |
| $L_{A1592}$ | H | $R_{B24}$ | H | $R_{B1}$ | $L_{A1785}$ | H | $R_{B24}$ | H | $R_{A54}$ |
| $L_{A1593}$ | H | $R_{B25}$ | H | $R_{B1}$ | $L_{A1786}$ | H | $R_{B25}$ | H | $R_{A54}$ |
| $L_{A1594}$ | H | $R_{A3}$ | H | $R_{B1}$ | $L_{A1787}$ | H | $R_{A3}$ | H | $R_{A54}$ |
| $L_{A1595}$ | H | $R_{A34}$ | H | $R_{B1}$ | $L_{A1788}$ | H | $R_{A34}$ | H | $R_{A54}$ |
| $L_{A1596}$ | H | $R_{A44}$ | H | $R_{B1}$ | $L_{A1789}$ | H | $R_{A44}$ | H | $R_{A54}$ |
| $L_{A1597}$ | H | $R_{A52}$ | H | $R_{B1}$ | $L_{A1790}$ | H | $R_{A52}$ | H | $R_{A54}$ |
| $L_{A1598}$ | H | $R_{A53}$ | H | $R_{B1}$ | $L_{A1791}$ | H | $R_{A53}$ | H | $R_{A54}$ |
| $L_{A1599}$ | H | $R_{A54}$ | H | $R_{B1}$ | $L_{A1792}$ | H | $R_{A54}$ | H | $R_{A54}$ |
| $L_{A1600}$ | H | $R_{C3}$ | H | $R_{B1}$ | $L_{A1793}$ | H | $R_{C3}$ | H | $R_{A54}$ |
| $L_{A1601}$ | H | $R_{C4}$ | H | $R_{B1}$ | $L_{A1794}$ | H | $R_{C4}$ | H | $R_{A54}$ |
| $L_{A1602}$ | H | $R_{C8}$ | H | $R_{B1}$ | $L_{A1795}$ | H | $R_{C8}$ | H | $R_{A54}$ |
| $L_{A1603}$ | H | H | $R_{B1}$ | $R_{B1}$ | $L_{A1796}$ | H | H | $R_{B1}$ | $R_{A54}$ |
| $L_{A1604}$ | H | H | $R_{B3}$ | $R_{B1}$ | $L_{A1797}$ | H | H | $R_{B3}$ | $R_{A54}$ |
| $L_{A1605}$ | H | H | $R_{B4}$ | $R_{B1}$ | $L_{A1798}$ | H | H | $R_{B4}$ | $R_{A54}$ |
| $L_{A1606}$ | H | H | $R_{B5}$ | $R_{B1}$ | $L_{A1799}$ | H | H | $R_{B5}$ | $R_{A54}$ |
| $L_{A1607}$ | H | H | $R_{B6}$ | $R_{B1}$ | $L_{A1800}$ | H | H | $R_{B6}$ | $R_{A54}$ |
| $L_{A1608}$ | H | H | $R_{B7}$ | $R_{B1}$ | $L_{A1801}$ | H | H | $R_{B7}$ | $R_{A54}$ |
| $L_{A1609}$ | H | H | $R_{B24}$ | $R_{B1}$ | $L_{A1802}$ | H | H | $R_{B24}$ | $R_{A54}$ |
| $L_{A1610}$ | H | H | $R_{B25}$ | $R_{B1}$ | $L_{A1803}$ | H | H | $R_{B25}$ | $R_{A54}$ |
| $L_{A1611}$ | H | H | $R_{A3}$ | $R_{B1}$ | $L_{A1804}$ | H | H | $R_{A3}$ | $R_{A54}$ |
| $L_{A1612}$ | H | H | $R_{A34}$ | $R_{B1}$ | $L_{A1805}$ | H | H | $R_{A34}$ | $R_{A54}$ |
| $L_{A1613}$ | H | H | $R_{A44}$ | $R_{B1}$ | $L_{A1806}$ | H | H | $R_{A44}$ | $R_{A54}$ |
| $L_{A1614}$ | H | H | $R_{A52}$ | $R_{B1}$ | $L_{A1807}$ | H | H | $R_{A52}$ | $R_{A54}$ |
| $L_{A1615}$ | H | H | $R_{A53}$ | $R_{B1}$ | $L_{A1808}$ | H | H | $R_{A53}$ | $R_{A54}$ |
| $L_{A1616}$ | H | H | $R_{A54}$ | $R_{B1}$ | $L_{A1809}$ | H | H | $R_{A54}$ | $R_{A54}$ |
| $L_{A1617}$ | H | H | $R_{C3}$ | $R_{B1}$ | $L_{A1810}$ | H | H | $R_{C3}$ | $R_{A54}$ |
| $L_{A1618}$ | H | H | $R_{C4}$ | $R_{B1}$ | $L_{A1811}$ | H | H | $R_{C4}$ | $R_{A54}$ |
| $L_{A1619}$ | H | H | $R_{C8}$ | $R_{B1}$ | $L_{A1812}$ | H | H | $R_{C8}$ | $R_{A54}$ |
| $L_{A1620}$ | H | $R_{B1}$ | $R_{B1}$ | $R_{B1}$ | $L_{A1813}$ | H | $R_{B1}$ | $R_{B1}$ | $R_{A54}$ |
| $L_{A1621}$ | H | $R_{B3}$ | $R_{B1}$ | $R_{B1}$ | $L_{A1814}$ | H | $R_{B3}$ | $R_{B1}$ | $R_{A54}$ |
| $L_{A1622}$ | H | $R_{B4}$ | $R_{B1}$ | $R_{B1}$ | $L_{A1815}$ | H | $R_{B4}$ | $R_{B1}$ | $R_{A54}$ |
| $L_{A1623}$ | H | $R_{B5}$ | $R_{B1}$ | $R_{B1}$ | $L_{A1816}$ | H | $R_{B5}$ | $R_{B1}$ | $R_{A54}$ |
| $L_{A1624}$ | H | $R_{B6}$ | $R_{B1}$ | $R_{B1}$ | $L_{A1817}$ | H | $R_{B6}$ | $R_{B1}$ | $R_{A54}$ |
| $L_{A1625}$ | H | $R_{B7}$ | $R_{B1}$ | $R_{B1}$ | $L_{A1818}$ | H | $R_{B7}$ | $R_{B1}$ | $R_{A54}$ |
| $L_{A1626}$ | H | $R_{B24}$ | $R_{B1}$ | $R_{B1}$ | $L_{A1819}$ | H | $R_{B24}$ | $R_{B1}$ | $R_{A54}$ |
| $L_{A1627}$ | H | $R_{B25}$ | $R_{B1}$ | $R_{B1}$ | $L_{A1820}$ | H | $R_{B25}$ | $R_{B1}$ | $R_{A54}$ |
| $L_{A1628}$ | H | $R_{A3}$ | $R_{B1}$ | $R_{B1}$ | $L_{A1821}$ | H | $R_{A3}$ | $R_{B1}$ | $R_{A54}$ |
| $L_{A1629}$ | H | $R_{A34}$ | $R_{B1}$ | $R_{B1}$ | $L_{A1822}$ | H | $R_{A34}$ | $R_{B1}$ | $R_{A54}$ |
| $L_{A1630}$ | H | $R_{A44}$ | $R_{B1}$ | $R_{B1}$ | $L_{A1823}$ | H | $R_{A44}$ | $R_{B1}$ | $R_{A54}$ |
| $L_{A1631}$ | H | $R_{A52}$ | $R_{B1}$ | $R_{B1}$ | $L_{A1824}$ | H | $R_{A52}$ | $R_{B1}$ | $R_{A54}$ |
| $L_{A1632}$ | H | $R_{A53}$ | $R_{B1}$ | $R_{B1}$ | $L_{A1825}$ | H | $R_{A53}$ | $R_{B1}$ | $R_{A54}$ |
| $L_{A1633}$ | H | $R_{A54}$ | $R_{B1}$ | $R_{B1}$ | $L_{A1826}$ | H | $R_{A54}$ | $R_{B1}$ | $R_{A54}$ |
| $L_{A1634}$ | H | $R_{C3}$ | $R_{B1}$ | $R_{B1}$ | $L_{A1827}$ | H | $R_{C3}$ | $R_{B1}$ | $R_{A54}$ |
| $L_{A1635}$ | H | $R_{C4}$ | $R_{B1}$ | $R_{B1}$ | $L_{A1828}$ | H | $R_{C4}$ | $R_{B1}$ | $R_{A54}$ |
| $L_{A1636}$ | H | $R_{C8}$ | $R_{B1}$ | $R_{B1}$ | $L_{A1829}$ | H | $R_{C8}$ | $R_{B1}$ | $R_{A54}$ |
| $L_{A1637}$ | H | $R_{B1}$ | $R_{B1}$ | $R_{B1}$ | $L_{A1830}$ | H | $R_{B1}$ | $R_{B1}$ | $R_{A54}$ |
| $L_{A1638}$ | H | $R_{B1}$ | $R_{B3}$ | $R_{B1}$ | $L_{A1831}$ | H | $R_{B1}$ | $R_{B3}$ | $R_{A54}$ |
| $L_{A1639}$ | H | $R_{B1}$ | $R_{B4}$ | $R_{B1}$ | $L_{A1832}$ | H | $R_{B1}$ | $R_{B4}$ | $R_{A54}$ |
| $L_{A1640}$ | H | $R_{B1}$ | $R_{B5}$ | $R_{B1}$ | $L_{A1833}$ | H | $R_{B1}$ | $R_{B5}$ | $R_{A54}$ |
| $L_{A1641}$ | H | $R_{B1}$ | $R_{B6}$ | $R_{B1}$ | $L_{A1834}$ | H | $R_{B1}$ | $R_{B6}$ | $R_{A54}$ |
| $L_{A1642}$ | H | $R_{B1}$ | $R_{B7}$ | $R_{B1}$ | $L_{A1835}$ | H | $R_{B1}$ | $R_{B7}$ | $R_{A54}$ |
| $L_{A1643}$ | H | $R_{B1}$ | $R_{B24}$ | $R_{B1}$ | $L_{A1836}$ | H | $R_{B1}$ | $R_{B24}$ | $R_{A54}$ |
| $L_{A1644}$ | H | $R_{B1}$ | $R_{B25}$ | $R_{B1}$ | $L_{A1837}$ | H | $R_{B1}$ | $R_{B25}$ | $R_{A54}$ |
| $L_{A1645}$ | H | $R_{B1}$ | $R_{A3}$ | $R_{B1}$ | $L_{A1838}$ | H | $R_{B1}$ | $R_{A3}$ | $R_{A54}$ |
| $L_{A1646}$ | H | $R_{B1}$ | $R_{A34}$ | $R_{B1}$ | $L_{A1839}$ | H | $R_{B1}$ | $R_{A34}$ | $R_{A54}$ |
| $L_{A1647}$ | H | $R_{B1}$ | $R_{A44}$ | $R_{B1}$ | $L_{A1840}$ | H | $R_{B1}$ | $R_{A44}$ | $R_{A54}$ |
| $L_{A1648}$ | H | $R_{B1}$ | $R_{A52}$ | $R_{B1}$ | $L_{A1841}$ | H | $R_{B1}$ | $R_{A52}$ | $R_{A54}$ |
| $L_{A1649}$ | H | $R_{B1}$ | $R_{A53}$ | $R_{B1}$ | $L_{A1842}$ | H | $R_{B1}$ | $R_{A53}$ | $R_{A54}$ |
| $L_{A1650}$ | H | $R_{B1}$ | $R_{A54}$ | $R_{B1}$ | $L_{A1843}$ | H | $R_{B1}$ | $R_{A54}$ | $R_{A54}$ |
| $L_{A1651}$ | H | $R_{B1}$ | $R_{C3}$ | $R_{B1}$ | $L_{A1844}$ | H | $R_{B1}$ | $R_{C3}$ | $R_{A54}$ |
| $L_{A1652}$ | H | $R_{B1}$ | $R_{C4}$ | $R_{B1}$ | $L_{A1845}$ | H | $R_{B1}$ | $R_{C4}$ | $R_{A54}$ |
| $L_{A1653}$ | H | $R_{B1}$ | $R_{C8}$ | $R_{B1}$ | $L_{A1846}$ | H | $R_{B1}$ | $R_{C8}$ | $R_{A54}$ |
| $L_{A1654}$ | $R_{B1}$ | H | H | $R_{B1}$ | $L_{A1847}$ | $R_{B1}$ | H | H | $R_{A54}$ |
| $L_{A1655}$ | $R_{B1}$ | $R_{B1}$ | H | $R_{B1}$ | $L_{A1848}$ | $R_{B1}$ | $R_{B1}$ | H | $R_{A54}$ |
| $L_{A1656}$ | $R_{B1}$ | $R_{B3}$ | H | $R_{B1}$ | $L_{A1849}$ | $R_{B1}$ | $R_{B3}$ | H | $R_{A54}$ |
| $L_{A1657}$ | $R_{B1}$ | $R_{B4}$ | H | $R_{B1}$ | $L_{A1850}$ | $R_{B1}$ | $R_{B4}$ | H | $R_{A54}$ |
| $L_{A1658}$ | $R_{B1}$ | $R_{B5}$ | H | $R_{B1}$ | $L_{A1851}$ | $R_{B1}$ | $R_{B5}$ | H | $R_{A54}$ |

-continued

| $L_{Ai}$ | $R^1$ | $R^{11}$ | $R^{12}$ | $R^2$ | $L_{Ai}$ | $R^1$ | $R^{11}$ | $R^{12}$ | $R^2$ |
|---|---|---|---|---|---|---|---|---|---|
| $L_{A1659}$ | $R_{B1}$ | $R_{B6}$ | H | $R_{B1}$ | $L_{A1852}$ | $R_{B1}$ | $R_{B6}$ | H | $R_{A54}$ |
| $L_{A1660}$ | $R_{B1}$ | $R_{B7}$ | H | $R_{B1}$ | $L_{A1853}$ | $R_{B1}$ | $R_{B7}$ | H | $R_{A54}$ |
| $L_{A1661}$ | $R_{B1}$ | $R_{B24}$ | H | $R_{B1}$ | $L_{A1854}$ | $R_{B1}$ | $R_{B24}$ | H | $R_{A54}$ |
| $L_{A1662}$ | $R_{B1}$ | $R_{B25}$ | H | $R_{B1}$ | $L_{A1855}$ | $R_{B1}$ | $R_{B25}$ | H | $R_{A54}$ |
| $L_{A1663}$ | $R_{B1}$ | $R_{A3}$ | H | $R_{B1}$ | $L_{A1856}$ | $R_{B1}$ | $R_{A3}$ | H | $R_{A54}$ |
| $L_{A1664}$ | $R_{B1}$ | $R_{A34}$ | H | $R_{B1}$ | $L_{A1857}$ | $R_{B1}$ | $R_{A34}$ | H | $R_{A54}$ |
| $L_{A1665}$ | $R_{B1}$ | $R_{A44}$ | H | $R_{B1}$ | $L_{A1858}$ | $R_{B1}$ | $R_{A44}$ | H | $R_{A54}$ |
| $L_{A1666}$ | $R_{B1}$ | $R_{A52}$ | H | $R_{B1}$ | $L_{A1859}$ | $R_{B1}$ | $R_{A52}$ | H | $R_{A54}$ |
| $L_{A1667}$ | $R_{B1}$ | $R_{A53}$ | H | $R_{B1}$ | $L_{A1860}$ | $R_{B1}$ | $R_{A53}$ | H | $R_{A54}$ |
| $L_{A1668}$ | $R_{B1}$ | $R_{A54}$ | H | $R_{B1}$ | $L_{A1861}$ | $R_{B1}$ | $R_{A54}$ | H | $R_{A54}$ |
| $L_{A1669}$ | $R_{B1}$ | $R_{C3}$ | H | $R_{B1}$ | $L_{A1862}$ | $R_{B1}$ | $R_{C3}$ | H | $R_{A54}$ |
| $L_{A1670}$ | $R_{B1}$ | $R_{C4}$ | H | $R_{B1}$ | $L_{A1863}$ | $R_{B1}$ | $R_{C4}$ | H | $R_{A54}$ |
| $L_{A1671}$ | $R_{B1}$ | $R_{C8}$ | H | $R_{B1}$ | $L_{A1864}$ | $R_{B1}$ | $R_{C8}$ | H | $R_{A54}$ |
| $L_{A1672}$ | $R_{B1}$ | H | $R_{B1}$ | $R_{B1}$ | $L_{A1865}$ | $R_{B1}$ | H | $R_{B1}$ | $R_{A54}$ |
| $L_{A1673}$ | $R_{B1}$ | H | $R_{B3}$ | $R_{B1}$ | $L_{A1866}$ | $R_{B1}$ | H | $R_{B3}$ | $R_{A54}$ |
| $L_{A1674}$ | $R_{B1}$ | H | $R_{B4}$ | $R_{B1}$ | $L_{A1867}$ | $R_{B1}$ | H | $R_{B4}$ | $R_{A54}$ |
| $L_{A1675}$ | $R_{B1}$ | H | $R_{B5}$ | $R_{B1}$ | $L_{A1868}$ | $R_{B1}$ | H | $R_{B5}$ | $R_{A54}$ |
| $L_{A1676}$ | $R_{B1}$ | H | $R_{B6}$ | $R_{B1}$ | $L_{A1869}$ | $R_{B1}$ | H | $R_{B6}$ | $R_{A54}$ |
| $L_{A1677}$ | $R_{B1}$ | H | $R_{B7}$ | $R_{B1}$ | $L_{A1870}$ | $R_{B1}$ | H | $R_{B7}$ | $R_{A54}$ |
| $L_{A1678}$ | $R_{B1}$ | H | $R_{B24}$ | $R_{B1}$ | $L_{A1871}$ | $R_{B1}$ | H | $R_{B24}$ | $R_{A54}$ |
| $L_{A1679}$ | $R_{B1}$ | H | $R_{B25}$ | $R_{B1}$ | $L_{A1872}$ | $R_{B1}$ | H | $R_{B25}$ | $R_{A54}$ |
| $L_{A1680}$ | $R_{B1}$ | H | $R_{A3}$ | $R_{B1}$ | $L_{A1873}$ | $R_{B1}$ | H | $R_{A3}$ | $R_{A54}$ |
| $L_{A1681}$ | $R_{B1}$ | H | $R_{A34}$ | $R_{B1}$ | $L_{A1874}$ | $R_{B1}$ | H | $R_{A34}$ | $R_{A54}$ |
| $L_{A1682}$ | $R_{B1}$ | H | $R_{A44}$ | $R_{B1}$ | $L_{A1875}$ | $R_{B1}$ | H | $R_{A44}$ | $R_{A54}$ |
| $L_{A1683}$ | $R_{B1}$ | H | $R_{A52}$ | $R_{B1}$ | $L_{A1876}$ | $R_{B1}$ | H | $R_{A52}$ | $R_{A54}$ |
| $L_{A1684}$ | $R_{B1}$ | H | $R_{A53}$ | $R_{B1}$ | $L_{A1877}$ | $R_{B1}$ | H | $R_{A53}$ | $R_{A54}$ |
| $L_{A1685}$ | $R_{B1}$ | H | $R_{A54}$ | $R_{B1}$ | $L_{A1878}$ | $R_{B1}$ | H | $R_{A54}$ | $R_{A54}$ |
| $L_{A1686}$ | $R_{B1}$ | H | $R_{C3}$ | $R_{B1}$ | $L_{A1879}$ | $R_{B1}$ | H | $R_{C3}$ | $R_{A54}$ |
| $L_{A1687}$ | $R_{B1}$ | H | $R_{C4}$ | $R_{B1}$ | $L_{A1880}$ | $R_{B1}$ | H | $R_{C4}$ | $R_{A54}$ |
| $L_{A1688}$ | $R_{B1}$ | H | $R_{C8}$ | $R_{B1}$ | $L_{A1881}$ | $R_{B1}$ | H | $R_{C8}$ | $R_{A54}$ |
| $L_{A1689}$ | $R_{B1}$ | $R_{B1}$ | $R_{B1}$ | $R_{B1}$ | $L_{A1882}$ | $R_{B1}$ | $R_{B1}$ | $R_{B1}$ | $R_{A54}$ |
| $L_{A1690}$ | $R_{B1}$ | $R_{B3}$ | $R_{B1}$ | $R_{B1}$ | $L_{A1883}$ | $R_{B1}$ | $R_{B3}$ | $R_{B1}$ | $R_{A54}$ |
| $L_{A1691}$ | $R_{B1}$ | $R_{B4}$ | $R_{B1}$ | $R_{B1}$ | $L_{A1884}$ | $R_{B1}$ | $R_{B4}$ | $R_{B1}$ | $R_{A54}$ |
| $L_{A1692}$ | $R_{B1}$ | $R_{B5}$ | $R_{B1}$ | $R_{B1}$ | $L_{A1885}$ | $R_{B1}$ | $R_{B5}$ | $R_{B1}$ | $R_{A54}$ |
| $L_{A1693}$ | $R_{B1}$ | $R_{B6}$ | $R_{B1}$ | $R_{B1}$ | $L_{A1886}$ | $R_{B1}$ | $R_{B6}$ | $R_{B1}$ | $R_{A54}$ |
| $L_{A1694}$ | $R_{B1}$ | $R_{B7}$ | $R_{B1}$ | $R_{B1}$ | $L_{A1887}$ | $R_{B1}$ | $R_{B7}$ | $R_{B1}$ | $R_{A54}$ |
| $L_{A1695}$ | $R_{B1}$ | $R_{B24}$ | $R_{B1}$ | $R_{B1}$ | $L_{A1888}$ | $R_{B1}$ | $R_{B24}$ | $R_{B1}$ | $R_{A54}$ |
| $L_{A1696}$ | $R_{B1}$ | $R_{B25}$ | $R_{B1}$ | $R_{B1}$ | $L_{A1889}$ | $R_{B1}$ | $R_{B25}$ | $R_{B1}$ | $R_{A54}$ |
| $L_{A1697}$ | $R_{B1}$ | $R_{A3}$ | $R_{B1}$ | $R_{B1}$ | $L_{A1890}$ | $R_{B1}$ | $R_{A3}$ | $R_{B1}$ | $R_{A54}$ |
| $L_{A1698}$ | $R_{B1}$ | $R_{A34}$ | $R_{B1}$ | $R_{B1}$ | $L_{A1891}$ | $R_{B1}$ | $R_{A34}$ | $R_{B1}$ | $R_{A54}$ |
| $L_{A1699}$ | $R_{B1}$ | $R_{A44}$ | $R_{B1}$ | $R_{B1}$ | $L_{A1892}$ | $R_{B1}$ | $R_{A44}$ | $R_{B1}$ | $R_{A54}$ |
| $L_{A1700}$ | $R_{B1}$ | $R_{A52}$ | $R_{B1}$ | $R_{B1}$ | $L_{A1893}$ | $R_{B1}$ | $R_{A52}$ | $R_{B1}$ | $R_{A54}$ |
| $L_{A1701}$ | $R_{B1}$ | $R_{A53}$ | $R_{B1}$ | $R_{B1}$ | $L_{A1894}$ | $R_{B1}$ | $R_{A53}$ | $R_{B1}$ | $R_{A54}$ |
| $L_{A1702}$ | $R_{B1}$ | $R_{A54}$ | $R_{B1}$ | $R_{B1}$ | $L_{A1895}$ | $R_{B1}$ | $R_{A54}$ | $R_{B1}$ | $R_{A54}$ |
| $L_{A1703}$ | $R_{B1}$ | $R_{C3}$ | $R_{B1}$ | $R_{B1}$ | $L_{A1896}$ | $R_{B1}$ | $R_{C3}$ | $R_{B1}$ | $R_{A54}$ |
| $L_{A1704}$ | $R_{B1}$ | $R_{C4}$ | $R_{B1}$ | $R_{B1}$ | $L_{A1897}$ | $R_{B1}$ | $R_{C4}$ | $R_{B1}$ | $R_{A54}$ |
| $L_{A1705}$ | $R_{B1}$ | $R_{C8}$ | $R_{B1}$ | $R_{B1}$ | $L_{A1898}$ | $R_{B1}$ | $R_{C8}$ | $R_{B1}$ | $R_{A54}$ |
| $L_{A1706}$ | $R_{B1}$ | $R_{B1}$ | $R_{B1}$ | $R_{B1}$ | $L_{A1899}$ | $R_{B1}$ | $R_{B1}$ | $R_{B1}$ | $R_{A54}$ |
| $L_{A1707}$ | $R_{B1}$ | $R_{B1}$ | $R_{B3}$ | $R_{B1}$ | $L_{A1900}$ | $R_{B1}$ | $R_{B1}$ | $R_{B3}$ | $R_{A54}$ |
| $L_{A1708}$ | $R_{B1}$ | $R_{B1}$ | $R_{B4}$ | $R_{B1}$ | $L_{A1901}$ | $R_{B1}$ | $R_{B1}$ | $R_{B4}$ | $R_{A54}$ |
| $L_{A1709}$ | $R_{B1}$ | $R_{B1}$ | $R_{B5}$ | $R_{B1}$ | $L_{A1902}$ | $R_{B1}$ | $R_{B1}$ | $R_{B5}$ | $R_{A54}$ |
| $L_{A1710}$ | $R_{B1}$ | $R_{B1}$ | $R_{B6}$ | $R_{B1}$ | $L_{A1903}$ | $R_{B1}$ | $R_{B1}$ | $R_{B6}$ | $R_{A54}$ |
| $L_{A1711}$ | $R_{B1}$ | $R_{B1}$ | $R_{B7}$ | $R_{B1}$ | $L_{A1904}$ | $R_{B1}$ | $R_{B1}$ | $R_{B7}$ | $R_{A54}$ |
| $L_{A1712}$ | $R_{B1}$ | $R_{B1}$ | $R_{B24}$ | $R_{B1}$ | $L_{A1905}$ | $R_{B1}$ | $R_{B1}$ | $R_{B24}$ | $R_{A54}$ |
| $L_{A1713}$ | $R_{B1}$ | $R_{B1}$ | $R_{B25}$ | $R_{B1}$ | $L_{A1906}$ | $R_{B1}$ | $R_{B1}$ | $R_{B25}$ | $R_{A54}$ |
| $L_{A1714}$ | $R_{B1}$ | $R_{B1}$ | $R_{A3}$ | $R_{B1}$ | $L_{A1907}$ | $R_{B1}$ | $R_{B1}$ | $R_{A3}$ | $R_{A54}$ |
| $L_{A1715}$ | $R_{B1}$ | $R_{B1}$ | $R_{A34}$ | $R_{B1}$ | $L_{A1908}$ | $R_{B1}$ | $R_{B1}$ | $R_{A34}$ | $R_{A54}$ |
| $L_{A1716}$ | $R_{B6}$ | H | H | $R_{B1}$ | $L_{A1909}$ | $R_{B6}$ | H | H | $R_{A54}$ |
| $L_{A1717}$ | $R_{B6}$ | $R_{B1}$ | H | $R_{B1}$ | $L_{A1910}$ | $R_{B6}$ | $R_{B1}$ | H | $R_{A54}$ |
| $L_{A1718}$ | $R_{B6}$ | $R_{B3}$ | H | $R_{B1}$ | $L_{A1911}$ | $R_{B6}$ | $R_{B3}$ | H | $R_{A54}$ |
| $L_{A1719}$ | $R_{B6}$ | $R_{B4}$ | H | $R_{B1}$ | $L_{A1912}$ | $R_{B6}$ | $R_{B4}$ | H | $R_{A54}$ |
| $L_{A1720}$ | $R_{B6}$ | $R_{B5}$ | H | $R_{B1}$ | $L_{A1913}$ | $R_{B6}$ | $R_{B5}$ | H | $R_{A54}$ |
| $L_{A1721}$ | $R_{B6}$ | $R_{B6}$ | H | $R_{B1}$ | $L_{A1914}$ | $R_{B6}$ | $R_{B6}$ | H | $R_{A54}$ |
| $L_{A1722}$ | $R_{B6}$ | $R_{B7}$ | H | $R_{B1}$ | $L_{A1915}$ | $R_{B6}$ | $R_{B7}$ | H | $R_{A54}$ |
| $L_{A1723}$ | $R_{B6}$ | $R_{B24}$ | H | $R_{B1}$ | $L_{A1916}$ | $R_{B6}$ | $R_{B24}$ | H | $R_{A54}$ |
| $L_{A1724}$ | $R_{B6}$ | $R_{B25}$ | H | $R_{B1}$ | $L_{A1917}$ | $R_{B6}$ | $R_{B25}$ | H | $R_{A54}$ |
| $L_{A1725}$ | $R_{B6}$ | $R_{A3}$ | H | $R_{B1}$ | $L_{A1918}$ | $R_{B6}$ | $R_{A3}$ | H | $R_{A54}$ |
| $L_{A1726}$ | $R_{B6}$ | $R_{A34}$ | H | $R_{B1}$ | $L_{A1919}$ | $R_{B6}$ | $R_{A34}$ | H | $R_{A54}$ |
| $L_{A1727}$ | $R_{B6}$ | $R_{A44}$ | H | $R_{B1}$ | $L_{A1920}$ | $R_{B6}$ | $R_{A44}$ | H | $R_{A54}$ |
| $L_{A1728}$ | $R_{B6}$ | $R_{A52}$ | H | $R_{B1}$ | $L_{A1921}$ | $R_{B6}$ | $R_{A52}$ | H | $R_{A54}$ |
| $L_{A1729}$ | $R_{B6}$ | $R_{A53}$ | H | $R_{B1}$ | $L_{A1922}$ | $R_{B6}$ | $R_{A53}$ | H | $R_{A54}$ |
| $L_{A1730}$ | $R_{B6}$ | $R_{A54}$ | H | $R_{B1}$ | $L_{A1923}$ | $R_{B6}$ | $R_{A54}$ | H | $R_{A54}$ |
| $L_{A1731}$ | $R_{B6}$ | $R_{C3}$ | H | $R_{B1}$ | $L_{A1924}$ | $R_{B6}$ | $R_{C3}$ | H | $R_{A54}$ |
| $L_{A1732}$ | $R_{B6}$ | $R_{C4}$ | H | $R_{B1}$ | $L_{A1925}$ | $R_{B6}$ | $R_{C4}$ | H | $R_{A54}$ |
| $L_{A1733}$ | $R_{B6}$ | $R_{C8}$ | H | $R_{B1}$ | $L_{A1926}$ | $R_{B6}$ | $R_{C8}$ | H | $R_{A54}$ |
| $L_{A1734}$ | $R_{B6}$ | H | $R_{B1}$ | $R_{B1}$ | $L_{A1927}$ | $R_{B6}$ | H | $R_{B1}$ | $R_{A54}$ |
| $L_{A1735}$ | $R_{B6}$ | H | $R_{B3}$ | $R_{B1}$ | $L_{A1928}$ | $R_{B6}$ | H | $R_{B3}$ | $R_{A54}$ |

-continued

| $L_{Ai}$ | $R^1$ | $R^{11}$ | $R^{12}$ | $R^2$ | $L_{Ai}$ | $R^1$ | $R^{11}$ | $R^{12}$ | $R^2$ |
|---|---|---|---|---|---|---|---|---|---|
| $L_{A1736}$ | $R_{B6}$ | H | $R_{B4}$ | $R_{B1}$ | $L_{A1929}$ | $R_{B6}$ | H | $R_{B4}$ | $R_{A454}$ |
| $L_{A1737}$ | $R_{B6}$ | H | $R_{B5}$ | $R_{B1}$ | $L_{A1930}$ | $R_{B6}$ | H | $R_{B5}$ | $R_{A454}$ |
| $L_{A1738}$ | $R_{B6}$ | H | $R_{B6}$ | $R_{B1}$ | $L_{A1931}$ | $R_{B6}$ | H | $R_{B6}$ | $R_{A454}$ |
| $L_{A1739}$ | $R_{B6}$ | H | $R_{B7}$ | $R_{B1}$ | $L_{A1932}$ | $R_{B6}$ | H | $R_{B7}$ | $R_{A454}$ |
| $L_{A1740}$ | $R_{B6}$ | H | $R_{B24}$ | $R_{B1}$ | $L_{A1933}$ | $R_{B6}$ | H | $R_{B24}$ | $R_{A454}$ |
| $L_{A1741}$ | $R_{B6}$ | H | $R_{B25}$ | $R_{B1}$ | $L_{A1934}$ | $R_{B6}$ | H | $R_{B25}$ | $R_{A454}$ |
| $L_{A1742}$ | $R_{B6}$ | H | $R_{A3}$ | $R_{B1}$ | $L_{A1935}$ | $R_{B6}$ | H | $R_{A3}$ | $R_{A454}$ |
| $L_{A1743}$ | $R_{B6}$ | H | $R_{A434}$ | $R_{B1}$ | $L_{A1936}$ | $R_{B6}$ | H | $R_{A434}$ | $R_{A454}$ |
| $L_{A1744}$ | $R_{B6}$ | H | $R_{A444}$ | $R_{B1}$ | $L_{A1937}$ | $R_{B6}$ | H | $R_{A444}$ | $R_{A454}$ |
| $L_{A1745}$ | $R_{B6}$ | H | $R_{A452}$ | $R_{B1}$ | $L_{A1938}$ | $R_{B6}$ | H | $R_{A452}$ | $R_{A454}$ |
| $L_{A1746}$ | $R_{B6}$ | H | $R_{A453}$ | $R_{B1}$ | $L_{A1939}$ | $R_{B6}$ | H | $R_{A453}$ | $R_{A454}$ |
| $L_{A1747}$ | $R_{B6}$ | H | $R_{A454}$ | $R_{B1}$ | $L_{A1940}$ | $R_{B6}$ | H | $R_{A454}$ | $R_{A454}$ |
| $L_{A1748}$ | $R_{B6}$ | H | $R_{C3}$ | $R_{B1}$ | $L_{A1941}$ | $R_{B6}$ | H | $R_{C3}$ | $R_{A454}$ |
| $L_{A1749}$ | $R_{B6}$ | H | $R_{C4}$ | $R_{B1}$ | $L_{A1942}$ | $R_{B6}$ | H | $R_{C4}$ | $R_{A454}$ |
| $L_{A1750}$ | $R_{B6}$ | H | $R_{C8}$ | $R_{B1}$ | $L_{A1943}$ | $R_{B6}$ | H | $R_{C8}$ | $R_{A454}$ |
| $L_{A1751}$ | $R_{B6}$ | $R_{B1}$ | $R_{B1}$ | $R_{B1}$ | $L_{A1944}$ | $R_{B6}$ | $R_{B1}$ | $R_{B1}$ | $R_{A454}$ |
| $L_{A1752}$ | $R_{B6}$ | $R_{B3}$ | $R_{B1}$ | $R_{B1}$ | $L_{A1945}$ | $R_{B6}$ | $R_{B3}$ | $R_{B1}$ | $R_{A454}$ |
| $L_{A1753}$ | $R_{B6}$ | $R_{B4}$ | $R_{B1}$ | $R_{B1}$ | $L_{A1946}$ | $R_{B6}$ | $R_{B4}$ | $R_{B1}$ | $R_{A454}$ |
| $L_{A1754}$ | $R_{B6}$ | $R_{B5}$ | $R_{B1}$ | $R_{B1}$ | $L_{A1947}$ | $R_{B6}$ | $R_{B5}$ | $R_{B1}$ | $R_{A454}$ |
| $L_{A1755}$ | $R_{B6}$ | $R_{B6}$ | $R_{B1}$ | $R_{B1}$ | $L_{A1948}$ | $R_{B6}$ | $R_{B6}$ | $R_{B1}$ | $R_{A454}$ |
| $L_{A1756}$ | $R_{B6}$ | $R_{B7}$ | $R_{B1}$ | $R_{B1}$ | $L_{A1949}$ | $R_{B6}$ | $R_{B7}$ | $R_{B1}$ | $R_{A454}$ |
| $L_{A1757}$ | $R_{B6}$ | $R_{B24}$ | $R_{B1}$ | $R_{B1}$ | $L_{A1950}$ | $R_{B6}$ | $R_{B24}$ | $R_{B1}$ | $R_{A454}$ |
| $L_{A1758}$ | $R_{B6}$ | $R_{B25}$ | $R_{B1}$ | $R_{B1}$ | $L_{A1951}$ | $R_{B6}$ | $R_{B25}$ | $R_{B1}$ | $R_{A454}$ |
| $L_{A1759}$ | $R_{B6}$ | $R_{A3}$ | $R_{B1}$ | $R_{B1}$ | $L_{A1952}$ | $R_{B6}$ | $R_{A3}$ | $R_{B1}$ | $R_{A454}$ |
| $L_{A1760}$ | $R_{B6}$ | $R_{A434}$ | $R_{B1}$ | $R_{B1}$ | $L_{A1953}$ | $R_{B6}$ | $R_{A434}$ | $R_{B1}$ | $R_{A454}$ |
| $L_{A1761}$ | $R_{B6}$ | $R_{A444}$ | $R_{B1}$ | $R_{B1}$ | $L_{A1954}$ | $R_{B6}$ | $R_{A444}$ | $R_{B1}$ | $R_{A454}$ |
| $L_{A1762}$ | $R_{B6}$ | $R_{A452}$ | $R_{B1}$ | $R_{B1}$ | $L_{A1955}$ | $R_{B6}$ | $R_{A452}$ | $R_{B1}$ | $R_{A454}$ |
| $L_{A1763}$ | $R_{B6}$ | $R_{A453}$ | $R_{B1}$ | $R_{B1}$ | $L_{A1956}$ | $R_{B6}$ | $R_{A453}$ | $R_{B1}$ | $R_{A454}$ |
| $L_{A1764}$ | $R_{B6}$ | $R_{A454}$ | $R_{B1}$ | $R_{B1}$ | $L_{A1957}$ | $R_{B6}$ | $R_{A454}$ | $R_{B1}$ | $R_{A454}$ |
| $L_{A1765}$ | $R_{B6}$ | $R_{C3}$ | $R_{B1}$ | $R_{B1}$ | $L_{A1958}$ | $R_{B6}$ | $R_{C3}$ | $R_{B1}$ | $R_{A454}$ |
| $L_{A1766}$ | $R_{B6}$ | $R_{C4}$ | $R_{B1}$ | $R_{B1}$ | $L_{A1959}$ | $R_{B6}$ | $R_{C4}$ | $R_{B1}$ | $R_{A454}$ |
| $L_{A1767}$ | $R_{B6}$ | $R_{C8}$ | $R_{B1}$ | $R_{B1}$ | $L_{A1960}$ | $R_{B6}$ | $R_{C8}$ | $R_{B1}$ | $R_{A454}$ |
| $L_{A1768}$ | $R_{B6}$ | $R_{B1}$ | $R_{B1}$ | $R_{B1}$ | $L_{A1961}$ | $R_{B6}$ | $R_{B1}$ | $R_{B1}$ | $R_{A454}$ |
| $L_{A1769}$ | $R_{B6}$ | $R_{B1}$ | $R_{B3}$ | $R_{B1}$ | $L_{A1962}$ | $R_{B6}$ | $R_{B1}$ | $R_{B3}$ | $R_{A454}$ |
| $L_{A1770}$ | $R_{B6}$ | $R_{B1}$ | $R_{B4}$ | $R_{B1}$ | $L_{A1963}$ | $R_{B6}$ | $R_{B1}$ | $R_{B4}$ | $R_{A454}$ |
| $L_{A1771}$ | $R_{B6}$ | $R_{B1}$ | $R_{B5}$ | $R_{B1}$ | $L_{A1964}$ | $R_{B6}$ | $R_{B1}$ | $R_{B5}$ | $R_{A454}$ |
| $L_{A1772}$ | $R_{B6}$ | $R_{B1}$ | $R_{B6}$ | $R_{B1}$ | $L_{A1965}$ | $R_{B6}$ | $R_{B1}$ | $R_{B6}$ | $R_{A454}$ |
| $L_{A1773}$ | $R_{B6}$ | $R_{B1}$ | $R_{B7}$ | $R_{B1}$ | $L_{A1966}$ | $R_{B6}$ | $R_{B1}$ | $R_{B7}$ | $R_{A454}$ |
| $L_{A1774}$ | $R_{B6}$ | $R_{B1}$ | $R_{B24}$ | $R_{B1}$ | $L_{A1967}$ | $R_{B6}$ | $R_{B1}$ | $R_{B24}$ | $R_{A454}$ |
| $L_{A1775}$ | $R_{B6}$ | $R_{B1}$ | $R_{B25}$ | $R_{B1}$ | $L_{A1968}$ | $R_{B6}$ | $R_{B1}$ | $R_{B25}$ | $R_{A454}$ |
| $L_{A1776}$ | $R_{B6}$ | $R_{B1}$ | $R_{A3}$ | $R_{B1}$ | $L_{A1969}$ | $R_{B6}$ | $R_{B1}$ | $R_{A3}$ | $R_{A454}$ |
| $L_{A1777}$ | $R_{B6}$ | $R_{B1}$ | $R_{A434}$ | $R_{B1}$ | $L_{A1970}$ | $R_{B6}$ | $R_{B1}$ | $R_{A434}$ | $R_{A454}$ |

In some embodiments of the compound, the first ligand $L_A$ is selected from the group consisting of ligands LII-$L_{Ai}$ that are based on a structure of Formula LII

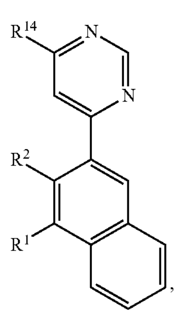

ligands LIII-$L_{Ai}$ that are based on a structure of Formula LIII

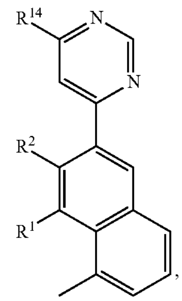

ligands LIV-$L_{Ai}$ that are based on a structure of Formula LIN

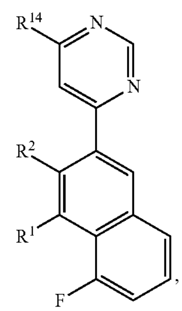

ligands LV-$L_{Ai}$ that are based on a structure of Formula LV

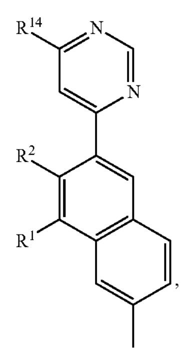

ligands LVI-$L_{Ai}$ that are based on a structure of Formula LVI

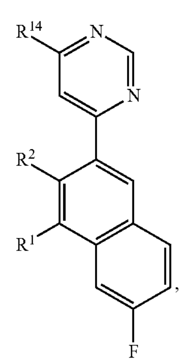

wherein i is an integer from 1971 to 2186 and for each i, $R^1$, $R^2$, and $R^{14}$ in the formulas LII through LVI are defined as follows:

| $L_{Ai}$ | $R^1$ | $R^{14}$ | $R^2$ | $L_{Ai}$ | $R^1$ | $R^{14}$ | $R^2$ | $L_{Ai}$ | $R^1$ | $R^{14}$ | $R^2$ |
|---|---|---|---|---|---|---|---|---|---|---|---|
| $L_{A1971}$ | $R_{B3}$ | H | H | $L_{A2043}$ | $R_{B15}$ | H | H | $L_{A2115}$ | H | H | $R_{A454}$ |
| $L_{A1972}$ | $R_{B3}$ | $R_{B1}$ | H | $L_{A2044}$ | $R_{B15}$ | $R_{B1}$ | H | $L_{A2116}$ | H | $R_{B1}$ | $R_{A454}$ |
| $L_{A1973}$ | $R_{B3}$ | $R_{B3}$ | H | $L_{A2045}$ | $R_{B15}$ | $R_{B3}$ | H | $L_{A2117}$ | H | $R_{B3}$ | $R_{A454}$ |
| $L_{A1974}$ | $R_{B3}$ | $R_{B4}$ | H | $L_{A2046}$ | $R_{B15}$ | $R_{B4}$ | H | $L_{A2118}$ | H | $R_{B4}$ | $R_{A454}$ |
| $L_{A1975}$ | $R_{B3}$ | $R_{B5}$ | H | $L_{A2047}$ | $R_{B15}$ | $R_{B5}$ | H | $L_{A2119}$ | H | $R_{B5}$ | $R_{A454}$ |
| $L_{A1976}$ | $R_{B3}$ | $R_{B6}$ | H | $L_{A2048}$ | $R_{B15}$ | $R_{B6}$ | H | $L_{A2120}$ | H | $R_{B6}$ | $R_{A454}$ |
| $L_{A1977}$ | $R_{B3}$ | $R_{B7}$ | H | $L_{A2049}$ | $R_{B15}$ | $R_{B7}$ | H | $L_{A2121}$ | H | $R_{B7}$ | $R_{A454}$ |
| $L_{A1978}$ | $R_{B3}$ | $R_{B24}$ | H | $L_{A2050}$ | $R_{B15}$ | $R_{B24}$ | H | $L_{A2122}$ | H | $R_{B24}$ | $R_{A454}$ |
| $L_{A1979}$ | $R_{B3}$ | $R_{B25}$ | H | $L_{A2051}$ | $R_{B15}$ | $R_{B25}$ | H | $L_{A2123}$ | H | $R_{B25}$ | $R_{A454}$ |
| $L_{A1980}$ | $R_{B3}$ | $R_{A3}$ | H | $L_{A2052}$ | $R_{B15}$ | $R_{A3}$ | H | $L_{A2124}$ | H | $R_{A3}$ | $R_{A454}$ |
| $L_{A1981}$ | $R_{B3}$ | $R_{A434}$ | H | $L_{A2053}$ | $R_{B15}$ | $R_{A434}$ | H | $L_{A2125}$ | H | $R_{A434}$ | $R_{A454}$ |
| $L_{A1982}$ | $R_{B3}$ | $R_{A444}$ | H | $L_{A2054}$ | $R_{B15}$ | $R_{A444}$ | H | $L_{A2126}$ | H | $R_{A444}$ | $R_{A454}$ |
| $L_{A1983}$ | $R_{B3}$ | $R_{A452}$ | H | $L_{A2055}$ | $R_{B15}$ | $R_{A452}$ | H | $L_{A2127}$ | H | $R_{A452}$ | $R_{A454}$ |
| $L_{A1984}$ | $R_{B3}$ | $R_{A453}$ | H | $L_{A2056}$ | $R_{B15}$ | $R_{A453}$ | H | $L_{A2128}$ | H | $R_{A453}$ | $R_{A454}$ |
| $L_{A1985}$ | $R_{B3}$ | $R_{A454}$ | H | $L_{A2057}$ | $R_{B15}$ | $R_{A454}$ | H | $L_{A2129}$ | H | $R_{A454}$ | $R_{A454}$ |
| $L_{A1986}$ | $R_{B3}$ | $R_{C3}$ | H | $L_{A2058}$ | $R_{B15}$ | $R_{C3}$ | H | $L_{A2130}$ | H | $R_{C3}$ | $R_{A454}$ |
| $L_{A1987}$ | $R_{B3}$ | $R_{C4}$ | H | $L_{A2059}$ | $R_{B15}$ | $R_{C4}$ | H | $L_{A2131}$ | H | $R_{C4}$ | $R_{A454}$ |
| $L_{A1988}$ | $R_{B3}$ | $R_{C8}$ | H | $L_{A2060}$ | $R_{B15}$ | $R_{C8}$ | H | $L_{A2132}$ | H | $R_{C8}$ | $R_{A454}$ |
| $L_{A1989}$ | $R_{B6}$ | H | H | $L_{A2061}$ | $R_{A444}$ | H | H | $L_{A2133}$ | $R_{B1}$ | H | $R_{A454}$ |
| $L_{A1990}$ | $R_{B6}$ | $R_{B1}$ | H | $L_{A2062}$ | $R_{A444}$ | $R_{B1}$ | H | $L_{A2134}$ | $R_{B1}$ | $R_{B1}$ | $R_{A454}$ |
| $L_{A1991}$ | $R_{B6}$ | $R_{B3}$ | H | $L_{A2063}$ | $R_{A444}$ | $R_{B3}$ | H | $L_{A2135}$ | $R_{B1}$ | $R_{B3}$ | $R_{A454}$ |
| $L_{A1992}$ | $R_{B6}$ | $R_{B4}$ | H | $L_{A2064}$ | $R_{A444}$ | $R_{B4}$ | H | $L_{A2136}$ | $R_{B1}$ | $R_{B4}$ | $R_{A454}$ |
| $L_{A1993}$ | $R_{B6}$ | $R_{B5}$ | H | $L_{A2065}$ | $R_{A444}$ | $R_{B5}$ | H | $L_{A2137}$ | $R_{B1}$ | $R_{B5}$ | $R_{A454}$ |
| $L_{A1994}$ | $R_{B6}$ | $R_{B6}$ | H | $L_{A2066}$ | $R_{A444}$ | $R_{B6}$ | H | $L_{A2138}$ | $R_{B1}$ | $R_{B6}$ | $R_{A454}$ |
| $L_{A1995}$ | $R_{B6}$ | $R_{B7}$ | H | $L_{A2067}$ | $R_{A444}$ | $R_{B7}$ | H | $L_{A2139}$ | $R_{B1}$ | $R_{B7}$ | $R_{A454}$ |
| $L_{A1996}$ | $R_{B6}$ | $R_{B24}$ | H | $L_{A2068}$ | $R_{A444}$ | $R_{B24}$ | H | $L_{A2140}$ | $R_{B1}$ | $R_{B24}$ | $R_{A454}$ |
| $L_{A1997}$ | $R_{B6}$ | $R_{B25}$ | H | $L_{A2069}$ | $R_{A444}$ | $R_{B25}$ | H | $L_{A2141}$ | $R_{B1}$ | $R_{B25}$ | $R_{A454}$ |
| $L_{A1998}$ | $R_{B6}$ | $R_{A3}$ | H | $L_{A2070}$ | $R_{A444}$ | $R_{A3}$ | H | $L_{A2142}$ | $R_{B1}$ | $R_{A3}$ | $R_{A454}$ |
| $L_{A1999}$ | $R_{B6}$ | $R_{A434}$ | H | $L_{A2071}$ | $R_{A444}$ | $R_{A434}$ | H | $L_{A2143}$ | $R_{B1}$ | $R_{A434}$ | $R_{A454}$ |
| $L_{A2000}$ | $R_{B6}$ | $R_{A444}$ | H | $L_{A2072}$ | $R_{A444}$ | $R_{A444}$ | H | $L_{A2144}$ | $R_{B1}$ | $R_{A444}$ | $R_{A454}$ |
| $L_{A2001}$ | $R_{B6}$ | $R_{A452}$ | H | $L_{A2073}$ | $R_{A444}$ | $R_{A452}$ | H | $L_{A2145}$ | $R_{B1}$ | $R_{A452}$ | $R_{A454}$ |
| $L_{A2002}$ | $R_{B6}$ | $R_{A453}$ | H | $L_{A2074}$ | $R_{A444}$ | $R_{A453}$ | H | $L_{A2146}$ | $R_{B1}$ | $R_{A453}$ | $R_{A454}$ |
| $L_{A2003}$ | $R_{B6}$ | $R_{A454}$ | H | $L_{A2075}$ | $R_{A444}$ | $R_{A454}$ | H | $L_{A2147}$ | $R_{B1}$ | $R_{A454}$ | $R_{A454}$ |
| $L_{A2004}$ | $R_{B6}$ | $R_{C3}$ | H | $L_{A2076}$ | $R_{A444}$ | $R_{C3}$ | H | $L_{A2148}$ | $R_{B1}$ | $R_{C3}$ | $R_{A454}$ |
| $L_{A2005}$ | $R_{B6}$ | $R_{C4}$ | H | $L_{A2077}$ | $R_{A444}$ | $R_{C4}$ | H | $L_{A2149}$ | $R_{B1}$ | $R_{C4}$ | $R_{A454}$ |
| $L_{A2006}$ | $R_{B6}$ | $R_{C8}$ | H | $L_{A2078}$ | $R_{A444}$ | $R_{C8}$ | H | $L_{A2150}$ | $R_{B1}$ | $R_{C8}$ | $R_{A454}$ |
| $L_{A2007}$ | $R_{B7}$ | H | H | $L_{A2079}$ | H | H | $R_{B1}$ | $L_{A2151}$ | $R_{A454}$ | H | $R_{A454}$ |
| $L_{A2008}$ | $R_{B7}$ | $R_{B1}$ | H | $L_{A2080}$ | H | $R_{B1}$ | $R_{B1}$ | $L_{A2152}$ | $R_{A454}$ | $R_{B1}$ | $R_{A454}$ |
| $L_{A2009}$ | $R_{B7}$ | $R_{B3}$ | H | $L_{A2081}$ | H | $R_{B3}$ | $R_{B1}$ | $L_{A2153}$ | $R_{A454}$ | $R_{B3}$ | $R_{A454}$ |
| $L_{A2010}$ | $R_{B7}$ | $R_{B4}$ | H | $L_{A2082}$ | H | $R_{B4}$ | $R_{B1}$ | $L_{A2154}$ | $R_{A454}$ | $R_{B4}$ | $R_{A454}$ |
| $L_{A2011}$ | $R_{B7}$ | $R_{B5}$ | H | $L_{A2083}$ | H | $R_{B5}$ | $R_{B1}$ | $L_{A2155}$ | $R_{A454}$ | $R_{B5}$ | $R_{A454}$ |
| $L_{A2012}$ | $R_{B7}$ | $R_{B6}$ | H | $L_{A2084}$ | H | $R_{B6}$ | $R_{B1}$ | $L_{A2156}$ | $R_{A454}$ | $R_{B6}$ | $R_{A454}$ |
| $L_{A2013}$ | $R_{B7}$ | $R_{B7}$ | H | $L_{A2085}$ | H | $R_{B7}$ | $R_{B1}$ | $L_{A2157}$ | $R_{A454}$ | $R_{B7}$ | $R_{A454}$ |
| $L_{A2014}$ | $R_{B7}$ | $R_{B24}$ | H | $L_{A2086}$ | H | $R_{B24}$ | $R_{B1}$ | $L_{A2158}$ | $R_{A454}$ | $R_{B24}$ | $R_{A454}$ |
| $L_{A2015}$ | $R_{B7}$ | $R_{B25}$ | H | $L_{A2087}$ | H | $R_{B25}$ | $R_{B1}$ | $L_{A2159}$ | $R_{A454}$ | $R_{B25}$ | $R_{A454}$ |
| $L_{A2016}$ | $R_{B7}$ | $R_{A3}$ | H | $L_{A2088}$ | H | $R_{A3}$ | $R_{B1}$ | $L_{A2160}$ | $R_{A454}$ | $R_{A3}$ | $R_{A454}$ |
| $L_{A2017}$ | $R_{B7}$ | $R_{A434}$ | H | $L_{A2089}$ | H | $R_{A434}$ | $R_{B1}$ | $L_{A2161}$ | $R_{A454}$ | $R_{A434}$ | $R_{A454}$ |
| $L_{A2018}$ | $R_{B7}$ | $R_{A444}$ | H | $L_{A2090}$ | H | $R_{A444}$ | $R_{B1}$ | $L_{A2162}$ | $R_{A454}$ | $R_{A444}$ | $R_{A454}$ |
| $L_{A2019}$ | $R_{B7}$ | $R_{A452}$ | H | $L_{A2091}$ | H | $R_{A452}$ | $R_{B1}$ | $L_{A2163}$ | $R_{A454}$ | $R_{A452}$ | $R_{A454}$ |
| $L_{A2020}$ | $R_{B7}$ | $R_{A453}$ | H | $L_{A2092}$ | H | $R_{A453}$ | $R_{B1}$ | $L_{A2164}$ | $R_{A454}$ | $R_{A453}$ | $R_{A454}$ |
| $L_{A2021}$ | $R_{B7}$ | $R_{A454}$ | H | $L_{A2093}$ | H | $R_{A454}$ | $R_{B1}$ | $L_{A2165}$ | $R_{A454}$ | $R_{A454}$ | $R_{A454}$ |
| $L_{A2022}$ | $R_{B7}$ | $R_{C3}$ | H | $L_{A2094}$ | H | $R_{C3}$ | $R_{B1}$ | $L_{A2166}$ | $R_{A454}$ | $R_{C3}$ | $R_{A454}$ |
| $L_{A2023}$ | $R_{B7}$ | $R_{C4}$ | H | $L_{A2095}$ | H | $R_{C4}$ | $R_{B1}$ | $L_{A2167}$ | $R_{A454}$ | $R_{C4}$ | $R_{A454}$ |
| $L_{A2024}$ | $R_{B7}$ | $R_{C8}$ | H | $L_{A2096}$ | H | $R_{C8}$ | $R_{B1}$ | $L_{A2168}$ | $R_{A454}$ | $R_{C8}$ | $R_{A454}$ |
| $L_{A2025}$ | $R_{B9}$ | H | H | $L_{A2097}$ | $R_{B1}$ | H | $R_{B1}$ | $L_{A2169}$ | $R_{B6}$ | H | $R_{B1}$ |
| $L_{A2026}$ | $R_{B9}$ | $R_{B1}$ | H | $L_{A2098}$ | $R_{B1}$ | $R_{B1}$ | $R_{B1}$ | $L_{A2170}$ | $R_{B6}$ | $R_{B1}$ | $R_{B1}$ |
| $L_{A2027}$ | $R_{B9}$ | $R_{B3}$ | H | $L_{A2099}$ | $R_{B1}$ | $R_{B3}$ | $R_{B1}$ | $L_{A2171}$ | $R_{B6}$ | $R_{B3}$ | $R_{B1}$ |
| $L_{A2028}$ | $R_{B9}$ | $R_{B4}$ | H | $L_{A2100}$ | $R_{B1}$ | $R_{B4}$ | $R_{B1}$ | $L_{A2172}$ | $R_{B6}$ | $R_{B4}$ | $R_{B1}$ |
| $L_{A2029}$ | $R_{B9}$ | $R_{B5}$ | H | $L_{A2101}$ | $R_{B1}$ | $R_{B5}$ | $R_{B1}$ | $L_{A2173}$ | $R_{B6}$ | $R_{B5}$ | $R_{B1}$ |
| $L_{A2030}$ | $R_{B9}$ | $R_{B6}$ | H | $L_{A2102}$ | $R_{B1}$ | $R_{B6}$ | $R_{B1}$ | $L_{A2174}$ | $R_{B6}$ | $R_{B6}$ | $R_{B1}$ |
| $L_{A2031}$ | $R_{B9}$ | $R_{B7}$ | H | $L_{A2103}$ | $R_{B1}$ | $R_{B7}$ | $R_{B1}$ | $L_{A2175}$ | $R_{B6}$ | $R_{B7}$ | $R_{B1}$ |
| $L_{A2032}$ | $R_{B9}$ | $R_{B24}$ | H | $L_{A2104}$ | $R_{B1}$ | $R_{B24}$ | $R_{B1}$ | $L_{A2176}$ | $R_{B6}$ | $R_{B24}$ | $R_{B1}$ |
| $L_{A2033}$ | $R_{B9}$ | $R_{B25}$ | H | $L_{A2105}$ | $R_{B1}$ | $R_{B25}$ | $R_{B1}$ | $L_{A2177}$ | $R_{B6}$ | $R_{B25}$ | $R_{B1}$ |
| $L_{A2034}$ | $R_{B9}$ | $R_{A3}$ | H | $L_{A2106}$ | $R_{B1}$ | $R_{A3}$ | $R_{B1}$ | $L_{A2178}$ | $R_{B6}$ | $R_{A3}$ | $R_{B1}$ |
| $L_{A2035}$ | $R_{B9}$ | $R_{A434}$ | H | $L_{A2107}$ | $R_{B1}$ | $R_{A434}$ | $R_{B1}$ | $L_{A2179}$ | $R_{B6}$ | $R_{A434}$ | $R_{B1}$ |
| $L_{A2036}$ | $R_{B9}$ | $R_{A444}$ | H | $L_{A2108}$ | $R_{B1}$ | $R_{A444}$ | $R_{B1}$ | $L_{A2180}$ | $R_{B6}$ | $R_{A444}$ | $R_{B1}$ |
| $L_{A2037}$ | $R_{B9}$ | $R_{A452}$ | H | $L_{A2109}$ | $R_{B1}$ | $R_{A452}$ | $R_{B1}$ | $L_{A2181}$ | $R_{B6}$ | $R_{A452}$ | $R_{B1}$ |
| $L_{A2038}$ | $R_{B9}$ | $R_{A453}$ | H | $L_{A2110}$ | $R_{B1}$ | $R_{A453}$ | $R_{B1}$ | $L_{A2182}$ | $R_{B6}$ | $R_{A453}$ | $R_{B1}$ |
| $L_{A2039}$ | $R_{B9}$ | $R_{A454}$ | H | $L_{A2111}$ | $R_{B1}$ | $R_{A454}$ | $R_{B1}$ | $L_{A2183}$ | $R_{B6}$ | $R_{A454}$ | $R_{B1}$ |
| $L_{A2040}$ | $R_{B9}$ | $R_{C3}$ | H | $L_{A2112}$ | $R_{B1}$ | $R_{C3}$ | $R_{B1}$ | $L_{A2184}$ | $R_{B6}$ | $R_{C3}$ | $R_{B1}$ |
| $L_{A2041}$ | $R_{B9}$ | $R_{C4}$ | H | $L_{A2113}$ | $R_{B1}$ | $R_{C4}$ | $R_{B1}$ | $L_{A2185}$ | $R_{B6}$ | $R_{C4}$ | $R_{B1}$ |
| $L_{A2042}$ | $R_{B9}$ | $R_{C8}$ | H | $L_{A2114}$ | $R_{B1}$ | $R_{C8}$ | $R_{B1}$ | $L_{A2186}$ | $R_{B6}$ | $R_{C8}$ | $R_{B1}$ |

In some embodiments of Formula IA, the first ligand $L_A$ is selected from the group consisting of:

ligands LVII-$L_{Ai}$ that are based on a structure of Formula LVII

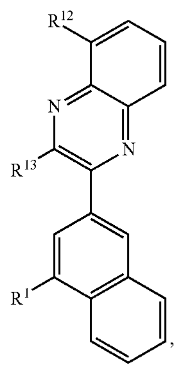

ligands LVIII-$L_{Ai}$ that are based on a structure of Formula LVIII

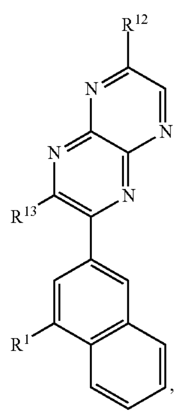

ligands LIX-$L_{Ai}$ that are based on a structure of Formula LIX

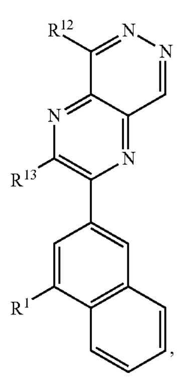

ligands LX-$L_{Ai}$ that are based on a structure of Formula LX

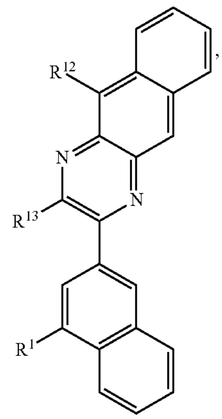

ligands LXI-$L_{Ai}$ that are based on a structure of Formula LXI

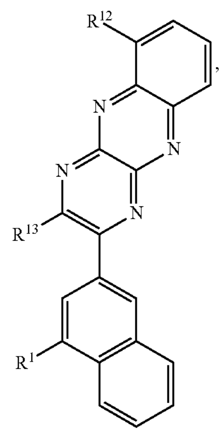

wherein i is an integer from 2187 to 2402 and for each i, $R^1$, $R^{12}$, and $R^{13}$ in the formulas LVII through LXI are defined as follows:

| $L_{Ai}$ | $R^1$ | $R^{12}$ | $R^{13}$ | $L_{Ai}$ | $R^1$ | $R^{12}$ | $R^{13}$ | $L_{Ai}$ | $R^1$ | $R^{12}$ | $R^{13}$ |
|---|---|---|---|---|---|---|---|---|---|---|---|
| $L_{A2187}$ | $R_{B3}$ | H | $R_{B1}$ | $L_{A2259}$ | $R_{B6}$ | H | $R_{B1}$ | $L_{A2331}$ | $R_{B6}$ | H | $R_{B1}$ |
| $L_{A2188}$ | $R_{B3}$ | $R_{B1}$ | $R_{B1}$ | $L_{A2260}$ | $R_{B6}$ | $R_{B1}$ | $R_{B1}$ | $L_{A2332}$ | $R_{B6}$ | $R_{B1}$ | $R_{B1}$ |
| $L_{A2189}$ | $R_{B3}$ | $R_{B3}$ | $R_{B1}$ | $L_{A2261}$ | $R_{B6}$ | $R_{B3}$ | $R_{B1}$ | $L_{A2333}$ | $R_{B6}$ | $R_{B3}$ | $R_{B1}$ |
| $L_{A2190}$ | $R_{B3}$ | $R_{B4}$ | $R_{B1}$ | $L_{A2262}$ | $R_{B6}$ | $R_{B4}$ | $R_{B1}$ | $L_{A2334}$ | $R_{B6}$ | $R_{B4}$ | $R_{B1}$ |
| $L_{A2191}$ | $R_{B3}$ | $R_{B5}$ | $R_{B1}$ | $L_{A2263}$ | $R_{B6}$ | $R_{B5}$ | $R_{B1}$ | $L_{A2335}$ | $R_{B6}$ | $R_{B5}$ | $R_{B1}$ |
| $L_{A2192}$ | $R_{B3}$ | $R_{B6}$ | $R_{B1}$ | $L_{A2264}$ | $R_{B6}$ | $R_{B6}$ | $R_{B1}$ | $L_{A2336}$ | $R_{B6}$ | $R_{B6}$ | $R_{B1}$ |
| $L_{A2193}$ | $R_{B3}$ | $R_{B7}$ | $R_{B1}$ | $L_{A2265}$ | $R_{B6}$ | $R_{B7}$ | $R_{B1}$ | $L_{A2337}$ | $R_{B6}$ | $R_{B7}$ | $R_{B1}$ |
| $L_{A2194}$ | $R_{B3}$ | $R_{B24}$ | $R_{B1}$ | $L_{A2266}$ | $R_{B6}$ | $R_{B24}$ | $R_{B1}$ | $L_{A2338}$ | $R_{B6}$ | $R_{B24}$ | $R_{B1}$ |
| $L_{A2195}$ | $R_{B3}$ | $R_{B25}$ | $R_{B1}$ | $L_{A2267}$ | $R_{B6}$ | $R_{B25}$ | $R_{B1}$ | $L_{A2339}$ | $R_{B6}$ | $R_{B25}$ | $R_{B1}$ |
| $L_{A2196}$ | $R_{B3}$ | $R_{A3}$ | $R_{B1}$ | $L_{A2268}$ | $R_{B6}$ | $R_{A3}$ | $R_{B1}$ | $L_{A2340}$ | $R_{B6}$ | $R_{A3}$ | $R_{B1}$ |
| $L_{A2197}$ | $R_{B3}$ | $R_{A34}$ | $R_{B1}$ | $L_{A2269}$ | $R_{B6}$ | $R_{A34}$ | $R_{B1}$ | $L_{A2341}$ | $R_{B6}$ | $R_{A34}$ | $R_{B1}$ |
| $L_{A2198}$ | $R_{B3}$ | $R_{A44}$ | $R_{B1}$ | $L_{A2270}$ | $R_{B6}$ | $R_{A44}$ | $R_{B1}$ | $L_{A2342}$ | $R_{B6}$ | $R_{A44}$ | $R_{B1}$ |
| $L_{A2199}$ | $R_{B3}$ | $R_{A52}$ | $R_{B1}$ | $L_{A2271}$ | $R_{B6}$ | $R_{A52}$ | $R_{B1}$ | $L_{A2343}$ | $R_{B6}$ | $R_{A52}$ | $R_{B1}$ |
| $L_{A2200}$ | $R_{B3}$ | $R_{A53}$ | $R_{B1}$ | $L_{A2272}$ | $R_{B6}$ | $R_{A53}$ | $R_{B1}$ | $L_{A2344}$ | $R_{B6}$ | $R_{A53}$ | $R_{B1}$ |
| $L_{A2201}$ | $R_{B3}$ | $R_{A54}$ | $R_{B1}$ | $L_{A2273}$ | $R_{B6}$ | $R_{A54}$ | $R_{B1}$ | $L_{A2345}$ | $R_{B6}$ | $R_{A54}$ | $R_{B1}$ |
| $L_{A2202}$ | $R_{B3}$ | $R_{C3}$ | $R_{B1}$ | $L_{A2274}$ | $R_{B6}$ | $R_{C3}$ | $R_{B1}$ | $L_{A2346}$ | $R_{B6}$ | $R_{C3}$ | $R_{B1}$ |
| $L_{A2203}$ | $R_{B3}$ | $R_{C4}$ | $R_{B1}$ | $L_{A2275}$ | $R_{B6}$ | $R_{C4}$ | $R_{B1}$ | $L_{A2347}$ | $R_{B6}$ | $R_{C4}$ | $R_{B1}$ |
| $L_{A2204}$ | $R_{B3}$ | $R_{C8}$ | $R_{B1}$ | $L_{A2276}$ | $R_{B6}$ | $R_{C8}$ | $R_{B1}$ | $L_{A2348}$ | $R_{B6}$ | $R_{C8}$ | $R_{B1}$ |
| $L_{A2205}$ | $R_{B3}$ | H | $R_{B3}$ | $L_{A2277}$ | $R_{B6}$ | H | $R_{B3}$ | $L_{A2349}$ | $R_{B6}$ | H | $R_{B3}$ |
| $L_{A2206}$ | $R_{B3}$ | $R_{B1}$ | $R_{B3}$ | $L_{A2278}$ | $R_{B6}$ | $R_{B1}$ | $R_{B3}$ | $L_{A2350}$ | $R_{B6}$ | $R_{B1}$ | $R_{B3}$ |
| $L_{A2207}$ | $R_{B3}$ | $R_{B3}$ | $R_{B3}$ | $L_{A2279}$ | $R_{B6}$ | $R_{B3}$ | $R_{B3}$ | $L_{A2351}$ | $R_{B6}$ | $R_{B3}$ | $R_{B3}$ |
| $L_{A2208}$ | $R_{B3}$ | $R_{B4}$ | $R_{B3}$ | $L_{A2280}$ | $R_{B6}$ | $R_{B4}$ | $R_{B3}$ | $L_{A2352}$ | $R_{B6}$ | $R_{B4}$ | $R_{B3}$ |
| $L_{A2209}$ | $R_{B3}$ | $R_{B5}$ | $R_{B3}$ | $L_{A2281}$ | $R_{B6}$ | $R_{B5}$ | $R_{B3}$ | $L_{A2353}$ | $R_{B6}$ | $R_{B5}$ | $R_{B3}$ |
| $L_{A2210}$ | $R_{B3}$ | $R_{B6}$ | $R_{B3}$ | $L_{A2282}$ | $R_{B6}$ | $R_{B6}$ | $R_{B3}$ | $L_{A2354}$ | $R_{B6}$ | $R_{B6}$ | $R_{B3}$ |
| $L_{A2211}$ | $R_{B3}$ | $R_{B7}$ | $R_{B3}$ | $L_{A2283}$ | $R_{B6}$ | $R_{B7}$ | $R_{B3}$ | $L_{A2355}$ | $R_{B6}$ | $R_{B7}$ | $R_{B3}$ |
| $L_{A2212}$ | $R_{B3}$ | $R_{B24}$ | $R_{B3}$ | $L_{A2284}$ | $R_{B6}$ | $R_{B24}$ | $R_{B3}$ | $L_{A2356}$ | $R_{B6}$ | $R_{B24}$ | $R_{B3}$ |

-continued

| $L_{Ai}$ | $R^1$ | $R^{12}$ | $R^{13}$ | $L_{Ai}$ | $R^1$ | $R^{12}$ | $R^{13}$ | $L_{Ai}$ | $R^1$ | $R^{12}$ | $R^{13}$ |
|---|---|---|---|---|---|---|---|---|---|---|---|
| $L_{A2213}$ | $R_{B3}$ | $R_{B25}$ | $R_{B3}$ | $L_{A2285}$ | $R_{B6}$ | $R_{B25}$ | $R_{B3}$ | $L_{A2357}$ | $R_{B6}$ | $R_{B25}$ | $R_{B3}$ |
| $L_{A2214}$ | $R_{B3}$ | $R_{A3}$ | $R_{B3}$ | $L_{A2286}$ | $R_{B6}$ | $R_{A3}$ | $R_{B3}$ | $L_{A2358}$ | $R_{B6}$ | $R_{A3}$ | $R_{B3}$ |
| $L_{A2215}$ | $R_{B3}$ | $R_{A34}$ | $R_{B3}$ | $L_{A2287}$ | $R_{B6}$ | $R_{A34}$ | $R_{B3}$ | $L_{A2359}$ | $R_{B6}$ | $R_{A34}$ | $R_{B3}$ |
| $L_{A2216}$ | $R_{B3}$ | $R_{A44}$ | $R_{B3}$ | $L_{A2288}$ | $R_{B6}$ | $R_{A44}$ | $R_{B3}$ | $L_{A2360}$ | $R_{B6}$ | $R_{A44}$ | $R_{B3}$ |
| $L_{A2217}$ | $R_{B3}$ | $R_{A52}$ | $R_{B3}$ | $L_{A2289}$ | $R_{B6}$ | $R_{A52}$ | $R_{B3}$ | $L_{A2361}$ | $R_{B6}$ | $R_{A52}$ | $R_{B3}$ |
| $L_{A2218}$ | $R_{B3}$ | $R_{A53}$ | $R_{B3}$ | $L_{A2290}$ | $R_{B6}$ | $R_{A53}$ | $R_{B3}$ | $L_{A2362}$ | $R_{B6}$ | $R_{A53}$ | $R_{B3}$ |
| $L_{A2219}$ | $R_{B3}$ | $R_{A54}$ | $R_{B3}$ | $L_{A2291}$ | $R_{B6}$ | $R_{A54}$ | $R_{B3}$ | $L_{A2363}$ | $R_{B6}$ | $R_{A54}$ | $R_{B3}$ |
| $L_{A2220}$ | $R_{B3}$ | $R_{C3}$ | $R_{B3}$ | $L_{A2292}$ | $R_{B6}$ | $R_{C3}$ | $R_{B3}$ | $L_{A2364}$ | $R_{B6}$ | $R_{C3}$ | $R_{B3}$ |
| $L_{A2221}$ | $R_{B3}$ | $R_{C4}$ | $R_{B3}$ | $L_{A2293}$ | $R_{B6}$ | $R_{C4}$ | $R_{B3}$ | $L_{A2365}$ | $R_{B6}$ | $R_{C4}$ | $R_{B3}$ |
| $L_{A2222}$ | $R_{B3}$ | $R_{C8}$ | $R_{B3}$ | $L_{A2294}$ | $R_{B6}$ | $R_{C8}$ | $R_{B3}$ | $L_{A2366}$ | $R_{B6}$ | $R_{C8}$ | $R_{B3}$ |
| $L_{A2223}$ | $R_{B3}$ | H | $R_{C3}$ | $L_{A2295}$ | $R_{B6}$ | H | $R_{C3}$ | $L_{A2367}$ | $R_{B6}$ | H | $R_{C3}$ |
| $L_{A2224}$ | $R_{B3}$ | $R_{B1}$ | $R_{C3}$ | $L_{A2296}$ | $R_{B6}$ | $R_{B1}$ | $R_{C3}$ | $L_{A2368}$ | $R_{B6}$ | $R_{B1}$ | $R_{C3}$ |
| $L_{A2225}$ | $R_{B3}$ | $R_{B3}$ | $R_{C3}$ | $L_{A2297}$ | $R_{B6}$ | $R_{B3}$ | $R_{C3}$ | $L_{A2369}$ | $R_{B6}$ | $R_{B3}$ | $R_{C3}$ |
| $L_{A2226}$ | $R_{B3}$ | $R_{B4}$ | $R_{C3}$ | $L_{A2298}$ | $R_{B6}$ | $R_{B4}$ | $R_{C3}$ | $L_{A2370}$ | $R_{B6}$ | $R_{B4}$ | $R_{C3}$ |
| $L_{A2227}$ | $R_{B3}$ | $R_{B5}$ | $R_{C3}$ | $L_{A2299}$ | $R_{B6}$ | $R_{B5}$ | $R_{C3}$ | $L_{A2371}$ | $R_{B6}$ | $R_{B5}$ | $R_{C3}$ |
| $L_{A2228}$ | $R_{B3}$ | $R_{B6}$ | $R_{C3}$ | $L_{A2300}$ | $R_{B6}$ | $R_{B6}$ | $R_{C3}$ | $L_{A2372}$ | $R_{B6}$ | $R_{B6}$ | $R_{C3}$ |
| $L_{A2229}$ | $R_{B3}$ | $R_{B7}$ | $R_{C3}$ | $L_{A2301}$ | $R_{B6}$ | $R_{B7}$ | $R_{C3}$ | $L_{A2373}$ | $R_{B6}$ | $R_{B7}$ | $R_{C3}$ |
| $L_{A2230}$ | $R_{B3}$ | $R_{B24}$ | $R_{C3}$ | $L_{A2302}$ | $R_{B6}$ | $R_{B24}$ | $R_{C3}$ | $L_{A2374}$ | $R_{B6}$ | $R_{B24}$ | $R_{C3}$ |
| $L_{A2231}$ | $R_{B3}$ | $R_{B25}$ | $R_{C3}$ | $L_{A2303}$ | $R_{B6}$ | $R_{B25}$ | $R_{C3}$ | $L_{A2375}$ | $R_{B6}$ | $R_{B25}$ | $R_{C3}$ |
| $L_{A2232}$ | $R_{B3}$ | $R_{A3}$ | $R_{C3}$ | $L_{A2304}$ | $R_{B6}$ | $R_{A3}$ | $R_{C3}$ | $L_{A2376}$ | $R_{B6}$ | $R_{A3}$ | $R_{C3}$ |
| $L_{A2233}$ | $R_{B3}$ | $R_{A34}$ | $R_{C3}$ | $L_{A2305}$ | $R_{B6}$ | $R_{A34}$ | $R_{C3}$ | $L_{A2377}$ | $R_{B6}$ | $R_{A34}$ | $R_{C3}$ |
| $L_{A2234}$ | $R_{B3}$ | $R_{A44}$ | $R_{C3}$ | $L_{A2306}$ | $R_{B6}$ | $R_{A44}$ | $R_{C3}$ | $L_{A2378}$ | $R_{B6}$ | $R_{A44}$ | $R_{C3}$ |
| $L_{A2235}$ | $R_{B3}$ | $R_{A52}$ | $R_{C3}$ | $L_{A2307}$ | $R_{B6}$ | $R_{A52}$ | $R_{C3}$ | $L_{A2379}$ | $R_{B6}$ | $R_{A52}$ | $R_{C3}$ |
| $L_{A2236}$ | $R_{B3}$ | $R_{A53}$ | $R_{C3}$ | $L_{A2308}$ | $R_{B6}$ | $R_{A53}$ | $R_{C3}$ | $L_{A2380}$ | $R_{B6}$ | $R_{A53}$ | $R_{C3}$ |
| $L_{A2237}$ | $R_{B3}$ | $R_{A54}$ | $R_{C3}$ | $L_{A2309}$ | $R_{B6}$ | $R_{A54}$ | $R_{C3}$ | $L_{A2381}$ | $R_{B6}$ | $R_{A54}$ | $R_{C3}$ |
| $L_{A2238}$ | $R_{B3}$ | $R_{C3}$ | $R_{C3}$ | $L_{A2310}$ | $R_{B6}$ | $R_{C3}$ | $R_{C3}$ | $L_{A2382}$ | $R_{B6}$ | $R_{C3}$ | $R_{C3}$ |
| $L_{A2239}$ | $R_{B3}$ | $R_{C4}$ | $R_{C3}$ | $L_{A2311}$ | $R_{B6}$ | $R_{C4}$ | $R_{C3}$ | $L_{A2383}$ | $R_{B6}$ | $R_{C4}$ | $R_{C3}$ |
| $L_{A2240}$ | $R_{B3}$ | $R_{C8}$ | $R_{C3}$ | $L_{A2312}$ | $R_{B6}$ | $R_{C8}$ | $R_{C3}$ | $L_{A2384}$ | $R_{B6}$ | $R_{C8}$ | $R_{C3}$ |
| $L_{A2241}$ | $R_{B3}$ | H | $R_{C4}$ | $L_{A2313}$ | $R_{B6}$ | H | $R_{C4}$ | $L_{A2385}$ | $R_{B6}$ | H | $R_{C4}$ |
| $L_{A2242}$ | $R_{B3}$ | $R_{B1}$ | $R_{C4}$ | $L_{A2314}$ | $R_{B6}$ | $R_{B1}$ | $R_{C4}$ | $L_{A2386}$ | $R_{B6}$ | $R_{B1}$ | $R_{C4}$ |
| $L_{A2243}$ | $R_{B3}$ | $R_{B3}$ | $R_{C4}$ | $L_{A2315}$ | $R_{B6}$ | $R_{B3}$ | $R_{C4}$ | $L_{A2387}$ | $R_{B6}$ | $R_{B3}$ | $R_{C4}$ |
| $L_{A2244}$ | $R_{B3}$ | $R_{B4}$ | $R_{C4}$ | $L_{A2316}$ | $R_{B6}$ | $R_{B4}$ | $R_{C4}$ | $L_{A2388}$ | $R_{B6}$ | $R_{B4}$ | $R_{C4}$ |
| $L_{A2245}$ | $R_{B3}$ | $R_{B5}$ | $R_{C4}$ | $L_{A2317}$ | $R_{B6}$ | $R_{B5}$ | $R_{C4}$ | $L_{A2389}$ | $R_{B6}$ | $R_{B5}$ | $R_{C4}$ |
| $L_{A2246}$ | $R_{B3}$ | $R_{B6}$ | $R_{C4}$ | $L_{A2318}$ | $R_{B6}$ | $R_{B6}$ | $R_{C4}$ | $L_{A2390}$ | $R_{B6}$ | $R_{B6}$ | $R_{C4}$ |
| $L_{A2247}$ | $R_{B3}$ | $R_{B7}$ | $R_{C4}$ | $L_{A2319}$ | $R_{B6}$ | $R_{B7}$ | $R_{C4}$ | $L_{A2391}$ | $R_{B6}$ | $R_{B7}$ | $R_{C4}$ |
| $L_{A2248}$ | $R_{B3}$ | $R_{B24}$ | $R_{C4}$ | $L_{A2320}$ | $R_{B6}$ | $R_{B24}$ | $R_{C4}$ | $L_{A2392}$ | $R_{B6}$ | $R_{B24}$ | $R_{C4}$ |
| $L_{A2249}$ | $R_{B3}$ | $R_{B25}$ | $R_{C4}$ | $L_{A2321}$ | $R_{B6}$ | $R_{B25}$ | $R_{C4}$ | $L_{A2393}$ | $R_{B6}$ | $R_{B25}$ | $R_{C4}$ |
| $L_{A2250}$ | $R_{B3}$ | $R_{A3}$ | $R_{C4}$ | $L_{A2322}$ | $R_{B6}$ | $R_{A3}$ | $R_{C4}$ | $L_{A2394}$ | $R_{B6}$ | $R_{A3}$ | $R_{C4}$ |
| $L_{A2251}$ | $R_{B3}$ | $R_{A34}$ | $R_{C4}$ | $L_{A2323}$ | $R_{B6}$ | $R_{A34}$ | $R_{C4}$ | $L_{A2395}$ | $R_{B6}$ | $R_{A34}$ | $R_{C4}$ |
| $L_{A2252}$ | $R_{B3}$ | $R_{A44}$ | $R_{C4}$ | $L_{A2324}$ | $R_{B6}$ | $R_{A44}$ | $R_{C4}$ | $L_{A2396}$ | $R_{B6}$ | $R_{A44}$ | $R_{C4}$ |
| $L_{A2253}$ | $R_{B3}$ | $R_{A52}$ | $R_{C4}$ | $L_{A2325}$ | $R_{B6}$ | $R_{A52}$ | $R_{C4}$ | $L_{A2397}$ | $R_{B6}$ | $R_{A52}$ | $R_{C4}$ |
| $L_{A2254}$ | $R_{B3}$ | $R_{A53}$ | $R_{C4}$ | $L_{A2326}$ | $R_{B6}$ | $R_{A53}$ | $R_{C4}$ | $L_{A2398}$ | $R_{B6}$ | $R_{A53}$ | $R_{C4}$ |
| $L_{A2255}$ | $R_{B3}$ | $R_{A54}$ | $R_{C4}$ | $L_{A2327}$ | $R_{B6}$ | $R_{A54}$ | $R_{C4}$ | $L_{A2399}$ | $R_{B6}$ | $R_{A54}$ | $R_{C4}$ |
| $L_{A2256}$ | $R_{B3}$ | $R_{C3}$ | $R_{C4}$ | $L_{A2328}$ | $R_{B6}$ | $R_{C3}$ | $R_{C4}$ | $L_{A2400}$ | $R_{B6}$ | $R_{C3}$ | $R_{C4}$ |
| $L_{A2257}$ | $R_{B3}$ | $R_{C4}$ | $R_{C4}$ | $L_{A2329}$ | $R_{B6}$ | $R_{C4}$ | $R_{C4}$ | $L_{A2401}$ | $R_{B6}$ | $R_{C4}$ | $R_{C4}$ |
| $L_{A2258}$ | $R_{B3}$ | $R_{C8}$ | $R_{C4}$ | $L_{A2330}$ | $R_{B6}$ | $R_{C8}$ | $R_{C4}$ | $L_{A2402}$ | $R_{B6}$ | $R_{C8}$ | $R_{C4}$ |

wherein $R_{B1}$ to $R_{B25}$ have the following structures:

$R_{B1}$

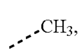

$R_{B2}$

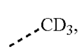

$R_{B3}$

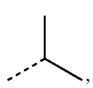

$R_{B4}$

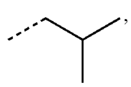

$R_{B5}$

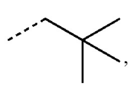

$R_{B6}$

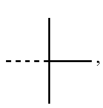

-continued $R_{B7}$

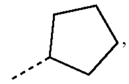

$R_{B8}$

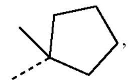

$R_{B9}$

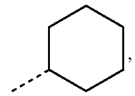

$R_{B10}$

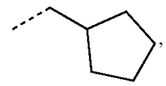

$R_{B11}$

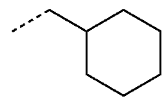

$R_{B12}$

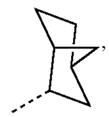

$R_{B13}$

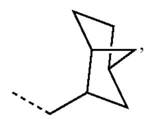

$R_{B14}$

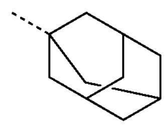

$R_{B15}$

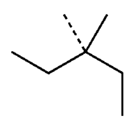

$R_{B16}$

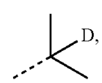

$R_{B17}$

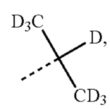

$R_{B18}$

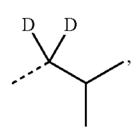

$R_{B19}$

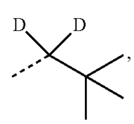

$R_{B20}$

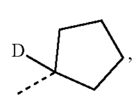

-continued
$R_{B21}$
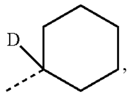
$R_{B22}$
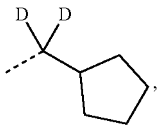
$R_{B23}$
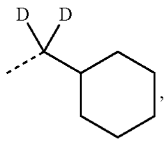
$R_{B24}$
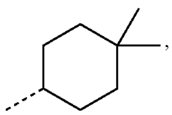
and
$R_{B25}$
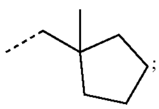
wherein $R_{A1}$ to $R_{A53}$ have the following structures
$R_{A1}$
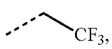
$R_{A2}$
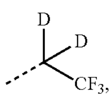
$R_{A3}$
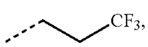
$R_{A4}$
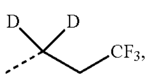
$R_{A5}$
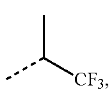
$R_{A6}$
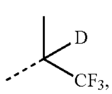
$R_{A7}$
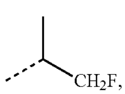
$R_{A8}$
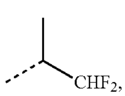
$R_{A9}$
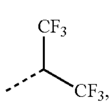
-continued
$R_{A10}$
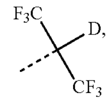
$R_{A11}$
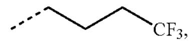
$R_{A12}$
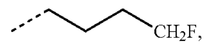
$R_{A13}$
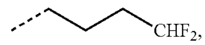
$R_{A14}$
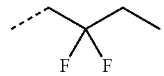
$R_{A15}$
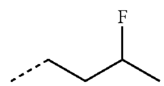
$R_{A16}$
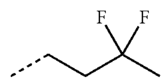
$R_{A17}$
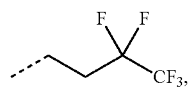
$R_{A18}$
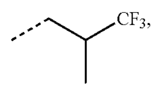
$R_{A19}$
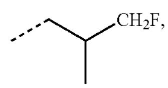
$R_{A20}$
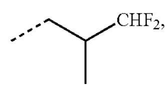
$R_{A21}$
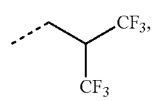
$R_{A22}$
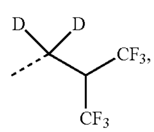
$R_{A23}$
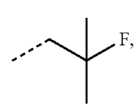
$R_{A24}$
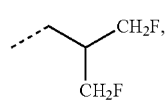
$R_{A25}$
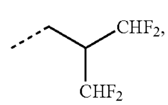

$R_{A26}$
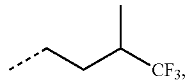
$R_{A27}$
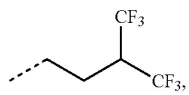
$R_{A28}$
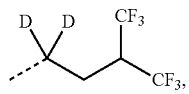
$R_{A29}$
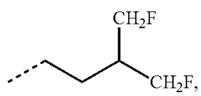
$R_{A30}$
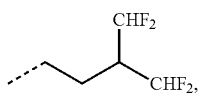
$R_{A31}$
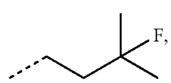
$R_{A32}$
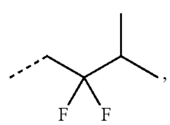
$R_{A33}$
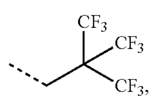
$R_{A34}$
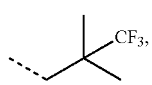
$R_{A35}$
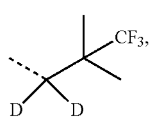
$R_{A36}$
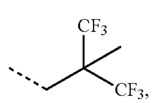
$R_{A37}$
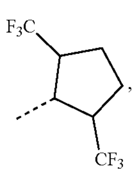
$R_{A38}$
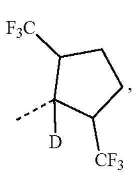
$R_{A39}$
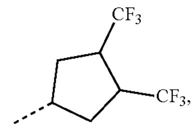
$R_{A40}$
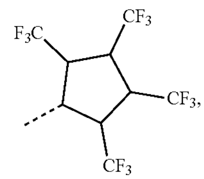
$R_{A41}$
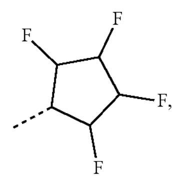
$R_{A42}$
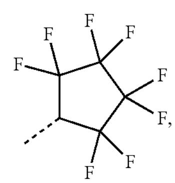
$R_{A43}$
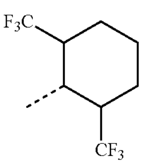
$R_{A44}$
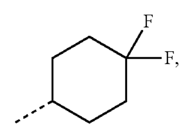
$R_{A45}$
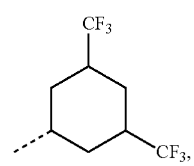
$R_{A46}$
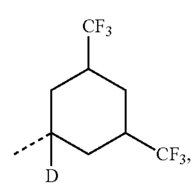
$R_{A47}$
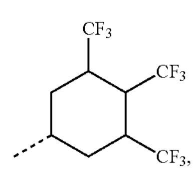

-continued $R_{A48}$

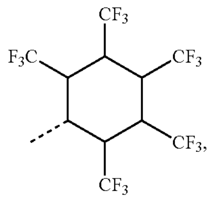

$R_{A49}$

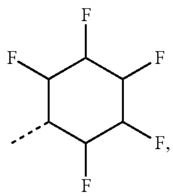

$R_{A50}$

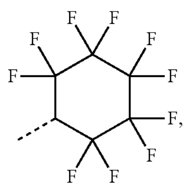

$R_{A51}$

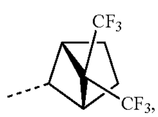

$R_{A52}$

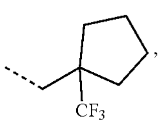

$R_{A53}$

----$CF_3$, and $R_{A54}$

----F;

wherein $R_{C1}$ to $R_{C11}$ have the following structures:

$R_{C1}$

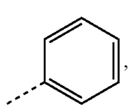

$R_{C2}$

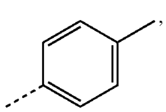

$R_{C3}$

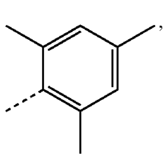

-continued $R_{C4}$

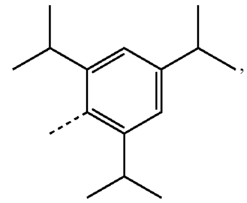

$R_{C5}$

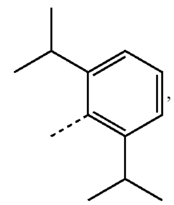

$R_{C6}$

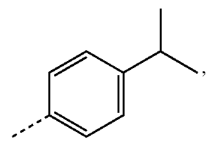

$R_{C7}$

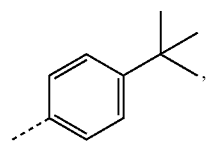

$R_{C8}$

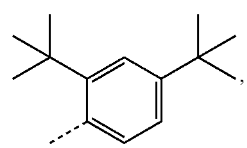

$R_{C9}$

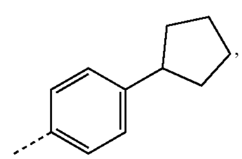

$R_{C10}$

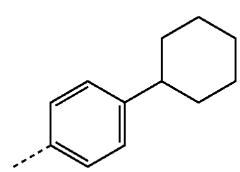

and $R_{C11}$

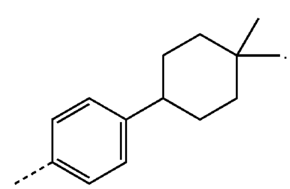

In some embodiments of Formula IA, the compound has formula $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein each $L_A$, $L_B$, and $L_C$ is a bidentate ligand, and different from each other.

In some embodiments of the compound, $L_B$ is $L_{Bj}$ selected from the group consisting of: $L_{B1}$ through $L_{B1260}$ are based on a structure of Formula XXVII,

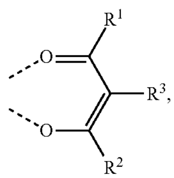

in which $R^1$, $R^2$, and $R^3$ are defined as:

| $L_{Bj}$ | $R^1$ | $R^2$ | $R^3$ | $L_{Bj}$ | $R^1$ | $R^2$ | $R^3$ | $L_{Bj}$ | $R^1$ | $R^2$ | $R^3$ |
|---|---|---|---|---|---|---|---|---|---|---|---|
| $L_{B1}$ | $R^{D1}$ | $R^{D1}$ | H | $L_{B421}$ | $R^{D26}$ | $R^{D21}$ | H | $L_{B841}$ | $R^{D7}$ | $R^{D14}$ | $R^{D1}$ |
| $L_{B2}$ | $R^{D2}$ | $R^{D2}$ | H | $L_{B422}$ | $R^{D26}$ | $R^{D23}$ | H | $L_{B842}$ | $R^{D7}$ | $R^{D15}$ | $R^{D1}$ |
| $L_{B3}$ | $R^{D3}$ | $R^{D3}$ | H | $L_{B423}$ | $R^{D26}$ | $R^{D24}$ | H | $L_{B843}$ | $R^{D7}$ | $R^{D16}$ | $R^{D1}$ |
| $L_{B4}$ | $R^{D4}$ | $R^{D4}$ | H | $L_{B424}$ | $R^{D26}$ | $R^{D25}$ | H | $L_{B844}$ | $R^{D7}$ | $R^{D17}$ | $R^{D1}$ |
| $L_{B5}$ | $R^{D5}$ | $R^{D5}$ | H | $L_{B425}$ | $R^{D26}$ | $R^{D27}$ | H | $L_{B845}$ | $R^{D7}$ | $R^{D18}$ | $R^{D1}$ |
| $L_{B6}$ | $R^{D6}$ | $R^{D6}$ | H | $L_{B426}$ | $R^{D26}$ | $R^{D28}$ | H | $L_{B846}$ | $R^{D7}$ | $R^{D19}$ | $R^{D1}$ |
| $L_{B7}$ | $R^{D7}$ | $R^{D7}$ | H | $L_{B427}$ | $R^{D26}$ | $R^{D29}$ | H | $L_{B847}$ | $R^{D7}$ | $R^{D20}$ | $R^{D1}$ |
| $L_{B8}$ | $R^{D8}$ | $R^{D8}$ | H | $L_{B428}$ | $R^{D26}$ | $R^{D30}$ | H | $L_{B848}$ | $R^{D7}$ | $R^{D21}$ | $R^{D1}$ |
| $L_{B9}$ | $R^{D9}$ | $R^{D9}$ | H | $L_{B429}$ | $R^{D26}$ | $R^{D31}$ | H | $L_{B849}$ | $R^{D7}$ | $R^{D22}$ | $R^{D1}$ |
| $L_{B10}$ | $R^{D10}$ | $R^{D10}$ | H | $L_{B430}$ | $R^{D26}$ | $R^{D32}$ | H | $L_{B850}$ | $R^{D7}$ | $R^{D23}$ | $R^{D1}$ |
| $L_{B11}$ | $R^{D11}$ | $R^{D11}$ | H | $L_{B431}$ | $R^{D26}$ | $R^{D33}$ | H | $L_{B851}$ | $R^{D7}$ | $R^{D24}$ | $R^{D1}$ |
| $L_{B12}$ | $R^{D12}$ | $R^{D12}$ | H | $L_{B432}$ | $R^{D26}$ | $R^{D34}$ | H | $L_{B852}$ | $R^{D7}$ | $R^{D25}$ | $R^{D1}$ |
| $L_{B13}$ | $R^{D13}$ | $R^{D13}$ | H | $L_{B433}$ | $R^{D26}$ | $R^{D35}$ | H | $L_{B853}$ | $R^{D7}$ | $R^{D26}$ | $R^{D1}$ |
| $L_{B14}$ | $R^{D14}$ | $R^{D14}$ | H | $L_{B434}$ | $R^{D26}$ | $R^{D40}$ | H | $L_{B854}$ | $R^{D7}$ | $R^{D27}$ | $R^{D1}$ |
| $L_{B15}$ | $R^{D15}$ | $R^{D15}$ | H | $L_{B435}$ | $R^{D26}$ | $R^{D41}$ | H | $L_{B855}$ | $R^{D7}$ | $R^{D28}$ | $R^{D1}$ |
| $L_{B16}$ | $R^{D16}$ | $R^{D16}$ | H | $L_{B436}$ | $R^{D26}$ | $R^{D42}$ | H | $L_{B856}$ | $R^{D7}$ | $R^{D29}$ | $R^{D1}$ |
| $L_{B17}$ | $R^{D17}$ | $R^{D17}$ | H | $L_{B437}$ | $R^{D26}$ | $R^{D64}$ | H | $L_{B857}$ | $R^{D7}$ | $R^{D30}$ | $R^{D1}$ |
| $L_{B18}$ | $R^{D18}$ | $R^{D18}$ | H | $L_{B438}$ | $R^{D26}$ | $R^{D66}$ | H | $L_{B858}$ | $R^{D7}$ | $R^{D31}$ | $R^{D1}$ |
| $L_{B19}$ | $R^{D19}$ | $R^{D19}$ | H | $L_{B439}$ | $R^{D26}$ | $R^{D68}$ | H | $L_{B859}$ | $R^{D7}$ | $R^{D32}$ | $R^{D1}$ |
| $L_{B20}$ | $R^{D20}$ | $R^{D20}$ | H | $L_{B440}$ | $R^{D26}$ | $R^{D76}$ | H | $L_{B860}$ | $R^{D7}$ | $R^{D33}$ | $R^{D1}$ |
| $L_{B21}$ | $R^{D21}$ | $R^{D21}$ | H | $L_{B441}$ | $R^{D35}$ | $R^{D5}$ | H | $L_{B861}$ | $R^{D7}$ | $R^{D34}$ | $R^{D1}$ |
| $L_{B22}$ | $R^{D22}$ | $R^{D22}$ | H | $L_{B442}$ | $R^{D35}$ | $R^{D6}$ | H | $L_{B862}$ | $R^{D7}$ | $R^{D35}$ | $R^{D1}$ |
| $L_{B23}$ | $R^{D23}$ | $R^{D23}$ | H | $L_{B443}$ | $R^{D35}$ | $R^{D9}$ | H | $L_{B863}$ | $R^{D7}$ | $R^{D40}$ | $R^{D1}$ |
| $L_{B24}$ | $R^{D24}$ | $R^{D24}$ | H | $L_{B444}$ | $R^{D35}$ | $R^{D10}$ | H | $L_{B864}$ | $R^{D7}$ | $R^{D41}$ | $R^{D1}$ |
| $L_{B25}$ | $R^{D25}$ | $R^{D25}$ | H | $L_{B445}$ | $R^{D35}$ | $R^{D12}$ | H | $L_{B865}$ | $R^{D7}$ | $R^{D42}$ | $R^{D1}$ |
| $L_{B26}$ | $R^{D26}$ | $R^{D26}$ | H | $L_{B446}$ | $R^{D35}$ | $R^{D15}$ | H | $L_{B866}$ | $R^{D7}$ | $R^{D64}$ | $R^{D1}$ |
| $L_{B27}$ | $R^{D27}$ | $R^{D27}$ | H | $L_{B447}$ | $R^{D35}$ | $R^{D16}$ | H | $L_{B867}$ | $R^{D7}$ | $R^{D66}$ | $R^{D1}$ |
| $L_{B28}$ | $R^{D28}$ | $R^{D28}$ | H | $L_{B448}$ | $R^{D35}$ | $R^{D17}$ | H | $L_{B868}$ | $R^{D7}$ | $R^{D68}$ | $R^{D1}$ |
| $L_{B29}$ | $R^{D29}$ | $R^{D29}$ | H | $L_{B449}$ | $R^{D35}$ | $R^{D18}$ | H | $L_{B869}$ | $R^{D7}$ | $R^{D76}$ | $R^{D1}$ |
| $L_{B30}$ | $R^{D30}$ | $R^{D30}$ | H | $L_{B450}$ | $R^{D35}$ | $R^{D19}$ | H | $L_{B870}$ | $R^{D8}$ | $R^{D5}$ | $R^{D1}$ |
| $L_{B31}$ | $R^{D31}$ | $R^{D31}$ | H | $L_{B451}$ | $R^{D35}$ | $R^{D20}$ | H | $L_{B871}$ | $R^{D8}$ | $R^{D6}$ | $R^{D1}$ |
| $L_{B32}$ | $R^{D32}$ | $R^{D32}$ | H | $L_{B452}$ | $R^{D35}$ | $R^{D21}$ | H | $L_{B872}$ | $R^{D8}$ | $R^{D9}$ | $R^{D1}$ |
| $L_{B33}$ | $R^{D33}$ | $R^{D33}$ | H | $L_{B453}$ | $R^{D35}$ | $R^{D22}$ | H | $L_{B873}$ | $R^{D8}$ | $R^{D10}$ | $R^{D1}$ |
| $L_{B34}$ | $R^{D34}$ | $R^{D34}$ | H | $L_{B454}$ | $R^{D35}$ | $R^{D23}$ | H | $L_{B874}$ | $R^{D8}$ | $R^{D11}$ | $R^{D1}$ |
| $L_{B35}$ | $R^{D35}$ | $R^{D35}$ | H | $L_{B455}$ | $R^{D35}$ | $R^{D24}$ | H | $L_{B875}$ | $R^{D8}$ | $R^{D12}$ | $R^{D1}$ |
| $L_{B36}$ | $R^{D40}$ | $R^{D40}$ | H | $L_{B456}$ | $R^{D35}$ | $R^{D27}$ | H | $L_{B876}$ | $R^{D8}$ | $R^{D13}$ | $R^{D1}$ |
| $L_{B37}$ | $R^{D41}$ | $R^{D41}$ | H | $L_{B457}$ | $R^{D35}$ | $R^{D28}$ | H | $L_{B877}$ | $R^{D8}$ | $R^{D14}$ | $R^{D1}$ |
| $L_{B38}$ | $R^{D42}$ | $R^{D42}$ | H | $L_{B458}$ | $R^{D35}$ | $R^{D29}$ | H | $L_{B878}$ | $R^{D8}$ | $R^{D15}$ | $R^{D1}$ |
| $L_{B39}$ | $R^{D64}$ | $R^{D64}$ | H | $L_{B459}$ | $R^{D35}$ | $R^{D30}$ | H | $L_{B879}$ | $R^{D8}$ | $R^{D16}$ | $R^{D1}$ |
| $L_{B40}$ | $R^{D66}$ | $R^{D66}$ | H | $L_{B460}$ | $R^{D35}$ | $R^{D31}$ | H | $L_{B880}$ | $R^{D8}$ | $R^{D17}$ | $R^{D1}$ |
| $L_{B41}$ | $R^{D68}$ | $R^{D68}$ | H | $L_{B461}$ | $R^{D35}$ | $R^{D32}$ | H | $L_{B881}$ | $R^{D8}$ | $R^{D18}$ | $R^{D1}$ |
| $L_{B42}$ | $R^{D76}$ | $R^{D76}$ | H | $L_{B462}$ | $R^{D35}$ | $R^{D33}$ | H | $L_{B882}$ | $R^{D8}$ | $R^{D19}$ | $R^{D1}$ |
| $L_{B43}$ | $R^{D1}$ | $R^{D2}$ | H | $L_{B463}$ | $R^{D35}$ | $R^{D34}$ | H | $L_{B883}$ | $R^{D8}$ | $R^{D20}$ | $R^{D1}$ |
| $L_{B44}$ | $R^{D1}$ | $R^{D3}$ | H | $L_{B464}$ | $R^{D35}$ | $R^{D40}$ | H | $L_{B884}$ | $R^{D8}$ | $R^{D21}$ | $R^{D1}$ |
| $L_{B45}$ | $R^{D1}$ | $R^{D4}$ | H | $L_{B465}$ | $R^{D35}$ | $R^{D41}$ | H | $L_{B885}$ | $R^{D8}$ | $R^{D22}$ | $R^{D1}$ |
| $L_{B46}$ | $R^{D1}$ | $R^{D5}$ | H | $L_{B466}$ | $R^{D35}$ | $R^{D42}$ | H | $L_{B886}$ | $R^{D8}$ | $R^{D23}$ | $R^{D1}$ |
| $L_{B47}$ | $R^{D1}$ | $R^{D6}$ | H | $L_{B467}$ | $R^{D35}$ | $R^{D64}$ | H | $L_{B887}$ | $R^{D8}$ | $R^{D24}$ | $R^{D1}$ |
| $L_{B48}$ | $R^{D1}$ | $R^{D7}$ | H | $L_{B468}$ | $R^{D35}$ | $R^{D66}$ | H | $L_{B888}$ | $R^{D8}$ | $R^{D25}$ | $R^{D1}$ |
| $L_{B49}$ | $R^{D1}$ | $R^{D8}$ | H | $L_{B469}$ | $R^{D35}$ | $R^{D68}$ | H | $L_{B889}$ | $R^{D8}$ | $R^{D26}$ | $R^{D1}$ |
| $L_{B50}$ | $R^{D1}$ | $R^{D9}$ | H | $L_{B470}$ | $R^{D35}$ | $R^{D76}$ | H | $L_{B890}$ | $R^{D8}$ | $R^{D27}$ | $R^{D1}$ |
| $L_{B51}$ | $R^{D1}$ | $R^{D10}$ | H | $L_{B471}$ | $R^{D40}$ | $R^{D5}$ | H | $L_{B891}$ | $R^{D8}$ | $R^{D28}$ | $R^{D1}$ |
| $L_{B52}$ | $R^{D1}$ | $R^{D11}$ | H | $L_{B472}$ | $R^{D40}$ | $R^{D6}$ | H | $L_{B892}$ | $R^{D8}$ | $R^{D29}$ | $R^{D1}$ |
| $L_{B53}$ | $R^{D1}$ | $R^{D12}$ | H | $L_{B473}$ | $R^{D40}$ | $R^{D9}$ | H | $L_{B893}$ | $R^{D8}$ | $R^{D30}$ | $R^{D1}$ |
| $L_{B54}$ | $R^{D1}$ | $R^{D13}$ | H | $L_{B474}$ | $R^{D40}$ | $R^{D10}$ | H | $L_{B894}$ | $R^{D8}$ | $R^{D31}$ | $R^{D1}$ |
| $L_{B55}$ | $R^{D1}$ | $R^{D14}$ | H | $L_{B475}$ | $R^{D40}$ | $R^{D12}$ | H | $L_{B895}$ | $R^{D8}$ | $R^{D32}$ | $R^{D1}$ |
| $L_{B56}$ | $R^{D1}$ | $R^{D15}$ | H | $L_{B476}$ | $R^{D40}$ | $R^{D15}$ | H | $L_{B896}$ | $R^{D8}$ | $R^{D33}$ | $R^{D1}$ |
| $L_{B57}$ | $R^{D1}$ | $R^{D16}$ | H | $L_{B477}$ | $R^{D40}$ | $R^{D16}$ | H | $L_{B897}$ | $R^{D8}$ | $R^{D34}$ | $R^{D1}$ |
| $L_{B58}$ | $R^{D1}$ | $R^{D17}$ | H | $L_{B478}$ | $R^{D40}$ | $R^{D17}$ | H | $L_{B898}$ | $R^{D8}$ | $R^{D35}$ | $R^{D1}$ |
| $L_{B59}$ | $R^{D1}$ | $R^{D18}$ | H | $L_{B479}$ | $R^{D40}$ | $R^{D18}$ | H | $L_{B899}$ | $R^{D8}$ | $R^{D40}$ | $R^{D1}$ |
| $L_{B60}$ | $R^{D1}$ | $R^{D19}$ | H | $L_{B480}$ | $R^{D40}$ | $R^{D19}$ | H | $L_{B900}$ | $R^{D8}$ | $R^{D41}$ | $R^{D1}$ |
| $L_{B61}$ | $R^{D1}$ | $R^{D20}$ | H | $L_{B481}$ | $R^{D40}$ | $R^{D20}$ | H | $L_{B901}$ | $R^{D8}$ | $R^{D42}$ | $R^{D1}$ |

-continued

| $L_{Bj}$ | $R^1$ | $R^2$ | $R^3$ | $L_{Bj}$ | $R^1$ | $R^2$ | $R^3$ | $L_{Bj}$ | $R^1$ | $R^2$ | $R^3$ |
|---|---|---|---|---|---|---|---|---|---|---|---|
| $L_{B62}$ | $R^{D1}$ | $R^{D21}$ | H | $L_{B482}$ | $R^{D40}$ | $R^{D21}$ | H | $L_{B902}$ | $R^{D8}$ | $R^{D64}$ | $R^{D1}$ |
| $L_{B63}$ | $R^{D1}$ | $R^{D22}$ | H | $L_{B483}$ | $R^{D40}$ | $R^{D23}$ | H | $L_{B903}$ | $R^{D8}$ | $R^{D66}$ | $R^{D1}$ |
| $L_{B64}$ | $R^{D1}$ | $R^{D23}$ | H | $L_{B484}$ | $R^{D40}$ | $R^{D24}$ | H | $L_{B904}$ | $R^{D8}$ | $R^{D68}$ | $R^{D1}$ |
| $L_{B65}$ | $R^{D1}$ | $R^{D24}$ | H | $L_{B485}$ | $R^{D40}$ | $R^{D25}$ | H | $L_{B905}$ | $R^{D8}$ | $R^{D76}$ | $R^{D1}$ |
| $L_{B66}$ | $R^{D1}$ | $R^{D25}$ | H | $L_{B486}$ | $R^{D40}$ | $R^{D27}$ | H | $L_{B906}$ | $R^{D11}$ | $R^{D5}$ | $R^{D1}$ |
| $L_{B67}$ | $R^{D1}$ | $R^{D26}$ | H | $L_{B487}$ | $R^{D40}$ | $R^{D28}$ | H | $L_{B907}$ | $R^{D11}$ | $R^{D6}$ | $R^{D1}$ |
| $L_{B68}$ | $R^{D1}$ | $R^{D27}$ | H | $L_{B488}$ | $R^{D40}$ | $R^{D29}$ | H | $L_{B908}$ | $R^{D11}$ | $R^{D9}$ | $R^{D1}$ |
| $L_{B69}$ | $R^{D1}$ | $R^{D28}$ | H | $L_{B489}$ | $R^{D40}$ | $R^{D30}$ | H | $L_{B909}$ | $R^{D11}$ | $R^{D10}$ | $R^{D1}$ |
| $L_{B70}$ | $R^{D1}$ | $R^{D29}$ | H | $L_{B490}$ | $R^{D40}$ | $R^{D31}$ | H | $L_{B910}$ | $R^{D11}$ | $R^{D12}$ | $R^{D1}$ |
| $L_{B71}$ | $R^{D1}$ | $R^{D30}$ | H | $L_{B491}$ | $R^{D40}$ | $R^{D32}$ | H | $L_{B911}$ | $R^{D11}$ | $R^{D13}$ | $R^{D1}$ |
| $L_{B72}$ | $R^{D1}$ | $R^{D31}$ | H | $L_{B492}$ | $R^{D40}$ | $R^{D33}$ | H | $L_{B912}$ | $R^{D11}$ | $R^{D14}$ | $R^{D1}$ |
| $L_{B73}$ | $R^{D1}$ | $R^{D32}$ | H | $L_{B493}$ | $R^{D40}$ | $R^{D34}$ | H | $L_{B913}$ | $R^{D11}$ | $R^{D15}$ | $R^{D1}$ |
| $L_{B74}$ | $R^{D1}$ | $R^{D33}$ | H | $L_{B494}$ | $R^{D40}$ | $R^{D41}$ | H | $L_{B914}$ | $R^{D11}$ | $R^{D16}$ | $R^{D1}$ |
| $L_{B75}$ | $R^{D1}$ | $R^{D34}$ | H | $L_{B495}$ | $R^{D40}$ | $R^{D42}$ | H | $L_{B915}$ | $R^{D11}$ | $R^{D17}$ | $R^{D1}$ |
| $L_{B76}$ | $R^{D1}$ | $R^{D35}$ | H | $L_{B496}$ | $R^{D40}$ | $R^{D64}$ | H | $L_{B916}$ | $R^{D11}$ | $R^{D18}$ | $R^{D1}$ |
| $L_{B77}$ | $R^{D1}$ | $R^{D40}$ | H | $L_{B497}$ | $R^{D40}$ | $R^{D66}$ | H | $L_{B917}$ | $R^{D11}$ | $R^{D19}$ | $R^{D1}$ |
| $L_{B78}$ | $R^{D1}$ | $R^{D41}$ | H | $L_{B498}$ | $R^{D40}$ | $R^{D68}$ | H | $L_{B918}$ | $R^{D11}$ | $R^{D20}$ | $R^{D1}$ |
| $L_{B79}$ | $R^{D1}$ | $R^{D42}$ | H | $L_{B499}$ | $R^{D40}$ | $R^{D76}$ | H | $L_{B919}$ | $R^{D11}$ | $R^{D21}$ | $R^{D1}$ |
| $L_{B80}$ | $R^{D1}$ | $R^{D64}$ | H | $L_{B500}$ | $R^{D41}$ | $R^{D5}$ | H | $L_{B920}$ | $R^{D11}$ | $R^{D22}$ | $R^{D1}$ |
| $L_{B81}$ | $R^{D1}$ | $R^{D66}$ | H | $L_{B501}$ | $R^{D41}$ | $R^{D6}$ | H | $L_{B921}$ | $R^{D11}$ | $R^{D23}$ | $R^{D1}$ |
| $L_{B82}$ | $R^{D1}$ | $R^{D68}$ | H | $L_{B502}$ | $R^{D41}$ | $R^{D9}$ | H | $L_{B922}$ | $R^{D11}$ | $R^{D24}$ | $R^{D1}$ |
| $L_{B83}$ | $R^{D1}$ | $R^{D76}$ | H | $L_{B503}$ | $R^{D41}$ | $R^{D10}$ | H | $L_{B923}$ | $R^{D11}$ | $R^{D25}$ | $R^{D1}$ |
| $L_{B84}$ | $R^{D2}$ | $R^{D1}$ | H | $L_{B504}$ | $R^{D41}$ | $R^{D12}$ | H | $L_{B924}$ | $R^{D11}$ | $R^{D26}$ | $R^{D1}$ |
| $L_{B85}$ | $R^{D2}$ | $R^{D3}$ | H | $L_{B505}$ | $R^{D41}$ | $R^{D15}$ | H | $L_{B925}$ | $R^{D11}$ | $R^{D27}$ | $R^{D1}$ |
| $L_{B86}$ | $R^{D2}$ | $R^{D4}$ | H | $L_{B506}$ | $R^{D41}$ | $R^{D16}$ | H | $L_{B926}$ | $R^{D11}$ | $R^{D28}$ | $R^{D1}$ |
| $L_{B87}$ | $R^{D2}$ | $R^{D5}$ | H | $L_{B507}$ | $R^{D41}$ | $R^{D17}$ | H | $L_{B927}$ | $R^{D11}$ | $R^{D29}$ | $R^{D1}$ |
| $L_{B88}$ | $R^{D2}$ | $R^{D6}$ | H | $L_{B508}$ | $R^{D41}$ | $R^{D18}$ | H | $L_{B928}$ | $R^{D11}$ | $R^{D30}$ | $R^{D1}$ |
| $L_{B89}$ | $R^{D2}$ | $R^{D7}$ | H | $L_{B509}$ | $R^{D41}$ | $R^{D19}$ | H | $L_{B929}$ | $R^{D11}$ | $R^{D31}$ | $R^{D1}$ |
| $L_{B90}$ | $R^{D2}$ | $R^{D8}$ | H | $L_{B510}$ | $R^{D41}$ | $R^{D20}$ | H | $L_{B930}$ | $R^{D11}$ | $R^{D32}$ | $R^{D1}$ |
| $L_{B91}$ | $R^{D2}$ | $R^{D9}$ | H | $L_{B511}$ | $R^{D41}$ | $R^{D21}$ | H | $L_{B931}$ | $R^{D11}$ | $R^{D33}$ | $R^{D1}$ |
| $L_{B92}$ | $R^{D2}$ | $R^{D10}$ | H | $L_{B512}$ | $R^{D41}$ | $R^{D22}$ | H | $L_{B932}$ | $R^{D11}$ | $R^{D34}$ | $R^{D1}$ |
| $L_{B93}$ | $R^{D2}$ | $R^{D11}$ | H | $L_{B513}$ | $R^{D41}$ | $R^{D23}$ | H | $L_{B933}$ | $R^{D11}$ | $R^{D35}$ | $R^{D1}$ |
| $L_{B94}$ | $R^{D2}$ | $R^{D12}$ | H | $L_{B514}$ | $R^{D41}$ | $R^{D24}$ | H | $L_{B934}$ | $R^{D11}$ | $R^{D40}$ | $R^{D1}$ |
| $L_{B95}$ | $R^{D2}$ | $R^{D13}$ | H | $L_{B515}$ | $R^{D41}$ | $R^{D25}$ | H | $L_{B935}$ | $R^{D11}$ | $R^{D41}$ | $R^{D1}$ |
| $L_{B96}$ | $R^{D2}$ | $R^{D14}$ | H | $L_{B516}$ | $R^{D41}$ | $R^{D26}$ | H | $L_{B936}$ | $R^{D11}$ | $R^{D42}$ | $R^{D1}$ |
| $L_{B97}$ | $R^{D2}$ | $R^{D15}$ | H | $L_{B517}$ | $R^{D41}$ | $R^{D27}$ | H | $L_{B937}$ | $R^{D11}$ | $R^{D64}$ | $R^{D1}$ |
| $L_{B98}$ | $R^{D2}$ | $R^{D16}$ | H | $L_{B518}$ | $R^{D41}$ | $R^{D28}$ | H | $L_{B938}$ | $R^{D11}$ | $R^{D66}$ | $R^{D1}$ |
| $L_{B99}$ | $R^{D2}$ | $R^{D17}$ | H | $L_{B519}$ | $R^{D41}$ | $R^{D29}$ | H | $L_{B939}$ | $R^{D11}$ | $R^{D68}$ | $R^{D1}$ |
| $L_{B100}$ | $R^{D2}$ | $R^{D18}$ | H | $L_{B520}$ | $R^{D41}$ | $R^{D30}$ | H | $L_{B940}$ | $R^{D11}$ | $R^{D76}$ | $R^{D1}$ |
| $L_{B101}$ | $R^{D2}$ | $R^{D19}$ | H | $L_{B521}$ | $R^{D41}$ | $R^{D31}$ | H | $L_{B941}$ | $R^{D13}$ | $R^{D5}$ | $R^{D1}$ |
| $L_{B102}$ | $R^{D2}$ | $R^{D20}$ | H | $L_{B522}$ | $R^{D41}$ | $R^{D32}$ | H | $L_{B942}$ | $R^{D13}$ | $R^{D6}$ | $R^{D1}$ |
| $L_{B103}$ | $R^{D2}$ | $R^{D21}$ | H | $L_{B523}$ | $R^{D41}$ | $R^{D42}$ | H | $L_{B943}$ | $R^{D13}$ | $R^{D9}$ | $R^{D1}$ |
| $L_{B104}$ | $R^{D2}$ | $R^{D22}$ | H | $L_{B524}$ | $R^{D41}$ | $R^{D64}$ | H | $L_{B944}$ | $R^{D13}$ | $R^{D10}$ | $R^{D1}$ |
| $L_{B105}$ | $R^{D2}$ | $R^{D23}$ | H | $L_{B525}$ | $R^{D41}$ | $R^{D66}$ | H | $L_{B945}$ | $R^{D13}$ | $R^{D12}$ | $R^{D1}$ |
| $L_{B106}$ | $R^{D2}$ | $R^{D24}$ | H | $L_{B526}$ | $R^{D41}$ | $R^{D68}$ | H | $L_{B946}$ | $R^{D13}$ | $R^{D14}$ | $R^{D1}$ |
| $L_{B107}$ | $R^{D2}$ | $R^{D25}$ | H | $L_{B527}$ | $R^{D41}$ | $R^{D76}$ | H | $L_{B947}$ | $R^{D13}$ | $R^{D15}$ | $R^{D1}$ |
| $L_{B108}$ | $R^{D2}$ | $R^{D26}$ | H | $L_{B528}$ | $R^{D64}$ | $R^{D5}$ | H | $L_{B948}$ | $R^{D13}$ | $R^{D16}$ | $R^{D1}$ |
| $L_{B109}$ | $R^{D2}$ | $R^{D27}$ | H | $L_{B529}$ | $R^{D64}$ | $R^{D6}$ | H | $L_{B949}$ | $R^{D13}$ | $R^{D17}$ | $R^{D1}$ |
| $L_{B110}$ | $R^{D2}$ | $R^{D28}$ | H | $L_{B530}$ | $R^{D64}$ | $R^{D9}$ | H | $L_{B950}$ | $R^{D13}$ | $R^{D18}$ | $R^{D1}$ |
| $L_{B111}$ | $R^{D2}$ | $R^{D29}$ | H | $L_{B531}$ | $R^{D64}$ | $R^{D10}$ | H | $L_{B951}$ | $R^{D13}$ | $R^{D19}$ | $R^{D1}$ |
| $L_{B112}$ | $R^{D2}$ | $R^{D30}$ | H | $L_{B532}$ | $R^{D64}$ | $R^{D12}$ | H | $L_{B952}$ | $R^{D13}$ | $R^{D20}$ | $R^{D1}$ |
| $L_{B113}$ | $R^{D2}$ | $R^{D31}$ | H | $L_{B533}$ | $R^{D64}$ | $R^{D15}$ | H | $L_{B953}$ | $R^{D13}$ | $R^{D21}$ | $R^{D1}$ |
| $L_{B114}$ | $R^{D2}$ | $R^{D32}$ | H | $L_{B534}$ | $R^{D64}$ | $R^{D16}$ | H | $L_{B954}$ | $R^{D13}$ | $R^{D22}$ | $R^{D1}$ |
| $L_{B115}$ | $R^{D2}$ | $R^{D33}$ | H | $L_{B535}$ | $R^{D64}$ | $R^{D17}$ | H | $L_{B955}$ | $R^{D13}$ | $R^{D23}$ | $R^{D1}$ |
| $L_{B116}$ | $R^{D2}$ | $R^{D34}$ | H | $L_{B536}$ | $R^{D64}$ | $R^{D18}$ | H | $L_{B956}$ | $R^{D13}$ | $R^{D24}$ | $R^{D1}$ |
| $L_{B117}$ | $R^{D2}$ | $R^{D35}$ | H | $L_{B537}$ | $R^{D64}$ | $R^{D19}$ | H | $L_{B957}$ | $R^{D13}$ | $R^{D25}$ | $R^{D1}$ |
| $L_{B118}$ | $R^{D2}$ | $R^{D40}$ | H | $L_{B538}$ | $R^{D64}$ | $R^{D20}$ | H | $L_{B958}$ | $R^{D13}$ | $R^{D26}$ | $R^{D1}$ |
| $L_{B119}$ | $R^{D2}$ | $R^{D41}$ | H | $L_{B539}$ | $R^{D64}$ | $R^{D21}$ | H | $L_{B959}$ | $R^{D13}$ | $R^{D27}$ | $R^{D1}$ |
| $L_{B120}$ | $R^{D2}$ | $R^{D42}$ | H | $L_{B540}$ | $R^{D64}$ | $R^{D23}$ | H | $L_{B960}$ | $R^{D13}$ | $R^{D28}$ | $R^{D1}$ |
| $L_{B121}$ | $R^{D2}$ | $R^{D64}$ | H | $L_{B541}$ | $R^{D64}$ | $R^{D24}$ | H | $L_{B961}$ | $R^{D13}$ | $R^{D29}$ | $R^{D1}$ |
| $L_{B122}$ | $R^{D2}$ | $R^{D66}$ | H | $L_{B542}$ | $R^{D64}$ | $R^{D25}$ | H | $L_{B962}$ | $R^{D13}$ | $R^{D30}$ | $R^{D1}$ |
| $L_{B123}$ | $R^{D2}$ | $R^{D68}$ | H | $L_{B543}$ | $R^{D64}$ | $R^{D27}$ | H | $L_{B963}$ | $R^{D13}$ | $R^{D31}$ | $R^{D1}$ |
| $L_{B124}$ | $R^{D2}$ | $R^{D76}$ | H | $L_{B544}$ | $R^{D64}$ | $R^{D28}$ | H | $L_{B964}$ | $R^{D13}$ | $R^{D32}$ | $R^{D1}$ |
| $L_{B125}$ | $R^{D3}$ | $R^{D4}$ | H | $L_{B545}$ | $R^{D64}$ | $R^{D29}$ | H | $L_{B965}$ | $R^{D13}$ | $R^{D33}$ | $R^{D1}$ |
| $L_{B126}$ | $R^{D3}$ | $R^{D5}$ | H | $L_{B546}$ | $R^{D64}$ | $R^{D30}$ | H | $L_{B966}$ | $R^{D13}$ | $R^{D34}$ | $R^{D1}$ |
| $L_{B127}$ | $R^{D3}$ | $R^{D6}$ | H | $L_{B547}$ | $R^{D64}$ | $R^{D31}$ | H | $L_{B967}$ | $R^{D13}$ | $R^{D35}$ | $R^{D1}$ |
| $L_{B128}$ | $R^{D3}$ | $R^{D7}$ | H | $L_{B548}$ | $R^{D64}$ | $R^{D32}$ | H | $L_{B968}$ | $R^{D13}$ | $R^{D40}$ | $R^{D1}$ |
| $L_{B129}$ | $R^{D3}$ | $R^{D8}$ | H | $L_{B549}$ | $R^{D64}$ | $R^{D33}$ | H | $L_{B969}$ | $R^{D13}$ | $R^{D41}$ | $R^{D1}$ |
| $L_{B130}$ | $R^{D3}$ | $R^{D9}$ | H | $L_{B550}$ | $R^{D64}$ | $R^{D34}$ | H | $L_{B970}$ | $R^{D13}$ | $R^{D42}$ | $R^{D1}$ |
| $L_{B131}$ | $R^{D3}$ | $R^{D10}$ | H | $L_{B551}$ | $R^{D64}$ | $R^{D42}$ | H | $L_{B971}$ | $R^{D13}$ | $R^{D64}$ | $R^{D1}$ |
| $L_{B132}$ | $R^{D3}$ | $R^{D11}$ | H | $L_{B552}$ | $R^{D64}$ | $R^{D64}$ | H | $L_{B972}$ | $R^{D13}$ | $R^{D66}$ | $R^{D1}$ |
| $L_{B133}$ | $R^{D3}$ | $R^{D12}$ | H | $L_{B553}$ | $R^{D64}$ | $R^{D66}$ | H | $L_{B973}$ | $R^{D13}$ | $R^{D68}$ | $R^{D1}$ |
| $L_{B134}$ | $R^{D3}$ | $R^{D13}$ | H | $L_{B554}$ | $R^{D64}$ | $R^{D68}$ | H | $L_{B974}$ | $R^{D13}$ | $R^{D76}$ | $R^{D1}$ |
| $L_{B135}$ | $R^{D3}$ | $R^{D14}$ | H | $L_{B555}$ | $R^{D64}$ | $R^{D76}$ | H | $L_{B975}$ | $R^{D14}$ | $R^{D5}$ | $R^{D1}$ |
| $L_{B136}$ | $R^{D3}$ | $R^{D15}$ | H | $L_{B556}$ | $R^{D66}$ | $R^{D5}$ | H | $L_{B976}$ | $R^{D14}$ | $R^{D6}$ | $R^{D1}$ |
| $L_{B137}$ | $R^{D3}$ | $R^{D16}$ | H | $L_{B557}$ | $R^{D66}$ | $R^{D6}$ | H | $L_{B977}$ | $R^{D14}$ | $R^{D9}$ | $R^{D1}$ |
| $L_{B138}$ | $R^{D3}$ | $R^{D17}$ | H | $L_{B558}$ | $R^{D66}$ | $R^{D9}$ | H | $L_{B978}$ | $R^{D14}$ | $R^{D10}$ | $R^{D1}$ |

-continued

| $L_{Bj}$ | $R^1$ | $R^2$ | $R^3$ | $L_{Bj}$ | $R^1$ | $R^2$ | $R^3$ | $L_{Bj}$ | $R^1$ | $R^2$ | $R^3$ |
|---|---|---|---|---|---|---|---|---|---|---|---|
| $L_{B139}$ | $R^{D3}$ | $R^{D18}$ | H | $L_{B559}$ | $R^{D66}$ | $R^{D10}$ | H | $L_{B979}$ | $R^{D14}$ | $R^{D12}$ | $R^{D1}$ |
| $L_{B140}$ | $R^{D3}$ | $R^{D19}$ | H | $L_{B560}$ | $R^{D66}$ | $R^{D12}$ | H | $L_{B980}$ | $R^{D14}$ | $R^{D15}$ | $R^{D1}$ |
| $L_{B141}$ | $R^{D3}$ | $R^{D20}$ | H | $L_{B561}$ | $R^{D66}$ | $R^{D15}$ | H | $L_{B981}$ | $R^{D14}$ | $R^{D16}$ | $R^{D1}$ |
| $L_{B142}$ | $R^{D3}$ | $R^{D21}$ | H | $L_{B562}$ | $R^{D66}$ | $R^{D16}$ | H | $L_{B982}$ | $R^{D14}$ | $R^{D17}$ | $R^{D1}$ |
| $L_{B143}$ | $R^{D3}$ | $R^{D22}$ | H | $L_{B563}$ | $R^{D66}$ | $R^{D17}$ | H | $L_{B983}$ | $R^{D14}$ | $R^{D18}$ | $R^{D1}$ |
| $L_{B144}$ | $R^{D3}$ | $R^{D23}$ | H | $L_{B564}$ | $R^{D66}$ | $R^{D18}$ | H | $L_{B984}$ | $R^{D14}$ | $R^{D19}$ | $R^{D1}$ |
| $L_{B145}$ | $R^{D3}$ | $R^{D24}$ | H | $L_{B565}$ | $R^{D66}$ | $R^{D19}$ | H | $L_{B985}$ | $R^{D14}$ | $R^{D20}$ | $R^{D1}$ |
| $L_{B146}$ | $R^{D3}$ | $R^{D25}$ | H | $L_{B566}$ | $R^{D66}$ | $R^{D20}$ | H | $L_{B986}$ | $R^{D14}$ | $R^{D21}$ | $R^{D1}$ |
| $L_{B147}$ | $R^{D3}$ | $R^{D26}$ | H | $L_{B567}$ | $R^{D66}$ | $R^{D21}$ | H | $L_{B987}$ | $R^{D14}$ | $R^{D22}$ | $R^{D1}$ |
| $L_{B148}$ | $R^{D3}$ | $R^{D27}$ | H | $L_{B568}$ | $R^{D66}$ | $R^{D23}$ | H | $L_{B988}$ | $R^{D14}$ | $R^{D23}$ | $R^{D1}$ |
| $L_{B149}$ | $R^{D3}$ | $R^{D28}$ | H | $L_{B569}$ | $R^{D66}$ | $R^{D24}$ | H | $L_{B989}$ | $R^{D14}$ | $R^{D24}$ | $R^{D1}$ |
| $L_{B150}$ | $R^{D3}$ | $R^{D29}$ | H | $L_{B570}$ | $R^{D66}$ | $R^{D25}$ | H | $L_{B990}$ | $R^{D14}$ | $R^{D25}$ | $R^{D1}$ |
| $L_{B151}$ | $R^{D3}$ | $R^{D30}$ | H | $L_{B571}$ | $R^{D66}$ | $R^{D27}$ | H | $L_{B991}$ | $R^{D14}$ | $R^{D26}$ | $R^{D1}$ |
| $L_{B152}$ | $R^{D3}$ | $R^{D31}$ | H | $L_{B572}$ | $R^{D66}$ | $R^{D28}$ | H | $L_{B992}$ | $R^{D14}$ | $R^{D27}$ | $R^{D1}$ |
| $L_{B153}$ | $R^{D3}$ | $R^{D32}$ | H | $L_{B573}$ | $R^{D66}$ | $R^{D29}$ | H | $L_{B993}$ | $R^{D14}$ | $R^{D28}$ | $R^{D1}$ |
| $L_{B154}$ | $R^{D3}$ | $R^{D33}$ | H | $L_{B574}$ | $R^{D66}$ | $R^{D30}$ | H | $L_{B994}$ | $R^{D14}$ | $R^{D29}$ | $R^{D1}$ |
| $L_{B155}$ | $R^{D3}$ | $R^{D34}$ | H | $L_{B575}$ | $R^{D66}$ | $R^{D31}$ | H | $L_{B995}$ | $R^{D14}$ | $R^{D30}$ | $R^{D1}$ |
| $L_{B156}$ | $R^{D3}$ | $R^{D35}$ | H | $L_{B576}$ | $R^{D66}$ | $R^{D32}$ | H | $L_{B996}$ | $R^{D14}$ | $R^{D31}$ | $R^{D1}$ |
| $L_{B157}$ | $R^{D3}$ | $R^{D40}$ | H | $L_{B577}$ | $R^{D66}$ | $R^{D33}$ | H | $L_{B997}$ | $R^{D14}$ | $R^{D32}$ | $R^{D1}$ |
| $L_{B158}$ | $R^{D3}$ | $R^{D41}$ | H | $L_{B578}$ | $R^{D66}$ | $R^{D34}$ | H | $L_{B998}$ | $R^{D14}$ | $R^{D33}$ | $R^{D1}$ |
| $L_{B159}$ | $R^{D3}$ | $R^{D42}$ | H | $L_{B579}$ | $R^{D66}$ | $R^{D42}$ | H | $L_{B999}$ | $R^{D14}$ | $R^{D34}$ | $R^{D1}$ |
| $L_{B160}$ | $R^{D3}$ | $R^{D64}$ | H | $L_{B580}$ | $R^{D66}$ | $R^{D68}$ | H | $L_{B1000}$ | $R^{D14}$ | $R^{D35}$ | $R^{D1}$ |
| $L_{B161}$ | $R^{D3}$ | $R^{D66}$ | H | $L_{B581}$ | $R^{D66}$ | $R^{D76}$ | H | $L_{B1001}$ | $R^{D14}$ | $R^{D40}$ | $R^{D1}$ |
| $L_{B162}$ | $R^{D3}$ | $R^{D68}$ | H | $L_{B582}$ | $R^{D68}$ | $R^{D5}$ | H | $L_{B1002}$ | $R^{D14}$ | $R^{D41}$ | $R^{D1}$ |
| $L_{B163}$ | $R^{D3}$ | $R^{D76}$ | H | $L_{B583}$ | $R^{D68}$ | $R^{D6}$ | H | $L_{B1003}$ | $R^{D14}$ | $R^{D42}$ | $R^{D1}$ |
| $L_{B164}$ | $R^{D4}$ | $R^{D5}$ | H | $L_{B584}$ | $R^{D68}$ | $R^{D9}$ | H | $L_{B1004}$ | $R^{D14}$ | $R^{D64}$ | $R^{D1}$ |
| $L_{B165}$ | $R^{D4}$ | $R^{D6}$ | H | $L_{B585}$ | $R^{D68}$ | $R^{D10}$ | H | $L_{B1005}$ | $R^{D14}$ | $R^{D66}$ | $R^{D1}$ |
| $L_{B166}$ | $R^{D4}$ | $R^{D7}$ | H | $L_{B586}$ | $R^{D68}$ | $R^{D12}$ | H | $L_{B1006}$ | $R^{D14}$ | $R^{D68}$ | $R^{D1}$ |
| $L_{B167}$ | $R^{D4}$ | $R^{D8}$ | H | $L_{B587}$ | $R^{D68}$ | $R^{D15}$ | H | $L_{B1007}$ | $R^{D14}$ | $R^{D76}$ | $R^{D1}$ |
| $L_{B168}$ | $R^{D4}$ | $R^{D9}$ | H | $L_{B588}$ | $R^{D68}$ | $R^{D16}$ | H | $L_{B1008}$ | $R^{D22}$ | $R^{D5}$ | $R^{D1}$ |
| $L_{B169}$ | $R^{D4}$ | $R^{D10}$ | H | $L_{B589}$ | $R^{D68}$ | $R^{D17}$ | H | $L_{B1009}$ | $R^{D22}$ | $R^{D6}$ | $R^{D1}$ |
| $L_{B170}$ | $R^{D4}$ | $R^{D11}$ | H | $L_{B590}$ | $R^{D68}$ | $R^{D18}$ | H | $L_{B1010}$ | $R^{D22}$ | $R^{D9}$ | $R^{D1}$ |
| $L_{B171}$ | $R^{D4}$ | $R^{D12}$ | H | $L_{B591}$ | $R^{D68}$ | $R^{D19}$ | H | $L_{B1011}$ | $R^{D22}$ | $R^{D10}$ | $R^{D1}$ |
| $L_{B172}$ | $R^{D4}$ | $R^{D13}$ | H | $L_{B592}$ | $R^{D68}$ | $R^{D20}$ | H | $L_{B1012}$ | $R^{D22}$ | $R^{D12}$ | $R^{D1}$ |
| $L_{B173}$ | $R^{D4}$ | $R^{D14}$ | H | $L_{B593}$ | $R^{D68}$ | $R^{D21}$ | H | $L_{B1013}$ | $R^{D22}$ | $R^{D15}$ | $R^{D1}$ |
| $L_{B174}$ | $R^{D4}$ | $R^{D15}$ | H | $L_{B594}$ | $R^{D68}$ | $R^{D23}$ | H | $L_{B1014}$ | $R^{D22}$ | $R^{D16}$ | $R^{D1}$ |
| $L_{B175}$ | $R^{D4}$ | $R^{D16}$ | H | $L_{B595}$ | $R^{D68}$ | $R^{D24}$ | H | $L_{B1015}$ | $R^{D22}$ | $R^{D17}$ | $R^{D1}$ |
| $L_{B176}$ | $R^{D4}$ | $R^{D17}$ | H | $L_{B596}$ | $R^{D68}$ | $R^{D25}$ | H | $L_{B1016}$ | $R^{D22}$ | $R^{D18}$ | $R^{D1}$ |
| $L_{B177}$ | $R^{D4}$ | $R^{D18}$ | H | $L_{B597}$ | $R^{D68}$ | $R^{D27}$ | H | $L_{B1017}$ | $R^{D22}$ | $R^{D19}$ | $R^{D1}$ |
| $L_{B178}$ | $R^{D4}$ | $R^{D19}$ | H | $L_{B598}$ | $R^{D68}$ | $R^{D28}$ | H | $L_{B1018}$ | $R^{D22}$ | $R^{D20}$ | $R^{D1}$ |
| $L_{B179}$ | $R^{D4}$ | $R^{D20}$ | H | $L_{B599}$ | $R^{D68}$ | $R^{D29}$ | H | $L_{B1019}$ | $R^{D22}$ | $R^{D21}$ | $R^{D1}$ |
| $L_{B180}$ | $R^{D4}$ | $R^{D21}$ | H | $L_{B600}$ | $R^{D68}$ | $R^{D30}$ | H | $L_{B1020}$ | $R^{D22}$ | $R^{D23}$ | $R^{D1}$ |
| $L_{B181}$ | $R^{D4}$ | $R^{D22}$ | H | $L_{B601}$ | $R^{D68}$ | $R^{D31}$ | H | $L_{B1021}$ | $R^{D22}$ | $R^{D24}$ | $R^{D1}$ |
| $L_{B182}$ | $R^{D4}$ | $R^{D23}$ | H | $L_{B602}$ | $R^{D68}$ | $R^{D32}$ | H | $L_{B1022}$ | $R^{D22}$ | $R^{D25}$ | $R^{D1}$ |
| $L_{B183}$ | $R^{D4}$ | $R^{D24}$ | H | $L_{B603}$ | $R^{D68}$ | $R^{D33}$ | H | $L_{B1023}$ | $R^{D22}$ | $R^{D26}$ | $R^{D1}$ |
| $L_{B184}$ | $R^{D4}$ | $R^{D25}$ | H | $L_{B604}$ | $R^{D68}$ | $R^{D34}$ | H | $L_{B1024}$ | $R^{D22}$ | $R^{D27}$ | $R^{D1}$ |
| $L_{B185}$ | $R^{D4}$ | $R^{D26}$ | H | $L_{B605}$ | $R^{D68}$ | $R^{D42}$ | H | $L_{B1025}$ | $R^{D22}$ | $R^{D28}$ | $R^{D1}$ |
| $L_{B186}$ | $R^{D4}$ | $R^{D27}$ | H | $L_{B606}$ | $R^{D68}$ | $R^{D76}$ | H | $L_{B1026}$ | $R^{D22}$ | $R^{D29}$ | $R^{D1}$ |
| $L_{B187}$ | $R^{D4}$ | $R^{D28}$ | H | $L_{B607}$ | $R^{D76}$ | $R^{D5}$ | H | $L_{B1027}$ | $R^{D22}$ | $R^{D30}$ | $R^{D1}$ |
| $L_{B188}$ | $R^{D4}$ | $R^{D29}$ | H | $L_{B608}$ | $R^{D76}$ | $R^{D6}$ | H | $L_{B1028}$ | $R^{D22}$ | $R^{D31}$ | $R^{D1}$ |
| $L_{B189}$ | $R^{D4}$ | $R^{D30}$ | H | $L_{B609}$ | $R^{D76}$ | $R^{D9}$ | H | $L_{B1029}$ | $R^{D22}$ | $R^{D32}$ | $R^{D1}$ |
| $L_{B190}$ | $R^{D4}$ | $R^{D31}$ | H | $L_{B610}$ | $R^{D76}$ | $R^{D10}$ | H | $L_{B1030}$ | $R^{D22}$ | $R^{D33}$ | $R^{D1}$ |
| $L_{B191}$ | $R^{D4}$ | $R^{D32}$ | H | $L_{B611}$ | $R^{D76}$ | $R^{D12}$ | H | $L_{B1031}$ | $R^{D22}$ | $R^{D34}$ | $R^{D1}$ |
| $L_{B192}$ | $R^{D4}$ | $R^{D33}$ | H | $L_{B612}$ | $R^{D76}$ | $R^{D15}$ | H | $L_{B1032}$ | $R^{D22}$ | $R^{D35}$ | $R^{D1}$ |
| $L_{B193}$ | $R^{D4}$ | $R^{D34}$ | H | $L_{B613}$ | $R^{D76}$ | $R^{D16}$ | H | $L_{B1033}$ | $R^{D22}$ | $R^{D40}$ | $R^{D1}$ |
| $L_{B194}$ | $R^{D4}$ | $R^{D35}$ | H | $L_{B614}$ | $R^{D76}$ | $R^{D17}$ | H | $L_{B1034}$ | $R^{D22}$ | $R^{D41}$ | $R^{D1}$ |
| $L_{B195}$ | $R^{D4}$ | $R^{D40}$ | H | $L_{B615}$ | $R^{D76}$ | $R^{D18}$ | H | $L_{B1035}$ | $R^{D22}$ | $R^{D42}$ | $R^{D1}$ |
| $L_{B196}$ | $R^{D4}$ | $R^{D41}$ | H | $L_{B616}$ | $R^{D76}$ | $R^{D19}$ | H | $L_{B1036}$ | $R^{D22}$ | $R^{D64}$ | $R^{D1}$ |
| $L_{B197}$ | $R^{D4}$ | $R^{D42}$ | H | $L_{B617}$ | $R^{D76}$ | $R^{D20}$ | H | $L_{B1037}$ | $R^{D22}$ | $R^{D66}$ | $R^{D1}$ |
| $L_{B198}$ | $R^{D4}$ | $R^{D64}$ | H | $L_{B618}$ | $R^{D76}$ | $R^{D21}$ | H | $L_{B1038}$ | $R^{D22}$ | $R^{D68}$ | $R^{D1}$ |
| $L_{B199}$ | $R^{D4}$ | $R^{D66}$ | H | $L_{B619}$ | $R^{D76}$ | $R^{D23}$ | H | $L_{B1039}$ | $R^{D22}$ | $R^{D76}$ | $R^{D1}$ |
| $L_{B200}$ | $R^{D4}$ | $R^{D68}$ | H | $L_{B620}$ | $R^{D76}$ | $R^{D24}$ | H | $L_{B1040}$ | $R^{D26}$ | $R^{D5}$ | $R^{D1}$ |
| $L_{B201}$ | $R^{D4}$ | $R^{D76}$ | H | $L_{B621}$ | $R^{D76}$ | $R^{D25}$ | H | $L_{B1041}$ | $R^{D26}$ | $R^{D6}$ | $R^{D1}$ |
| $L_{B202}$ | $R^{D4}$ | $R^{D1}$ | H | $L_{B622}$ | $R^{D76}$ | $R^{D27}$ | H | $L_{B1042}$ | $R^{D26}$ | $R^{D9}$ | $R^{D1}$ |
| $L_{B203}$ | $R^{D7}$ | $R^{D5}$ | H | $L_{B623}$ | $R^{D76}$ | $R^{D28}$ | H | $L_{B1043}$ | $R^{D26}$ | $R^{D10}$ | $R^{D1}$ |
| $L_{B204}$ | $R^{D7}$ | $R^{D6}$ | H | $L_{B624}$ | $R^{D76}$ | $R^{D29}$ | H | $L_{B1044}$ | $R^{D26}$ | $R^{D12}$ | $R^{D1}$ |
| $L_{B205}$ | $R^{D7}$ | $R^{D8}$ | H | $L_{B625}$ | $R^{D76}$ | $R^{D30}$ | H | $L_{B1045}$ | $R^{D26}$ | $R^{D15}$ | $R^{D1}$ |
| $L_{B206}$ | $R^{D7}$ | $R^{D9}$ | H | $L_{B626}$ | $R^{D76}$ | $R^{D31}$ | H | $L_{B1046}$ | $R^{D26}$ | $R^{D16}$ | $R^{D1}$ |
| $L_{B207}$ | $R^{D7}$ | $R^{D10}$ | H | $L_{B627}$ | $R^{D76}$ | $R^{D32}$ | H | $L_{B1047}$ | $R^{D26}$ | $R^{D17}$ | $R^{D1}$ |
| $L_{B208}$ | $R^{D7}$ | $R^{D11}$ | H | $L_{B628}$ | $R^{D76}$ | $R^{D33}$ | H | $L_{B1048}$ | $R^{D26}$ | $R^{D18}$ | $R^{D1}$ |
| $L_{B209}$ | $R^{D7}$ | $R^{D12}$ | H | $L_{B629}$ | $R^{D76}$ | $R^{D34}$ | H | $L_{B1049}$ | $R^{D26}$ | $R^{D19}$ | $R^{D1}$ |
| $L_{B210}$ | $R^{D7}$ | $R^{D13}$ | H | $L_{B630}$ | $R^{D76}$ | $R^{D42}$ | H | $L_{B1050}$ | $R^{D26}$ | $R^{D20}$ | $R^{D1}$ |
| $L_{B211}$ | $R^{D7}$ | $R^{D14}$ | H | $L_{B631}$ | $R^{D1}$ | $R^{D1}$ | $R^{D1}$ | $L_{B1051}$ | $R^{D26}$ | $R^{D21}$ | $R^{D1}$ |
| $L_{B212}$ | $R^{D7}$ | $R^{D15}$ | H | $L_{B632}$ | $R^{D2}$ | $R^{D2}$ | $R^{D1}$ | $L_{B1052}$ | $R^{D26}$ | $R^{D23}$ | $R^{D1}$ |
| $L_{B213}$ | $R^{D7}$ | $R^{D16}$ | H | $L_{B633}$ | $R^{D3}$ | $R^{D3}$ | $R^{D1}$ | $L_{B1053}$ | $R^{D26}$ | $R^{D24}$ | $R^{D1}$ |
| $L_{B214}$ | $R^{D7}$ | $R^{D17}$ | H | $L_{B634}$ | $R^{D4}$ | $R^{D4}$ | $R^{D1}$ | $L_{B1054}$ | $R^{D26}$ | $R^{D25}$ | $R^{D1}$ |
| $L_{B215}$ | $R^{D7}$ | $R^{D18}$ | H | $L_{B635}$ | $R^{D5}$ | $R^{D5}$ | $R^{D1}$ | $L_{B1055}$ | $R^{D26}$ | $R^{D27}$ | $R^{D1}$ |

-continued

| $L_{Bj}$ | $R^1$ | $R^2$ | $R^3$ | $L_{Bj}$ | $R^1$ | $R^2$ | $R^3$ | $L_{Bj}$ | $R^1$ | $R^2$ | $R^3$ |
|---|---|---|---|---|---|---|---|---|---|---|---|
| $L_{B216}$ | $R^{D7}$ | $R^{D19}$ | H | $L_{B636}$ | $R^{D6}$ | $R^{D6}$ | $R^{D1}$ | $L_{B1056}$ | $R^{D26}$ | $R^{D28}$ | $R^{D1}$ |
| $L_{B217}$ | $R^{D7}$ | $R^{D20}$ | H | $L_{B637}$ | $R^{D7}$ | $R^{D7}$ | $R^{D1}$ | $L_{B1057}$ | $R^{D26}$ | $R^{D29}$ | $R^{D1}$ |
| $L_{B218}$ | $R^{D7}$ | $R^{D21}$ | H | $L_{B638}$ | $R^{D8}$ | $R^{D8}$ | $R^{D1}$ | $L_{B1058}$ | $R^{D26}$ | $R^{D30}$ | $R^{D1}$ |
| $L_{B219}$ | $R^{D7}$ | $R^{D22}$ | H | $L_{B639}$ | $R^{D9}$ | $R^{D9}$ | $R^{D1}$ | $L_{B1059}$ | $R^{D26}$ | $R^{D31}$ | $R^{D1}$ |
| $L_{B220}$ | $R^{D7}$ | $R^{D23}$ | H | $L_{B640}$ | $R^{D10}$ | $R^{D10}$ | $R^{D1}$ | $L_{B1060}$ | $R^{D26}$ | $R^{D32}$ | $R^{D1}$ |
| $L_{B221}$ | $R^{D7}$ | $R^{D24}$ | H | $L_{B641}$ | $R^{D11}$ | $R^{D11}$ | $R^{D1}$ | $L_{B1061}$ | $R^{D26}$ | $R^{D33}$ | $R^{D1}$ |
| $L_{B222}$ | $R^{D7}$ | $R^{D25}$ | H | $L_{B642}$ | $R^{D12}$ | $R^{D12}$ | $R^{D1}$ | $L_{B1062}$ | $R^{D26}$ | $R^{D34}$ | $R^{D1}$ |
| $L_{B223}$ | $R^{D7}$ | $R^{D26}$ | H | $L_{B643}$ | $R^{D13}$ | $R^{D13}$ | $R^{D1}$ | $L_{B1063}$ | $R^{D26}$ | $R^{D35}$ | $R^{D1}$ |
| $L_{B224}$ | $R^{D7}$ | $R^{D27}$ | H | $L_{B644}$ | $R^{D14}$ | $R^{D14}$ | $R^{D1}$ | $L_{B1064}$ | $R^{D26}$ | $R^{D40}$ | $R^{D1}$ |
| $L_{B225}$ | $R^{D7}$ | $R^{D28}$ | H | $L_{B645}$ | $R^{D15}$ | $R^{D15}$ | $R^{D1}$ | $L_{B1065}$ | $R^{D26}$ | $R^{D41}$ | $R^{D1}$ |
| $L_{B226}$ | $R^{D7}$ | $R^{D29}$ | H | $L_{B646}$ | $R^{D16}$ | $R^{D16}$ | $R^{D1}$ | $L_{B1066}$ | $R^{D26}$ | $R^{D42}$ | $R^{D1}$ |
| $L_{B227}$ | $R^{D7}$ | $R^{D30}$ | H | $L_{B647}$ | $R^{D17}$ | $R^{D17}$ | $R^{D1}$ | $L_{B1067}$ | $R^{D26}$ | $R^{D64}$ | $R^{D1}$ |
| $L_{B228}$ | $R^{D7}$ | $R^{D31}$ | H | $L_{B648}$ | $R^{D18}$ | $R^{D18}$ | $R^{D1}$ | $L_{B1068}$ | $R^{D26}$ | $R^{D66}$ | $R^{D1}$ |
| $L_{B229}$ | $R^{D7}$ | $R^{D32}$ | H | $L_{B649}$ | $R^{D19}$ | $R^{D19}$ | $R^{D1}$ | $L_{B1069}$ | $R^{D26}$ | $R^{D68}$ | $R^{D1}$ |
| $L_{B230}$ | $R^{D7}$ | $R^{D33}$ | H | $L_{B650}$ | $R^{D20}$ | $R^{D20}$ | $R^{D1}$ | $L_{B1070}$ | $R^{D26}$ | $R^{D76}$ | $R^{D1}$ |
| $L_{B231}$ | $R^{D7}$ | $R^{D34}$ | H | $L_{B651}$ | $R^{D21}$ | $R^{D21}$ | $R^{D1}$ | $L_{B1071}$ | $R^{D35}$ | $R^{D5}$ | $R^{D1}$ |
| $L_{B232}$ | $R^{D7}$ | $R^{D35}$ | H | $L_{B652}$ | $R^{D22}$ | $R^{D22}$ | $R^{D1}$ | $L_{B1072}$ | $R^{D35}$ | $R^{D6}$ | $R^{D1}$ |
| $L_{B233}$ | $R^{D7}$ | $R^{D40}$ | H | $L_{B653}$ | $R^{D23}$ | $R^{D23}$ | $R^{D1}$ | $L_{B1073}$ | $R^{D35}$ | $R^{D9}$ | $R^{D1}$ |
| $L_{B234}$ | $R^{D7}$ | $R^{D41}$ | H | $L_{B654}$ | $R^{D24}$ | $R^{D24}$ | $R^{D1}$ | $L_{B1074}$ | $R^{D35}$ | $R^{D10}$ | $R^{D1}$ |
| $L_{B235}$ | $R^{D7}$ | $R^{D42}$ | H | $L_{B655}$ | $R^{D25}$ | $R^{D25}$ | $R^{D1}$ | $L_{B1075}$ | $R^{D35}$ | $R^{D12}$ | $R^{D1}$ |
| $L_{B236}$ | $R^{D7}$ | $R^{D64}$ | H | $L_{B656}$ | $R^{D26}$ | $R^{D26}$ | $R^{D1}$ | $L_{B1076}$ | $R^{D35}$ | $R^{D15}$ | $R^{D1}$ |
| $L_{B237}$ | $R^{D7}$ | $R^{D66}$ | H | $L_{B657}$ | $R^{D27}$ | $R^{D27}$ | $R^{D1}$ | $L_{B1077}$ | $R^{D35}$ | $R^{D16}$ | $R^{D1}$ |
| $L_{B238}$ | $R^{D7}$ | $R^{D68}$ | H | $L_{B658}$ | $R^{D28}$ | $R^{D28}$ | $R^{D1}$ | $L_{B1078}$ | $R^{D35}$ | $R^{D17}$ | $R^{D1}$ |
| $L_{B239}$ | $R^{D7}$ | $R^{D76}$ | H | $L_{B659}$ | $R^{D29}$ | $R^{D29}$ | $R^{D1}$ | $L_{B1079}$ | $R^{D35}$ | $R^{D18}$ | $R^{D1}$ |
| $L_{B240}$ | $R^{D8}$ | $R^{D5}$ | H | $L_{B660}$ | $R^{D30}$ | $R^{D30}$ | $R^{D1}$ | $L_{B1080}$ | $R^{D35}$ | $R^{D19}$ | $R^{D1}$ |
| $L_{B241}$ | $R^{D8}$ | $R^{D6}$ | H | $L_{B661}$ | $R^{D31}$ | $R^{D31}$ | $R^{D1}$ | $L_{B1081}$ | $R^{D35}$ | $R^{D20}$ | $R^{D1}$ |
| $L_{B242}$ | $R^{D8}$ | $R^{D9}$ | H | $L_{B662}$ | $R^{D32}$ | $R^{D32}$ | $R^{D1}$ | $L_{B1082}$ | $R^{D35}$ | $R^{D21}$ | $R^{D1}$ |
| $L_{B243}$ | $R^{D8}$ | $R^{D10}$ | H | $L_{B663}$ | $R^{D33}$ | $R^{D33}$ | $R^{D1}$ | $L_{B1083}$ | $R^{D35}$ | $R^{D23}$ | $R^{D1}$ |
| $L_{B244}$ | $R^{D8}$ | $R^{D11}$ | H | $L_{B664}$ | $R^{D34}$ | $R^{D34}$ | $R^{D1}$ | $L_{B1084}$ | $R^{D35}$ | $R^{D24}$ | $R^{D1}$ |
| $L_{B245}$ | $R^{D8}$ | $R^{D12}$ | H | $L_{B665}$ | $R^{D35}$ | $R^{D35}$ | $R^{D1}$ | $L_{B1085}$ | $R^{D35}$ | $R^{D25}$ | $R^{D1}$ |
| $L_{B246}$ | $R^{D8}$ | $R^{D13}$ | H | $L_{B666}$ | $R^{D40}$ | $R^{D40}$ | $R^{D1}$ | $L_{B1086}$ | $R^{D35}$ | $R^{D27}$ | $R^{D1}$ |
| $L_{B247}$ | $R^{D8}$ | $R^{D14}$ | H | $L_{B667}$ | $R^{D41}$ | $R^{D41}$ | $R^{D1}$ | $L_{B1087}$ | $R^{D35}$ | $R^{D28}$ | $R^{D1}$ |
| $L_{B248}$ | $R^{D8}$ | $R^{D15}$ | H | $L_{B668}$ | $R^{D42}$ | $R^{D42}$ | $R^{D1}$ | $L_{B1088}$ | $R^{D35}$ | $R^{D29}$ | $R^{D1}$ |
| $L_{B249}$ | $R^{D8}$ | $R^{D16}$ | H | $L_{B669}$ | $R^{D64}$ | $R^{D64}$ | $R^{D1}$ | $L_{B1089}$ | $R^{D35}$ | $R^{D30}$ | $R^{D1}$ |
| $L_{B250}$ | $R^{D8}$ | $R^{D17}$ | H | $L_{B670}$ | $R^{D66}$ | $R^{D66}$ | $R^{D1}$ | $L_{B1090}$ | $R^{D35}$ | $R^{D31}$ | $R^{D1}$ |
| $L_{B251}$ | $R^{D8}$ | $R^{D18}$ | H | $L_{B671}$ | $R^{D68}$ | $R^{D68}$ | $R^{D1}$ | $L_{B1091}$ | $R^{D35}$ | $R^{D32}$ | $R^{D1}$ |
| $L_{B252}$ | $R^{D8}$ | $R^{D19}$ | H | $L_{B672}$ | $R^{D76}$ | $R^{D76}$ | $R^{D1}$ | $L_{B1092}$ | $R^{D35}$ | $R^{D33}$ | $R^{D1}$ |
| $L_{B253}$ | $R^{D8}$ | $R^{D20}$ | H | $L_{B673}$ | $R^{D1}$ | $R^{D2}$ | $R^{D1}$ | $L_{B1093}$ | $R^{D35}$ | $R^{D34}$ | $R^{D1}$ |
| $L_{B254}$ | $R^{D8}$ | $R^{D21}$ | H | $L_{B674}$ | $R^{D1}$ | $R^{D3}$ | $R^{D1}$ | $L_{B1094}$ | $R^{D35}$ | $R^{D40}$ | $R^{D1}$ |
| $L_{B255}$ | $R^{D8}$ | $R^{D22}$ | H | $L_{B675}$ | $R^{D1}$ | $R^{D4}$ | $R^{D1}$ | $L_{B1095}$ | $R^{D35}$ | $R^{D41}$ | $R^{D1}$ |
| $L_{B256}$ | $R^{D8}$ | $R^{D23}$ | H | $L_{B676}$ | $R^{D1}$ | $R^{D5}$ | $R^{D1}$ | $L_{B1096}$ | $R^{D35}$ | $R^{D42}$ | $R^{D1}$ |
| $L_{B257}$ | $R^{D8}$ | $R^{D24}$ | H | $L_{B677}$ | $R^{D1}$ | $R^{D6}$ | $R^{D1}$ | $L_{B1097}$ | $R^{D35}$ | $R^{D64}$ | $R^{D1}$ |
| $L_{B258}$ | $R^{D8}$ | $R^{D25}$ | H | $L_{B678}$ | $R^{D1}$ | $R^{D7}$ | $R^{D1}$ | $L_{B1098}$ | $R^{D35}$ | $R^{D66}$ | $R^{D1}$ |
| $L_{B259}$ | $R^{D8}$ | $R^{D26}$ | H | $L_{B679}$ | $R^{D1}$ | $R^{D8}$ | $R^{D1}$ | $L_{B1099}$ | $R^{D35}$ | $R^{D68}$ | $R^{D1}$ |
| $L_{B260}$ | $R^{D8}$ | $R^{D27}$ | H | $L_{B680}$ | $R^{D1}$ | $R^{D9}$ | $R^{D1}$ | $L_{B1100}$ | $R^{D35}$ | $R^{D76}$ | $R^{D1}$ |
| $L_{B261}$ | $R^{D8}$ | $R^{D28}$ | H | $L_{B681}$ | $R^{D1}$ | $R^{D10}$ | $R^{D1}$ | $L_{B1101}$ | $R^{D40}$ | $R^{D5}$ | $R^{D1}$ |
| $L_{B262}$ | $R^{D8}$ | $R^{D29}$ | H | $L_{B682}$ | $R^{D1}$ | $R^{D11}$ | $R^{D1}$ | $L_{B1102}$ | $R^{D40}$ | $R^{D6}$ | $R^{D1}$ |
| $L_{B263}$ | $R^{D8}$ | $R^{D30}$ | H | $L_{B683}$ | $R^{D1}$ | $R^{D12}$ | $R^{D1}$ | $L_{B1103}$ | $R^{D40}$ | $R^{D9}$ | $R^{D1}$ |
| $L_{B264}$ | $R^{D8}$ | $R^{D31}$ | H | $L_{B684}$ | $R^{D1}$ | $R^{D13}$ | $R^{D1}$ | $L_{B1104}$ | $R^{D40}$ | $R^{D10}$ | $R^{D1}$ |
| $L_{B265}$ | $R^{D8}$ | $R^{D32}$ | H | $L_{B685}$ | $R^{D1}$ | $R^{D14}$ | $R^{D1}$ | $L_{B1105}$ | $R^{D40}$ | $R^{D12}$ | $R^{D1}$ |
| $L_{B266}$ | $R^{D8}$ | $R^{D33}$ | H | $L_{B686}$ | $R^{D1}$ | $R^{D15}$ | $R^{D1}$ | $L_{B1106}$ | $R^{D40}$ | $R^{D15}$ | $R^{D1}$ |
| $L_{B267}$ | $R^{D8}$ | $R^{D34}$ | H | $L_{B687}$ | $R^{D1}$ | $R^{D16}$ | $R^{D1}$ | $L_{B1107}$ | $R^{D40}$ | $R^{D16}$ | $R^{D1}$ |
| $L_{B268}$ | $R^{D8}$ | $R^{D35}$ | H | $L_{B688}$ | $R^{D1}$ | $R^{D17}$ | $R^{D1}$ | $L_{B1108}$ | $R^{D40}$ | $R^{D17}$ | $R^{D1}$ |
| $L_{B269}$ | $R^{D8}$ | $R^{D40}$ | H | $L_{B689}$ | $R^{D1}$ | $R^{D18}$ | $R^{D1}$ | $L_{B1109}$ | $R^{D40}$ | $R^{D18}$ | $R^{D1}$ |
| $L_{B270}$ | $R^{D8}$ | $R^{D41}$ | H | $L_{B690}$ | $R^{D1}$ | $R^{D19}$ | $R^{D1}$ | $L_{B1110}$ | $R^{D40}$ | $R^{D19}$ | $R^{D1}$ |
| $L_{B271}$ | $R^{D8}$ | $R^{D42}$ | H | $L_{B691}$ | $R^{D1}$ | $R^{D20}$ | $R^{D1}$ | $L_{B1111}$ | $R^{D40}$ | $R^{D20}$ | $R^{D1}$ |
| $L_{B272}$ | $R^{D8}$ | $R^{D64}$ | H | $L_{B692}$ | $R^{D1}$ | $R^{D21}$ | $R^{D1}$ | $L_{B1112}$ | $R^{D40}$ | $R^{D21}$ | $R^{D1}$ |
| $L_{B273}$ | $R^{D8}$ | $R^{D66}$ | H | $L_{B693}$ | $R^{D1}$ | $R^{D22}$ | $R^{D1}$ | $L_{B1113}$ | $R^{D40}$ | $R^{D23}$ | $R^{D1}$ |
| $L_{B274}$ | $R^{D8}$ | $R^{D68}$ | H | $L_{B694}$ | $R^{D1}$ | $R^{D23}$ | $R^{D1}$ | $L_{B1114}$ | $R^{D40}$ | $R^{D24}$ | $R^{D1}$ |
| $L_{B275}$ | $R^{D8}$ | $R^{D76}$ | H | $L_{B695}$ | $R^{D1}$ | $R^{D24}$ | $R^{D1}$ | $L_{B1115}$ | $R^{D40}$ | $R^{D25}$ | $R^{D1}$ |
| $L_{B276}$ | $R^{D11}$ | $R^{D5}$ | H | $L_{B696}$ | $R^{D1}$ | $R^{D25}$ | $R^{D1}$ | $L_{B1116}$ | $R^{D40}$ | $R^{D27}$ | $R^{D1}$ |
| $L_{B277}$ | $R^{D11}$ | $R^{D6}$ | H | $L_{B697}$ | $R^{D1}$ | $R^{D26}$ | $R^{D1}$ | $L_{B1117}$ | $R^{D40}$ | $R^{D28}$ | $R^{D1}$ |
| $L_{B278}$ | $R^{D11}$ | $R^{D9}$ | H | $L_{B698}$ | $R^{D1}$ | $R^{D27}$ | $R^{D1}$ | $L_{B1118}$ | $R^{D40}$ | $R^{D29}$ | $R^{D1}$ |
| $L_{B279}$ | $R^{D11}$ | $R^{D10}$ | H | $L_{B699}$ | $R^{D1}$ | $R^{D28}$ | $R^{D1}$ | $L_{B1119}$ | $R^{D40}$ | $R^{D30}$ | $R^{D1}$ |
| $L_{B280}$ | $R^{D11}$ | $R^{D12}$ | H | $L_{B700}$ | $R^{D1}$ | $R^{D29}$ | $R^{D1}$ | $L_{B1120}$ | $R^{D40}$ | $R^{D31}$ | $R^{D1}$ |
| $L_{B281}$ | $R^{D11}$ | $R^{D13}$ | H | $L_{B701}$ | $R^{D1}$ | $R^{D30}$ | $R^{D1}$ | $L_{B1121}$ | $R^{D40}$ | $R^{D32}$ | $R^{D1}$ |
| $L_{B282}$ | $R^{D11}$ | $R^{D14}$ | H | $L_{B702}$ | $R^{D1}$ | $R^{D31}$ | $R^{D1}$ | $L_{B1122}$ | $R^{D40}$ | $R^{D33}$ | $R^{D1}$ |
| $L_{B283}$ | $R^{D11}$ | $R^{D15}$ | H | $L_{B703}$ | $R^{D1}$ | $R^{D32}$ | $R^{D1}$ | $L_{B1123}$ | $R^{D40}$ | $R^{D34}$ | $R^{D1}$ |
| $L_{B284}$ | $R^{D11}$ | $R^{D16}$ | H | $L_{B704}$ | $R^{D1}$ | $R^{D33}$ | $R^{D1}$ | $L_{B1124}$ | $R^{D40}$ | $R^{D41}$ | $R^{D1}$ |
| $L_{B285}$ | $R^{D11}$ | $R^{D17}$ | H | $L_{B705}$ | $R^{D1}$ | $R^{D34}$ | $R^{D1}$ | $L_{B1125}$ | $R^{D40}$ | $R^{D42}$ | $R^{D1}$ |
| $L_{B286}$ | $R^{D11}$ | $R^{D18}$ | H | $L_{B706}$ | $R^{D1}$ | $R^{D35}$ | $R^{D1}$ | $L_{B1126}$ | $R^{D40}$ | $R^{D64}$ | $R^{D1}$ |
| $L_{B287}$ | $R^{D11}$ | $R^{D19}$ | H | $L_{B707}$ | $R^{D1}$ | $R^{D40}$ | $R^{D1}$ | $L_{B1127}$ | $R^{D40}$ | $R^{D66}$ | $R^{D1}$ |
| $L_{B288}$ | $R^{D11}$ | $R^{D20}$ | H | $L_{B708}$ | $R^{D1}$ | $R^{D41}$ | $R^{D1}$ | $L_{B1128}$ | $R^{D40}$ | $R^{D68}$ | $R^{D1}$ |
| $L_{B289}$ | $R^{D11}$ | $R^{D21}$ | H | $L_{B709}$ | $R^{D1}$ | $R^{D42}$ | $R^{D1}$ | $L_{B1129}$ | $R^{D40}$ | $R^{D76}$ | $R^{D1}$ |
| $L_{B290}$ | $R^{D11}$ | $R^{D22}$ | H | $L_{B710}$ | $R^{D1}$ | $R^{D64}$ | $R^{D1}$ | $L_{B1130}$ | $R^{D41}$ | $R^{D5}$ | $R^{D1}$ |
| $L_{B291}$ | $R^{D11}$ | $R^{D23}$ | H | $L_{B711}$ | $R^{D1}$ | $R^{D66}$ | $R^{D1}$ | $L_{B1131}$ | $R^{D41}$ | $R^{D6}$ | $R^{D1}$ |
| $L_{B292}$ | $R^{D11}$ | $R^{D24}$ | H | $L_{B712}$ | $R^{D1}$ | $R^{D68}$ | $R^{D1}$ | $L_{B1132}$ | $R^{D41}$ | $R^{D9}$ | $R^{D1}$ |

-continued

| $L_{Bj}$ | $R^1$ | $R^2$ | $R^3$ | $L_{Bj}$ | $R^1$ | $R^2$ | $R^3$ | $L_{Bj}$ | $R^1$ | $R^2$ | $R^3$ |
|---|---|---|---|---|---|---|---|---|---|---|---|
| $L_{B293}$ | $R^{D11}$ | $R^{D25}$ | H | $L_{B713}$ | $R^{D1}$ | $R^{D76}$ | $R^{D1}$ | $L_{B1133}$ | $R^{D41}$ | $R^{D10}$ | $R^{D1}$ |
| $L_{B294}$ | $R^{D11}$ | $R^{D26}$ | H | $L_{B714}$ | $R^{D2}$ | $R^{D1}$ | $R^{D1}$ | $L_{B1134}$ | $R^{D41}$ | $R^{D12}$ | $R^{D1}$ |
| $L_{B295}$ | $R^{D11}$ | $R^{D27}$ | H | $L_{B715}$ | $R^{D2}$ | $R^{D3}$ | $R^{D1}$ | $L_{B1135}$ | $R^{D41}$ | $R^{D15}$ | $R^{D1}$ |
| $L_{B296}$ | $R^{D11}$ | $R^{D28}$ | H | $L_{B716}$ | $R^{D2}$ | $R^{D4}$ | $R^{D1}$ | $L_{B1136}$ | $R^{D41}$ | $R^{D16}$ | $R^{D1}$ |
| $L_{B297}$ | $R^{D11}$ | $R^{D29}$ | H | $L_{B717}$ | $R^{D2}$ | $R^{D5}$ | $R^{D1}$ | $L_{B1137}$ | $R^{D41}$ | $R^{D17}$ | $R^{D1}$ |
| $L_{B298}$ | $R^{D11}$ | $R^{D30}$ | H | $L_{B718}$ | $R^{D2}$ | $R^{D6}$ | $R^{D1}$ | $L_{B1138}$ | $R^{D41}$ | $R^{D18}$ | $R^{D1}$ |
| $L_{B299}$ | $R^{D11}$ | $R^{D31}$ | H | $L_{B719}$ | $R^{D2}$ | $R^{D7}$ | $R^{D1}$ | $L_{B1139}$ | $R^{D41}$ | $R^{D19}$ | $R^{D1}$ |
| $L_{B300}$ | $R^{D11}$ | $R^{D32}$ | H | $L_{B720}$ | $R^{D2}$ | $R^{D8}$ | $R^{D1}$ | $L_{B1140}$ | $R^{D41}$ | $R^{D20}$ | $R^{D1}$ |
| $L_{B301}$ | $R^{D11}$ | $R^{D33}$ | H | $L_{B721}$ | $R^{D2}$ | $R^{D9}$ | $R^{D1}$ | $L_{B1141}$ | $R^{D41}$ | $R^{D21}$ | $R^{D1}$ |
| $L_{B302}$ | $R^{D11}$ | $R^{D34}$ | H | $L_{B722}$ | $R^{D2}$ | $R^{D10}$ | $R^{D1}$ | $L_{B1142}$ | $R^{D41}$ | $R^{D23}$ | $R^{D1}$ |
| $L_{B303}$ | $R^{D11}$ | $R^{D35}$ | H | $L_{B723}$ | $R^{D2}$ | $R^{D11}$ | $R^{D1}$ | $L_{B1143}$ | $R^{D41}$ | $R^{D24}$ | $R^{D1}$ |
| $L_{B304}$ | $R^{D11}$ | $R^{D40}$ | H | $L_{B724}$ | $R^{D2}$ | $R^{D12}$ | $R^{D1}$ | $L_{B1144}$ | $R^{D41}$ | $R^{D25}$ | $R^{D1}$ |
| $L_{B305}$ | $R^{D11}$ | $R^{D41}$ | H | $L_{B725}$ | $R^{D2}$ | $R^{D13}$ | $R^{D1}$ | $L_{B1145}$ | $R^{D41}$ | $R^{D27}$ | $R^{D1}$ |
| $L_{B306}$ | $R^{D11}$ | $R^{D42}$ | H | $L_{B726}$ | $R^{D2}$ | $R^{D14}$ | $R^{D1}$ | $L_{B1146}$ | $R^{D41}$ | $R^{D28}$ | $R^{D1}$ |
| $L_{B307}$ | $R^{D11}$ | $R^{D64}$ | H | $L_{B727}$ | $R^{D2}$ | $R^{D15}$ | $R^{D1}$ | $L_{B1147}$ | $R^{D41}$ | $R^{D29}$ | $R^{D1}$ |
| $L_{B308}$ | $R^{D11}$ | $R^{D66}$ | H | $L_{B728}$ | $R^{D2}$ | $R^{D16}$ | $R^{D1}$ | $L_{B1148}$ | $R^{D41}$ | $R^{D30}$ | $R^{D1}$ |
| $L_{B309}$ | $R^{D11}$ | $R^{D68}$ | H | $L_{B729}$ | $R^{D2}$ | $R^{D17}$ | $R^{D1}$ | $L_{B1149}$ | $R^{D41}$ | $R^{D31}$ | $R^{D1}$ |
| $L_{B310}$ | $R^{D11}$ | $R^{D76}$ | H | $L_{B730}$ | $R^{D2}$ | $R^{D18}$ | $R^{D1}$ | $L_{B1150}$ | $R^{D41}$ | $R^{D32}$ | $R^{D1}$ |
| $L_{B311}$ | $R^{D13}$ | $R^{D5}$ | H | $L_{B731}$ | $R^{D2}$ | $R^{D19}$ | $R^{D1}$ | $L_{B1151}$ | $R^{D41}$ | $R^{D33}$ | $R^{D1}$ |
| $L_{B312}$ | $R^{D13}$ | $R^{D6}$ | H | $L_{B732}$ | $R^{D2}$ | $R^{D20}$ | $R^{D1}$ | $L_{B1152}$ | $R^{D41}$ | $R^{D34}$ | $R^{D1}$ |
| $L_{B313}$ | $R^{D13}$ | $R^{D9}$ | H | $L_{B733}$ | $R^{D2}$ | $R^{D21}$ | $R^{D1}$ | $L_{B1153}$ | $R^{D41}$ | $R^{D42}$ | $R^{D1}$ |
| $L_{B314}$ | $R^{D13}$ | $R^{D10}$ | H | $L_{B734}$ | $R^{D2}$ | $R^{D22}$ | $R^{D1}$ | $L_{B1154}$ | $R^{D41}$ | $R^{D64}$ | $R^{D1}$ |
| $L_{B315}$ | $R^{D13}$ | $R^{D12}$ | H | $L_{B735}$ | $R^{D2}$ | $R^{D23}$ | $R^{D1}$ | $L_{B1155}$ | $R^{D41}$ | $R^{D66}$ | $R^{D1}$ |
| $L_{B316}$ | $R^{D13}$ | $R^{D14}$ | H | $L_{B736}$ | $R^{D2}$ | $R^{D24}$ | $R^{D1}$ | $L_{B1156}$ | $R^{D41}$ | $R^{D68}$ | $R^{D1}$ |
| $L_{B317}$ | $R^{D13}$ | $R^{D15}$ | H | $L_{B737}$ | $R^{D2}$ | $R^{D25}$ | $R^{D1}$ | $L_{B1157}$ | $R^{D41}$ | $R^{D76}$ | $R^{D1}$ |
| $L_{B318}$ | $R^{D13}$ | $R^{D16}$ | H | $L_{B738}$ | $R^{D2}$ | $R^{D26}$ | $R^{D1}$ | $L_{B1158}$ | $R^{D64}$ | $R^{D5}$ | $R^{D1}$ |
| $L_{B319}$ | $R^{D13}$ | $R^{D17}$ | H | $L_{B739}$ | $R^{D2}$ | $R^{D27}$ | $R^{D1}$ | $L_{B1159}$ | $R^{D64}$ | $R^{D6}$ | $R^{D1}$ |
| $L_{B320}$ | $R^{D13}$ | $R^{D18}$ | H | $L_{B740}$ | $R^{D2}$ | $R^{D28}$ | $R^{D1}$ | $L_{B1160}$ | $R^{D64}$ | $R^{D9}$ | $R^{D1}$ |
| $L_{B321}$ | $R^{D13}$ | $R^{D19}$ | H | $L_{B741}$ | $R^{D2}$ | $R^{D29}$ | $R^{D1}$ | $L_{B1161}$ | $R^{D64}$ | $R^{D10}$ | $R^{D1}$ |
| $L_{B322}$ | $R^{D13}$ | $R^{D20}$ | H | $L_{B742}$ | $R^{D2}$ | $R^{D30}$ | $R^{D1}$ | $L_{B1162}$ | $R^{D64}$ | $R^{D12}$ | $R^{D1}$ |
| $L_{B323}$ | $R^{D13}$ | $R^{D21}$ | H | $L_{B743}$ | $R^{D2}$ | $R^{D31}$ | $R^{D1}$ | $L_{B1163}$ | $R^{D64}$ | $R^{D15}$ | $R^{D1}$ |
| $L_{B324}$ | $R^{D13}$ | $R^{D22}$ | H | $L_{B744}$ | $R^{D2}$ | $R^{D32}$ | $R^{D1}$ | $L_{B1164}$ | $R^{D64}$ | $R^{D16}$ | $R^{D1}$ |
| $L_{B325}$ | $R^{D13}$ | $R^{D23}$ | H | $L_{B745}$ | $R^{D2}$ | $R^{D33}$ | $R^{D1}$ | $L_{B1165}$ | $R^{D64}$ | $R^{D17}$ | $R^{D1}$ |
| $L_{B326}$ | $R^{D13}$ | $R^{D24}$ | H | $L_{B746}$ | $R^{D2}$ | $R^{D34}$ | $R^{D1}$ | $L_{B1166}$ | $R^{D64}$ | $R^{D18}$ | $R^{D1}$ |
| $L_{B327}$ | $R^{D13}$ | $R^{D25}$ | H | $L_{B747}$ | $R^{D2}$ | $R^{D35}$ | $R^{D1}$ | $L_{B1167}$ | $R^{D64}$ | $R^{D19}$ | $R^{D1}$ |
| $L_{B328}$ | $R^{D13}$ | $R^{D26}$ | H | $L_{B748}$ | $R^{D2}$ | $R^{D40}$ | $R^{D1}$ | $L_{B1168}$ | $R^{D64}$ | $R^{D20}$ | $R^{D1}$ |
| $L_{B329}$ | $R^{D13}$ | $R^{D27}$ | H | $L_{B749}$ | $R^{D2}$ | $R^{D41}$ | $R^{D1}$ | $L_{B1169}$ | $R^{D64}$ | $R^{D21}$ | $R^{D1}$ |
| $L_{B330}$ | $R^{D13}$ | $R^{D28}$ | H | $L_{B750}$ | $R^{D2}$ | $R^{D42}$ | $R^{D1}$ | $L_{B1170}$ | $R^{D64}$ | $R^{D23}$ | $R^{D1}$ |
| $L_{B331}$ | $R^{D13}$ | $R^{D29}$ | H | $L_{B751}$ | $R^{D2}$ | $R^{D64}$ | $R^{D1}$ | $L_{B1171}$ | $R^{D64}$ | $R^{D24}$ | $R^{D1}$ |
| $L_{B332}$ | $R^{D13}$ | $R^{D30}$ | H | $L_{B752}$ | $R^{D2}$ | $R^{D66}$ | $R^{D1}$ | $L_{B1172}$ | $R^{D64}$ | $R^{D25}$ | $R^{D1}$ |
| $L_{B333}$ | $R^{D13}$ | $R^{D31}$ | H | $L_{B753}$ | $R^{D2}$ | $R^{D68}$ | $R^{D1}$ | $L_{B1173}$ | $R^{D64}$ | $R^{D27}$ | $R^{D1}$ |
| $L_{B334}$ | $R^{D13}$ | $R^{D32}$ | H | $L_{B754}$ | $R^{D2}$ | $R^{D76}$ | $R^{D1}$ | $L_{B1174}$ | $R^{D64}$ | $R^{D28}$ | $R^{D1}$ |
| $L_{B335}$ | $R^{D13}$ | $R^{D33}$ | H | $L_{B755}$ | $R^{D3}$ | $R^{D4}$ | $R^{D1}$ | $L_{B1175}$ | $R^{D64}$ | $R^{D29}$ | $R^{D1}$ |
| $L_{B336}$ | $R^{D13}$ | $R^{D34}$ | H | $L_{B756}$ | $R^{D3}$ | $R^{D5}$ | $R^{D1}$ | $L_{B1176}$ | $R^{D64}$ | $R^{D30}$ | $R^{D1}$ |
| $L_{B337}$ | $R^{D13}$ | $R^{D35}$ | H | $L_{B757}$ | $R^{D3}$ | $R^{D6}$ | $R^{D1}$ | $L_{B1177}$ | $R^{D64}$ | $R^{D31}$ | $R^{D1}$ |
| $L_{B338}$ | $R^{D13}$ | $R^{D40}$ | H | $L_{B758}$ | $R^{D3}$ | $R^{D7}$ | $R^{D1}$ | $L_{B1178}$ | $R^{D64}$ | $R^{D32}$ | $R^{D1}$ |
| $L_{B339}$ | $R^{D13}$ | $R^{D41}$ | H | $L_{B759}$ | $R^{D3}$ | $R^{D8}$ | $R^{D1}$ | $L_{B1179}$ | $R^{D64}$ | $R^{D33}$ | $R^{D1}$ |
| $L_{B340}$ | $R^{D13}$ | $R^{D42}$ | H | $L_{B760}$ | $R^{D3}$ | $R^{D9}$ | $R^{D1}$ | $L_{B1180}$ | $R^{D64}$ | $R^{D34}$ | $R^{D1}$ |
| $L_{B341}$ | $R^{D13}$ | $R^{D64}$ | H | $L_{B761}$ | $R^{D3}$ | $R^{D10}$ | $R^{D1}$ | $L_{B1181}$ | $R^{D64}$ | $R^{D42}$ | $R^{D1}$ |
| $L_{B342}$ | $R^{D13}$ | $R^{D66}$ | H | $L_{B762}$ | $R^{D3}$ | $R^{D11}$ | $R^{D1}$ | $L_{B1182}$ | $R^{D64}$ | $R^{D64}$ | $R^{D1}$ |
| $L_{B343}$ | $R^{D13}$ | $R^{D68}$ | H | $L_{B763}$ | $R^{D3}$ | $R^{D12}$ | $R^{D1}$ | $L_{B1183}$ | $R^{D64}$ | $R^{D66}$ | $R^{D1}$ |
| $L_{B344}$ | $R^{D13}$ | $R^{D76}$ | H | $L_{B764}$ | $R^{D3}$ | $R^{D13}$ | $R^{D1}$ | $L_{B1184}$ | $R^{D64}$ | $R^{D68}$ | $R^{D1}$ |
| $L_{B345}$ | $R^{D14}$ | $R^{D5}$ | H | $L_{B765}$ | $R^{D3}$ | $R^{D14}$ | $R^{D1}$ | $L_{B1185}$ | $R^{D64}$ | $R^{D76}$ | $R^{D1}$ |
| $L_{B346}$ | $R^{D14}$ | $R^{D6}$ | H | $L_{B766}$ | $R^{D3}$ | $R^{D15}$ | $R^{D1}$ | $L_{B1186}$ | $R^{D66}$ | $R^{D5}$ | $R^{D1}$ |
| $L_{B347}$ | $R^{D14}$ | $R^{D9}$ | H | $L_{B767}$ | $R^{D3}$ | $R^{D16}$ | $R^{D1}$ | $L_{B1187}$ | $R^{D66}$ | $R^{D6}$ | $R^{D1}$ |
| $L_{B348}$ | $R^{D14}$ | $R^{D10}$ | H | $L_{B768}$ | $R^{D3}$ | $R^{D17}$ | $R^{D1}$ | $L_{B1188}$ | $R^{D66}$ | $R^{D9}$ | $R^{D1}$ |
| $L_{B349}$ | $R^{D14}$ | $R^{D12}$ | H | $L_{B769}$ | $R^{D3}$ | $R^{D18}$ | $R^{D1}$ | $L_{B1189}$ | $R^{D66}$ | $R^{D10}$ | $R^{D1}$ |
| $L_{B350}$ | $R^{D14}$ | $R^{D15}$ | H | $L_{B770}$ | $R^{D3}$ | $R^{D19}$ | $R^{D1}$ | $L_{B1190}$ | $R^{D66}$ | $R^{D12}$ | $R^{D1}$ |
| $L_{B351}$ | $R^{D14}$ | $R^{D16}$ | H | $L_{B771}$ | $R^{D3}$ | $R^{D20}$ | $R^{D1}$ | $L_{B1191}$ | $R^{D66}$ | $R^{D15}$ | $R^{D1}$ |
| $L_{B352}$ | $R^{D14}$ | $R^{D17}$ | H | $L_{B772}$ | $R^{D3}$ | $R^{D21}$ | $R^{D1}$ | $L_{B1192}$ | $R^{D66}$ | $R^{D16}$ | $R^{D1}$ |
| $L_{B353}$ | $R^{D14}$ | $R^{D18}$ | H | $L_{B773}$ | $R^{D3}$ | $R^{D22}$ | $R^{D1}$ | $L_{B1193}$ | $R^{D66}$ | $R^{D17}$ | $R^{D1}$ |
| $L_{B354}$ | $R^{D14}$ | $R^{D19}$ | H | $L_{B774}$ | $R^{D3}$ | $R^{D23}$ | $R^{D1}$ | $L_{B1194}$ | $R^{D66}$ | $R^{D18}$ | $R^{D1}$ |
| $L_{B355}$ | $R^{D14}$ | $R^{D20}$ | H | $L_{B775}$ | $R^{D3}$ | $R^{D24}$ | $R^{D1}$ | $L_{B1195}$ | $R^{D66}$ | $R^{D19}$ | $R^{D1}$ |
| $L_{B356}$ | $R^{D14}$ | $R^{D21}$ | H | $L_{B776}$ | $R^{D3}$ | $R^{D25}$ | $R^{D1}$ | $L_{B1196}$ | $R^{D66}$ | $R^{D20}$ | $R^{D1}$ |
| $L_{B357}$ | $R^{D14}$ | $R^{D22}$ | H | $L_{B777}$ | $R^{D3}$ | $R^{D26}$ | $R^{D1}$ | $L_{B1197}$ | $R^{D66}$ | $R^{D21}$ | $R^{D1}$ |
| $L_{B358}$ | $R^{D14}$ | $R^{D23}$ | H | $L_{B778}$ | $R^{D3}$ | $R^{D27}$ | $R^{D1}$ | $L_{B1198}$ | $R^{D66}$ | $R^{D23}$ | $R^{D1}$ |
| $L_{B359}$ | $R^{D14}$ | $R^{D24}$ | H | $L_{B779}$ | $R^{D3}$ | $R^{D28}$ | $R^{D1}$ | $L_{B1199}$ | $R^{D66}$ | $R^{D24}$ | $R^{D1}$ |
| $L_{B360}$ | $R^{D14}$ | $R^{D25}$ | H | $L_{B780}$ | $R^{D3}$ | $R^{D29}$ | $R^{D1}$ | $L_{B1200}$ | $R^{D66}$ | $R^{D25}$ | $R^{D1}$ |
| $L_{B361}$ | $R^{D14}$ | $R^{D26}$ | H | $L_{B781}$ | $R^{D3}$ | $R^{D30}$ | $R^{D1}$ | $L_{B1201}$ | $R^{D66}$ | $R^{D27}$ | $R^{D1}$ |
| $L_{B362}$ | $R^{D14}$ | $R^{D27}$ | H | $L_{B782}$ | $R^{D3}$ | $R^{D31}$ | $R^{D1}$ | $L_{B1202}$ | $R^{D66}$ | $R^{D28}$ | $R^{D1}$ |
| $L_{B363}$ | $R^{D14}$ | $R^{D28}$ | H | $L_{B783}$ | $R^{D3}$ | $R^{D32}$ | $R^{D1}$ | $L_{B1203}$ | $R^{D66}$ | $R^{D29}$ | $R^{D1}$ |
| $L_{B364}$ | $R^{D14}$ | $R^{D29}$ | H | $L_{B784}$ | $R^{D3}$ | $R^{D33}$ | $R^{D1}$ | $L_{B1204}$ | $R^{D66}$ | $R^{D30}$ | $R^{D1}$ |
| $L_{B365}$ | $R^{D14}$ | $R^{D30}$ | H | $L_{B785}$ | $R^{D3}$ | $R^{D34}$ | $R^{D1}$ | $L_{B1205}$ | $R^{D66}$ | $R^{D31}$ | $R^{D1}$ |
| $L_{B366}$ | $R^{D14}$ | $R^{D31}$ | H | $L_{B786}$ | $R^{D3}$ | $R^{D35}$ | $R^{D1}$ | $L_{B1206}$ | $R^{D66}$ | $R^{D32}$ | $R^{D1}$ |
| $L_{B367}$ | $R^{D14}$ | $R^{D32}$ | H | $L_{B787}$ | $R^{D3}$ | $R^{D40}$ | $R^{D1}$ | $L_{B1207}$ | $R^{D66}$ | $R^{D33}$ | $R^{D1}$ |
| $L_{B368}$ | $R^{D14}$ | $R^{D33}$ | H | $L_{B788}$ | $R^{D3}$ | $R^{D41}$ | $R^{D1}$ | $L_{B1208}$ | $R^{D66}$ | $R^{D34}$ | $R^{D1}$ |
| $L_{B369}$ | $R^{D14}$ | $R^{D34}$ | H | $L_{B789}$ | $R^{D3}$ | $R^{D42}$ | $R^{D1}$ | $L_{B1209}$ | $R^{D66}$ | $R^{D42}$ | $R^{D1}$ |

-continued

| $L_{Bj}$ | $R^1$ | $R^2$ | $R^3$ | $L_{Bj}$ | $R^1$ | $R^2$ | $R^3$ | $L_{Bj}$ | $R^1$ | $R^2$ | $R^3$ |
|---|---|---|---|---|---|---|---|---|---|---|---|
| $L_{B370}$ | $R^{D14}$ | $R^{D35}$ | H | $L_{B790}$ | $R^{D3}$ | $R^{D64}$ | $R^{D1}$ | $L_{B1210}$ | $R^{D66}$ | $R^{D68}$ | $R^{D1}$ |
| $L_{B371}$ | $R^{D14}$ | $R^{D40}$ | H | $L_{B791}$ | $R^{D3}$ | $R^{D66}$ | $R^{D1}$ | $L_{B1211}$ | $R^{D66}$ | $R^{D76}$ | $R^{D1}$ |
| $L_{B372}$ | $R^{D14}$ | $R^{D41}$ | H | $L_{B792}$ | $R^{D3}$ | $R^{D68}$ | $R^{D1}$ | $L_{B1212}$ | $R^{D68}$ | $R^{D5}$ | $R^{D1}$ |
| $L_{B373}$ | $R^{D14}$ | $R^{D42}$ | H | $L_{B793}$ | $R^{D3}$ | $R^{D76}$ | $R^{D1}$ | $L_{B1213}$ | $R^{D68}$ | $R^{D6}$ | $R^{D1}$ |
| $L_{B374}$ | $R^{D14}$ | $R^{D64}$ | H | $L_{B794}$ | $R^{D4}$ | $R^{D5}$ | $R^{D1}$ | $L_{B1214}$ | $R^{D68}$ | $R^{D9}$ | $R^{D1}$ |
| $L_{B375}$ | $R^{D14}$ | $R^{D66}$ | H | $L_{B795}$ | $R^{D4}$ | $R^{D6}$ | $R^{D1}$ | $L_{B1215}$ | $R^{D68}$ | $R^{D10}$ | $R^{D1}$ |
| $L_{B376}$ | $R^{D14}$ | $R^{D68}$ | H | $L_{B796}$ | $R^{D4}$ | $R^{D7}$ | $R^{D1}$ | $L_{B1216}$ | $R^{D68}$ | $R^{D12}$ | $R^{D1}$ |
| $L_{B377}$ | $R^{D14}$ | $R^{D76}$ | H | $L_{B797}$ | $R^{D4}$ | $R^{D8}$ | $R^{D1}$ | $L_{B1217}$ | $R^{D68}$ | $R^{D15}$ | $R^{D1}$ |
| $L_{B378}$ | $R^{D22}$ | $R^{D5}$ | H | $L_{B798}$ | $R^{D4}$ | $R^{D9}$ | $R^{D1}$ | $L_{B1218}$ | $R^{D68}$ | $R^{D16}$ | $R^{D1}$ |
| $L_{B379}$ | $R^{D22}$ | $R^{D6}$ | H | $L_{B799}$ | $R^{D4}$ | $R^{D10}$ | $R^{D1}$ | $L_{B1219}$ | $R^{D68}$ | $R^{D17}$ | $R^{D1}$ |
| $L_{B380}$ | $R^{D22}$ | $R^{D9}$ | H | $L_{B800}$ | $R^{D4}$ | $R^{D11}$ | $R^{D1}$ | $L_{B1220}$ | $R^{D68}$ | $R^{D18}$ | $R^{D1}$ |
| $L_{B381}$ | $R^{D22}$ | $R^{D10}$ | H | $L_{B801}$ | $R^{D4}$ | $R^{D12}$ | $R^{D1}$ | $L_{B1221}$ | $R^{D68}$ | $R^{D19}$ | $R^{D1}$ |
| $L_{B382}$ | $R^{D22}$ | $R^{D12}$ | H | $L_{B802}$ | $R^{D4}$ | $R^{D13}$ | $R^{D1}$ | $L_{B1222}$ | $R^{D68}$ | $R^{D20}$ | $R^{D1}$ |
| $L_{B383}$ | $R^{D22}$ | $R^{D15}$ | H | $L_{B803}$ | $R^{D4}$ | $R^{D14}$ | $R^{D1}$ | $L_{B1223}$ | $R^{D68}$ | $R^{D21}$ | $R^{D1}$ |
| $L_{B384}$ | $R^{D22}$ | $R^{D16}$ | H | $L_{B804}$ | $R^{D4}$ | $R^{D15}$ | $R^{D1}$ | $L_{B1224}$ | $R^{D68}$ | $R^{D23}$ | $R^{D1}$ |
| $L_{B385}$ | $R^{D22}$ | $R^{D17}$ | H | $L_{B805}$ | $R^{D4}$ | $R^{D16}$ | $R^{D1}$ | $L_{B1225}$ | $R^{D68}$ | $R^{D24}$ | $R^{D1}$ |
| $L_{B386}$ | $R^{D22}$ | $R^{D18}$ | H | $L_{B806}$ | $R^{D4}$ | $R^{D17}$ | $R^{D1}$ | $L_{B1226}$ | $R^{D68}$ | $R^{D25}$ | $R^{D1}$ |
| $L_{B387}$ | $R^{D22}$ | $R^{D19}$ | H | $L_{B807}$ | $R^{D4}$ | $R^{D18}$ | $R^{D1}$ | $L_{B1227}$ | $R^{D68}$ | $R^{D27}$ | $R^{D1}$ |
| $L_{B388}$ | $R^{D22}$ | $R^{D20}$ | H | $L_{B808}$ | $R^{D4}$ | $R^{D19}$ | $R^{D1}$ | $L_{B1228}$ | $R^{D68}$ | $R^{D28}$ | $R^{D1}$ |
| $L_{B389}$ | $R^{D22}$ | $R^{D21}$ | H | $L_{B809}$ | $R^{D4}$ | $R^{D20}$ | $R^{D1}$ | $L_{B1229}$ | $R^{D68}$ | $R^{D29}$ | $R^{D1}$ |
| $L_{B390}$ | $R^{D22}$ | $R^{D23}$ | H | $L_{B810}$ | $R^{D4}$ | $R^{D21}$ | $R^{D1}$ | $L_{B1230}$ | $R^{D68}$ | $R^{D30}$ | $R^{D1}$ |
| $L_{B391}$ | $R^{D22}$ | $R^{D24}$ | H | $L_{B811}$ | $R^{D4}$ | $R^{D22}$ | $R^{D1}$ | $L_{B1231}$ | $R^{D68}$ | $R^{D31}$ | $R^{D1}$ |
| $L_{B392}$ | $R^{D22}$ | $R^{D25}$ | H | $L_{B812}$ | $R^{D4}$ | $R^{D23}$ | $R^{D1}$ | $L_{B1232}$ | $R^{D68}$ | $R^{D32}$ | $R^{D1}$ |
| $L_{B393}$ | $R^{D22}$ | $R^{D26}$ | H | $L_{B813}$ | $R^{D4}$ | $R^{D24}$ | $R^{D1}$ | $L_{B1233}$ | $R^{D68}$ | $R^{D33}$ | $R^{D1}$ |
| $L_{B394}$ | $R^{D22}$ | $R^{D27}$ | H | $L_{B814}$ | $R^{D4}$ | $R^{D25}$ | $R^{D1}$ | $L_{B1234}$ | $R^{D68}$ | $R^{D34}$ | $R^{D1}$ |
| $L_{B395}$ | $R^{D22}$ | $R^{D28}$ | H | $L_{B815}$ | $R^{D4}$ | $R^{D26}$ | $R^{D1}$ | $L_{B1235}$ | $R^{D68}$ | $R^{D42}$ | $R^{D1}$ |
| $L_{B396}$ | $R^{D22}$ | $R^{D29}$ | H | $L_{B816}$ | $R^{D4}$ | $R^{D27}$ | $R^{D1}$ | $L_{B1236}$ | $R^{D68}$ | $R^{D76}$ | $R^{D1}$ |
| $L_{B397}$ | $R^{D22}$ | $R^{D30}$ | H | $L_{B817}$ | $R^{D4}$ | $R^{D28}$ | $R^{D1}$ | $L_{B1237}$ | $R^{D76}$ | $R^{D5}$ | $R^{D1}$ |
| $L_{B398}$ | $R^{D22}$ | $R^{D31}$ | H | $L_{B818}$ | $R^{D4}$ | $R^{D29}$ | $R^{D1}$ | $L_{B1238}$ | $R^{D76}$ | $R^{D6}$ | $R^{D1}$ |
| $L_{B399}$ | $R^{D22}$ | $R^{D32}$ | H | $L_{B819}$ | $R^{D4}$ | $R^{D30}$ | $R^{D1}$ | $L_{B1239}$ | $R^{D76}$ | $R^{D9}$ | $R^{D1}$ |
| $L_{B400}$ | $R^{D22}$ | $R^{D33}$ | H | $L_{B820}$ | $R^{D4}$ | $R^{D31}$ | $R^{D1}$ | $L_{B1240}$ | $R^{D76}$ | $R^{D10}$ | $R^{D1}$ |
| $L_{B401}$ | $R^{D22}$ | $R^{D34}$ | H | $L_{B821}$ | $R^{D4}$ | $R^{D32}$ | $R^{D1}$ | $L_{B1241}$ | $R^{D76}$ | $R^{D12}$ | $R^{D1}$ |
| $L_{B402}$ | $R^{D22}$ | $R^{D35}$ | H | $L_{B822}$ | $R^{D4}$ | $R^{D33}$ | $R^{D1}$ | $L_{B1242}$ | $R^{D76}$ | $R^{D15}$ | $R^{D1}$ |
| $L_{B403}$ | $R^{D22}$ | $R^{D40}$ | H | $L_{B823}$ | $R^{D4}$ | $R^{D34}$ | $R^{D1}$ | $L_{B1243}$ | $R^{D76}$ | $R^{D16}$ | $R^{D1}$ |
| $L_{B404}$ | $R^{D22}$ | $R^{D41}$ | H | $L_{B824}$ | $R^{D4}$ | $R^{D35}$ | $R^{D1}$ | $L_{B1244}$ | $R^{D76}$ | $R^{D17}$ | $R^{D1}$ |
| $L_{B405}$ | $R^{D22}$ | $R^{D42}$ | H | $L_{B825}$ | $R^{D4}$ | $R^{D40}$ | $R^{D1}$ | $L_{B1245}$ | $R^{D76}$ | $R^{D18}$ | $R^{D1}$ |
| $L_{B406}$ | $R^{D22}$ | $R^{D64}$ | H | $L_{B826}$ | $R^{D4}$ | $R^{D41}$ | $R^{D1}$ | $L_{B1246}$ | $R^{D76}$ | $R^{D19}$ | $R^{D1}$ |
| $L_{B407}$ | $R^{D22}$ | $R^{D66}$ | H | $L_{B827}$ | $R^{D4}$ | $R^{D42}$ | $R^{D1}$ | $L_{B1247}$ | $R^{D76}$ | $R^{D20}$ | $R^{D1}$ |
| $L_{B408}$ | $R^{D22}$ | $R^{D68}$ | H | $L_{B828}$ | $R^{D4}$ | $R^{D64}$ | $R^{D1}$ | $L_{B1248}$ | $R^{D76}$ | $R^{D21}$ | $R^{D1}$ |
| $L_{B409}$ | $R^{D22}$ | $R^{D76}$ | H | $L_{B829}$ | $R^{D4}$ | $R^{D66}$ | $R^{D1}$ | $L_{B1249}$ | $R^{D76}$ | $R^{D23}$ | $R^{D1}$ |
| $L_{B410}$ | $R^{D26}$ | $R^{D5}$ | H | $L_{B830}$ | $R^{D4}$ | $R^{D68}$ | $R^{D1}$ | $L_{B1250}$ | $R^{D76}$ | $R^{D24}$ | $R^{D1}$ |
| $L_{B411}$ | $R^{D26}$ | $R^{D6}$ | H | $L_{B831}$ | $R^{D4}$ | $R^{D76}$ | $R^{D1}$ | $L_{B1251}$ | $R^{D76}$ | $R^{D25}$ | $R^{D1}$ |
| $L_{B412}$ | $R^{D26}$ | $R^{D9}$ | H | $L_{B832}$ | $R^{D4}$ | $R^{D1}$ | $R^{D1}$ | $L_{B1252}$ | $R^{D76}$ | $R^{D27}$ | $R^{D1}$ |
| $L_{B413}$ | $R^{D26}$ | $R^{D10}$ | H | $L_{B833}$ | $R^{D7}$ | $R^{D5}$ | $R^{D1}$ | $L_{B1253}$ | $R^{D76}$ | $R^{D28}$ | $R^{D1}$ |
| $L_{B414}$ | $R^{D26}$ | $R^{D12}$ | H | $L_{B834}$ | $R^{D7}$ | $R^{D6}$ | $R^{D1}$ | $L_{B1254}$ | $R^{D76}$ | $R^{D29}$ | $R^{D1}$ |
| $L_{B415}$ | $R^{D26}$ | $R^{D15}$ | H | $L_{B835}$ | $R^{D7}$ | $R^{D8}$ | $R^{D1}$ | $L_{B1255}$ | $R^{D76}$ | $R^{D30}$ | $R^{D1}$ |
| $L_{B416}$ | $R^{D26}$ | $R^{D16}$ | H | $L_{B836}$ | $R^{D7}$ | $R^{D9}$ | $R^{D1}$ | $L_{B1256}$ | $R^{D76}$ | $R^{D31}$ | $R^{D1}$ |
| $L_{B417}$ | $R^{D26}$ | $R^{D17}$ | H | $L_{B837}$ | $R^{D7}$ | $R^{D10}$ | $R^{D1}$ | $L_{B1257}$ | $R^{D76}$ | $R^{D32}$ | $R^{D1}$ |
| $L_{B418}$ | $R^{D26}$ | $R^{D18}$ | H | $L_{B838}$ | $R^{D7}$ | $R^{D11}$ | $R^{D1}$ | $L_{B1258}$ | $R^{D76}$ | $R^{D33}$ | $R^{D1}$ |
| $L_{B419}$ | $R^{D26}$ | $R^{D19}$ | H | $L_{B839}$ | $R^{D7}$ | $R^{D12}$ | $R^{D1}$ | $L_{B1259}$ | $R^{D76}$ | $R^{D34}$ | $R^{D1}$ |
| $L_{B420}$ | $R^{D26}$ | $R^{D20}$ | H | $L_{B840}$ | $R^{D7}$ | $R^{D13}$ | $R^{D1}$ | $L_{B1260}$ | $R^{D76}$ | $R^{D42}$ | $R^{D1}$ |

wherein $R^{D1}$ to $R^{D81}$ has the following structures:

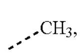

$R^{D1}$

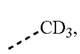

$R^{D2}$

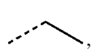

$R^{D3}$

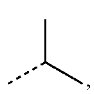

$R^{D4}$

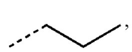

$R^{D5}$

-continued

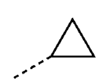

$R^{D6}$

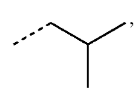

$R^{D7}$

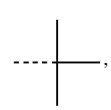

$R^{D8}$

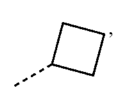

$R^{D9}$

-continued
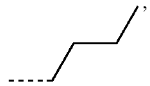
$R^{D10}$
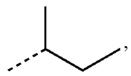
$R^{D11}$
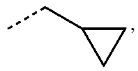
$R^{D12}$
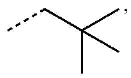
$R^{D13}$
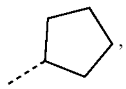
$R^{D14}$
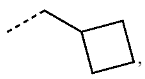
$R^{D15}$
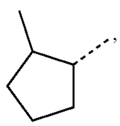
$R^{D16}$
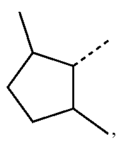
$R^{D17}$
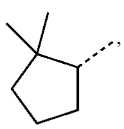
$R^{D18}$
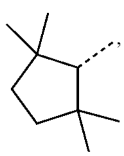
$R^{D19}$
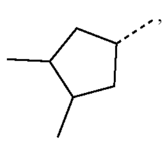
$R^{D20}$
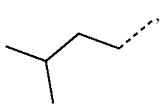
$R^{D21}$
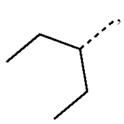
$R^{D22}$
-continued
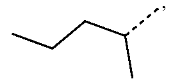
$R^{D23}$
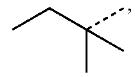
$R^{D24}$
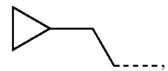
$R^{D25}$
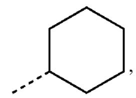
$R^{D26}$
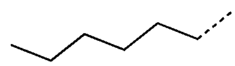
$R^{D27}$
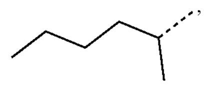
$R^{D28}$
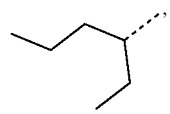
$R^{D29}$
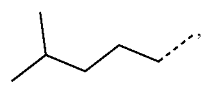
$R^{D30}$
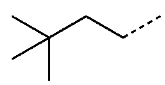
$R^{D31}$
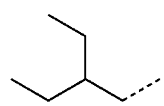
$R^{D32}$
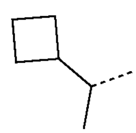
$R^{D33}$
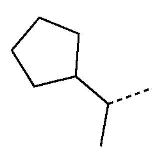
$R^{D34}$
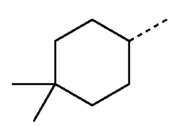
$R^{D35}$ -continued
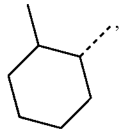
$R^{D36}$
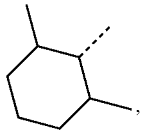
$R^{D37}$
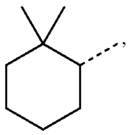
$R^{D38}$
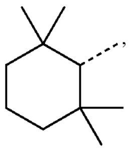
$R^{D39}$
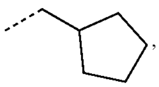
$R^{D40}$
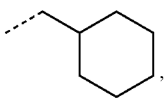
$R^{D41}$
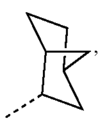
$R^{D42}$
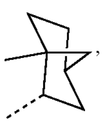
$R^{D43}$
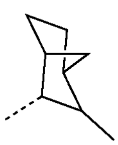
$R^{D44}$
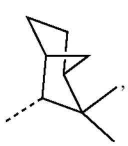
$R^{D45}$
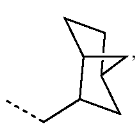
$R^{D46}$
-continued
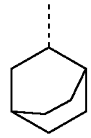
$R^{D47}$
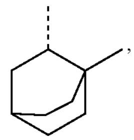
$R^{D48}$
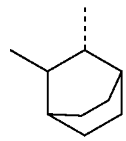
$R^{D49}$
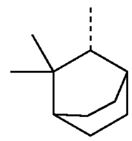
$R^{D50}$
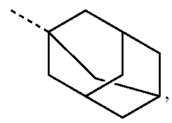
$R^{D51}$
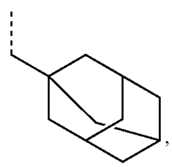
$R^{D52}$
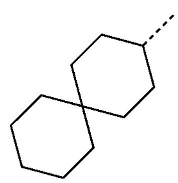
$R^{D53}$
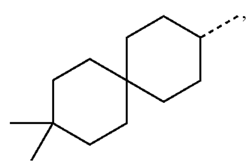
$R^{D54}$
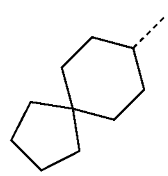
$R^{D55}$
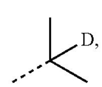
$R^{D56}$ -continued $R^{D57}$

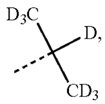

$R^{D58}$

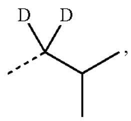

$R^{D59}$

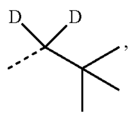

$R^{D60}$

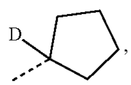

$R^{D61}$

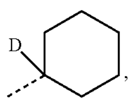

$R^{D62}$

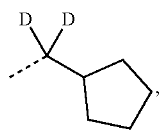

$R^{D63}$

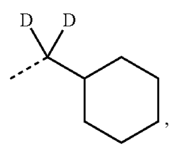

$R^{D64}$

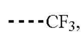

$R^{D65}$

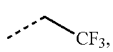

$R^{D66}$

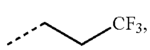

$R^{D67}$

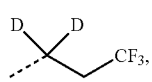

$R^{D68}$

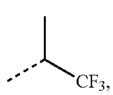

$R^{D69}$

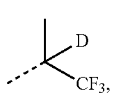

$R^{D70}$

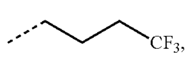

$R^{D71}$

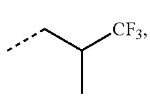

$R^{D72}$

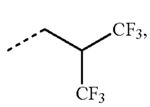

-continued $R^{D73}$

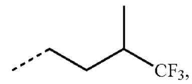

$R^{D74}$

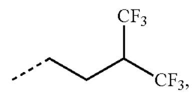

$R^{D75}$

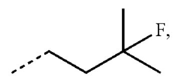

$R^{D76}$

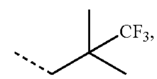

$R^{D77}$

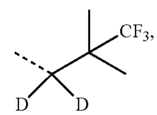

$R^{D78}$

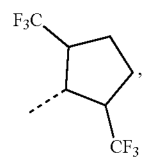

$R^{D79}$

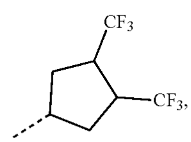

$R^{D80}$

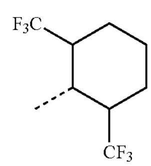

and $R^{D81}$

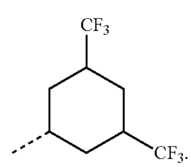

In some embodiments, the compound is Compound Z-x having the formula Ir(Z-$L_{Ai}$)$_2$($L_{Bj}$), wherein Z is Roman numerals from I to LXI;

where x=1260i+j−1260, j is an integer from 1 to 1260; where for Z is 1 to XII, i is an integer from 1 to 618; where for Z is XIII to XVII, i is an integer from 619 to 1170; where for Z is XVIII to XLIV, and LXII to LXV, i is an integer from 1171 to 1584; where for Z is XLV to LI, i is an integer from 1585 to 1970; where for Z is LII to LVI, i is an integer from 1971 to 2186; where for Z is LVII to LXI, i is an integer from 2187 to 2402; where each corresponding $L_{Ai}$ and $L_{Bj}$ are defined above.

The OLEDs and the Devices of the Present Disclosure

In another aspect, the present disclosure also provides an OLED comprising a first organic layer that contains a compound as disclosed in the above compounds section of the present disclosure. In some embodiments, the OLED comprises: an anode; a cathode; and an organic layer disposed between the anode and the cathode, wherein the organic layer comprises a compound comprising a ligand $L_A$ of Formula I, Formula IA defined above, Formula II, Formula III, or Formula IV:

Formula I

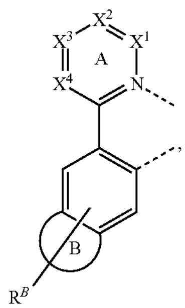

Formula II

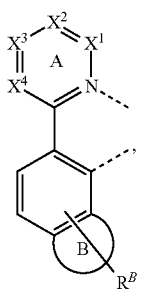

Formula III

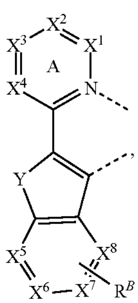

or

Formula IV

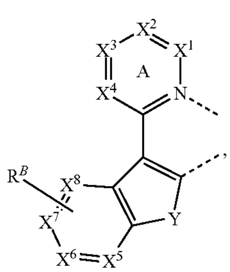

wherein: ring B is independently a 5-membered or 6-membered carbocyclic or heterocyclic ring; $X^1$ to $X^4$ are each independently selected from the group consisting of C, N, and CR; at least one pair of adjacent $X^1$ to $X^4$ are each C and fused to a structure of Formula V

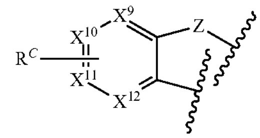

where indicated by "$\sim\sim\sim$"; $X^5$ to $X^{12}$ are each independently C or N; the maximum number of N within a ring is two; Z and Y are each independently selected from the group consisting of O, S, Se, NR', CR'R", SiR'R", and GeR'R"; $R^B$ and $R^C$ each independently represents zero, mono, or up to a maximum allowed substitutions to its associated ring; each of $R^B$, $R^C$, R, R', and R" is independently a hydrogen or a substituent selected from the group consisting of the general substituents defined herein; and two substituents can be joined or fused to form a ring; the ligand $L_A$ is complexed to a metal M through the two indicated dash lines of each Formula; and the ligand $L_A$ can be joined with other ligands to form a tridentate, tetradentate, pentadentate, or hexadentate ligand.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, published on Mar. 14, 2019 as U.S. patent application publication No. 2019/0081248, which is hereby incorporated by reference in its entirety), triplet-triplet annihilation, or combinations of these processes. In some embodiments, the emissive dopant can be a racemic mixture, or can be enriched in one enantiomer. In some embodiments, the compound can be homoleptic (each ligand is the same). In some embodiments, the compound can be heteroleptic (at least one ligand is different from others).

When there are more than one ligand coordinated to a metal, the ligands can all be the same in some embodiments. In some other embodiments, at least one ligand is different from the other ligand(s). In some embodiments, every ligand can be different from each other. This is also true in embodiments where a ligand being coordinated to a metal can be linked with other ligands being coordinated to that metal to form a tridentate, tetradentate, pentadentate, or hexadentate ligands Thus, where the coordinating ligands are being linked together, all of the ligands can be the same in some embodiments, and at least one of the ligands being linked can be different from the other ligand(s) in some other embodiments.

In some embodiments, the compound can be used as a phosphorescent sensitizer in an OLED where one or multiple layers in the OLED contains an acceptor in the form of one or more fluorescent and/or delayed fluorescence emitters. In some embodiments, the compound can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 100%. The acceptor could be in either the same layer as the phosphorescent sensitizer or in one or more different layers. In some embodiments, the acceptor is a TADF emitter. In some embodiments, the acceptor is a fluorescent emitter. In some embodiments, the emission can arise from any or all of the sensitizer, acceptor, and final emitter In some embodiments, the compound of the present disclosure is neutrally charged.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1{-}Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound, for example, a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the Host Group consisting of:

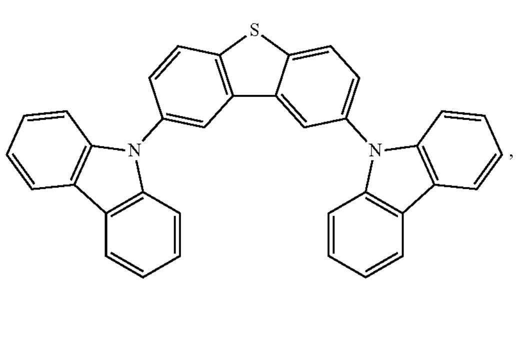

-continued

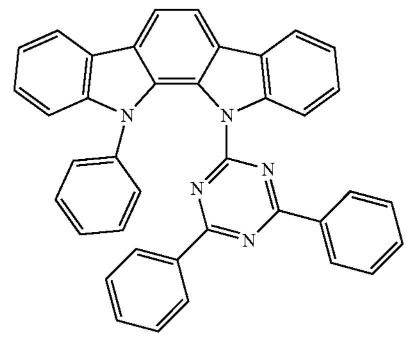

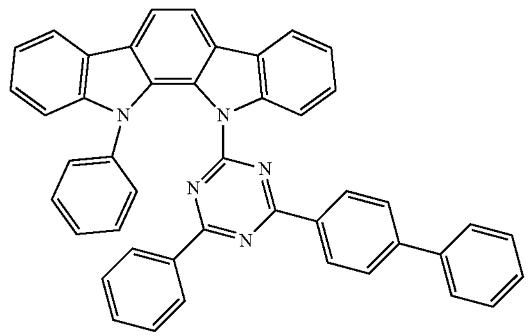

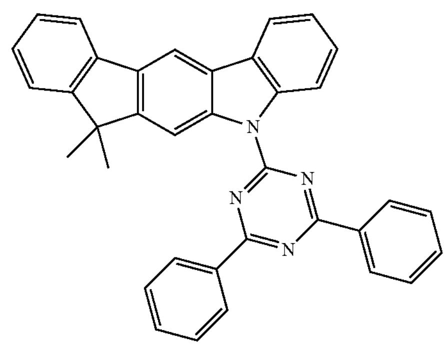

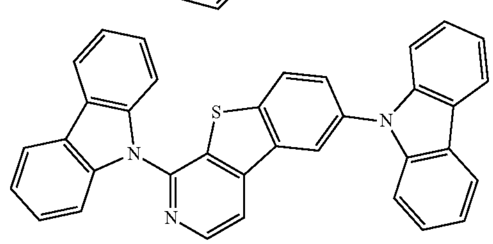

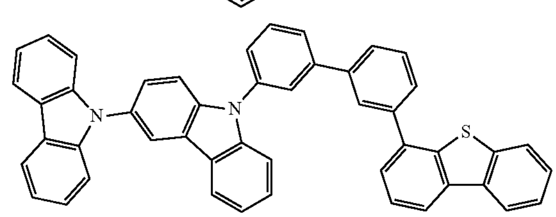

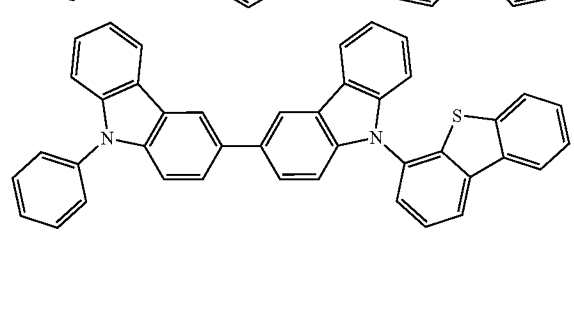

-continued
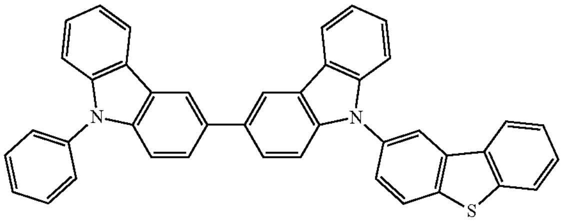
,
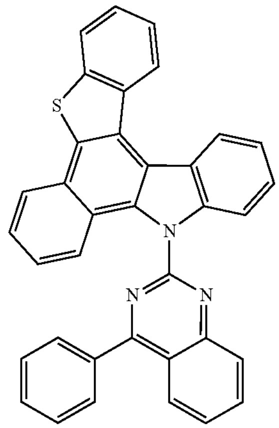
,
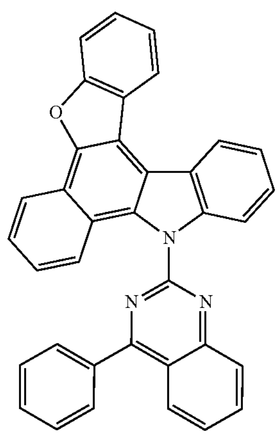
,
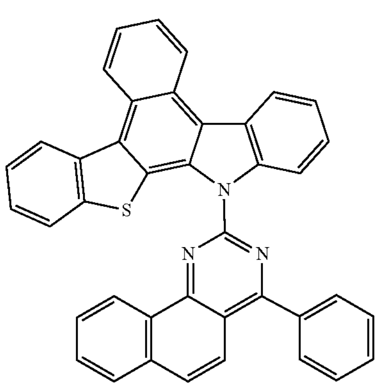
,
-continued
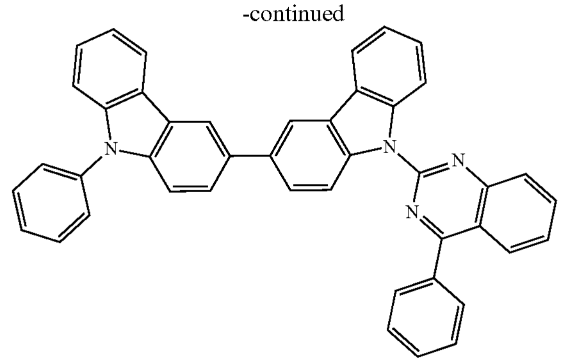
,
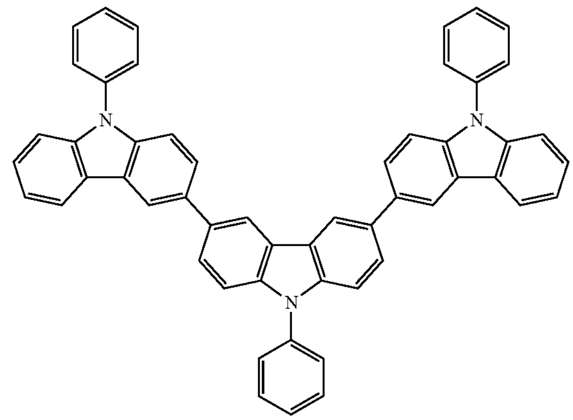
,
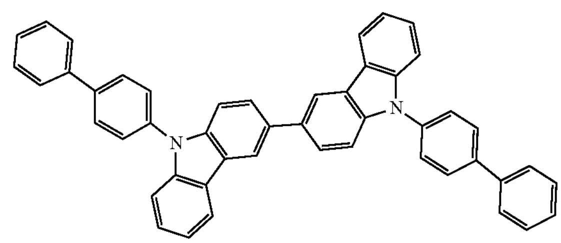
,
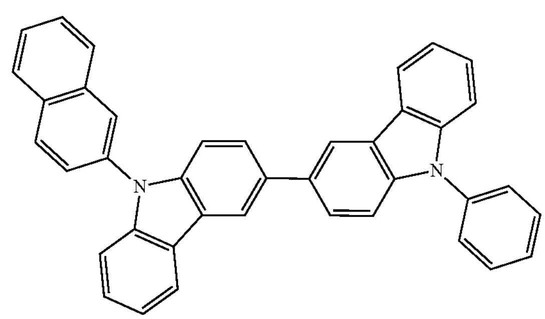
,
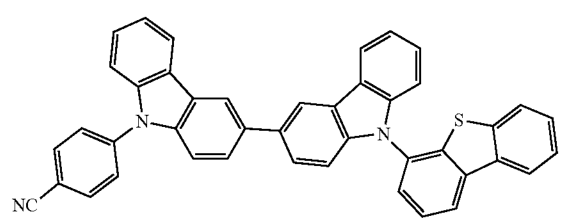
, -continued
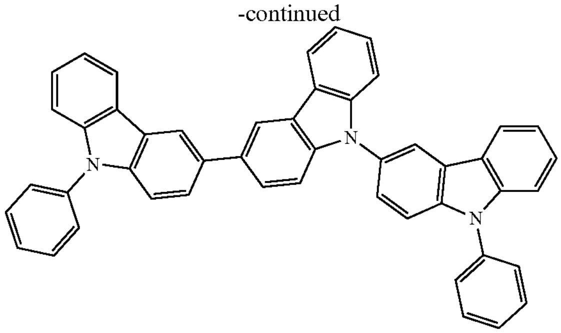
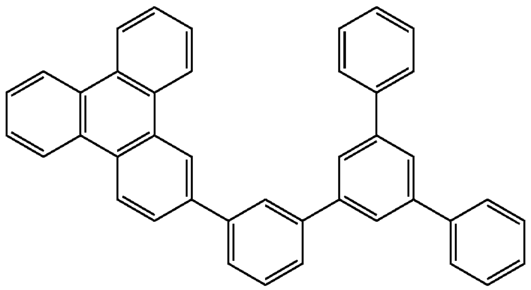
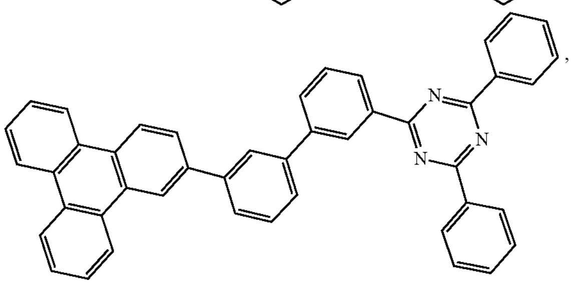
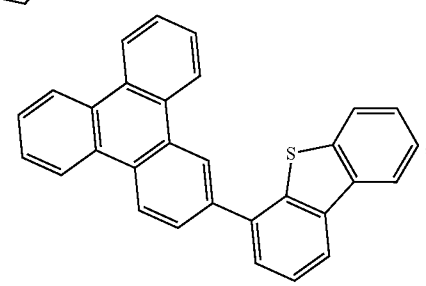
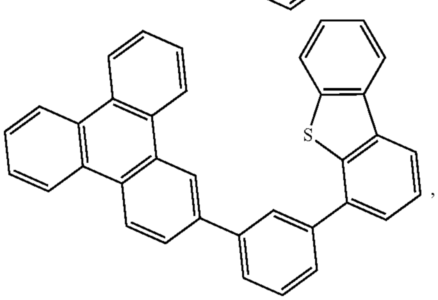
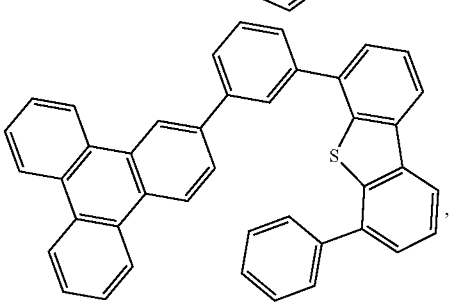
-continued
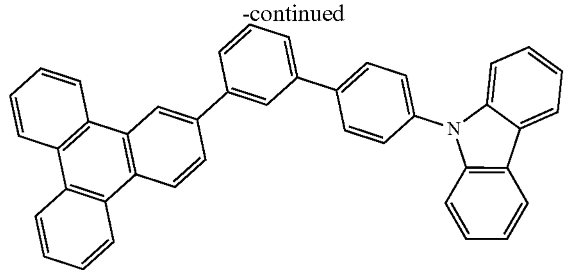
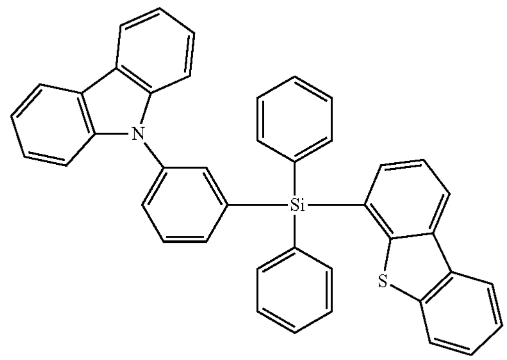
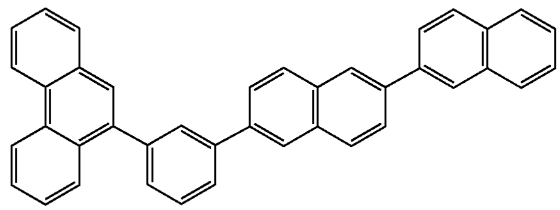
and combinations thereof.
Additional information on possible hosts is provided below.
In some embodiments, the emissive region may comprise a compound comprising a ligand $L_A$ of Formula I, Formula IA defined above, Formula II, Formula III, or Formula IV:
Formula I
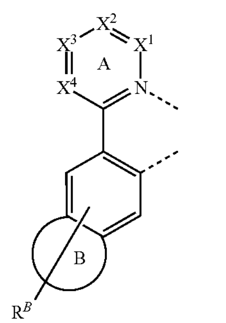
Formula II
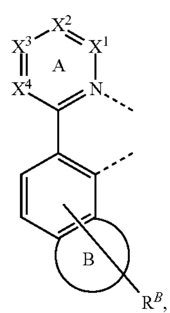

-continued

Formula III

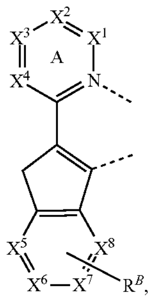

or

Formula IV

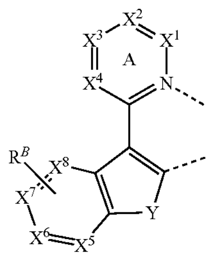

wherein:

ring B is independently a 5-membered or 6-membered carbocyclic or heterocyclic ring; $X^1$ to $X^4$ are each independently selected from the group consisting of C, N, and CR; at least one pair of adjacent $X^1$ to $X^4$ are each C and fused to a structure of Formula V

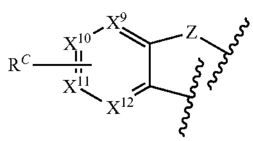

where indicated by "∿∿∿"; $X^5$ to $X^{12}$ are each independently C or N; the maximum number of N within a ring is two; Z and Y are each independently selected from the group consisting of O, S, Se, NR', CR'R", SiR'R", and GeR'R"; $R^B$ and $R^C$ each independently represents zero, mono, or up to a maximum allowed substitutions to its associated ring; each of $R^B$, $R^C$, R, R', and R" is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; and two substituents can be joined or fused to form a ring; the ligand $L_A$ is complexed to a metal M through the two indicated dash lines of each Formula; and the ligand $L_A$ can be joined with other ligands to form a tridentate, tetradentate, pentadentate, or hexadentate ligand.

In some embodiments of the emissive region, the compound can be an emissive dopant or a non-emissive dopant.

In some embodiments of the emissive region, the emissive region further comprises a host, wherein host contains at least one chemical group selected from the group consisting of metal complex, triphenylene, carbazole, dibenzothiophene, dibenzofuran, dibenzoselenophene, aza-triphenylene, aza-carbazole, aza-dibenzothiophene, aza-dibenzofuran, and aza-dibenzoselenophene.

In some embodiments, the host may be selected from the group consisting of the HOST Group defined herein.

According to another aspect, a consumer product comprising an OLED is disclosed, wherein the OLED comprises: an anode; a cathode; and an organic layer disposed between the anode and the cathode, wherein the organic layer comprises a compound comprising a ligand $L_A$ of Formula I, Formula IA defined above, Formula II, Formula III, or Formula IV:

Formula I

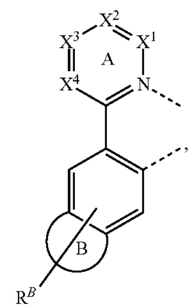

Formula II

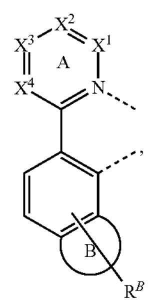

Formula III

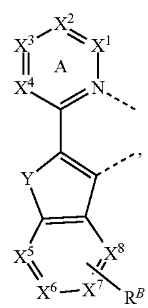

or

Formula IV

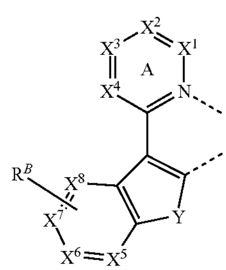

wherein:

ring B is independently a 5-membered or 6-membered carbocyclic or heterocyclic ring; $X^1$ to $X^4$ are each independently selected from the group consisting of C, N, and CR; at least one pair of adjacent $X^1$ to $X^4$ are each C and fused to a structure of Formula V

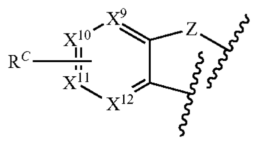

where indicated by "$\sim\sim\sim$"; $X^5$ to $X^{12}$ are each independently C or N; the maximum number of N within a ring is two; Z and Y are each independently selected from the group consisting of O, S, Se, NR', CR'R", SiR'R", and GeR'R"; $R^B$ and $R^C$ each independently represents zero, mono, or up to a maximum allowed substitutions to its associated ring; each of $R^B$, $R^C$, R, R', and R" is independently hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof; and two substituents can be joined or fused to form a ring; the ligand $L_A$ is complexed to a metal M through the two indicated dash lines of each Formula; and the ligand $L_A$ can be joined with other ligands to form a tridentate, tetradentate, pentadentate, or hexadentate ligand.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound is can also be incorporated into the supramolecule complex without covalent bonds.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, 0520050139810, 0520070160905, 0520090167167, 052010288362, WO06081780, WO2009003455, WO2009008277, WO2009011327, WO2014009310, 052007252140, 052015060804, 0520150123047, and US2012146012.

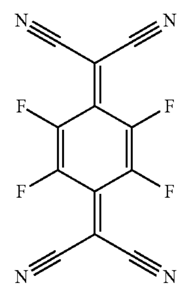

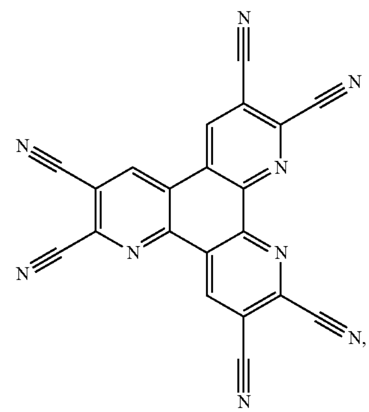

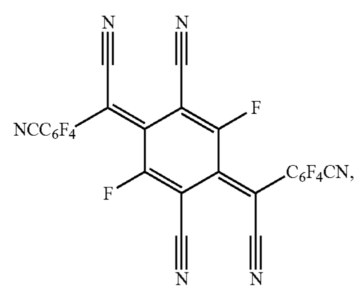

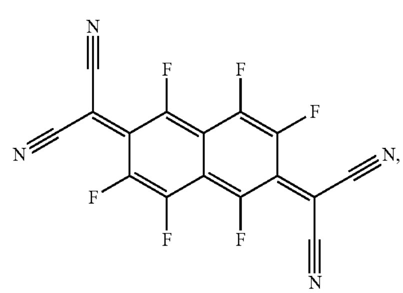

-continued

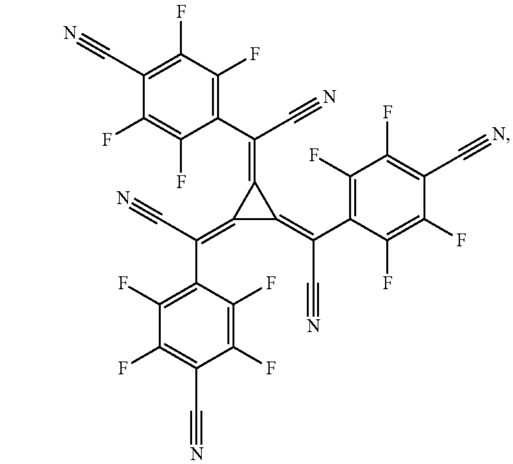

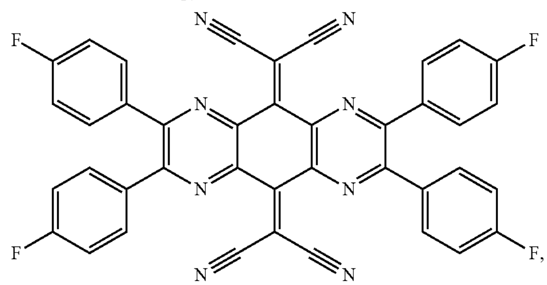

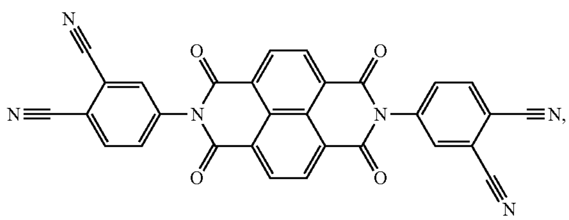

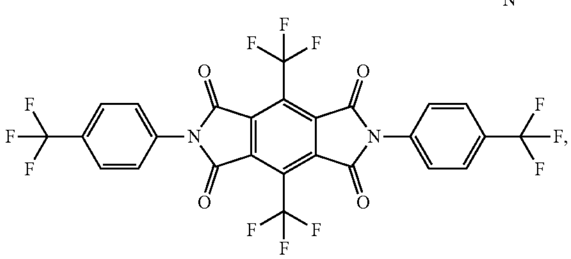

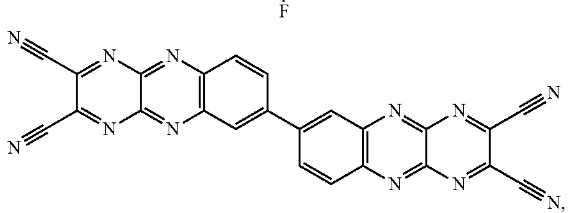

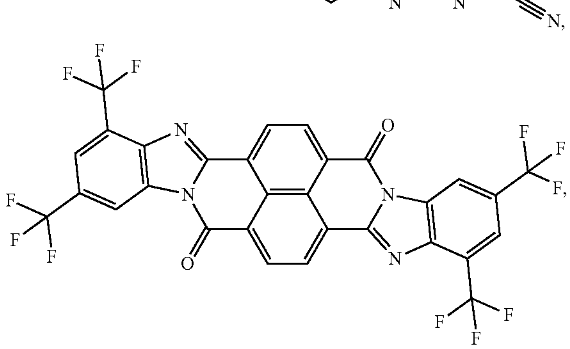

-continued

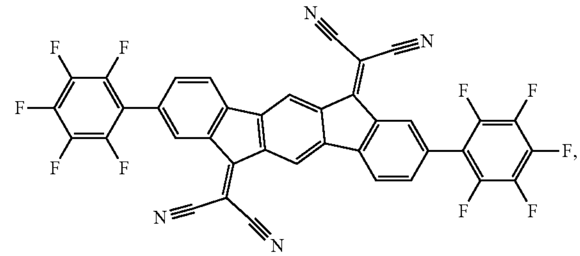

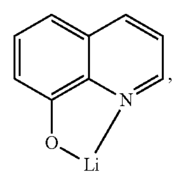

and

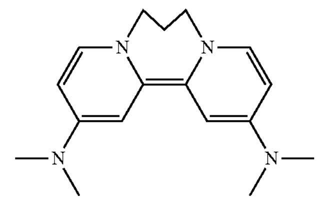

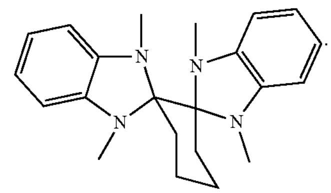

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphoric acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

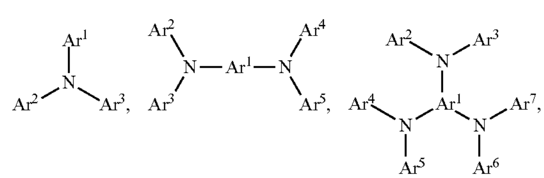

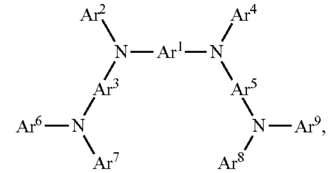

and

-continued

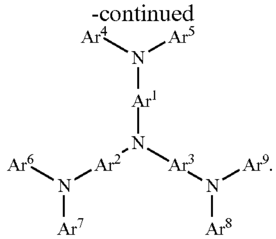

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

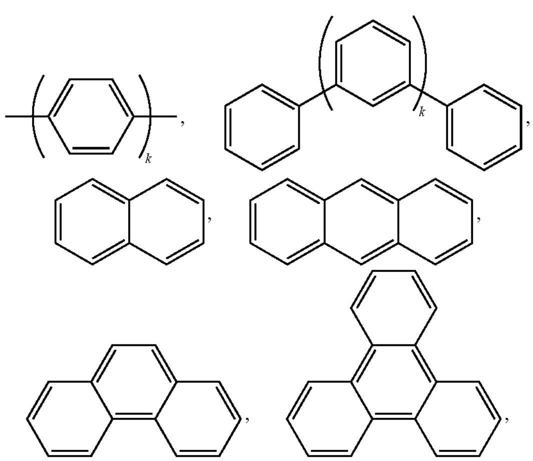

-continued

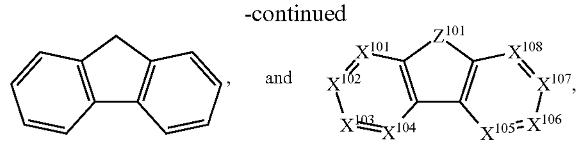

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

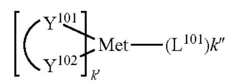

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

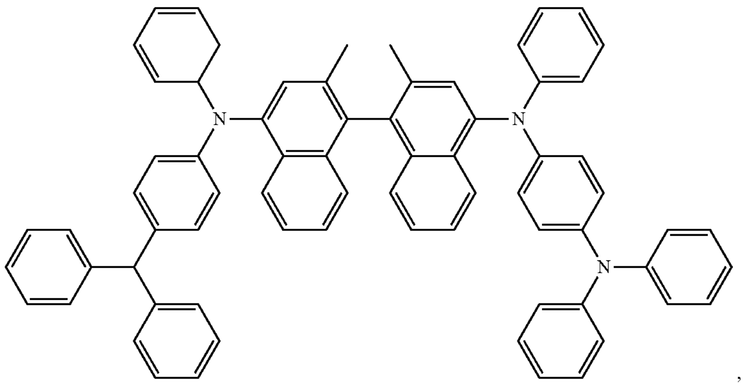
,
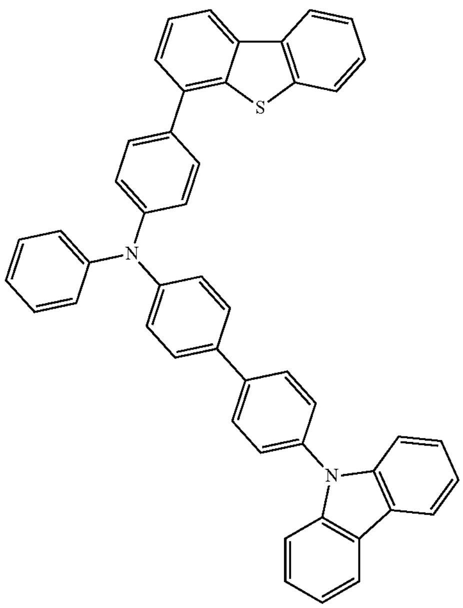
,
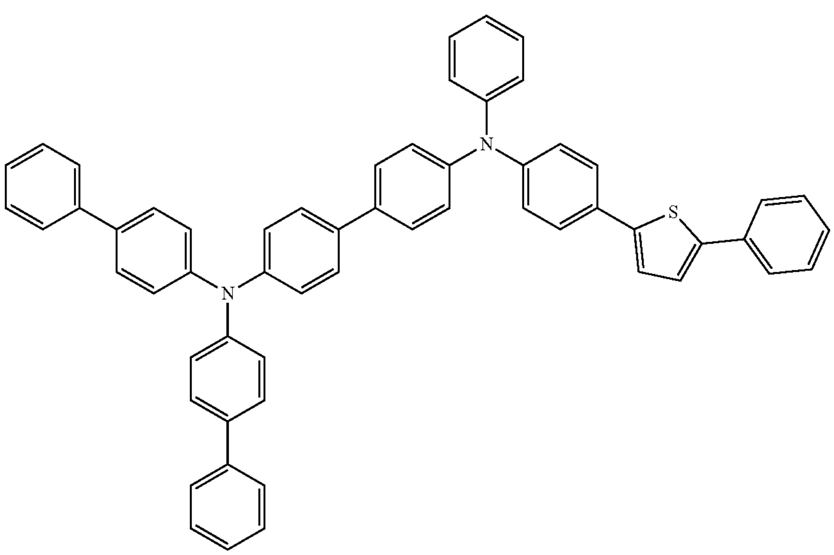
,

-continued
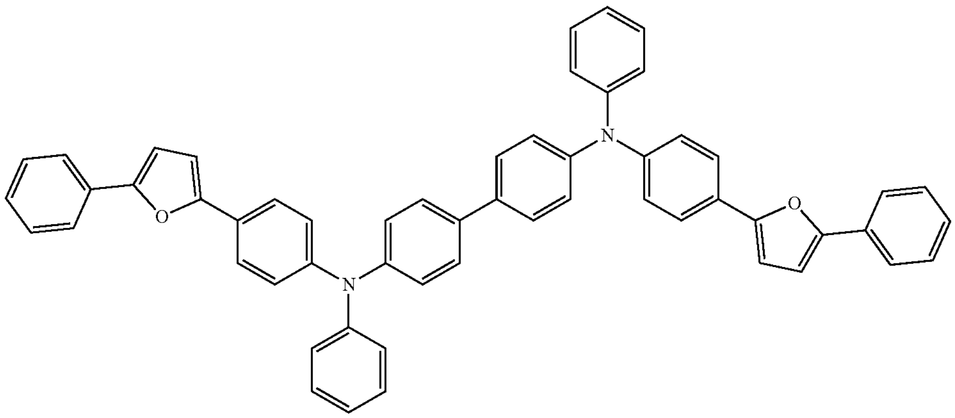
,
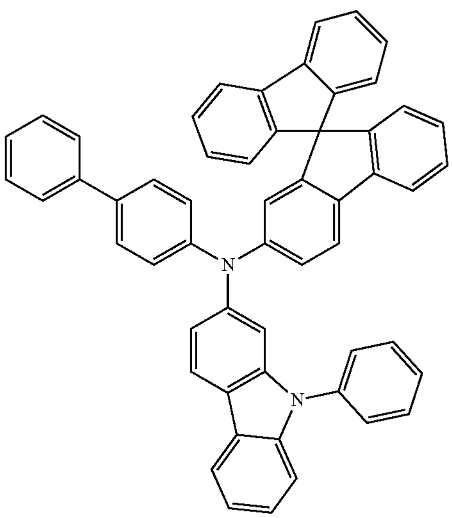
,
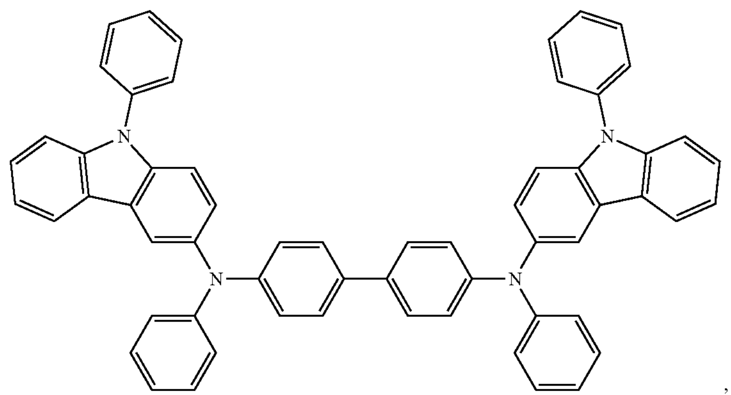
,
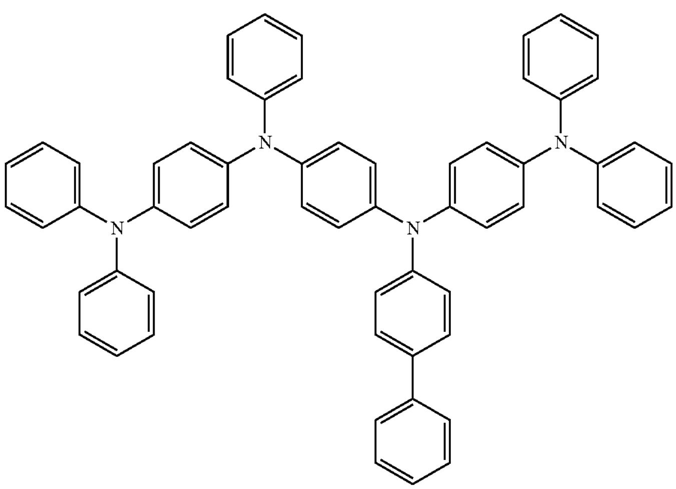
,

-continued
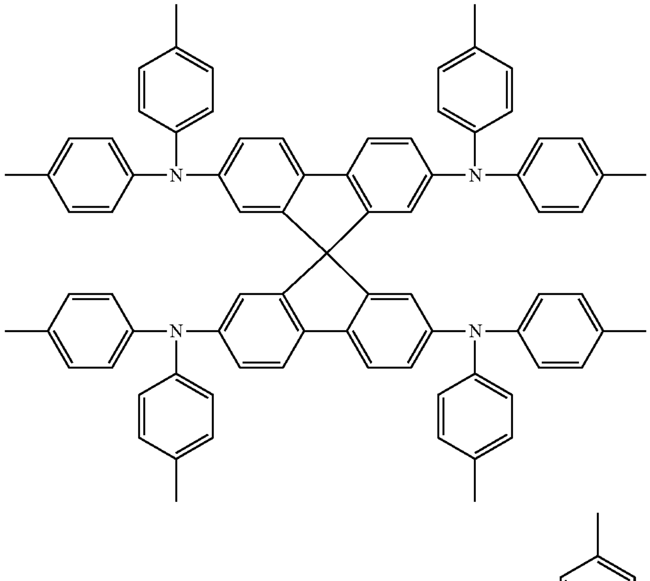
,
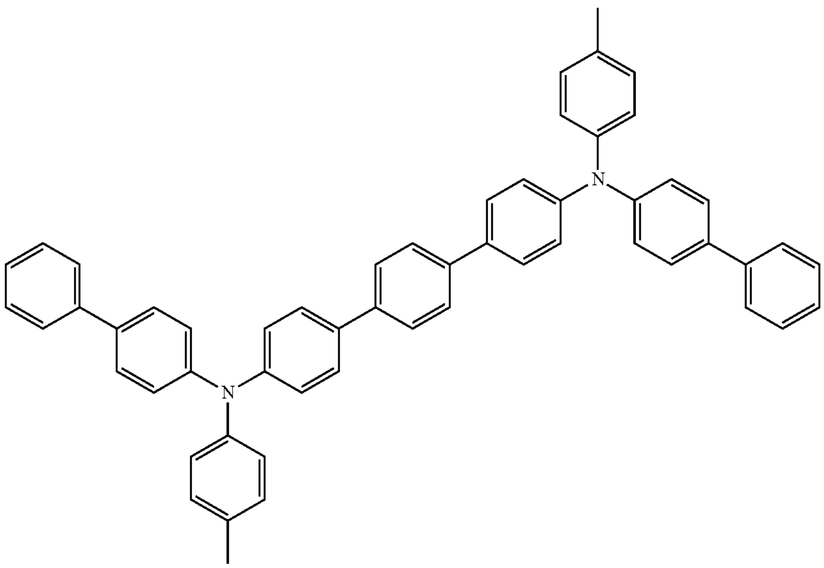
,
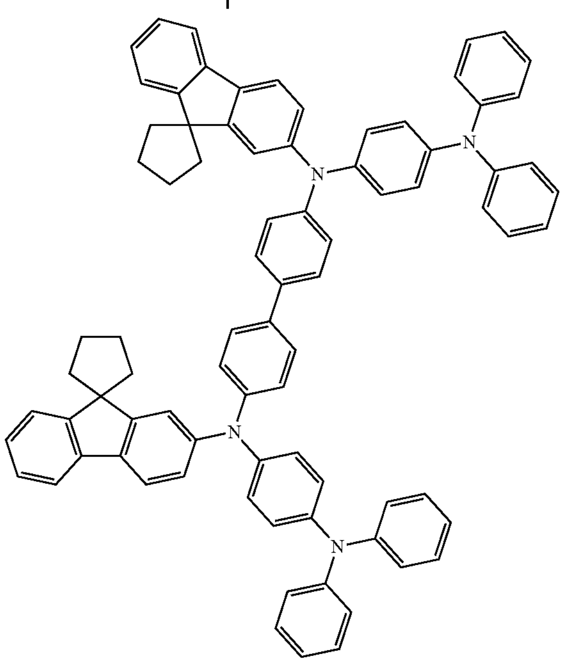
,

-continued
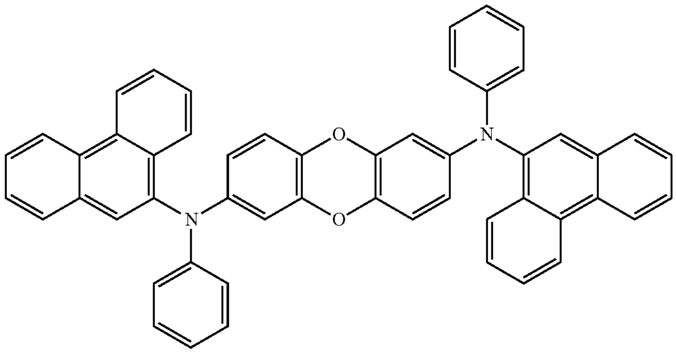
,
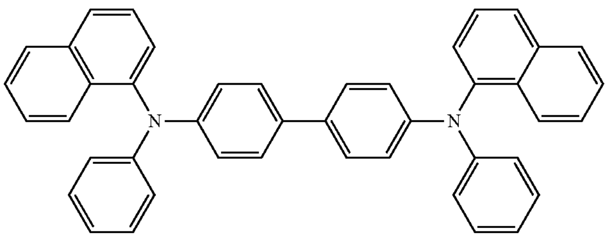
+ $MoO_x$,
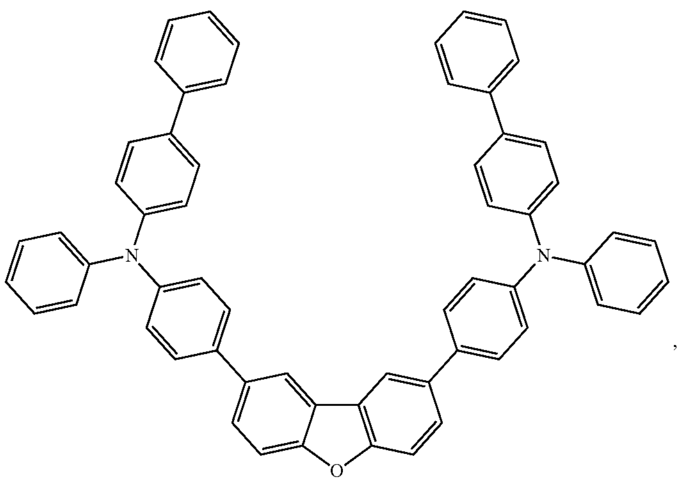
,
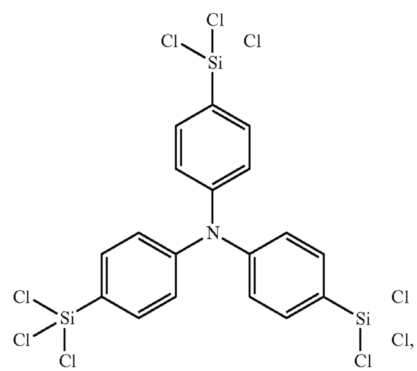
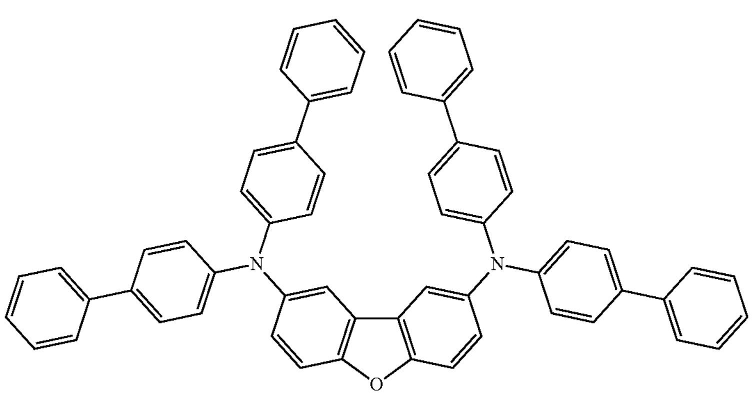
,
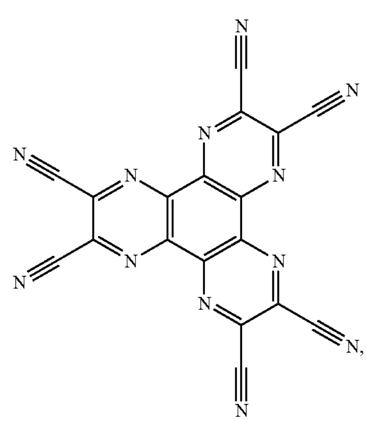

-continued
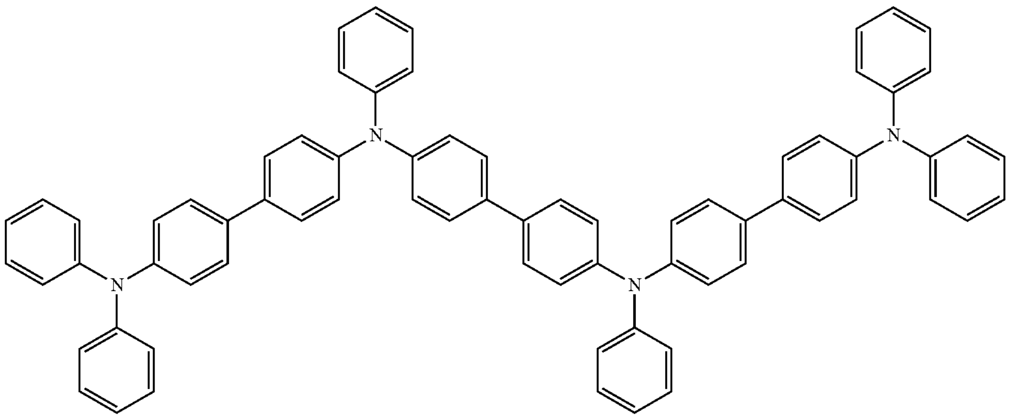
,
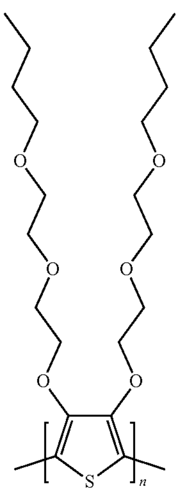
,
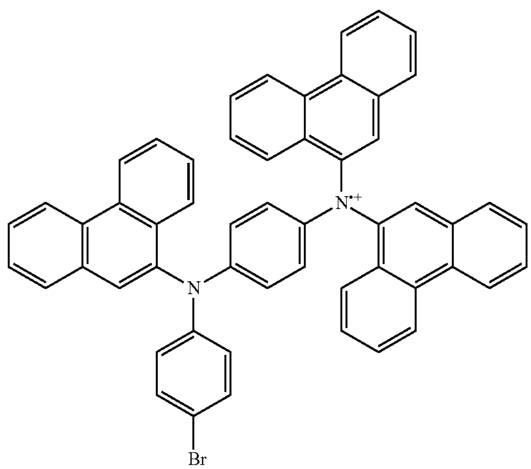
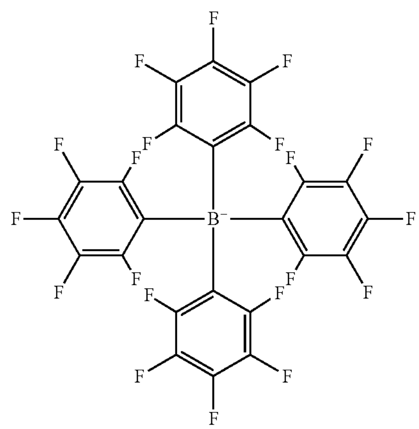
,
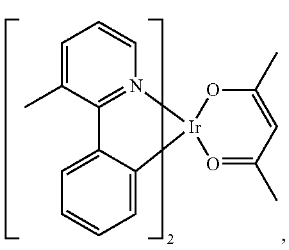
,
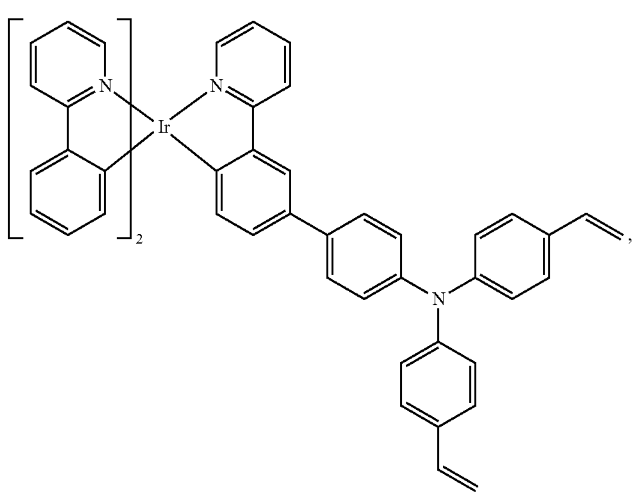
, -continued
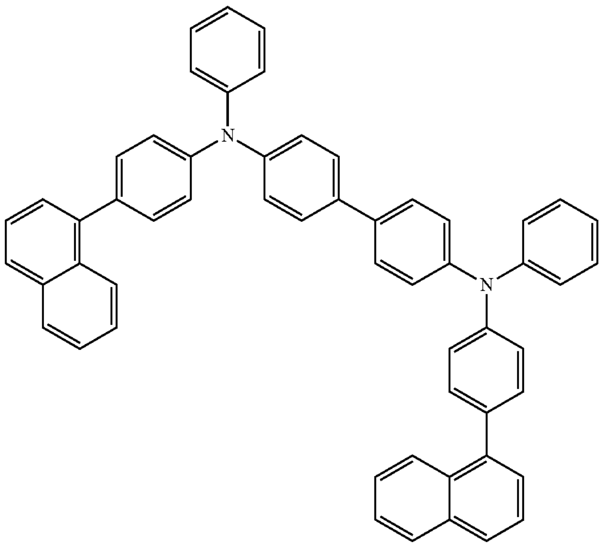
,
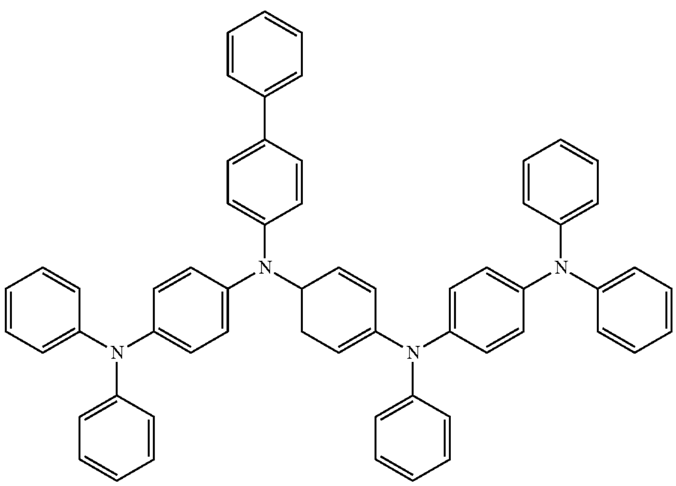
,
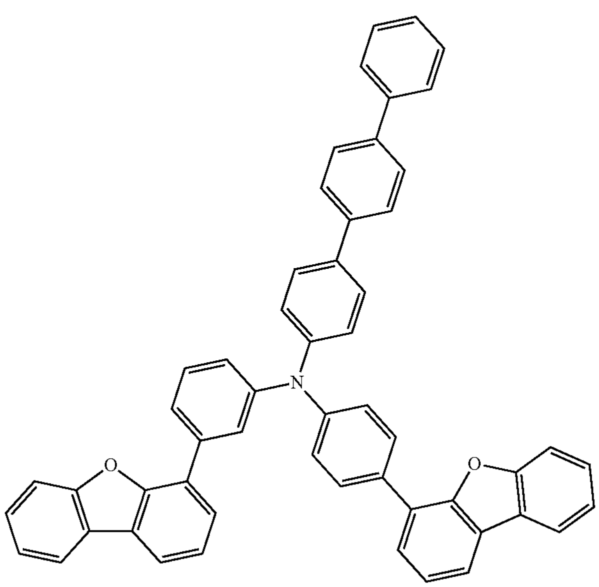
, -continued
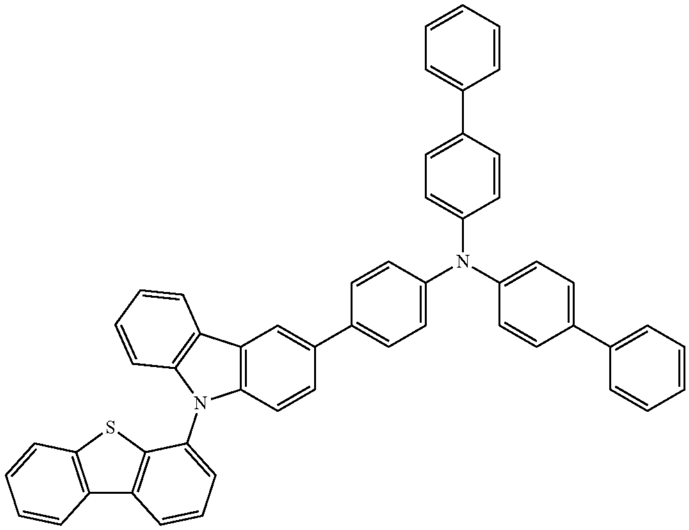
,
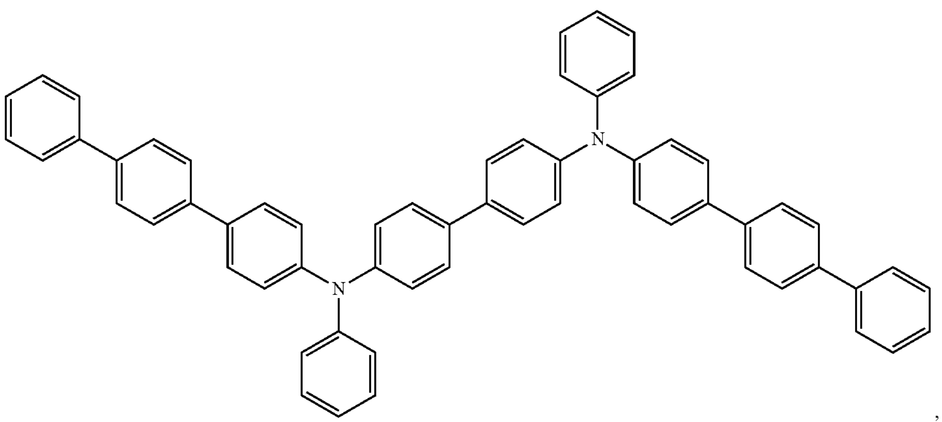
,
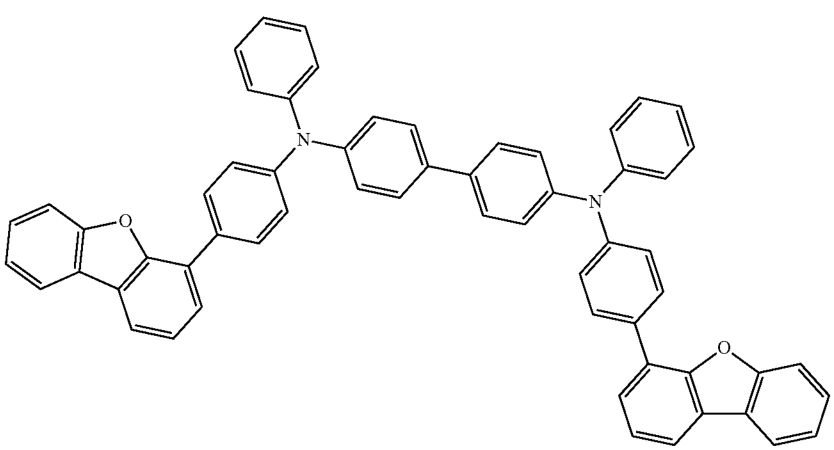
, -continued
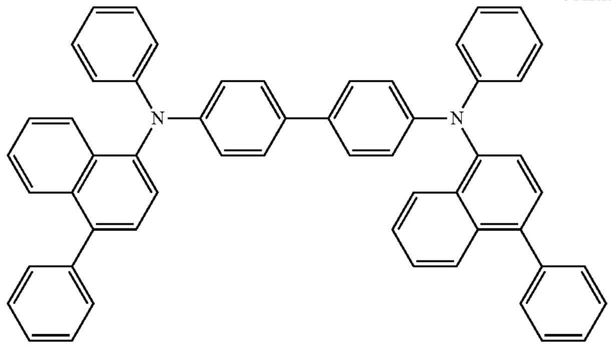
,
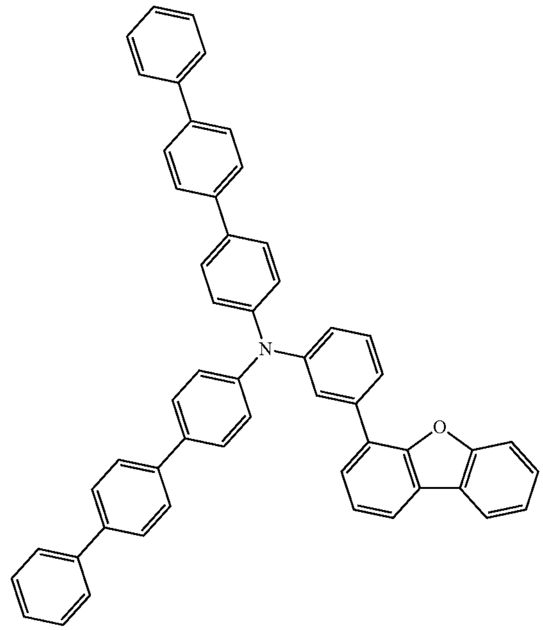
,
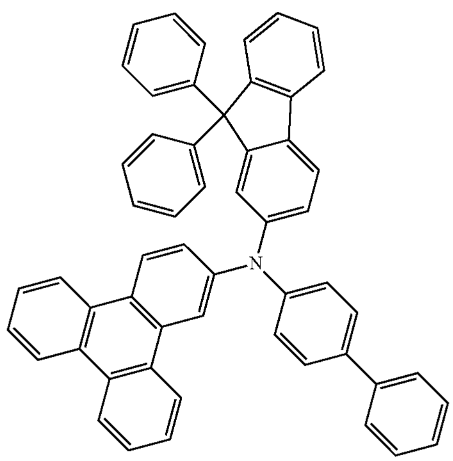
,
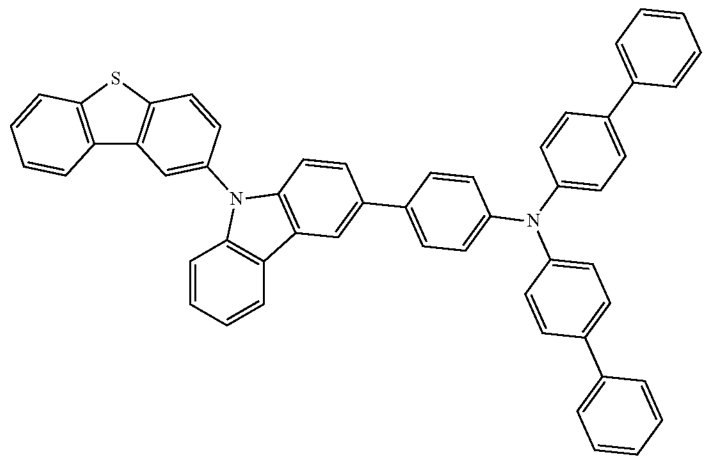
,
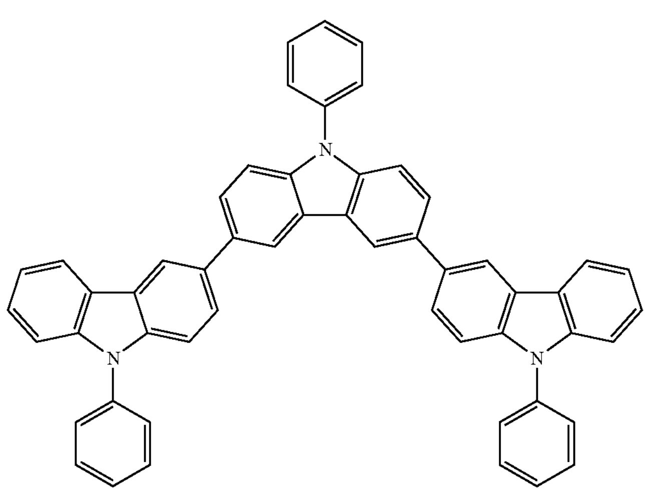
,
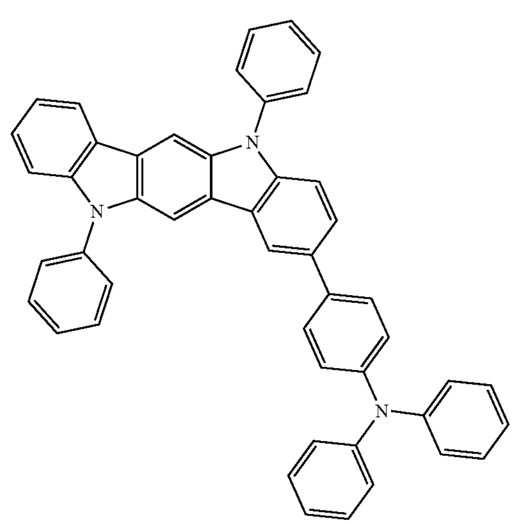
, -continued
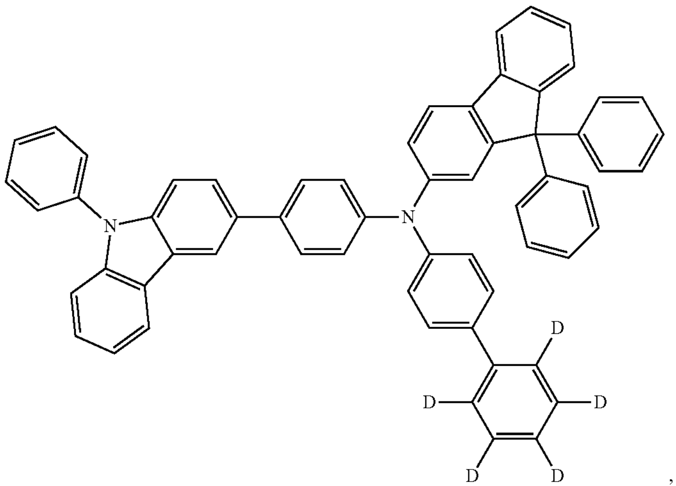
,
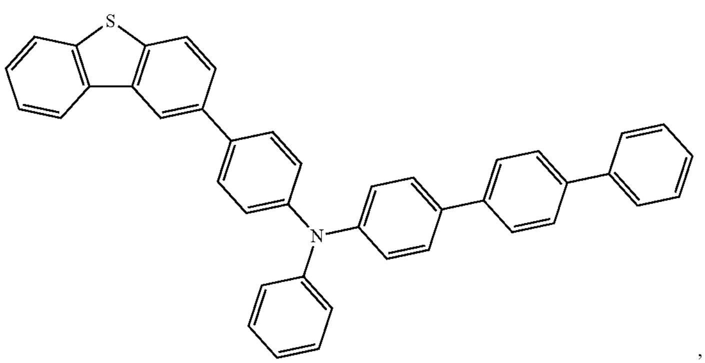
,
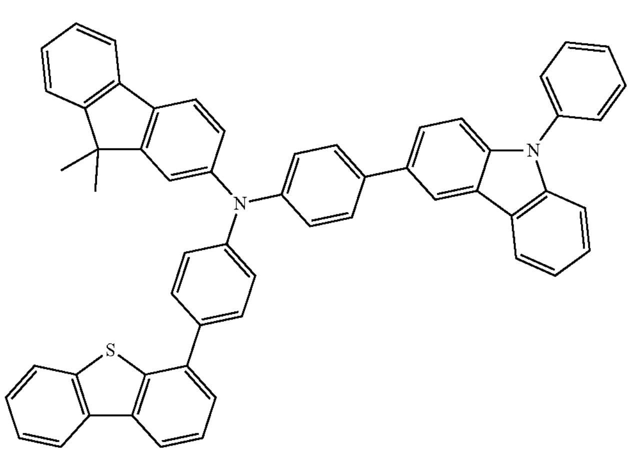
, -continued
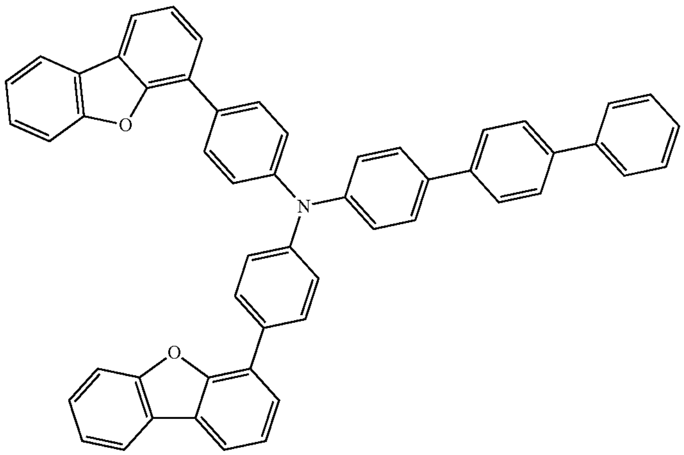
,
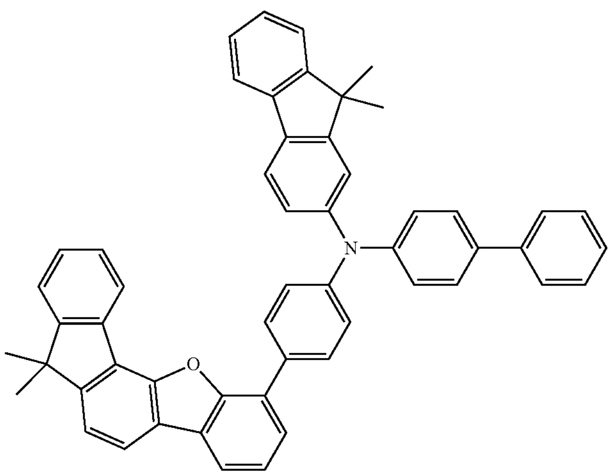
,
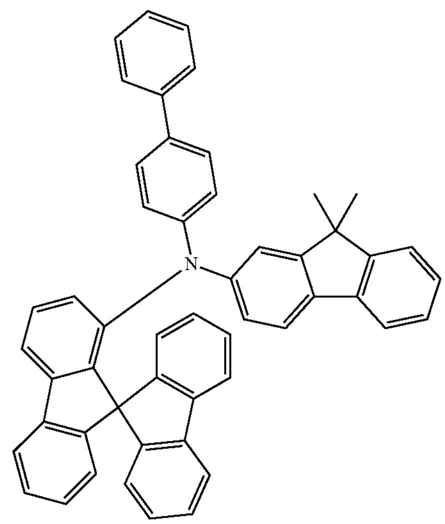
,
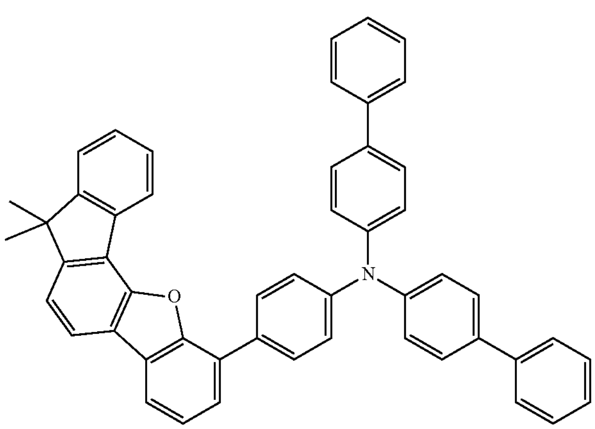
, -continued
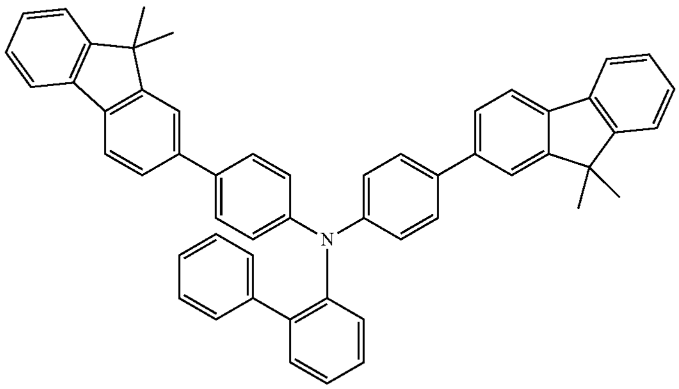
,
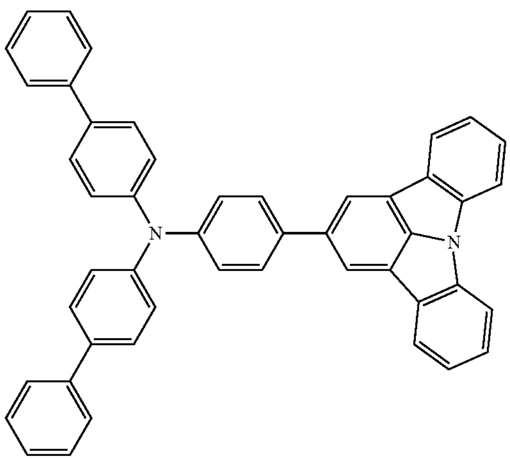
,
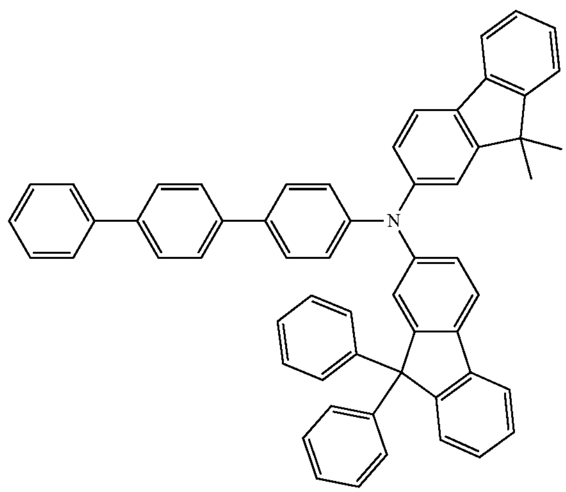
,
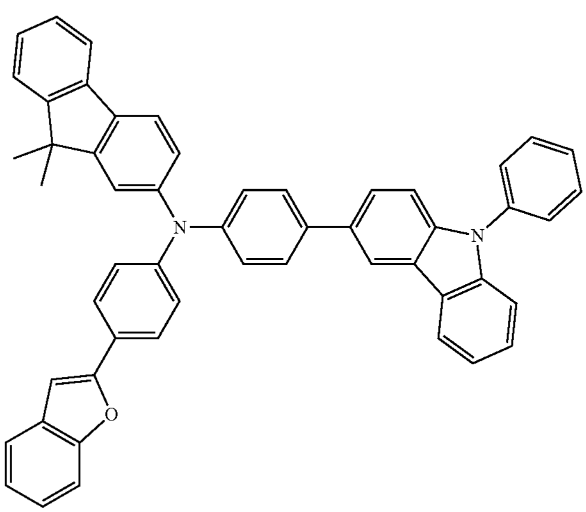
,
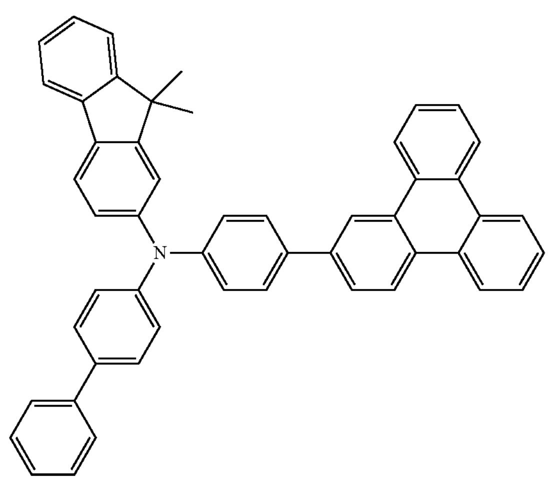
, -continued
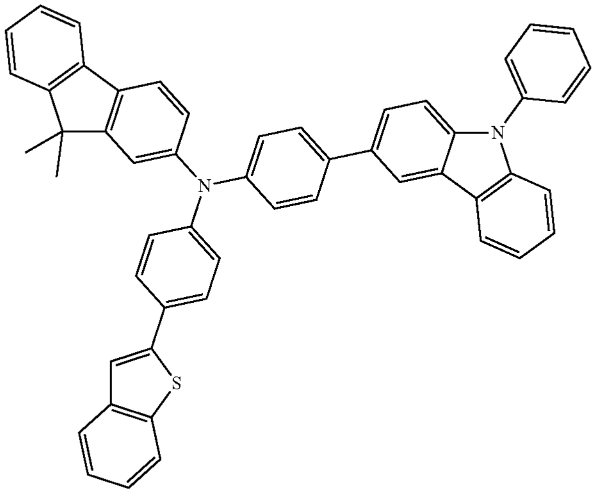
,
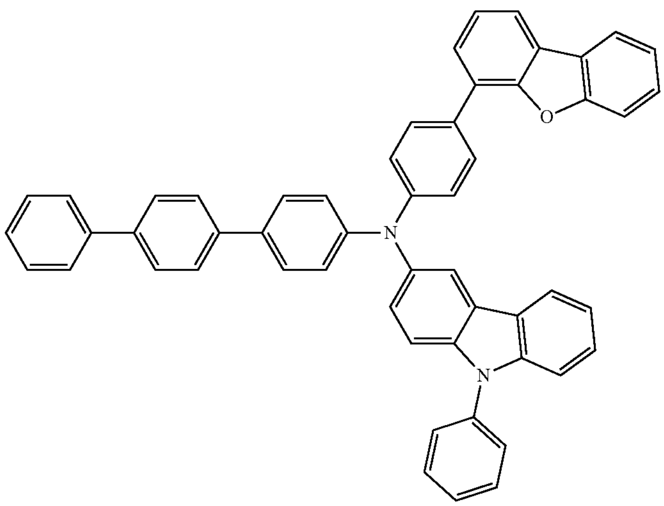
,
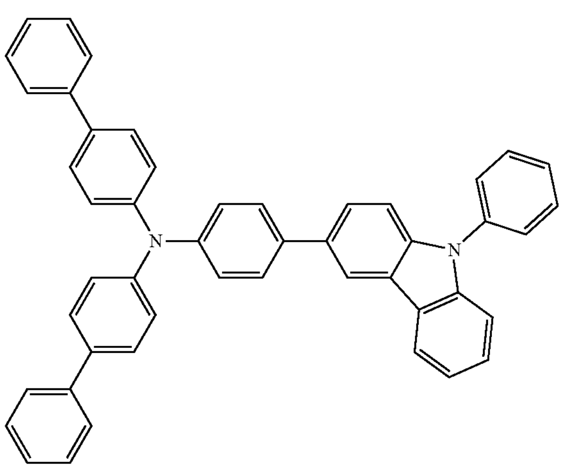
,
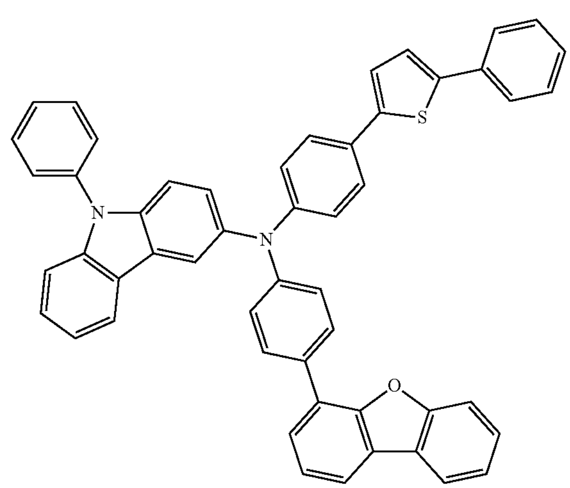
, -continued
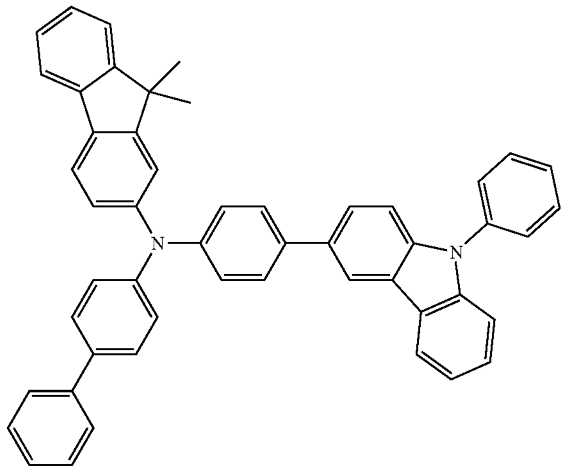
,
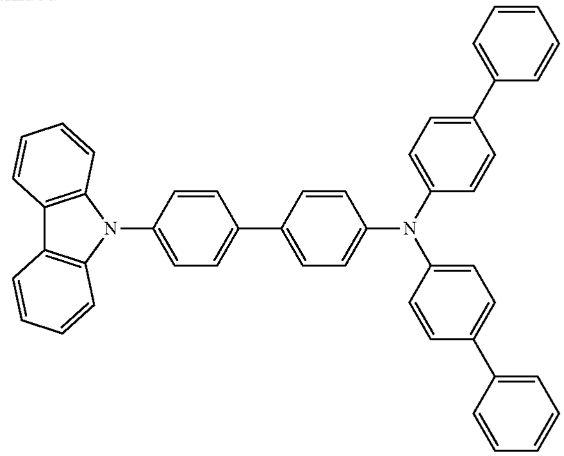
,
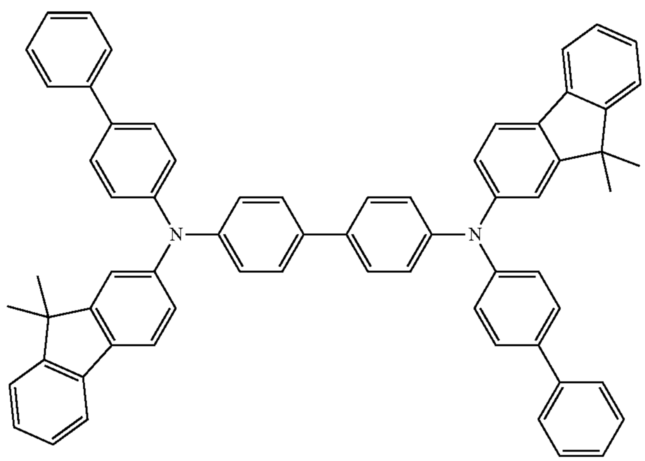
,
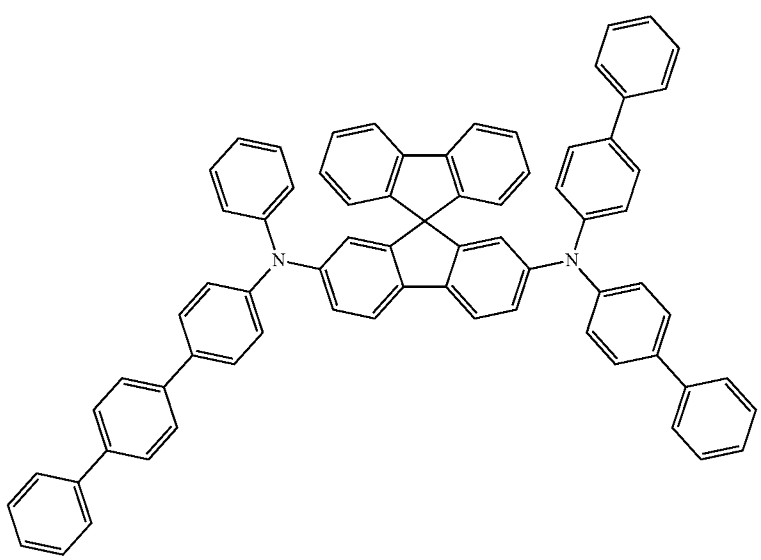
, -continued
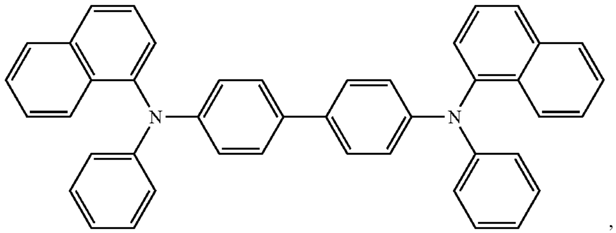
,
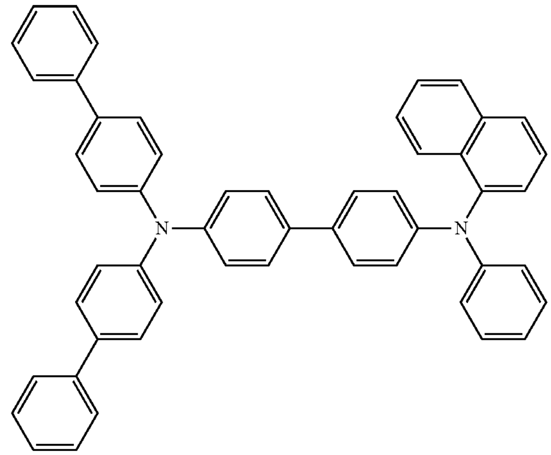
,
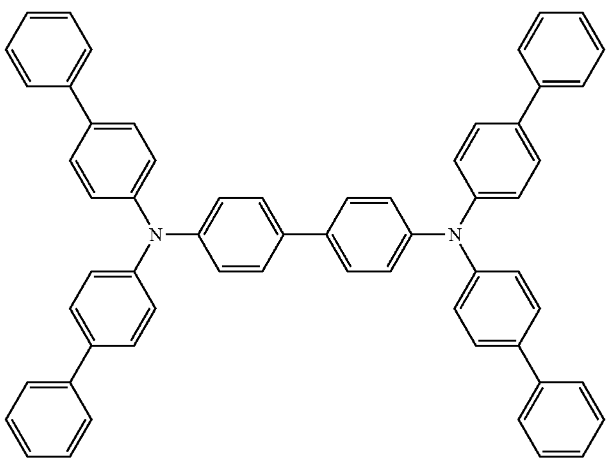
,
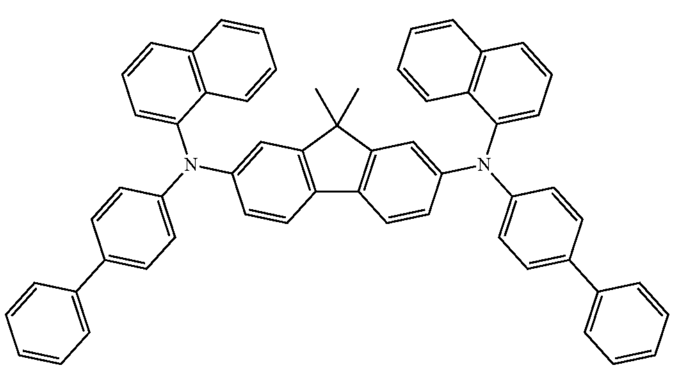
, -continued
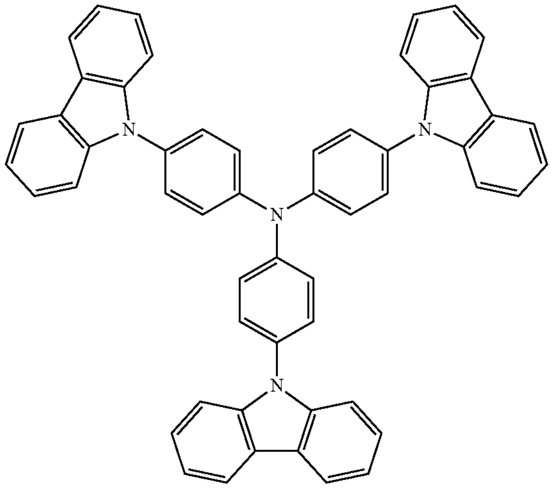
,
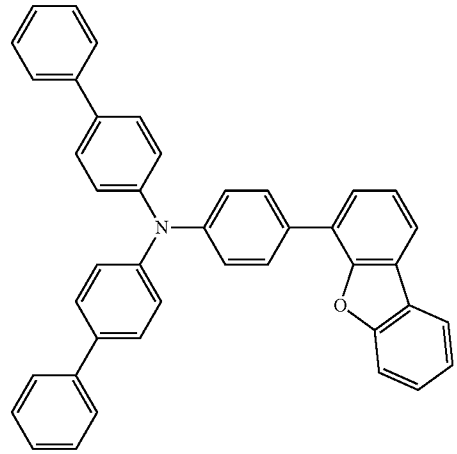
,
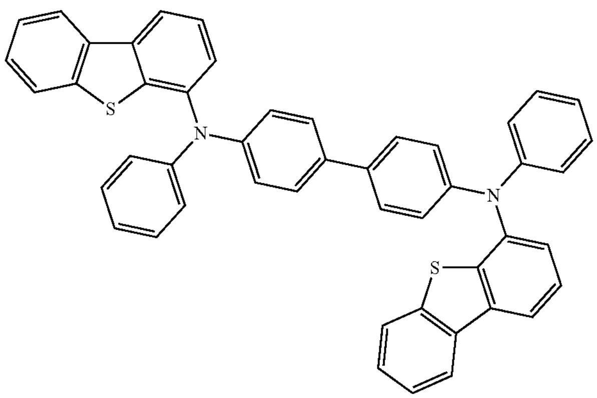
,
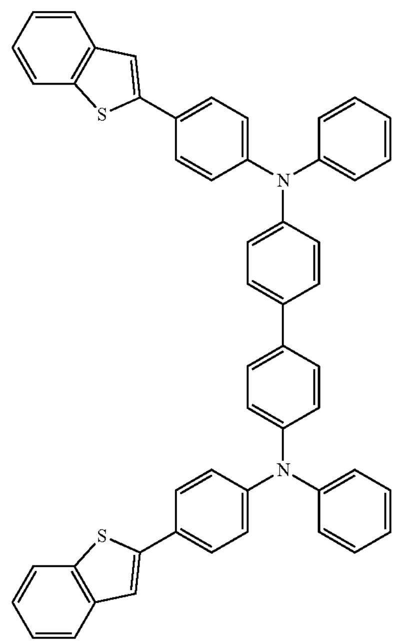
, and
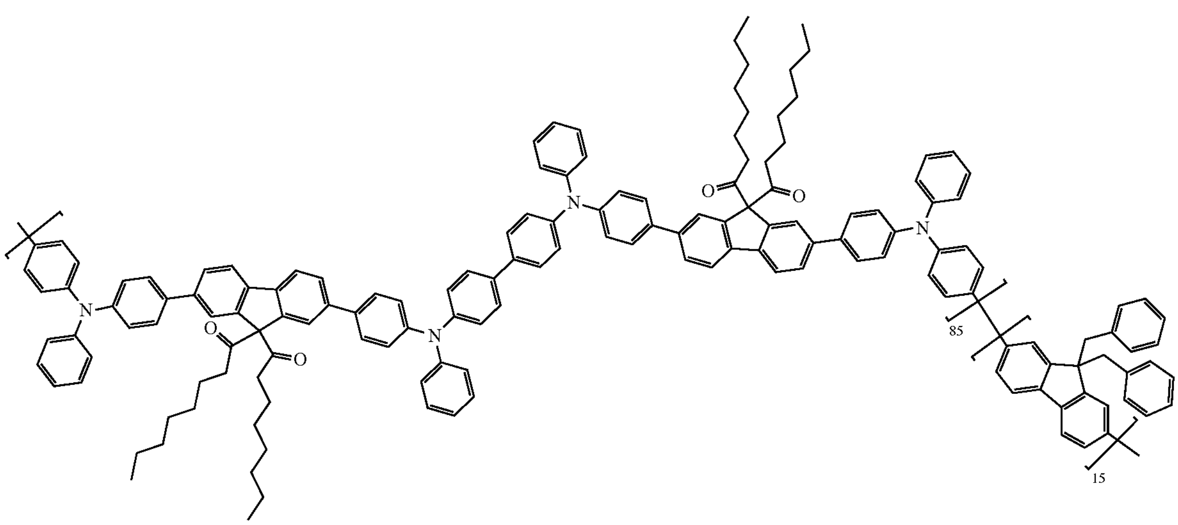
.

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

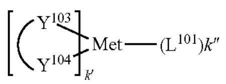

wherein Met is a metal; ($Y^{103}$-$Y^{104}$)) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

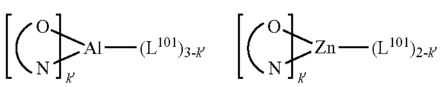

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

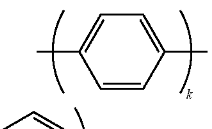

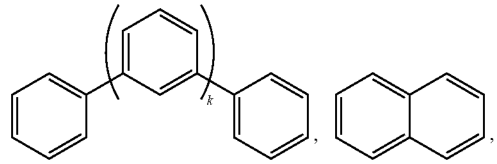

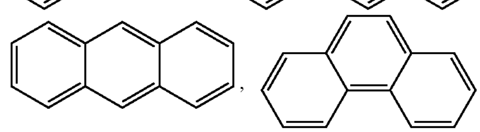

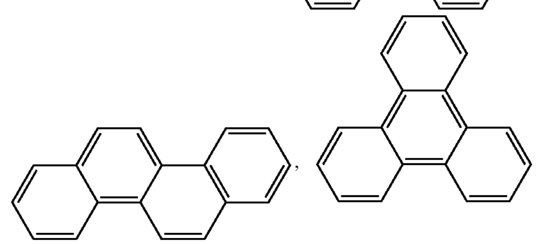

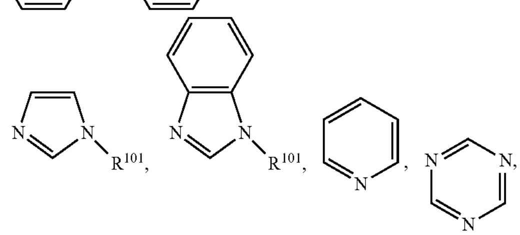

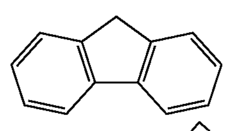

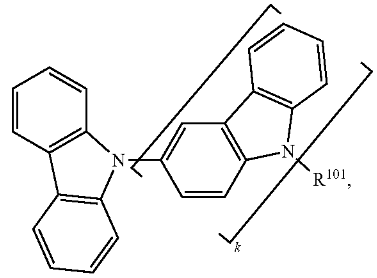

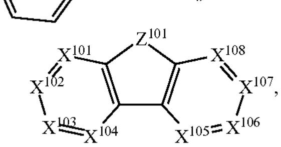

-continued

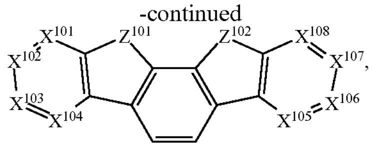

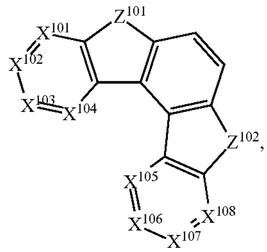

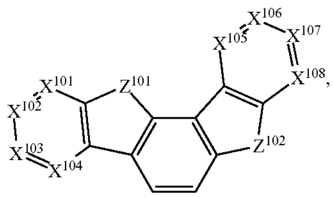

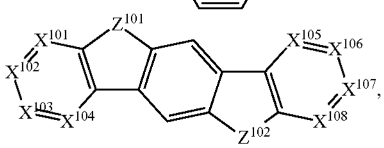 and

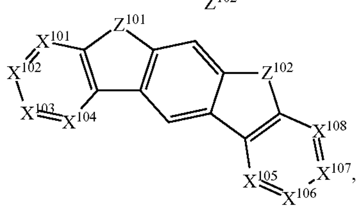

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

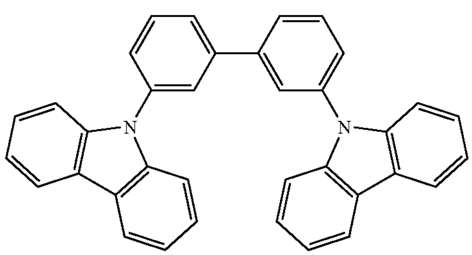

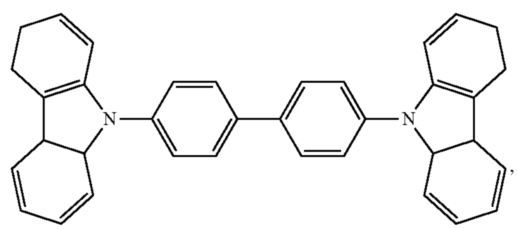

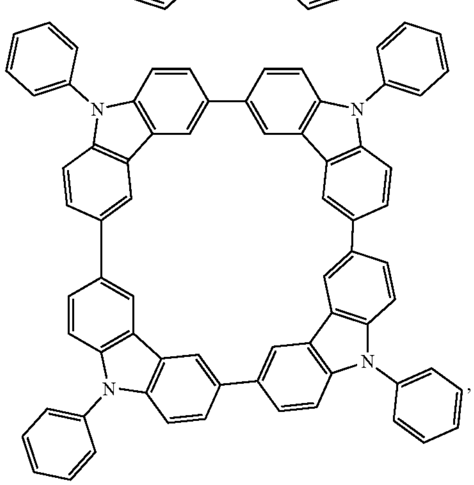

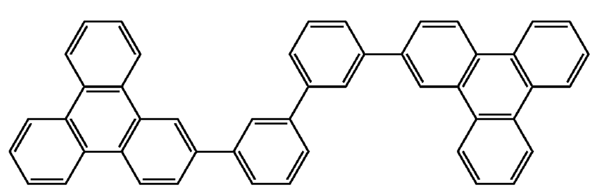

-continued
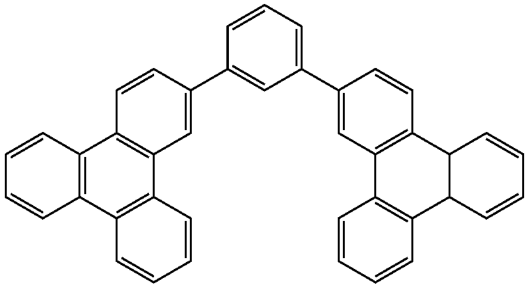
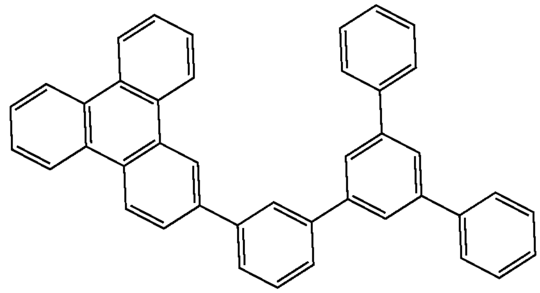
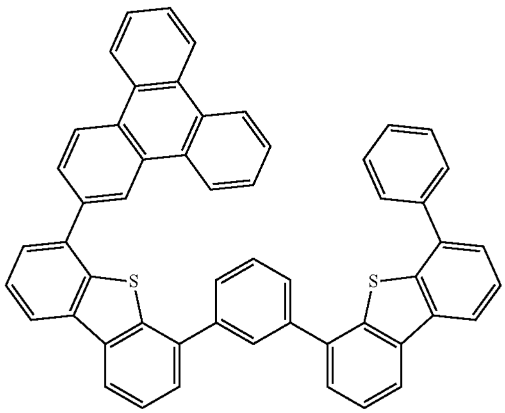
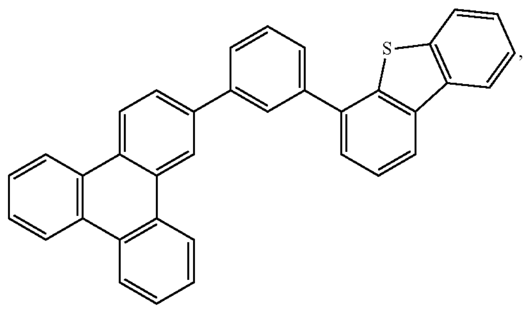
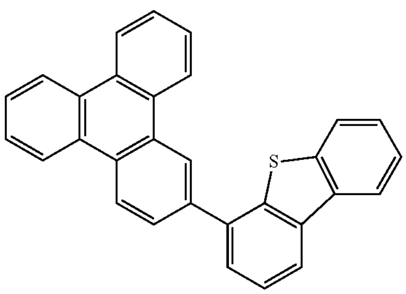
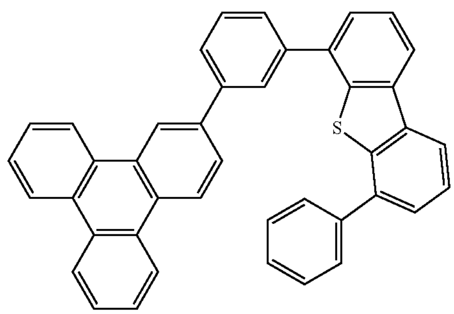
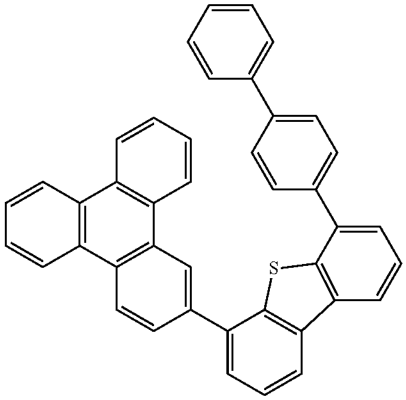
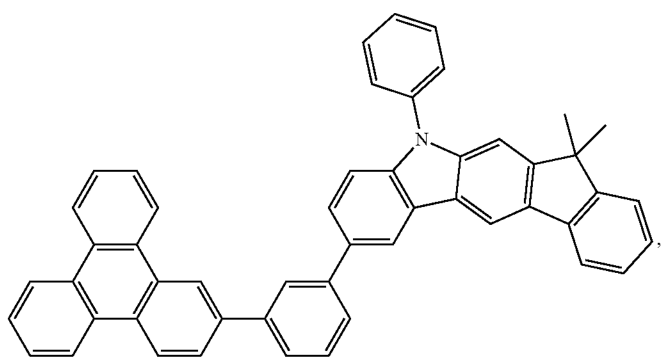

-continued
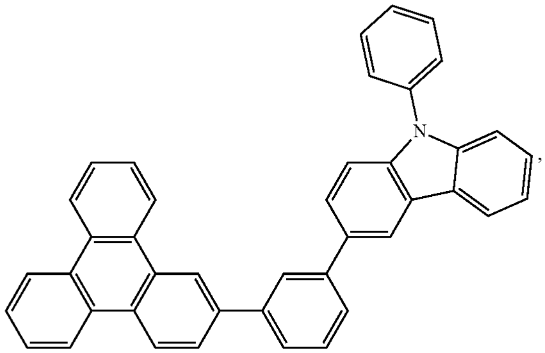
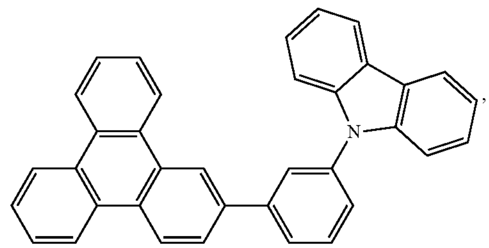
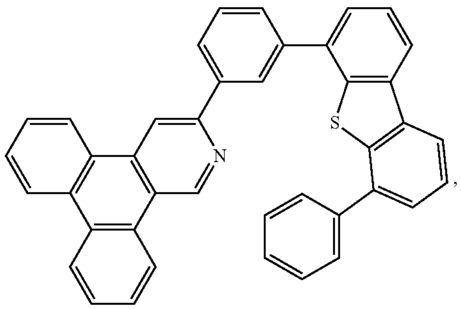
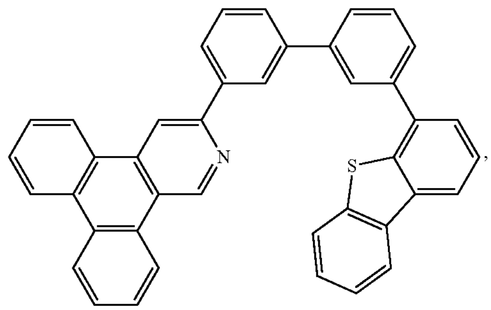
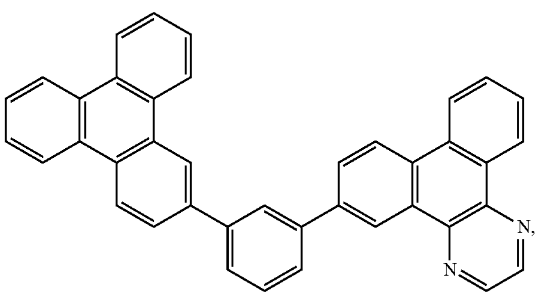
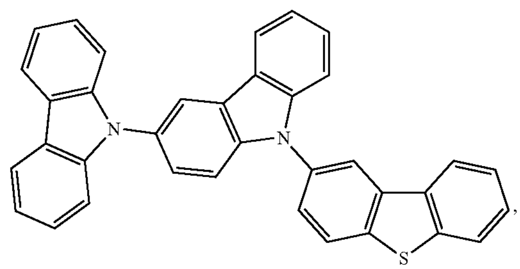
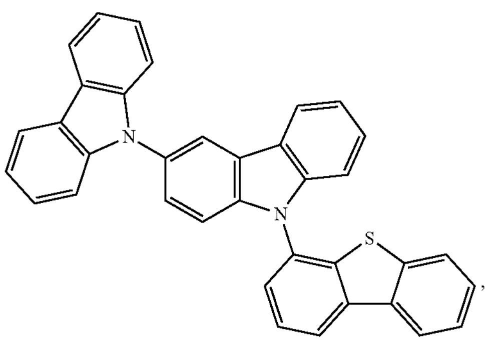
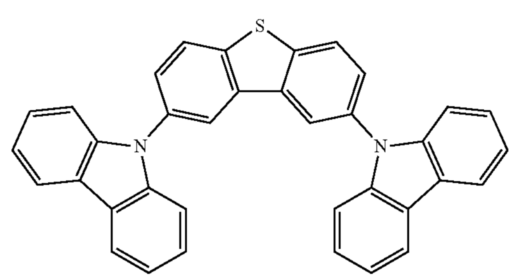
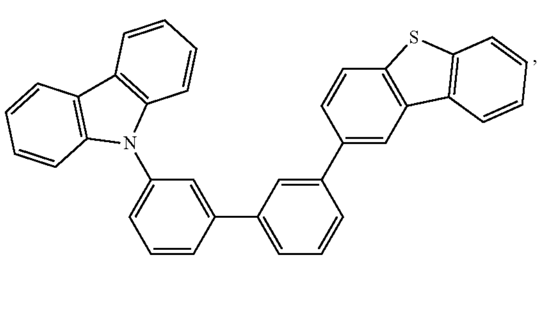
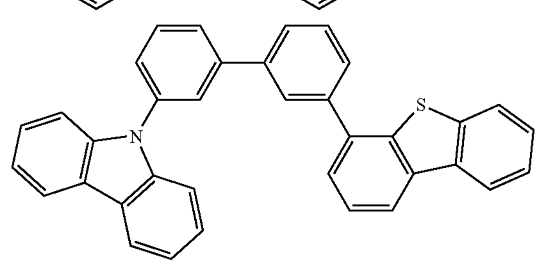

-continued
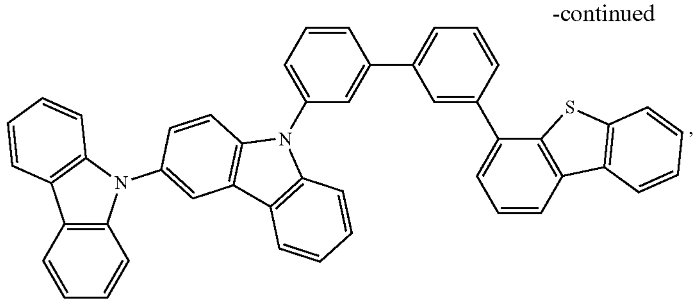
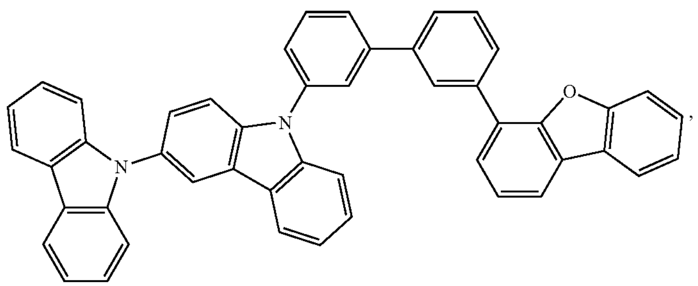
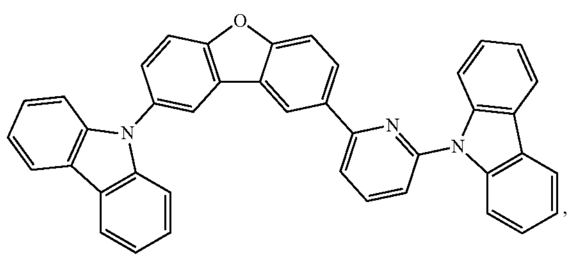
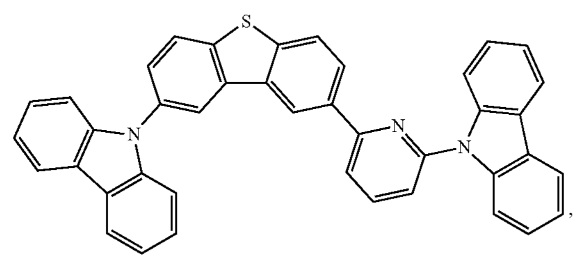
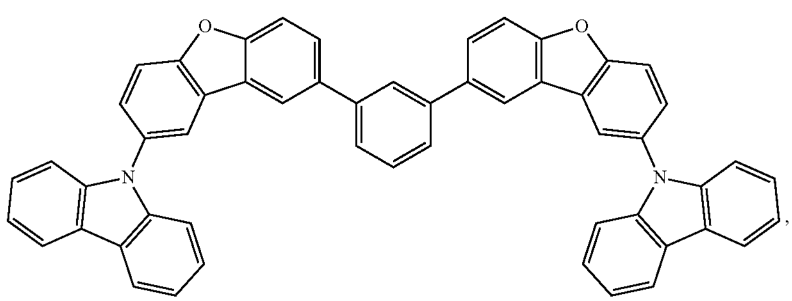
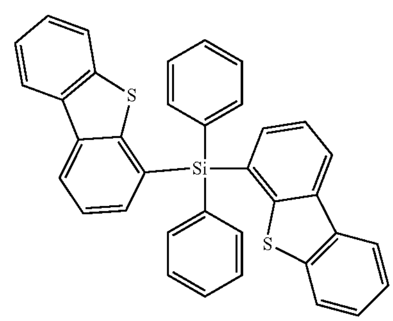
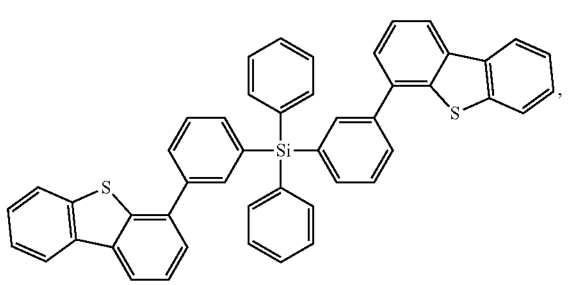
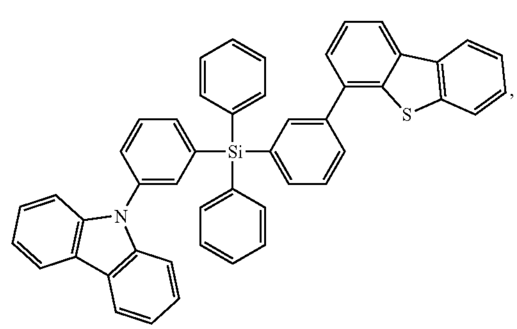

-continued
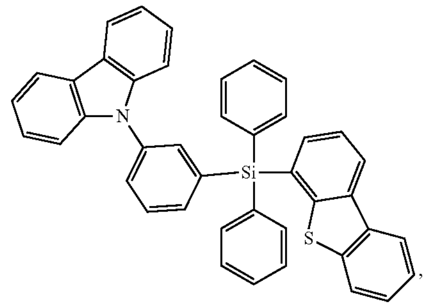
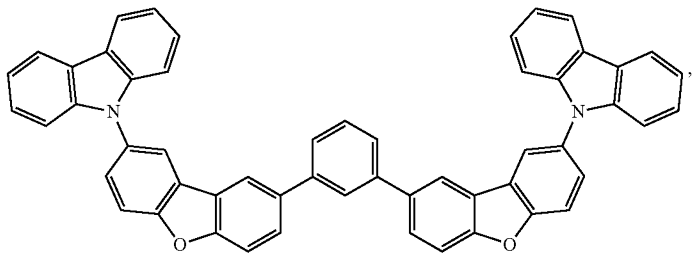
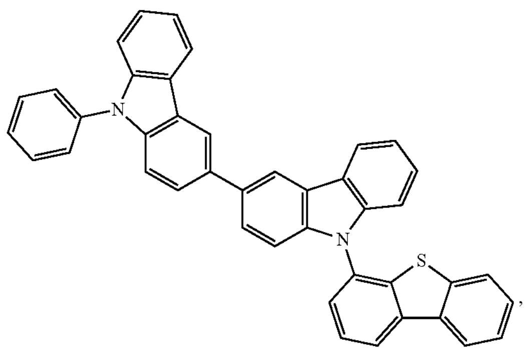
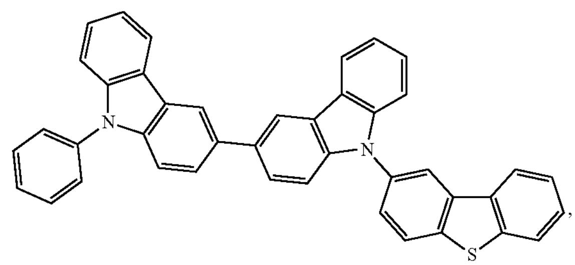
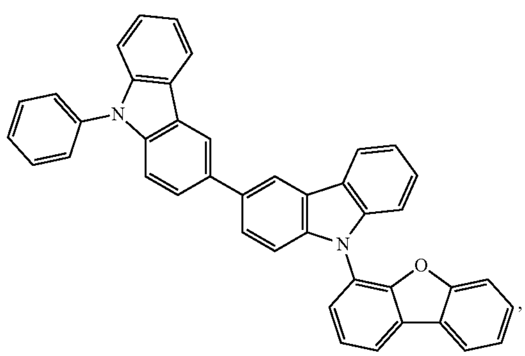
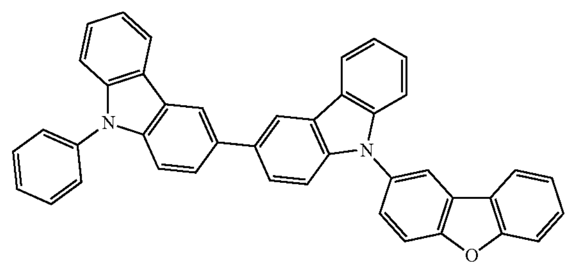
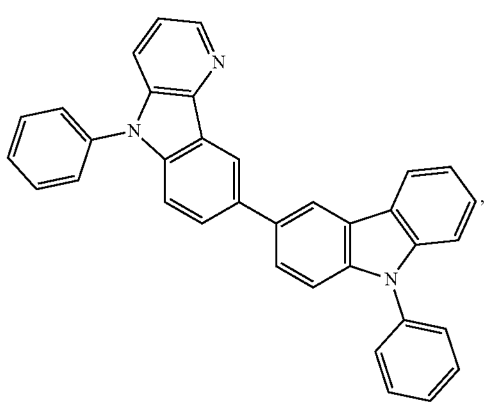
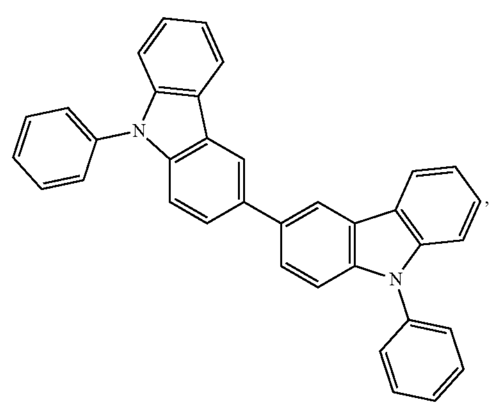

-continued
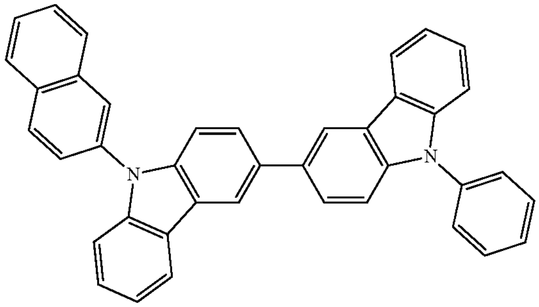
,
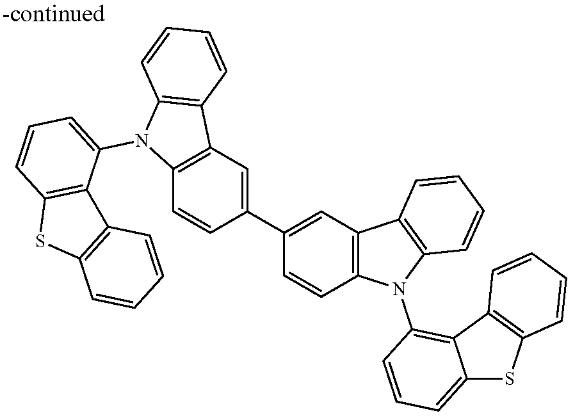
,
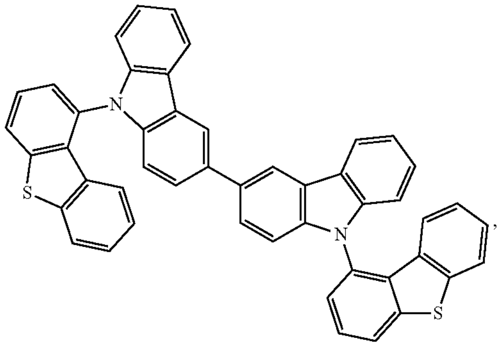
,
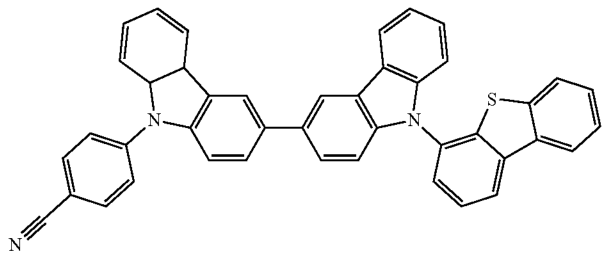
,
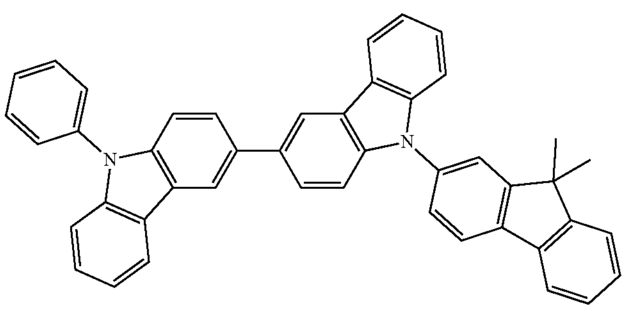
,
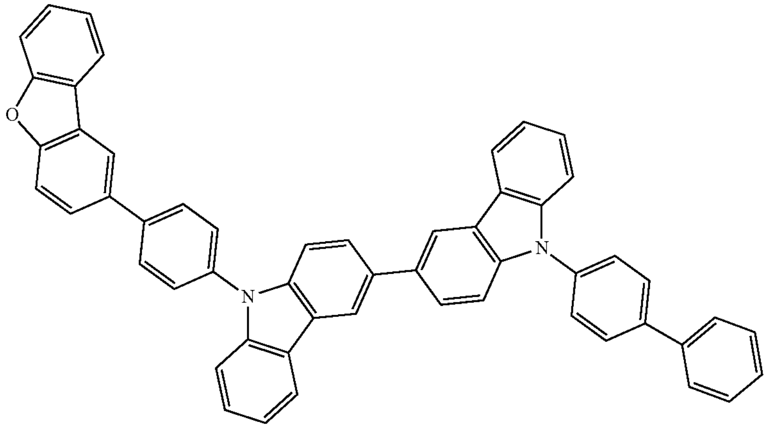
, -continued
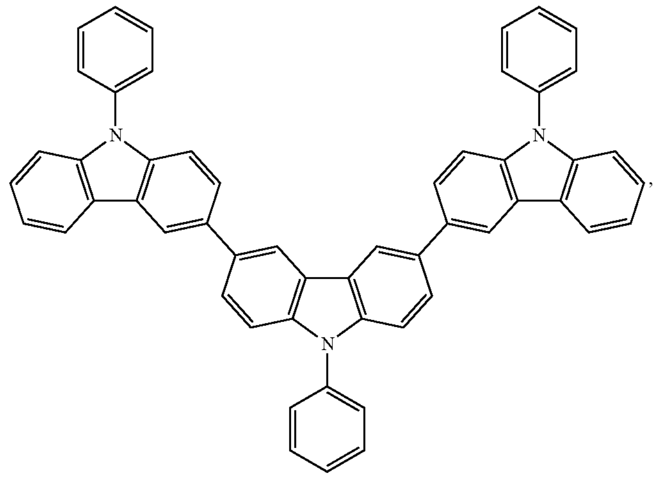
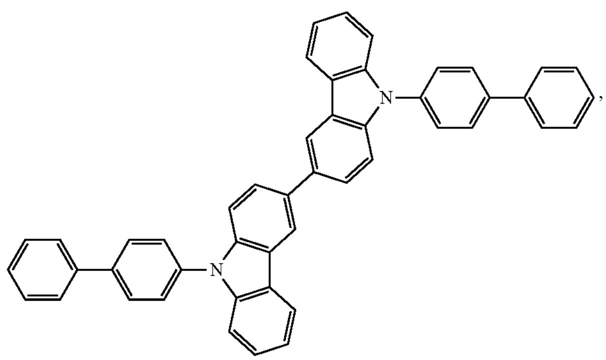
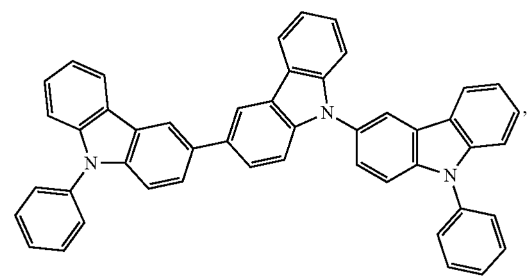
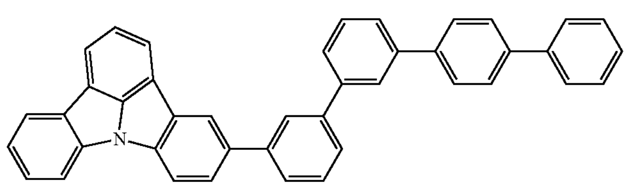
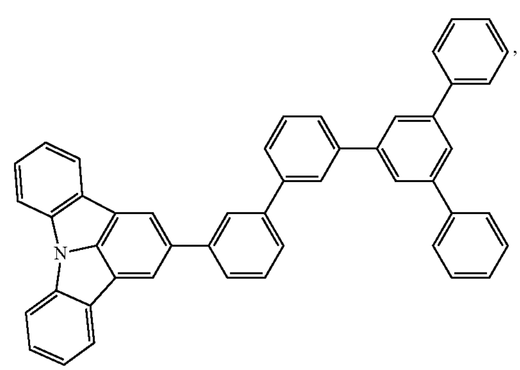
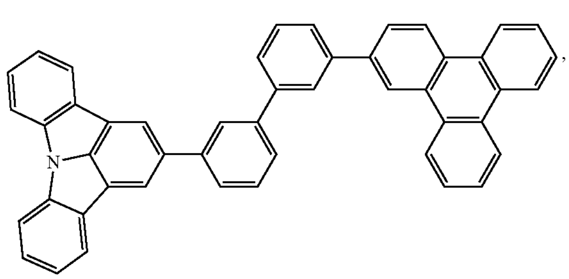
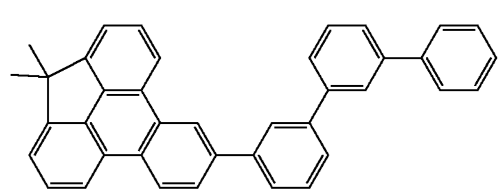

-continued
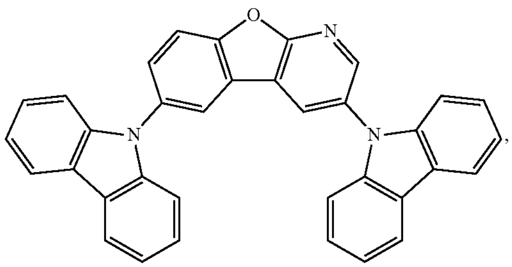
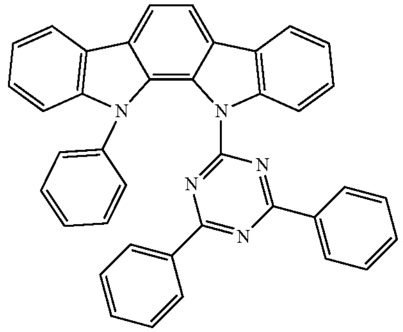
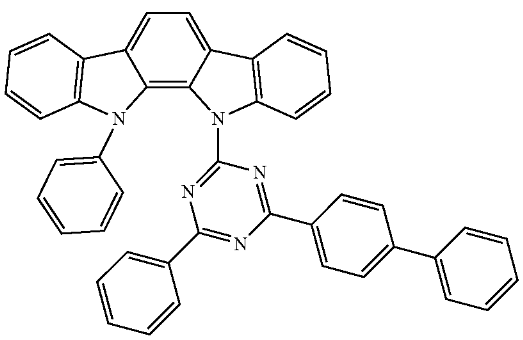
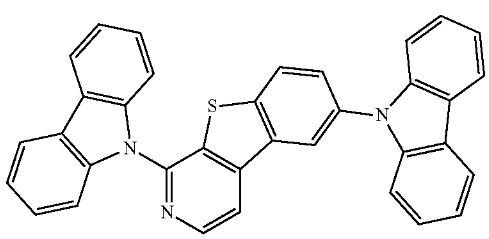
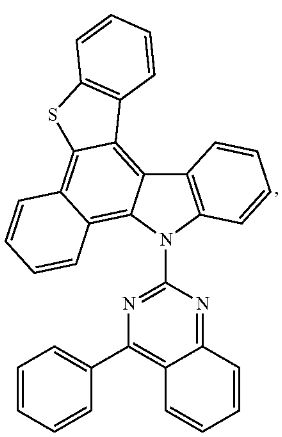
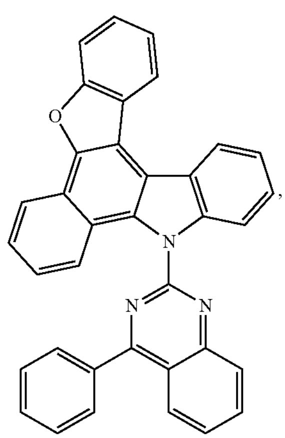
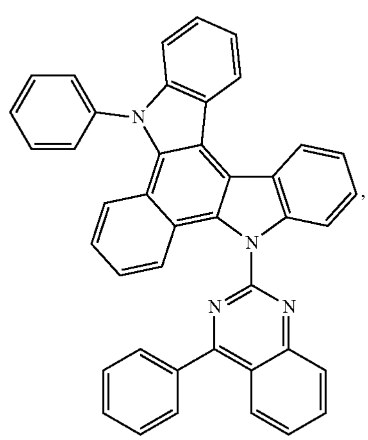

-continued
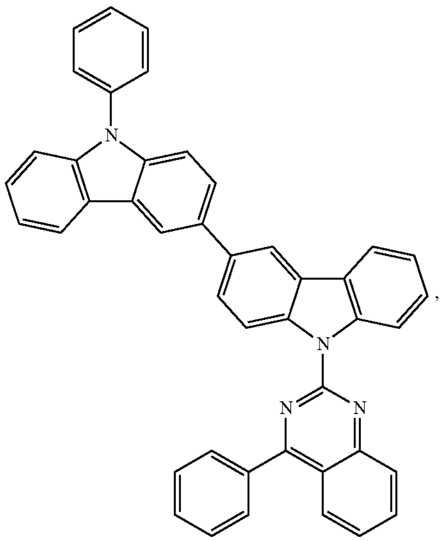
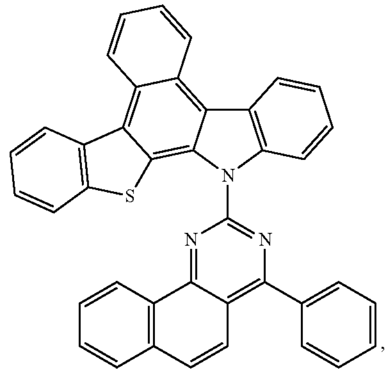
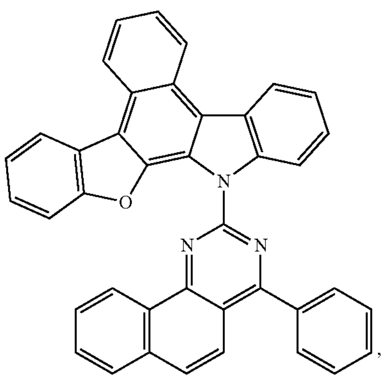
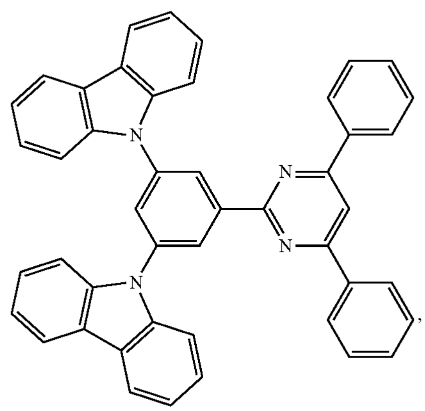
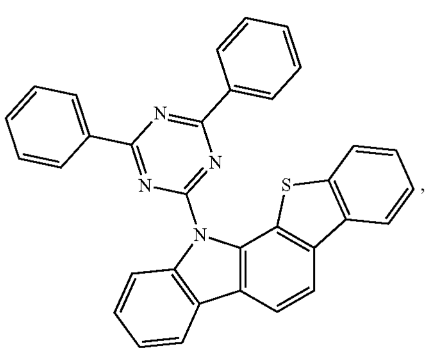
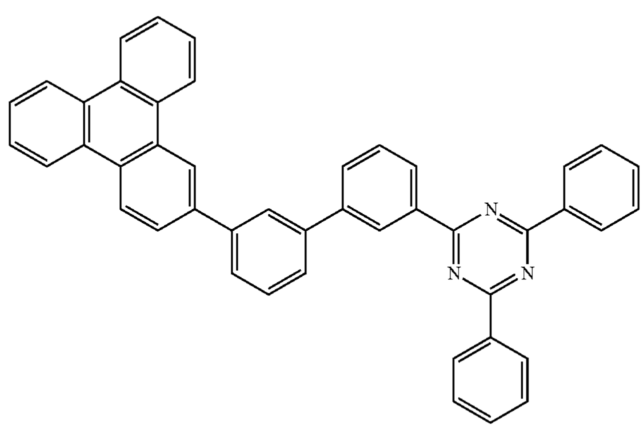

-continued
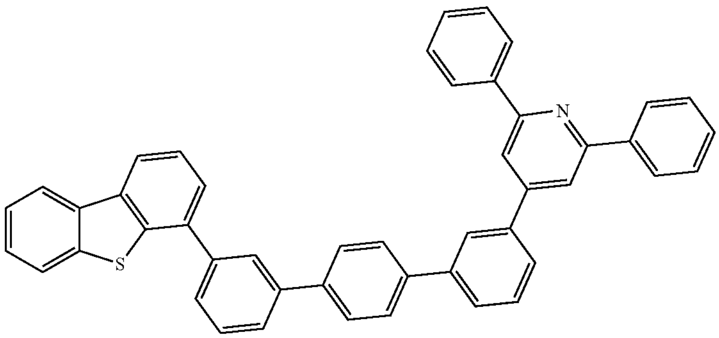
,
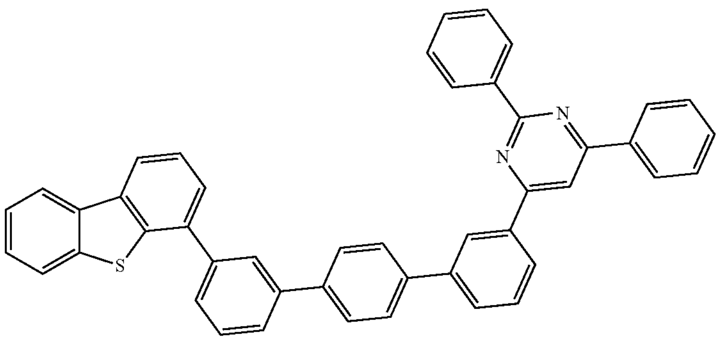
,
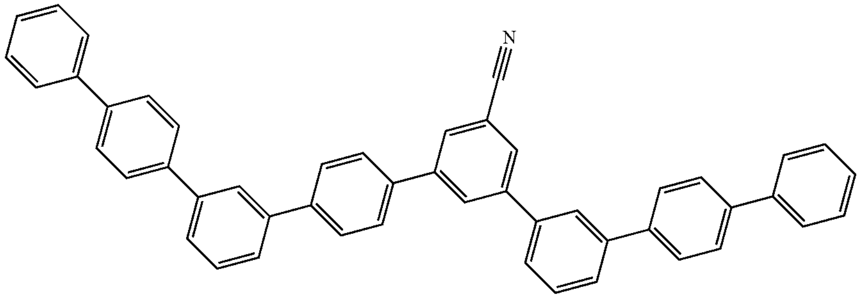
,
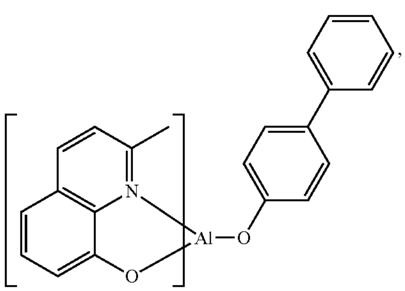
,
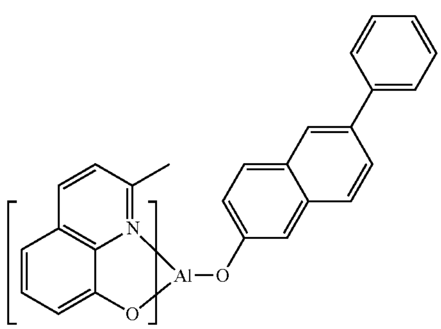
,
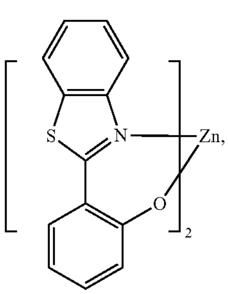
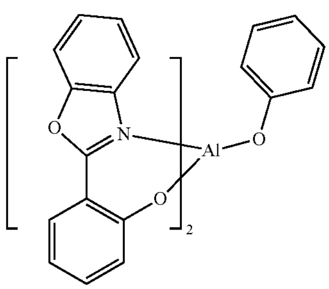
,
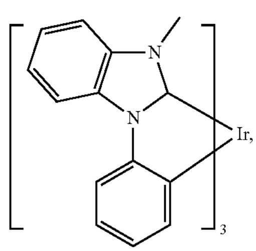

-continued

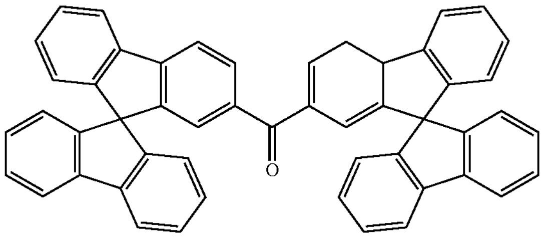

,

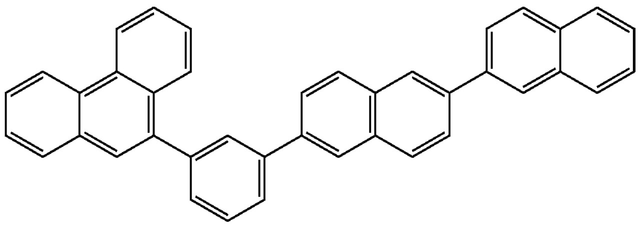

,

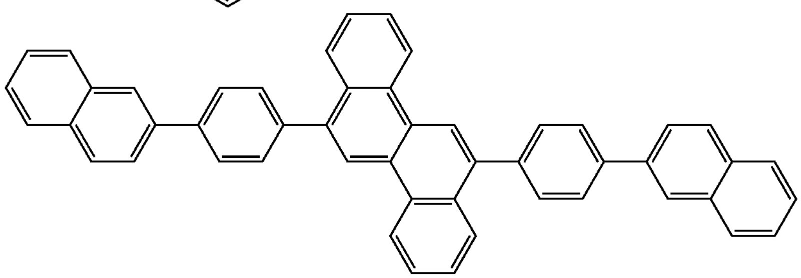

, and

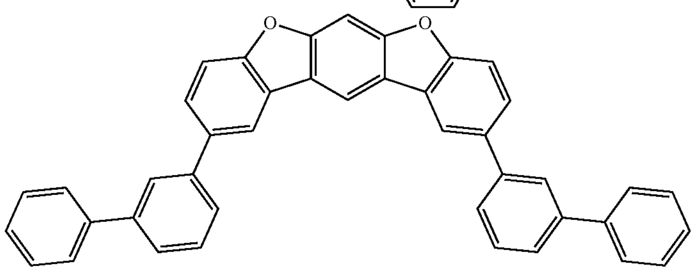

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.
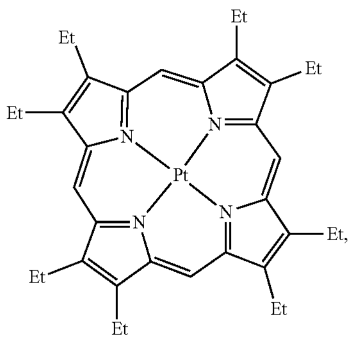
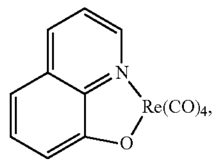
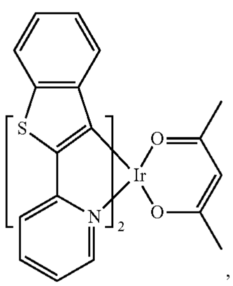
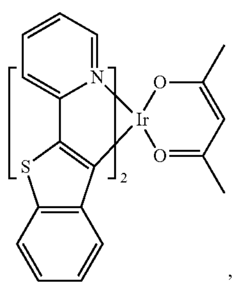
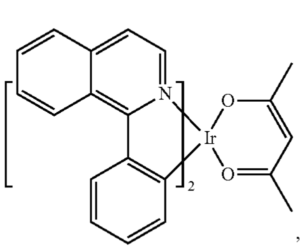
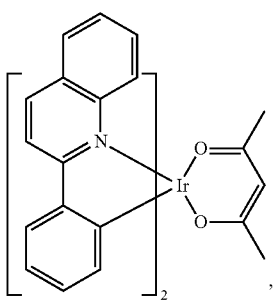
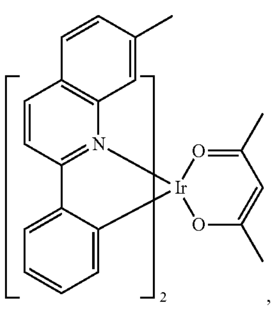
-continued
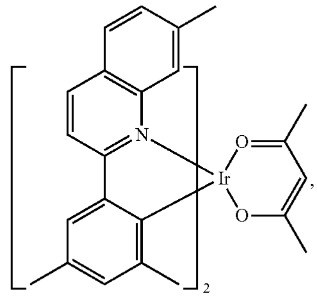
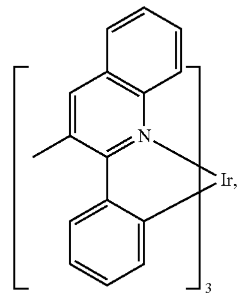
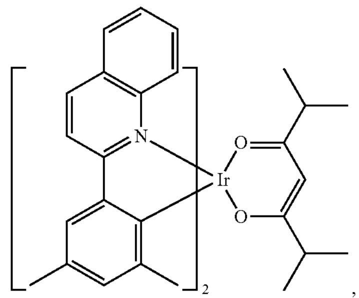
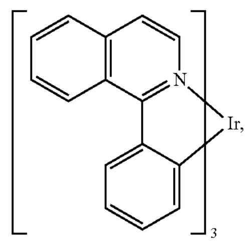
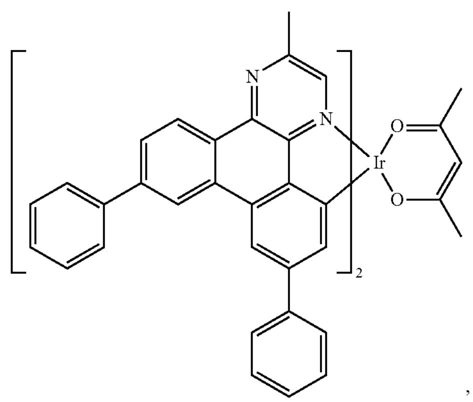
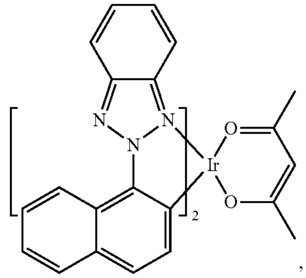
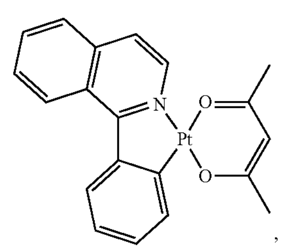

-continued
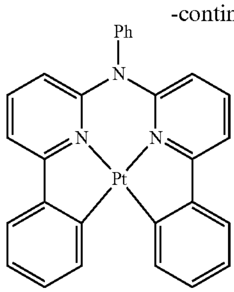
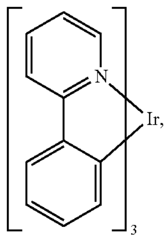
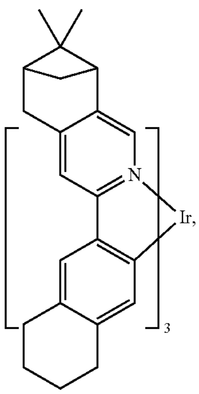
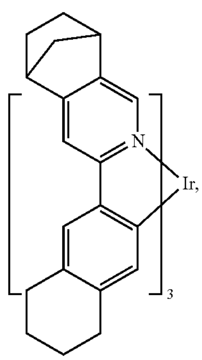
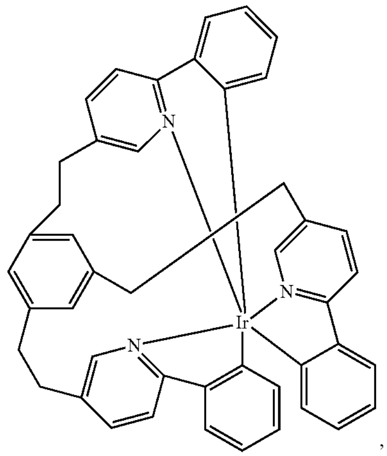
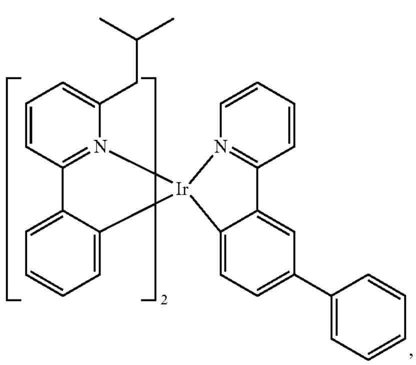
-continued
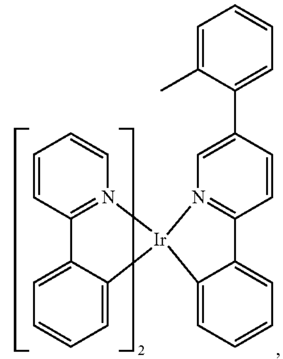
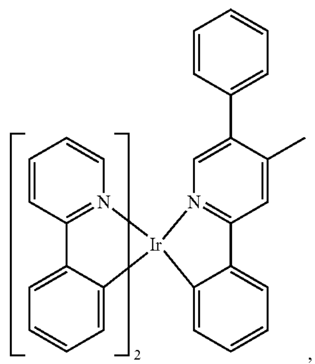
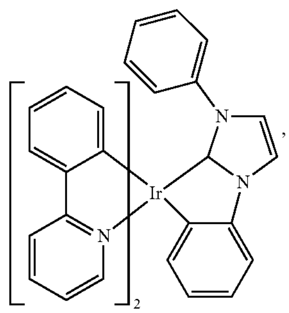
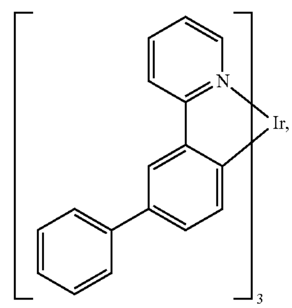
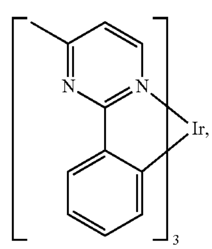
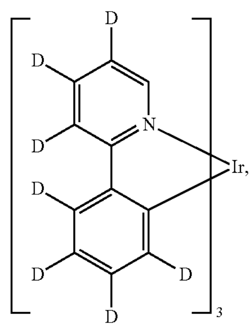
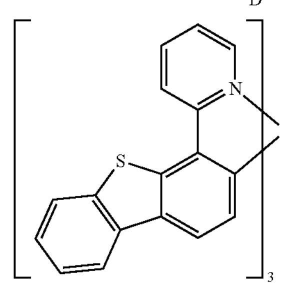

-continued
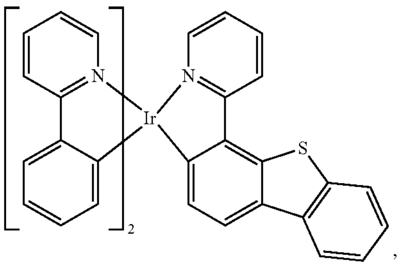
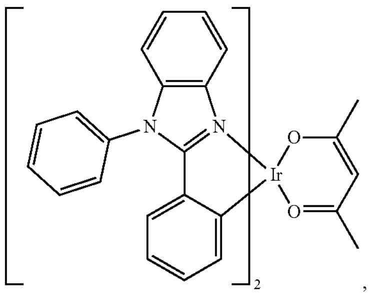
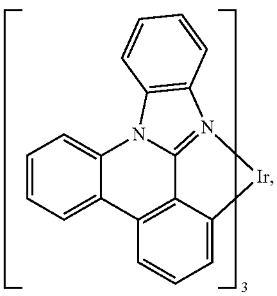
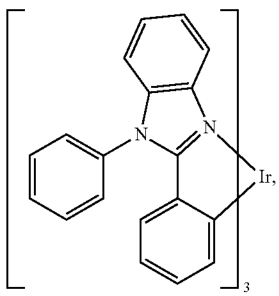
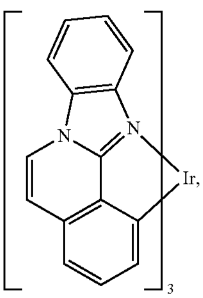
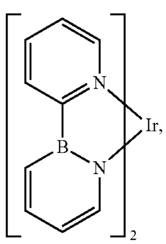
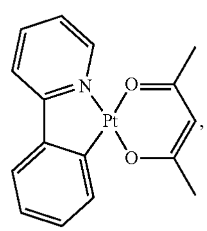
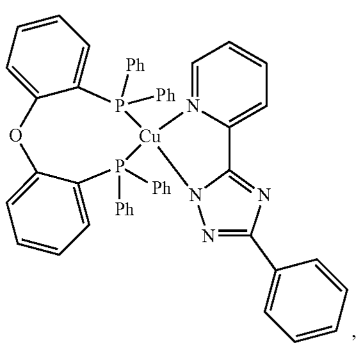
-continued
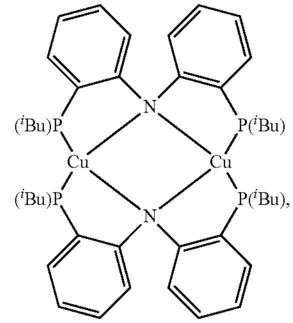
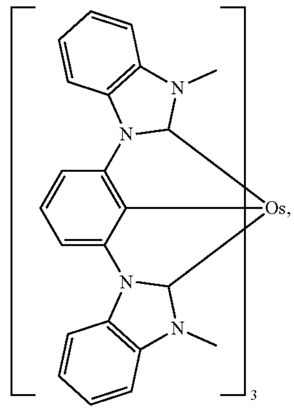
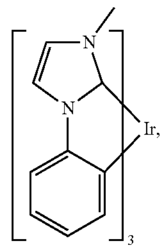
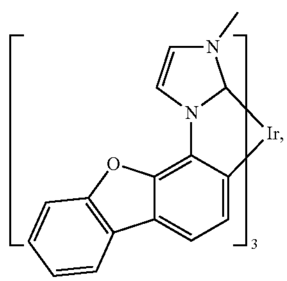
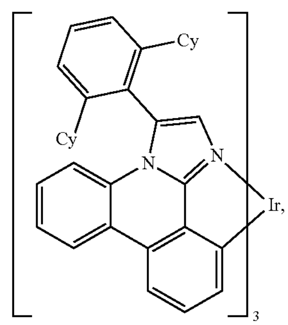
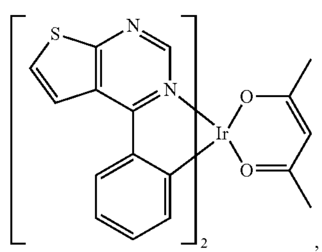
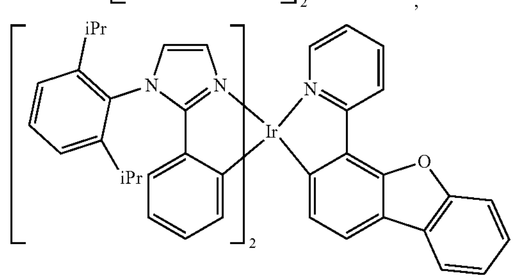

-continued
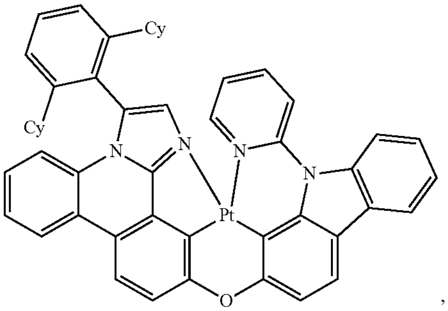
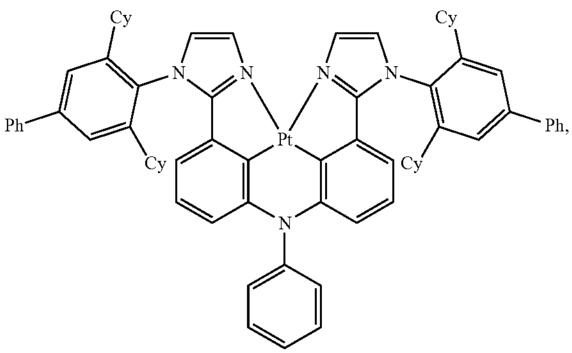
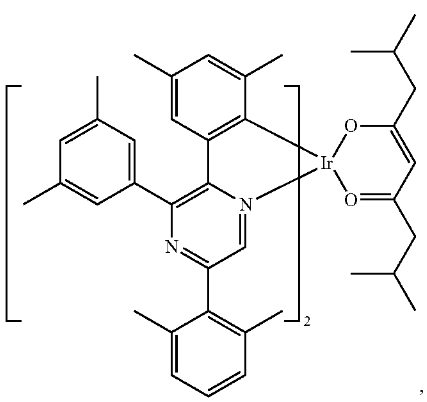
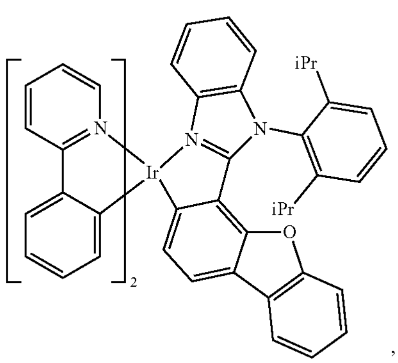
-continued
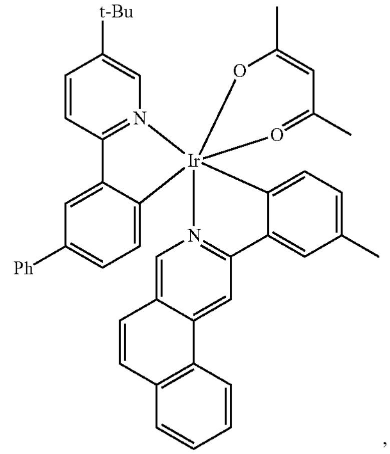
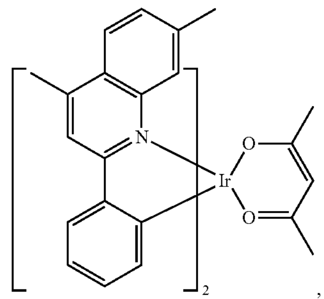
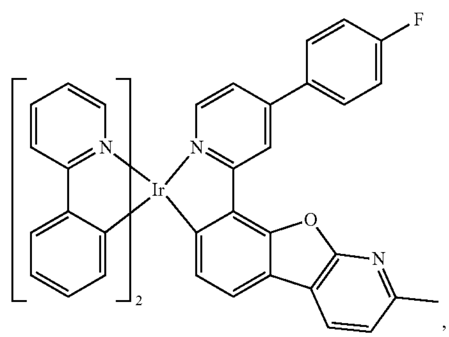
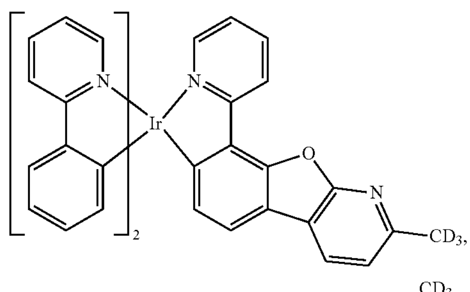
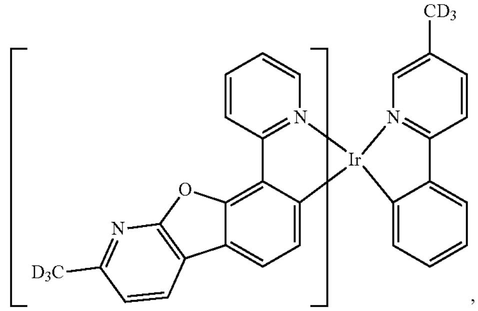

-continued
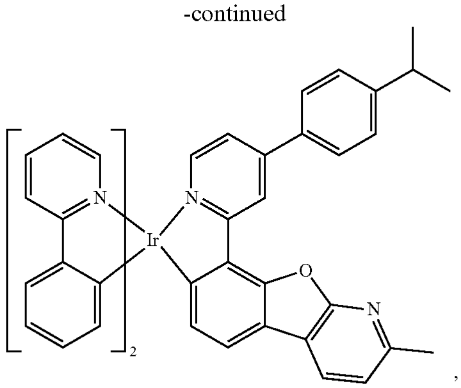
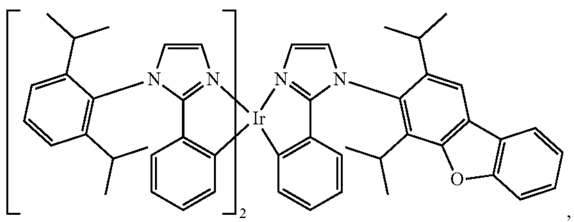
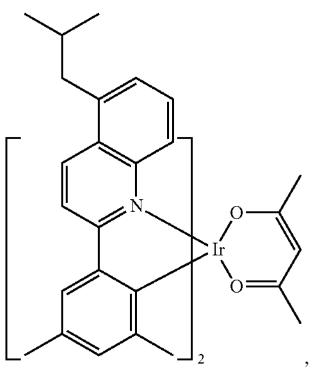
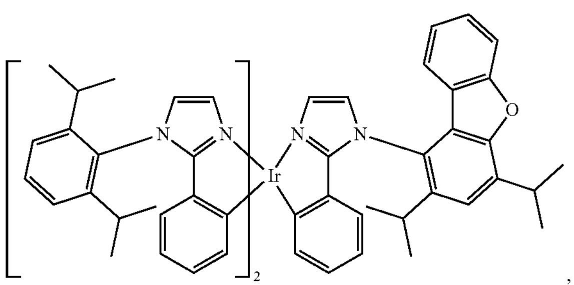
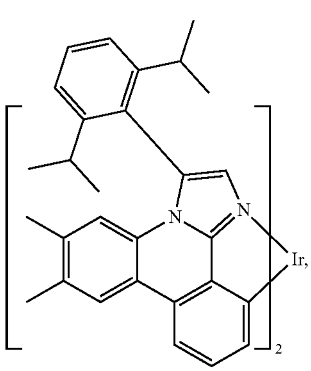
-continued
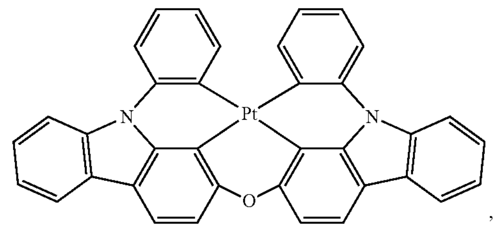
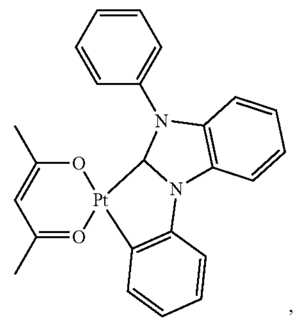
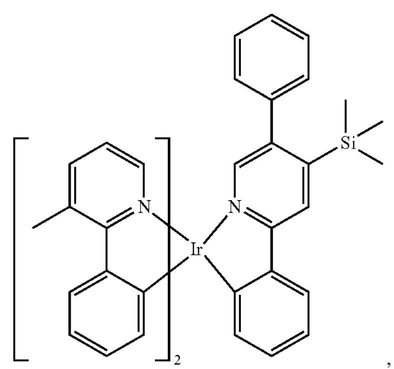
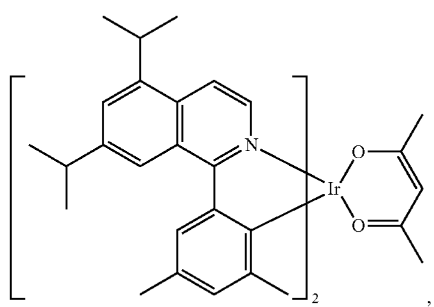
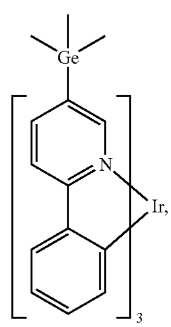
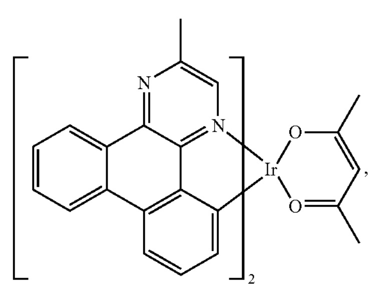

-continued
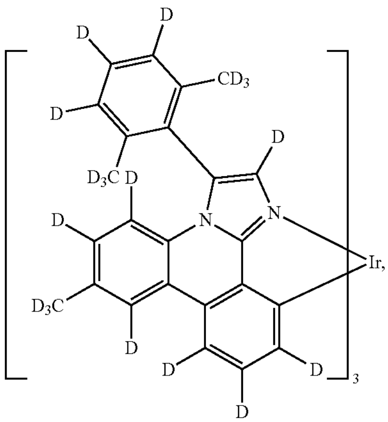
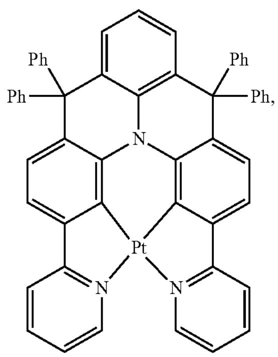
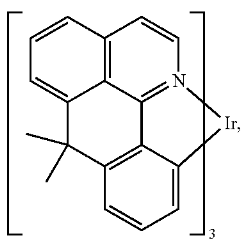
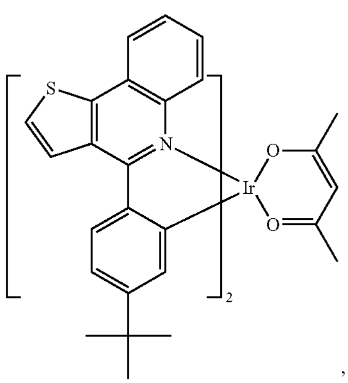
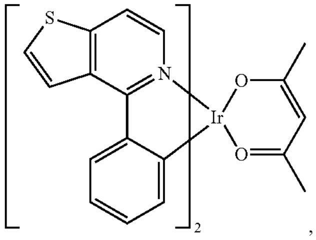
-continued
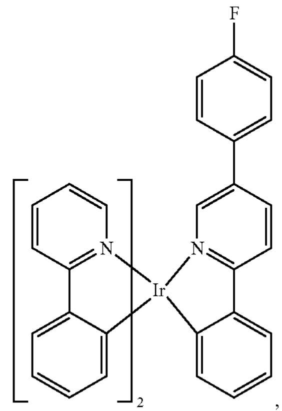
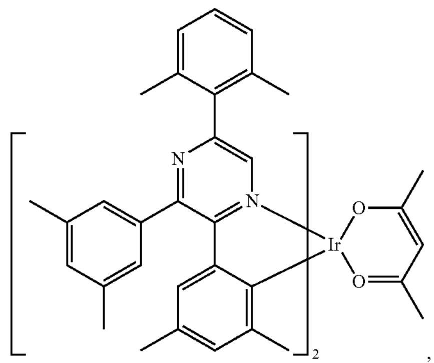
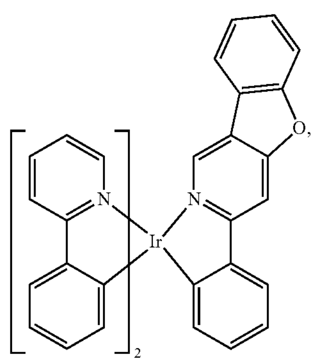
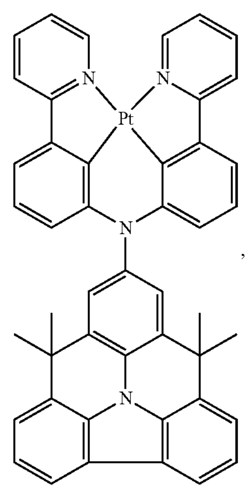
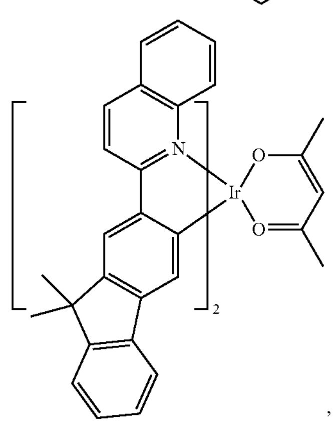

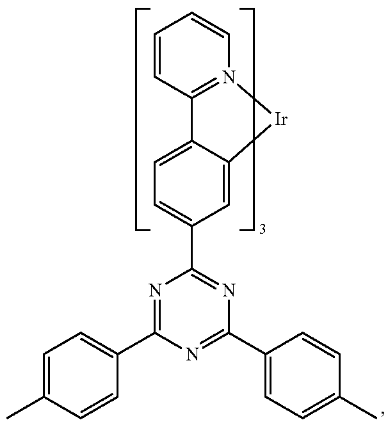
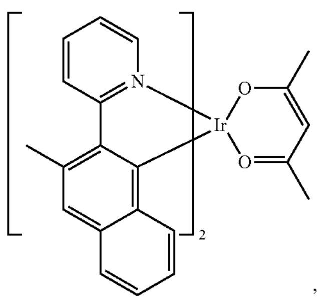
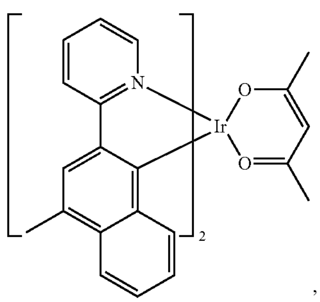
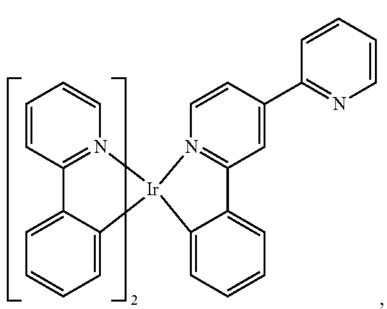
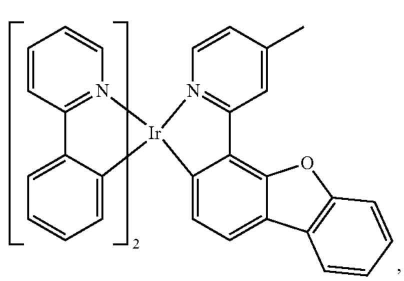
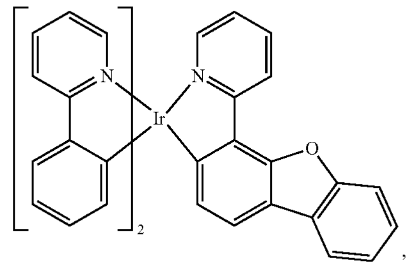
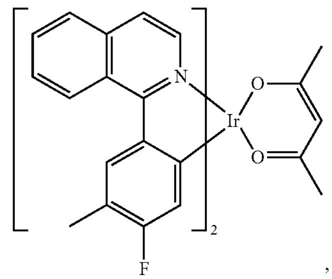
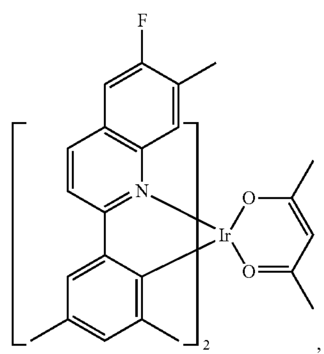
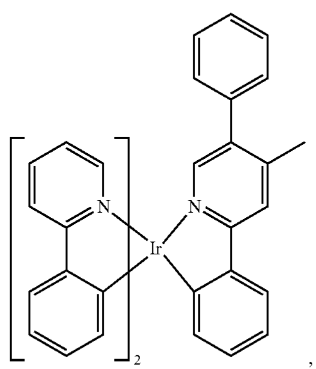
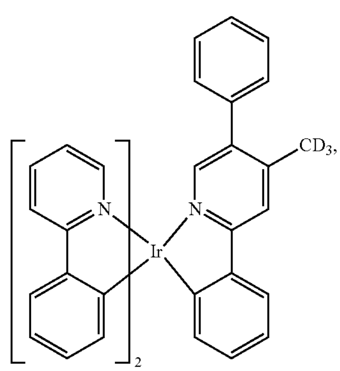
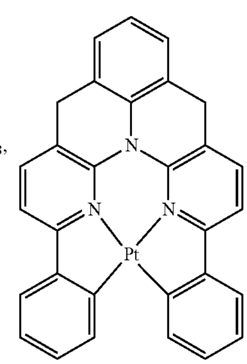

-continued
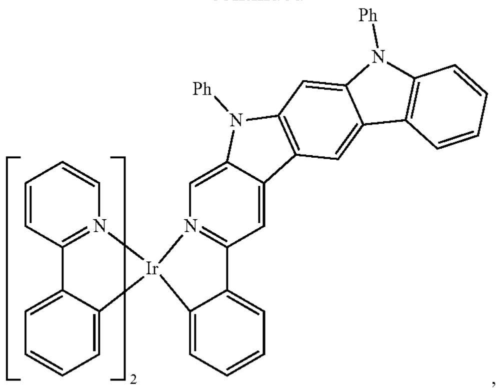
,
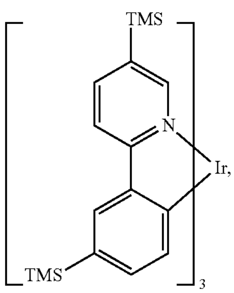
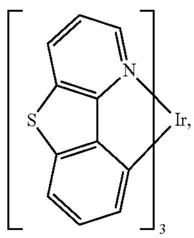
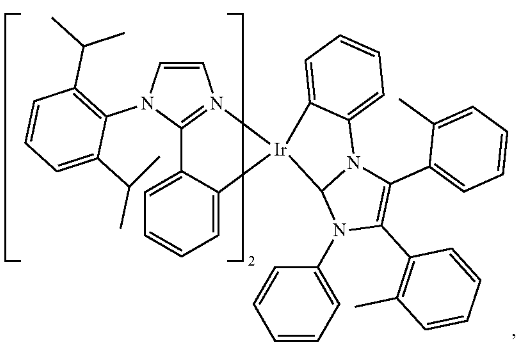
,
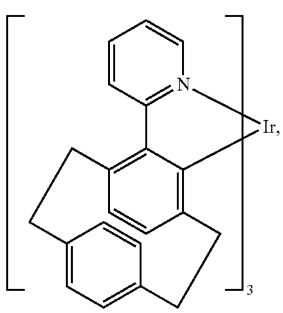
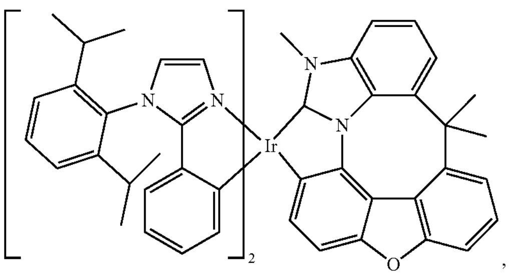
,
-continued
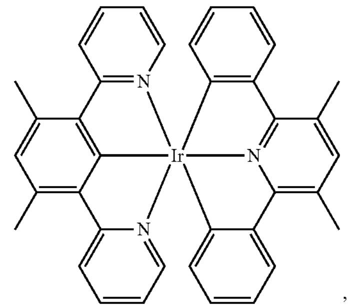
,
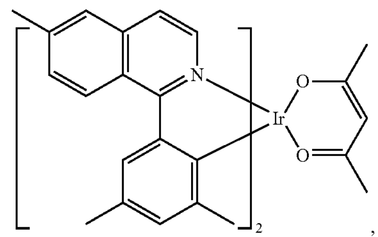
,
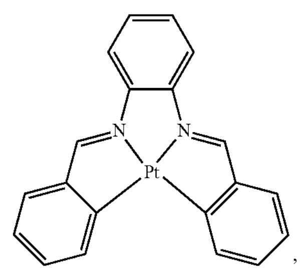
,
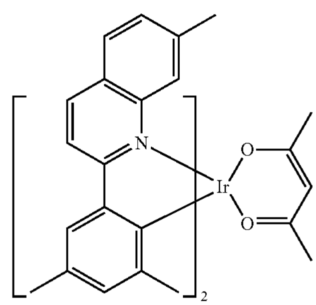
,
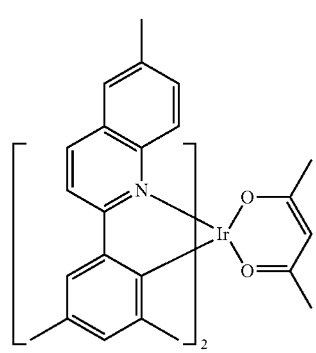
, -continued
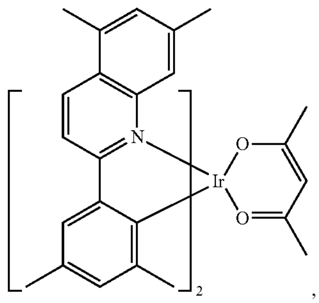
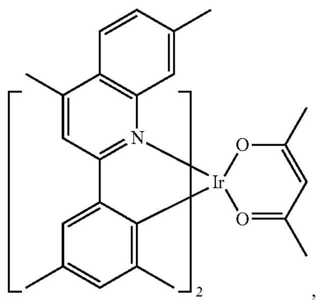
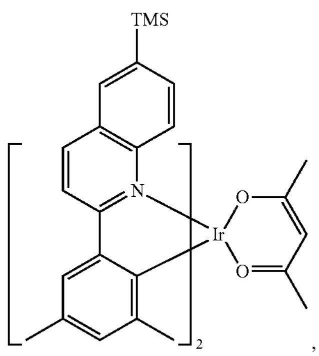
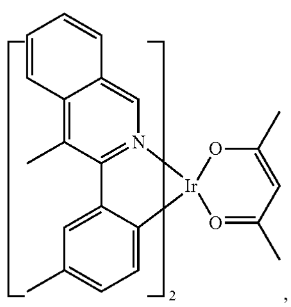
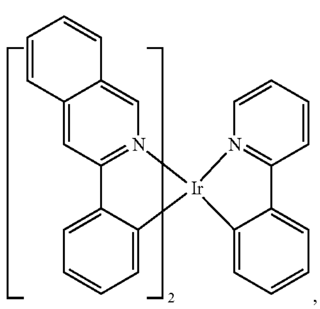
-continued
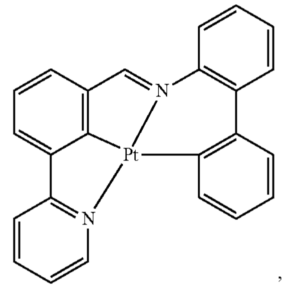
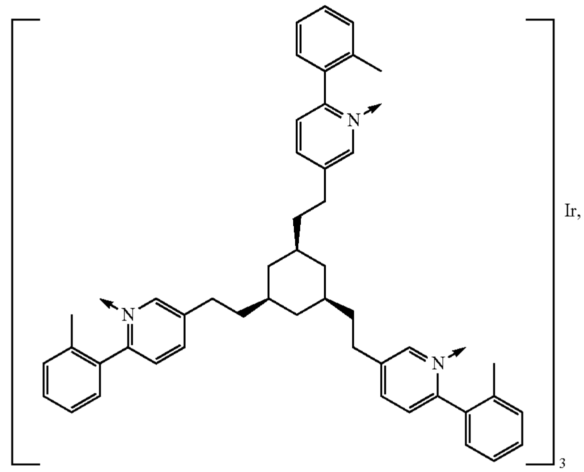
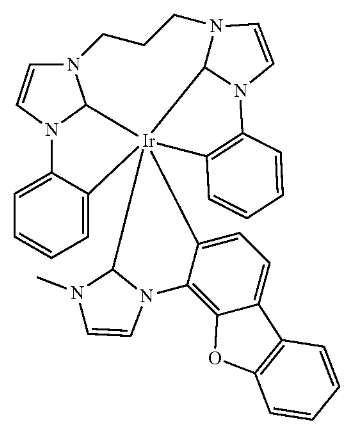
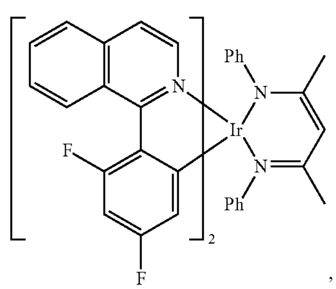

-continued
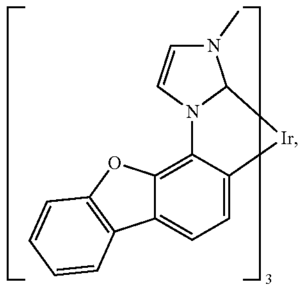
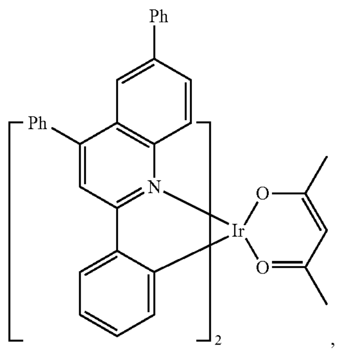
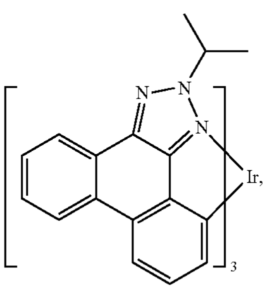
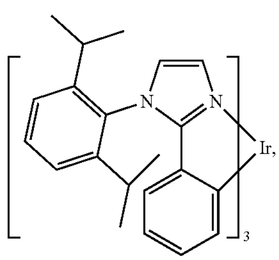
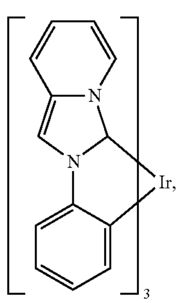
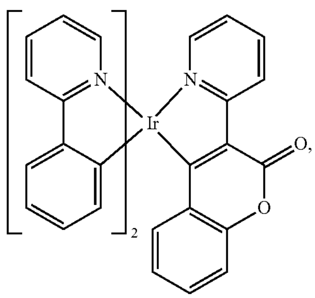
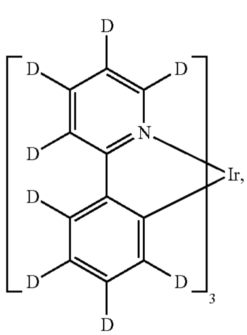
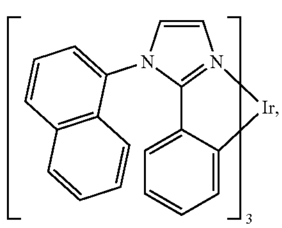
-continued
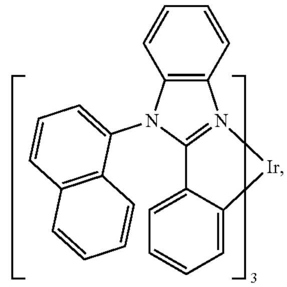
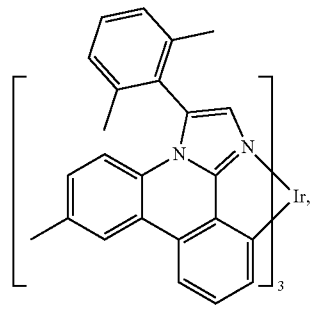
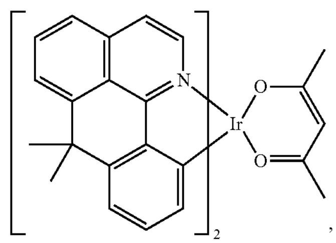
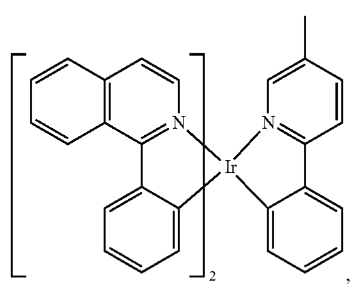
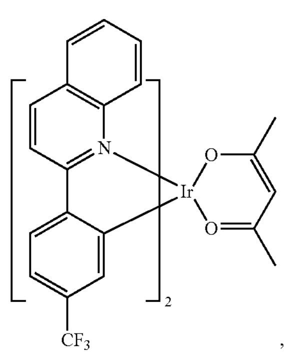

-continued

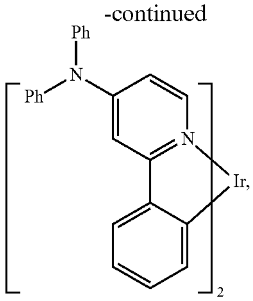

and

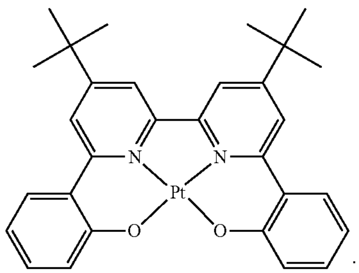

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

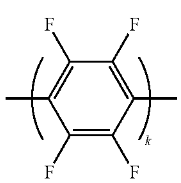
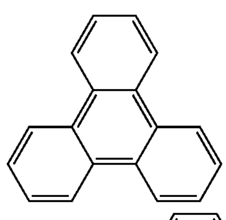
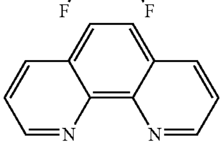
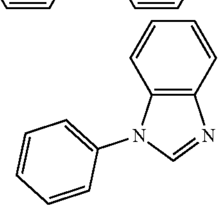
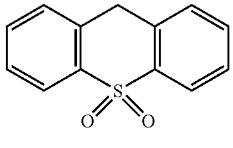
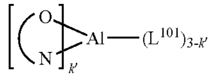

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

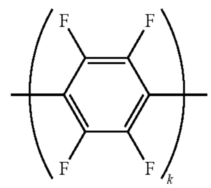
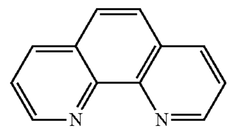
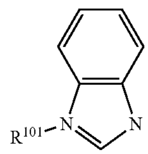
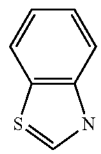
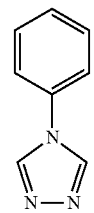
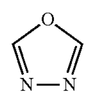
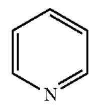
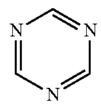
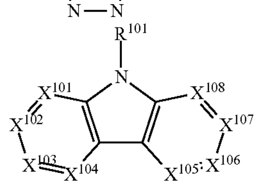
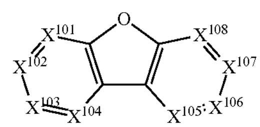
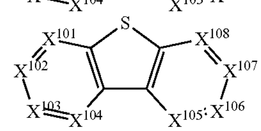
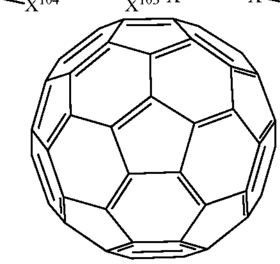
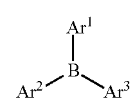

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

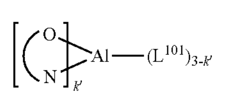
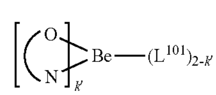

-continued

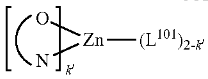

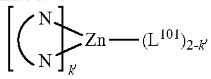

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

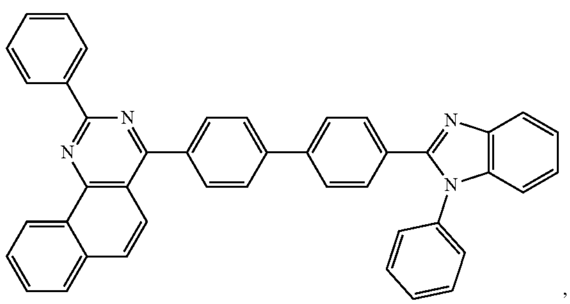

,

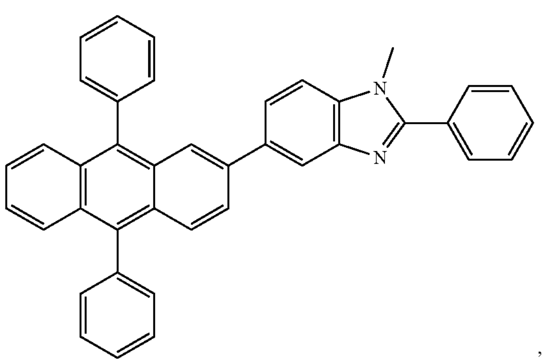

,

-continued

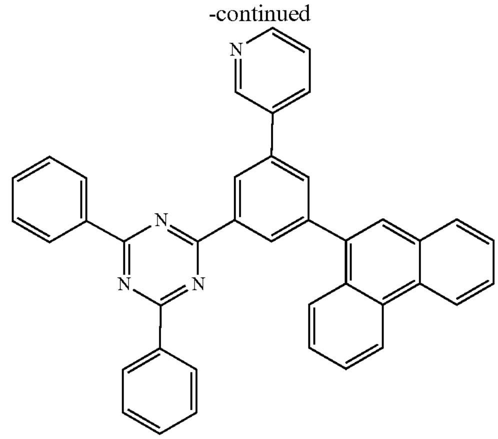

,

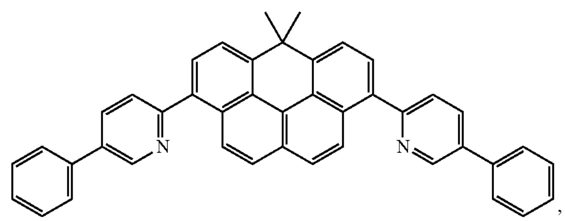

,

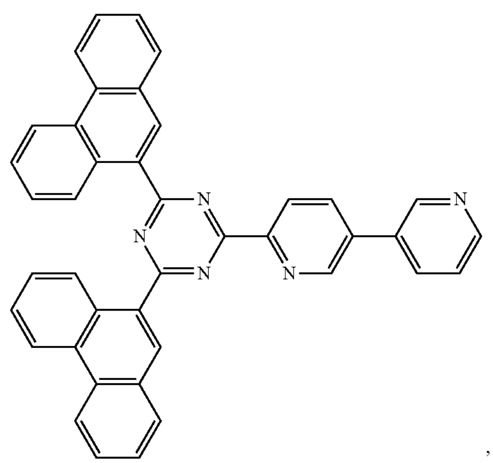

,

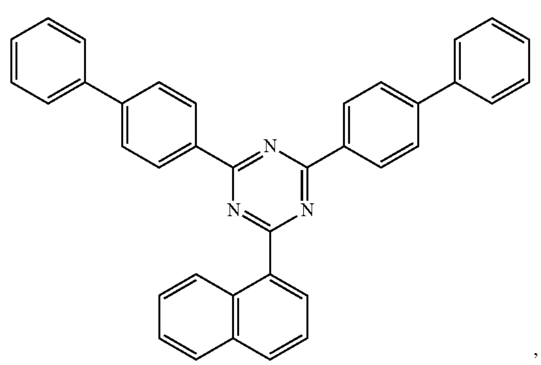

,

-continued
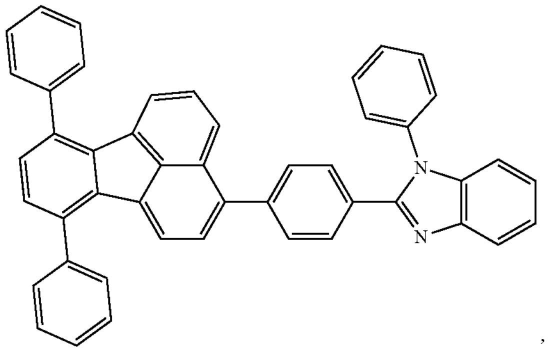
,
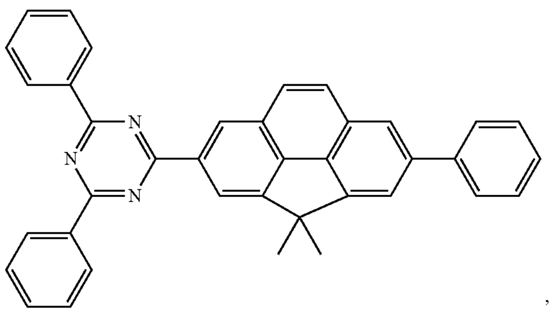
,
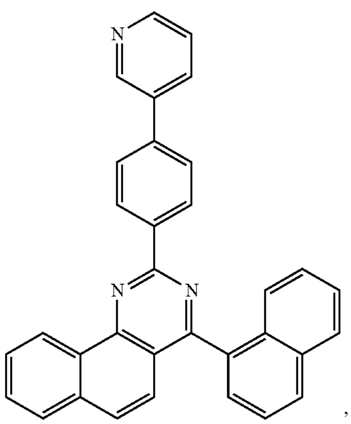
,
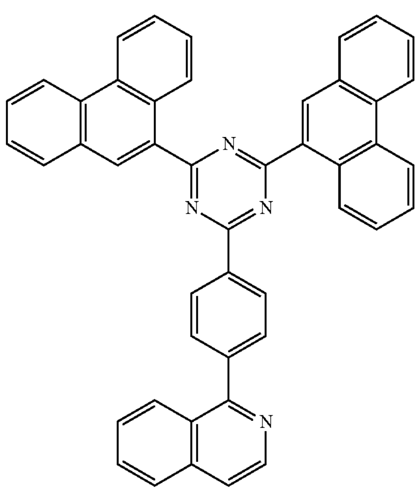
,
-continued
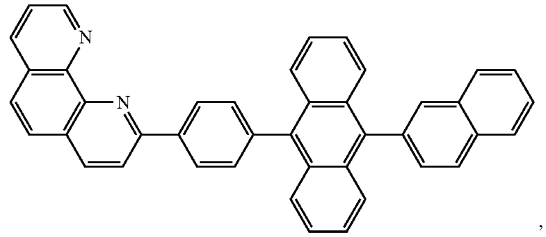
,
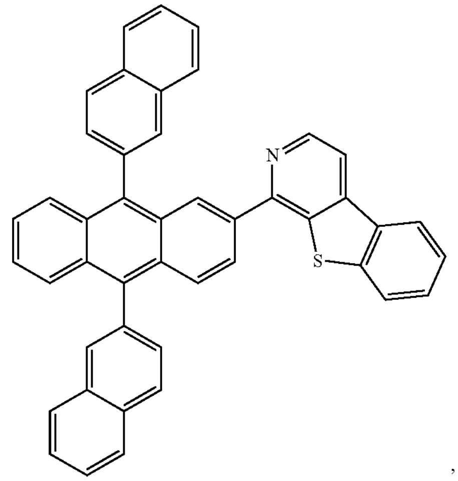
,
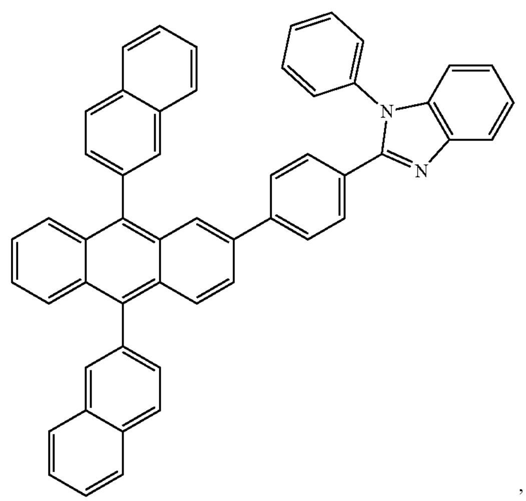
,
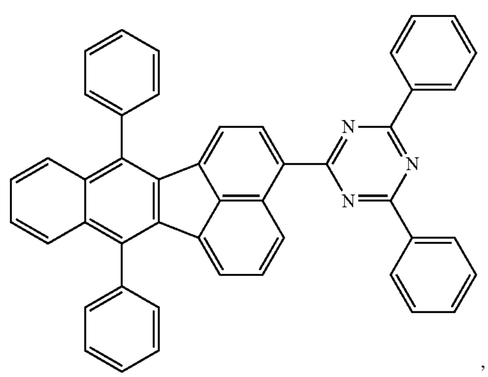
, -continued
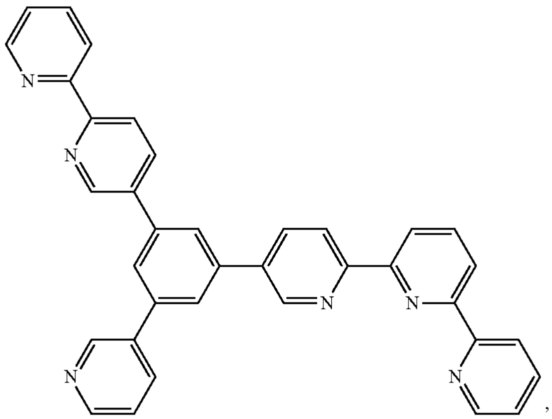
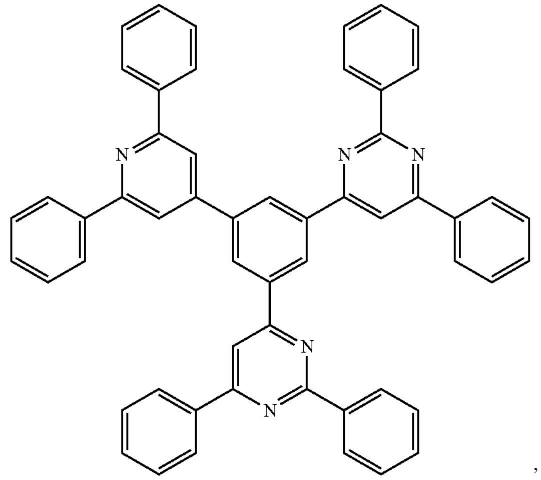
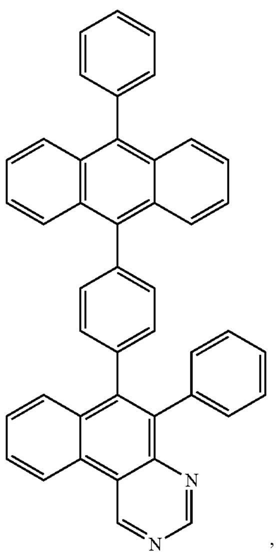
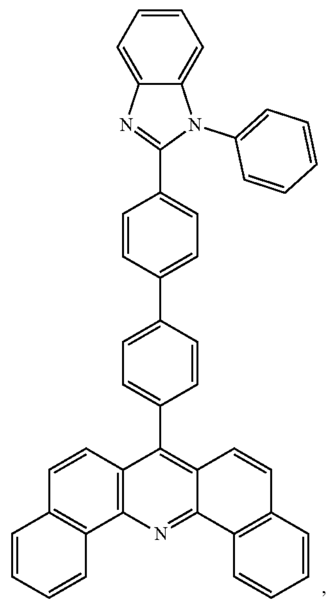
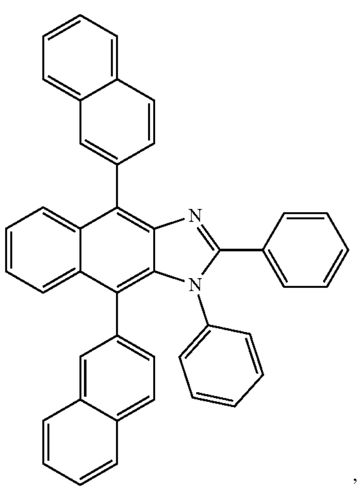
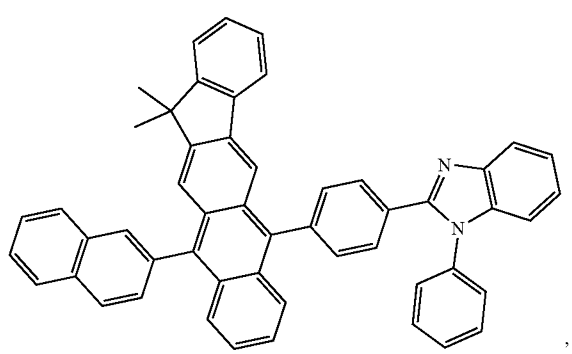

-continued
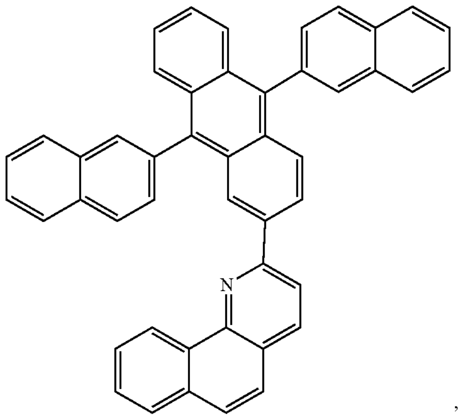
,
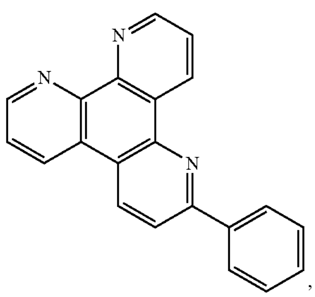
,
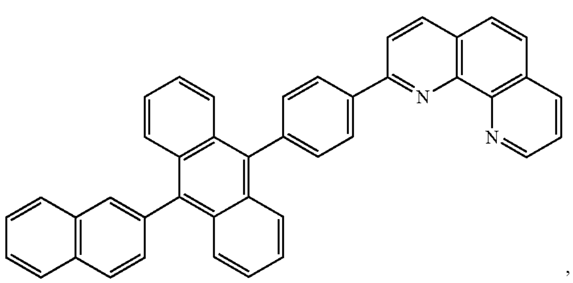
,
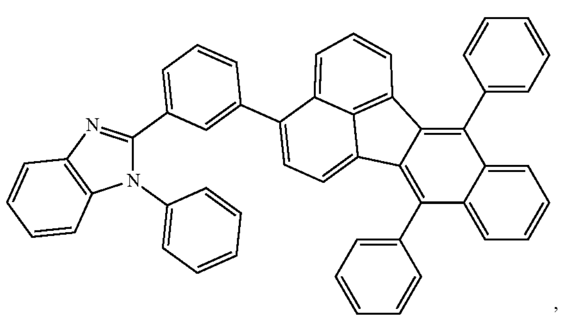
,
-continued
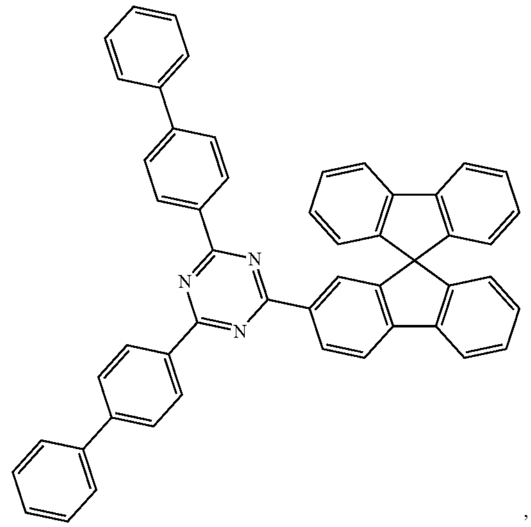
,
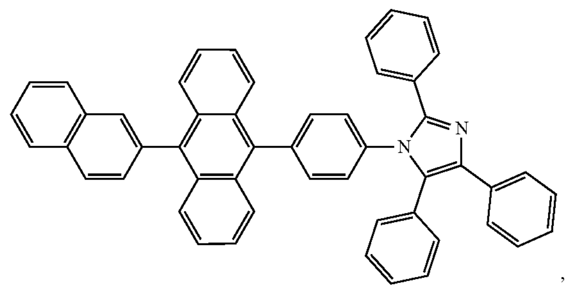
,
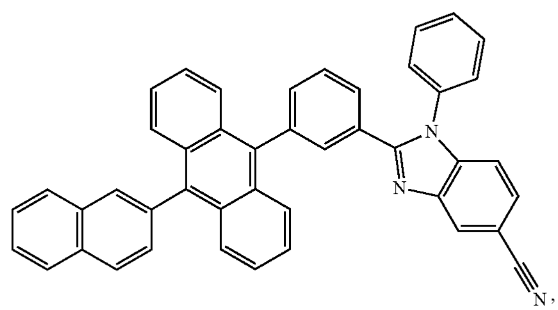
,
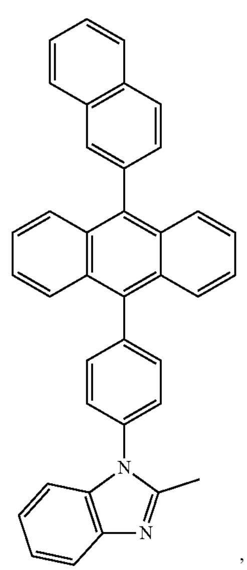
, -continued

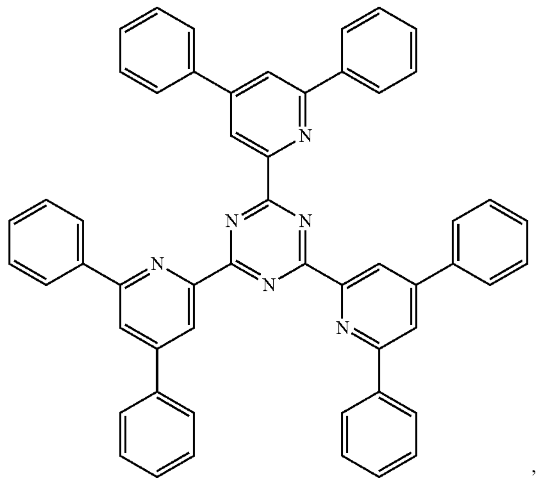

,

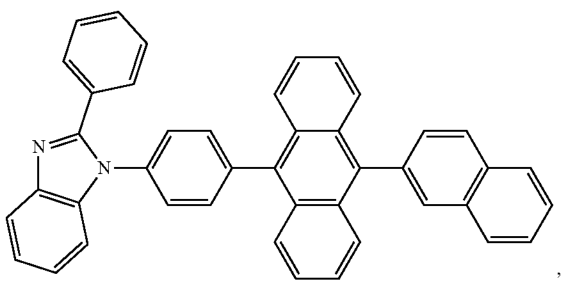

,

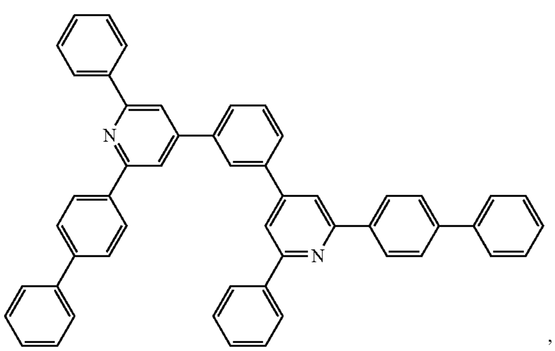

,

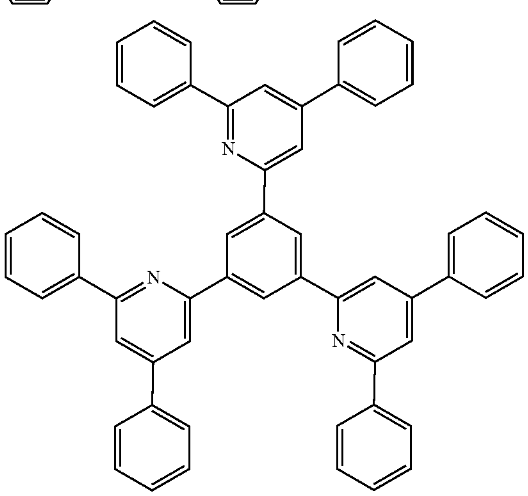

,

-continued

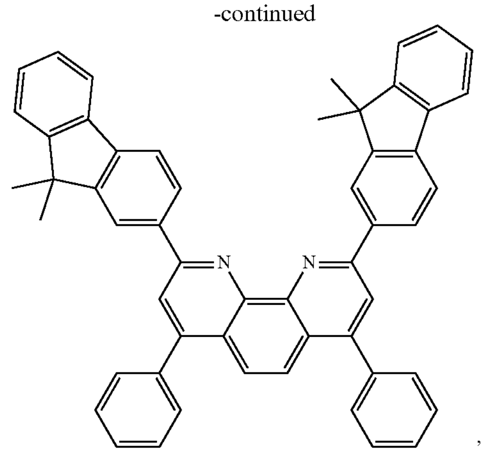

, and

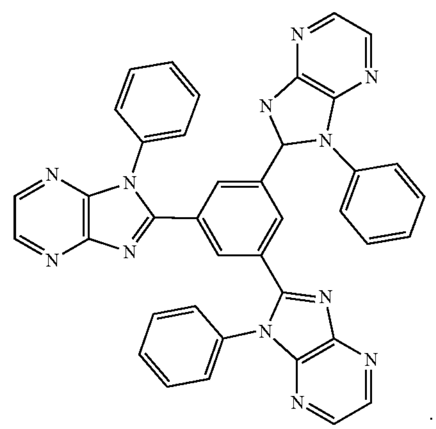

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTALS

Synthesis of the Inventive Example Compound 1 with Formula of $Ir(L_{A66-1})_2L_{C17}$ Scheme

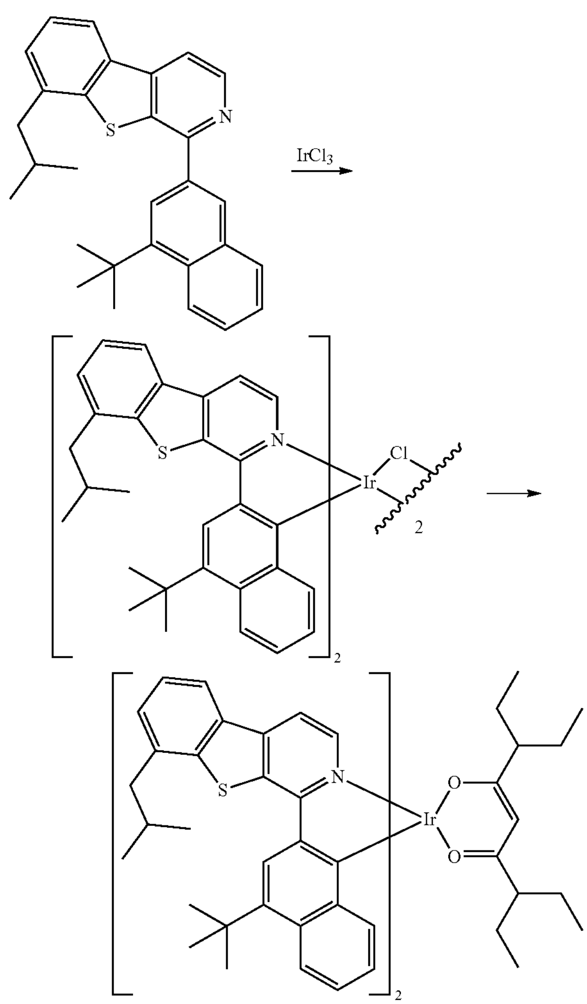

Inventive Example 1
Ir(LA66-1)2LC17

Solution of 1-(4-(tert-butyl)naphthalen-2-yl)-8-isobutyl-benzo[4,5]thieno[2,3-c]pyri-dine (8.43 g, 19.9 mmol, 2.1 equiv) in 2-ethoxyethanol (125 mL) and deionized ultra-filtered (DIUF) water (80 mL) was sparged with nitrogen for 10 minutes. Iridium chloride(III) hydrate (3.019 g, 9.54 mmol, 1.0 equiv) was added and the reaction mixture heated at 95° C. for 18 hours. The solution was cooled to 50° C., the solids were filtered, washed with DIUF water (125 mL) and methanol (125 mL) then air-dried to give solvent wet di-μ-chloro-tetrakis-[(1-(4-(tert-butyl)naphthalen-2-yl)-1'-yl)-8-iso-butylbenzo[4,5]thieno[2,3-c]pyridin-6-yl] diiridium(III).

Next, to a solution of di-μ-chloro-tetrakis-[(1-(4-(tert-butyl)naphthalen-2-yl)-1'-yl)-8-isobutylbenzo[4,5]thieno[2,3-c]pyridin-6-yl]iridium(III) (10.23 g, 4.77 mmol, 1.0 equiv) in 2-ethoxyethanol (150 mL) was added, via syringe, 3,7-di-ethylnonane-4,6-dione (5.516 g, 26.0 mmol, 5.45 equiv) and the reaction mixture sparged with nitrogen for 15 minutes. Powdered potassium carbonate (5.317 g, 38.5 mmol, 8.07 equiv) was added and the reaction mixture stirred at room temperature for 72 hours. DIUF water (150 mL) was added and the mixture stirred for 30 minutes. The suspension was filtered, the solid washed with DIUF water (250 mL) and methanol (200 mL) then air-dried. The crude red solid (16.6 g) was chromatographed on silica gel (843 g) layered with basic alumina (468 g), eluting with 40% dichloromethane in hexanes to give bis[(1-(4-(tert-butyl) naphthalen-2-yl)-1'-yl)-8-isobutylbenzo[4,5]thieno[2,3-c] pyridin-2-yl]-(3,7-diethylnonane-4,6-dionato-$k_2$O,O') iridium(III).

Synthesis of Inventive Example Compound 2

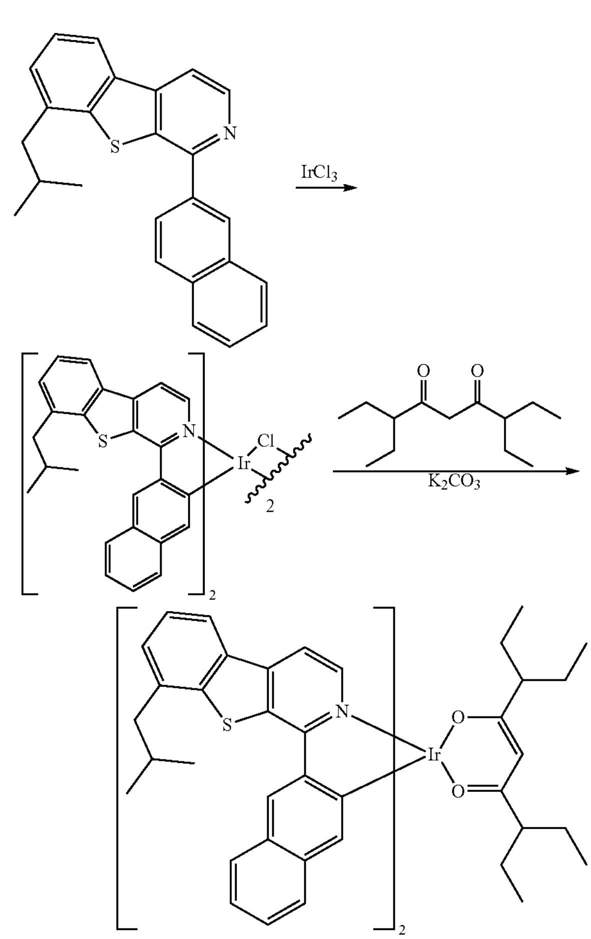

Inventive example 2

8-Isobutyl-1-(naphthalen-2-yl)benzo[4,5]thieno[2,3-c]pyri-dine (2.40 g, 6.53 mmol, 2.2 equiv) and iridium(III) chloride tetrahydrate (1.1 g, 2.97 mmol, 1.0 equiv) were charged to 40 mL reaction vial. 2-Ethoxyethanol (15 mL) and DIUF water (5 mL) were added and the reaction mixture stirred at 90° C. for about 60 hours. $^1$H-NMR analysis indicated complete consumption of the starting ligand. The mixture was cooled to room temperature and diluted with DIUF water (5 mL). The solids were filtered and washed with methanol (20 mL) to give di-μ-chloro-tetrakis[1-(naphthalen-2-yl)-3'-yl)-8-isobutyl-benzo[4,5]thieno[2,3-c]pyridin-2-yl)]-diiridium(III) (1.42 g, 52% yield) as an orange solid.

A mixture of 3,7-diethylnonane-4,6-dione (1.180 g, 5.56 mmol, 8 equiv), crude di-μ-chloro-tetrakis[1-(naphthalen yl)-3'-yl)-8-isobutyl-benzo[4,5]thieno[2,3-c]pyridin-2-yl)]-diiridium(III) (1.39 g, 0.722 mmol, 1.0 equiv), dichloromethane (1 mL) and methanol (25 mL) were charged to a 40 mL vial. Powdered potassium carbonate (1.152 g, 8.34 mmol, 12 equiv) was added and the mixture sparged with nitrogen for 5 minutes. After heating at 45° C. overnight, the reaction was cooled to room temperature and diluted with DIUF water (50 mL). After stirring for 10 minutes, the red-orange solid was filtered, washed with water (20 mL), then methanol (100 mL) and dried under vacuum, The solid was dissolved in dichloromethane (200 mL) and thy-loaded onto Celite (50 g). The product was chromatographed on basic alumina to afford bis[(1-(naphthalen-2-yl)-3'-yl)-8-isobutyl-benzo[4,5]thieno[2,3-c]pyridin-2-yl)]-(3,7-diethyl-4,6-nonanedionato-κ$_2$O,O') iridium(III) (0.705 g, 97.2% purity, 43% yield) as a red-orange solid.

Synthesis of Comparative Example 1 Compound

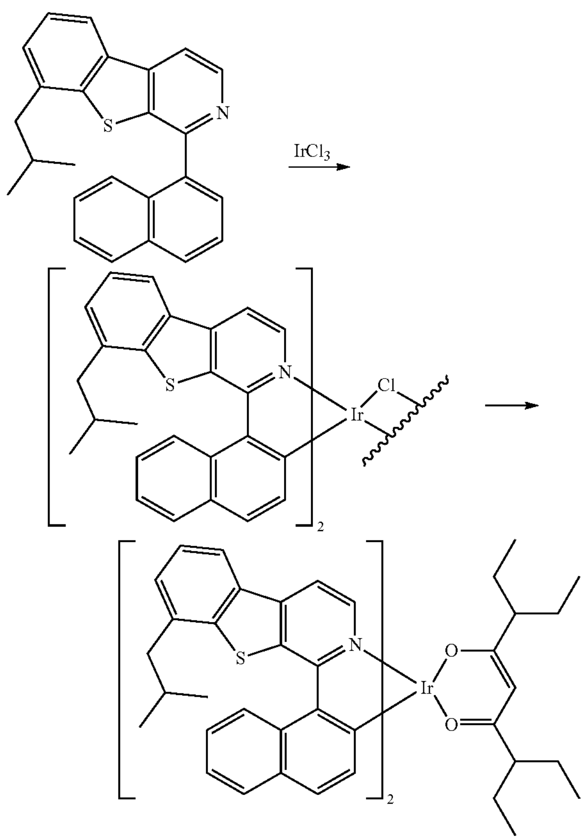

Comparative example 1

A suspension of 8-isobutyl-1-(naphthalen-1-yl)benzo[4,5]thieno[2,3-c]pyridine (1.695 g, 4.61 mmol, 2.0 equiv) in 2-ethoxyethanol (12 mL) and DIUF water (4 mL) was sparged with nitrogen for 10 minutes. Iridium(III) chloride hydrate (0.73 g, 2.31 mmol, 1.0 equiv) was added, and the reaction mixture heated at 100° C. for 18 hours. The reaction was stopped and cooled to room temperature. The resulting red solid was filtered and washed with methanol (3×5 mL) to give the crude presumed intermediate di-μ-chloro-tetrakis

[1-(naphthalen-1-yl)-2'-yl)-8-isobutyl-benzo[4,5]thieno[2,3-c]pyridin-1-yl)]-diiridium(III) (est. 1.153 mmol, wet) as a red solid.

Next, crude di-μ-chloro-tetrakis[1-(naphthalen-1-yl)-2'-yl)-8-isobutyl-benzo[4,5]thieno[2,3-c]pyridin-1-yl)]-diiridium(III) (est. 1.153 mmol, 1.0 equiv) was suspended in methanol (12 mL) and dichloromethane (1 mL). 3,7-Diethylnonane-4,6-dione (0.98 g, 4.61 mmol, 4.0 equiv) and powdered potassium carbonate (0.96 g, 6.92 mmol, 6.0 equiv) were added and the reaction mixture heated at 50° C. for 2 hours to form a new red suspension. The reaction was cooled to room temperature and diluted with water (10 mL). The solid was filtered and washed with water (2×3 mL) and methanol (3×1 mL). The red solid was purified on silica gel column eluted with a gradient of 0 to 50% dichloromethane in heptanes to give bis[(1-(naphthalen-1-yl)-2'-yl)-8-isobutyl-benzo[4,5]thieno[2,3-c]pyridin-1-yl)]-(3,7-diethyl-4,6-nonanedionato-k$_2$O,O') iridium(III).

Figure 3:
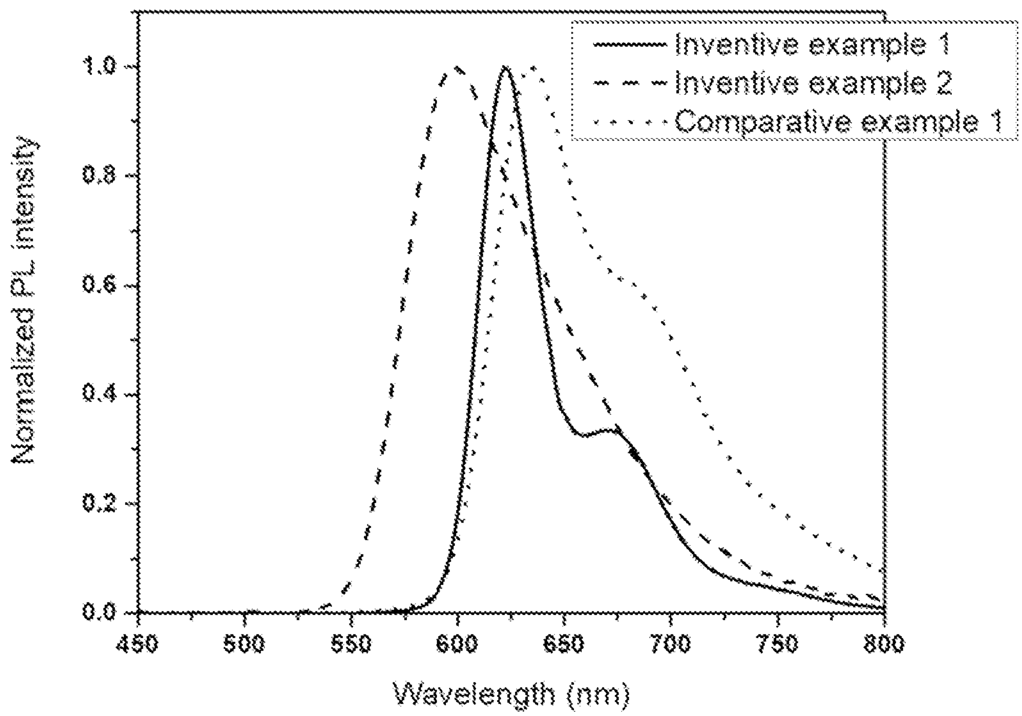
FIG. 3 is a plot of photoluminescence (PL) spectra of the Inventive Example compound 1 and 2 and the Comparative Example compound 1 taken in 2-methylTHF solution at room temperature.

A photoluminescence (PL) spectra of compounds of the Inventive Example I, Inventive Example 2, and the Comparative Example 1 were taken in 2-methylTHF solution at room temperature and the data are shown in the plot in FIG. 3. The PL intensities are normalized to the maximum of the first emission peaks. Both the Inventive Example 1 and the Comparative Example 1 show saturated red color. Compared to the Comparative Example 1, the Inventive Example 1 shows much narrower emission. It can be seen that the intensity of the second PL peak of the Inventive Example 1 is lower than that of the Comparative Example 1. The saturated emission color, narrower emission spectrum, more specifically the lower contribution from the second emission peak offers improved device performance, such as high electroluminescence efficiency and lower power consumption.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound comprising a ligand $L_A$ of Formula I:

Formula I

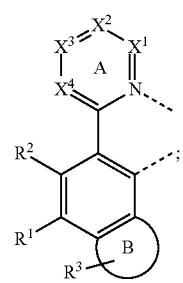

wherein Ring B represents a five- or six-membered aromatic ring;

wherein $R^3$ represents from none to the maximum number of substitutions;

wherein $X^1$, $X^2$, $X^3$, and $X^4$ are each independently a CR or N;

wherein at least two adjacent ones of $X^1$, $X^2$, $X^3$, and $X^4$ are CR and fused into a five-membered aromatic ring;

wherein $R^1$ is $CR^{11}R^{12}R^{13}$ or joined with $R^2$ to form into a ring;

wherein R, $R^1$, $R^2$, $R^3$, $R^{11}$, $R^{12}$, and $R^{13}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein any two substituents among R, $R^1$, $R^2$, and $R^3$, are optionally joined to form into an aromatic ring;

wherein two substituents among $R^{11}$, $R^{12}$, and $R^{13}$ are optionally joined to form into a ring;

wherein $L_A$ is coordinated to a metal M;

wherein $L_A$ is optionally linked with other ligands to comprise a tridentate, tetradentate, pentadentate, or hexadentate ligand; and wherein M is optionally coordinated to other ligands.

2. The compound of claim 1, wherein M is selected from the group consisting of Ir, Rh, Re, Ru, Os, Pt, Au, and Cu.

3. The compound of claim 1, wherein M is Ir or Pt.

4. The compound of claim 1, wherein two of $R^{11}$, $R^{12}$, and $R^{13}$ are joined to form a ring; or at least two of $R^{11}$, $R^{12}$, and $R^{13}$ are each independently selected from the group consisting of alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, partially or fully deuterated variants thereof partially or fully fluorinated variants thereof, and combinations thereof.

5. The compound of claim 1, wherein $R^1$ is tert-butyl or substituted tert-butyl.

6. The compound of claim 1, wherein Ring B is phenyl.

7. The compound of claim 1, wherein the ligand $L_A$ is selected from the group consisting of:

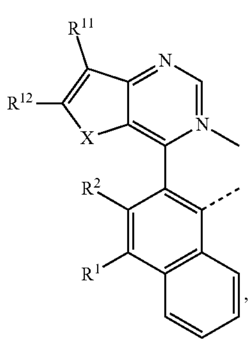

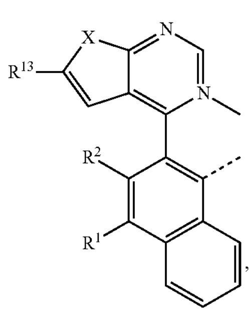

-continued

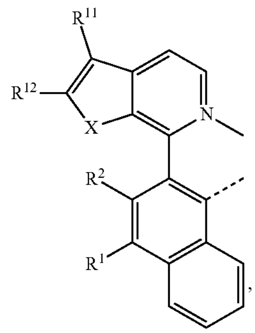

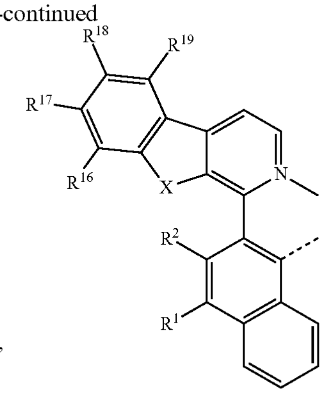

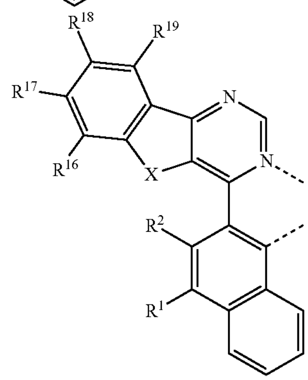

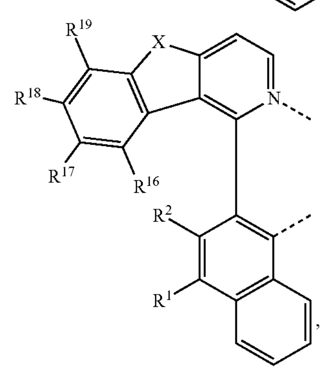

and

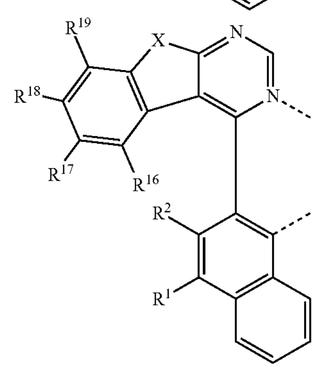

wherein X is O or S;

wherein $R^1$, $R^2$, $R^4$, $R^5$, $R^6$, $R^7$, $R^8$, $R^9$, $R^{10}$, $R^{11}$, $R^{12}$, $R^{13}$, $R^{14}$, $R^{15}$, $R^{16}$, $R^{17}$, $R^{18}$, and $R^{19}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein any two substituents are optionally joined to form into a ring.

8. The compound of claim 1, wherein the ligand $L_A$ is selected from the group consisting of:

ligands XVIII-$L_{Ai-O}$ that are based on a structure of Formula XVIII

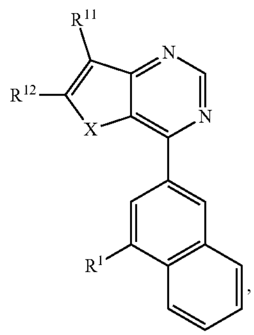

where X is O, and ligands XVIII-$L_{Ai-S}$ that are based on a structure of Formula XVIII, where X is S;

ligands XIX-$L_{Ai-O}$ that are based on a structure of Formula XIX

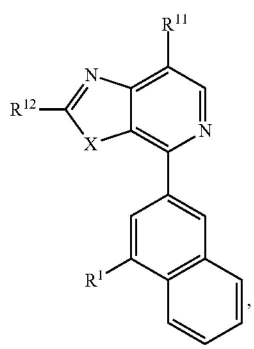

where X is O, and ligands XIX-$L_{Ai-S}$ that are based on a structure of Formula XIX, where X is S;

ligands XX-$L_{Ai-O}$ that are based on a structure of Formula XX

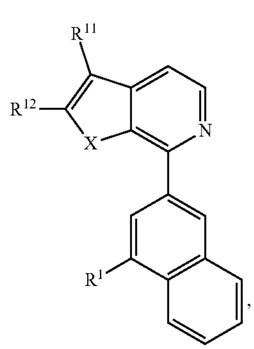

where X is O, and ligands XX-$L_{Ai-S}$ that are based on a structure of Formula XX, where X is S;

ligands XXI-$L_{Ai-O}$ that are based on a structure of Formula XXI

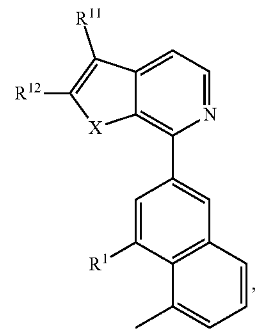

where X is O, and ligands XXI-$L_{Ai-S}$ that are based on a structure of Formula XXI, where X is S;

ligands XXII-$L_{Ai-O}$ that are based on a structure of Formula XXII

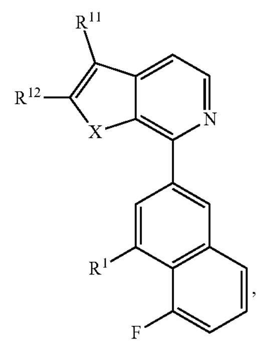

where X is O, and ligands XXII-$L_{Ai-S}$ that are based on a structure of Formula XXII, where X is S;

ligands XXIII-$L_{Ai-O}$ that are based on a structure of Formula XXIII

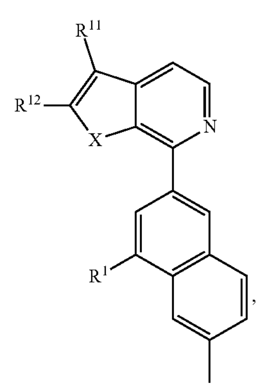

where X is O, and ligands XXIII-$L_{Ai-S}$ that are based on a structure of Formula XXIII, where X is S;

ligands XXIV-$L_{Ai-O}$ that are based on a structure of Formula XXIV

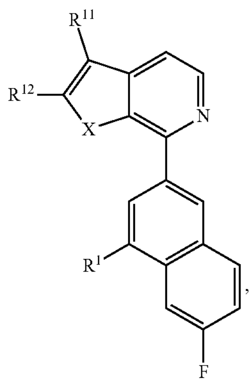

where X is O, and ligands XXIV-$L_{Ai-S}$ that are based on a structure of Formula XXIV, where X is S;

ligands XXV-$L_{Ai-O}$ that are based on a structure of Formula XXV

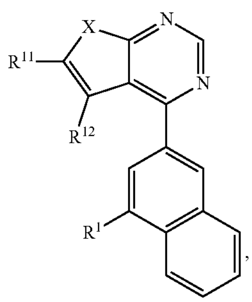

where X is O, and ligands XXV-$L_{Ai-S}$ that are based on a structure of Formula XXV, where X is S;

ligands XXVI-$L_{Ai-O}$ that are based on a structure of Formula XXVI

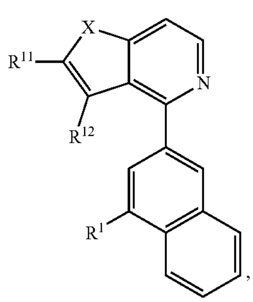

where X is O, and ligands XXVI-$L_{Ai-S}$ that are based on a structure of Formula XXVI, where X is S;

ligands XXVII-$L_{Ai-O}$ that are based on a structure of Formula XXVII

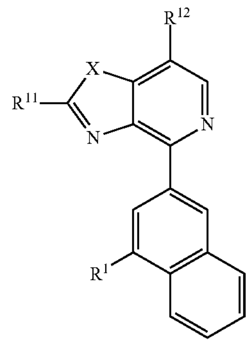

where X is O, and ligands XXVII-$L_{Ai-S}$ that are based on a structure of Formula XXVII, where X is S;

ligands XXVIII-$L_{Ai-O}$ that are based on a structure of Formula XXVII

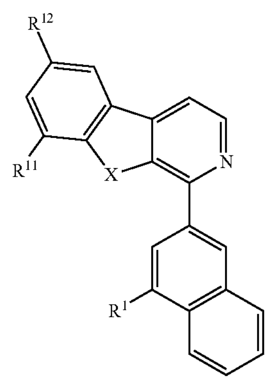

where X is O, and ligands XXVIII-$L_{Ai-S}$ that are based on a structure of Formula XXVIII, where X is S;

ligands XXIX-$L_{Ai-O}$ that are based on a structure of Formula XXIX

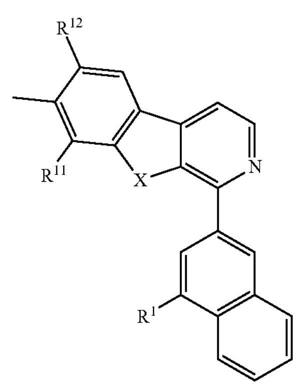

where X is O, and ligands XXIX-$L_{Ai-S}$ that are based on a structure of Formula XXIX, where X is S;

ligands XXX-$L_{Ai-O}$ that are based on a structure of Formula XXX

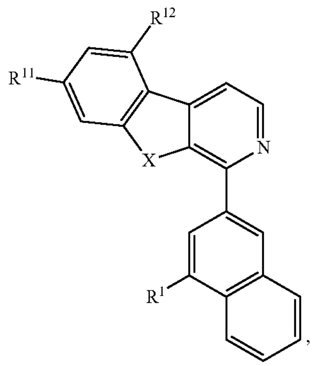

where X is O, and

- ligands XXX-$L_{Ai\text{-}S}$ that are based on a structure of Formula XXX, where X is S;
- ligands XXXI-$L_{Ai\text{-}O}$ that are based on a structure of Formula XXXI

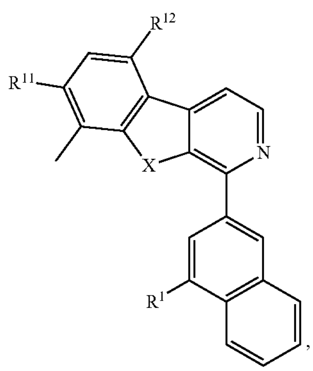

where X is O, and

- ligands XXXI-$L_{Ai\text{-}S}$ that are based on a structure of Formula XXXI, where X is S;
- ligands XXXII-$L_{Ai\text{-}O}$ that are based on a structure of Formula XXXII

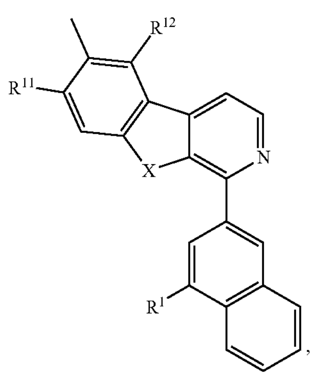

where X is O, and

- ligands XXXII-$L_{Ai\text{-}S}$ that are based on a structure of Formula XXXII, where X is S;
- ligands XXXIII-$L_{Ai\text{-}O}$ that are based on a structure of Formula XXXIII

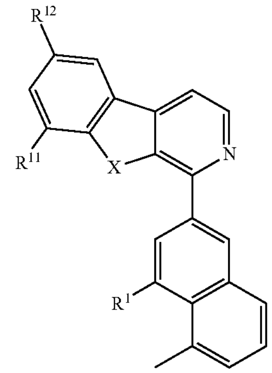

where X is O, and

- ligands XXXIII-$L_{Ai\text{-}S}$ that are based on a structure of Formula XXXIII, where X is S;
- ligands XXXIV-$L_{Ai\text{-}O}$ that are based on a structure of Formula XXXIV

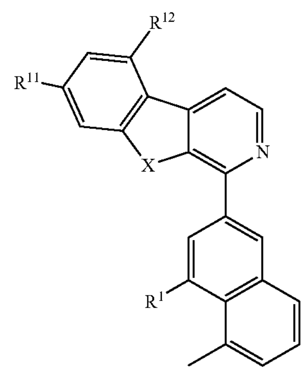

where X is O, and

- ligands XXXIV-$L_{Ai\text{-}S}$ that are based on a structure of Formula XXXIV, where X is S;
- ligands XXXV-$L_{Ai\text{-}O}$ that are based on a structure of Formula XXXV

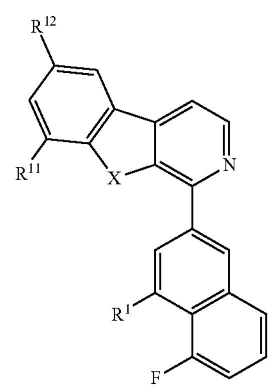

where X is O, and

- ligands XXXV-$L_{Ai\text{-}S}$ that are based on a structure of Formula XXXV, where X is S;
- ligands XXXVI-$L_{Ai\text{-}O}$ that are based on a structure of Formula XXXVI

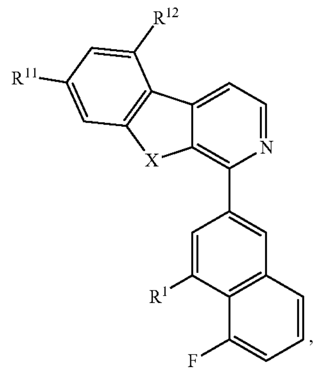

where X is O, and ligands XXXVI-$L_{Ai-S}$ that are based on a structure of Formula XXXVI, where X is S;

ligands XXXVII-$L_{Ai-O}$ that are based on a structure of Formula XXXVII

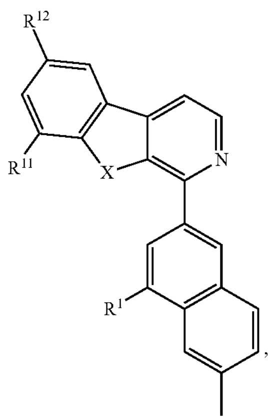

where X is O, and ligands XXXVII-$L_{Ai-S}$ that are based on a structure of Formula XXXVII, where X is S;

ligands XXXVIII-$L_{Ai-O}$ that are based on a structure of Formula XXXVIII

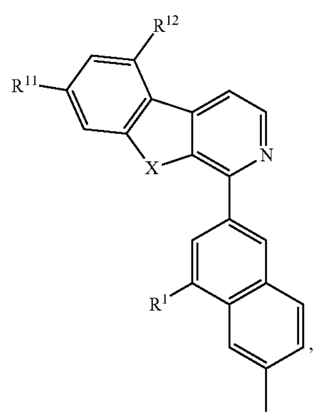

where X is O, and ligands XXXVIII-$L_{Ai-S}$ that are based on a structure of Formula XXXVIII, where X is S;

ligands XXXIX-$L_{Ai-O}$ that are based on a structure of Formula XXXIX

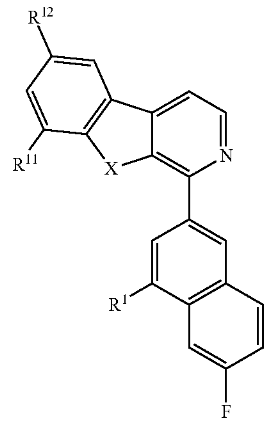

where X is O, and ligands XXXIX-$L_{Ai-S}$ that are based on a structure of Formula XXXIX, where X is S;

ligands XL-$L_{Ai-O}$ that are based on a structure of Formula XL

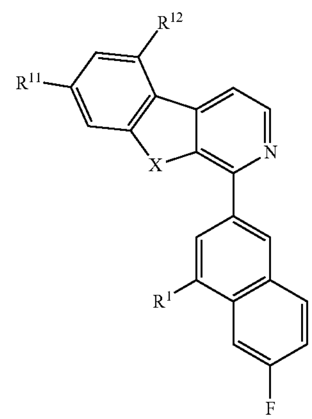

where X is O, and ligands XL-$L_{Ai-S}$ that are based on a structure of Formula XL, where X is S;

ligands XLI-$L_{Ai-O}$ that are based on a structure of Formula XLI

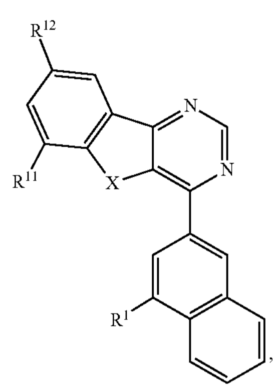

where X is O, and ligands XLI-$L_{Ai\text{-}S}$ that are based on a structure of Formula XLI, where X is S;

ligands XLII-$L_{Ai\text{-}O}$ that are based on a structure of Formula XLII

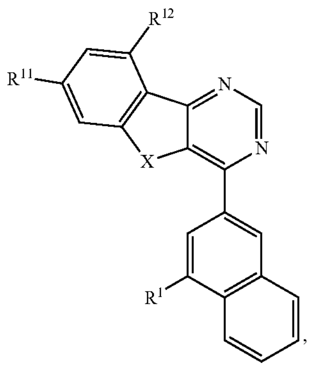

where X is O, and ligands XLII-$L_{Ai\text{-}S}$ that are based on a structure of Formula XLII, where X is S;

ligands XLIII-$L_{Ai\text{-}O}$ that are based on a structure of Formula XLIII

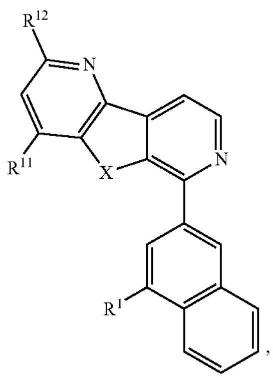

where X is O, and ligands XLIII-$L_{Ai\text{-}S}$ that are based on a structure of Formula XLIII, where X is S;

ligands XLIV-$L_{Ai\text{-}O}$ that are based on a structure of Formula XLIV

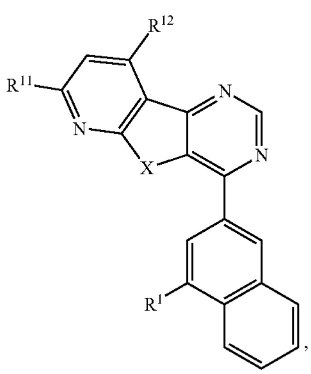

where X is O, and ligands XLIV-$L_{Ai\text{-}S}$ that are based on a structure of Formula XLIV, where X is S;

wherein i is an integer from 1171 to 1584 and for each i, $R^1$, $R^{11}$, and $R^{12}$ in the formulas XVIII through XLIV are defined as follows:

| $L_{Ai}$ | $R^1$ | $R^{11}$ | $R^{12}$ |
|---|---|---|---|
| $L_{A1171}$ | $R_{B3}$ | H | H |
| $L_{A1172}$ | $R_{B3}$ | $R_{B1}$ | H |
| $L_{A1173}$ | $R_{B3}$ | $R_{B3}$ | H |
| $L_{A1174}$ | $R_{B3}$ | $R_{B4}$ | H |
| $L_{A1175}$ | $R_{B3}$ | $R_{B5}$ | H |
| $L_{A1176}$ | $R_{B3}$ | $R_{B6}$ | H |
| $L_{A1177}$ | $R_{B3}$ | $R_{B7}$ | H |
| $L_{A1178}$ | $R_{B3}$ | $R_{B24}$ | H |
| $L_{A1179}$ | $R_{B3}$ | $R_{B25}$ | H |
| $L_{A1180}$ | $R_{B3}$ | $R_{A3}$ | H |
| $L_{A1181}$ | $R_{B3}$ | $R_{A34}$ | H |
| $L_{A1182}$ | $R_{B3}$ | $R_{A44}$ | H |
| $L_{A1183}$ | $R_{B3}$ | $R_{A52}$ | H |
| $L_{A1184}$ | $R_{B3}$ | $R_{A53}$ | H |
| $L_{A1185}$ | $R_{B3}$ | $R_{A54}$ | H |
| $L_{A1186}$ | $R_{B3}$ | $R_{C3}$ | H |
| $L_{A1187}$ | $R_{B3}$ | $R_{C4}$ | H |
| $L_{A1188}$ | $R_{B3}$ | $R_{C8}$ | H |
| $L_{A1189}$ | $R_{B3}$ | H | $R_{B1}$ |
| $L_{A1190}$ | $R_{B3}$ | H | $R_{B3}$ |
| $L_{A1191}$ | $R_{B3}$ | H | $R_{B4}$ |
| $L_{A1192}$ | $R_{B3}$ | H | $R_{B5}$ |
| $L_{A1193}$ | $R_{B3}$ | H | $R_{B6}$ |
| $L_{A1194}$ | $R_{B3}$ | H | $R_{B7}$ |
| $L_{A1195}$ | $R_{B3}$ | H | $R_{B24}$ |
| $L_{A1196}$ | $R_{B3}$ | H | $R_{B25}$ |
| $L_{A1197}$ | $R_{B3}$ | H | $R_{A3}$ |
| $L_{A1198}$ | $R_{B3}$ | H | $R_{A34}$ |
| $L_{A1199}$ | $R_{B3}$ | H | $R_{A44}$ |
| $L_{A1200}$ | $R_{B3}$ | H | $R_{A52}$ |
| $L_{A1201}$ | $R_{B3}$ | H | $R_{A53}$ |
| $L_{A1202}$ | $R_{B3}$ | H | $R_{A54}$ |
| $L_{A1203}$ | $R_{B3}$ | H | $R_{C3}$ |
| $L_{A1204}$ | $R_{B3}$ | H | $R_{C4}$ |
| $L_{A1205}$ | $R_{B3}$ | H | $R_{C8}$ |
| $L_{A1206}$ | $R_{B3}$ | $R_{B1}$ | $R_{B1}$ |
| $L_{A1207}$ | $R_{B3}$ | $R_{B3}$ | $R_{B1}$ |
| $L_{A1208}$ | $R_{B3}$ | $R_{B4}$ | $R_{B1}$ |
| $L_{A1209}$ | $R_{B3}$ | $R_{B5}$ | $R_{B1}$ |
| $L_{A1210}$ | $R_{B3}$ | $R_{B6}$ | $R_{B1}$ |
| $L_{A1211}$ | $R_{B3}$ | $R_{B7}$ | $R_{B1}$ |
| $L_{A1212}$ | $R_{B3}$ | $R_{B24}$ | $R_{B1}$ |
| $L_{A1213}$ | $R_{B3}$ | $R_{B25}$ | $R_{B1}$ |
| $L_{A1214}$ | $R_{B3}$ | $R_{A3}$ | $R_{B1}$ |
| $L_{A1215}$ | $R_{B3}$ | $R_{A34}$ | $R_{B1}$ |
| $L_{A1216}$ | $R_{B3}$ | $R_{A44}$ | $R_{B1}$ |
| $L_{A1217}$ | $R_{B3}$ | $R_{A52}$ | $R_{B1}$ |
| $L_{A1218}$ | $R_{B3}$ | $R_{A53}$ | $R_{B1}$ |
| $L_{A1219}$ | $R_{B3}$ | $R_{A54}$ | $R_{B1}$ |
| $L_{A1220}$ | $R_{B3}$ | $R_{C3}$ | $R_{B1}$ |
| $L_{A1221}$ | $R_{B3}$ | $R_{C4}$ | $R_{B1}$ |
| $L_{A1222}$ | $R_{B3}$ | $R_{C8}$ | $R_{B1}$ |
| $L_{A1223}$ | $R_{B3}$ | $R_{B1}$ | $R_{B1}$ |
| $L_{A1224}$ | $R_{B3}$ | $R_{B1}$ | $R_{B3}$ |
| $L_{A1225}$ | $R_{B3}$ | $R_{B1}$ | $R_{B4}$ |
| $L_{A1226}$ | $R_{B3}$ | $R_{B1}$ | $R_{B5}$ |
| $L_{A1227}$ | $R_{B3}$ | $R_{B1}$ | $R_{B6}$ |
| $L_{A1228}$ | $R_{B3}$ | $R_{B1}$ | $R_{B7}$ |
| $L_{A1229}$ | $R_{B3}$ | $R_{B1}$ | $R_{B24}$ |
| $L_{A1230}$ | $R_{B3}$ | $R_{B1}$ | $R_{B25}$ |
| $L_{A1231}$ | $R_{B3}$ | $R_{B1}$ | $R_{A3}$ |
| $L_{A1232}$ | $R_{B3}$ | $R_{B1}$ | $R_{A34}$ |
| $L_{A1233}$ | $R_{B3}$ | $R_{B1}$ | $R_{A44}$ |
| $L_{A1234}$ | $R_{B3}$ | $R_{B1}$ | $R_{A52}$ |
| $L_{A1235}$ | $R_{B3}$ | $R_{B1}$ | $R_{A53}$ |
| $L_{A1236}$ | $R_{B3}$ | $R_{B1}$ | $R_{A54}$ |
| $L_{A1237}$ | $R_{B3}$ | $R_{B1}$ | $R_{C3}$ |
| $L_{A1238}$ | $R_{B3}$ | $R_{B1}$ | $R_{C4}$ |
| $L_{A1239}$ | $R_{B3}$ | $R_{B1}$ | $R_{C8}$ |
| $L_{A1240}$ | $R_{B6}$ | H | H |

-continued

| $L_{Ai}$ | $R^1$ | $R^{11}$ | $R^{12}$ |
|---|---|---|---|
| $L_{A1241}$ | $R_{B6}$ | $R_{B1}$ | H |
| $L_{A1242}$ | $R_{B6}$ | $R_{B3}$ | H |
| $L_{A1243}$ | $R_{B6}$ | $R_{B4}$ | H |
| $L_{A1244}$ | $R_{B6}$ | $R_{B5}$ | H |
| $L_{A1245}$ | $R_{B6}$ | $R_{B6}$ | H |
| $L_{A1246}$ | $R_{B6}$ | $R_{B7}$ | H |
| $L_{A1247}$ | $R_{B6}$ | $R_{B24}$ | H |
| $L_{A1248}$ | $R_{B6}$ | $R_{B25}$ | H |
| $L_{A1249}$ | $R_{B6}$ | $R_{A3}$ | H |
| $L_{A1250}$ | $R_{B6}$ | $R_{A34}$ | H |
| $L_{A1251}$ | $R_{B6}$ | $R_{A44}$ | H |
| $L_{A1252}$ | $R_{B6}$ | $R_{A52}$ | H |
| $L_{A1253}$ | $R_{B6}$ | $R_{A53}$ | H |
| $L_{A1254}$ | $R_{B6}$ | $R_{A54}$ | H |
| $L_{A1255}$ | $R_{B6}$ | $R_{C3}$ | H |
| $L_{A1256}$ | $R_{B6}$ | $R_{C4}$ | H |
| $L_{A1257}$ | $R_{B6}$ | $R_{C8}$ | H |
| $L_{A1258}$ | $R_{B6}$ | H | $R_{B1}$ |
| $L_{A1259}$ | $R_{B6}$ | H | $R_{B3}$ |
| $L_{A1260}$ | $R_{B6}$ | H | $R_{B4}$ |
| $L_{A1261}$ | $R_{B6}$ | H | $R_{B5}$ |
| $L_{A1262}$ | $R_{B6}$ | H | $R_{B6}$ |
| $L_{A1263}$ | $R_{B6}$ | H | $R_{B7}$ |
| $L_{A1264}$ | $R_{B6}$ | H | $R_{B24}$ |
| $L_{A1265}$ | $R_{B6}$ | H | $R_{B25}$ |
| $L_{A1266}$ | $R_{B6}$ | H | $R_{A3}$ |
| $L_{A1267}$ | $R_{B6}$ | H | $R_{A34}$ |
| $L_{A1268}$ | $R_{B6}$ | H | $R_{A44}$ |
| $L_{A1269}$ | $R_{B6}$ | H | $R_{A52}$ |
| $L_{A1270}$ | $R_{B6}$ | H | $R_{A53}$ |
| $L_{A1271}$ | $R_{B6}$ | H | $R_{A54}$ |
| $L_{A1272}$ | $R_{B6}$ | H | $R_{C3}$ |
| $L_{A1273}$ | $R_{B6}$ | H | $R_{C4}$ |
| $L_{A1274}$ | $R_{B6}$ | H | $R_{C8}$ |
| $L_{A1275}$ | $R_{B6}$ | $R_{B1}$ | $R_{B1}$ |
| $L_{A1276}$ | $R_{B6}$ | $R_{B3}$ | $R_{B1}$ |
| $L_{A1277}$ | $R_{B6}$ | $R_{B4}$ | $R_{B1}$ |
| $L_{A1278}$ | $R_{B6}$ | $R_{B5}$ | $R_{B1}$ |
| $L_{A1279}$ | $R_{B6}$ | $R_{B6}$ | $R_{B1}$ |
| $L_{A1280}$ | $R_{B6}$ | $R_{B7}$ | $R_{B1}$ |
| $L_{A1281}$ | $R_{B6}$ | $R_{B24}$ | $R_{B1}$ |
| $L_{A1282}$ | $R_{B6}$ | $R_{B25}$ | $R_{B1}$ |
| $L_{A1283}$ | $R_{B6}$ | $R_{A3}$ | $R_{B1}$ |
| $L_{A1284}$ | $R_{B6}$ | $R_{A34}$ | $R_{B1}$ |
| $L_{A1285}$ | $R_{B6}$ | $R_{A44}$ | $R_{B1}$ |
| $L_{A1286}$ | $R_{B6}$ | $R_{A52}$ | $R_{B1}$ |
| $L_{A1287}$ | $R_{B6}$ | $R_{A53}$ | $R_{B1}$ |
| $L_{A1288}$ | $R_{B6}$ | $R_{A54}$ | $R_{B1}$ |
| $L_{A1289}$ | $R_{B6}$ | $R_{C3}$ | $R_{B1}$ |
| $L_{A1290}$ | $R_{B6}$ | $R_{C4}$ | $R_{B1}$ |
| $L_{A1291}$ | $R_{B6}$ | $R_{C8}$ | $R_{B1}$ |
| $L_{A1292}$ | $R_{B6}$ | $R_{B1}$ | $R_{B1}$ |
| $L_{A1293}$ | $R_{B6}$ | $R_{B1}$ | $R_{B3}$ |
| $L_{A1294}$ | $R_{B6}$ | $R_{B1}$ | $R_{B4}$ |
| $L_{A1295}$ | $R_{B6}$ | $R_{B1}$ | $R_{B5}$ |
| $L_{A1296}$ | $R_{B6}$ | $R_{B1}$ | $R_{B6}$ |
| $L_{A1297}$ | $R_{B6}$ | $R_{B1}$ | $R_{B7}$ |
| $L_{A1298}$ | $R_{B6}$ | $R_{B1}$ | $R_{B24}$ |
| $L_{A1299}$ | $R_{B6}$ | $R_{B1}$ | $R_{B25}$ |
| $L_{A1300}$ | $R_{B6}$ | $R_{B1}$ | $R_{A3}$ |
| $L_{A1301}$ | $R_{B6}$ | $R_{B1}$ | $R_{A34}$ |
| $L_{A1302}$ | $R_{B6}$ | $R_{B1}$ | $R_{A44}$ |
| $L_{A1303}$ | $R_{B6}$ | $R_{B1}$ | $R_{A52}$ |
| $L_{A1304}$ | $R_{B6}$ | $R_{B1}$ | $R_{A53}$ |
| $L_{A1305}$ | $R_{B6}$ | $R_{B1}$ | $R_{A54}$ |
| $L_{A1306}$ | $R_{B6}$ | $R_{B1}$ | $R_{C3}$ |
| $L_{A1307}$ | $R_{B6}$ | $R_{B1}$ | $R_{C4}$ |
| $L_{A1308}$ | $R_{B6}$ | $R_{B1}$ | $R_{C8}$ |
| $L_{A1309}$ | $R_{B7}$ | H | H |
| $L_{A1310}$ | $R_{B7}$ | $R_{B1}$ | H |
| $L_{A1311}$ | $R_{B7}$ | $R_{B3}$ | H |
| $L_{A1312}$ | $R_{B7}$ | $R_{B4}$ | H |
| $L_{A1313}$ | $R_{B7}$ | $R_{B5}$ | H |
| $L_{A1314}$ | $R_{B7}$ | $R_{B6}$ | H |
| $L_{A1315}$ | $R_{B7}$ | $R_{B7}$ | H |
| $L_{A1316}$ | $R_{B7}$ | $R_{B24}$ | H |
| $L_{A1317}$ | $R_{B7}$ | $R_{B25}$ | H |
| $L_{A1318}$ | $R_{B7}$ | $R_{A3}$ | H |
| $L_{A1319}$ | $R_{B7}$ | $R_{A34}$ | H |
| $L_{A1320}$ | $R_{B7}$ | $R_{A44}$ | H |
| $L_{A1321}$ | $R_{B7}$ | $R_{A52}$ | H |
| $L_{A1322}$ | $R_{B7}$ | $R_{A53}$ | H |
| $L_{A1323}$ | $R_{B7}$ | $R_{A54}$ | H |
| $L_{A1324}$ | $R_{B7}$ | $R_{C3}$ | H |
| $L_{A1325}$ | $R_{B7}$ | $R_{C4}$ | H |
| $L_{A1326}$ | $R_{B7}$ | $R_{C8}$ | H |
| $L_{A1327}$ | $R_{B7}$ | H | $R_{B1}$ |
| $L_{A1328}$ | $R_{B7}$ | H | $R_{B3}$ |
| $L_{A1329}$ | $R_{B7}$ | H | $R_{B4}$ |
| $L_{A1330}$ | $R_{B7}$ | H | $R_{B5}$ |
| $L_{A1331}$ | $R_{B7}$ | H | $R_{B6}$ |
| $L_{A1332}$ | $R_{B7}$ | H | $R_{B7}$ |
| $L_{A1333}$ | $R_{B7}$ | H | $R_{B24}$ |
| $L_{A1334}$ | $R_{B7}$ | H | $R_{B25}$ |
| $L_{A1335}$ | $R_{B7}$ | H | $R_{A3}$ |
| $L_{A1336}$ | $R_{B7}$ | H | $R_{A34}$ |
| $L_{A1337}$ | $R_{B7}$ | H | $R_{A44}$ |
| $L_{A1338}$ | $R_{B7}$ | H | $R_{A52}$ |
| $L_{A1339}$ | $R_{B7}$ | H | $R_{A53}$ |
| $L_{A1340}$ | $R_{B7}$ | H | $R_{A54}$ |
| $L_{A1341}$ | $R_{B7}$ | H | $R_{C3}$ |
| $L_{A1342}$ | $R_{B7}$ | H | $R_{C4}$ |
| $L_{A1343}$ | $R_{B7}$ | H | $R_{C8}$ |
| $L_{A1344}$ | $R_{B7}$ | $R_{B1}$ | $R_{B1}$ |
| $L_{A1345}$ | $R_{B7}$ | $R_{B3}$ | $R_{B1}$ |
| $L_{A1346}$ | $R_{B7}$ | $R_{B4}$ | $R_{B1}$ |
| $L_{A1347}$ | $R_{B7}$ | $R_{B5}$ | $R_{B1}$ |
| $L_{A1348}$ | $R_{B7}$ | $R_{B6}$ | $R_{B1}$ |
| $L_{A1349}$ | $R_{B7}$ | $R_{B7}$ | $R_{B1}$ |
| $L_{A1350}$ | $R_{B7}$ | $R_{B24}$ | $R_{B1}$ |
| $L_{A1351}$ | $R_{B7}$ | $R_{B25}$ | $R_{B1}$ |
| $L_{A1352}$ | $R_{B7}$ | $R_{A3}$ | $R_{B1}$ |
| $L_{A1353}$ | $R_{B7}$ | $R_{A34}$ | $R_{B1}$ |
| $L_{A1354}$ | $R_{B7}$ | $R_{A44}$ | $R_{B1}$ |
| $L_{A1355}$ | $R_{B7}$ | $R_{A52}$ | $R_{B1}$ |
| $L_{A1356}$ | $R_{B7}$ | $R_{A53}$ | $R_{B1}$ |
| $L_{A1357}$ | $R_{B7}$ | $R_{A54}$ | $R_{B1}$ |
| $L_{A1358}$ | $R_{B7}$ | $R_{C3}$ | $R_{B1}$ |
| $L_{A1359}$ | $R_{B7}$ | $R_{C4}$ | $R_{B1}$ |
| $L_{A1360}$ | $R_{B7}$ | $R_{C8}$ | $R_{B1}$ |
| $L_{A1361}$ | $R_{B7}$ | $R_{B1}$ | $R_{B1}$ |
| $L_{A1362}$ | $R_{B7}$ | $R_{B1}$ | $R_{B3}$ |
| $L_{A1363}$ | $R_{B7}$ | $R_{B1}$ | $R_{B4}$ |
| $L_{A1364}$ | $R_{B7}$ | $R_{B1}$ | $R_{B5}$ |
| $L_{A1365}$ | $R_{B7}$ | $R_{B1}$ | $R_{B6}$ |
| $L_{A1366}$ | $R_{B7}$ | $R_{B1}$ | $R_{B7}$ |
| $L_{A1367}$ | $R_{B7}$ | $R_{B1}$ | $R_{B24}$ |
| $L_{A1368}$ | $R_{B7}$ | $R_{B1}$ | $R_{A25}$ |
| $L_{A1369}$ | $R_{B7}$ | $R_{B1}$ | $R_{A3}$ |
| $L_{A1370}$ | $R_{B7}$ | $R_{B1}$ | $R_{A34}$ |
| $L_{A1371}$ | $R_{B7}$ | $R_{B1}$ | $R_{A44}$ |
| $L_{A1372}$ | $R_{B7}$ | $R_{B1}$ | $R_{A52}$ |
| $L_{A1373}$ | $R_{B7}$ | $R_{B1}$ | $R_{A53}$ |
| $L_{A1374}$ | $R_{B7}$ | $R_{B1}$ | $R_{C54}$ |
| $L_{A1375}$ | $R_{B7}$ | $R_{B1}$ | $R_{C3}$ |
| $L_{A1376}$ | $R_{B7}$ | $R_{B1}$ | $R_{C4}$ |
| $L_{A1377}$ | $R_{B7}$ | $R_{B1}$ | $R_{C8}$ |
| $L_{A1378}$ | $R_{B9}$ | H | H |
| $L_{A1379}$ | $R_{B9}$ | $R_{B1}$ | H |
| $L_{A1380}$ | $R_{B9}$ | $R_{B3}$ | H |
| $L_{A1381}$ | $R_{B9}$ | $R_{B4}$ | H |
| $L_{A1382}$ | $R_{B9}$ | $R_{B5}$ | H |
| $L_{A1383}$ | $R_{B9}$ | $R_{B6}$ | H |
| $L_{A1384}$ | $R_{B9}$ | $R_{B7}$ | H |
| $L_{A1385}$ | $R_{B9}$ | $R_{B24}$ | H |
| $L_{A1386}$ | $R_{B9}$ | $R_{B25}$ | H |
| $L_{A1387}$ | $R_{B9}$ | $R_{A3}$ | H |
| $L_{A1388}$ | $R_{B9}$ | $R_{A34}$ | H |
| $L_{A1389}$ | $R_{B9}$ | $R_{A44}$ | H |
| $L_{A1390}$ | $R_{B9}$ | $R_{A52}$ | H |
| $L_{A1391}$ | $R_{B9}$ | $R_{A53}$ | H |
| $L_{A1392}$ | $R_{B9}$ | $R_{A54}$ | H |
| $L_{A1393}$ | $R_{B9}$ | $R_{C3}$ | H |
| $L_{A1394}$ | $R_{B9}$ | $R_{C4}$ | H |

| $L_{Ai}$ | $R^1$ | $R^{11}$ | $R^{12}$ |
|---|---|---|---|
| $L_{A1395}$ | $R_{B9}$ | $R_{C8}$ | H |
| $L_{A1396}$ | $R_{B9}$ | H | $R_{B1}$ |
| $L_{A1397}$ | $R_{B9}$ | H | $R_{B3}$ |
| $L_{A1398}$ | $R_{B9}$ | H | $R_{B4}$ |
| $L_{A1399}$ | $R_{B9}$ | H | $R_{B5}$ |
| $L_{A1400}$ | $R_{B9}$ | H | $R_{B6}$ |
| $L_{A1401}$ | $R_{B9}$ | H | $R_{B7}$ |
| $L_{A1402}$ | $R_{B9}$ | H | $R_{B24}$ |
| $L_{A1403}$ | $R_{B9}$ | H | $R_{B25}$ |
| $L_{A1404}$ | $R_{B9}$ | H | $R_{A3}$ |
| $L_{A1405}$ | $R_{B9}$ | H | $R_{A34}$ |
| $L_{A1406}$ | $R_{B9}$ | H | $R_{A44}$ |
| $L_{A1407}$ | $R_{B9}$ | H | $R_{A52}$ |
| $L_{A1408}$ | $R_{B9}$ | H | $R_{A53}$ |
| $L_{A1409}$ | $R_{B9}$ | H | $R_{A54}$ |
| $L_{A1410}$ | $R_{B9}$ | H | $R_{C3}$ |
| $L_{A1411}$ | $R_{B9}$ | H | $R_{C4}$ |
| $L_{A1412}$ | $R_{B9}$ | H | $R_{C8}$ |
| $L_{A1413}$ | $R_{B9}$ | $R_{B1}$ | $R_{B1}$ |
| $L_{A1414}$ | $R_{B9}$ | $R_{B3}$ | $R_{B1}$ |
| $L_{A1415}$ | $R_{B9}$ | $R_{B4}$ | $R_{B1}$ |
| $L_{A1416}$ | $R_{B9}$ | $R_{B5}$ | $R_{B1}$ |
| $L_{A1417}$ | $R_{B9}$ | $R_{B6}$ | $R_{B1}$ |
| $L_{A1418}$ | $R_{B9}$ | $R_{B7}$ | $R_{B1}$ |
| $L_{A1419}$ | $R_{B9}$ | $R_{B24}$ | $R_{B1}$ |
| $L_{A1420}$ | $R_{B9}$ | $R_{B25}$ | $R_{B1}$ |
| $L_{A1421}$ | $R_{B9}$ | $R_{A3}$ | $R_{B1}$ |
| $L_{A1422}$ | $R_{B9}$ | $R_{A34}$ | $R_{B1}$ |
| $L_{A1423}$ | $R_{B9}$ | $R_{A44}$ | $R_{B1}$ |
| $L_{A1424}$ | $R_{B9}$ | $R_{A52}$ | $R_{B1}$ |
| $L_{A1425}$ | $R_{B9}$ | $R_{A53}$ | $R_{B1}$ |
| $L_{A1426}$ | $R_{B9}$ | $R_{A54}$ | $R_{B1}$ |
| $L_{A1427}$ | $R_{B9}$ | $R_{C3}$ | $R_{B1}$ |
| $L_{A1428}$ | $R_{B9}$ | $R_{C4}$ | $R_{B1}$ |
| $L_{A1429}$ | $R_{B9}$ | $R_{C8}$ | $R_{B1}$ |
| $L_{A1430}$ | $R_{B9}$ | $R_{B1}$ | $R_{B1}$ |
| $L_{A1431}$ | $R_{B9}$ | $R_{B1}$ | $R_{B3}$ |
| $L_{A1432}$ | $R_{B9}$ | $R_{B1}$ | $R_{B4}$ |
| $L_{A1433}$ | $R_{B9}$ | $R_{B1}$ | $R_{B5}$ |
| $L_{A1434}$ | $R_{B9}$ | $R_{B1}$ | $R_{B6}$ |
| $L_{A1435}$ | $R_{B9}$ | $R_{B1}$ | $R_{B7}$ |
| $L_{A1436}$ | $R_{B9}$ | $R_{B1}$ | $R_{B24}$ |
| $L_{A1437}$ | $R_{B9}$ | $R_{B1}$ | $R_{B25}$ |
| $L_{A1438}$ | $R_{B9}$ | $R_{B1}$ | $R_{A3}$ |
| $L_{A1439}$ | $R_{B9}$ | $R_{B1}$ | $R_{A34}$ |
| $L_{A1440}$ | $R_{B9}$ | $R_{B1}$ | $R_{A44}$ |
| $L_{A1441}$ | $R_{B9}$ | $R_{B1}$ | $R_{A52}$ |
| $L_{A1442}$ | $R_{B9}$ | $R_{B1}$ | $R_{A53}$ |
| $L_{A1443}$ | $R_{B9}$ | $R_{B1}$ | $R_{A54}$ |
| $L_{A1444}$ | $R_{B9}$ | $R_{B1}$ | $R_{C3}$ |
| $L_{A1445}$ | $R_{B9}$ | $R_{B1}$ | $R_{C4}$ |
| $L_{A1446}$ | $R_{B9}$ | $R_{B1}$ | $R_{C8}$ |
| $L_{A1447}$ | $R_{B15}$ | H | H |
| $L_{A1448}$ | $R_{B15}$ | $R_{B1}$ | H |
| $L_{A1449}$ | $R_{B15}$ | $R_{B3}$ | H |
| $L_{A1450}$ | $R_{B15}$ | $R_{B4}$ | H |
| $L_{A1451}$ | $R_{B15}$ | $R_{B5}$ | H |
| $L_{A1452}$ | $R_{B15}$ | $R_{B6}$ | H |
| $L_{A1453}$ | $R_{B15}$ | $R_{B7}$ | H |
| $L_{A1454}$ | $R_{B15}$ | $R_{B24}$ | H |
| $L_{A1455}$ | $R_{B15}$ | $R_{B25}$ | H |
| $L_{A1456}$ | $R_{B15}$ | $R_{A3}$ | H |
| $L_{A1457}$ | $R_{B15}$ | $R_{A34}$ | H |
| $L_{A1458}$ | $R_{B15}$ | $R_{A44}$ | H |
| $L_{A1459}$ | $R_{B15}$ | $R_{A52}$ | H |
| $L_{A1460}$ | $R_{B15}$ | $R_{A53}$ | H |
| $L_{A1461}$ | $R_{B15}$ | $R_{A54}$ | H |
| $L_{A1462}$ | $R_{B15}$ | $R_{C3}$ | H |
| $L_{A1463}$ | $R_{B15}$ | $R_{C4}$ | H |
| $L_{A1464}$ | $R_{B15}$ | $R_{C8}$ | H |
| $L_{A1465}$ | $R_{B15}$ | H | $R_{B1}$ |
| $L_{A1466}$ | $R_{B15}$ | H | $R_{B3}$ |
| $L_{A1467}$ | $R_{B15}$ | H | $R_{B4}$ |
| $L_{A1468}$ | $R_{B15}$ | H | $R_{B5}$ |
| $L_{A1469}$ | $R_{B15}$ | H | $R_{B6}$ |
| $L_{A1470}$ | $R_{B15}$ | H | $R_{B7}$ |
| $L_{A1471}$ | $R_{B15}$ | H | $R_{B24}$ |

| $L_{Ai}$ | $R^1$ | $R^{11}$ | $R^{12}$ |
|---|---|---|---|
| $L_{A1472}$ | $R_{B15}$ | H | $R_{B25}$ |
| $L_{A1473}$ | $R_{B15}$ | H | $R_{A3}$ |
| $L_{A1474}$ | $R_{B15}$ | H | $R_{A34}$ |
| $L_{A1475}$ | $R_{B15}$ | H | $R_{A44}$ |
| $L_{A1476}$ | $R_{B15}$ | H | $R_{A52}$ |
| $L_{A1477}$ | $R_{B15}$ | H | $R_{A53}$ |
| $L_{A1478}$ | $R_{B15}$ | H | $R_{A54}$ |
| $L_{A1479}$ | $R_{B15}$ | H | $R_{C3}$ |
| $L_{A1480}$ | $R_{B15}$ | H | $R_{C4}$ |
| $L_{A1481}$ | $R_{B15}$ | H | $R_{C8}$ |
| $L_{A1482}$ | $R_{B15}$ | $R_{B1}$ | $R_{B1}$ |
| $L_{A1483}$ | $R_{B15}$ | $R_{B3}$ | $R_{B1}$ |
| $L_{A1484}$ | $R_{B15}$ | $R_{B4}$ | $R_{B1}$ |
| $L_{A1485}$ | $R_{B15}$ | $R_{B5}$ | $R_{B1}$ |
| $L_{A1486}$ | $R_{B15}$ | $R_{B6}$ | $R_{B1}$ |
| $L_{A1487}$ | $R_{B15}$ | $R_{B7}$ | $R_{B1}$ |
| $L_{A1488}$ | $R_{B15}$ | $R_{B24}$ | $R_{B1}$ |
| $L_{A1489}$ | $R_{B15}$ | $R_{B25}$ | $R_{B1}$ |
| $L_{A1490}$ | $R_{B15}$ | $R_{A3}$ | $R_{B1}$ |
| $L_{A1491}$ | $R_{B15}$ | $R_{A34}$ | $R_{B1}$ |
| $L_{A1492}$ | $R_{B15}$ | $R_{A44}$ | $R_{B1}$ |
| $L_{A1493}$ | $R_{B15}$ | $R_{A52}$ | $R_{B1}$ |
| $L_{A1494}$ | $R_{B15}$ | $R_{A53}$ | $R_{B1}$ |
| $L_{A1495}$ | $R_{B15}$ | $R_{A54}$ | $R_{B1}$ |
| $L_{A1496}$ | $R_{B15}$ | $R_{C3}$ | $R_{B1}$ |
| $L_{A1497}$ | $R_{B15}$ | $R_{C4}$ | $R_{B1}$ |
| $L_{A1498}$ | $R_{B15}$ | $R_{C8}$ | $R_{B1}$ |
| $L_{A1499}$ | $R_{B15}$ | $R_{B1}$ | $R_{B1}$ |
| $L_{A1500}$ | $R_{B15}$ | $R_{B1}$ | $R_{B3}$ |
| $L_{A1501}$ | $R_{B15}$ | $R_{B1}$ | $R_{B4}$ |
| $L_{A1502}$ | $R_{B15}$ | $R_{B1}$ | $R_{B5}$ |
| $L_{A1503}$ | $R_{B15}$ | $R_{B1}$ | $R_{B6}$ |
| $L_{A1504}$ | $R_{B15}$ | $R_{B1}$ | $R_{B7}$ |
| $L_{A1505}$ | $R_{B15}$ | $R_{B1}$ | $R_{B24}$ |
| $L_{A1506}$ | $R_{B15}$ | $R_{B1}$ | $R_{B25}$ |
| $L_{A1507}$ | $R_{B15}$ | $R_{B1}$ | $R_{A3}$ |
| $L_{A1508}$ | $R_{B15}$ | $R_{B1}$ | $R_{A34}$ |
| $L_{A1509}$ | $R_{B15}$ | $R_{B1}$ | $R_{A44}$ |
| $L_{A1510}$ | $R_{B15}$ | $R_{B1}$ | $R_{A52}$ |
| $L_{A1511}$ | $R_{B15}$ | $R_{B1}$ | $R_{A53}$ |
| $L_{A1512}$ | $R_{B15}$ | $R_{B1}$ | $R_{A54}$ |
| $L_{A1513}$ | $R_{B15}$ | $R_{B1}$ | $R_{C3}$ |
| $L_{A1514}$ | $R_{B15}$ | $R_{B1}$ | $R_{C4}$ |
| $L_{A1515}$ | $R_{B15}$ | $R_{B1}$ | $R_{C8}$ |
| $L_{A1516}$ | $R_{A44}$ | H | H |
| $L_{A1517}$ | $R_{A44}$ | $R_{B1}$ | H |
| $L_{A1518}$ | $R_{A44}$ | $R_{B3}$ | H |
| $L_{A1519}$ | $R_{A44}$ | $R_{B4}$ | H |
| $L_{A1520}$ | $R_{A44}$ | $R_{B5}$ | H |
| $L_{A1521}$ | $R_{A44}$ | $R_{B6}$ | H |
| $L_{A1522}$ | $R_{A44}$ | $R_{B7}$ | H |
| $L_{A1523}$ | $R_{A44}$ | $R_{B24}$ | H |
| $L_{A1524}$ | $R_{A44}$ | $R_{B25}$ | H |
| $L_{A1525}$ | $R_{A44}$ | $R_{A3}$ | H |
| $L_{A1526}$ | $R_{A44}$ | $R_{A34}$ | H |
| $L_{A1527}$ | $R_{A44}$ | $R_{A44}$ | H |
| $L_{A1528}$ | $R_{A44}$ | $R_{A52}$ | H |
| $L_{A1529}$ | $R_{A44}$ | $R_{A53}$ | H |
| $L_{A1530}$ | $R_{A44}$ | $R_{A54}$ | H |
| $L_{A1531}$ | $R_{A44}$ | $R_{C3}$ | H |
| $L_{A1532}$ | $R_{A44}$ | $R_{C4}$ | H |
| $L_{A1533}$ | $R_{A44}$ | $R_{C8}$ | H |
| $L_{A1534}$ | $R_{A44}$ | H | $R_{B1}$ |
| $L_{A1535}$ | $R_{A44}$ | H | $R_{B3}$ |
| $L_{A1536}$ | $R_{A44}$ | H | $R_{B4}$ |
| $L_{A1537}$ | $R_{A44}$ | H | $R_{B5}$ |
| $L_{A1538}$ | $R_{A44}$ | H | $R_{B6}$ |
| $L_{A1539}$ | $R_{A44}$ | H | $R_{B7}$ |
| $L_{A1540}$ | $R_{A44}$ | H | $R_{B24}$ |
| $L_{A1541}$ | $R_{A44}$ | H | $R_{B25}$ |
| $L_{A1542}$ | $R_{A44}$ | H | $R_{A3}$ |
| $L_{A1543}$ | $R_{A44}$ | H | $R_{A34}$ |
| $L_{A1544}$ | $R_{A44}$ | H | $R_{A44}$ |
| $L_{A1545}$ | $R_{A44}$ | H | $R_{A52}$ |
| $L_{A1546}$ | $R_{A44}$ | H | $R_{A53}$ |
| $L_{A1547}$ | $R_{A44}$ | H | $R_{A54}$ |
| $L_{A1548}$ | $R_{A44}$ | H | $R_{C3}$ |

-continued

| $L_{Ai}$ | $R^1$ | $R^{11}$ | $R^{12}$ |
|---|---|---|---|
| $L_{A1549}$ | $R_{A44}$ | H | $R_{C4}$ |
| $L_{A1550}$ | $R_{A44}$ | H | $R_{C8}$ |
| $L_{A1551}$ | $R_{A44}$ | $R_{B1}$ | $R_{B1}$ |
| $L_{A1552}$ | $R_{A44}$ | $R_{B3}$ | $R_{B1}$ |
| $L_{A1553}$ | $R_{A44}$ | $R_{B4}$ | $R_{B1}$ |
| $L_{A1554}$ | $R_{A44}$ | $R_{B5}$ | $R_{B1}$ |
| $L_{A1555}$ | $R_{A44}$ | $R_{B6}$ | $R_{B1}$ |
| $L_{A1556}$ | $R_{A44}$ | $R_{B7}$ | $R_{B1}$ |
| $L_{A1557}$ | $R_{A44}$ | $R_{B24}$ | $R_{B1}$ |
| $L_{A1558}$ | $R_{A44}$ | $R_{B25}$ | $R_{B1}$ |
| $L_{A1559}$ | $R_{A44}$ | $R_{A3}$ | $R_{B1}$ |
| $L_{A1560}$ | $R_{A44}$ | $R_{A34}$ | $R_{B1}$ |
| $L_{A1561}$ | $R_{A44}$ | $R_{A44}$ | $R_{B1}$ |
| $L_{A1562}$ | $R_{A44}$ | $R_{A52}$ | $R_{B1}$ |
| $L_{A1563}$ | $R_{A44}$ | $R_{A53}$ | $R_{B1}$ |
| $L_{A1564}$ | $R_{A44}$ | $R_{A54}$ | $R_{B1}$ |
| $L_{A1565}$ | $R_{A44}$ | $R_{C3}$ | $R_{B1}$ |
| $L_{A1566}$ | $R_{A44}$ | $R_{C4}$ | $R_{B1}$ |
| $L_{A1567}$ | $R_{A44}$ | $R_{C8}$ | $R_{B1}$ |
| $L_{A1568}$ | $R_{A44}$ | $R_{B1}$ | $R_{B1}$ |
| $L_{A1569}$ | $R_{A44}$ | $R_{B1}$ | $R_{B3}$ |
| $L_{A1570}$ | $R_{A44}$ | $R_{B1}$ | $R_{B4}$ |
| $L_{A1571}$ | $R_{A44}$ | $R_{B1}$ | $R_{B5}$ |
| $L_{A1572}$ | $R_{A44}$ | $R_{B1}$ | $R_{B6}$ |
| $L_{A1573}$ | $R_{A44}$ | $R_{B1}$ | $R_{B7}$ |
| $L_{A1574}$ | $R_{A44}$ | $R_{B1}$ | $R_{B24}$ |
| $L_{A1575}$ | $R_{A44}$ | $R_{B1}$ | $R_{B25}$ |
| $L_{A1576}$ | $R_{A44}$ | $R_{B1}$ | $R_{A3}$ |
| $L_{A1577}$ | $R_{A44}$ | $R_{B1}$ | $R_{A34}$ |
| $L_{A1578}$ | $R_{A44}$ | $R_{B1}$ | $R_{A44}$ |
| $L_{A1579}$ | $R_{A44}$ | $R_{B1}$ | $R_{A52}$ |
| $L_{A1580}$ | $R_{A44}$ | $R_{B1}$ | $R_{A53}$ |
| $L_{A1581}$ | $R_{A44}$ | $R_{B1}$ | $R_{A54}$ |
| $L_{A1582}$ | $R_{A44}$ | $R_{B1}$ | $R_{C3}$ |
| $L_{A1583}$ | $R_{A44}$ | $R_{B1}$ | $R_{C4}$ |
| $L_{A1584}$ | $R_{A44}$ | $R_{B1}$ | $R_{C8}$ |

ligands XLV-$L_{Ai-O}$ that are based on a structure of Formula XLV

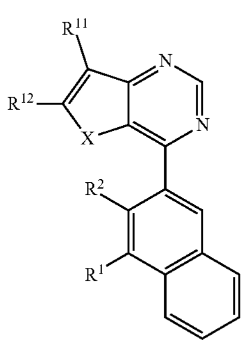

where X is O, and ligands XLV-$L_{Ai-S}$ that are based on a structure of Formula XLV, where X is S;

ligands XLVI-$L_{Ai-O}$ that are based on a structure of Formula XLVI

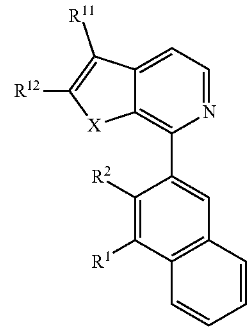

where X is O, and ligands XLVI-$L_{Ai-S}$ that are based on a structure of Formula XLVI, where X is S;

ligands XLVII-$L_{Ai-O}$ that are based on a structure of Formula XLVII

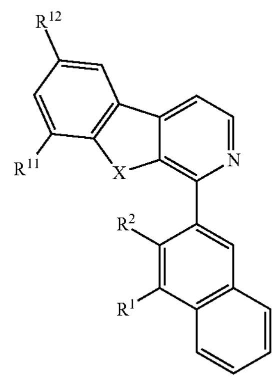

where X is O, and ligands XLVII-$L_{Ai-S}$ that are based on a structure of Formula XLVII, where X is S;

ligands XLVIII-$L_{Ai-O}$ that are based on a structure of Formula XLVIII

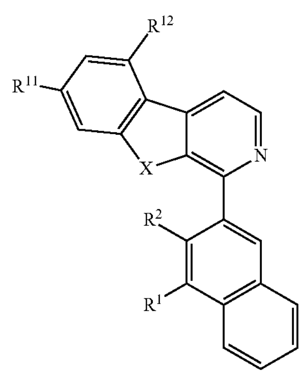

where X is O, and ligands XLVIII-$L_{Ai-S}$ that are based on a structure of Formula XLVIII, where X is S;

ligands XLIX-$L_{Ai-O}$ that are based on a structure of Formula XLIX

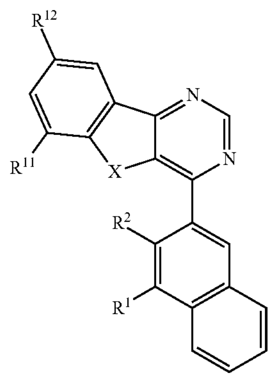

where X is O, and ligands XLIX-$L_{Ai-S}$ that are based on a structure of Formula XLIX, where X is S, ligands L-$L_{Ai-O}$ that are based on a structure of Formula L

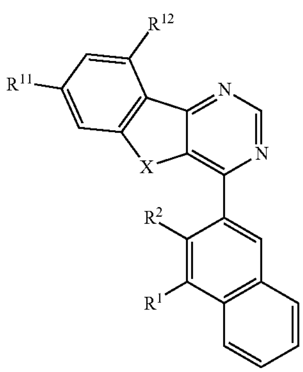

where X is O, and ligands L-$L_{Ai-S}$ that are based on a structure of Formula L, where X is S;

wherein i is an integer from 1654 to 1777 and 1847 to 1970 and for each i, $R^1$, $R^2$, $R^{11}$, and $R^{12}$ in the formulas XLV through L are defined as follows:

| $L_{Ai}$ | $R^1$ | $R^9$ | $R^{10}$ | $R^2$ |
|---|---|---|---|---|
| $L_{A1654}$ | $R_{B1}$ | H | H | $R_{B1}$ |
| $L_{A1655}$ | $R_{B1}$ | $R_{B1}$ | H | $R_{B1}$ |
| $L_{A1656}$ | $R_{B1}$ | $R_{B3}$ | H | $R_{B1}$ |
| $L_{A1657}$ | $R_{B1}$ | $R_{B4}$ | H | $R_{B1}$ |
| $L_{A1658}$ | $R_{B1}$ | $R_{B5}$ | H | $R_{B1}$ |
| $L_{A1659}$ | $R_{B1}$ | $R_{B6}$ | H | $R_{B1}$ |
| $L_{A1660}$ | $R_{B1}$ | $R_{B7}$ | H | $R_{B1}$ |
| $L_{A1661}$ | $R_{B1}$ | $R_{B24}$ | H | $R_{B1}$ |
| $L_{A1662}$ | $R_{B1}$ | $R_{B25}$ | H | $R_{B1}$ |
| $L_{A1663}$ | $R_{B1}$ | $R_{A3}$ | H | $R_{B1}$ |
| $L_{A1664}$ | $R_{B1}$ | $R_{A34}$ | H | $R_{B1}$ |
| $L_{A1665}$ | $R_{B1}$ | $R_{A44}$ | H | $R_{B1}$ |
| $L_{A1666}$ | $R_{B1}$ | $R_{A52}$ | H | $R_{B1}$ |
| $L_{A1667}$ | $R_{B1}$ | $R_{A53}$ | H | $R_{B1}$ |
| $L_{A1668}$ | $R_{B1}$ | $R_{A54}$ | H | $R_{B1}$ |
| $L_{A1669}$ | $R_{B1}$ | $R_{C3}$ | H | $R_{B1}$ |
| $L_{A1670}$ | $R_{B1}$ | $R_{C4}$ | H | $R_{B1}$ |
| $L_{A1671}$ | $R_{B1}$ | $R_{C8}$ | H | $R_{B1}$ |
| $L_{A1672}$ | $R_{B1}$ | H | $R_{B1}$ | $R_{B1}$ |
| $L_{A1673}$ | $R_{B1}$ | H | $R_{B3}$ | $R_{B1}$ |
| $L_{A1674}$ | $R_{B1}$ | H | $R_{B4}$ | $R_{B1}$ |
| $L_{A1675}$ | $R_{B1}$ | H | $R_{B5}$ | $R_{B1}$ |
| $L_{A1676}$ | $R_{B1}$ | H | $R_{B6}$ | $R_{B1}$ |
| $L_{A1677}$ | $R_{B1}$ | H | $R_{B7}$ | $R_{B1}$ |

-continued

| $L_{Ai}$ | $R^1$ | $R^9$ | $R^{10}$ | $R^2$ |
|---|---|---|---|---|
| $L_{A1678}$ | $R_{B1}$ | H | $R_{B24}$ | $R_{B1}$ |
| $L_{A1679}$ | $R_{B1}$ | H | $R_{B25}$ | $R_{B1}$ |
| $L_{A1680}$ | $R_{B1}$ | H | $R_{A3}$ | $R_{B1}$ |
| $L_{A1681}$ | $R_{B1}$ | H | $R_{A34}$ | $R_{B1}$ |
| $L_{A1682}$ | $R_{B1}$ | H | $R_{A44}$ | $R_{B1}$ |
| $L_{A1683}$ | $R_{B1}$ | H | $R_{A52}$ | $R_{B1}$ |
| $L_{A1684}$ | $R_{B1}$ | H | $R_{A53}$ | $R_{B1}$ |
| $L_{A1685}$ | $R_{B1}$ | H | $R_{A54}$ | $R_{B1}$ |
| $L_{A1686}$ | $R_{B1}$ | H | $R_{C3}$ | $R_{B1}$ |
| $L_{A1687}$ | $R_{B1}$ | H | $R_{C4}$ | $R_{B1}$ |
| $L_{A1688}$ | $R_{B1}$ | H | $R_{C8}$ | $R_{B1}$ |
| $L_{A1689}$ | $R_{B1}$ | $R_{B1}$ | $R_{B1}$ | $R_{B1}$ |
| $L_{A1690}$ | $R_{B1}$ | $R_{B3}$ | $R_{B1}$ | $R_{B1}$ |
| $L_{A1691}$ | $R_{B1}$ | $R_{B4}$ | $R_{B1}$ | $R_{B1}$ |
| $L_{A1692}$ | $R_{B1}$ | $R_{B5}$ | $R_{B1}$ | $R_{B1}$ |
| $L_{A1693}$ | $R_{B1}$ | $R_{B6}$ | $R_{B1}$ | $R_{B1}$ |
| $L_{A1694}$ | $R_{B1}$ | $R_{B7}$ | $R_{B1}$ | $R_{B1}$ |
| $L_{A1695}$ | $R_{B1}$ | $R_{B24}$ | $R_{B1}$ | $R_{B1}$ |
| $L_{A1696}$ | $R_{B1}$ | $R_{B25}$ | $R_{B1}$ | $R_{B1}$ |
| $L_{A1697}$ | $R_{B1}$ | $R_{A3}$ | $R_{B1}$ | $R_{B1}$ |
| $L_{A1698}$ | $R_{B1}$ | $R_{A34}$ | $R_{B1}$ | $R_{B1}$ |
| $L_{A1699}$ | $R_{B1}$ | $R_{A44}$ | $R_{B1}$ | $R_{B1}$ |
| $L_{A1700}$ | $R_{B1}$ | $R_{A52}$ | $R_{B1}$ | $R_{B1}$ |
| $L_{A1701}$ | $R_{B1}$ | $R_{A53}$ | $R_{B1}$ | $R_{B1}$ |
| $L_{A1702}$ | $R_{B1}$ | $R_{A54}$ | $R_{B1}$ | $R_{B1}$ |
| $L_{A1703}$ | $R_{B1}$ | $R_{C3}$ | $R_{B1}$ | $R_{B1}$ |
| $L_{A1704}$ | $R_{B1}$ | $R_{C4}$ | $R_{B1}$ | $R_{B1}$ |
| $L_{A1705}$ | $R_{B1}$ | $R_{C8}$ | $R_{B1}$ | $R_{B1}$ |
| $L_{A1706}$ | $R_{B1}$ | $R_{B1}$ | $R_{B1}$ | $R_{B1}$ |
| $L_{A1707}$ | $R_{B1}$ | $R_{B1}$ | $R_{B3}$ | $R_{B1}$ |
| $L_{A1708}$ | $R_{B1}$ | $R_{B1}$ | $R_{B4}$ | $R_{B1}$ |
| $L_{A1709}$ | $R_{B1}$ | $R_{B1}$ | $R_{B5}$ | $R_{B1}$ |
| $L_{A1710}$ | $R_{B1}$ | $R_{B1}$ | $R_{B6}$ | $R_{B1}$ |
| $L_{A1711}$ | $R_{B1}$ | $R_{B1}$ | $R_{B7}$ | $R_{B1}$ |
| $L_{A1712}$ | $R_{B1}$ | $R_{B1}$ | $R_{B24}$ | $R_{B1}$ |
| $L_{A1713}$ | $R_{B1}$ | $R_{B1}$ | $R_{B25}$ | $R_{B1}$ |
| $L_{A1714}$ | $R_{B1}$ | $R_{B1}$ | $R_{A3}$ | $R_{B1}$ |
| $L_{A1715}$ | $R_{B1}$ | $R_{B1}$ | $R_{A34}$ | $R_{B1}$ |
| $L_{A1716}$ | $R_{B6}$ | H | H | $R_{B1}$ |
| $L_{A1717}$ | $R_{B6}$ | $R_{B1}$ | H | $R_{B1}$ |
| $L_{A1718}$ | $R_{B6}$ | $R_{B3}$ | H | $R_{B1}$ |
| $L_{A1719}$ | $R_{B6}$ | $R_{B4}$ | H | $R_{B1}$ |
| $L_{A1720}$ | $R_{B6}$ | $R_{B5}$ | H | $R_{B1}$ |
| $L_{A1721}$ | $R_{B6}$ | $R_{B6}$ | H | $R_{B1}$ |
| $L_{A1722}$ | $R_{B6}$ | $R_{B7}$ | H | $R_{B1}$ |
| $L_{A1723}$ | $R_{B6}$ | $R_{B24}$ | H | $R_{B1}$ |
| $L_{A1724}$ | $R_{B6}$ | $R_{B25}$ | H | $R_{B1}$ |
| $L_{A1725}$ | $R_{B6}$ | $R_{A3}$ | H | $R_{B1}$ |
| $L_{A1726}$ | $R_{B6}$ | $R_{A34}$ | H | $R_{B1}$ |
| $L_{A1727}$ | $R_{B6}$ | $R_{A44}$ | H | $R_{B1}$ |
| $L_{A1728}$ | $R_{B6}$ | $R_{A52}$ | H | $R_{B1}$ |
| $L_{A1729}$ | $R_{B6}$ | $R_{A53}$ | H | $R_{B1}$ |
| $L_{A1730}$ | $R_{B6}$ | $R_{A54}$ | H | $R_{B1}$ |
| $L_{A1731}$ | $R_{B6}$ | $R_{C3}$ | H | $R_{B1}$ |
| $L_{A1732}$ | $R_{B6}$ | $R_{C4}$ | H | $R_{B1}$ |
| $L_{A1733}$ | $R_{B6}$ | $R_{C8}$ | H | $R_{B1}$ |
| $L_{A1734}$ | $R_{B6}$ | H | $R_{B1}$ | $R_{B1}$ |
| $L_{A1735}$ | $R_{B6}$ | H | $R_{B3}$ | $R_{B1}$ |
| $L_{A1736}$ | $R_{B6}$ | H | $R_{B4}$ | $R_{B1}$ |
| $L_{A1737}$ | $R_{B6}$ | H | $R_{B5}$ | $R_{B1}$ |
| $L_{A1738}$ | $R_{B6}$ | H | $R_{B6}$ | $R_{B1}$ |
| $L_{A1739}$ | $R_{B6}$ | H | $R_{B7}$ | $R_{B1}$ |
| $L_{A1740}$ | $R_{B6}$ | H | $R_{B24}$ | $R_{B1}$ |
| $L_{A1741}$ | $R_{B6}$ | H | $R_{B25}$ | $R_{B1}$ |
| $L_{A1742}$ | $R_{B6}$ | H | $R_{A3}$ | $R_{B1}$ |
| $L_{A1743}$ | $R_{B6}$ | H | $R_{A34}$ | $R_{B1}$ |
| $L_{A1744}$ | $R_{B6}$ | H | $R_{A44}$ | $R_{B1}$ |
| $L_{A1745}$ | $R_{B6}$ | H | $R_{A52}$ | $R_{B1}$ |
| $L_{A1746}$ | $R_{B6}$ | H | $R_{A53}$ | $R_{B1}$ |
| $L_{A1747}$ | $R_{B6}$ | H | $R_{A54}$ | $R_{B1}$ |
| $L_{A1748}$ | $R_{B6}$ | H | $R_{C3}$ | $R_{B1}$ |
| $L_{A1749}$ | $R_{B6}$ | H | $R_{C4}$ | $R_{B1}$ |
| $L_{A1750}$ | $R_{B6}$ | H | $R_{C8}$ | $R_{B1}$ |
| $L_{A1751}$ | $R_{B6}$ | $R_{B1}$ | $R_{B1}$ | $R_{B1}$ |
| $L_{A1752}$ | $R_{B6}$ | $R_{B3}$ | $R_{B1}$ | $R_{B1}$ |
| $L_{A1753}$ | $R_{B6}$ | $R_{B4}$ | $R_{B1}$ | $R_{B1}$ |
| $L_{A1754}$ | $R_{B6}$ | $R_{B5}$ | $R_{B1}$ | $R_{B1}$ |

-continued

| $L_{Ai}$ | $R^1$ | $R^9$ | $R^{10}$ | $R^2$ |
|---|---|---|---|---|
| $L_{A1755}$ | $R_{B6}$ | $R_{B6}$ | $R_{B1}$ | $R_{B1}$ |
| $L_{A1756}$ | $R_{B6}$ | $R_{B7}$ | $R_{B1}$ | $R_{B1}$ |
| $L_{A1757}$ | $R_{B6}$ | $R_{B24}$ | $R_{B1}$ | $R_{B1}$ |
| $L_{A1758}$ | $R_{B6}$ | $R_{B25}$ | $R_{B1}$ | $R_{B1}$ |
| $L_{A1759}$ | $R_{B6}$ | $R_{A3}$ | $R_{B1}$ | $R_{B1}$ |
| $L_{A1760}$ | $R_{B6}$ | $R_{A34}$ | $R_{B1}$ | $R_{B1}$ |
| $L_{A1761}$ | $R_{B6}$ | $R_{A44}$ | $R_{B1}$ | $R_{B1}$ |
| $L_{A1762}$ | $R_{B6}$ | $R_{A52}$ | $R_{B1}$ | $R_{B1}$ |
| $L_{A1763}$ | $R_{B6}$ | $R_{A53}$ | $R_{B1}$ | $R_{B1}$ |
| $L_{A1764}$ | $R_{B6}$ | $R_{A54}$ | $R_{B1}$ | $R_{B1}$ |
| $L_{A1765}$ | $R_{B6}$ | $R_{C3}$ | $R_{B1}$ | $R_{B1}$ |
| $L_{A1766}$ | $R_{B6}$ | $R_{C4}$ | $R_{B1}$ | $R_{B1}$ |
| $L_{A1767}$ | $R_{B6}$ | $R_{C8}$ | $R_{B1}$ | $R_{B1}$ |
| $L_{A1768}$ | $R_{B6}$ | $R_{B1}$ | $R_{B1}$ | $R_{B1}$ |
| $L_{A1769}$ | $R_{B6}$ | $R_{B1}$ | $R_{B3}$ | $R_{B1}$ |
| $L_{A1770}$ | $R_{B6}$ | $R_{B1}$ | $R_{B4}$ | $R_{B1}$ |
| $L_{A1771}$ | $R_{B6}$ | $R_{B1}$ | $R_{B5}$ | $R_{B1}$ |
| $L_{A1772}$ | $R_{B6}$ | $R_{B1}$ | $R_{B6}$ | $R_{B1}$ |
| $L_{A1773}$ | $R_{B6}$ | $R_{B1}$ | $R_{B7}$ | $R_{B1}$ |
| $L_{A1774}$ | $R_{B6}$ | $R_{B1}$ | $R_{B24}$ | $R_{B1}$ |
| $L_{A1775}$ | $R_{B6}$ | $R_{B1}$ | $R_{B25}$ | $R_{B1}$ |
| $L_{A1776}$ | $R_{B6}$ | $R_{B1}$ | $R_{A3}$ | $R_{B1}$ |
| $L_{A1777}$ | $R_{B6}$ | $R_{B1}$ | $R_{A34}$ | $R_{B1}$ |
| $L_{A1847}$ | $R_{B1}$ | H | H | $R_{A54}$ |
| $L_{A1848}$ | $R_{B1}$ | $R_{B1}$ | H | $R_{A54}$ |
| $L_{A1849}$ | $R_{B1}$ | $R_{B3}$ | H | $R_{A54}$ |
| $L_{A1850}$ | $R_{B1}$ | $R_{B4}$ | H | $R_{A54}$ |
| $L_{A1851}$ | $R_{B1}$ | $R_{B5}$ | H | $R_{A54}$ |
| $L_{A1852}$ | $R_{B1}$ | $R_{B6}$ | H | $R_{A54}$ |
| $L_{A1853}$ | $R_{B1}$ | $R_{B7}$ | H | $R_{A54}$ |
| $L_{A1854}$ | $R_{B1}$ | $R_{B24}$ | H | $R_{A54}$ |
| $L_{A1855}$ | $R_{B1}$ | $R_{B25}$ | H | $R_{A54}$ |
| $L_{A1856}$ | $R_{B1}$ | $R_{A3}$ | H | $R_{A54}$ |
| $L_{A1857}$ | $R_{B1}$ | $R_{A34}$ | H | $R_{A54}$ |
| $L_{A1858}$ | $R_{B1}$ | $R_{A44}$ | H | $R_{A54}$ |
| $L_{A1859}$ | $R_{B1}$ | $R_{A52}$ | H | $R_{A54}$ |
| $L_{A1860}$ | $R_{B1}$ | $R_{A53}$ | H | $R_{A54}$ |
| $L_{A1861}$ | $R_{B1}$ | $R_{A54}$ | H | $R_{A54}$ |
| $L_{A1862}$ | $R_{B1}$ | $R_{C3}$ | H | $R_{A54}$ |
| $L_{A1863}$ | $R_{B1}$ | $R_{C4}$ | H | $R_{A54}$ |
| $L_{A1864}$ | $R_{B1}$ | $R_{C8}$ | H | $R_{A54}$ |
| $L_{A1865}$ | $R_{B1}$ | H | $R_{B1}$ | $R_{A54}$ |
| $L_{A1866}$ | $R_{B1}$ | H | $R_{B3}$ | $R_{A54}$ |
| $L_{A1867}$ | $R_{B1}$ | H | $R_{B4}$ | $R_{A54}$ |
| $L_{A1868}$ | $R_{B1}$ | H | $R_{B5}$ | $R_{A54}$ |
| $L_{A1869}$ | $R_{B1}$ | H | $R_{B6}$ | $R_{A54}$ |
| $L_{A1870}$ | $R_{B1}$ | H | $R_{B7}$ | $R_{A54}$ |
| $L_{A1871}$ | $R_{B1}$ | H | $R_{B24}$ | $R_{A54}$ |
| $L_{A1872}$ | $R_{B1}$ | H | $R_{B25}$ | $R_{A54}$ |
| $L_{A1873}$ | $R_{B1}$ | H | $R_{A3}$ | $R_{A54}$ |
| $L_{A1874}$ | $R_{B1}$ | H | $R_{A34}$ | $R_{A54}$ |
| $L_{A1875}$ | $R_{B1}$ | H | $R_{A44}$ | $R_{A54}$ |
| $L_{A1876}$ | $R_{B1}$ | H | $R_{A52}$ | $R_{A54}$ |
| $L_{A1877}$ | $R_{B1}$ | H | $R_{A53}$ | $R_{A54}$ |
| $L_{A1878}$ | $R_{B1}$ | H | $R_{A54}$ | $R_{A54}$ |
| $L_{A1879}$ | $R_{B1}$ | H | $R_{C3}$ | $R_{A54}$ |
| $L_{A1880}$ | $R_{B1}$ | H | $R_{C4}$ | $R_{A54}$ |
| $L_{A1881}$ | $R_{B1}$ | H | $R_{C8}$ | $R_{A54}$ |
| $L_{A1882}$ | $R_{B1}$ | $R_{B1}$ | $R_{B1}$ | $R_{A54}$ |
| $L_{A1883}$ | $R_{B1}$ | $R_{B3}$ | $R_{B1}$ | $R_{A54}$ |
| $L_{A1884}$ | $R_{B1}$ | $R_{B4}$ | $R_{B1}$ | $R_{A54}$ |
| $L_{A1885}$ | $R_{B1}$ | $R_{B5}$ | $R_{B1}$ | $R_{A54}$ |
| $L_{A1886}$ | $R_{B1}$ | $R_{B6}$ | $R_{B1}$ | $R_{A54}$ |
| $L_{A1887}$ | $R_{B1}$ | $R_{B7}$ | $R_{B1}$ | $R_{A54}$ |
| $L_{A1888}$ | $R_{B1}$ | $R_{B24}$ | $R_{B1}$ | $R_{A54}$ |
| $L_{A1889}$ | $R_{B1}$ | $R_{B25}$ | $R_{B1}$ | $R_{A54}$ |
| $L_{A1890}$ | $R_{B1}$ | $R_{A3}$ | $R_{B1}$ | $R_{A54}$ |
| $L_{A1891}$ | $R_{B1}$ | $R_{A34}$ | $R_{B1}$ | $R_{A54}$ |
| $L_{A1892}$ | $R_{B1}$ | $R_{A44}$ | $R_{B1}$ | $R_{A54}$ |
| $L_{A1893}$ | $R_{B1}$ | $R_{A52}$ | $R_{B1}$ | $R_{A54}$ |
| $L_{A1894}$ | $R_{B1}$ | $R_{A53}$ | $R_{B1}$ | $R_{A54}$ |
| $L_{A1895}$ | $R_{B1}$ | $R_{A54}$ | $R_{B1}$ | $R_{A54}$ |
| $L_{A1896}$ | $R_{B1}$ | $R_{C3}$ | $R_{B1}$ | $R_{A54}$ |
| $L_{A1897}$ | $R_{B1}$ | $R_{C4}$ | $R_{B1}$ | $R_{A54}$ |
| $L_{A1898}$ | $R_{B1}$ | $R_{C8}$ | $R_{B1}$ | $R_{A54}$ |
| $L_{A1899}$ | $R_{B1}$ | $R_{B1}$ | $R_{B1}$ | $R_{A54}$ |
| $L_{A1900}$ | $R_{B1}$ | $R_{B1}$ | $R_{B3}$ | $R_{A54}$ |

-continued

| $L_{Ai}$ | $R^1$ | $R^9$ | $R^{10}$ | $R^2$ |
|---|---|---|---|---|
| $L_{A1901}$ | $R_{B1}$ | $R_{B1}$ | $R_{B4}$ | $R_{A54}$ |
| $L_{A1902}$ | $R_{B1}$ | $R_{B1}$ | $R_{B5}$ | $R_{A54}$ |
| $L_{A1903}$ | $R_{B1}$ | $R_{B1}$ | $R_{B6}$ | $R_{A54}$ |
| $L_{A1904}$ | $R_{B1}$ | $R_{B1}$ | $R_{B7}$ | $R_{A54}$ |
| $L_{A1905}$ | $R_{B1}$ | $R_{B1}$ | $R_{B24}$ | $R_{A54}$ |
| $L_{A1906}$ | $R_{B1}$ | $R_{B1}$ | $R_{B25}$ | $R_{A54}$ |
| $L_{A1907}$ | $R_{B1}$ | $R_{B1}$ | $R_{A3}$ | $R_{A54}$ |
| $L_{A1908}$ | $R_{B1}$ | $R_{B1}$ | $R_{A34}$ | $R_{A54}$ |
| $L_{A1909}$ | $R_{B6}$ | H | H | $R_{A54}$ |
| $L_{A1910}$ | $R_{B6}$ | $R_{B1}$ | H | $R_{A54}$ |
| $L_{A1911}$ | $R_{B6}$ | $R_{B3}$ | H | $R_{A54}$ |
| $L_{A1912}$ | $R_{B6}$ | $R_{B4}$ | H | $R_{A54}$ |
| $L_{A1913}$ | $R_{B6}$ | $R_{B5}$ | H | $R_{A54}$ |
| $L_{A1914}$ | $R_{B6}$ | $R_{B6}$ | H | $R_{A54}$ |
| $L_{A1915}$ | $R_{B6}$ | $R_{B7}$ | H | $R_{A54}$ |
| $L_{A1916}$ | $R_{B6}$ | $R_{B24}$ | H | $R_{A54}$ |
| $L_{A1917}$ | $R_{B6}$ | $R_{B25}$ | H | $R_{A54}$ |
| $L_{A1918}$ | $R_{B6}$ | $R_{A3}$ | H | $R_{A54}$ |
| $L_{A1919}$ | $R_{B6}$ | $R_{A34}$ | H | $R_{A54}$ |
| $L_{A1920}$ | $R_{B6}$ | $R_{A44}$ | H | $R_{A54}$ |
| $L_{A1921}$ | $R_{B6}$ | $R_{A52}$ | H | $R_{A54}$ |
| $L_{A1922}$ | $R_{B6}$ | $R_{A53}$ | H | $R_{A54}$ |
| $L_{A1923}$ | $R_{B6}$ | $R_{A54}$ | H | $R_{A54}$ |
| $L_{A1924}$ | $R_{B6}$ | $R_{C3}$ | H | $R_{A54}$ |
| $L_{A1925}$ | $R_{B6}$ | $R_{C4}$ | H | $R_{A54}$ |
| $L_{A1926}$ | $R_{B6}$ | $R_{C8}$ | H | $R_{A54}$ |
| $L_{A1927}$ | $R_{B6}$ | H | $R_{B1}$ | $R_{A54}$ |
| $L_{A1928}$ | $R_{B6}$ | H | $R_{B3}$ | $R_{A54}$ |
| $L_{A1929}$ | $R_{B6}$ | H | $R_{B4}$ | $R_{A54}$ |
| $L_{A1930}$ | $R_{B6}$ | H | $R_{B5}$ | $R_{A54}$ |
| $L_{A1931}$ | $R_{B6}$ | H | $R_{B6}$ | $R_{A54}$ |
| $L_{A1932}$ | $R_{B6}$ | H | $R_{B7}$ | $R_{A54}$ |
| $L_{A1933}$ | $R_{B6}$ | H | $R_{B24}$ | $R_{A54}$ |
| $L_{A1934}$ | $R_{B6}$ | H | $R_{B25}$ | $R_{A54}$ |
| $L_{A1935}$ | $R_{B6}$ | H | $R_{A3}$ | $R_{A54}$ |
| $L_{A1936}$ | $R_{B6}$ | H | $R_{A34}$ | $R_{A54}$ |
| $L_{A1937}$ | $R_{B6}$ | H | $R_{A44}$ | $R_{A54}$ |
| $L_{A1938}$ | $R_{B6}$ | H | $R_{A52}$ | $R_{A54}$ |
| $L_{A1939}$ | $R_{B6}$ | H | $R_{A53}$ | $R_{A54}$ |
| $L_{A1940}$ | $R_{B6}$ | H | $R_{A54}$ | $R_{A54}$ |
| $L_{A1941}$ | $R_{B6}$ | H | $R_{C3}$ | $R_{A54}$ |
| $L_{A1942}$ | $R_{B6}$ | H | $R_{C4}$ | $R_{A54}$ |
| $L_{A1943}$ | $R_{B6}$ | H | $R_{C8}$ | $R_{A54}$ |
| $L_{A1944}$ | $R_{B6}$ | $R_{B1}$ | $R_{B1}$ | $R_{A54}$ |
| $L_{A1945}$ | $R_{B6}$ | $R_{B3}$ | $R_{B1}$ | $R_{A54}$ |
| $L_{A1946}$ | $R_{B6}$ | $R_{B4}$ | $R_{B1}$ | $R_{A54}$ |
| $L_{A1947}$ | $R_{B6}$ | $R_{B5}$ | $R_{B1}$ | $R_{A54}$ |
| $L_{A1948}$ | $R_{B6}$ | $R_{B6}$ | $R_{B1}$ | $R_{A54}$ |
| $L_{A1949}$ | $R_{B6}$ | $R_{B7}$ | $R_{B1}$ | $R_{A54}$ |
| $L_{A1950}$ | $R_{B6}$ | $R_{B24}$ | $R_{B1}$ | $R_{A54}$ |
| $L_{A1951}$ | $R_{B6}$ | $R_{B25}$ | $R_{B1}$ | $R_{A54}$ |
| $L_{A1952}$ | $R_{B6}$ | $R_{A3}$ | $R_{B1}$ | $R_{A54}$ |
| $L_{A1953}$ | $R_{B6}$ | $R_{A34}$ | $R_{B1}$ | $R_{A54}$ |
| $L_{A1954}$ | $R_{B6}$ | $R_{A44}$ | $R_{B1}$ | $R_{A54}$ |
| $L_{A1955}$ | $R_{B6}$ | $R_{A52}$ | $R_{B1}$ | $R_{A54}$ |
| $L_{A1956}$ | $R_{B6}$ | $R_{A53}$ | $R_{B1}$ | $R_{A54}$ |
| $L_{A1957}$ | $R_{B6}$ | $R_{A54}$ | $R_{B1}$ | $R_{A54}$ |
| $L_{A1958}$ | $R_{B6}$ | $R_{C3}$ | $R_{B1}$ | $R_{A54}$ |
| $L_{A1959}$ | $R_{B6}$ | $R_{C4}$ | $R_{B1}$ | $R_{A54}$ |
| $L_{A1960}$ | $R_{B6}$ | $R_{C8}$ | $R_{B1}$ | $R_{A54}$ |
| $L_{A1961}$ | $R_{B6}$ | $R_{B1}$ | $R_{B1}$ | $R_{A54}$ |
| $L_{A1962}$ | $R_{B6}$ | $R_{B1}$ | $R_{B3}$ | $R_{A54}$ |
| $L_{A1963}$ | $R_{B6}$ | $R_{B1}$ | $R_{B4}$ | $R_{A54}$ |
| $L_{A1964}$ | $R_{B6}$ | $R_{B1}$ | $R_{B5}$ | $R_{A54}$ |
| $L_{A1965}$ | $R_{B6}$ | $R_{B1}$ | $R_{B6}$ | $R_{A54}$ |
| $L_{A1966}$ | $R_{B6}$ | $R_{B1}$ | $R_{B7}$ | $R_{A54}$ |
| $L_{A1967}$ | $R_{B6}$ | $R_{B1}$ | $R_{B24}$ | $R_{A54}$ |
| $L_{A1968}$ | $R_{B6}$ | $R_{B1}$ | $R_{B25}$ | $R_{A54}$ |
| $L_{A1969}$ | $R_{B6}$ | $R_{B1}$ | $R_{A3}$ | $R_{A54}$ |
| $L_{A1970}$ | $R_{B6}$ | $R_{B1}$ | $R_{A34}$ | $R_{A54}$ |

wherein $R_{B1}$ to $R_{B25}$ have the following structures:
$R_{B1}$
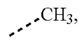
$R_{B2}$
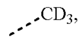
$R_{B3}$
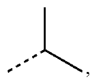
$R_{B4}$
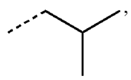
$R_{B5}$
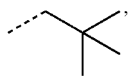
$R_{B6}$
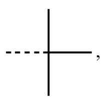
$R_{B7}$
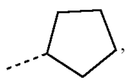
$R_{B8}$
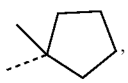
$R_{B9}$
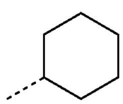
$R_{B10}$
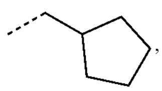
$R_{B11}$
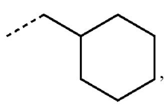
$R_{B12}$
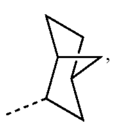
$R_{B13}$
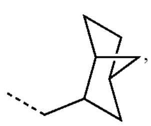
$R_{B14}$
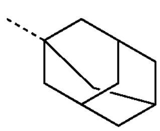
$R_{B15}$
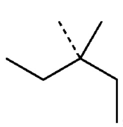
-continued
$R_{B16}$
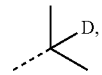
$R_{B17}$
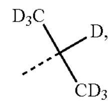
$R_{B18}$
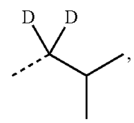
$R_{B19}$
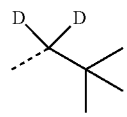
$R_{B20}$
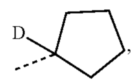
$R_{B21}$
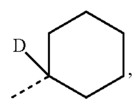
$R_{B22}$
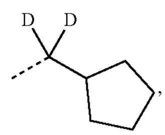
$R_{B23}$
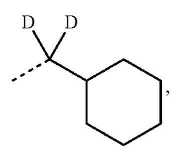
$R_{B24}$
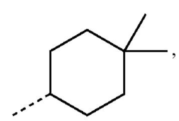
and
$R_{B25}$
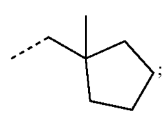
wherein $R_{A1}$ to $R_{A53}$ have the following structures:
$R_{A1}$
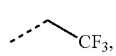
$R_{A2}$
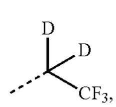
$R_{A3}$
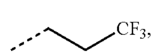

-continued
$R_{A4}$
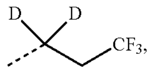
$R_{A5}$
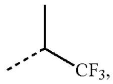
$R_{A6}$
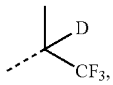
$R_{A7}$
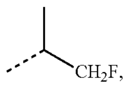
$R_{A8}$
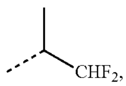
$R_{A9}$
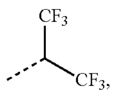
$R_{A10}$
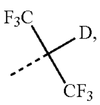
$R_{A11}$
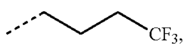
$R_{A12}$
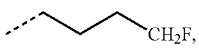
$R_{A13}$
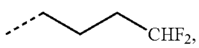
$R_{A14}$
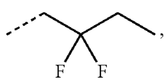
$R_{A15}$
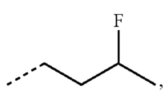
$R_{A16}$
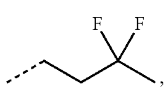
$R_{A17}$
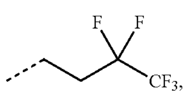
$R_{A18}$
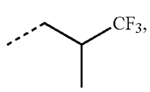
$R_{A19}$
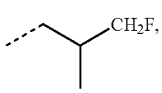
$R_{A20}$
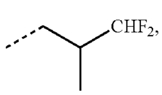
-continued
$R_{A21}$
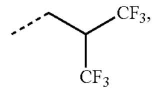
$R_{A22}$
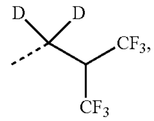
$R_{A23}$
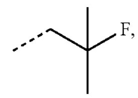
$R_{A24}$
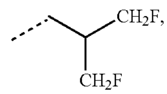
$R_{A25}$
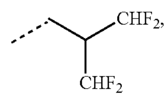
$R_{A26}$
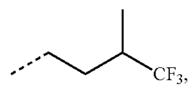
$R_{A27}$
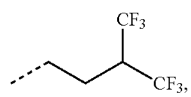
$R_{A28}$
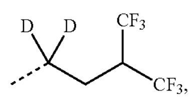
$R_{A29}$
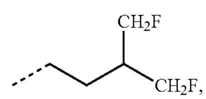
$R_{A30}$
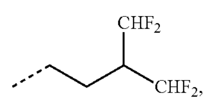
$R_{A31}$
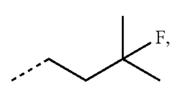
$R_{A32}$
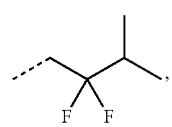
$R_{A33}$
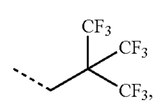
$R_{A34}$
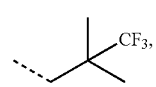

-continued
$R_{A35}$
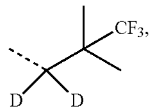
$R_{A36}$
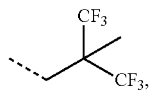
$R_{A37}$
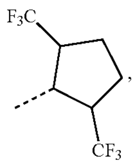
$R_{A38}$
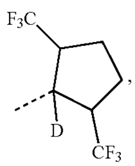
$R_{A39}$
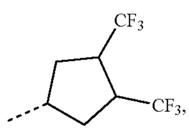
$R_{A40}$
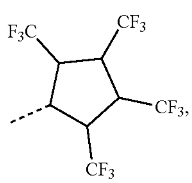
$R_{A41}$
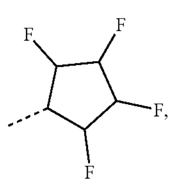
$R_{A42}$
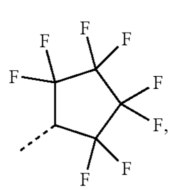
$R_{A43}$
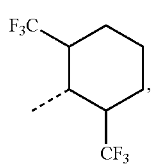
$R_{A44}$
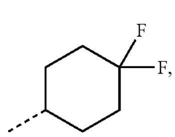
-continued
$R_{A45}$
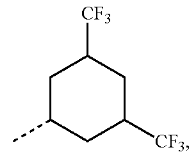
$R_{A46}$
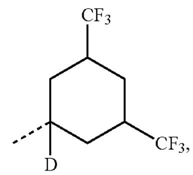
$R_{A47}$
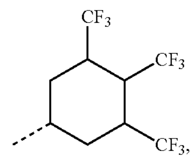
$R_{A48}$
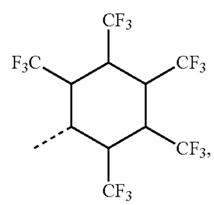
$R_{A49}$
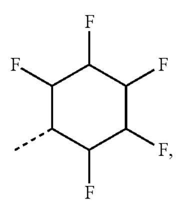
$R_{A50}$
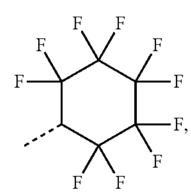
$R_{A51}$
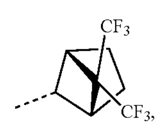
$R_{A52}$
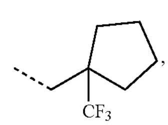
$R_{A53}$
----$CF_3$, and
$R_{A54}$
----F;

wherein $R_{C1}$ to $R_{C11}$ have the following structures:

$R_{C1}$

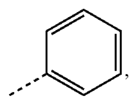

$R_{C2}$

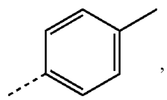

$R_{C3}$

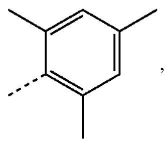

$R_{C4}$

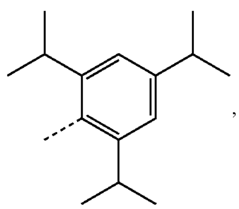

$R_{C5}$

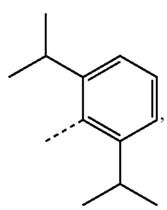

$R_{C6}$

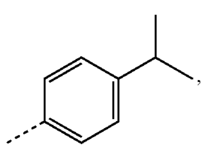

$R_{C7}$

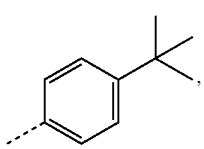

$R_{C8}$

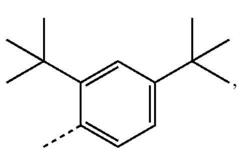

$R_{C9}$

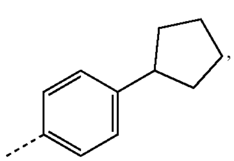

$R_{C10}$

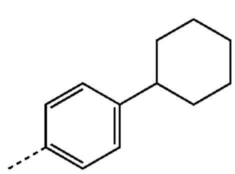

and

-continued $R_{C11}$

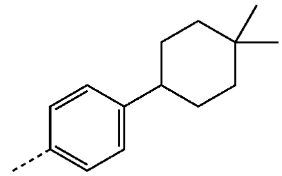

9. The compound of claim 8, wherein the compound is selected from the group consisting of structures of formula $Ir(L_A)_2(L_{Bj})$, wherein $L_A$ is selected from the group consisting of Formula XVIII-$L_{A1171\text{-}O}$ to Formula XVIV-$L_{A1584\text{-}O}$, Formula XVIII-$L_{A1171\text{-}S}$ to Formula XVIV-$L_{A1584\text{-}S}$, Formula XLV-$L_{A1654\text{-}O}$ to Formula L-$L_{A1777\text{-}O}$, Formula XLV-$L_{A1847\text{-}O}$ to Formula L-$L_{A1970\text{-}O}$, Formula XLV-$L_{A1654\text{-}S}$ to Formula L-$L_{A1777\text{-}S}$, and Formula L-$L_{A1847\text{-}S}$ to Formula L-$L_{A1970\text{-}S}$, wherein j is an integer from 1 to 1260; and wherein $L_{B1}$ through $L_{B17}$ are defined as follows:

$L_{B1}$ through $L_{B1260}$ are based on a structure,

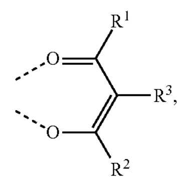

in which $R^1$, $R^2$, and $R^3$ are defined as:

| Ligand | $R^1$ | $R^2$ | $R^3$ |
|---|---|---|---|
| $L_{B1}$ | $R^{D1}$ | $R^{D1}$ | H |
| $L_{B2}$ | $R^{D2}$ | $R^{D2}$ | H |
| $L_{B3}$ | $R^{D3}$ | $R^{D3}$ | H |
| $L_{B4}$ | $R^{D4}$ | $R^{D4}$ | H |
| $L_{B5}$ | $R^{D5}$ | $R^{D5}$ | H |
| $L_{B6}$ | $R^{D6}$ | $R^{D6}$ | H |
| $L_{B7}$ | $R^{D7}$ | $R^{D7}$ | H |
| $L_{B8}$ | $R^{D8}$ | $R^{D8}$ | H |
| $L_{B9}$ | $R^{D9}$ | $R^{D9}$ | H |
| $L_{B10}$ | $R^{D10}$ | $R^{D10}$ | H |
| $L_{B11}$ | $R^{D11}$ | $R^{D11}$ | H |
| $L_{B12}$ | $R^{D12}$ | $R^{D12}$ | H |
| $L_{B13}$ | $R^{D13}$ | $R^{D13}$ | H |
| $L_{B14}$ | $R^{D14}$ | $R^{D14}$ | H |
| $L_{B15}$ | $R^{D15}$ | $R^{D15}$ | H |
| $L_{B16}$ | $R^{D16}$ | $R^{D16}$ | H |
| $L_{B17}$ | $R^{D17}$ | $R^{D17}$ | H |
| $L_{B18}$ | $R^{D18}$ | $R^{D18}$ | H |
| $L_{B19}$ | $R^{D19}$ | $R^{D19}$ | H |
| $L_{B20}$ | $R^{D20}$ | $R^{D20}$ | H |
| $L_{B21}$ | $R^{D21}$ | $R^{D21}$ | H |
| $L_{B22}$ | $R^{D22}$ | $R^{D22}$ | H |
| $L_{B23}$ | $R^{D23}$ | $R^{D23}$ | H |
| $L_{B24}$ | $R^{D24}$ | $R^{D24}$ | H |
| $L_{B25}$ | $R^{D25}$ | $R^{D25}$ | H |
| $L_{B26}$ | $R^{D26}$ | $R^{D26}$ | H |
| $L_{B27}$ | $R^{D27}$ | $R^{D27}$ | H |
| $L_{B28}$ | $R^{D28}$ | $R^{D28}$ | H |
| $L_{B29}$ | $R^{D29}$ | $R^{D29}$ | H |
| $L_{B30}$ | $R^{D30}$ | $R^{D30}$ | H |
| $L_{B31}$ | $R^{D31}$ | $R^{D31}$ | H |
| $L_{B32}$ | $R^{D32}$ | $R^{D32}$ | H |
| $L_{B33}$ | $R^{D33}$ | $R^{D33}$ | H |
| $L_{B34}$ | $R^{D34}$ | $R^{D34}$ | H |
| $L_{B35}$ | $R^{D35}$ | $R^{D35}$ | H |
| $L_{B36}$ | $R^{D40}$ | $R^{D40}$ | H |
| $L_{B37}$ | $R^{D41}$ | $R^{D41}$ | H |
| $L_{B38}$ | $R^{D42}$ | $R^{D42}$ | H |

-continued

| Ligand | $R^1$ | $R^2$ | $R^3$ |
|---|---|---|---|
| $L_{B39}$ | $R^{D64}$ | $R^{D64}$ | H |
| $L_{B40}$ | $R^{D66}$ | $R^{D66}$ | H |
| $L_{B41}$ | $R^{D68}$ | $R^{D68}$ | H |
| $L_{B42}$ | $R^{D76}$ | $R^{D76}$ | H |
| $L_{B43}$ | $R^{D1}$ | $R^{D2}$ | H |
| $L_{B44}$ | $R^{D1}$ | $R^{D3}$ | H |
| $L_{B45}$ | $R^{D1}$ | $R^{D4}$ | H |
| $L_{B46}$ | $R^{D1}$ | $R^{D5}$ | H |
| $L_{B47}$ | $R^{D1}$ | $R^{D6}$ | H |
| $L_{B48}$ | $R^{D1}$ | $R^{D7}$ | H |
| $L_{B49}$ | $R^{D1}$ | $R^{D8}$ | H |
| $L_{B50}$ | $R^{D1}$ | $R^{D9}$ | H |
| $L_{B51}$ | $R^{D1}$ | $R^{D10}$ | H |
| $L_{B52}$ | $R^{D1}$ | $R^{D11}$ | H |
| $L_{B53}$ | $R^{D1}$ | $R^{D12}$ | H |
| $L_{B54}$ | $R^{D1}$ | $R^{D13}$ | H |
| $L_{B55}$ | $R^{D1}$ | $R^{D14}$ | H |
| $L_{B56}$ | $R^{D1}$ | $R^{D15}$ | H |
| $L_{B57}$ | $R^{D1}$ | $R^{D16}$ | H |
| $L_{B58}$ | $R^{D1}$ | $R^{D17}$ | H |
| $L_{B59}$ | $R^{D1}$ | $R^{D18}$ | H |
| $L_{B60}$ | $R^{D1}$ | $R^{D19}$ | H |
| $L_{B61}$ | $R^{D1}$ | $R^{D20}$ | H |
| $L_{B62}$ | $R^{D1}$ | $R^{D21}$ | H |
| $L_{B63}$ | $R^{D1}$ | $R^{D22}$ | H |
| $L_{B64}$ | $R^{D1}$ | $R^{D23}$ | H |
| $L_{B65}$ | $R^{D1}$ | $R^{D24}$ | H |
| $L_{B66}$ | $R^{D1}$ | $R^{D25}$ | H |
| $L_{B67}$ | $R^{D1}$ | $R^{D26}$ | H |
| $L_{B68}$ | $R^{D1}$ | $R^{D27}$ | H |
| $L_{B69}$ | $R^{D1}$ | $R^{D28}$ | H |
| $L_{B70}$ | $R^{D1}$ | $R^{D29}$ | H |
| $L_{B71}$ | $R^{D1}$ | $R^{D30}$ | H |
| $L_{B72}$ | $R^{D1}$ | $R^{D31}$ | H |
| $L_{B73}$ | $R^{D1}$ | $R^{D32}$ | H |
| $L_{B74}$ | $R^{D1}$ | $R^{D33}$ | H |
| $L_{B75}$ | $R^{D1}$ | $R^{D34}$ | H |
| $L_{B76}$ | $R^{D1}$ | $R^{D35}$ | H |
| $L_{B77}$ | $R^{D1}$ | $R^{D40}$ | H |
| $L_{B78}$ | $R^{D1}$ | $R^{D41}$ | H |
| $L_{B79}$ | $R^{D1}$ | $R^{D42}$ | H |
| $L_{B80}$ | $R^{D1}$ | $R^{D64}$ | H |
| $L_{B81}$ | $R^{D1}$ | $R^{D66}$ | H |
| $L_{B82}$ | $R^{D1}$ | $R^{D68}$ | H |
| $L_{B83}$ | $R^{D1}$ | $R^{D76}$ | H |
| $L_{B84}$ | $R^{D2}$ | $R^{D1}$ | H |
| $L_{B85}$ | $R^{D2}$ | $R^{D3}$ | H |
| $L_{B86}$ | $R^{D2}$ | $R^{D4}$ | H |
| $L_{B87}$ | $R^{D2}$ | $R^{D5}$ | H |
| $L_{B88}$ | $R^{D2}$ | $R^{D6}$ | H |
| $L_{B89}$ | $R^{D2}$ | $R^{D7}$ | H |
| $L_{B90}$ | $R^{D2}$ | $R^{D8}$ | H |
| $L_{B91}$ | $R^{D2}$ | $R^{D9}$ | H |
| $L_{B92}$ | $R^{D2}$ | $R^{D10}$ | H |
| $L_{B93}$ | $R^{D2}$ | $R^{D11}$ | H |
| $L_{B94}$ | $R^{D2}$ | $R^{D12}$ | H |
| $L_{B95}$ | $R^{D2}$ | $R^{D13}$ | H |
| $L_{B96}$ | $R^{D2}$ | $R^{D14}$ | H |
| $L_{B97}$ | $R^{D2}$ | $R^{D15}$ | H |
| $L_{B98}$ | $R^{D2}$ | $R^{D16}$ | H |
| $L_{B99}$ | $R^{D2}$ | $R^{D17}$ | H |
| $L_{B100}$ | $R^{D2}$ | $R^{D18}$ | H |
| $L_{B101}$ | $R^{D2}$ | $R^{D19}$ | H |
| $L_{B102}$ | $R^{D2}$ | $R^{D20}$ | H |
| $L_{B103}$ | $R^{D2}$ | $R^{D21}$ | H |
| $L_{B104}$ | $R^{D2}$ | $R^{D22}$ | H |
| $L_{B105}$ | $R^{D2}$ | $R^{D23}$ | H |
| $L_{B106}$ | $R^{D2}$ | $R^{D24}$ | H |
| $L_{B107}$ | $R^{D2}$ | $R^{D25}$ | H |
| $L_{B108}$ | $R^{D2}$ | $R^{D26}$ | H |
| $L_{B109}$ | $R^{D2}$ | $R^{D27}$ | H |
| $L_{B110}$ | $R^{D2}$ | $R^{D28}$ | H |
| $L_{B111}$ | $R^{D2}$ | $R^{D29}$ | H |
| $L_{B112}$ | $R^{D2}$ | $R^{D30}$ | H |
| $L_{B113}$ | $R^{D2}$ | $R^{D31}$ | H |
| $L_{B114}$ | $R^{D2}$ | $R^{D32}$ | H |
| $L_{B115}$ | $R^{D2}$ | $R^{D33}$ | H |

-continued

| Ligand | $R^1$ | $R^2$ | $R^3$ |
|---|---|---|---|
| $L_{B116}$ | $R^{D2}$ | $R^{D34}$ | H |
| $L_{B117}$ | $R^{D2}$ | $R^{D35}$ | H |
| $L_{B118}$ | $R^{D2}$ | $R^{D40}$ | H |
| $L_{B119}$ | $R^{D2}$ | $R^{D41}$ | H |
| $L_{B120}$ | $R^{D2}$ | $R^{D42}$ | H |
| $L_{B121}$ | $R^{D2}$ | $R^{D64}$ | H |
| $L_{B122}$ | $R^{D2}$ | $R^{D66}$ | H |
| $L_{B123}$ | $R^{D2}$ | $R^{D68}$ | H |
| $L_{B124}$ | $R^{D2}$ | $R^{D76}$ | H |
| $L_{B125}$ | $R^{D3}$ | $R^{D4}$ | H |
| $L_{B126}$ | $R^{D3}$ | $R^{D5}$ | H |
| $L_{B127}$ | $R^{D3}$ | $R^{D6}$ | H |
| $L_{B128}$ | $R^{D3}$ | $R^{D7}$ | H |
| $L_{B129}$ | $R^{D3}$ | $R^{D8}$ | H |
| $L_{B130}$ | $R^{D3}$ | $R^{D9}$ | H |
| $L_{B131}$ | $R^{D3}$ | $R^{D10}$ | H |
| $L_{B132}$ | $R^{D3}$ | $R^{D11}$ | H |
| $L_{B133}$ | $R^{D3}$ | $R^{D12}$ | H |
| $L_{B134}$ | $R^{D3}$ | $R^{D13}$ | H |
| $L_{B135}$ | $R^{D3}$ | $R^{D14}$ | H |
| $L_{B136}$ | $R^{D3}$ | $R^{D15}$ | H |
| $L_{B137}$ | $R^{D3}$ | $R^{D16}$ | H |
| $L_{B138}$ | $R^{D3}$ | $R^{D17}$ | H |
| $L_{B139}$ | $R^{D3}$ | $R^{D18}$ | H |
| $L_{B140}$ | $R^{D3}$ | $R^{D19}$ | H |
| $L_{B141}$ | $R^{D3}$ | $R^{D20}$ | H |
| $L_{B142}$ | $R^{D3}$ | $R^{D21}$ | H |
| $L_{B143}$ | $R^{D3}$ | $R^{D22}$ | H |
| $L_{B144}$ | $R^{D3}$ | $R^{D23}$ | H |
| $L_{B145}$ | $R^{D3}$ | $R^{D24}$ | H |
| $L_{B146}$ | $R^{D3}$ | $R^{D25}$ | H |
| $L_{B147}$ | $R^{D3}$ | $R^{D26}$ | H |
| $L_{B148}$ | $R^{D3}$ | $R^{D27}$ | H |
| $L_{B149}$ | $R^{D3}$ | $R^{D28}$ | H |
| $L_{B150}$ | $R^{D3}$ | $R^{D29}$ | H |
| $L_{B151}$ | $R^{D3}$ | $R^{D30}$ | H |
| $L_{B152}$ | $R^{D3}$ | $R^{D31}$ | H |
| $L_{B153}$ | $R^{D3}$ | $R^{D32}$ | H |
| $L_{B154}$ | $R^{D3}$ | $R^{D33}$ | H |
| $L_{B155}$ | $R^{D3}$ | $R^{D34}$ | H |
| $L_{B156}$ | $R^{D3}$ | $R^{D35}$ | H |
| $L_{B157}$ | $R^{D3}$ | $R^{D40}$ | H |
| $L_{B158}$ | $R^{D3}$ | $R^{D41}$ | H |
| $L_{B159}$ | $R^{D3}$ | $R^{D42}$ | H |
| $L_{B160}$ | $R^{D3}$ | $R^{D64}$ | H |
| $L_{B161}$ | $R^{D3}$ | $R^{D66}$ | H |
| $L_{B162}$ | $R^{D3}$ | $R^{D68}$ | H |
| $L_{B163}$ | $R^{D3}$ | $R^{D76}$ | H |
| $L_{B164}$ | $R^{D4}$ | $R^{D5}$ | H |
| $L_{B165}$ | $R^{D4}$ | $R^{D6}$ | H |
| $L_{B166}$ | $R^{D4}$ | $R^{D7}$ | H |
| $L_{B167}$ | $R^{D4}$ | $R^{D8}$ | H |
| $L_{B168}$ | $R^{D4}$ | $R^{D9}$ | H |
| $L_{B169}$ | $R^{D4}$ | $R^{D10}$ | H |
| $L_{B170}$ | $R^{D4}$ | $R^{D11}$ | H |
| $L_{B171}$ | $R^{D4}$ | $R^{D12}$ | H |
| $L_{B172}$ | $R^{D4}$ | $R^{D13}$ | H |
| $L_{B173}$ | $R^{D4}$ | $R^{D14}$ | H |
| $L_{B174}$ | $R^{D4}$ | $R^{D15}$ | H |
| $L_{B175}$ | $R^{D4}$ | $R^{D16}$ | H |
| $L_{B176}$ | $R^{D4}$ | $R^{D17}$ | H |
| $L_{B177}$ | $R^{D4}$ | $R^{D18}$ | H |
| $L_{B178}$ | $R^{D4}$ | $R^{D19}$ | H |
| $L_{B179}$ | $R^{D4}$ | $R^{D20}$ | H |
| $L_{B180}$ | $R^{D4}$ | $R^{D21}$ | H |
| $L_{B181}$ | $R^{D4}$ | $R^{D22}$ | H |
| $L_{B182}$ | $R^{D4}$ | $R^{D23}$ | H |
| $L_{B183}$ | $R^{D4}$ | $R^{D24}$ | H |
| $L_{B184}$ | $R^{D4}$ | $R^{D25}$ | H |
| $L_{B185}$ | $R^{D4}$ | $R^{D26}$ | H |
| $L_{B186}$ | $R^{D4}$ | $R^{D27}$ | H |
| $L_{B187}$ | $R^{D4}$ | $R^{D28}$ | H |
| $L_{B188}$ | $R^{D4}$ | $R^{D29}$ | H |
| $L_{B189}$ | $R^{D4}$ | $R^{D30}$ | H |
| $L_{B190}$ | $R^{D4}$ | $R^{D31}$ | H |
| $L_{B191}$ | $R^{D4}$ | $R^{D32}$ | H |
| $L_{B192}$ | $R^{D4}$ | $R^{D33}$ | H |

-continued

| Ligand | $R^1$ | $R^2$ | $R^3$ |
|---|---|---|---|
| $L_{B193}$ | $R^{D4}$ | $R^{D34}$ | H |
| $L_{B194}$ | $R^{D4}$ | $R^{D35}$ | H |
| $L_{B195}$ | $R^{D4}$ | $R^{D40}$ | H |
| $L_{B196}$ | $R^{D4}$ | $R^{D41}$ | H |
| $L_{B197}$ | $R^{D4}$ | $R^{D42}$ | H |
| $L_{B198}$ | $R^{D4}$ | $R^{D64}$ | H |
| $L_{B199}$ | $R^{D4}$ | $R^{D66}$ | H |
| $L_{B200}$ | $R^{D4}$ | $R^{D68}$ | H |
| $L_{B201}$ | $R^{D4}$ | $R^{D76}$ | H |
| $L_{B202}$ | $R^{D4}$ | $R^{D1}$ | H |
| $L_{B203}$ | $R^{D7}$ | $R^{D5}$ | H |
| $L_{B204}$ | $R^{D7}$ | $R^{D6}$ | H |
| $L_{B205}$ | $R^{D7}$ | $R^{D8}$ | H |
| $L_{B206}$ | $R^{D7}$ | $R^{D9}$ | H |
| $L_{B207}$ | $R^{D7}$ | $R^{D10}$ | H |
| $L_{B208}$ | $R^{D7}$ | $R^{D11}$ | H |
| $L_{B209}$ | $R^{D7}$ | $R^{D12}$ | H |
| $L_{B210}$ | $R^{D7}$ | $R^{D13}$ | H |
| $L_{B211}$ | $R^{D7}$ | $R^{D14}$ | H |
| $L_{B212}$ | $R^{D7}$ | $R^{D15}$ | H |
| $L_{B213}$ | $R^{D7}$ | $R^{D16}$ | H |
| $L_{B214}$ | $R^{D7}$ | $R^{D17}$ | H |
| $L_{B215}$ | $R^{D7}$ | $R^{D18}$ | H |
| $L_{B216}$ | $R^{D7}$ | $R^{D19}$ | H |
| $L_{B217}$ | $R^{D7}$ | $R^{D20}$ | H |
| $L_{B218}$ | $R^{D7}$ | $R^{D21}$ | H |
| $L_{B219}$ | $R^{D7}$ | $R^{D22}$ | H |
| $L_{B220}$ | $R^{D7}$ | $R^{D23}$ | H |
| $L_{B221}$ | $R^{D7}$ | $R^{D24}$ | H |
| $L_{B222}$ | $R^{D7}$ | $R^{D25}$ | H |
| $L_{B223}$ | $R^{D7}$ | $R^{D26}$ | H |
| $L_{B224}$ | $R^{D7}$ | $R^{D27}$ | H |
| $L_{B225}$ | $R^{D7}$ | $R^{D28}$ | H |
| $L_{B226}$ | $R^{D7}$ | $R^{D29}$ | H |
| $L_{B227}$ | $R^{D7}$ | $R^{D30}$ | H |
| $L_{B228}$ | $R^{D7}$ | $R^{D31}$ | H |
| $L_{B229}$ | $R^{D7}$ | $R^{D32}$ | H |
| $L_{B230}$ | $R^{D7}$ | $R^{D33}$ | H |
| $L_{B231}$ | $R^{D7}$ | $R^{D34}$ | H |
| $L_{B232}$ | $R^{D7}$ | $R^{D35}$ | H |
| $L_{B233}$ | $R^{D7}$ | $R^{D40}$ | H |
| $L_{B234}$ | $R^{D7}$ | $R^{D41}$ | H |
| $L_{B235}$ | $R^{D7}$ | $R^{D42}$ | H |
| $L_{B236}$ | $R^{D7}$ | $R^{D64}$ | H |
| $L_{B237}$ | $R^{D7}$ | $R^{D66}$ | H |
| $L_{B238}$ | $R^{D7}$ | $R^{D68}$ | H |
| $L_{B239}$ | $R^{D7}$ | $R^{D76}$ | H |
| $L_{B240}$ | $R^{D8}$ | $R^{D5}$ | H |
| $L_{B241}$ | $R^{D8}$ | $R^{D6}$ | H |
| $L_{B242}$ | $R^{D8}$ | $R^{D9}$ | H |
| $L_{B243}$ | $R^{D8}$ | $R^{D10}$ | H |
| $L_{B244}$ | $R^{D8}$ | $R^{D11}$ | H |
| $L_{B245}$ | $R^{D8}$ | $R^{D12}$ | H |
| $L_{B246}$ | $R^{D8}$ | $R^{D13}$ | H |
| $L_{B247}$ | $R^{D8}$ | $R^{D14}$ | H |
| $L_{B248}$ | $R^{D8}$ | $R^{D15}$ | H |
| $L_{B249}$ | $R^{D8}$ | $R^{D16}$ | H |
| $L_{B250}$ | $R^{D8}$ | $R^{D17}$ | H |
| $L_{B251}$ | $R^{D8}$ | $R^{D18}$ | H |
| $L_{B252}$ | $R^{D8}$ | $R^{D19}$ | H |
| $L_{B253}$ | $R^{D8}$ | $R^{D20}$ | H |
| $L_{B254}$ | $R^{D8}$ | $R^{D21}$ | H |
| $L_{B255}$ | $R^{D8}$ | $R^{D22}$ | H |
| $L_{B256}$ | $R^{D8}$ | $R^{D23}$ | H |
| $L_{B257}$ | $R^{D8}$ | $R^{D24}$ | H |
| $L_{B258}$ | $R^{D8}$ | $R^{D25}$ | H |
| $L_{B259}$ | $R^{D8}$ | $R^{D26}$ | H |
| $L_{B260}$ | $R^{D8}$ | $R^{D27}$ | H |
| $L_{B261}$ | $R^{D8}$ | $R^{D28}$ | H |
| $L_{B262}$ | $R^{D8}$ | $R^{D29}$ | H |
| $L_{B263}$ | $R^{D8}$ | $R^{D30}$ | H |
| $L_{B264}$ | $R^{D8}$ | $R^{D31}$ | H |
| $L_{B265}$ | $R^{D8}$ | $R^{D32}$ | H |
| $L_{B266}$ | $R^{D8}$ | $R^{D33}$ | H |
| $L_{B267}$ | $R^{D8}$ | $R^{D34}$ | H |
| $L_{B268}$ | $R^{D8}$ | $R^{D35}$ | H |
| $L_{B269}$ | $R^{D8}$ | $R^{D40}$ | H |
| $L_{B270}$ | $R^{D8}$ | $R^{D41}$ | H |
| $L_{B271}$ | $R^{D8}$ | $R^{D42}$ | H |
| $L_{B272}$ | $R^{D8}$ | $R^{D64}$ | H |
| $L_{B273}$ | $R^{D8}$ | $R^{D66}$ | H |
| $L_{B274}$ | $R^{D8}$ | $R^{D68}$ | H |
| $L_{B275}$ | $R^{D8}$ | $R^{D76}$ | H |
| $L_{B276}$ | $R^{D11}$ | $R^{D5}$ | H |
| $L_{B277}$ | $R^{D11}$ | $R^{D6}$ | H |
| $L_{B278}$ | $R^{D11}$ | $R^{D9}$ | H |
| $L_{B279}$ | $R^{D11}$ | $R^{D10}$ | H |
| $L_{B280}$ | $R^{D11}$ | $R^{D12}$ | H |
| $L_{B281}$ | $R^{D11}$ | $R^{D13}$ | H |
| $L_{B282}$ | $R^{D11}$ | $R^{D14}$ | H |
| $L_{B283}$ | $R^{D11}$ | $R^{D15}$ | H |
| $L_{B284}$ | $R^{D11}$ | $R^{D16}$ | H |
| $L_{B285}$ | $R^{D11}$ | $R^{D17}$ | H |
| $L_{B286}$ | $R^{D11}$ | $R^{D18}$ | H |
| $L_{B287}$ | $R^{D11}$ | $R^{D19}$ | H |
| $L_{B288}$ | $R^{D11}$ | $R^{D20}$ | H |
| $L_{B289}$ | $R^{D11}$ | $R^{D21}$ | H |
| $L_{B290}$ | $R^{D11}$ | $R^{D22}$ | H |
| $L_{B291}$ | $R^{D11}$ | $R^{D23}$ | H |
| $L_{B292}$ | $R^{D11}$ | $R^{D24}$ | H |
| $L_{B293}$ | $R^{D11}$ | $R^{D25}$ | H |
| $L_{B294}$ | $R^{D11}$ | $R^{D26}$ | H |
| $L_{B295}$ | $R^{D11}$ | $R^{D27}$ | H |
| $L_{B296}$ | $R^{D11}$ | $R^{D28}$ | H |
| $L_{B297}$ | $R^{D11}$ | $R^{D29}$ | H |
| $L_{B298}$ | $R^{D11}$ | $R^{D30}$ | H |
| $L_{B299}$ | $R^{D11}$ | $R^{D31}$ | H |
| $L_{B300}$ | $R^{D11}$ | $R^{D32}$ | H |
| $L_{B301}$ | $R^{D11}$ | $R^{D33}$ | H |
| $L_{B302}$ | $R^{D11}$ | $R^{D34}$ | H |
| $L_{B303}$ | $R^{D11}$ | $R^{D35}$ | H |
| $L_{B304}$ | $R^{D11}$ | $R^{D40}$ | H |
| $L_{B305}$ | $R^{D11}$ | $R^{D41}$ | H |
| $L_{B306}$ | $R^{D11}$ | $R^{D42}$ | H |
| $L_{B307}$ | $R^{D11}$ | $R^{D64}$ | H |
| $L_{B308}$ | $R^{D11}$ | $R^{D66}$ | H |
| $L_{B309}$ | $R^{D11}$ | $R^{D68}$ | H |
| $L_{B310}$ | $R^{D11}$ | $R^{D76}$ | H |
| $L_{B311}$ | $R^{D13}$ | $R^{D5}$ | H |
| $L_{B312}$ | $R^{D13}$ | $R^{D6}$ | H |
| $L_{B313}$ | $R^{D13}$ | $R^{D9}$ | H |
| $L_{B314}$ | $R^{D13}$ | $R^{D10}$ | H |
| $L_{B315}$ | $R^{D13}$ | $R^{D12}$ | H |
| $L_{B316}$ | $R^{D13}$ | $R^{D14}$ | H |
| $L_{B317}$ | $R^{D13}$ | $R^{D15}$ | H |
| $L_{B318}$ | $R^{D13}$ | $R^{D16}$ | H |
| $L_{B319}$ | $R^{D13}$ | $R^{D17}$ | H |
| $L_{B320}$ | $R^{D13}$ | $R^{D18}$ | H |
| $L_{B321}$ | $R^{D13}$ | $R^{D19}$ | H |
| $L_{B322}$ | $R^{D13}$ | $R^{D0}$ | H |
| $L_{B323}$ | $R^{D13}$ | $R^{D21}$ | H |
| $L_{B324}$ | $R^{D13}$ | $R^{D22}$ | H |
| $L_{B325}$ | $R^{D13}$ | $R^{D23}$ | H |
| $L_{B326}$ | $R^{D13}$ | $R^{D24}$ | H |
| $L_{B327}$ | $R^{D13}$ | $R^{D25}$ | H |
| $L_{B328}$ | $R^{D13}$ | $R^{D26}$ | H |
| $L_{B329}$ | $R^{D13}$ | $R^{D27}$ | H |
| $L_{B330}$ | $R^{D13}$ | $R^{D28}$ | H |
| $L_{B331}$ | $R^{D13}$ | $R^{D29}$ | H |
| $L_{B332}$ | $R^{D13}$ | $R^{D30}$ | H |
| $L_{B333}$ | $R^{D13}$ | $R^{D31}$ | H |
| $L_{B334}$ | $R^{D13}$ | $R^{D32}$ | H |
| $L_{B335}$ | $R^{D13}$ | $R^{D33}$ | H |
| $L_{B336}$ | $R^{D13}$ | $R^{D34}$ | H |
| $L_{B337}$ | $R^{D13}$ | $R^{D35}$ | H |
| $L_{B338}$ | $R^{D13}$ | $R^{D40}$ | H |
| $L_{B339}$ | $R^{D13}$ | $R^{D41}$ | H |
| $L_{B340}$ | $R^{D13}$ | $R^{D42}$ | H |
| $L_{B341}$ | $R^{D13}$ | $R^{D64}$ | H |
| $L_{B342}$ | $R^{D13}$ | $R^{D66}$ | H |
| $L_{B343}$ | $R^{D13}$ | $R^{D68}$ | H |
| $L_{B344}$ | $R^{D13}$ | $R^{D76}$ | H |
| $L_{B345}$ | $R^{D14}$ | $R^{D5}$ | H |
| $L_{B346}$ | $R^{D14}$ | $R^{D6}$ | H |

-continued

| Ligand | $R^1$ | $R^2$ | $R^3$ |
|---|---|---|---|
| $L_{B347}$ | $R^{D14}$ | $R^{D9}$ | H |
| $L_{B348}$ | $R^{D14}$ | $R^{D10}$ | H |
| $L_{B349}$ | $R^{D14}$ | $R^{D12}$ | H |
| $L_{B350}$ | $R^{D14}$ | $R^{D15}$ | H |
| $L_{B351}$ | $R^{D14}$ | $R^{D16}$ | H |
| $L_{B352}$ | $R^{D14}$ | $R^{D17}$ | H |
| $L_{B353}$ | $R^{D14}$ | $R^{D18}$ | H |
| $L_{B354}$ | $R^{D14}$ | $R^{D19}$ | H |
| $L_{B355}$ | $R^{D14}$ | $R^{D20}$ | H |
| $L_{B356}$ | $R^{D14}$ | $R^{D21}$ | H |
| $L_{B357}$ | $R^{D14}$ | $R^{D22}$ | H |
| $L_{B358}$ | $R^{D14}$ | $R^{D23}$ | H |
| $L_{B359}$ | $R^{D14}$ | $R^{D24}$ | H |
| $L_{B360}$ | $R^{D14}$ | $R^{D25}$ | H |
| $L_{B361}$ | $R^{D14}$ | $R^{D26}$ | H |
| $L_{B362}$ | $R^{D14}$ | $R^{D27}$ | H |
| $L_{B363}$ | $R^{D14}$ | $R^{D28}$ | H |
| $L_{B364}$ | $R^{D14}$ | $R^{D29}$ | H |
| $L_{B365}$ | $R^{D14}$ | $R^{D30}$ | H |
| $L_{B366}$ | $R^{D14}$ | $R^{D31}$ | H |
| $L_{B367}$ | $R^{D14}$ | $R^{D32}$ | H |
| $L_{B368}$ | $R^{D14}$ | $R^{D33}$ | H |
| $L_{B369}$ | $R^{D14}$ | $R^{D34}$ | H |
| $L_{B370}$ | $R^{D14}$ | $R^{D35}$ | H |
| $L_{B371}$ | $R^{D14}$ | $R^{D40}$ | H |
| $L_{B372}$ | $R^{D14}$ | $R^{D41}$ | H |
| $L_{B373}$ | $R^{D14}$ | $R^{D42}$ | H |
| $L_{B374}$ | $R^{D14}$ | $R^{D64}$ | H |
| $L_{B375}$ | $R^{D14}$ | $R^{D66}$ | H |
| $L_{B376}$ | $R^{D14}$ | $R^{D68}$ | H |
| $L_{B377}$ | $R^{D14}$ | $R^{D76}$ | H |
| $L_{B378}$ | $R^{D22}$ | $R^{D5}$ | H |
| $L_{B379}$ | $R^{D22}$ | $R^{D6}$ | H |
| $L_{B380}$ | $R^{D22}$ | $R^{D9}$ | H |
| $L_{B381}$ | $R^{D22}$ | $R^{D10}$ | H |
| $L_{B382}$ | $R^{D22}$ | $R^{D12}$ | H |
| $L_{B383}$ | $R^{D22}$ | $R^{D15}$ | H |
| $L_{B384}$ | $R^{D22}$ | $R^{D16}$ | H |
| $L_{B385}$ | $R^{D22}$ | $R^{D17}$ | H |
| $L_{B386}$ | $R^{D22}$ | $R^{D18}$ | H |
| $L_{B387}$ | $R^{D22}$ | $R^{D19}$ | H |
| $L_{B388}$ | $R^{D22}$ | $R^{D20}$ | H |
| $L_{B389}$ | $R^{D22}$ | $R^{D21}$ | H |
| $L_{B390}$ | $R^{D22}$ | $R^{D23}$ | H |
| $L_{B391}$ | $R^{D22}$ | $R^{D24}$ | H |
| $L_{B392}$ | $R^{D22}$ | $R^{D25}$ | H |
| $L_{B393}$ | $R^{D22}$ | $R^{D26}$ | H |
| $L_{B394}$ | $R^{D22}$ | $R^{D27}$ | H |
| $L_{B395}$ | $R^{D22}$ | $R^{D28}$ | H |
| $L_{B396}$ | $R^{D22}$ | $R^{D29}$ | H |
| $L_{B397}$ | $R^{D22}$ | $R^{D30}$ | H |
| $L_{B398}$ | $R^{D22}$ | $R^{D31}$ | H |
| $L_{B399}$ | $R^{D22}$ | $R^{D32}$ | H |
| $L_{B400}$ | $R^{D22}$ | $R^{D33}$ | H |
| $L_{B401}$ | $R^{D22}$ | $R^{D34}$ | H |
| $L_{B402}$ | $R^{D22}$ | $R^{D35}$ | H |
| $L_{B403}$ | $R^{D22}$ | $R^{D40}$ | H |
| $L_{B404}$ | $R^{D22}$ | $R^{D41}$ | H |
| $L_{B405}$ | $R^{D22}$ | $R^{D42}$ | H |
| $L_{B406}$ | $R^{D22}$ | $R^{D64}$ | H |
| $L_{B407}$ | $R^{D22}$ | $R^{D66}$ | H |
| $L_{B408}$ | $R^{D22}$ | $R^{D68}$ | H |
| $L_{B409}$ | $R^{D22}$ | $R^{D76}$ | H |
| $L_{B410}$ | $R^{D26}$ | $R^{D5}$ | H |
| $L_{B411}$ | $R^{D26}$ | $R^{D6}$ | H |
| $L_{B412}$ | $R^{D26}$ | $R^{D9}$ | H |
| $L_{B413}$ | $R^{D26}$ | $R^{D10}$ | H |
| $L_{B414}$ | $R^{D26}$ | $R^{D12}$ | H |
| $L_{B415}$ | $R^{D26}$ | $R^{D15}$ | H |
| $L_{B416}$ | $R^{D26}$ | $R^{D16}$ | H |
| $L_{B417}$ | $R^{D26}$ | $R^{D17}$ | H |
| $L_{B418}$ | $R^{D26}$ | $R^{D18}$ | H |
| $L_{B419}$ | $R^{D26}$ | $R^{D19}$ | H |
| $L_{B420}$ | $R^{D26}$ | $R^{D20}$ | H |
| $L_{B421}$ | $R^{D26}$ | $R^{D21}$ | H |
| $L_{B422}$ | $R^{D26}$ | $R^{D23}$ | H |
| $L_{B423}$ | $R^{D26}$ | $R^{D24}$ | H |

-continued

| Ligand | $R^1$ | $R^2$ | $R^3$ |
|---|---|---|---|
| $L_{B424}$ | $R^{D26}$ | $R^{D25}$ | H |
| $L_{B425}$ | $R^{D26}$ | $R^{D27}$ | H |
| $L_{B426}$ | $R^{D26}$ | $R^{D28}$ | H |
| $L_{B427}$ | $R^{D26}$ | $R^{D29}$ | H |
| $L_{B428}$ | $R^{D26}$ | $R^{D30}$ | H |
| $L_{B429}$ | $R^{D26}$ | $R^{D31}$ | H |
| $L_{B430}$ | $R^{D26}$ | $R^{D32}$ | H |
| $L_{B431}$ | $R^{D26}$ | $R^{D33}$ | H |
| $L_{B432}$ | $R^{D26}$ | $R^{D34}$ | H |
| $L_{B433}$ | $R^{D26}$ | $R^{D35}$ | H |
| $L_{B434}$ | $R^{D26}$ | $R^{D40}$ | H |
| $L_{B435}$ | $R^{D26}$ | $R^{D41}$ | H |
| $L_{B436}$ | $R^{D26}$ | $R^{D42}$ | H |
| $L_{B437}$ | $R^{D26}$ | $R^{D64}$ | H |
| $L_{B438}$ | $R^{D26}$ | $R^{D66}$ | H |
| $L_{B439}$ | $R^{D26}$ | $R^{D68}$ | H |
| $L_{B440}$ | $R^{D26}$ | $R^{D76}$ | H |
| $L_{B441}$ | $R^{D35}$ | $R^{D5}$ | H |
| $L_{B442}$ | $R^{D35}$ | $R^{D6}$ | H |
| $L_{B443}$ | $R^{D35}$ | $R^{D9}$ | H |
| $L_{B444}$ | $R^{D35}$ | $R^{D10}$ | H |
| $L_{B445}$ | $R^{D35}$ | $R^{D12}$ | H |
| $L_{B446}$ | $R^{D35}$ | $R^{D15}$ | H |
| $L_{B447}$ | $R^{D35}$ | $R^{D16}$ | H |
| $L_{B448}$ | $R^{D35}$ | $R^{D17}$ | H |
| $L_{B449}$ | $R^{D35}$ | $R^{D18}$ | H |
| $L_{B450}$ | $R^{D35}$ | $R^{D19}$ | H |
| $L_{B451}$ | $R^{D35}$ | $R^{D20}$ | H |
| $L_{B452}$ | $R^{D35}$ | $R^{D21}$ | H |
| $L_{B453}$ | $R^{D35}$ | $R^{D23}$ | H |
| $L_{B454}$ | $R^{D35}$ | $R^{D24}$ | H |
| $L_{B455}$ | $R^{D35}$ | $R^{D25}$ | H |
| $L_{B456}$ | $R^{D35}$ | $R^{D27}$ | H |
| $L_{B457}$ | $R^{D35}$ | $R^{D28}$ | H |
| $L_{B458}$ | $R^{D35}$ | $R^{D29}$ | H |
| $L_{B459}$ | $R^{D35}$ | $R^{D30}$ | H |
| $L_{B460}$ | $R^{D35}$ | $R^{D31}$ | H |
| $L_{B461}$ | $R^{D35}$ | $R^{D32}$ | H |
| $L_{B462}$ | $R^{D35}$ | $R^{D33}$ | H |
| $L_{B463}$ | $R^{D35}$ | $R^{D34}$ | H |
| $L_{B464}$ | $R^{D35}$ | $R^{D40}$ | H |
| $L_{B465}$ | $R^{D35}$ | $R^{D41}$ | H |
| $L_{B466}$ | $R^{D35}$ | $R^{D42}$ | H |
| $L_{B467}$ | $R^{D35}$ | $R^{D64}$ | H |
| $L_{B468}$ | $R^{D35}$ | $R^{D66}$ | H |
| $L_{B469}$ | $R^{D35}$ | $R^{D68}$ | H |
| $L_{B470}$ | $R^{D35}$ | $R^{D76}$ | H |
| $L_{B471}$ | $R^{D40}$ | $R^{D5}$ | H |
| $L_{B472}$ | $R^{D40}$ | $R^{D6}$ | H |
| $L_{B473}$ | $R^{D40}$ | $R^{D9}$ | H |
| $L_{B474}$ | $R^{D40}$ | $R^{D10}$ | H |
| $L_{B475}$ | $R^{D40}$ | $R^{D12}$ | H |
| $L_{B476}$ | $R^{D40}$ | $R^{D15}$ | H |
| $L_{B477}$ | $R^{D40}$ | $R^{D16}$ | H |
| $L_{B478}$ | $R^{D40}$ | $R^{D17}$ | H |
| $L_{B479}$ | $R^{D40}$ | $R^{D18}$ | H |
| $L_{B480}$ | $R^{D40}$ | $R^{D19}$ | H |
| $L_{B481}$ | $R^{D40}$ | $R^{D20}$ | H |
| $L_{B482}$ | $R^{D40}$ | $R^{D21}$ | H |
| $L_{B483}$ | $R^{D40}$ | $R^{D23}$ | H |
| $L_{B484}$ | $R^{D40}$ | $R^{D24}$ | H |
| $L_{B485}$ | $R^{D40}$ | $R^{D25}$ | H |
| $L_{B486}$ | $R^{D40}$ | $R^{D27}$ | H |
| $L_{B487}$ | $R^{D40}$ | $R^{D28}$ | H |
| $L_{B488}$ | $R^{D40}$ | $R^{D29}$ | H |
| $L_{B489}$ | $R^{D40}$ | $R^{D30}$ | H |
| $L_{B490}$ | $R^{D40}$ | $R^{D31}$ | H |
| $L_{B491}$ | $R^{D40}$ | $R^{D32}$ | H |
| $L_{B492}$ | $R^{D40}$ | $R^{D33}$ | H |
| $L_{B493}$ | $R^{D40}$ | $R^{D34}$ | H |
| $L_{B494}$ | $R^{D40}$ | $R^{D41}$ | H |
| $L_{B495}$ | $R^{D40}$ | $R^{D42}$ | H |
| $L_{B496}$ | $R^{D40}$ | $R^{D64}$ | H |
| $L_{B497}$ | $R^{D40}$ | $R^{D66}$ | H |
| $L_{B498}$ | $R^{D40}$ | $R^{D68}$ | H |
| $L_{B499}$ | $R^{D40}$ | $R^{D76}$ | H |
| $L_{B500}$ | $R^{D41}$ | $R^{D5}$ | H |

-continued

| Ligand | $R^1$ | $R^2$ | $R^3$ |
|---|---|---|---|
| $L_{B501}$ | $R^{D41}$ | $R^{D6}$ | H |
| $L_{B502}$ | $R^{D41}$ | $R^{D9}$ | H |
| $L_{B503}$ | $R^{D41}$ | $R^{D10}$ | H |
| $L_{B504}$ | $R^{D41}$ | $R^{D12}$ | H |
| $L_{B505}$ | $R^{D41}$ | $R^{D15}$ | H |
| $L_{B506}$ | $R^{D41}$ | $R^{D16}$ | H |
| $L_{B507}$ | $R^{D41}$ | $R^{D17}$ | H |
| $L_{B508}$ | $R^{D41}$ | $R^{D18}$ | H |
| $L_{B509}$ | $R^{D41}$ | $R^{D19}$ | H |
| $L_{B510}$ | $R^{D41}$ | $R^{D20}$ | H |
| $L_{B511}$ | $R^{D41}$ | $R^{D21}$ | H |
| $L_{B512}$ | $R^{D41}$ | $R^{D23}$ | H |
| $L_{B513}$ | $R^{D41}$ | $R^{D24}$ | H |
| $L_{B514}$ | $R^{D41}$ | $R^{D25}$ | H |
| $L_{B515}$ | $R^{D41}$ | $R^{D27}$ | H |
| $L_{B516}$ | $R^{D41}$ | $R^{D28}$ | H |
| $L_{B517}$ | $R^{D41}$ | $R^{D29}$ | H |
| $L_{B518}$ | $R^{D41}$ | $R^{D30}$ | H |
| $L_{B519}$ | $R^{D41}$ | $R^{D31}$ | H |
| $L_{B520}$ | $R^{D41}$ | $R^{D32}$ | H |
| $L_{B521}$ | $R^{D41}$ | $R^{D33}$ | H |
| $L_{B522}$ | $R^{D41}$ | $R^{D34}$ | H |
| $L_{B523}$ | $R^{D41}$ | $R^{D42}$ | H |
| $L_{B524}$ | $R^{D41}$ | $R^{D64}$ | H |
| $L_{B525}$ | $R^{D41}$ | $R^{D66}$ | H |
| $L_{B526}$ | $R^{D41}$ | $R^{D68}$ | H |
| $L_{B527}$ | $R^{D41}$ | $R^{D76}$ | H |
| $L_{B528}$ | $R^{D64}$ | $R^{D5}$ | H |
| $L_{B529}$ | $R^{D64}$ | $R^{D6}$ | H |
| $L_{B530}$ | $R^{D64}$ | $R^{D9}$ | H |
| $L_{B531}$ | $R^{D64}$ | $R^{D10}$ | H |
| $L_{B532}$ | $R^{D64}$ | $R^{D12}$ | H |
| $L_{B533}$ | $R^{D64}$ | $R^{D15}$ | H |
| $L_{B534}$ | $R^{D64}$ | $R^{D16}$ | H |
| $L_{B535}$ | $R^{D64}$ | $R^{D17}$ | H |
| $L_{B536}$ | $R^{D64}$ | $R^{D18}$ | H |
| $L_{B537}$ | $R^{D64}$ | $R^{D19}$ | H |
| $L_{B538}$ | $R^{D64}$ | $R^{D20}$ | H |
| $L_{B539}$ | $R^{D64}$ | $R^{D21}$ | H |
| $L_{B540}$ | $R^{D64}$ | $R^{D23}$ | H |
| $L_{B541}$ | $R^{D64}$ | $R^{D24}$ | H |
| $L_{B542}$ | $R^{D64}$ | $R^{D25}$ | H |
| $L_{B543}$ | $R^{D64}$ | $R^{D27}$ | H |
| $L_{B544}$ | $R^{D64}$ | $R^{D28}$ | H |
| $L_{B545}$ | $R^{D64}$ | $R^{D29}$ | H |
| $L_{B546}$ | $R^{D64}$ | $R^{D30}$ | H |
| $L_{B547}$ | $R^{D64}$ | $R^{D31}$ | H |
| $L_{B548}$ | $R^{D64}$ | $R^{D32}$ | H |
| $L_{B549}$ | $R^{D64}$ | $R^{D33}$ | H |
| $L_{B550}$ | $R^{D64}$ | $R^{D34}$ | H |
| $L_{B551}$ | $R^{D64}$ | $R^{D42}$ | H |
| $L_{B552}$ | $R^{D64}$ | $R^{D64}$ | H |
| $L_{B553}$ | $R^{D64}$ | $R^{D66}$ | H |
| $L_{B554}$ | $R^{D64}$ | $R^{D68}$ | H |
| $L_{B555}$ | $R^{D64}$ | $R^{D76}$ | H |
| $L_{B556}$ | $R^{D66}$ | $R^{D5}$ | H |
| $L_{B557}$ | $R^{D66}$ | $R^{D6}$ | H |
| $L_{B558}$ | $R^{D66}$ | $R^{D9}$ | H |
| $L_{B559}$ | $R^{D66}$ | $R^{D10}$ | H |
| $L_{B560}$ | $R^{D66}$ | $R^{D12}$ | H |
| $L_{B561}$ | $R^{D66}$ | $R^{D15}$ | H |
| $L_{B562}$ | $R^{D66}$ | $R^{D16}$ | H |
| $L_{B563}$ | $R^{D66}$ | $R^{D17}$ | H |
| $L_{B564}$ | $R^{D66}$ | $R^{D18}$ | H |
| $L_{B565}$ | $R^{D66}$ | $R^{D19}$ | H |
| $L_{B566}$ | $R^{D66}$ | $R^{D20}$ | H |
| $L_{B567}$ | $R^{D66}$ | $R^{D21}$ | H |
| $L_{B568}$ | $R^{D66}$ | $R^{D23}$ | H |
| $L_{B569}$ | $R^{D66}$ | $R^{D24}$ | H |
| $L_{B570}$ | $R^{D66}$ | $R^{D25}$ | H |
| $L_{B571}$ | $R^{D66}$ | $R^{D27}$ | H |
| $L_{B572}$ | $R^{D66}$ | $R^{D28}$ | H |
| $L_{B573}$ | $R^{D66}$ | $R^{D29}$ | H |
| $L_{B574}$ | $R^{D66}$ | $R^{D30}$ | H |
| $L_{B575}$ | $R^{D66}$ | $R^{D31}$ | H |
| $L_{B576}$ | $R^{D66}$ | $R^{D32}$ | H |
| $L_{B577}$ | $R^{D66}$ | $R^{D33}$ | H |

-continued

| Ligand | $R^1$ | $R^2$ | $R^3$ |
|---|---|---|---|
| $L_{B578}$ | $R^{D66}$ | $R^{D34}$ | H |
| $L_{B579}$ | $R^{D66}$ | $R^{D42}$ | H |
| $L_{B580}$ | $R^{D66}$ | $R^{D68}$ | H |
| $L_{B581}$ | $R^{D66}$ | $R^{D76}$ | H |
| $L_{B582}$ | $R^{D68}$ | $R^{D5}$ | H |
| $L_{B583}$ | $R^{D68}$ | $R^{D6}$ | H |
| $L_{B584}$ | $R^{D68}$ | $R^{D9}$ | H |
| $L_{B585}$ | $R^{D68}$ | $R^{D10}$ | H |
| $L_{B586}$ | $R^{D68}$ | $R^{D12}$ | H |
| $L_{B587}$ | $R^{D68}$ | $R^{D15}$ | H |
| $L_{B588}$ | $R^{D68}$ | $R^{D16}$ | H |
| $L_{B589}$ | $R^{D68}$ | $R^{D17}$ | H |
| $L_{B590}$ | $R^{D68}$ | $R^{D18}$ | H |
| $L_{B591}$ | $R^{D68}$ | $R^{D19}$ | H |
| $L_{B592}$ | $R^{D68}$ | $R^{D20}$ | H |
| $L_{B593}$ | $R^{D68}$ | $R^{D21}$ | H |
| $L_{B594}$ | $R^{D68}$ | $R^{D23}$ | H |
| $L_{B595}$ | $R^{D68}$ | $R^{D24}$ | H |
| $L_{B596}$ | $R^{D68}$ | $R^{D25}$ | H |
| $L_{B597}$ | $R^{D68}$ | $R^{D27}$ | H |
| $L_{B598}$ | $R^{D68}$ | $R^{D28}$ | H |
| $L_{B599}$ | $R^{D68}$ | $R^{D29}$ | H |
| $L_{B600}$ | $R^{D68}$ | $R^{D30}$ | H |
| $L_{B601}$ | $R^{D68}$ | $R^{D31}$ | H |
| $L_{B602}$ | $R^{D68}$ | $R^{D32}$ | H |
| $L_{B603}$ | $R^{D68}$ | $R^{D33}$ | H |
| $L_{B604}$ | $R^{D68}$ | $R^{D34}$ | H |
| $L_{B605}$ | $R^{D68}$ | $R^{D42}$ | H |
| $L_{B606}$ | $R^{D68}$ | $R^{D76}$ | H |
| $L_{B607}$ | $R^{D76}$ | $R^{D5}$ | H |
| $L_{B608}$ | $R^{D76}$ | $R^{D6}$ | H |
| $L_{B609}$ | $R^{D76}$ | $R^{D9}$ | H |
| $L_{B610}$ | $R^{D76}$ | $R^{D10}$ | H |
| $L_{B611}$ | $R^{D76}$ | $R^{D12}$ | H |
| $L_{B612}$ | $R^{D76}$ | $R^{D15}$ | H |
| $L_{B613}$ | $R^{D76}$ | $R^{D16}$ | H |
| $L_{B614}$ | $R^{D76}$ | $R^{D17}$ | H |
| $L_{B615}$ | $R^{D76}$ | $R^{D18}$ | H |
| $L_{B616}$ | $R^{D76}$ | $R^{D19}$ | H |
| $L_{B617}$ | $R^{D76}$ | $R^{D20}$ | H |
| $L_{B618}$ | $R^{D76}$ | $R^{D21}$ | H |
| $L_{B619}$ | $R^{D76}$ | $R^{D23}$ | H |
| $L_{B620}$ | $R^{D76}$ | $R^{D24}$ | H |
| $L_{B621}$ | $R^{D76}$ | $R^{D25}$ | H |
| $L_{B622}$ | $R^{D76}$ | $R^{D27}$ | H |
| $L_{B623}$ | $R^{D76}$ | $R^{D28}$ | H |
| $L_{B624}$ | $R^{D76}$ | $R^{D29}$ | H |
| $L_{B625}$ | $R^{D76}$ | $R^{D30}$ | H |
| $L_{B626}$ | $R^{D76}$ | $R^{D31}$ | H |
| $L_{B627}$ | $R^{D76}$ | $R^{D32}$ | H |
| $L_{B628}$ | $R^{D76}$ | $R^{D33}$ | H |
| $L_{B629}$ | $R^{D76}$ | $R^{D34}$ | H |
| $L_{B630}$ | $R^{D76}$ | $R^{D42}$ | H |
| $L_{B631}$ | $R^{D1}$ | $R^{D1}$ | $R^{D1}$ |
| $L_{B632}$ | $R^{D2}$ | $R^{D2}$ | $R^{D1}$ |
| $L_{B633}$ | $R^{D3}$ | $R^{D3}$ | $R^{D1}$ |
| $L_{B634}$ | $R^{D4}$ | $R^{D4}$ | $R^{D1}$ |
| $L_{B635}$ | $R^{D5}$ | $R^{D5}$ | $R^{D1}$ |
| $L_{B636}$ | $R^{D6}$ | $R^{D6}$ | $R^{D1}$ |
| $L_{B637}$ | $R^{D7}$ | $R^{D7}$ | $R^{D1}$ |
| $L_{B638}$ | $R^{D8}$ | $R^{D8}$ | $R^{D1}$ |
| $L_{B639}$ | $R^{D9}$ | $R^{D9}$ | $R^{D1}$ |
| $L_{B640}$ | $R^{D10}$ | $R^{D10}$ | $R^{D1}$ |
| $L_{B641}$ | $R^{D11}$ | $R^{D11}$ | $R^{D1}$ |
| $L_{B642}$ | $R^{D12}$ | $R^{D12}$ | $R^{D1}$ |
| $L_{B643}$ | $R^{D13}$ | $R^{D13}$ | $R^{D1}$ |
| $L_{B644}$ | $R^{D14}$ | $R^{D14}$ | $R^{D1}$ |
| $L_{B645}$ | $R^{D15}$ | $R^{D15}$ | $R^{D1}$ |
| $L_{B646}$ | $R^{D16}$ | $R^{D16}$ | $R^{D1}$ |
| $L_{B647}$ | $R^{D17}$ | $R^{D17}$ | $R^{D1}$ |
| $L_{B648}$ | $R^{D18}$ | $R^{D18}$ | $R^{D1}$ |
| $L_{B649}$ | $R^{D19}$ | $R^{D19}$ | $R^{D1}$ |
| $L_{B650}$ | $R^{D20}$ | $R^{D20}$ | $R^{D1}$ |
| $L_{B651}$ | $R^{D21}$ | $R^{D21}$ | $R^{D1}$ |
| $L_{B652}$ | $R^{D22}$ | $R^{D22}$ | $R^{D1}$ |
| $L_{B653}$ | $R^{D23}$ | $R^{D23}$ | $R^{D1}$ |
| $L_{B654}$ | $R^{D24}$ | $R^{D24}$ | $R^{D1}$ |

-continued

| Ligand | $R^1$ | $R^2$ | $R^3$ |
|---|---|---|---|
| $L_{B655}$ | $R^{D25}$ | $R^{D25}$ | $R^{D1}$ |
| $L_{B656}$ | $R^{D26}$ | $R^{D26}$ | $R^{D1}$ |
| $L_{B657}$ | $R^{D27}$ | $R^{D27}$ | $R^{D1}$ |
| $L_{B658}$ | $R^{D28}$ | $R^{D28}$ | $R^{D1}$ |
| $L_{B659}$ | $R^{D29}$ | $R^{D29}$ | $R^{D1}$ |
| $L_{B660}$ | $R^{D30}$ | $R^{D30}$ | $R^{D1}$ |
| $L_{B661}$ | $R^{D31}$ | $R^{D31}$ | $R^{D1}$ |
| $L_{B662}$ | $R^{D32}$ | $R^{D32}$ | $R^{D1}$ |
| $L_{B663}$ | $R^{D33}$ | $R^{D33}$ | $R^{D1}$ |
| $L_{B664}$ | $R^{D34}$ | $R^{D34}$ | $R^{D1}$ |
| $L_{B665}$ | $R^{D35}$ | $R^{D35}$ | $R^{D1}$ |
| $L_{B666}$ | $R^{D40}$ | $R^{D40}$ | $R^{D1}$ |
| $L_{B667}$ | $R^{D41}$ | $R^{D41}$ | $R^{D1}$ |
| $L_{B668}$ | $R^{D42}$ | $R^{D42}$ | $R^{D1}$ |
| $L_{B669}$ | $R^{D64}$ | $R^{D64}$ | $R^{D1}$ |
| $L_{B670}$ | $R^{D66}$ | $R^{D66}$ | $R^{D1}$ |
| $L_{B671}$ | $R^{D68}$ | $R^{D68}$ | $R^{D1}$ |
| $L_{B672}$ | $R^{D76}$ | $R^{D76}$ | $R^{D1}$ |
| $L_{B673}$ | $R^{D1}$ | $R^{D2}$ | $R^{D1}$ |
| $L_{B674}$ | $R^{D1}$ | $R^{D3}$ | $R^{D1}$ |
| $L_{B675}$ | $R^{D1}$ | $R^{D4}$ | $R^{D1}$ |
| $L_{B676}$ | $R^{D1}$ | $R^{D5}$ | $R^{D1}$ |
| $L_{B677}$ | $R^{D1}$ | $R^{D6}$ | $R^{D1}$ |
| $L_{B678}$ | $R^{D1}$ | $R^{D7}$ | $R^{D1}$ |
| $L_{B679}$ | $R^{D1}$ | $R^{D8}$ | $R^{D1}$ |
| $L_{B680}$ | $R^{D1}$ | $R^{D9}$ | $R^{D1}$ |
| $L_{B681}$ | $R^{D1}$ | $R^{D10}$ | $R^{D1}$ |
| $L_{B682}$ | $R^{D1}$ | $R^{D11}$ | $R^{D1}$ |
| $L_{B683}$ | $R^{D1}$ | $R^{D12}$ | $R^{D1}$ |
| $L_{B684}$ | $R^{D1}$ | $R^{D13}$ | $R^{D1}$ |
| $L_{B685}$ | $R^{D1}$ | $R^{D14}$ | $R^{D1}$ |
| $L_{B686}$ | $R^{D1}$ | $R^{D15}$ | $R^{D1}$ |
| $L_{B687}$ | $R^{D1}$ | $R^{D16}$ | $R^{D1}$ |
| $L_{B688}$ | $R^{D1}$ | $R^{D17}$ | $R^{D1}$ |
| $L_{B689}$ | $R^{D1}$ | $R^{D18}$ | $R^{D1}$ |
| $L_{B690}$ | $R^{D1}$ | $R^{D19}$ | $R^{D1}$ |
| $L_{B691}$ | $R^{D1}$ | $R^{D20}$ | $R^{D1}$ |
| $L_{B692}$ | $R^{D1}$ | $R^{D21}$ | $R^{D1}$ |
| $L_{B693}$ | $R^{D1}$ | $R^{D22}$ | $R^{D1}$ |
| $L_{B694}$ | $R^{D1}$ | $R^{D23}$ | $R^{D1}$ |
| $L_{B695}$ | $R^{D1}$ | $R^{D24}$ | $R^{D1}$ |
| $L_{B696}$ | $R^{D1}$ | $R^{D25}$ | $R^{D1}$ |
| $L_{B697}$ | $R^{D1}$ | $R^{D26}$ | $R^{D1}$ |
| $L_{B698}$ | $R^{D1}$ | $R^{D27}$ | $R^{D1}$ |
| $L_{B699}$ | $R^{D1}$ | $R^{D28}$ | $R^{D1}$ |
| $L_{B700}$ | $R^{D1}$ | $R^{D29}$ | $R^{D1}$ |
| $L_{B701}$ | $R^{D1}$ | $R^{D30}$ | $R^{D1}$ |
| $L_{B702}$ | $R^{D1}$ | $R^{D31}$ | $R^{D1}$ |
| $L_{B703}$ | $R^{D1}$ | $R^{D32}$ | $R^{D1}$ |
| $L_{B704}$ | $R^{D1}$ | $R^{D33}$ | $R^{D1}$ |
| $L_{B705}$ | $R^{D1}$ | $R^{D34}$ | $R^{D1}$ |
| $L_{B706}$ | $R^{D1}$ | $R^{D35}$ | $R^{D1}$ |
| $L_{B707}$ | $R^{D1}$ | $R^{D40}$ | $R^{D1}$ |
| $L_{B708}$ | $R^{D1}$ | $R^{D41}$ | $R^{D1}$ |
| $L_{B709}$ | $R^{D1}$ | $R^{D42}$ | $R^{D1}$ |
| $L_{B710}$ | $R^{D1}$ | $R^{D64}$ | $R^{D1}$ |
| $L_{B711}$ | $R^{D1}$ | $R^{D66}$ | $R^{D1}$ |
| $L_{B712}$ | $R^{D1}$ | $R^{D68}$ | $R^{D1}$ |
| $L_{B713}$ | $R^{D1}$ | $R^{D76}$ | $R^{D1}$ |
| $L_{B714}$ | $R^{D2}$ | $R^{D1}$ | $R^{D1}$ |
| $L_{B715}$ | $R^{D2}$ | $R^{D3}$ | $R^{D1}$ |
| $L_{B716}$ | $R^{D2}$ | $R^{D4}$ | $R^{D1}$ |
| $L_{B717}$ | $R^{D2}$ | $R^{D5}$ | $R^{D1}$ |
| $L_{B718}$ | $R^{D2}$ | $R^{D6}$ | $R^{D1}$ |
| $L_{B719}$ | $R^{D2}$ | $R^{D7}$ | $R^{D1}$ |
| $L_{B720}$ | $R^{D2}$ | $R^{D8}$ | $R^{D1}$ |
| $L_{B721}$ | $R^{D2}$ | $R^{D9}$ | $R^{D1}$ |
| $L_{B722}$ | $R^{D2}$ | $R^{D10}$ | $R^{D1}$ |
| $L_{B723}$ | $R^{D2}$ | $R^{D11}$ | $R^{D1}$ |
| $L_{B724}$ | $R^{D2}$ | $R^{D12}$ | $R^{D1}$ |
| $L_{B725}$ | $R^{D2}$ | $R^{D13}$ | $R^{D1}$ |
| $L_{B726}$ | $R^{D2}$ | $R^{D14}$ | $R^{D1}$ |
| $L_{B727}$ | $R^{D2}$ | $R^{D15}$ | $R^{D1}$ |
| $L_{B728}$ | $R^{D2}$ | $R^{D16}$ | $R^{D1}$ |
| $L_{B729}$ | $R^{D2}$ | $R^{D17}$ | $R^{D1}$ |
| $L_{B730}$ | $R^{D2}$ | $R^{D18}$ | $R^{D1}$ |
| $L_{B731}$ | $R^{D2}$ | $R^{D19}$ | $R^{D1}$ |
| $L_{B732}$ | $R^{D2}$ | $R^{D20}$ | $R^{D1}$ |
| $L_{B733}$ | $R^{D2}$ | $R^{D21}$ | $R^{D1}$ |
| $L_{B734}$ | $R^{D2}$ | $R^{D22}$ | $R^{D1}$ |
| $L_{B735}$ | $R^{D2}$ | $R^{D23}$ | $R^{D1}$ |
| $L_{B736}$ | $R^{D2}$ | $R^{D24}$ | $R^{D1}$ |
| $L_{B737}$ | $R^{D2}$ | $R^{D25}$ | $R^{D1}$ |
| $L_{B738}$ | $R^{D2}$ | $R^{D26}$ | $R^{D1}$ |
| $L_{B739}$ | $R^{D2}$ | $R^{D27}$ | $R^{D1}$ |
| $L_{B740}$ | $R^{D2}$ | $R^{D28}$ | $R^{D1}$ |
| $L_{B741}$ | $R^{D2}$ | $R^{D29}$ | $R^{D1}$ |
| $L_{B742}$ | $R^{D2}$ | $R^{D30}$ | $R^{D1}$ |
| $L_{B743}$ | $R^{D2}$ | $R^{D31}$ | $R^{D1}$ |
| $L_{B744}$ | $R^{D2}$ | $R^{D32}$ | $R^{D1}$ |
| $L_{B745}$ | $R^{D2}$ | $R^{D33}$ | $R^{D1}$ |
| $L_{B746}$ | $R^{D2}$ | $R^{D34}$ | $R^{D1}$ |
| $L_{B747}$ | $R^{D2}$ | $R^{D35}$ | $R^{D1}$ |
| $L_{B748}$ | $R^{D2}$ | $R^{D40}$ | $R^{D1}$ |
| $L_{B749}$ | $R^{D2}$ | $R^{D41}$ | $R^{D1}$ |
| $L_{B750}$ | $R^{D2}$ | $R^{D42}$ | $R^{D1}$ |
| $L_{B751}$ | $R^{D2}$ | $R^{D64}$ | $R^{D1}$ |
| $L_{B752}$ | $R^{D2}$ | $R^{D66}$ | $R^{D1}$ |
| $L_{B753}$ | $R^{D2}$ | $R^{D68}$ | $R^{D1}$ |
| $L_{B754}$ | $R^{D2}$ | $R^{D76}$ | $R^{D1}$ |
| $L_{B755}$ | $R^{D3}$ | $R^{D4}$ | $R^{D1}$ |
| $L_{B756}$ | $R^{D3}$ | $R^{D5}$ | $R^{D1}$ |
| $L_{B757}$ | $R^{D3}$ | $R^{D6}$ | $R^{D1}$ |
| $L_{B758}$ | $R^{D3}$ | $R^{D7}$ | $R^{D1}$ |
| $L_{B759}$ | $R^{D3}$ | $R^{D8}$ | $R^{D1}$ |
| $L_{B760}$ | $R^{D3}$ | $R^{D9}$ | $R^{D1}$ |
| $L_{B761}$ | $R^{D3}$ | $R^{D10}$ | $R^{D1}$ |
| $L_{B762}$ | $R^{D3}$ | $R^{D11}$ | $R^{D1}$ |
| $L_{B763}$ | $R^{D3}$ | $R^{D12}$ | $R^{D1}$ |
| $L_{B764}$ | $R^{D3}$ | $R^{D13}$ | $R^{D1}$ |
| $L_{B765}$ | $R^{D3}$ | $R^{D14}$ | $R^{D1}$ |
| $L_{B766}$ | $R^{D3}$ | $R^{D15}$ | $R^{D1}$ |
| $L_{B767}$ | $R^{D3}$ | $R^{D16}$ | $R^{D1}$ |
| $L_{B768}$ | $R^{D3}$ | $R^{D17}$ | $R^{D1}$ |
| $L_{B769}$ | $R^{D3}$ | $R^{D18}$ | $R^{D1}$ |
| $L_{B770}$ | $R^{D3}$ | $R^{D19}$ | $R^{D1}$ |
| $L_{B771}$ | $R^{D3}$ | $R^{D20}$ | $R^{D1}$ |
| $L_{B772}$ | $R^{D3}$ | $R^{D21}$ | $R^{D1}$ |
| $L_{B773}$ | $R^{D3}$ | $R^{D22}$ | $R^{D1}$ |
| $L_{B774}$ | $R^{D3}$ | $R^{D23}$ | $R^{D1}$ |
| $L_{B775}$ | $R^{D3}$ | $R^{D24}$ | $R^{D1}$ |
| $L_{B776}$ | $R^{D3}$ | $R^{D25}$ | $R^{D1}$ |
| $L_{B777}$ | $R^{D3}$ | $R^{D26}$ | $R^{D1}$ |
| $L_{B778}$ | $R^{D3}$ | $R^{D27}$ | $R^{D1}$ |
| $L_{B779}$ | $R^{D3}$ | $R^{D28}$ | $R^{D1}$ |
| $L_{B780}$ | $R^{D3}$ | $R^{D29}$ | $R^{D1}$ |
| $L_{B781}$ | $R^{D3}$ | $R^{D30}$ | $R^{D1}$ |
| $L_{B782}$ | $R^{D3}$ | $R^{D31}$ | $R^{D1}$ |
| $L_{B783}$ | $R^{D3}$ | $R^{D32}$ | $R^{D1}$ |
| $L_{B784}$ | $R^{D3}$ | $R^{D33}$ | $R^{D1}$ |
| $L_{B785}$ | $R^{D3}$ | $R^{D34}$ | $R^{D1}$ |
| $L_{B786}$ | $R^{D3}$ | $R^{D35}$ | $R^{D1}$ |
| $L_{B787}$ | $R^{D3}$ | $R^{D40}$ | $R^{D1}$ |
| $L_{B788}$ | $R^{D3}$ | $R^{D41}$ | $R^{D1}$ |
| $L_{B789}$ | $R^{D3}$ | $R^{D42}$ | $R^{D1}$ |
| $L_{B790}$ | $R^{D3}$ | $R^{D64}$ | $R^{D1}$ |
| $L_{B791}$ | $R^{D3}$ | $R^{D66}$ | $R^{D1}$ |
| $L_{B792}$ | $R^{D3}$ | $R^{D68}$ | $R^{D1}$ |
| $L_{B793}$ | $R^{D3}$ | $R^{D76}$ | $R^{D1}$ |
| $L_{B794}$ | $R^{D4}$ | $R^{D5}$ | $R^{D1}$ |
| $L_{B795}$ | $R^{D4}$ | $R^{D6}$ | $R^{D1}$ |
| $L_{B796}$ | $R^{D4}$ | $R^{D7}$ | $R^{D1}$ |
| $L_{B797}$ | $R^{D4}$ | $R^{D8}$ | $R^{D1}$ |
| $L_{B798}$ | $R^{D4}$ | $R^{D9}$ | $R^{D1}$ |
| $L_{B799}$ | $R^{D4}$ | $R^{D10}$ | $R^{D1}$ |
| $L_{B800}$ | $R^{D4}$ | $R^{D11}$ | $R^{D1}$ |
| $L_{B801}$ | $R^{D4}$ | $R^{D12}$ | $R^{D1}$ |
| $L_{B802}$ | $R^{D4}$ | $R^{D13}$ | $R^{D1}$ |
| $L_{B803}$ | $R^{D4}$ | $R^{D14}$ | $R^{D1}$ |
| $L_{B804}$ | $R^{D4}$ | $R^{D15}$ | $R^{D1}$ |
| $L_{B805}$ | $R^{D4}$ | $R^{D16}$ | $R^{D1}$ |
| $L_{B806}$ | $R^{D4}$ | $R^{D17}$ | $R^{D1}$ |
| $L_{B807}$ | $R^{D4}$ | $R^{D18}$ | $R^{D1}$ |
| $L_{B808}$ | $R^{D4}$ | $R^{D19}$ | $R^{D1}$ |

-continued

| Ligand | $R^1$ | $R^2$ | $R^3$ |
|---|---|---|---|
| $L_{B809}$ | $R^{D4}$ | $R^{D20}$ | $R^{D1}$ |
| $L_{B810}$ | $R^{D4}$ | $R^{D21}$ | $R^{D1}$ |
| $L_{B811}$ | $R^{D4}$ | $R^{D22}$ | $R^{D1}$ |
| $L_{B812}$ | $R^{D4}$ | $R^{D23}$ | $R^{D1}$ |
| $L_{B813}$ | $R^{D4}$ | $R^{D24}$ | $R^{D1}$ |
| $L_{B814}$ | $R^{D4}$ | $R^{D25}$ | $R^{D1}$ |
| $L_{B815}$ | $R^{D4}$ | $R^{D26}$ | $R^{D1}$ |
| $L_{B816}$ | $R^{D4}$ | $R^{D27}$ | $R^{D1}$ |
| $L_{B817}$ | $R^{D4}$ | $R^{D28}$ | $R^{D1}$ |
| $L_{B818}$ | $R^{D4}$ | $R^{D29}$ | $R^{D1}$ |
| $L_{B819}$ | $R^{D4}$ | $R^{D30}$ | $R^{D1}$ |
| $L_{B820}$ | $R^{D4}$ | $R^{D31}$ | $R^{D1}$ |
| $L_{B821}$ | $R^{D4}$ | $R^{D32}$ | $R^{D1}$ |
| $L_{B822}$ | $R^{D4}$ | $R^{D33}$ | $R^{D1}$ |
| $L_{B823}$ | $R^{D4}$ | $R^{D34}$ | $R^{D1}$ |
| $L_{B824}$ | $R^{D4}$ | $R^{D35}$ | $R^{D1}$ |
| $L_{B825}$ | $R^{D4}$ | $R^{D40}$ | $R^{D1}$ |
| $L_{B826}$ | $R^{D4}$ | $R^{D41}$ | $R^{D1}$ |
| $L_{B827}$ | $R^{D4}$ | $R^{D42}$ | $R^{D1}$ |
| $L_{B828}$ | $R^{D4}$ | $R^{D64}$ | $R^{D1}$ |
| $L_{B829}$ | $R^{D4}$ | $R^{D66}$ | $R^{D1}$ |
| $L_{B830}$ | $R^{D4}$ | $R^{D68}$ | $R^{D1}$ |
| $L_{B831}$ | $R^{D4}$ | $R^{D76}$ | $R^{D1}$ |
| $L_{B832}$ | $R^{D4}$ | $R^{D1}$ | $R^{D1}$ |
| $L_{B833}$ | $R^{D7}$ | $R^{D5}$ | $R^{D1}$ |
| $L_{B834}$ | $R^{D7}$ | $R^{D6}$ | $R^{D1}$ |
| $L_{B835}$ | $R^{D7}$ | $R^{D8}$ | $R^{D1}$ |
| $L_{B836}$ | $R^{D7}$ | $R^{D9}$ | $R^{D1}$ |
| $L_{B837}$ | $R^{D7}$ | $R^{D10}$ | $R^{D1}$ |
| $L_{B838}$ | $R^{D7}$ | $R^{D11}$ | $R^{D1}$ |
| $L_{B839}$ | $R^{D7}$ | $R^{D12}$ | $R^{D1}$ |
| $L_{B840}$ | $R^{D7}$ | $R^{D13}$ | $R^{D1}$ |
| $L_{B841}$ | $R^{D7}$ | $R^{D14}$ | $R^{D1}$ |
| $L_{B842}$ | $R^{D7}$ | $R^{D15}$ | $R^{D1}$ |
| $L_{B843}$ | $R^{D7}$ | $R^{D16}$ | $R^{D1}$ |
| $L_{B844}$ | $R^{D7}$ | $R^{D17}$ | $R^{D1}$ |
| $L_{B845}$ | $R^{D7}$ | $R^{D18}$ | $R^{D1}$ |
| $L_{B846}$ | $R^{D7}$ | $R^{D19}$ | $R^{D1}$ |
| $L_{B847}$ | $R^{D7}$ | $R^{D20}$ | $R^{D1}$ |
| $L_{B848}$ | $R^{D7}$ | $R^{D21}$ | $R^{D1}$ |
| $L_{B849}$ | $R^{D7}$ | $R^{D22}$ | $R^{D1}$ |
| $L_{B850}$ | $R^{D7}$ | $R^{D23}$ | $R^{D1}$ |
| $L_{B851}$ | $R^{D7}$ | $R^{D24}$ | $R^{D1}$ |
| $L_{B852}$ | $R^{D7}$ | $R^{D25}$ | $R^{D1}$ |
| $L_{B853}$ | $R^{D7}$ | $R^{D26}$ | $R^{D1}$ |
| $L_{B854}$ | $R^{D7}$ | $R^{D27}$ | $R^{D1}$ |
| $L_{B855}$ | $R^{D7}$ | $R^{D28}$ | $R^{D1}$ |
| $L_{B856}$ | $R^{D7}$ | $R^{D29}$ | $R^{D1}$ |
| $L_{B857}$ | $R^{D7}$ | $R^{D30}$ | $R^{D1}$ |
| $L_{B858}$ | $R^{D7}$ | $R^{D31}$ | $R^{D1}$ |
| $L_{B859}$ | $R^{D7}$ | $R^{D32}$ | $R^{D1}$ |
| $L_{B860}$ | $R^{D7}$ | $R^{D33}$ | $R^{D1}$ |
| $L_{B861}$ | $R^{D7}$ | $R^{D34}$ | $R^{D1}$ |
| $L_{B862}$ | $R^{D7}$ | $R^{D35}$ | $R^{D1}$ |
| $L_{B863}$ | $R^{D7}$ | $R^{D40}$ | $R^{D1}$ |
| $L_{B864}$ | $R^{D7}$ | $R^{D41}$ | $R^{D1}$ |
| $L_{B865}$ | $R^{D7}$ | $R^{D42}$ | $R^{D1}$ |
| $L_{B866}$ | $R^{D7}$ | $R^{D64}$ | $R^{D1}$ |
| $L_{B867}$ | $R^{D7}$ | $R^{D66}$ | $R^{D1}$ |
| $L_{B868}$ | $R^{D7}$ | $R^{D68}$ | $R^{D1}$ |
| $L_{B869}$ | $R^{D7}$ | $R^{D76}$ | $R^{D1}$ |
| $L_{B870}$ | $R^{D8}$ | $R^{D5}$ | $R^{D1}$ |
| $L_{B871}$ | $R^{D8}$ | $R^{D6}$ | $R^{D1}$ |
| $L_{B872}$ | $R^{D8}$ | $R^{D9}$ | $R^{D1}$ |
| $L_{B873}$ | $R^{D8}$ | $R^{D10}$ | $R^{D1}$ |
| $L_{B874}$ | $R^{D8}$ | $R^{D11}$ | $R^{D1}$ |
| $L_{B875}$ | $R^{D8}$ | $R^{D12}$ | $R^{D1}$ |
| $L_{B876}$ | $R^{D8}$ | $R^{D13}$ | $R^{D1}$ |
| $L_{B877}$ | $R^{D8}$ | $R^{D14}$ | $R^{D1}$ |
| $L_{B878}$ | $R^{D8}$ | $R^{D15}$ | $R^{D1}$ |
| $L_{B879}$ | $R^{D8}$ | $R^{D16}$ | $R^{D1}$ |
| $L_{B880}$ | $R^{D8}$ | $R^{D17}$ | $R^{D1}$ |
| $L_{B881}$ | $R^{D8}$ | $R^{D18}$ | $R^{D1}$ |
| $L_{B882}$ | $R^{D8}$ | $R^{D19}$ | $R^{D1}$ |
| $L_{B883}$ | $R^{D8}$ | $R^{D20}$ | $R^{D1}$ |
| $L_{B884}$ | $R^{D8}$ | $R^{D21}$ | $R^{D1}$ |
| $L_{B885}$ | $R^{D8}$ | $R^{D22}$ | $R^{D1}$ |

-continued

| Ligand | $R^1$ | $R^2$ | $R^3$ |
|---|---|---|---|
| $L_{B886}$ | $R^{D8}$ | $R^{D23}$ | $R^{D1}$ |
| $L_{B887}$ | $R^{D8}$ | $R^{D24}$ | $R^{D1}$ |
| $L_{B888}$ | $R^{D8}$ | $R^{D25}$ | $R^{D1}$ |
| $L_{B889}$ | $R^{D8}$ | $R^{D26}$ | $R^{D1}$ |
| $L_{B890}$ | $R^{D8}$ | $R^{D27}$ | $R^{D1}$ |
| $L_{B891}$ | $R^{D8}$ | $R^{D28}$ | $R^{D1}$ |
| $L_{B892}$ | $R^{D8}$ | $R^{D29}$ | $R^{D1}$ |
| $L_{B893}$ | $R^{D8}$ | $R^{D30}$ | $R^{D1}$ |
| $L_{B894}$ | $R^{D8}$ | $R^{D31}$ | $R^{D1}$ |
| $L_{B895}$ | $R^{D8}$ | $R^{D32}$ | $R^{D1}$ |
| $L_{B896}$ | $R^{D8}$ | $R^{D33}$ | $R^{D1}$ |
| $L_{B897}$ | $R^{D8}$ | $R^{D34}$ | $R^{D1}$ |
| $L_{B898}$ | $R^{D8}$ | $R^{D35}$ | $R^{D1}$ |
| $L_{B899}$ | $R^{D8}$ | $R^{D40}$ | $R^{D1}$ |
| $L_{B900}$ | $R^{D8}$ | $R^{D41}$ | $R^{D1}$ |
| $L_{B901}$ | $R^{D8}$ | $R^{D42}$ | $R^{D1}$ |
| $L_{B902}$ | $R^{D8}$ | $R^{D64}$ | $R^{D1}$ |
| $L_{B903}$ | $R^{D8}$ | $R^{D66}$ | $R^{D1}$ |
| $L_{B904}$ | $R^{D8}$ | $R^{D68}$ | $R^{D1}$ |
| $L_{B905}$ | $R^{D8}$ | $R^{D76}$ | $R^{D1}$ |
| $L_{B906}$ | $R^{D11}$ | $R^{D5}$ | $R^{D1}$ |
| $L_{B907}$ | $R^{D11}$ | $R^{D6}$ | $R^{D1}$ |
| $L_{B908}$ | $R^{D11}$ | $R^{D9}$ | $R^{D1}$ |
| $L_{B909}$ | $R^{D11}$ | $R^{D10}$ | $R^{D1}$ |
| $L_{B910}$ | $R^{D11}$ | $R^{D12}$ | $R^{D1}$ |
| $L_{B911}$ | $R^{D11}$ | $R^{D13}$ | $R^{D1}$ |
| $L_{B912}$ | $R^{D11}$ | $R^{D14}$ | $R^{D1}$ |
| $L_{B913}$ | $R^{D11}$ | $R^{D15}$ | $R^{D1}$ |
| $L_{B914}$ | $R^{D11}$ | $R^{D16}$ | $R^{D1}$ |
| $L_{B915}$ | $R^{D11}$ | $R^{D17}$ | $R^{D1}$ |
| $L_{B916}$ | $R^{D11}$ | $R^{D18}$ | $R^{D1}$ |
| $L_{B917}$ | $R^{D11}$ | $R^{D19}$ | $R^{D1}$ |
| $L_{B918}$ | $R^{D11}$ | $R^{D20}$ | $R^{D1}$ |
| $L_{B919}$ | $R^{D11}$ | $R^{D21}$ | $R^{D1}$ |
| $L_{B920}$ | $R^{D11}$ | $R^{D22}$ | $R^{D1}$ |
| $L_{B921}$ | $R^{D11}$ | $R^{D23}$ | $R^{D1}$ |
| $L_{B922}$ | $R^{D11}$ | $R^{D24}$ | $R^{D1}$ |
| $L_{B923}$ | $R^{D11}$ | $R^{D25}$ | $R^{D1}$ |
| $L_{B924}$ | $R^{D11}$ | $R^{D26}$ | $R^{D1}$ |
| $L_{B925}$ | $R^{D11}$ | $R^{D27}$ | $R^{D1}$ |
| $L_{B926}$ | $R^{D11}$ | $R^{D28}$ | $R^{D1}$ |
| $L_{B927}$ | $R^{D11}$ | $R^{D29}$ | $R^{D1}$ |
| $L_{B928}$ | $R^{D11}$ | $R^{D30}$ | $R^{D1}$ |
| $L_{B929}$ | $R^{D11}$ | $R^{D31}$ | $R^{D1}$ |
| $L_{B930}$ | $R^{D11}$ | $R^{D32}$ | $R^{D1}$ |
| $L_{B931}$ | $R^{D11}$ | $R^{D33}$ | $R^{D1}$ |
| $L_{B932}$ | $R^{D11}$ | $R^{D34}$ | $R^{D1}$ |
| $L_{B933}$ | $R^{D11}$ | $R^{D35}$ | $R^{D1}$ |
| $L_{B934}$ | $R^{D11}$ | $R^{D40}$ | $R^{D1}$ |
| $L_{B935}$ | $R^{D11}$ | $R^{D41}$ | $R^{D1}$ |
| $L_{B936}$ | $R^{D11}$ | $R^{D42}$ | $R^{D1}$ |
| $L_{B937}$ | $R^{D11}$ | $R^{D64}$ | $R^{D1}$ |
| $L_{B938}$ | $R^{D11}$ | $R^{D66}$ | $R^{D1}$ |
| $L_{B939}$ | $R^{D11}$ | $R^{D68}$ | $R^{D1}$ |
| $L_{B940}$ | $R^{D11}$ | $R^{D76}$ | $R^{D1}$ |
| $L_{B941}$ | $R^{D13}$ | $R^{D5}$ | $R^{D1}$ |
| $L_{B942}$ | $R^{D13}$ | $R^{D6}$ | $R^{D1}$ |
| $L_{B943}$ | $R^{D13}$ | $R^{D9}$ | $R^{D1}$ |
| $L_{B944}$ | $R^{D13}$ | $R^{D10}$ | $R^{D1}$ |
| $L_{B945}$ | $R^{D13}$ | $R^{D12}$ | $R^{D1}$ |
| $L_{B946}$ | $R^{D13}$ | $R^{D14}$ | $R^{D1}$ |
| $L_{B947}$ | $R^{D13}$ | $R^{D15}$ | $R^{D1}$ |
| $L_{B948}$ | $R^{D13}$ | $R^{D16}$ | $R^{D1}$ |
| $L_{B949}$ | $R^{D13}$ | $R^{D17}$ | $R^{D1}$ |
| $L_{B950}$ | $R^{D13}$ | $R^{D18}$ | $R^{D1}$ |
| $L_{B951}$ | $R^{D13}$ | $R^{D19}$ | $R^{D1}$ |
| $L_{B952}$ | $R^{D13}$ | $R^{D20}$ | $R^{D1}$ |
| $L_{B953}$ | $R^{D13}$ | $R^{D21}$ | $R^{D1}$ |
| $L_{B954}$ | $R^{D13}$ | $R^{D22}$ | $R^{D1}$ |
| $L_{B955}$ | $R^{D13}$ | $R^{D23}$ | $R^{D1}$ |
| $L_{B956}$ | $R^{D13}$ | $R^{D24}$ | $R^{D1}$ |
| $L_{B957}$ | $R^{D13}$ | $R^{D25}$ | $R^{D1}$ |
| $L_{B958}$ | $R^{D13}$ | $R^{D26}$ | $R^{D1}$ |
| $L_{B959}$ | $R^{D13}$ | $R^{D27}$ | $R^{D1}$ |
| $L_{B960}$ | $R^{D13}$ | $R^{D28}$ | $R^{D1}$ |
| $L_{B961}$ | $R^{D13}$ | $R^{D29}$ | $R^{D1}$ |
| $L_{B962}$ | $R^{D13}$ | $R^{D30}$ | $R^{D1}$ |

-continued

| Ligand | $R^1$ | $R^2$ | $R^3$ |
|---|---|---|---|
| $L_{B963}$ | $R^{D13}$ | $R^{D31}$ | $R^{D1}$ |
| $L_{B964}$ | $R^{D13}$ | $R^{D32}$ | $R^{D1}$ |
| $L_{B965}$ | $R^{D13}$ | $R^{D33}$ | $R^{D1}$ |
| $L_{B966}$ | $R^{D13}$ | $R^{D34}$ | $R^{D1}$ |
| $L_{B967}$ | $R^{D13}$ | $R^{D35}$ | $R^{D1}$ |
| $L_{B968}$ | $R^{D13}$ | $R^{D40}$ | $R^{D1}$ |
| $L_{B969}$ | $R^{D13}$ | $R^{D41}$ | $R^{D1}$ |
| $L_{B970}$ | $R^{D13}$ | $R^{D42}$ | $R^{D1}$ |
| $L_{B971}$ | $R^{D13}$ | $R^{D64}$ | $R^{D1}$ |
| $L_{B972}$ | $R^{D13}$ | $R^{D66}$ | $R^{D1}$ |
| $L_{B973}$ | $R^{D13}$ | $R^{D68}$ | $R^{D1}$ |
| $L_{B974}$ | $R^{D13}$ | $R^{D76}$ | $R^{D1}$ |
| $L_{B975}$ | $R^{D14}$ | $R^{D5}$ | $R^{D1}$ |
| $L_{B976}$ | $R^{D14}$ | $R^{D6}$ | $R^{D1}$ |
| $L_{B977}$ | $R^{D14}$ | $R^{D9}$ | $R^{D1}$ |
| $L_{B978}$ | $R^{D14}$ | $R^{D10}$ | $R^{D1}$ |
| $L_{B979}$ | $R^{D14}$ | $R^{D12}$ | $R^{D1}$ |
| $L_{B980}$ | $R^{D14}$ | $R^{D15}$ | $R^{D1}$ |
| $L_{B981}$ | $R^{D14}$ | $R^{D16}$ | $R^{D1}$ |
| $L_{B982}$ | $R^{D14}$ | $R^{D17}$ | $R^{D1}$ |
| $L_{B983}$ | $R^{D14}$ | $R^{D18}$ | $R^{D1}$ |
| $L_{B984}$ | $R^{D14}$ | $R^{D19}$ | $R^{D1}$ |
| $L_{B985}$ | $R^{D14}$ | $R^{D20}$ | $R^{D1}$ |
| $L_{B986}$ | $R^{D14}$ | $R^{D21}$ | $R^{D1}$ |
| $L_{B987}$ | $R^{D14}$ | $R^{D22}$ | $R^{D1}$ |
| $L_{B988}$ | $R^{D14}$ | $R^{D23}$ | $R^{D1}$ |
| $L_{B989}$ | $R^{D14}$ | $R^{D24}$ | $R^{D1}$ |
| $L_{B990}$ | $R^{D14}$ | $R^{D25}$ | $R^{D1}$ |
| $L_{B991}$ | $R^{D14}$ | $R^{D26}$ | $R^{D1}$ |
| $L_{B992}$ | $R^{D14}$ | $R^{D27}$ | $R^{D1}$ |
| $L_{B993}$ | $R^{D14}$ | $R^{D28}$ | $R^{D1}$ |
| $L_{B994}$ | $R^{D14}$ | $R^{D29}$ | $R^{D1}$ |
| $L_{B995}$ | $R^{D14}$ | $R^{D30}$ | $R^{D1}$ |
| $L_{B996}$ | $R^{D14}$ | $R^{D31}$ | $R^{D1}$ |
| $L_{B997}$ | $R^{D14}$ | $R^{D32}$ | $R^{D1}$ |
| $L_{B998}$ | $R^{D14}$ | $R^{D33}$ | $R^{D1}$ |
| $L_{B999}$ | $R^{D14}$ | $R^{D34}$ | $R^{D1}$ |
| $L_{B1000}$ | $R^{D14}$ | $R^{D35}$ | $R^{D1}$ |
| $L_{B1001}$ | $R^{D14}$ | $R^{D40}$ | $R^{D1}$ |
| $L_{B1002}$ | $R^{D14}$ | $R^{D41}$ | $R^{D1}$ |
| $L_{B1003}$ | $R^{D14}$ | $R^{D42}$ | $R^{D1}$ |
| $L_{B1004}$ | $R^{D14}$ | $R^{D64}$ | $R^{D1}$ |
| $L_{B1005}$ | $R^{D14}$ | $R^{D66}$ | $R^{D1}$ |
| $L_{B1006}$ | $R^{D14}$ | $R^{D68}$ | $R^{D1}$ |
| $L_{B1007}$ | $R^{D14}$ | $R^{D76}$ | $R^{D1}$ |
| $L_{B1008}$ | $R^{D22}$ | $R^{D5}$ | $R^{D1}$ |
| $L_{B1009}$ | $R^{D22}$ | $R^{D6}$ | $R^{D1}$ |
| $L_{B1010}$ | $R^{D22}$ | $R^{D9}$ | $R^{D1}$ |
| $L_{B1011}$ | $R^{D22}$ | $R^{D10}$ | $R^{D1}$ |
| $L_{B1012}$ | $R^{D22}$ | $R^{D12}$ | $R^{D1}$ |
| $L_{B1013}$ | $R^{D22}$ | $R^{D15}$ | $R^{D1}$ |
| $L_{B1014}$ | $R^{D22}$ | $R^{D16}$ | $R^{D1}$ |
| $L_{B1015}$ | $R^{D22}$ | $R^{D17}$ | $R^{D1}$ |
| $L_{B1016}$ | $R^{D22}$ | $R^{D18}$ | $R^{D1}$ |
| $L_{B1017}$ | $R^{D22}$ | $R^{D19}$ | $R^{D1}$ |
| $L_{B1018}$ | $R^{D22}$ | $R^{D20}$ | $R^{D1}$ |
| $L_{B1019}$ | $R^{D22}$ | $R^{D21}$ | $R^{D1}$ |
| $L_{B1020}$ | $R^{D22}$ | $R^{D23}$ | $R^{D1}$ |
| $L_{B1021}$ | $R^{D22}$ | $R^{D24}$ | $R^{D1}$ |
| $L_{B1022}$ | $R^{D22}$ | $R^{D25}$ | $R^{D1}$ |
| $L_{B1023}$ | $R^{D22}$ | $R^{D26}$ | $R^{D1}$ |
| $L_{B1024}$ | $R^{D22}$ | $R^{D27}$ | $R^{D1}$ |
| $L_{B1025}$ | $R^{D22}$ | $R^{D28}$ | $R^{D1}$ |
| $L_{B1026}$ | $R^{D22}$ | $R^{D29}$ | $R^{D1}$ |
| $L_{B1027}$ | $R^{D22}$ | $R^{D30}$ | $R^{D1}$ |
| $L_{B1028}$ | $R^{D22}$ | $R^{D31}$ | $R^{D1}$ |
| $L_{B1029}$ | $R^{D22}$ | $R^{D32}$ | $R^{D1}$ |
| $L_{B1030}$ | $R^{D22}$ | $R^{D33}$ | $R^{D1}$ |
| $L_{B1031}$ | $R^{D22}$ | $R^{D34}$ | $R^{D1}$ |
| $L_{B1032}$ | $R^{D22}$ | $R^{D35}$ | $R^{D1}$ |
| $L_{B1033}$ | $R^{D22}$ | $R^{D40}$ | $R^{D1}$ |
| $L_{B1034}$ | $R^{D22}$ | $R^{D41}$ | $R^{D1}$ |
| $L_{B1035}$ | $R^{D22}$ | $R^{D42}$ | $R^{D1}$ |
| $L_{B1036}$ | $R^{D22}$ | $R^{D64}$ | $R^{D1}$ |
| $L_{B1037}$ | $R^{D22}$ | $R^{D66}$ | $R^{D1}$ |
| $L_{B1038}$ | $R^{D22}$ | $R^{D68}$ | $R^{D1}$ |
| $L_{B1039}$ | $R^{D22}$ | $R^{D76}$ | $R^{D1}$ |

-continued

| Ligand | $R^1$ | $R^2$ | $R^3$ |
|---|---|---|---|
| $L_{B1040}$ | $R^{D26}$ | $R^{D5}$ | $R^{D1}$ |
| $L_{B1041}$ | $R^{D26}$ | $R^{D6}$ | $R^{D1}$ |
| $L_{B1042}$ | $R^{D26}$ | $R^{D9}$ | $R^{D1}$ |
| $L_{B1043}$ | $R^{D26}$ | $R^{D10}$ | $R^{D1}$ |
| $L_{B1044}$ | $R^{D26}$ | $R^{D12}$ | $R^{D1}$ |
| $L_{B1045}$ | $R^{D26}$ | $R^{D15}$ | $R^{D1}$ |
| $L_{B1046}$ | $R^{D26}$ | $R^{D16}$ | $R^{D1}$ |
| $L_{B1047}$ | $R^{D26}$ | $R^{D17}$ | $R^{D1}$ |
| $L_{B1048}$ | $R^{D26}$ | $R^{D18}$ | $R^{D1}$ |
| $L_{B1049}$ | $R^{D26}$ | $R^{D19}$ | $R^{D1}$ |
| $L_{B1050}$ | $R^{D26}$ | $R^{D20}$ | $R^{D1}$ |
| $L_{B1051}$ | $R^{D26}$ | $R^{D21}$ | $R^{D1}$ |
| $L_{B1052}$ | $R^{D26}$ | $R^{D23}$ | $R^{D1}$ |
| $L_{B1053}$ | $R^{D26}$ | $R^{D24}$ | $R^{D1}$ |
| $L_{B1054}$ | $R^{D26}$ | $R^{D25}$ | $R^{D1}$ |
| $L_{B1055}$ | $R^{D26}$ | $R^{D27}$ | $R^{D1}$ |
| $L_{B1056}$ | $R^{D26}$ | $R^{D28}$ | $R^{D1}$ |
| $L_{B1057}$ | $R^{D26}$ | $R^{D29}$ | $R^{D1}$ |
| $L_{B1058}$ | $R^{D26}$ | $R^{D30}$ | $R^{D1}$ |
| $L_{B1059}$ | $R^{D26}$ | $R^{D31}$ | $R^{D1}$ |
| $L_{B1060}$ | $R^{D26}$ | $R^{D32}$ | $R^{D1}$ |
| $L_{B1061}$ | $R^{D26}$ | $R^{D33}$ | $R^{D1}$ |
| $L_{B1062}$ | $R^{D26}$ | $R^{D34}$ | $R^{D1}$ |
| $L_{B1063}$ | $R^{D26}$ | $R^{D35}$ | $R^{D1}$ |
| $L_{B1064}$ | $R^{D26}$ | $R^{D40}$ | $R^{D1}$ |
| $L_{B1065}$ | $R^{D26}$ | $R^{D41}$ | $R^{D1}$ |
| $L_{B1066}$ | $R^{D26}$ | $R^{D42}$ | $R^{D1}$ |
| $L_{B1067}$ | $R^{D26}$ | $R^{D64}$ | $R^{D1}$ |
| $L_{B1068}$ | $R^{D26}$ | $R^{D66}$ | $R^{D1}$ |
| $L_{B1069}$ | $R^{D26}$ | $R^{D68}$ | $R^{D1}$ |
| $L_{B1070}$ | $R^{D26}$ | $R^{D76}$ | $R^{D1}$ |
| $L_{B1071}$ | $R^{D35}$ | $R^{D5}$ | $R^{D1}$ |
| $L_{B1072}$ | $R^{D35}$ | $R^{D6}$ | $R^{D1}$ |
| $L_{B1073}$ | $R^{D35}$ | $R^{D9}$ | $R^{D1}$ |
| $L_{B1074}$ | $R^{D35}$ | $R^{D10}$ | $R^{D1}$ |
| $L_{B1075}$ | $R^{D35}$ | $R^{D12}$ | $R^{D1}$ |
| $L_{B1076}$ | $R^{D35}$ | $R^{D15}$ | $R^{D1}$ |
| $L_{B1077}$ | $R^{D35}$ | $R^{D16}$ | $R^{D1}$ |
| $L_{B1078}$ | $R^{D35}$ | $R^{D17}$ | $R^{D1}$ |
| $L_{B1079}$ | $R^{D35}$ | $R^{D18}$ | $R^{D1}$ |
| $L_{B1080}$ | $R^{D35}$ | $R^{D19}$ | $R^{D1}$ |
| $L_{B1081}$ | $R^{D35}$ | $R^{D20}$ | $R^{D1}$ |
| $L_{B1082}$ | $R^{D35}$ | $R^{D21}$ | $R^{D1}$ |
| $L_{B1083}$ | $R^{D35}$ | $R^{D23}$ | $R^{D1}$ |
| $L_{B1084}$ | $R^{D35}$ | $R^{D24}$ | $R^{D1}$ |
| $L_{B1085}$ | $R^{D35}$ | $R^{D25}$ | $R^{D1}$ |
| $L_{B1086}$ | $R^{D35}$ | $R^{D27}$ | $R^{D1}$ |
| $L_{B1087}$ | $R^{D35}$ | $R^{D28}$ | $R^{D1}$ |
| $L_{B1088}$ | $R^{D35}$ | $R^{D29}$ | $R^{D1}$ |
| $L_{B1089}$ | $R^{D35}$ | $R^{D30}$ | $R^{D1}$ |
| $L_{B1090}$ | $R^{D35}$ | $R^{D31}$ | $R^{D1}$ |
| $L_{B1091}$ | $R^{D35}$ | $R^{D32}$ | $R^{D1}$ |
| $L_{B1092}$ | $R^{D35}$ | $R^{D33}$ | $R^{D1}$ |
| $L_{B1093}$ | $R^{D35}$ | $R^{D34}$ | $R^{D1}$ |
| $L_{B1094}$ | $R^{D35}$ | $R^{D40}$ | $R^{D1}$ |
| $L_{B1095}$ | $R^{D35}$ | $R^{D41}$ | $R^{D1}$ |
| $L_{B1096}$ | $R^{D35}$ | $R^{D42}$ | $R^{D1}$ |
| $L_{B1097}$ | $R^{D35}$ | $R^{D64}$ | $R^{D1}$ |
| $L_{B1098}$ | $R^{D35}$ | $R^{D66}$ | $R^{D1}$ |
| $L_{B1099}$ | $R^{D35}$ | $R^{D68}$ | $R^{D1}$ |
| $L_{B1100}$ | $R^{D35}$ | $R^{D76}$ | $R^{D1}$ |
| $L_{B1101}$ | $R^{D40}$ | $R^{D5}$ | $R^{D1}$ |
| $L_{B1102}$ | $R^{D40}$ | $R^{D6}$ | $R^{D1}$ |
| $L_{B1103}$ | $R^{D40}$ | $R^{D9}$ | $R^{D1}$ |
| $L_{B1104}$ | $R^{D40}$ | $R^{D10}$ | $R^{D1}$ |
| $L_{B1105}$ | $R^{D40}$ | $R^{D12}$ | $R^{D1}$ |
| $L_{B1106}$ | $R^{D40}$ | $R^{D15}$ | $R^{D1}$ |
| $L_{B1107}$ | $R^{D40}$ | $R^{D16}$ | $R^{D1}$ |
| $L_{B1108}$ | $R^{D40}$ | $R^{D17}$ | $R^{D1}$ |
| $L_{B1109}$ | $R^{D40}$ | $R^{D18}$ | $R^{D1}$ |
| $L_{B1110}$ | $R^{D40}$ | $R^{D19}$ | $R^{D1}$ |
| $L_{B1111}$ | $R^{D40}$ | $R^{D20}$ | $R^{D1}$ |
| $L_{B1112}$ | $R^{D40}$ | $R^{D21}$ | $R^{D1}$ |
| $L_{B1113}$ | $R^{D40}$ | $R^{D23}$ | $R^{D1}$ |
| $L_{B1114}$ | $R^{D40}$ | $R^{D24}$ | $R^{D1}$ |
| $L_{B1115}$ | $R^{D40}$ | $R^{D25}$ | $R^{D1}$ |
| $L_{B1116}$ | $R^{D40}$ | $R^{D27}$ | $R^{D1}$ |

-continued

| Ligand | $R^1$ | $R^2$ | $R^3$ |
|---|---|---|---|
| $L_{B1117}$ | $R^{D40}$ | $R^{D28}$ | $R^{D1}$ |
| $L_{B1118}$ | $R^{D40}$ | $R^{D29}$ | $R^{D1}$ |
| $L_{B1119}$ | $R^{D40}$ | $R^{D30}$ | $R^{D1}$ |
| $L_{B1120}$ | $R^{D40}$ | $R^{D31}$ | $R^{D1}$ |
| $L_{B1121}$ | $R^{D40}$ | $R^{D32}$ | $R^{D1}$ |
| $L_{B1122}$ | $R^{D40}$ | $R^{D33}$ | $R^{D1}$ |
| $L_{B1123}$ | $R^{D40}$ | $R^{D34}$ | $R^{D1}$ |
| $L_{B1124}$ | $R^{D40}$ | $R^{D41}$ | $R^{D1}$ |
| $L_{B1125}$ | $R^{D40}$ | $R^{D42}$ | $R^{D1}$ |
| $L_{B1126}$ | $R^{D40}$ | $R^{D64}$ | $R^{D1}$ |
| $L_{B1127}$ | $R^{D40}$ | $R^{D66}$ | $R^{D1}$ |
| $L_{B1128}$ | $R^{D40}$ | $R^{D68}$ | $R^{D1}$ |
| $L_{B1129}$ | $R^{D40}$ | $R^{D76}$ | $R^{D1}$ |
| $L_{B1130}$ | $R^{D41}$ | $R^{D5}$ | $R^{D1}$ |
| $L_{B1131}$ | $R^{D41}$ | $R^{D6}$ | $R^{D1}$ |
| $L_{B1132}$ | $R^{D41}$ | $R^{D9}$ | $R^{D1}$ |
| $L_{B1133}$ | $R^{D41}$ | $R^{D10}$ | $R^{D1}$ |
| $L_{B1134}$ | $R^{D41}$ | $R^{D12}$ | $R^{D1}$ |
| $L_{B1135}$ | $R^{D41}$ | $R^{D15}$ | $R^{D1}$ |
| $L_{B1136}$ | $R^{D41}$ | $R^{D16}$ | $R^{D1}$ |
| $L_{B1137}$ | $R^{D41}$ | $R^{D17}$ | $R^{D1}$ |
| $L_{B1138}$ | $R^{D41}$ | $R^{D18}$ | $R^{D1}$ |
| $L_{B1139}$ | $R^{D41}$ | $R^{D19}$ | $R^{D1}$ |
| $L_{B1140}$ | $R^{D41}$ | $R^{D20}$ | $R^{D1}$ |
| $L_{B1141}$ | $R^{D41}$ | $R^{D21}$ | $R^{D1}$ |
| $L_{B1142}$ | $R^{D41}$ | $R^{D23}$ | $R^{D1}$ |
| $L_{B1143}$ | $R^{D41}$ | $R^{D24}$ | $R^{D1}$ |
| $L_{B1144}$ | $R^{D41}$ | $R^{D25}$ | $R^{D1}$ |
| $L_{B1145}$ | $R^{D41}$ | $R^{D27}$ | $R^{D1}$ |
| $L_{B1146}$ | $R^{D41}$ | $R^{D28}$ | $R^{D1}$ |
| $L_{B1147}$ | $R^{D41}$ | $R^{D29}$ | $R^{D1}$ |
| $L_{B1148}$ | $R^{D41}$ | $R^{D30}$ | $R^{D1}$ |
| $L_{B1149}$ | $R^{D41}$ | $R^{D31}$ | $R^{D1}$ |
| $L_{B1150}$ | $R^{D41}$ | $R^{D32}$ | $R^{D1}$ |
| $L_{B1151}$ | $R^{D41}$ | $R^{D33}$ | $R^{D1}$ |
| $L_{B1152}$ | $R^{D41}$ | $R^{D34}$ | $R^{D1}$ |
| $L_{B1153}$ | $R^{D41}$ | $R^{D42}$ | $R^{D1}$ |
| $L_{B1154}$ | $R^{D41}$ | $R^{D64}$ | $R^{D1}$ |
| $L_{B1155}$ | $R^{D41}$ | $R^{D66}$ | $R^{D1}$ |
| $L_{B1156}$ | $R^{D41}$ | $R^{D68}$ | $R^{D1}$ |
| $L_{B1157}$ | $R^{D41}$ | $R^{D76}$ | $R^{D1}$ |
| $L_{B1158}$ | $R^{D64}$ | $R^{D5}$ | $R^{D1}$ |
| $L_{B1159}$ | $R^{D64}$ | $R^{D6}$ | $R^{D1}$ |
| $L_{B1160}$ | $R^{D64}$ | $R^{D9}$ | $R^{D1}$ |
| $L_{B1161}$ | $R^{D64}$ | $R^{D10}$ | $R^{D1}$ |
| $L_{B1162}$ | $R^{D64}$ | $R^{D12}$ | $R^{D1}$ |
| $L_{B1163}$ | $R^{D64}$ | $R^{D15}$ | $R^{D1}$ |
| $L_{B1164}$ | $R^{D64}$ | $R^{D16}$ | $R^{D1}$ |
| $L_{B1165}$ | $R^{D64}$ | $R^{D17}$ | $R^{D1}$ |
| $L_{B1166}$ | $R^{D64}$ | $R^{D18}$ | $R^{D1}$ |
| $L_{B1167}$ | $R^{D64}$ | $R^{D19}$ | $R^{D1}$ |
| $L_{B1168}$ | $R^{D64}$ | $R^{D20}$ | $R^{D1}$ |
| $L_{B1169}$ | $R^{D64}$ | $R^{D21}$ | $R^{D1}$ |
| $L_{B1170}$ | $R^{D64}$ | $R^{D23}$ | $R^{D1}$ |
| $L_{B1171}$ | $R^{D64}$ | $R^{D24}$ | $R^{D1}$ |
| $L_{B1172}$ | $R^{D64}$ | $R^{D25}$ | $R^{D1}$ |
| $L_{B1173}$ | $R^{D64}$ | $R^{D27}$ | $R^{D1}$ |
| $L_{B1174}$ | $R^{D64}$ | $R^{D28}$ | $R^{D1}$ |
| $L_{B1175}$ | $R^{D64}$ | $R^{D29}$ | $R^{D1}$ |
| $L_{B1176}$ | $R^{D64}$ | $R^{D30}$ | $R^{D1}$ |
| $L_{B1177}$ | $R^{D64}$ | $R^{D31}$ | $R^{D1}$ |
| $L_{B1178}$ | $R^{D64}$ | $R^{D32}$ | $R^{D1}$ |
| $L_{B1179}$ | $R^{D64}$ | $R^{D33}$ | $R^{D1}$ |
| $L_{B1180}$ | $R^{D64}$ | $R^{D34}$ | $R^{D1}$ |
| $L_{B1181}$ | $R^{D64}$ | $R^{D42}$ | $R^{D1}$ |
| $L_{B1182}$ | $R^{D64}$ | $R^{D64}$ | $R^{D1}$ |
| $L_{B1183}$ | $R^{D64}$ | $R^{D66}$ | $R^{D1}$ |
| $L_{B1184}$ | $R^{D64}$ | $R^{D68}$ | $R^{D1}$ |
| $L_{B1185}$ | $R^{D64}$ | $R^{D76}$ | $R^{D1}$ |
| $L_{B1186}$ | $R^{D66}$ | $R^{D5}$ | $R^{D1}$ |
| $L_{B1187}$ | $R^{D66}$ | $R^{D6}$ | $R^{D1}$ |
| $L_{B1188}$ | $R^{D66}$ | $R^{D9}$ | $R^{D1}$ |
| $L_{B1189}$ | $R^{D66}$ | $R^{D10}$ | $R^{D1}$ |
| $L_{B1190}$ | $R^{D66}$ | $R^{D12}$ | $R^{D1}$ |
| $L_{B1191}$ | $R^{D66}$ | $R^{D15}$ | $R^{D1}$ |
| $L_{B1192}$ | $R^{D66}$ | $R^{D16}$ | $R^{D1}$ |
| $L_{B1193}$ | $R^{D66}$ | $R^{D17}$ | $R^{D1}$ |
| $L_{B1194}$ | $R^{D66}$ | $R^{D18}$ | $R^{D1}$ |
| $L_{B1195}$ | $R^{D66}$ | $R^{D19}$ | $R^{D1}$ |
| $L_{B1196}$ | $R^{D66}$ | $R^{D20}$ | $R^{D1}$ |
| $L_{B1197}$ | $R^{D66}$ | $R^{D21}$ | $R^{D1}$ |
| $L_{B1198}$ | $R^{D66}$ | $R^{D23}$ | $R^{D1}$ |
| $L_{B1199}$ | $R^{D66}$ | $R^{D24}$ | $R^{D1}$ |
| $L_{B1200}$ | $R^{D66}$ | $R^{D25}$ | $R^{D1}$ |
| $L_{B1201}$ | $R^{D66}$ | $R^{D27}$ | $R^{D1}$ |
| $L_{B1202}$ | $R^{D66}$ | $R^{D28}$ | $R^{D1}$ |
| $L_{B1203}$ | $R^{D66}$ | $R^{D29}$ | $R^{D1}$ |
| $L_{B1204}$ | $R^{D66}$ | $R^{D30}$ | $R^{D1}$ |
| $L_{B1205}$ | $R^{D66}$ | $R^{D31}$ | $R^{D1}$ |
| $L_{B1206}$ | $R^{D66}$ | $R^{D32}$ | $R^{D1}$ |
| $L_{B1207}$ | $R^{D66}$ | $R^{D33}$ | $R^{D1}$ |
| $L_{B1208}$ | $R^{D66}$ | $R^{D34}$ | $R^{D1}$ |
| $L_{B1209}$ | $R^{D66}$ | $R^{D42}$ | $R^{D1}$ |
| $L_{B1210}$ | $R^{D66}$ | $R^{D68}$ | $R^{D1}$ |
| $L_{B1211}$ | $R^{D66}$ | $R^{D76}$ | $R^{D1}$ |
| $L_{B1212}$ | $R^{D68}$ | $R^{D5}$ | $R^{D1}$ |
| $L_{B1213}$ | $R^{D68}$ | $R^{D6}$ | $R^{D1}$ |
| $L_{B1214}$ | $R^{D68}$ | $R^{D9}$ | $R^{D1}$ |
| $L_{B1215}$ | $R^{D68}$ | $R^{D10}$ | $R^{D1}$ |
| $L_{B1216}$ | $R^{D68}$ | $R^{D12}$ | $R^{D1}$ |
| $L_{B1217}$ | $R^{D68}$ | $R^{D15}$ | $R^{D1}$ |
| $L_{B1218}$ | $R^{D68}$ | $R^{D16}$ | $R^{D1}$ |
| $L_{B1219}$ | $R^{D68}$ | $R^{D17}$ | $R^{D1}$ |
| $L_{B1220}$ | $R^{D68}$ | $R^{D18}$ | $R^{D1}$ |
| $L_{B1221}$ | $R^{D68}$ | $R^{D19}$ | $R^{D1}$ |
| $L_{B1222}$ | $R^{D68}$ | $R^{D20}$ | $R^{D1}$ |
| $L_{B1223}$ | $R^{D68}$ | $R^{D21}$ | $R^{D1}$ |
| $L_{B1224}$ | $R^{D68}$ | $R^{D23}$ | $R^{D1}$ |
| $L_{B1225}$ | $R^{D68}$ | $R^{D24}$ | $R^{D1}$ |
| $L_{B1226}$ | $R^{D68}$ | $R^{D25}$ | $R^{D1}$ |
| $L_{B1227}$ | $R^{D68}$ | $R^{D27}$ | $R^{D1}$ |
| $L_{B1228}$ | $R^{D68}$ | $R^{D28}$ | $R^{D1}$ |
| $L_{B1229}$ | $R^{D68}$ | $R^{D29}$ | $R^{D1}$ |
| $L_{B1230}$ | $R^{D68}$ | $R^{D30}$ | $R^{D1}$ |
| $L_{B1231}$ | $R^{D68}$ | $R^{D31}$ | $R^{D1}$ |
| $L_{B1232}$ | $R^{D68}$ | $R^{D32}$ | $R^{D1}$ |
| $L_{B1233}$ | $R^{D68}$ | $R^{D33}$ | $R^{D1}$ |
| $L_{B1234}$ | $R^{D68}$ | $R^{D34}$ | $R^{D1}$ |
| $L_{B1235}$ | $R^{D68}$ | $R^{D42}$ | $R^{D1}$ |
| $L_{B1236}$ | $R^{D68}$ | $R^{D76}$ | $R^{D1}$ |
| $L_{B1237}$ | $R^{D76}$ | $R^{D5}$ | $R^{D1}$ |
| $L_{B1238}$ | $R^{D76}$ | $R^{D6}$ | $R^{D1}$ |
| $L_{B1239}$ | $R^{D76}$ | $R^{D9}$ | $R^{D1}$ |
| $L_{B1240}$ | $R^{D76}$ | $R^{D10}$ | $R^{D1}$ |
| $L_{B1241}$ | $R^{D76}$ | $R^{D12}$ | $R^{D1}$ |
| $L_{B1242}$ | $R^{D76}$ | $R^{D15}$ | $R^{D1}$ |
| $L_{B1243}$ | $R^{D76}$ | $R^{D16}$ | $R^{D1}$ |
| $L_{B1244}$ | $R^{D76}$ | $R^{D17}$ | $R^{D1}$ |
| $L_{B1245}$ | $R^{D76}$ | $R^{D18}$ | $R^{D1}$ |
| $L_{B1246}$ | $R^{D76}$ | $R^{D19}$ | $R^{D1}$ |
| $L_{B1247}$ | $R^{D76}$ | $R^{D20}$ | $R^{D1}$ |
| $L_{B1248}$ | $R^{D76}$ | $R^{D21}$ | $R^{D1}$ |
| $L_{B1249}$ | $R^{D76}$ | $R^{D23}$ | $R^{D1}$ |
| $L_{B1250}$ | $R^{D76}$ | $R^{D24}$ | $R^{D1}$ |
| $L_{B1251}$ | $R^{D76}$ | $R^{D25}$ | $R^{D1}$ |
| $L_{B1252}$ | $R^{D76}$ | $R^{D27}$ | $R^{D1}$ |
| $L_{B1253}$ | $R^{D76}$ | $R^{D28}$ | $R^{D1}$ |
| $L_{B1254}$ | $R^{D76}$ | $R^{D29}$ | $R^{D1}$ |
| $L_{B1255}$ | $R^{D76}$ | $R^{D30}$ | $R^{D1}$ |
| $L_{B1256}$ | $R^{D76}$ | $R^{D31}$ | $R^{D1}$ |
| $L_{B1257}$ | $R^{D76}$ | $R^{D32}$ | $R^{D1}$ |
| $L_{B1258}$ | $R^{D76}$ | $R^{D33}$ | $R^{D1}$ |
| $L_{B1259}$ | $R^{D76}$ | $R^{D34}$ | $R^{D1}$ |
| $L_{B1260}$ | $R^{D76}$ | $R^{D42}$ | $R^{D1}$ |

wherein $R^{D1}$ to $R^{D81}$ has the following structures:

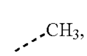

$R^{D1}$

-continued
$R^{D2}$
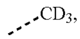
$R^{D3}$
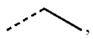
$R^{D4}$
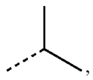
$R^{D5}$
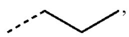
$R^{D6}$
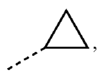
$R^{D7}$
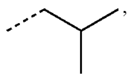
$R^{D8}$
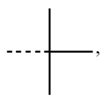
$R^{D9}$
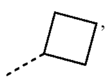
$R^{D10}$
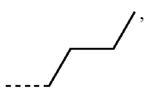
$R^{D11}$
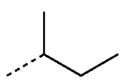
$R^{D12}$
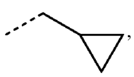
$R^{D13}$
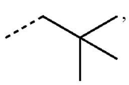
$R^{D14}$
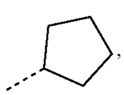
$R^{D15}$
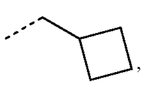
$R^{D16}$
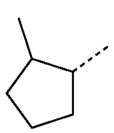
$R^{D17}$
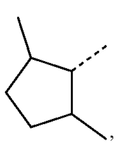
-continued
$R^{D18}$
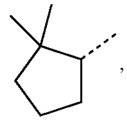
$R^{D19}$
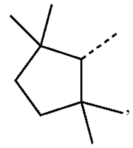
$R^{D20}$
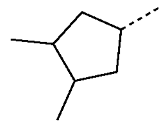
$R^{D21}$
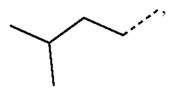
$R^{D22}$
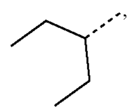
$R^{D23}$
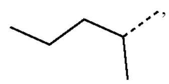
$R^{D24}$
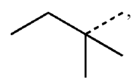
$R^{D25}$
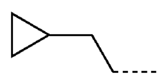
$R^{D26}$
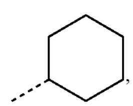
$R^{D27}$
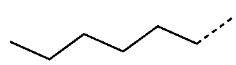
$R^{D28}$
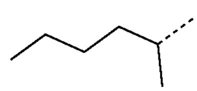
$R^{D29}$
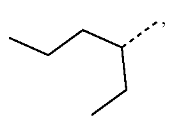
$R^{D30}$
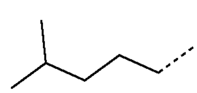

-continued
$R^{D31}$
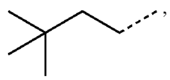
$R^{D32}$
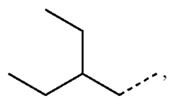
$R^{D33}$
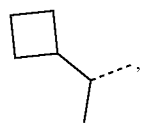
$R^{D34}$
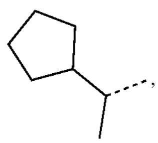
$R^{D35}$
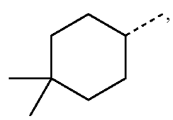
$R^{D36}$
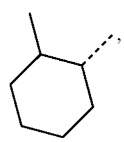
$R^{D37}$
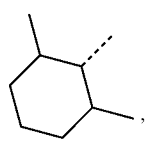
$R^{D38}$
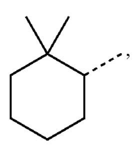
$R^{D39}$
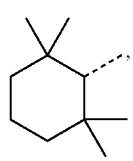
$R^{D40}$
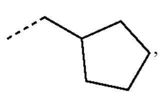
$R^{D41}$
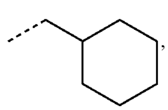
$R^{D42}$
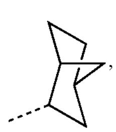
-continued
$R^{D43}$
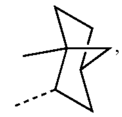
$R^{D44}$
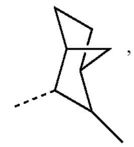
$R^{D45}$
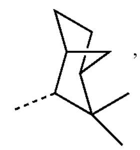
$R^{D46}$
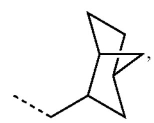
$R^{D47}$
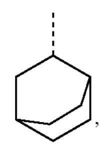
$R^{D48}$
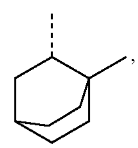
$R^{D49}$
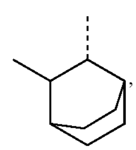
$R^{D50}$
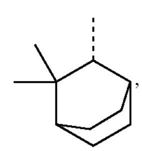
$R^{D51}$
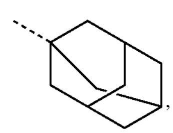
$R^{D52}$
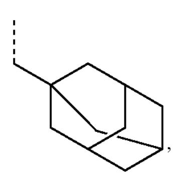

-continued
$R^{D53}$
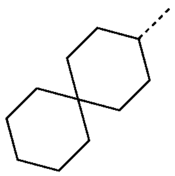
$R^{D54}$
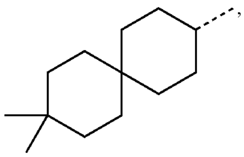
$R^{D55}$
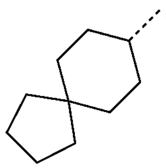
$R^{D56}$
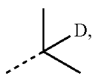
$R^{D57}$
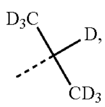
$R^{D58}$
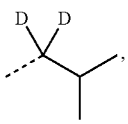
$R^{D59}$
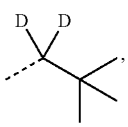
$R^{D60}$
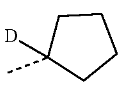
$R^{D61}$
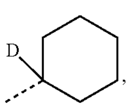
$R^{D62}$
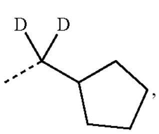
$R^{D63}$
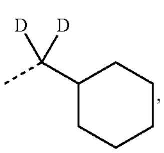
$R^{D64}$
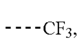
-continued
$R^{D65}$
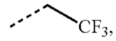
$R^{D66}$
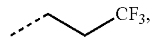
$R^{D67}$
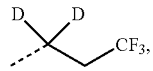
$R^{D68}$
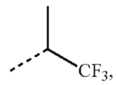
$R^{D69}$
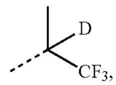
$R^{D70}$
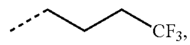
$R^{D71}$
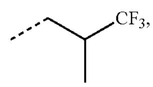
$R^{D72}$
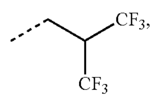
$R^{D73}$
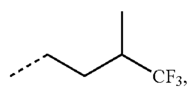
$R^{D74}$
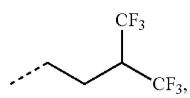
$R^{D75}$
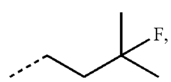
$R^{D76}$
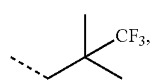
$R^{D77}$
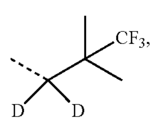
$R^{D78}$
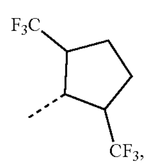
$R^{D79}$
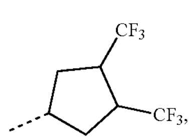

-continued $R^{D80}$

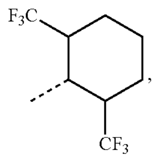

and $R^{D81}$

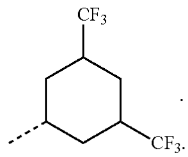

10. The compound of claim 1, wherein the compound has formula $Ir(L_A)_3$, $Ir(L_A)(L_B)_2$, $Ir(L_A)_2(L_B)$, $Ir(L_A)_2(L_C)$, or $Ir(L_A)(L_B)(L_C)$; and wherein each $L_A$, $L_B$, and $L_C$ is a bidentate ligand, and different from each other.

11. The compound of claim 10, wherein $L_B$ is $L_{Bj}$ selected from the group consisting of:

$L_{B1}$ through $L_{B1260}$ are based on a structure of Formula

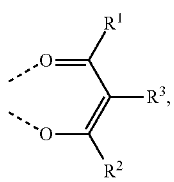

in which $R^1$, $R^2$, and $R^3$ are defined as:

| $L_{Bj}$ | $R^1$ | $R^2$ | $R^3$ |
|---|---|---|---|
| $L_{B1}$ | $R^{D1}$ | $R^{D1}$ | H |
| $L_{B2}$ | $R^{D2}$ | $R^{D2}$ | H |
| $L_{B3}$ | $R^{D3}$ | $R^{D3}$ | H |
| $L_{B4}$ | $R^{D4}$ | $R^{D4}$ | H |
| $L_{B5}$ | $R^{D5}$ | $R^{D5}$ | H |
| $L_{B6}$ | $R^{D6}$ | $R^{D6}$ | H |
| $L_{B7}$ | $R^{D7}$ | $R^{D7}$ | H |
| $L_{B8}$ | $R^{D8}$ | $R^{D8}$ | H |
| $L_{B9}$ | $R^{D9}$ | $R^{D9}$ | H |
| $L_{B10}$ | $R^{D10}$ | $R^{D10}$ | H |
| $L_{B11}$ | $R^{D11}$ | $R^{D11}$ | H |
| $L_{B12}$ | $R^{D12}$ | $R^{D12}$ | H |
| $L_{B13}$ | $R^{D13}$ | $R^{D13}$ | H |
| $L_{B14}$ | $R^{D14}$ | $R^{D14}$ | H |
| $L_{B15}$ | $R^{D15}$ | $R^{D15}$ | H |
| $L_{B16}$ | $R^{D16}$ | $R^{D16}$ | H |
| $L_{B17}$ | $R^{D17}$ | $R^{D17}$ | H |
| $L_{B18}$ | $R^{D18}$ | $R^{D18}$ | H |
| $L_{B19}$ | $R^{D19}$ | $R^{D19}$ | H |
| $L_{B20}$ | $R^{D20}$ | $R^{D20}$ | H |
| $L_{B21}$ | $R^{D21}$ | $R^{D21}$ | H |
| $L_{B22}$ | $R^{D22}$ | $R^{D22}$ | H |
| $L_{B23}$ | $R^{D23}$ | $R^{D23}$ | H |
| $L_{B24}$ | $R^{D24}$ | $R^{D24}$ | H |
| $L_{B25}$ | $R^{D25}$ | $R^{D25}$ | H |
| $L_{B26}$ | $R^{D26}$ | $R^{D26}$ | H |
| $L_{B27}$ | $R^{D27}$ | $R^{D27}$ | H |
| $L_{B28}$ | $R^{D28}$ | $R^{D28}$ | H |
| $L_{B29}$ | $R^{29}$ | $R^{D29}$ | H |
| $L_{B30}$ | $R^{D30}$ | $R^{D30}$ | H |
| $L_{B31}$ | $R^{D31}$ | $R^{D31}$ | H |
| $L_{B32}$ | $R^{D32}$ | $R^{D32}$ | H |
| $L_{B33}$ | $R^{D33}$ | $R^{D33}$ | H |
| $L_{B34}$ | $R^{D34}$ | $R^{D34}$ | H |
| $L_{B35}$ | $R^{D35}$ | $R^{D35}$ | H |
| $L_{B36}$ | $R^{D40}$ | $R^{D40}$ | H |

-continued

| $L_{Bj}$ | $R^1$ | $R^2$ | $R^3$ |
|---|---|---|---|
| $L_{B37}$ | $R^{D41}$ | $R^{D41}$ | H |
| $L_{B38}$ | $R^{D42}$ | $R^{D42}$ | H |
| $L_{B39}$ | $R^{D64}$ | $R^{D64}$ | H |
| $L_{B40}$ | $R^{D66}$ | $R^{D66}$ | H |
| $L_{B41}$ | $R^{D68}$ | $R^{D68}$ | H |
| $L_{B42}$ | $R^{D76}$ | $R^{D76}$ | H |
| $L_{B43}$ | $R^{D1}$ | $R^{D2}$ | H |
| $L_{B44}$ | $R^{D1}$ | $R^{D3}$ | H |
| $L_{B45}$ | $R^{D1}$ | $R^{D4}$ | H |
| $L_{B46}$ | $R^{D1}$ | $R^{D5}$ | H |
| $L_{B47}$ | $R^{D1}$ | $R^{D6}$ | H |
| $L_{B48}$ | $R^{D1}$ | $R^{D7}$ | H |
| $L_{B49}$ | $R^{D1}$ | $R^{D8}$ | H |
| $L_{B50}$ | $R^{D1}$ | $R^{D9}$ | H |
| $L_{B51}$ | $R^{D1}$ | $R^{D10}$ | H |
| $L_{B52}$ | $R^{D1}$ | $R^{D11}$ | H |
| $L_{B53}$ | $R^{D1}$ | $R^{D12}$ | H |
| $L_{B54}$ | $R^{D1}$ | $R^{D13}$ | H |
| $L_{B55}$ | $R^{D1}$ | $R^{D14}$ | H |
| $L_{B56}$ | $R^{D1}$ | $R^{D15}$ | H |
| $L_{B57}$ | $R^{D1}$ | $R^{D16}$ | H |
| $L_{B58}$ | $R^{D1}$ | $R^{D17}$ | H |
| $L_{B59}$ | $R^{D1}$ | $R^{D18}$ | H |
| $L_{B60}$ | $R^{D1}$ | $R^{D19}$ | H |
| $L_{B61}$ | $R^{D1}$ | $R^{D20}$ | H |
| $L_{B62}$ | $R^{D1}$ | $R^{D21}$ | H |
| $L_{B63}$ | $R^{D1}$ | $R^{D22}$ | H |
| $L_{B64}$ | $R^{D1}$ | $R^{D23}$ | H |
| $L_{B65}$ | $R^{D1}$ | $R^{D24}$ | H |
| $L_{B66}$ | $R^{D1}$ | $R^{D25}$ | H |
| $L_{B67}$ | $R^{D1}$ | $R^{D26}$ | H |
| $L_{B68}$ | $R^{D1}$ | $R^{D27}$ | H |
| $L_{B69}$ | $R^{D1}$ | $R^{D28}$ | H |
| $L_{B70}$ | $R^{D1}$ | $R^{D29}$ | H |
| $L_{B71}$ | $R^{D1}$ | $R^{D30}$ | H |
| $L_{B72}$ | $R^{D1}$ | $R^{D31}$ | H |
| $L_{B73}$ | $R^{D1}$ | $R^{D32}$ | H |
| $L_{B74}$ | $R^{D1}$ | $R^{D33}$ | H |
| $L_{B75}$ | $R^{D1}$ | $R^{D34}$ | H |
| $L_{B76}$ | $R^{D1}$ | $R^{D35}$ | H |
| $L_{B77}$ | $R^{D1}$ | $R^{D40}$ | H |
| $L_{B78}$ | $R^{D1}$ | $R^{D41}$ | H |
| $L_{B79}$ | $R^{D1}$ | $R^{D42}$ | H |
| $L_{B80}$ | $R^{D1}$ | $R^{D64}$ | H |
| $L_{B81}$ | $R^{D1}$ | $R^{D66}$ | H |
| $L_{B82}$ | $R^{D1}$ | $R^{D68}$ | H |
| $L_{B83}$ | $R^{D1}$ | $R^{D76}$ | H |
| $L_{B84}$ | $R^{D2}$ | $R^{D1}$ | H |
| $L_{B85}$ | $R^{D2}$ | $R^{D3}$ | H |
| $L_{B86}$ | $R^{D2}$ | $R^{D4}$ | H |
| $L_{B87}$ | $R^{D2}$ | $R^{D5}$ | H |
| $L_{B88}$ | $R^{D2}$ | $R^{D6}$ | H |
| $L_{B89}$ | $R^{D2}$ | $R^{D7}$ | H |
| $L_{B90}$ | $R^{D2}$ | $R^{D8}$ | H |
| $L_{B91}$ | $R^{D2}$ | $R^{D9}$ | H |
| $L_{B92}$ | $R^{D2}$ | $R^{D10}$ | H |
| $L_{B93}$ | $R^{D2}$ | $R^{D11}$ | H |
| $L_{B94}$ | $R^{D2}$ | $R^{D12}$ | H |
| $L_{B95}$ | $R^{D2}$ | $R^{D13}$ | H |
| $L_{B96}$ | $R^{D2}$ | $R^{D14}$ | H |
| $L_{B97}$ | $R^{D2}$ | $R^{D15}$ | H |
| $L_{B98}$ | $R^{D2}$ | $R^{D16}$ | H |
| $L_{B99}$ | $R^{D2}$ | $R^{D17}$ | H |
| $L_{B100}$ | $R^{D2}$ | $R^{D18}$ | H |
| $L_{B101}$ | $R^{D2}$ | $R^{D19}$ | H |
| $L_{B102}$ | $R^{D2}$ | $R^{D20}$ | H |
| $L_{B103}$ | $R^{D2}$ | $R^{D21}$ | H |
| $L_{B104}$ | $R^{D2}$ | $R^{D22}$ | H |
| $L_{B105}$ | $R^{D2}$ | $R^{D23}$ | H |
| $L_{B106}$ | $R^{D2}$ | $R^{D24}$ | H |
| $L_{B107}$ | $R^{D2}$ | $R^{D25}$ | H |
| $L_{B108}$ | $R^{D2}$ | $R^{D26}$ | H |
| $L_{B109}$ | $R^{D2}$ | $R^{D27}$ | H |
| $L_{B110}$ | $R^{D2}$ | $R^{D28}$ | H |
| $L_{B111}$ | $R^{D2}$ | $R^{D29}$ | H |
| $L_{B112}$ | $R^{D2}$ | $R^{D30}$ | H |
| $L_{B113}$ | $R^{D2}$ | $R^{D31}$ | H |

-continued

| $L_{Bj}$ | $R^1$ | $R^2$ | $R^3$ |
|---|---|---|---|
| $L_{B114}$ | $R^{D2}$ | $R^{D32}$ | H |
| $L_{B115}$ | $R^{D2}$ | $R^{D33}$ | H |
| $L_{B116}$ | $R^{D2}$ | $R^{D34}$ | H |
| $L_{B117}$ | $R^{D2}$ | $R^{D35}$ | H |
| $L_{B118}$ | $R^{D2}$ | $R^{D40}$ | H |
| $L_{B119}$ | $R^{D2}$ | $R^{D41}$ | H |
| $L_{B120}$ | $R^{D2}$ | $R^{D42}$ | H |
| $L_{B121}$ | $R^{D2}$ | $R^{D64}$ | H |
| $L_{B122}$ | $R^{D2}$ | $R^{D66}$ | H |
| $L_{B123}$ | $R^{D2}$ | $R^{D68}$ | H |
| $L_{B124}$ | $R^{D2}$ | $R^{D76}$ | H |
| $L_{B125}$ | $R^{D3}$ | $R^{D4}$ | H |
| $L_{B126}$ | $R^{D3}$ | $R^{D5}$ | H |
| $L_{B127}$ | $R^{D3}$ | $R^{D6}$ | H |
| $L_{B128}$ | $R^{D3}$ | $R^{D7}$ | H |
| $L_{B129}$ | $R^{D3}$ | $R^{D8}$ | H |
| $L_{B130}$ | $R^{D3}$ | $R^{D9}$ | H |
| $L_{B131}$ | $R^{D3}$ | $R^{D10}$ | H |
| $L_{B132}$ | $R^{D3}$ | $R^{D11}$ | H |
| $L_{B133}$ | $R^{D3}$ | $R^{D12}$ | H |
| $L_{B134}$ | $R^{D3}$ | $R^{D13}$ | H |
| $L_{B135}$ | $R^{D3}$ | $R^{D14}$ | H |
| $L_{B136}$ | $R^{D3}$ | $R^{D15}$ | H |
| $L_{B137}$ | $R^{D3}$ | $R^{D16}$ | H |
| $L_{B138}$ | $R^{D3}$ | $R^{D17}$ | H |
| $L_{B139}$ | $R^{D3}$ | $R^{D18}$ | H |
| $L_{B140}$ | $R^{D3}$ | $R^{D19}$ | H |
| $L_{B141}$ | $R^{D3}$ | $R^{D20}$ | H |
| $L_{B142}$ | $R^{D3}$ | $R^{D21}$ | H |
| $L_{B143}$ | $R^{D3}$ | $R^{D22}$ | H |
| $L_{B144}$ | $R^{D3}$ | $R^{D23}$ | H |
| $L_{B145}$ | $R^{D3}$ | $R^{D24}$ | H |
| $L_{B146}$ | $R^{D3}$ | $R^{D25}$ | H |
| $L_{B147}$ | $R^{D3}$ | $R^{D26}$ | H |
| $L_{B148}$ | $R^{D3}$ | $R^{D27}$ | H |
| $L_{B149}$ | $R^{D3}$ | $R^{D28}$ | H |
| $L_{B150}$ | $R^{D3}$ | $R^{D29}$ | H |
| $L_{B151}$ | $R^{D3}$ | $R^{D30}$ | H |
| $L_{B152}$ | $R^{D3}$ | $R^{D31}$ | H |
| $L_{B153}$ | $R^{D3}$ | $R^{D32}$ | H |
| $L_{B154}$ | $R^{D3}$ | $R^{D33}$ | H |
| $L_{B155}$ | $R^{D3}$ | $R^{D34}$ | H |
| $L_{B156}$ | $R^{D3}$ | $R^{D35}$ | H |
| $L_{B157}$ | $R^{D3}$ | $R^{D40}$ | H |
| $L_{B158}$ | $R^{D3}$ | $R^{D41}$ | H |
| $L_{B159}$ | $R^{D3}$ | $R^{D42}$ | H |
| $L_{B160}$ | $R^{D3}$ | $R^{D64}$ | H |
| $L_{B161}$ | $R^{D3}$ | $R^{D66}$ | H |
| $L_{B162}$ | $R^{D3}$ | $R^{D68}$ | H |
| $L_{B163}$ | $R^{D3}$ | $R^{D76}$ | H |
| $L_{B164}$ | $R^{D4}$ | $R^{D5}$ | H |
| $L_{B165}$ | $R^{D4}$ | $R^{D6}$ | H |
| $L_{B166}$ | $R^{D4}$ | $R^{D7}$ | H |
| $L_{B167}$ | $R^{D4}$ | $R^{D8}$ | H |
| $L_{B168}$ | $R^{D4}$ | $R^{D9}$ | H |
| $L_{B169}$ | $R^{D4}$ | $R^{D10}$ | H |
| $L_{B170}$ | $R^{D4}$ | $R^{D11}$ | H |
| $L_{B171}$ | $R^{D4}$ | $R^{D12}$ | H |
| $L_{B172}$ | $R^{D4}$ | $R^{D13}$ | H |
| $L_{B173}$ | $R^{D4}$ | $R^{D14}$ | H |
| $L_{B174}$ | $R^{D4}$ | $R^{D15}$ | H |
| $L_{B175}$ | $R^{D4}$ | $R^{D16}$ | H |
| $L_{B176}$ | $R^{D4}$ | $R^{D17}$ | H |
| $L_{B177}$ | $R^{D4}$ | $R^{D18}$ | H |
| $L_{B178}$ | $R^{D4}$ | $R^{D19}$ | H |
| $L_{B179}$ | $R^{D4}$ | $R^{D20}$ | H |
| $L_{B180}$ | $R^{D4}$ | $R^{D21}$ | H |
| $L_{B181}$ | $R^{D4}$ | $R^{D22}$ | H |
| $L_{B182}$ | $R^{D4}$ | $R^{D23}$ | H |
| $L_{B183}$ | $R^{D4}$ | $R^{D24}$ | H |
| $L_{B184}$ | $R^{D4}$ | $R^{D25}$ | H |
| $L_{B185}$ | $R^{D4}$ | $R^{D26}$ | H |
| $L_{B186}$ | $R^{D4}$ | $R^{D27}$ | H |
| $L_{B187}$ | $R^{D4}$ | $R^{D28}$ | H |
| $L_{B188}$ | $R^{D4}$ | $R^{D29}$ | H |
| $L_{B189}$ | $R^{D4}$ | $R^{D30}$ | H |
| $L_{B190}$ | $R^{D4}$ | $R^{D31}$ | H |

-continued

| $L_{Bj}$ | $R^1$ | $R^2$ | $R^3$ |
|---|---|---|---|
| $L_{B191}$ | $R^{D4}$ | $R^{D32}$ | H |
| $L_{B192}$ | $R^{D4}$ | $R^{D33}$ | H |
| $L_{B193}$ | $R^{D4}$ | $R^{D34}$ | H |
| $L_{B194}$ | $R^{D4}$ | $R^{D35}$ | H |
| $L_{B195}$ | $R^{D4}$ | $R^{D40}$ | H |
| $L_{B196}$ | $R^{D4}$ | $R^{D41}$ | H |
| $L_{B197}$ | $R^{D4}$ | $R^{D42}$ | H |
| $L_{B198}$ | $R^{D4}$ | $R^{D64}$ | H |
| $L_{B199}$ | $R^{D4}$ | $R^{D66}$ | H |
| $L_{B200}$ | $R^{D4}$ | $R^{D68}$ | H |
| $L_{B201}$ | $R^{D4}$ | $R^{D76}$ | H |
| $L_{B202}$ | $R^{D4}$ | $R^{D1}$ | H |
| $L_{B203}$ | $R^{D7}$ | $R^{D5}$ | H |
| $L_{B204}$ | $R^{D7}$ | $R^{D6}$ | H |
| $L_{B205}$ | $R^{D7}$ | $R^{D8}$ | H |
| $L_{B206}$ | $R^{D7}$ | $R^{D9}$ | H |
| $L_{B207}$ | $R^{D7}$ | $R^{D10}$ | H |
| $L_{B208}$ | $R^{D7}$ | $R^{D11}$ | H |
| $L_{B209}$ | $R^{D7}$ | $R^{D12}$ | H |
| $L_{B210}$ | $R^{D7}$ | $R^{D13}$ | H |
| $L_{B211}$ | $R^{D7}$ | $R^{D14}$ | H |
| $L_{B212}$ | $R^{D7}$ | $R^{D15}$ | H |
| $L_{B213}$ | $R^{D7}$ | $R^{D16}$ | H |
| $L_{B214}$ | $R^{D7}$ | $R^{D17}$ | H |
| $L_{B215}$ | $R^{D7}$ | $R^{D18}$ | H |
| $L_{B216}$ | $R^{D7}$ | $R^{D19}$ | H |
| $L_{B217}$ | $R^{D7}$ | $R^{D20}$ | H |
| $L_{B218}$ | $R^{D7}$ | $R^{D21}$ | H |
| $L_{B219}$ | $R^{D7}$ | $R^{D22}$ | H |
| $L_{B220}$ | $R^{D7}$ | $R^{D23}$ | H |
| $L_{B221}$ | $R^{D7}$ | $R^{D24}$ | H |
| $L_{B222}$ | $R^{D7}$ | $R^{D25}$ | H |
| $L_{B223}$ | $R^{D7}$ | $R^{D26}$ | H |
| $L_{B224}$ | $R^{D7}$ | $R^{D27}$ | H |
| $L_{B225}$ | $R^{D7}$ | $R^{D28}$ | H |
| $L_{B226}$ | $R^{D7}$ | $R^{D29}$ | H |
| $L_{B227}$ | $R^{D7}$ | $R^{D30}$ | H |
| $L_{B228}$ | $R^{D7}$ | $R^{D31}$ | H |
| $L_{B229}$ | $R^{D7}$ | $R^{D32}$ | H |
| $L_{B230}$ | $R^{D7}$ | $R^{D33}$ | H |
| $L_{B231}$ | $R^{D7}$ | $R^{D34}$ | H |
| $L_{B232}$ | $R^{D7}$ | $R^{D35}$ | H |
| $L_{B233}$ | $R^{D7}$ | $R^{D40}$ | H |
| $L_{B234}$ | $R^{D7}$ | $R^{D41}$ | H |
| $L_{B235}$ | $R^{D7}$ | $R^{D42}$ | H |
| $L_{B236}$ | $R^{D7}$ | $R^{D64}$ | H |
| $L_{B237}$ | $R^{D7}$ | $R^{D66}$ | H |
| $L_{B238}$ | $R^{D7}$ | $R^{D68}$ | H |
| $L_{B239}$ | $R^{D7}$ | $R^{D76}$ | H |
| $L_{B240}$ | $R^{D8}$ | $R^{D5}$ | H |
| $L_{B241}$ | $R^{D8}$ | $R^{D6}$ | H |
| $L_{B242}$ | $R^{D8}$ | $R^{D9}$ | H |
| $L_{B243}$ | $R^{D8}$ | $R^{D10}$ | H |
| $L_{B244}$ | $R^{D8}$ | $R^{D11}$ | H |
| $L_{B245}$ | $R^{D8}$ | $R^{D12}$ | H |
| $L_{B246}$ | $R^{D8}$ | $R^{D13}$ | H |
| $L_{B247}$ | $R^{D8}$ | $R^{D14}$ | H |
| $L_{B248}$ | $R^{D8}$ | $R^{D15}$ | H |
| $L_{B249}$ | $R^{D8}$ | $R^{D16}$ | H |
| $L_{B250}$ | $R^{D8}$ | $R^{D17}$ | H |
| $L_{B251}$ | $R^{D8}$ | $R^{D18}$ | H |
| $L_{B252}$ | $R^{D8}$ | $R^{D19}$ | H |
| $L_{B253}$ | $R^{D8}$ | $R^{D20}$ | H |
| $L_{B254}$ | $R^{D8}$ | $R^{D21}$ | H |
| $L_{B255}$ | $R^{D8}$ | $R^{D22}$ | H |
| $L_{B256}$ | $R^{D8}$ | $R^{D23}$ | H |
| $L_{B257}$ | $R^{D8}$ | $R^{D24}$ | H |
| $L_{B258}$ | $R^{D8}$ | $R^{D25}$ | H |
| $L_{B259}$ | $R^{D8}$ | $R^{D26}$ | H |
| $L_{B260}$ | $R^{D8}$ | $R^{D27}$ | H |
| $L_{B261}$ | $R^{D8}$ | $R^{D28}$ | H |
| $L_{B262}$ | $R^{D8}$ | $R^{D29}$ | H |
| $L_{B263}$ | $R^{D8}$ | $R^{D30}$ | H |
| $L_{B264}$ | $R^{D8}$ | $R^{D31}$ | H |
| $L_{B265}$ | $R^{D8}$ | $R^{D32}$ | H |
| $L_{B266}$ | $R^{D8}$ | $R^{D33}$ | H |
| $L_{B267}$ | $R^{D8}$ | $R^{D34}$ | H |

-continued

| $L_{Bj}$ | $R^1$ | $R^2$ | $R^3$ |
|---|---|---|---|
| $L_{B268}$ | $R^{D8}$ | $R^{D35}$ | H |
| $L_{B269}$ | $R^{D8}$ | $R^{D40}$ | H |
| $L_{B270}$ | $R^{D8}$ | $R^{D41}$ | H |
| $L_{B271}$ | $R^{D8}$ | $R^{D42}$ | H |
| $L_{B272}$ | $R^{D8}$ | $R^{D64}$ | H |
| $L_{B273}$ | $R^{D8}$ | $R^{D66}$ | H |
| $L_{B274}$ | $R^{D8}$ | $R^{D68}$ | H |
| $L_{B275}$ | $R^{D8}$ | $R^{D76}$ | H |
| $L_{B276}$ | $R^{D11}$ | $R^{D5}$ | H |
| $L_{B277}$ | $R^{D11}$ | $R^{D6}$ | H |
| $L_{B278}$ | $R^{D11}$ | $R^{D9}$ | H |
| $L_{B279}$ | $R^{D11}$ | $R^{D10}$ | H |
| $L_{B280}$ | $R^{D11}$ | $R^{D12}$ | H |
| $L_{B281}$ | $R^{D11}$ | $R^{D13}$ | H |
| $L_{B282}$ | $R^{D11}$ | $R^{D14}$ | H |
| $L_{B283}$ | $R^{D11}$ | $R^{D15}$ | H |
| $L_{B284}$ | $R^{D11}$ | $R^{D16}$ | H |
| $L_{B285}$ | $R^{D11}$ | $R^{D17}$ | H |
| $L_{B286}$ | $R^{D11}$ | $R^{D18}$ | H |
| $L_{B287}$ | $R^{D11}$ | $R^{D19}$ | H |
| $L_{B288}$ | $R^{D11}$ | $R^{D20}$ | H |
| $L_{B289}$ | $R^{D11}$ | $R^{D21}$ | H |
| $L_{B290}$ | $R^{D11}$ | $R^{D22}$ | H |
| $L_{B291}$ | $R^{D11}$ | $R^{D23}$ | H |
| $L_{B292}$ | $R^{D11}$ | $R^{D24}$ | H |
| $L_{B293}$ | $R^{D11}$ | $R^{D25}$ | H |
| $L_{B294}$ | $R^{D11}$ | $R^{D26}$ | H |
| $L_{B295}$ | $R^{D11}$ | $R^{D27}$ | H |
| $L_{B296}$ | $R^{D11}$ | $R^{D28}$ | H |
| $L_{B297}$ | $R^{D11}$ | $R^{D29}$ | H |
| $L_{B298}$ | $R^{D11}$ | $R^{D30}$ | H |
| $L_{B299}$ | $R^{D11}$ | $R^{D31}$ | H |
| $L_{B300}$ | $R^{D11}$ | $R^{D32}$ | H |
| $L_{B301}$ | $R^{D11}$ | $R^{D33}$ | H |
| $L_{B302}$ | $R^{D11}$ | $R^{D34}$ | H |
| $L_{B303}$ | $R^{D11}$ | $R^{D35}$ | H |
| $L_{B304}$ | $R^{D11}$ | $R^{D40}$ | H |
| $L_{B305}$ | $R^{D11}$ | $R^{D41}$ | H |
| $L_{B306}$ | $R^{D11}$ | $R^{D42}$ | H |
| $L_{B307}$ | $R^{D11}$ | $R^{D64}$ | H |
| $L_{B308}$ | $R^{D11}$ | $R^{D66}$ | H |
| $L_{B309}$ | $R^{D11}$ | $R^{D68}$ | H |
| $L_{B310}$ | $R^{D11}$ | $R^{D76}$ | H |
| $L_{B311}$ | $R^{D13}$ | $R^{D5}$ | H |
| $L_{B312}$ | $R^{D13}$ | $R^{D6}$ | H |
| $L_{B313}$ | $R^{D13}$ | $R^{D9}$ | H |
| $L_{B314}$ | $R^{D13}$ | $R^{D10}$ | H |
| $L_{B315}$ | $R^{D13}$ | $R^{D12}$ | H |
| $L_{B316}$ | $R^{D13}$ | $R^{D14}$ | H |
| $L_{B317}$ | $R^{D13}$ | $R^{D15}$ | H |
| $L_{B318}$ | $R^{D13}$ | $R^{D16}$ | H |
| $L_{B319}$ | $R^{D13}$ | $R^{D17}$ | H |
| $L_{B320}$ | $R^{D13}$ | $R^{D18}$ | H |
| $L_{B321}$ | $R^{D13}$ | $R^{D19}$ | H |
| $L_{B322}$ | $R^{D13}$ | $R^{D20}$ | H |
| $L_{B323}$ | $R^{D13}$ | $R^{D21}$ | H |
| $L_{B324}$ | $R^{D13}$ | $R^{D22}$ | H |
| $L_{B325}$ | $R^{D13}$ | $R^{D23}$ | H |
| $L_{B326}$ | $R^{D13}$ | $R^{D24}$ | H |
| $L_{B327}$ | $R^{D13}$ | $R^{D25}$ | H |
| $L_{B328}$ | $R^{D13}$ | $R^{D26}$ | H |
| $L_{B329}$ | $R^{D13}$ | $R^{D27}$ | H |
| $L_{B330}$ | $R^{D13}$ | $R^{D28}$ | H |
| $L_{B331}$ | $R^{D13}$ | $R^{D29}$ | H |
| $L_{B332}$ | $R^{D13}$ | $R^{D30}$ | H |
| $L_{B333}$ | $R^{D13}$ | $R^{D31}$ | H |
| $L_{B334}$ | $R^{D13}$ | $R^{D32}$ | H |
| $L_{B335}$ | $R^{D13}$ | $R^{D33}$ | H |
| $L_{B336}$ | $R^{D13}$ | $R^{D34}$ | H |
| $L_{B337}$ | $R^{D13}$ | $R^{D35}$ | H |
| $L_{B338}$ | $R^{D13}$ | $R^{D40}$ | H |
| $L_{B339}$ | $R^{D13}$ | $R^{D41}$ | H |
| $L_{B340}$ | $R^{D13}$ | $R^{D42}$ | H |
| $L_{B341}$ | $R^{D13}$ | $R^{D64}$ | H |
| $L_{B342}$ | $R^{D13}$ | $R^{D66}$ | H |
| $L_{B343}$ | $R^{D13}$ | $R^{D68}$ | H |
| $L_{B344}$ | $R^{D13}$ | $R^{D76}$ | H |

-continued

| $L_{Bj}$ | $R^1$ | $R^2$ | $R^3$ |
|---|---|---|---|
| $L_{B345}$ | $R^{D14}$ | $R^{D5}$ | H |
| $L_{B346}$ | $R^{D14}$ | $R^{D6}$ | H |
| $L_{B347}$ | $R^{D14}$ | $R^{D9}$ | H |
| $L_{B348}$ | $R^{D14}$ | $R^{D10}$ | H |
| $L_{B349}$ | $R^{D14}$ | $R^{D12}$ | H |
| $L_{B350}$ | $R^{D14}$ | $R^{D15}$ | H |
| $L_{B351}$ | $R^{D14}$ | $R^{D16}$ | H |
| $L_{B352}$ | $R^{D14}$ | $R^{D17}$ | H |
| $L_{B353}$ | $R^{D14}$ | $R^{D18}$ | H |
| $L_{B354}$ | $R^{D14}$ | $R^{D19}$ | H |
| $L_{B355}$ | $R^{D14}$ | $R^{D20}$ | H |
| $L_{B356}$ | $R^{D14}$ | $R^{D21}$ | H |
| $L_{B357}$ | $R^{D14}$ | $R^{D22}$ | H |
| $L_{B358}$ | $R^{D14}$ | $R^{D23}$ | H |
| $L_{B359}$ | $R^{D14}$ | $R^{D24}$ | H |
| $L_{B360}$ | $R^{D14}$ | $R^{D25}$ | H |
| $L_{B361}$ | $R^{D14}$ | $R^{D26}$ | H |
| $L_{B362}$ | $R^{D14}$ | $R^{D27}$ | H |
| $L_{B363}$ | $R^{D14}$ | $R^{D28}$ | H |
| $L_{B364}$ | $R^{D14}$ | $R^{D29}$ | H |
| $L_{B365}$ | $R^{D14}$ | $R^{D30}$ | H |
| $L_{B366}$ | $R^{D14}$ | $R^{D31}$ | H |
| $L_{B367}$ | $R^{D14}$ | $R^{D32}$ | H |
| $L_{B368}$ | $R^{D14}$ | $R^{D33}$ | H |
| $L_{B369}$ | $R^{D14}$ | $R^{D34}$ | H |
| $L_{B370}$ | $R^{D14}$ | $R^{D35}$ | H |
| $L_{B371}$ | $R^{D14}$ | $R^{D40}$ | H |
| $L_{B372}$ | $R^{D14}$ | $R^{D41}$ | H |
| $L_{B373}$ | $R^{D14}$ | $R^{D42}$ | H |
| $L_{B374}$ | $R^{D14}$ | $R^{D64}$ | H |
| $L_{B375}$ | $R^{D14}$ | $R^{D66}$ | H |
| $L_{B376}$ | $R^{D14}$ | $R^{D68}$ | H |
| $L_{B377}$ | $R^{D14}$ | $R^{D76}$ | H |
| $L_{B378}$ | $R^{D22}$ | $R^{D5}$ | H |
| $L_{B379}$ | $R^{D22}$ | $R^{D6}$ | H |
| $L_{B380}$ | $R^{D22}$ | $R^{D9}$ | H |
| $L_{B381}$ | $R^{D22}$ | $R^{D10}$ | H |
| $L_{B382}$ | $R^{D22}$ | $R^{D12}$ | H |
| $L_{B383}$ | $R^{D22}$ | $R^{D15}$ | H |
| $L_{B384}$ | $R^{D22}$ | $R^{D16}$ | H |
| $L_{B385}$ | $R^{D22}$ | $R^{D17}$ | H |
| $L_{B386}$ | $R^{D22}$ | $R^{D18}$ | H |
| $L_{B387}$ | $R^{D22}$ | $R^{D19}$ | H |
| $L_{B388}$ | $R^{D22}$ | $R^{D20}$ | H |
| $L_{B389}$ | $R^{D22}$ | $R^{D21}$ | H |
| $L_{B390}$ | $R^{D22}$ | $R^{D23}$ | H |
| $L_{B391}$ | $R^{D22}$ | $R^{D24}$ | H |
| $L_{B392}$ | $R^{D22}$ | $R^{D25}$ | H |
| $L_{B393}$ | $R^{D22}$ | $R^{D26}$ | H |
| $L_{B394}$ | $R^{D22}$ | $R^{D27}$ | H |
| $L_{B395}$ | $R^{D22}$ | $R^{D28}$ | H |
| $L_{B396}$ | $R^{D22}$ | $R^{D29}$ | H |
| $L_{B397}$ | $R^{D22}$ | $R^{D30}$ | H |
| $L_{B398}$ | $R^{D22}$ | $R^{D31}$ | H |
| $L_{B399}$ | $R^{D22}$ | $R^{D32}$ | H |
| $L_{B400}$ | $R^{D22}$ | $R^{D33}$ | H |
| $L_{B401}$ | $R^{D22}$ | $R^{D34}$ | H |
| $L_{B402}$ | $R^{D22}$ | $R^{D35}$ | H |
| $L_{B403}$ | $R^{D22}$ | $R^{D40}$ | H |
| $L_{B404}$ | $R^{D22}$ | $R^{D41}$ | H |
| $L_{B405}$ | $R^{D22}$ | $R^{D42}$ | H |
| $L_{B406}$ | $R^{D22}$ | $R^{D64}$ | H |
| $L_{B407}$ | $R^{D22}$ | $R^{D66}$ | H |
| $L_{B408}$ | $R^{D22}$ | $R^{D68}$ | H |
| $L_{B409}$ | $R^{D22}$ | $R^{D76}$ | H |
| $L_{B410}$ | $R^{D26}$ | $R^{D5}$ | H |
| $L_{B411}$ | $R^{D26}$ | $R^{D6}$ | H |
| $L_{B412}$ | $R^{D26}$ | $R^{D9}$ | H |
| $L_{B413}$ | $R^{D26}$ | $R^{D10}$ | H |
| $L_{B414}$ | $R^{D26}$ | $R^{D12}$ | H |
| $L_{B415}$ | $R^{D26}$ | $R^{D15}$ | H |
| $L_{B416}$ | $R^{D26}$ | $R^{D16}$ | H |
| $L_{B417}$ | $R^{D26}$ | $R^{D17}$ | H |
| $L_{B418}$ | $R^{D26}$ | $R^{D18}$ | H |
| $L_{B419}$ | $R^{D26}$ | $R^{D19}$ | H |
| $L_{B420}$ | $R^{D26}$ | $R^{D20}$ | H |
| $L_{B421}$ | $R^{D26}$ | $R^{D21}$ | H |

-continued

| $L_{Bj}$ | $R^1$ | $R^2$ | $R^3$ |
| --- | --- | --- | --- |
| $L_{B422}$ | $R^{D26}$ | $R^{D23}$ | H |
| $L_{B423}$ | $R^{D26}$ | $R^{D24}$ | H |
| $L_{B424}$ | $R^{D26}$ | $R^{D25}$ | H |
| $L_{B425}$ | $R^{D26}$ | $R^{D27}$ | H |
| $L_{B426}$ | $R^{D26}$ | $R^{D28}$ | H |
| $L_{B427}$ | $R^{D26}$ | $R^{D29}$ | H |
| $L_{B428}$ | $R^{D26}$ | $R^{D30}$ | H |
| $L_{B429}$ | $R^{D26}$ | $R^{D31}$ | H |
| $L_{B430}$ | $R^{D26}$ | $R^{D32}$ | H |
| $L_{B431}$ | $R^{D26}$ | $R^{D33}$ | H |
| $L_{B432}$ | $R^{D26}$ | $R^{D34}$ | H |
| $L_{B433}$ | $R^{D26}$ | $R^{D35}$ | H |
| $L_{B434}$ | $R^{D26}$ | $R^{D40}$ | H |
| $L_{B435}$ | $R^{D26}$ | $R^{D41}$ | H |
| $L_{B436}$ | $R^{D26}$ | $R^{D42}$ | H |
| $L_{B437}$ | $R^{D26}$ | $R^{D64}$ | H |
| $L_{B438}$ | $R^{D26}$ | $R^{D66}$ | H |
| $L_{B439}$ | $R^{D26}$ | $R^{D68}$ | H |
| $L_{B440}$ | $R^{D26}$ | $R^{D76}$ | H |
| $L_{B441}$ | $R^{D35}$ | $R^{D5}$ | H |
| $L_{B442}$ | $R^{D35}$ | $R^{D6}$ | H |
| $L_{B443}$ | $R^{D35}$ | $R^{D9}$ | H |
| $L_{B444}$ | $R^{D35}$ | $R^{D10}$ | H |
| $L_{B445}$ | $R^{D35}$ | $R^{D12}$ | H |
| $L_{B446}$ | $R^{D35}$ | $R^{D15}$ | H |
| $L_{B447}$ | $R^{D35}$ | $R^{D16}$ | H |
| $L_{B448}$ | $R^{D35}$ | $R^{D17}$ | H |
| $L_{B449}$ | $R^{D35}$ | $R^{D18}$ | H |
| $L_{B450}$ | $R^{D35}$ | $R^{R19}$ | H |
| $L_{B451}$ | $R^{D35}$ | $R^{D20}$ | H |
| $L_{B432}$ | $R^{D35}$ | $R^{D21}$ | H |
| $L_{B433}$ | $R^{D35}$ | $R^{D23}$ | H |
| $L_{B434}$ | $R^{D35}$ | $R^{D24}$ | H |
| $L_{B433}$ | $R^{D35}$ | $R^{D25}$ | H |
| $L_{B456}$ | $R^{D35}$ | $R^{D27}$ | H |
| $L_{B457}$ | $R^{D35}$ | $R^{D28}$ | H |
| $L_{B458}$ | $R^{D35}$ | $R^{D29}$ | H |
| $L_{B459}$ | $R^{D35}$ | $R^{D30}$ | H |
| $L_{B460}$ | $R^{D35}$ | $R^{D31}$ | H |
| $L_{B461}$ | $R^{D35}$ | $R^{D32}$ | H |
| $L_{B462}$ | $R^{D35}$ | $R^{D33}$ | H |
| $L_{B463}$ | $R^{D35}$ | $R^{D34}$ | H |
| $L_{B464}$ | $R^{D35}$ | $R^{D40}$ | H |
| $L_{B465}$ | $R^{D35}$ | $R^{D41}$ | H |
| $L_{B466}$ | $R^{D35}$ | $R^{D42}$ | H |
| $L_{B467}$ | $R^{D35}$ | $R^{D64}$ | H |
| $L_{B468}$ | $R^{D35}$ | $R^{D66}$ | H |
| $L_{B469}$ | $R^{D35}$ | $R^{D68}$ | H |
| $L_{B470}$ | $R^{D35}$ | $R^{D76}$ | H |
| $L_{B471}$ | $R^{D40}$ | $R^{D5}$ | H |
| $L_{B472}$ | $R^{D40}$ | $R^{D6}$ | H |
| $L_{B473}$ | $R^{D40}$ | $R^{D9}$ | H |
| $L_{B474}$ | $R^{D40}$ | $R^{D10}$ | H |
| $L_{B475}$ | $R^{D40}$ | $R^{D12}$ | H |
| $L_{B476}$ | $R^{D40}$ | $R^{D15}$ | H |
| $L_{B477}$ | $R^{D40}$ | $R^{D16}$ | H |
| $L_{B478}$ | $R^{D40}$ | $R^{D17}$ | H |
| $L_{B479}$ | $R^{D40}$ | $R^{D18}$ | H |
| $L_{B480}$ | $R^{D40}$ | $R^{D19}$ | H |
| $L_{B481}$ | $R^{D40}$ | $R^{D20}$ | H |
| $L_{B482}$ | $R^{D40}$ | $R^{D21}$ | H |
| $L_{B485}$ | $R^{D40}$ | $R^{D23}$ | H |
| $L_{B484}$ | $R^{D40}$ | $R^{D24}$ | H |
| $L_{B485}$ | $R^{D40}$ | $R^{D25}$ | H |
| $L_{B486}$ | $R^{D40}$ | $R^{D27}$ | H |
| $L_{B487}$ | $R^{D40}$ | $R^{D28}$ | H |
| $L_{B488}$ | $R^{D40}$ | $R^{D29}$ | H |
| $L_{B489}$ | $R^{D40}$ | $R^{D30}$ | H |
| $L_{B490}$ | $R^{D40}$ | $R^{D31}$ | H |
| $L_{B491}$ | $R^{D40}$ | $R^{D32}$ | H |
| $L_{B492}$ | $R^{D40}$ | $R^{D33}$ | H |
| $L_{B493}$ | $R^{D40}$ | $R^{D34}$ | H |
| $L_{B494}$ | $R^{D40}$ | $R^{D41}$ | H |
| $L_{B495}$ | $R^{D40}$ | $R^{D42}$ | H |
| $L_{B496}$ | $R^{D40}$ | $R^{D64}$ | H |
| $L_{B497}$ | $R^{D40}$ | $R^{D66}$ | H |
| $L_{B498}$ | $R^{D40}$ | $R^{D68}$ | H |

-continued

| $L_{Bj}$ | $R^1$ | $R^2$ | $R^3$ |
| --- | --- | --- | --- |
| $L_{B499}$ | $R^{D40}$ | $R^{D76}$ | H |
| $L_{B500}$ | $R^{D41}$ | $R^{D5}$ | H |
| $L_{B501}$ | $R^{D41}$ | $R^{D6}$ | H |
| $L_{B502}$ | $R^{D41}$ | $R^{D9}$ | H |
| $L_{B503}$ | $R^{D41}$ | $R^{D10}$ | H |
| $L_{B504}$ | $R^{D41}$ | $R^{D12}$ | H |
| $L_{B505}$ | $R^{D41}$ | $R^{D15}$ | H |
| $L_{B506}$ | $R^{D41}$ | $R^{D16}$ | H |
| $L_{B507}$ | $R^{D41}$ | $R^{D17}$ | H |
| $L_{B508}$ | $R^{D41}$ | $R^{D18}$ | H |
| $L_{B509}$ | $R^{D41}$ | $R^{D19}$ | H |
| $L_{B510}$ | $R^{D41}$ | $R^{D20}$ | H |
| $L_{B511}$ | $R^{D41}$ | $R^{D21}$ | H |
| $L_{B512}$ | $R^{D41}$ | $R^{D23}$ | H |
| $L_{B513}$ | $R^{D41}$ | $R^{D24}$ | H |
| $L_{B514}$ | $R^{D41}$ | $R^{D25}$ | H |
| $L_{B515}$ | $R^{D41}$ | $R^{D27}$ | H |
| $L_{B516}$ | $R^{D41}$ | $R^{D28}$ | H |
| $L_{B517}$ | $R^{D41}$ | $R^{D29}$ | H |
| $L_{B518}$ | $R^{D41}$ | $R^{D30}$ | H |
| $L_{B519}$ | $R^{D41}$ | $R^{D31}$ | H |
| $L_{B520}$ | $R^{D41}$ | $R^{D32}$ | H |
| $L_{B521}$ | $R^{D41}$ | $R^{D33}$ | H |
| $L_{B522}$ | $R^{D41}$ | $R^{D34}$ | H |
| $L_{B523}$ | $R^{D41}$ | $R^{D42}$ | H |
| $L_{B524}$ | $R^{D41}$ | $R^{D64}$ | H |
| $L_{B525}$ | $R^{D41}$ | $R^{D66}$ | H |
| $L_{B526}$ | $R^{D41}$ | $R^{D68}$ | H |
| $L_{B527}$ | $R^{D41}$ | $R^{D76}$ | H |
| $L_{B528}$ | $R^{D64}$ | $R^{D5}$ | H |
| $L_{B529}$ | $R^{D64}$ | $R^{D6}$ | H |
| $L_{B530}$ | $R^{D64}$ | $R^{D9}$ | H |
| $L_{B531}$ | $R^{D64}$ | $R^{D10}$ | H |
| $L_{B532}$ | $R^{D64}$ | $R^{D12}$ | H |
| $L_{B533}$ | $R^{D64}$ | $R^{D15}$ | H |
| $L_{B534}$ | $R^{D64}$ | $R^{D16}$ | H |
| $L_{B535}$ | $R^{D64}$ | $R^{D17}$ | H |
| $L_{B536}$ | $R^{D64}$ | $R^{D18}$ | H |
| $L_{B537}$ | $R^{D64}$ | $R^{D19}$ | H |
| $L_{B538}$ | $R^{D64}$ | $R^{D20}$ | H |
| $L_{B539}$ | $R^{D64}$ | $R^{D21}$ | H |
| $L_{B540}$ | $R^{D64}$ | $R^{D23}$ | H |
| $L_{B541}$ | $R^{D64}$ | $R^{D24}$ | H |
| $L_{B542}$ | $R^{D64}$ | $R^{D25}$ | H |
| $L_{B543}$ | $R^{D64}$ | $R^{D27}$ | H |
| $L_{B544}$ | $R^{D64}$ | $R^{D28}$ | H |
| $L_{B545}$ | $R^{D64}$ | $R^{D29}$ | H |
| $L_{B546}$ | $R^{D64}$ | $R^{D30}$ | H |
| $L_{B547}$ | $R^{D64}$ | $R^{D31}$ | H |
| $L_{B548}$ | $R^{D64}$ | $R^{D32}$ | H |
| $L_{B549}$ | $R^{D64}$ | $R^{D33}$ | H |
| $L_{B550}$ | $R^{D64}$ | $R^{D34}$ | H |
| $L_{B551}$ | $R^{D64}$ | $R^{D42}$ | H |
| $L_{B552}$ | $R^{D64}$ | $R^{D64}$ | H |
| $L_{B553}$ | $R^{D64}$ | $R^{D66}$ | H |
| $L_{B554}$ | $R^{D64}$ | $R^{D68}$ | H |
| $L_{B555}$ | $R^{D64}$ | $R^{D76}$ | H |
| $L_{B556}$ | $R^{D66}$ | $R^{D5}$ | H |
| $L_{B557}$ | $R^{D66}$ | $R^{D6}$ | H |
| $L_{B558}$ | $R^{D66}$ | $R^{D9}$ | H |
| $L_{B559}$ | $R^{D66}$ | $R^{D10}$ | H |
| $L_{B560}$ | $R^{D66}$ | $R^{D12}$ | H |
| $L_{B561}$ | $R^{D66}$ | $R^{D15}$ | H |
| $L_{B562}$ | $R^{D66}$ | $R^{D16}$ | H |
| $L_{B563}$ | $R^{D66}$ | $R^{D17}$ | H |
| $L_{B564}$ | $R^{D66}$ | $R^{D18}$ | H |
| $L_{B565}$ | $R^{D66}$ | $R^{D19}$ | H |
| $L_{B566}$ | $R^{D66}$ | $R^{D20}$ | H |
| $L_{B567}$ | $R^{D66}$ | $R^{D21}$ | H |
| $L_{B568}$ | $R^{D66}$ | $R^{D23}$ | H |
| $L_{B569}$ | $R^{D66}$ | $R^{D24}$ | H |
| $L_{B570}$ | $R^{D66}$ | $R^{D25}$ | H |
| $L_{B571}$ | $R^{D66}$ | $R^{D27}$ | H |
| $L_{B572}$ | $R^{D66}$ | $R^{D28}$ | H |
| $L_{B573}$ | $R^{D66}$ | $R^{D29}$ | H |
| $L_{B574}$ | $R^{D66}$ | $R^{D30}$ | H |
| $L_{B575}$ | $R^{D66}$ | $R^{D31}$ | H |

| $L_{Bj}$ | $R^1$ | $R^2$ | $R^3$ |
|---|---|---|---|
| $L_{B576}$ | $R^{D66}$ | $R^{D32}$ | H |
| $L_{B577}$ | $R^{D66}$ | $R^{D33}$ | H |
| $L_{B578}$ | $R^{D66}$ | $R^{D34}$ | H |
| $L_{B579}$ | $R^{D66}$ | $R^{D42}$ | H |
| $L_{B580}$ | $R^{D66}$ | $R^{D68}$ | H |
| $L_{B581}$ | $R^{D66}$ | $R^{D76}$ | H |
| $L_{B582}$ | $R^{D68}$ | $R^{D5}$ | H |
| $L_{B583}$ | $R^{D68}$ | $R^{D6}$ | H |
| $L_{B584}$ | $R^{D68}$ | $R^{D9}$ | H |
| $L_{B585}$ | $R^{D68}$ | $R^{D10}$ | H |
| $L_{B586}$ | $R^{D68}$ | $R^{D12}$ | H |
| $L_{B587}$ | $R^{D68}$ | $R^{D15}$ | H |
| $L_{B588}$ | $R^{D68}$ | $R^{D16}$ | H |
| $L_{B589}$ | $R^{D68}$ | $R^{D17}$ | H |
| $L_{B590}$ | $R^{D68}$ | $R^{D18}$ | H |
| $L_{B591}$ | $R^{D68}$ | $R^{D19}$ | H |
| $L_{B592}$ | $R^{D68}$ | $R^{D20}$ | H |
| $L_{B593}$ | $R^{D68}$ | $R^{D21}$ | H |
| $L_{B594}$ | $R^{D68}$ | $R^{D23}$ | H |
| $L_{B595}$ | $R^{D68}$ | $R^{D24}$ | H |
| $L_{B596}$ | $R^{D68}$ | $R^{D25}$ | H |
| $L_{B597}$ | $R^{D68}$ | $R^{D27}$ | H |
| $L_{B598}$ | $R^{D68}$ | $R^{D28}$ | H |
| $L_{B599}$ | $R^{D68}$ | $R^{D29}$ | H |
| $L_{B600}$ | $R^{D68}$ | $R^{D30}$ | H |
| $L_{B601}$ | $R^{D68}$ | $R^{D31}$ | H |
| $L_{B602}$ | $R^{D68}$ | $R^{D32}$ | H |
| $L_{B603}$ | $R^{D68}$ | $R^{D33}$ | H |
| $L_{B604}$ | $R^{D68}$ | $R^{D34}$ | H |
| $L_{B605}$ | $R^{D68}$ | $R^{D42}$ | H |
| $L_{B606}$ | $R^{D68}$ | $R^{D76}$ | H |
| $L_{B607}$ | $R^{D76}$ | $R^{D5}$ | H |
| $L_{B608}$ | $R^{D76}$ | $R^{D6}$ | H |
| $L_{B609}$ | $R^{D76}$ | $R^{D9}$ | H |
| $L_{B610}$ | $R^{D76}$ | $R^{D10}$ | H |
| $L_{B611}$ | $R^{D76}$ | $R^{D12}$ | H |
| $L_{B612}$ | $R^{D76}$ | $R^{D15}$ | H |
| $L_{B613}$ | $R^{D76}$ | $R^{D16}$ | H |
| $L_{B614}$ | $R^{D76}$ | $R^{D17}$ | H |
| $L_{B615}$ | $R^{D76}$ | $R^{D18}$ | H |
| $L_{B616}$ | $R^{D76}$ | $R^{D19}$ | H |
| $L_{B617}$ | $R^{D76}$ | $R^{D20}$ | H |
| $L_{B618}$ | $R^{D76}$ | $R^{D21}$ | H |
| $L_{B619}$ | $R^{D76}$ | $R^{D23}$ | H |
| $L_{B620}$ | $R^{D76}$ | $R^{D24}$ | H |
| $L_{B621}$ | $R^{D76}$ | $R^{D25}$ | H |
| $L_{B622}$ | $R^{D76}$ | $R^{D27}$ | H |
| $L_{B623}$ | $R^{D76}$ | $R^{D28}$ | H |
| $L_{B624}$ | $R^{D76}$ | $R^{D29}$ | H |
| $L_{B625}$ | $R^{D76}$ | $R^{D30}$ | H |
| $L_{B626}$ | $R^{D76}$ | $R^{D31}$ | H |
| $L_{B627}$ | $R^{D76}$ | $R^{D32}$ | H |
| $L_{B628}$ | $R^{D76}$ | $R^{D33}$ | H |
| $L_{B629}$ | $R^{D76}$ | $R^{D34}$ | H |
| $L_{B630}$ | $R^{D76}$ | $R^{D42}$ | H |
| $L_{B631}$ | $R^{D1}$ | $R^{D1}$ | $R^{D1}$ |
| $L_{B632}$ | $R^{D2}$ | $R^{D2}$ | $R^{D1}$ |
| $L_{B633}$ | $R^{D3}$ | $R^{D3}$ | $R^{D1}$ |
| $L_{B634}$ | $R^{D4}$ | $R^{D4}$ | $R^{D1}$ |
| $L_{B635}$ | $R^{D5}$ | $R^{D5}$ | $R^{D1}$ |
| $L_{B636}$ | $R^{D6}$ | $R^{D6}$ | $R^{D1}$ |
| $L_{B637}$ | $R^{D7}$ | $R^{D7}$ | $R^{D1}$ |
| $L_{B638}$ | $R^{D8}$ | $R^{D8}$ | $R^{D1}$ |
| $L_{B639}$ | $R^{D9}$ | $R^{D9}$ | $R^{D1}$ |
| $L_{B640}$ | $R^{D10}$ | $R^{D10}$ | $R^{D1}$ |
| $L_{B641}$ | $R^{D11}$ | $R^{D11}$ | $R^{D1}$ |
| $L_{B642}$ | $R^{D12}$ | $R^{D12}$ | $R^{D1}$ |
| $L_{B643}$ | $R^{D13}$ | $R^{D13}$ | $R^{D1}$ |
| $L_{B644}$ | $R^{D14}$ | $R^{D14}$ | $R^{D1}$ |
| $L_{B645}$ | $R^{D15}$ | $R^{D15}$ | $R^{D1}$ |
| $L_{B646}$ | $R^{D16}$ | $R^{D16}$ | $R^{D1}$ |
| $L_{B647}$ | $R^{D17}$ | $R^{D17}$ | $R^{D1}$ |
| $L_{B648}$ | $R^{D18}$ | $R^{D18}$ | $R^{D1}$ |
| $L_{B649}$ | $R^{D19}$ | $R^{D19}$ | $R^{D1}$ |
| $L_{B650}$ | $R^{D20}$ | $R^{D20}$ | $R^{D1}$ |
| $L_{B651}$ | $R^{D21}$ | $R^{D21}$ | $R^{D1}$ |
| $L_{B652}$ | $R^{D22}$ | $R^{D22}$ | $R^{D1}$ |

| $L_{Bj}$ | $R^1$ | $R^2$ | $R^3$ |
|---|---|---|---|
| $L_{B653}$ | $R^{D23}$ | $R^{D23}$ | $R^{D1}$ |
| $L_{B654}$ | $R^{D24}$ | $R^{D24}$ | $R^{D1}$ |
| $L_{B655}$ | $R^{D25}$ | $R^{D25}$ | $R^{D1}$ |
| $L_{B656}$ | $R^{D26}$ | $R^{D26}$ | $R^{D1}$ |
| $L_{B657}$ | $R^{D27}$ | $R^{D27}$ | $R^{D1}$ |
| $L_{B658}$ | $R^{D28}$ | $R^{D28}$ | $R^{D1}$ |
| $L_{B659}$ | $R^{D29}$ | $R^{D29}$ | $R^{D1}$ |
| $L_{B660}$ | $R^{D30}$ | $R^{D30}$ | $R^{D1}$ |
| $L_{B661}$ | $R^{D31}$ | $R^{D31}$ | $R^{D1}$ |
| $L_{B662}$ | $R^{D32}$ | $R^{D32}$ | $R^{D1}$ |
| $L_{B663}$ | $R^{D33}$ | $R^{D33}$ | $R^{D1}$ |
| $L_{B664}$ | $R^{D34}$ | $R^{D34}$ | $R^{D1}$ |
| $L_{B665}$ | $R^{D35}$ | $R^{D35}$ | $R^{D1}$ |
| $L_{B666}$ | $R^{D40}$ | $R^{D40}$ | $R^{D1}$ |
| $L_{B667}$ | $R^{D41}$ | $R^{D41}$ | $R^{D1}$ |
| $L_{B668}$ | $R^{D42}$ | $R^{D42}$ | $R^{D1}$ |
| $L_{B669}$ | $R^{D64}$ | $R^{D64}$ | $R^{D1}$ |
| $L_{B670}$ | $R^{D66}$ | $R^{D66}$ | $R^{D1}$ |
| $L_{B671}$ | $R^{D68}$ | $R^{D68}$ | $R^{D1}$ |
| $L_{B672}$ | $R^{D76}$ | $R^{D76}$ | $R^{D1}$ |
| $L_{B673}$ | $R^{D1}$ | $R^{D2}$ | $R^{D1}$ |
| $L_{B674}$ | $R^{D1}$ | $R^{D3}$ | $R^{D1}$ |
| $L_{B675}$ | $R^{D1}$ | $R^{D4}$ | $R^{D1}$ |
| $L_{B676}$ | $R^{D1}$ | $R^{D5}$ | $R^{D1}$ |
| $L_{B677}$ | $R^{D1}$ | $R^{D6}$ | $R^{D1}$ |
| $L_{B678}$ | $R^{D1}$ | $R^{D7}$ | $R^{D1}$ |
| $L_{B679}$ | $R^{D1}$ | $R^{D8}$ | $R^{D1}$ |
| $L_{B680}$ | $R^{D1}$ | $R^{D9}$ | $R^{D1}$ |
| $L_{B681}$ | $R^{D1}$ | $R^{D10}$ | $R^{D1}$ |
| $L_{B682}$ | $R^{D1}$ | $R^{D11}$ | $R^{D1}$ |
| $L_{B683}$ | $R^{D1}$ | $R^{D12}$ | $R^{D1}$ |
| $L_{B684}$ | $R^{D1}$ | $R^{D13}$ | $R^{D1}$ |
| $L_{B685}$ | $R^{D1}$ | $R^{D14}$ | $R^{D1}$ |
| $L_{B686}$ | $R^{D1}$ | $R^{D15}$ | $R^{D1}$ |
| $L_{B687}$ | $R^{D1}$ | $R^{D16}$ | $R^{D1}$ |
| $L_{B688}$ | $R^{D1}$ | $R^{D17}$ | $R^{D1}$ |
| $L_{B689}$ | $R^{D1}$ | $R^{D18}$ | $R^{D1}$ |
| $L_{B690}$ | $R^{D1}$ | $R^{D19}$ | $R^{D1}$ |
| $L_{B691}$ | $R^{D1}$ | $R^{D20}$ | $R^{D1}$ |
| $L_{B692}$ | $R^{D1}$ | $R^{D21}$ | $R^{D1}$ |
| $L_{B693}$ | $R^{D1}$ | $R^{D22}$ | $R^{D1}$ |
| $L_{B694}$ | $R^{D1}$ | $R^{D23}$ | $R^{D1}$ |
| $L_{B695}$ | $R^{D1}$ | $R^{D24}$ | $R^{D1}$ |
| $L_{B696}$ | $R^{D1}$ | $R^{D25}$ | $R^{D1}$ |
| $L_{B697}$ | $R^{D1}$ | $R^{D26}$ | $R^{D1}$ |
| $L_{B698}$ | $R^{D1}$ | $R^{D27}$ | $R^{D1}$ |
| $L_{B699}$ | $R^{D1}$ | $R^{D28}$ | $R^{D1}$ |
| $L_{B700}$ | $R^{D1}$ | $R^{D29}$ | $R^{D1}$ |
| $L_{B701}$ | $R^{D1}$ | $R^{D30}$ | $R^{D1}$ |
| $L_{B702}$ | $R^{D1}$ | $R^{D31}$ | $R^{D1}$ |
| $L_{B703}$ | $R^{D1}$ | $R^{D32}$ | $R^{D1}$ |
| $L_{B704}$ | $R^{D1}$ | $R^{D33}$ | $R^{D1}$ |
| $L_{B705}$ | $R^{D1}$ | $R^{D34}$ | $R^{D1}$ |
| $L_{B706}$ | $R^{D1}$ | $R^{D35}$ | $R^{D1}$ |
| $L_{B707}$ | $R^{D1}$ | $R^{D40}$ | $R^{D1}$ |
| $L_{B708}$ | $R^{D1}$ | $R^{D41}$ | $R^{D1}$ |
| $L_{B709}$ | $R^{D1}$ | $R^{D42}$ | $R^{D1}$ |
| $L_{B710}$ | $R^{D1}$ | $R^{D64}$ | $R^{D1}$ |
| $L_{B711}$ | $R^{D1}$ | $R^{D66}$ | $R^{D1}$ |
| $L_{B712}$ | $R^{D1}$ | $R^{D68}$ | $R^{D1}$ |
| $L_{B713}$ | $R^{D1}$ | $R^{D76}$ | $R^{D1}$ |
| $L_{B714}$ | $R^{D2}$ | $R^{D1}$ | $R^{D1}$ |
| $L_{B715}$ | $R^{D2}$ | $R^{D3}$ | $R^{D1}$ |
| $L_{B716}$ | $R^{D2}$ | $R^{D4}$ | $R^{D1}$ |
| $L_{B717}$ | $R^{D2}$ | $R^{D5}$ | $R^{D1}$ |
| $L_{B718}$ | $R^{D2}$ | $R^{D6}$ | $R^{D1}$ |
| $L_{B719}$ | $R^{D2}$ | $R^{D7}$ | $R^{D1}$ |
| $L_{B720}$ | $R^{D2}$ | $R^{D8}$ | $R^{D1}$ |
| $L_{B721}$ | $R^{D2}$ | $R^{D9}$ | $R^{D1}$ |
| $L_{B722}$ | $R^{D2}$ | $R^{D10}$ | $R^{D1}$ |
| $L_{B723}$ | $R^{D2}$ | $R^{D11}$ | $R^{D1}$ |
| $L_{B724}$ | $R^{D2}$ | $R^{D12}$ | $R^{D1}$ |
| $L_{B725}$ | $R^{D2}$ | $R^{D13}$ | $R^{D1}$ |
| $L_{B726}$ | $R^{D2}$ | $R^{D14}$ | $R^{D1}$ |
| $L_{B727}$ | $R^{D2}$ | $R^{D15}$ | $R^{D1}$ |
| $L_{B728}$ | $R^{D2}$ | $R^{D16}$ | $R^{D1}$ |
| $L_{B729}$ | $R^{D2}$ | $R^{D17}$ | $R^{D1}$ |

-continued

| $L_{Bj}$ | $R^1$ | $R^2$ | $R^3$ |
|---|---|---|---|
| $L_{B730}$ | $R^{D2}$ | $R^{D18}$ | $R^{D1}$ |
| $L_{B731}$ | $R^{D2}$ | $R^{D19}$ | $R^{D1}$ |
| $L_{B732}$ | $R^{D2}$ | $R^{D20}$ | $R^{D1}$ |
| $L_{B733}$ | $R^{D2}$ | $R^{D21}$ | $R^{D1}$ |
| $L_{B734}$ | $R^{D2}$ | $R^{D22}$ | $R^{D1}$ |
| $L_{B735}$ | $R^{D2}$ | $R^{D23}$ | $R^{D1}$ |
| $L_{B736}$ | $R^{D2}$ | $R^{D24}$ | $R^{D1}$ |
| $L_{B737}$ | $R^{D2}$ | $R^{D25}$ | $R^{D1}$ |
| $L_{B738}$ | $R^{D2}$ | $R^{D26}$ | $R^{D1}$ |
| $L_{B739}$ | $R^{D2}$ | $R^{D27}$ | $R^{D1}$ |
| $L_{B740}$ | $R^{D2}$ | $R^{D28}$ | $R^{D1}$ |
| $L_{B741}$ | $R^{D2}$ | $R^{D29}$ | $R^{D1}$ |
| $L_{B742}$ | $R^{D2}$ | $R^{D30}$ | $R^{D1}$ |
| $L_{B743}$ | $R^{D2}$ | $R^{D31}$ | $R^{D1}$ |
| $L_{B744}$ | $R^{D2}$ | $R^{D32}$ | $R^{D1}$ |
| $L_{B745}$ | $R^{D2}$ | $R^{D33}$ | $R^{D1}$ |
| $L_{B746}$ | $R^{D2}$ | $R^{D34}$ | $R^{D1}$ |
| $L_{B747}$ | $R^{D2}$ | $R^{D35}$ | $R^{D1}$ |
| $L_{B748}$ | $R^{D2}$ | $R^{D40}$ | $R^{D1}$ |
| $L_{B749}$ | $R^{D2}$ | $R^{D41}$ | $R^{D1}$ |
| $L_{B750}$ | $R^{D2}$ | $R^{D42}$ | $R^{D1}$ |
| $L_{B751}$ | $R^{D2}$ | $R^{D64}$ | $R^{D1}$ |
| $L_{B752}$ | $R^{D2}$ | $R^{D66}$ | $R^{D1}$ |
| $L_{B753}$ | $R^{D2}$ | $R^{D68}$ | $R^{D1}$ |
| $L_{B754}$ | $R^{D2}$ | $R^{D76}$ | $R^{D1}$ |
| $L_{B755}$ | $R^{D3}$ | $R^{D4}$ | $R^{D1}$ |
| $L_{B756}$ | $R^{D3}$ | $R^{D5}$ | $R^{D1}$ |
| $L_{B757}$ | $R^{D3}$ | $R^{D6}$ | $R^{D1}$ |
| $L_{B758}$ | $R^{D3}$ | $R^{D7}$ | $R^{D1}$ |
| $L_{B759}$ | $R^{D3}$ | $R^{D8}$ | $R^{D1}$ |
| $L_{B760}$ | $R^{D3}$ | $R^{D9}$ | $R^{D1}$ |
| $L_{B761}$ | $R^{D3}$ | $R^{D10}$ | $R^{D1}$ |
| $L_{B762}$ | $R^{D3}$ | $R^{D11}$ | $R^{D1}$ |
| $L_{B763}$ | $R^{D3}$ | $R^{D12}$ | $R^{D1}$ |
| $L_{B764}$ | $R^{D3}$ | $R^{D13}$ | $R^{D1}$ |
| $L_{B765}$ | $R^{D3}$ | $R^{D14}$ | $R^{D1}$ |
| $L_{B766}$ | $R^{D3}$ | $R^{D15}$ | $R^{D1}$ |
| $L_{B767}$ | $R^{D3}$ | $R^{D16}$ | $R^{D1}$ |
| $L_{B768}$ | $R^{D3}$ | $R^{D17}$ | $R^{D1}$ |
| $L_{B769}$ | $R^{D3}$ | $R^{D18}$ | $R^{D1}$ |
| $L_{B770}$ | $R^{D3}$ | $R^{D19}$ | $R^{D1}$ |
| $L_{B771}$ | $R^{D3}$ | $R^{D20}$ | $R^{D1}$ |
| $L_{B772}$ | $R^{D3}$ | $R^{D21}$ | $R^{D1}$ |
| $L_{B773}$ | $R^{D3}$ | $R^{D22}$ | $R^{D1}$ |
| $L_{B774}$ | $R^{D3}$ | $R^{D23}$ | $R^{D1}$ |
| $L_{B775}$ | $R^{D3}$ | $R^{D24}$ | $R^{D1}$ |
| $L_{B776}$ | $R^{D3}$ | $R^{D25}$ | $R^{D1}$ |
| $L_{B777}$ | $R^{D3}$ | $R^{D26}$ | $R^{D1}$ |
| $L_{B778}$ | $R^{D3}$ | $R^{D27}$ | $R^{D1}$ |
| $L_{B779}$ | $R^{D3}$ | $R^{D28}$ | $R^{D1}$ |
| $L_{B780}$ | $R^{D3}$ | $R^{D29}$ | $R^{D1}$ |
| $L_{B781}$ | $R^{D3}$ | $R^{D30}$ | $R^{D1}$ |
| $L_{B782}$ | $R^{D3}$ | $R^{D31}$ | $R^{D1}$ |
| $L_{B783}$ | $R^{D3}$ | $R^{D32}$ | $R^{D1}$ |
| $L_{B784}$ | $R^{D3}$ | $R^{D33}$ | $R^{D1}$ |
| $L_{B785}$ | $R^{D3}$ | $R^{D34}$ | $R^{D1}$ |
| $L_{B786}$ | $R^{D3}$ | $R^{D35}$ | $R^{D1}$ |
| $L_{B787}$ | $R^{D3}$ | $R^{D40}$ | $R^{D1}$ |
| $L_{B788}$ | $R^{D3}$ | $R^{D41}$ | $R^{D1}$ |
| $L_{B789}$ | $R^{D3}$ | $R^{D42}$ | $R^{D1}$ |
| $L_{B790}$ | $R^{D3}$ | $R^{D64}$ | $R^{D1}$ |
| $L_{B791}$ | $R^{D3}$ | $R^{D66}$ | $R^{D1}$ |
| $L_{B792}$ | $R^{D3}$ | $R^{D68}$ | $R^{D1}$ |
| $L_{B793}$ | $R^{D3}$ | $R^{D76}$ | $R^{D1}$ |
| $L_{B794}$ | $R^{D4}$ | $R^{D5}$ | $R^{D1}$ |
| $L_{B795}$ | $R^{D4}$ | $R^{D6}$ | $R^{D1}$ |
| $L_{B796}$ | $R^{D4}$ | $R^{D7}$ | $R^{D1}$ |
| $L_{B797}$ | $R^{D4}$ | $R^{D8}$ | $R^{D1}$ |
| $L_{B798}$ | $R^{D4}$ | $R^{D9}$ | $R^{D1}$ |
| $L_{B799}$ | $R^{D4}$ | $R^{D10}$ | $R^{D1}$ |
| $L_{B800}$ | $R^{D4}$ | $R^{D11}$ | $R^{D1}$ |
| $L_{B801}$ | $R^{D4}$ | $R^{D12}$ | $R^{D1}$ |
| $L_{B802}$ | $R^{D4}$ | $R^{D13}$ | $R^{D1}$ |
| $L_{B803}$ | $R^{D4}$ | $R^{D14}$ | $R^{D1}$ |
| $L_{B804}$ | $R^{D4}$ | $R^{D15}$ | $R^{D1}$ |
| $L_{B805}$ | $R^{D4}$ | $R^{D16}$ | $R^{D1}$ |
| $L_{B806}$ | $R^{D4}$ | $R^{D17}$ | $R^{D1}$ |

-continued

| $L_{Bj}$ | $R^1$ | $R^2$ | $R^3$ |
|---|---|---|---|
| $L_{B807}$ | $R^{D4}$ | $R^{D18}$ | $R^{D1}$ |
| $L_{B808}$ | $R^{D4}$ | $R^{D19}$ | $R^{D1}$ |
| $L_{B809}$ | $R^{D4}$ | $R^{D20}$ | $R^{D1}$ |
| $L_{B810}$ | $R^{D4}$ | $R^{D21}$ | $R^{D1}$ |
| $L_{B811}$ | $R^{D4}$ | $R^{D22}$ | $R^{D1}$ |
| $L_{B812}$ | $R^{D4}$ | $R^{D23}$ | $R^{D1}$ |
| $L_{B813}$ | $R^{D4}$ | $R^{D24}$ | $R^{D1}$ |
| $L_{B814}$ | $R^{D4}$ | $R^{D25}$ | $R^{D1}$ |
| $L_{B815}$ | $R^{D4}$ | $R^{D26}$ | $R^{D1}$ |
| $L_{B816}$ | $R^{D4}$ | $R^{D27}$ | $R^{D1}$ |
| $L_{B817}$ | $R^{D4}$ | $R^{D28}$ | $R^{D1}$ |
| $L_{B818}$ | $R^{D4}$ | $R^{D29}$ | $R^{D1}$ |
| $L_{B819}$ | $R^{D4}$ | $R^{D30}$ | $R^{D1}$ |
| $L_{B820}$ | $R^{D4}$ | $R^{D31}$ | $R^{D1}$ |
| $L_{B821}$ | $R^{D4}$ | $R^{D32}$ | $R^{D1}$ |
| $L_{B822}$ | $R^{D4}$ | $R^{D33}$ | $R^{D1}$ |
| $L_{B823}$ | $R^{D4}$ | $R^{D34}$ | $R^{D1}$ |
| $L_{B824}$ | $R^{D4}$ | $R^{D35}$ | $R^{D1}$ |
| $L_{B825}$ | $R^{D4}$ | $R^{D40}$ | $R^{D1}$ |
| $L_{B826}$ | $R^{D4}$ | $R^{D41}$ | $R^{D1}$ |
| $L_{B827}$ | $R^{D4}$ | $R^{D42}$ | $R^{D1}$ |
| $L_{B828}$ | $R^{D4}$ | $R^{D64}$ | $R^{D1}$ |
| $L_{B829}$ | $R^{D4}$ | $R^{D66}$ | $R^{D1}$ |
| $L_{B830}$ | $R^{D4}$ | $R^{D68}$ | $R^{D1}$ |
| $L_{B831}$ | $R^{D4}$ | $R^{D76}$ | $R^{D1}$ |
| $L_{B832}$ | $R^{D4}$ | $R^{D1}$ | $R^{D1}$ |
| $L_{B833}$ | $R^{D7}$ | $R^{D5}$ | $R^{D1}$ |
| $L_{B834}$ | $R^{D7}$ | $R^{D6}$ | $R^{D1}$ |
| $L_{B835}$ | $R^{D7}$ | $R^{D8}$ | $R^{D1}$ |
| $L_{B836}$ | $R^{D7}$ | $R^{D9}$ | $R^{D1}$ |
| $L_{B837}$ | $R^{D7}$ | $R^{D10}$ | $R^{D1}$ |
| $L_{B838}$ | $R^{D7}$ | $R^{D11}$ | $R^{D1}$ |
| $L_{B839}$ | $R^{D7}$ | $R^{D12}$ | $R^{D1}$ |
| $L_{B840}$ | $R^{D7}$ | $R^{D13}$ | $R^{D1}$ |
| $L_{B841}$ | $R^{D7}$ | $R^{D14}$ | $R^{D1}$ |
| $L_{B842}$ | $R^{D7}$ | $R^{D15}$ | $R^{D1}$ |
| $L_{B843}$ | $R^{D7}$ | $R^{D16}$ | $R^{D1}$ |
| $L_{B844}$ | $R^{D7}$ | $R^{D17}$ | $R^{D1}$ |
| $L_{B845}$ | $R^{D7}$ | $R^{D18}$ | $R^{D1}$ |
| $L_{B846}$ | $R^{D7}$ | $R^{D19}$ | $R^{D1}$ |
| $L_{B847}$ | $R^{D7}$ | $R^{D20}$ | $R^{D1}$ |
| $L_{B848}$ | $R^{D7}$ | $R^{D21}$ | $R^{D1}$ |
| $L_{B849}$ | $R^{D7}$ | $R^{D22}$ | $R^{D1}$ |
| $L_{B850}$ | $R^{D7}$ | $R^{D23}$ | $R^{D1}$ |
| $L_{B851}$ | $R^{D7}$ | $R^{D24}$ | $R^{D1}$ |
| $L_{B852}$ | $R^{D7}$ | $R^{D25}$ | $R^{D1}$ |
| $L_{B853}$ | $R^{D7}$ | $R^{D26}$ | $R^{D1}$ |
| $L_{B854}$ | $R^{D7}$ | $R^{D27}$ | $R^{D1}$ |
| $L_{B855}$ | $R^{D7}$ | $R^{D28}$ | $R^{D1}$ |
| $L_{B856}$ | $R^{D7}$ | $R^{D29}$ | $R^{D1}$ |
| $L_{B857}$ | $R^{D7}$ | $R^{D30}$ | $R^{D1}$ |
| $L_{B858}$ | $R^{D7}$ | $R^{D31}$ | $R^{D1}$ |
| $L_{B859}$ | $R^{D7}$ | $R^{D32}$ | $R^{D1}$ |
| $L_{B860}$ | $R^{D7}$ | $R^{D33}$ | $R^{D1}$ |
| $L_{B861}$ | $R^{D7}$ | $R^{D34}$ | $R^{D1}$ |
| $L_{B862}$ | $R^{D7}$ | $R^{D35}$ | $R^{D1}$ |
| $L_{B863}$ | $R^{D7}$ | $R^{D40}$ | $R^{D1}$ |
| $L_{B864}$ | $R^{D7}$ | $R^{D41}$ | $R^{D1}$ |
| $L_{B865}$ | $R^{D7}$ | $R^{D42}$ | $R^{D1}$ |
| $L_{B866}$ | $R^{D7}$ | $R^{D64}$ | $R^{D1}$ |
| $L_{B867}$ | $R^{D7}$ | $R^{D66}$ | $R^{D1}$ |
| $L_{B868}$ | $R^{D7}$ | $R^{D68}$ | $R^{D1}$ |
| $L_{B869}$ | $R^{D7}$ | $R^{D76}$ | $R^{D1}$ |
| $L_{B870}$ | $R^{D8}$ | $R^{D5}$ | $R^{D1}$ |
| $L_{B871}$ | $R^{D8}$ | $R^{D6}$ | $R^{D1}$ |
| $L_{B872}$ | $R^{D8}$ | $R^{D9}$ | $R^{D1}$ |
| $L_{B873}$ | $R^{D8}$ | $R^{D10}$ | $R^{D1}$ |
| $L_{B874}$ | $R^{D8}$ | $R^{D11}$ | $R^{D1}$ |
| $L_{B875}$ | $R^{D8}$ | $R^{D12}$ | $R^{D1}$ |
| $L_{B876}$ | $R^{D8}$ | $R^{D13}$ | $R^{D1}$ |
| $L_{B877}$ | $R^{D8}$ | $R^{D14}$ | $R^{D1}$ |
| $L_{B878}$ | $R^{D8}$ | $R^{D15}$ | $R^{D1}$ |
| $L_{B879}$ | $R^{D8}$ | $R^{D16}$ | $R^{D1}$ |
| $L_{B880}$ | $R^{D8}$ | $R^{D17}$ | $R^{D1}$ |
| $L_{B881}$ | $R^{D8}$ | $R^{D18}$ | $R^{D1}$ |
| $L_{B882}$ | $R^{D8}$ | $R^{D19}$ | $R^{D1}$ |
| $L_{B883}$ | $R^{D8}$ | $R^{D20}$ | $R^{D1}$ |

-continued

| $L_{Bj}$ | $R^1$ | $R^2$ | $R^3$ |
|---|---|---|---|
| $L_{B884}$ | $R^{D8}$ | $R^{D21}$ | $R^{D1}$ |
| $L_{B885}$ | $R^{D8}$ | $R^{D22}$ | $R^{D1}$ |
| $L_{B886}$ | $R^{D8}$ | $R^{D23}$ | $R^{D1}$ |
| $L_{B887}$ | $R^{D8}$ | $R^{D24}$ | $R^{D1}$ |
| $L_{B888}$ | $R^{D8}$ | $R^{D25}$ | $R^{D1}$ |
| $L_{B889}$ | $R^{D8}$ | $R^{D26}$ | $R^{D1}$ |
| $L_{B890}$ | $R^{D8}$ | $R^{D27}$ | $R^{D1}$ |
| $L_{B891}$ | $R^{D8}$ | $R^{D28}$ | $R^{D1}$ |
| $L_{B892}$ | $R^{D8}$ | $R^{D29}$ | $R^{D1}$ |
| $L_{B893}$ | $R^{D8}$ | $R^{D30}$ | $R^{D1}$ |
| $L_{B894}$ | $R^{D8}$ | $R^{D31}$ | $R^{D1}$ |
| $L_{B895}$ | $R^{D8}$ | $R^{D32}$ | $R^{D1}$ |
| $L_{B896}$ | $R^{D8}$ | $R^{D33}$ | $R^{D1}$ |
| $L_{B897}$ | $R^{D8}$ | $R^{D34}$ | $R^{D1}$ |
| $L_{B898}$ | $R^{D8}$ | $R^{D35}$ | $R^{D1}$ |
| $L_{B899}$ | $R^{D8}$ | $R^{D40}$ | $R^{D1}$ |
| $L_{B900}$ | $R^{D8}$ | $R^{D41}$ | $R^{D1}$ |
| $L_{B901}$ | $R^{D8}$ | $R^{D42}$ | $R^{D1}$ |
| $L_{B902}$ | $R^{D8}$ | $R^{D64}$ | $R^{D1}$ |
| $L_{B903}$ | $R^{D8}$ | $R^{D66}$ | $R^{D1}$ |
| $L_{B904}$ | $R^{D8}$ | $R^{D68}$ | $R^{D1}$ |
| $L_{B905}$ | $R^{D8}$ | $R^{D76}$ | $R^{D1}$ |
| $L_{B906}$ | $R^{D11}$ | $R^{D5}$ | $R^{D1}$ |
| $L_{B907}$ | $R^{D11}$ | $R^{D6}$ | $R^{D1}$ |
| $L_{B908}$ | $R^{D11}$ | $R^{D9}$ | $R^{D1}$ |
| $L_{B909}$ | $R^{D11}$ | $R^{D10}$ | $R^{D1}$ |
| $L_{B910}$ | $R^{D11}$ | $R^{D12}$ | $R^{D1}$ |
| $L_{B911}$ | $R^{D11}$ | $R^{D13}$ | $R^{D1}$ |
| $L_{B912}$ | $R^{D11}$ | $R^{D14}$ | $R^{D1}$ |
| $L_{B913}$ | $R^{D11}$ | $R^{D15}$ | $R^{D1}$ |
| $L_{B914}$ | $R^{D11}$ | $R^{D16}$ | $R^{D1}$ |
| $L_{B915}$ | $R^{D11}$ | $R^{D17}$ | $R^{D1}$ |
| $L_{B916}$ | $R^{D11}$ | $R^{D18}$ | $R^{D1}$ |
| $L_{B917}$ | $R^{D11}$ | $R^{D19}$ | $R^{D1}$ |
| $L_{B918}$ | $R^{D11}$ | $R^{D20}$ | $R^{D1}$ |
| $L_{B919}$ | $R^{D11}$ | $R^{D21}$ | $R^{D1}$ |
| $L_{B920}$ | $R^{D11}$ | $R^{D22}$ | $R^{D1}$ |
| $L_{B921}$ | $R^{D11}$ | $R^{D23}$ | $R^{D1}$ |
| $L_{B922}$ | $R^{D11}$ | $R^{D24}$ | $R^{D1}$ |
| $L_{B923}$ | $R^{D11}$ | $R^{D25}$ | $R^{D1}$ |
| $L_{B924}$ | $R^{D11}$ | $R^{D26}$ | $R^{D1}$ |
| $L_{B925}$ | $R^{D11}$ | $R^{D27}$ | $R^{D1}$ |
| $L_{B926}$ | $R^{D11}$ | $R^{D28}$ | $R^{D1}$ |
| $L_{B927}$ | $R^{D11}$ | $R^{D29}$ | $R^{D1}$ |
| $L_{B928}$ | $R^{D11}$ | $R^{D30}$ | $R^{D1}$ |
| $L_{B929}$ | $R^{D11}$ | $R^{D31}$ | $R^{D1}$ |
| $L_{B930}$ | $R^{D11}$ | $R^{D32}$ | $R^{D1}$ |
| $L_{B931}$ | $R^{D11}$ | $R^{D33}$ | $R^{D1}$ |
| $L_{B932}$ | $R^{D11}$ | $R^{D34}$ | $R^{D1}$ |
| $L_{B933}$ | $R^{D11}$ | $R^{D35}$ | $R^{D1}$ |
| $L_{B934}$ | $R^{D11}$ | $R^{D40}$ | $R^{D1}$ |
| $L_{B935}$ | $R^{D11}$ | $R^{D41}$ | $R^{D1}$ |
| $L_{B936}$ | $R^{D11}$ | $R^{D42}$ | $R^{D1}$ |
| $L_{B937}$ | $R^{D11}$ | $R^{D64}$ | $R^{D1}$ |
| $L_{B938}$ | $R^{D11}$ | $R^{D66}$ | $R^{D1}$ |
| $L_{B939}$ | $R^{D11}$ | $R^{D68}$ | $R^{D1}$ |
| $L_{B940}$ | $R^{D11}$ | $R^{D76}$ | $R^{D1}$ |
| $L_{B941}$ | $R^{D13}$ | $R^{D5}$ | $R^{D1}$ |
| $L_{B942}$ | $R^{D13}$ | $R^{D6}$ | $R^{D1}$ |
| $L_{B943}$ | $R^{D13}$ | $R^{D9}$ | $R^{D1}$ |
| $L_{B944}$ | $R^{D13}$ | $R^{D10}$ | $R^{D1}$ |
| $L_{B945}$ | $R^{D13}$ | $R^{D12}$ | $R^{D1}$ |
| $L_{B946}$ | $R^{D13}$ | $R^{D14}$ | $R^{D1}$ |
| $L_{B947}$ | $R^{D13}$ | $R^{D15}$ | $R^{D1}$ |
| $L_{B948}$ | $R^{D13}$ | $R^{D16}$ | $R^{D1}$ |
| $L_{B949}$ | $R^{D13}$ | $R^{D17}$ | $R^{D1}$ |
| $L_{B950}$ | $R^{D13}$ | $R^{D18}$ | $R^{D1}$ |
| $L_{B951}$ | $R^{D13}$ | $R^{D19}$ | $R^{D1}$ |
| $L_{B952}$ | $R^{D13}$ | $R^{D20}$ | $R^{D1}$ |
| $L_{B953}$ | $R^{D13}$ | $R^{D21}$ | $R^{D1}$ |
| $L_{B954}$ | $R^{D13}$ | $R^{D22}$ | $R^{D1}$ |
| $L_{B955}$ | $R^{D13}$ | $R^{D23}$ | $R^{D1}$ |
| $L_{B956}$ | $R^{D13}$ | $R^{D24}$ | $R^{D1}$ |
| $L_{B957}$ | $R^{D13}$ | $R^{D25}$ | $R^{D1}$ |
| $L_{B958}$ | $R^{D13}$ | $R^{D26}$ | $R^{D1}$ |
| $L_{B959}$ | $R^{D13}$ | $R^{D27}$ | $R^{D1}$ |
| $L_{B960}$ | $R^{D13}$ | $R^{D28}$ | $R^{D1}$ |

-continued

| $L_{Bj}$ | $R^1$ | $R^2$ | $R^3$ |
|---|---|---|---|
| $L_{B961}$ | $R^{D13}$ | $R^{D29}$ | $R^{D1}$ |
| $L_{B962}$ | $R^{D13}$ | $R^{D30}$ | $R^{D1}$ |
| $L_{B963}$ | $R^{D13}$ | $R^{D31}$ | $R^{D1}$ |
| $L_{B964}$ | $R^{D13}$ | $R^{D32}$ | $R^{D1}$ |
| $L_{B965}$ | $R^{D13}$ | $R^{D33}$ | $R^{D1}$ |
| $L_{B966}$ | $R^{D13}$ | $R^{D34}$ | $R^{D1}$ |
| $L_{B967}$ | $R^{D13}$ | $R^{D35}$ | $R^{D1}$ |
| $L_{B968}$ | $R^{D13}$ | $R^{D40}$ | $R^{D1}$ |
| $L_{B969}$ | $R^{D13}$ | $R^{D41}$ | $R^{D1}$ |
| $L_{B970}$ | $R^{D13}$ | $R^{D42}$ | $R^{D1}$ |
| $L_{B971}$ | $R^{D13}$ | $R^{D64}$ | $R^{D1}$ |
| $L_{B972}$ | $R^{D13}$ | $R^{D66}$ | $R^{D1}$ |
| $L_{B973}$ | $R^{D13}$ | $R^{D68}$ | $R^{D1}$ |
| $L_{B974}$ | $R^{D13}$ | $R^{D76}$ | $R^{D1}$ |
| $L_{B975}$ | $R^{D14}$ | $R^{D5}$ | $R^{D1}$ |
| $L_{B976}$ | $R^{D14}$ | $R^{D6}$ | $R^{D1}$ |
| $L_{B977}$ | $R^{D14}$ | $R^{D9}$ | $R^{D1}$ |
| $L_{B978}$ | $R^{D14}$ | $R^{D10}$ | $R^{D1}$ |
| $L_{B979}$ | $R^{D14}$ | $R^{D12}$ | $R^{D1}$ |
| $L_{B980}$ | $R^{D14}$ | $R^{D15}$ | $R^{D1}$ |
| $L_{B981}$ | $R^{D14}$ | $R^{D16}$ | $R^{D1}$ |
| $L_{B982}$ | $R^{D14}$ | $R^{D17}$ | $R^{D1}$ |
| $L_{B983}$ | $R^{D14}$ | $R^{D18}$ | $R^{D1}$ |
| $L_{B984}$ | $R^{D14}$ | $R^{D19}$ | $R^{D1}$ |
| $L_{B985}$ | $R^{D14}$ | $R^{D20}$ | $R^{D1}$ |
| $L_{B986}$ | $R^{D14}$ | $R^{D21}$ | $R^{D1}$ |
| $L_{B987}$ | $R^{D14}$ | $R^{D22}$ | $R^{D1}$ |
| $L_{B988}$ | $R^{D14}$ | $R^{D23}$ | $R^{D1}$ |
| $L_{B989}$ | $R^{D14}$ | $R^{D24}$ | $R^{D1}$ |
| $L_{B990}$ | $R^{D14}$ | $R^{D25}$ | $R^{D1}$ |
| $L_{B991}$ | $R^{D14}$ | $R^{D26}$ | $R^{D1}$ |
| $L_{B992}$ | $R^{D14}$ | $R^{D27}$ | $R^{D1}$ |
| $L_{B993}$ | $R^{D14}$ | $R^{D28}$ | $R^{D1}$ |
| $L_{B994}$ | $R^{D14}$ | $R^{D29}$ | $R^{D1}$ |
| $L_{B995}$ | $R^{D14}$ | $R^{D30}$ | $R^{D1}$ |
| $L_{B996}$ | $R^{D14}$ | $R^{D31}$ | $R^{D1}$ |
| $L_{B997}$ | $R^{D14}$ | $R^{D32}$ | $R^{D1}$ |
| $L_{B998}$ | $R^{D14}$ | $R^{D33}$ | $R^{D1}$ |
| $L_{B999}$ | $R^{D14}$ | $R^{D34}$ | $R^{D1}$ |
| $L_{B1000}$ | $R^{D14}$ | $R^{D35}$ | $R^{D1}$ |
| $L_{B1001}$ | $R^{D14}$ | $R^{D40}$ | $R^{D1}$ |
| $L_{B1002}$ | $R^{D14}$ | $R^{D41}$ | $R^{D1}$ |
| $L_{B1003}$ | $R^{D14}$ | $R^{D42}$ | $R^{D1}$ |
| $L_{B1004}$ | $R^{D14}$ | $R^{D64}$ | $R^{D1}$ |
| $L_{B1005}$ | $R^{D14}$ | $R^{D66}$ | $R^{D1}$ |
| $L_{B1006}$ | $R^{D14}$ | $R^{D68}$ | $R^{D1}$ |
| $L_{B1007}$ | $R^{D14}$ | $R^{D76}$ | $R^{D1}$ |
| $L_{B1008}$ | $R^{D22}$ | $R^{D5}$ | $R^{D1}$ |
| $L_{B1009}$ | $R^{D22}$ | $R^{D6}$ | $R^{D1}$ |
| $L_{B1010}$ | $R^{D22}$ | $R^{D9}$ | $R^{D1}$ |
| $L_{B1011}$ | $R^{D22}$ | $R^{D10}$ | $R^{D1}$ |
| $L_{B1012}$ | $R^{D22}$ | $R^{D12}$ | $R^{D1}$ |
| $L_{B1013}$ | $R^{D22}$ | $R^{D15}$ | $R^{D1}$ |
| $L_{B1014}$ | $R^{D22}$ | $R^{D16}$ | $R^{D1}$ |
| $L_{B1015}$ | $R^{D22}$ | $R^{D17}$ | $R^{D1}$ |
| $L_{B1016}$ | $R^{D22}$ | $R^{D18}$ | $R^{D1}$ |
| $L_{B1017}$ | $R^{D22}$ | $R^{D19}$ | $R^{D1}$ |
| $L_{B1018}$ | $R^{D22}$ | $R^{D20}$ | $R^{D1}$ |
| $L_{B1019}$ | $R^{D22}$ | $R^{D21}$ | $R^{D1}$ |
| $L_{B1020}$ | $R^{D22}$ | $R^{D23}$ | $R^{D1}$ |
| $L_{B1021}$ | $R^{D22}$ | $R^{D24}$ | $R^{D1}$ |
| $L_{B1022}$ | $R^{D22}$ | $R^{D25}$ | $R^{D1}$ |
| $L_{B1023}$ | $R^{D22}$ | $R^{D26}$ | $R^{D1}$ |
| $L_{B1024}$ | $R^{D22}$ | $R^{D27}$ | $R^{D1}$ |
| $L_{B1025}$ | $R^{D22}$ | $R^{D28}$ | $R^{D1}$ |
| $L_{B1026}$ | $R^{D22}$ | $R^{D29}$ | $R^{D1}$ |
| $L_{B1027}$ | $R^{D22}$ | $R^{D30}$ | $R^{D1}$ |
| $L_{B1028}$ | $R^{D22}$ | $R^{D31}$ | $R^{D1}$ |
| $L_{B1029}$ | $R^{D22}$ | $R^{D32}$ | $R^{D1}$ |
| $L_{B1030}$ | $R^{D22}$ | $R^{D33}$ | $R^{D1}$ |
| $L_{B1031}$ | $R^{D22}$ | $R^{D34}$ | $R^{D1}$ |
| $L_{B1032}$ | $R^{D22}$ | $R^{D35}$ | $R^{D1}$ |
| $L_{B1033}$ | $R^{D22}$ | $R^{D40}$ | $R^{D1}$ |
| $L_{B1034}$ | $R^{D22}$ | $R^{D41}$ | $R^{D1}$ |
| $L_{B1035}$ | $R^{D22}$ | $R^{D42}$ | $R^{D1}$ |
| $L_{B1036}$ | $R^{D22}$ | $R^{D64}$ | $R^{D1}$ |
| $L_{B1037}$ | $R^{D22}$ | $R^{D66}$ | $R^{D1}$ |

-continued

| $L_{Bj}$ | $R^1$ | $R^2$ | $R^3$ |
|---|---|---|---|
| $L_{B1038}$ | $R^{D22}$ | $R^{D68}$ | $R^{D1}$ |
| $L_{B1039}$ | $R^{D22}$ | $R^{D76}$ | $R^{D1}$ |
| $L_{B1040}$ | $R^{D26}$ | $R^{D5}$ | $R^{D1}$ |
| $L_{B1041}$ | $R^{D26}$ | $R^{D6}$ | $R^{D1}$ |
| $L_{B1042}$ | $R^{D26}$ | $R^{D9}$ | $R^{D1}$ |
| $L_{B1043}$ | $R^{D26}$ | $R^{D10}$ | $R^{D1}$ |
| $L_{B1044}$ | $R^{D26}$ | $R^{D12}$ | $R^{D1}$ |
| $L_{B1045}$ | $R^{D26}$ | $R^{D15}$ | $R^{D1}$ |
| $L_{B1046}$ | $R^{D26}$ | $R^{D16}$ | $R^{D1}$ |
| $L_{B1047}$ | $R^{D26}$ | $R^{D17}$ | $R^{D1}$ |
| $L_{B1048}$ | $R^{D26}$ | $R^{D18}$ | $R^{D1}$ |
| $L_{B1049}$ | $R^{D26}$ | $R^{D19}$ | $R^{D1}$ |
| $L_{B1050}$ | $R^{D26}$ | $R^{D20}$ | $R^{D1}$ |
| $L_{B1051}$ | $R^{D26}$ | $R^{D21}$ | $R^{D1}$ |
| $L_{B1052}$ | $R^{D26}$ | $R^{D23}$ | $R^{D1}$ |
| $L_{B1053}$ | $R^{D26}$ | $R^{D24}$ | $R^{D1}$ |
| $L_{B1054}$ | $R^{D26}$ | $R^{D25}$ | $R^{D1}$ |
| $L_{B1055}$ | $R^{D26}$ | $R^{D27}$ | $R^{D1}$ |
| $L_{B1056}$ | $R^{D26}$ | $R^{D28}$ | $R^{D1}$ |
| $L_{B1057}$ | $R^{D26}$ | $R^{D29}$ | $R^{D1}$ |
| $L_{B1058}$ | $R^{D26}$ | $R^{D30}$ | $R^{D1}$ |
| $L_{B1059}$ | $R^{D26}$ | $R^{D31}$ | $R^{D1}$ |
| $L_{B1060}$ | $R^{D26}$ | $R^{D32}$ | $R^{D1}$ |
| $L_{B1061}$ | $R^{D26}$ | $R^{D33}$ | $R^{D1}$ |
| $L_{B1062}$ | $R^{D26}$ | $R^{D34}$ | $R^{D1}$ |
| $L_{B1063}$ | $R^{D26}$ | $R^{D35}$ | $R^{D1}$ |
| $L_{B1064}$ | $R^{D26}$ | $R^{D40}$ | $R^{D1}$ |
| $L_{B1065}$ | $R^{D26}$ | $R^{D41}$ | $R^{D1}$ |
| $L_{B1066}$ | $R^{D26}$ | $R^{D42}$ | $R^{D1}$ |
| $L_{B1067}$ | $R^{D26}$ | $R^{D64}$ | $R^{D1}$ |
| $L_{B1068}$ | $R^{D26}$ | $R^{D66}$ | $R^{D1}$ |
| $L_{B1069}$ | $R^{D26}$ | $R^{D68}$ | $R^{D1}$ |
| $L_{B1070}$ | $R^{D26}$ | $R^{D76}$ | $R^{D1}$ |
| $L_{B1071}$ | $R^{D35}$ | $R^{D5}$ | $R^{D1}$ |
| $L_{B1072}$ | $R^{D35}$ | $R^{D6}$ | $R^{D1}$ |
| $L_{B1073}$ | $R^{D35}$ | $R^{D9}$ | $R^{D1}$ |
| $L_{B1074}$ | $R^{D35}$ | $R^{D10}$ | $R^{D1}$ |
| $L_{B1075}$ | $R^{D35}$ | $R^{D12}$ | $R^{D1}$ |
| $L_{B1076}$ | $R^{D35}$ | $R^{D15}$ | $R^{D1}$ |
| $L_{B1077}$ | $R^{D35}$ | $R^{D16}$ | $R^{D1}$ |
| $L_{B1078}$ | $R^{D35}$ | $R^{D17}$ | $R^{D1}$ |
| $L_{B1079}$ | $R^{D35}$ | $R^{D18}$ | $R^{D1}$ |
| $L_{B1080}$ | $R^{D35}$ | $R^{D19}$ | $R^{D1}$ |
| $L_{B1081}$ | $R^{D35}$ | $R^{D20}$ | $R^{D1}$ |
| $L_{B1082}$ | $R^{D35}$ | $R^{D21}$ | $R^{D1}$ |
| $L_{B1083}$ | $R^{D35}$ | $R^{D23}$ | $R^{D1}$ |
| $L_{B1084}$ | $R^{D35}$ | $R^{D24}$ | $R^{D1}$ |
| $L_{B1085}$ | $R^{D35}$ | $R^{D25}$ | $R^{D1}$ |
| $L_{B1086}$ | $R^{D35}$ | $R^{D27}$ | $R^{D1}$ |
| $L_{B1087}$ | $R^{D35}$ | $R^{D28}$ | $R^{D1}$ |
| $L_{B1088}$ | $R^{D35}$ | $R^{D29}$ | $R^{D1}$ |
| $L_{B1089}$ | $R^{D35}$ | $R^{D30}$ | $R^{D1}$ |
| $L_{B1090}$ | $R^{D35}$ | $R^{D31}$ | $R^{D1}$ |
| $L_{B1091}$ | $R^{D35}$ | $R^{D32}$ | $R^{D1}$ |
| $L_{B1092}$ | $R^{D35}$ | $R^{D33}$ | $R^{D1}$ |
| $L_{B1093}$ | $R^{D35}$ | $R^{D34}$ | $R^{D1}$ |
| $L_{B1094}$ | $R^{D35}$ | $R^{D40}$ | $R^{D1}$ |
| $L_{B1095}$ | $R^{D35}$ | $R^{D41}$ | $R^{D1}$ |
| $L_{B1096}$ | $R^{D35}$ | $R^{D42}$ | $R^{D1}$ |
| $L_{B1097}$ | $R^{D35}$ | $R^{D64}$ | $R^{D1}$ |
| $L_{B1098}$ | $R^{D35}$ | $R^{D66}$ | $R^{D1}$ |
| $L_{B1099}$ | $R^{D35}$ | $R^{D68}$ | $R^{D1}$ |
| $L_{B1100}$ | $R^{D35}$ | $R^{D76}$ | $R^{D1}$ |
| $L_{B1101}$ | $R^{D40}$ | $R^{D5}$ | $R^{D1}$ |
| $L_{B1102}$ | $R^{D40}$ | $R^{D6}$ | $R^{D1}$ |
| $L_{B1103}$ | $R^{D40}$ | $R^{D9}$ | $R^{D1}$ |
| $L_{B1104}$ | $R^{D40}$ | $R^{D10}$ | $R^{D1}$ |
| $L_{B1105}$ | $R^{D40}$ | $R^{D12}$ | $R^{D1}$ |
| $L_{B1106}$ | $R^{D40}$ | $R^{D15}$ | $R^{D1}$ |
| $L_{B1107}$ | $R^{D40}$ | $R^{D16}$ | $R^{D1}$ |
| $L_{B1108}$ | $R^{D40}$ | $R^{D17}$ | $R^{D1}$ |
| $L_{B1109}$ | $R^{D40}$ | $R^{D18}$ | $R^{D1}$ |
| $L_{B1110}$ | $R^{D40}$ | $R^{D19}$ | $R^{D1}$ |
| $L_{B1111}$ | $R^{D40}$ | $R^{D20}$ | $R^{D1}$ |
| $L_{B1112}$ | $R^{D40}$ | $R^{D21}$ | $R^{D1}$ |
| $L_{B1113}$ | $R^{D40}$ | $R^{D23}$ | $R^{D1}$ |
| $L_{B1114}$ | $R^{D40}$ | $R^{D24}$ | $R^{D1}$ |

-continued

| $L_{Bj}$ | $R^1$ | $R^2$ | $R^3$ |
|---|---|---|---|
| $L_{B1115}$ | $R^{D40}$ | $R^{D25}$ | $R^{D1}$ |
| $L_{B1116}$ | $R^{D40}$ | $R^{D27}$ | $R^{D1}$ |
| $L_{B1117}$ | $R^{D40}$ | $R^{D28}$ | $R^{D1}$ |
| $L_{B1118}$ | $R^{D40}$ | $R^{D29}$ | $R^{D1}$ |
| $L_{B1119}$ | $R^{D40}$ | $R^{D30}$ | $R^{D1}$ |
| $L_{B1120}$ | $R^{D40}$ | $R^{D31}$ | $R^{D1}$ |
| $L_{B1121}$ | $R^{D40}$ | $R^{D32}$ | $R^{D1}$ |
| $L_{B1122}$ | $R^{D40}$ | $R^{D33}$ | $R^{D1}$ |
| $L_{B1123}$ | $R^{D40}$ | $R^{D34}$ | $R^{D1}$ |
| $L_{B1124}$ | $R^{D40}$ | $R^{D41}$ | $R^{D1}$ |
| $L_{B1125}$ | $R^{D40}$ | $R^{D42}$ | $R^{D1}$ |
| $L_{B1126}$ | $R^{D40}$ | $R^{D64}$ | $R^{D1}$ |
| $L_{B1127}$ | $R^{D40}$ | $R^{D66}$ | $R^{D1}$ |
| $L_{B1128}$ | $R^{D40}$ | $R^{D68}$ | $R^{D1}$ |
| $L_{B1129}$ | $R^{D40}$ | $R^{D76}$ | $R^{D1}$ |
| $L_{B1130}$ | $R^{D41}$ | $R^{D5}$ | $R^{D1}$ |
| $L_{B1131}$ | $R^{D41}$ | $R^{D6}$ | $R^{D1}$ |
| $L_{B1132}$ | $R^{D41}$ | $R^{D9}$ | $R^{D1}$ |
| $L_{B1133}$ | $R^{D41}$ | $R^{D10}$ | $R^{D1}$ |
| $L_{B1134}$ | $R^{D41}$ | $R^{D12}$ | $R^{D1}$ |
| $L_{B1135}$ | $R^{D41}$ | $R^{D15}$ | $R^{D1}$ |
| $L_{B1136}$ | $R^{D41}$ | $R^{D16}$ | $R^{D1}$ |
| $L_{B1137}$ | $R^{D41}$ | $R^{D17}$ | $R^{D1}$ |
| $L_{B1138}$ | $R^{D41}$ | $R^{D18}$ | $R^{D1}$ |
| $L_{B1139}$ | $R^{D41}$ | $R^{D19}$ | $R^{D1}$ |
| $L_{B1140}$ | $R^{D41}$ | $R^{D20}$ | $R^{D1}$ |
| $L_{B1141}$ | $R^{D41}$ | $R^{D21}$ | $R^{D1}$ |
| $L_{B1142}$ | $R^{D41}$ | $R^{D23}$ | $R^{D1}$ |
| $L_{B1143}$ | $R^{D41}$ | $R^{D24}$ | $R^{D1}$ |
| $L_{B1144}$ | $R^{D41}$ | $R^{D25}$ | $R^{D1}$ |
| $L_{B1145}$ | $R^{D41}$ | $R^{D27}$ | $R^{D1}$ |
| $L_{B1146}$ | $R^{D41}$ | $R^{D28}$ | $R^{D1}$ |
| $L_{B1147}$ | $R^{D41}$ | $R^{D29}$ | $R^{D1}$ |
| $L_{B1148}$ | $R^{D41}$ | $R^{D30}$ | $R^{D1}$ |
| $L_{B1149}$ | $R^{D41}$ | $R^{D31}$ | $R^{D1}$ |
| $L_{B1150}$ | $R^{D41}$ | $R^{D32}$ | $R^{D1}$ |
| $L_{B1151}$ | $R^{D41}$ | $R^{D33}$ | $R^{D1}$ |
| $L_{B1152}$ | $R^{D41}$ | $R^{D34}$ | $R^{D1}$ |
| $L_{B1153}$ | $R^{D41}$ | $R^{D42}$ | $R^{D1}$ |
| $L_{B1154}$ | $R^{D41}$ | $R^{D64}$ | $R^{D1}$ |
| $L_{B1155}$ | $R^{D41}$ | $R^{D66}$ | $R^{D1}$ |
| $L_{B1156}$ | $R^{D41}$ | $R^{D68}$ | $R^{D1}$ |
| $L_{B1157}$ | $R^{D41}$ | $R^{D76}$ | $R^{D1}$ |
| $L_{B1158}$ | $R^{D64}$ | $R^{D5}$ | $R^{D1}$ |
| $L_{B1159}$ | $R^{D64}$ | $R^{D6}$ | $R^{D1}$ |
| $L_{B1160}$ | $R^{D64}$ | $R^{D9}$ | $R^{D1}$ |
| $L_{B1161}$ | $R^{D64}$ | $R^{D10}$ | $R^{D1}$ |
| $L_{B1162}$ | $R^{D64}$ | $R^{D12}$ | $R^{D1}$ |
| $L_{B1163}$ | $R^{D64}$ | $R^{D15}$ | $R^{D1}$ |
| $L_{B1164}$ | $R^{D64}$ | $R^{D16}$ | $R^{D1}$ |
| $L_{B1165}$ | $R^{D64}$ | $R^{D17}$ | $R^{D1}$ |
| $L_{B1166}$ | $R^{D64}$ | $R^{D18}$ | $R^{D1}$ |
| $L_{B1167}$ | $R^{D64}$ | $R^{D19}$ | $R^{D1}$ |
| $L_{B1168}$ | $R^{D64}$ | $R^{D20}$ | $R^{D1}$ |
| $L_{B1169}$ | $R^{D64}$ | $R^{D21}$ | $R^{D1}$ |
| $L_{B1170}$ | $R^{D64}$ | $R^{D23}$ | $R^{D1}$ |
| $L_{B1171}$ | $R^{D64}$ | $R^{D24}$ | $R^{D1}$ |
| $L_{B1172}$ | $R^{D64}$ | $R^{D25}$ | $R^{D1}$ |
| $L_{B1173}$ | $R^{D64}$ | $R^{D27}$ | $R^{D1}$ |
| $L_{B1174}$ | $R^{D64}$ | $R^{D28}$ | $R^{D1}$ |
| $L_{B1175}$ | $R^{D64}$ | $R^{D29}$ | $R^{D1}$ |
| $L_{B1176}$ | $R^{D64}$ | $R^{D30}$ | $R^{D1}$ |
| $L_{B1177}$ | $R^{D64}$ | $R^{D31}$ | $R^{D1}$ |
| $L_{B1178}$ | $R^{D64}$ | $R^{D32}$ | $R^{D1}$ |
| $L_{B1179}$ | $R^{D64}$ | $R^{D33}$ | $R^{D1}$ |
| $L_{B1180}$ | $R^{D64}$ | $R^{D34}$ | $R^{D1}$ |
| $L_{B1181}$ | $R^{D64}$ | $R^{D42}$ | $R^{D1}$ |
| $L_{B1182}$ | $R^{D64}$ | $R^{D64}$ | $R^{D1}$ |
| $L_{B1183}$ | $R^{D64}$ | $R^{D66}$ | $R^{D1}$ |
| $L_{B1184}$ | $R^{D64}$ | $R^{D68}$ | $R^{D1}$ |
| $L_{B1185}$ | $R^{D64}$ | $R^{D76}$ | $R^{D1}$ |
| $L_{B1186}$ | $R^{D66}$ | $R^{D5}$ | $R^{D1}$ |
| $L_{B1187}$ | $R^{D66}$ | $R^{D6}$ | $R^{D1}$ |
| $L_{B1188}$ | $R^{D66}$ | $R^{D9}$ | $R^{D1}$ |
| $L_{B1189}$ | $R^{D66}$ | $R^{D10}$ | $R^{D1}$ |
| $L_{B1190}$ | $R^{D66}$ | $R^{D12}$ | $R^{D1}$ |
| $L_{B1191}$ | $R^{D66}$ | $R^{D15}$ | $R^{D1}$ |

-continued

| $L_{Bj}$ | $R^1$ | $R^2$ | $R^3$ |
|---|---|---|---|
| $L_{B1192}$ | $R^{D66}$ | $R^{D16}$ | $R^{D1}$ |
| $L_{B1193}$ | $R^{D66}$ | $R^{D17}$ | $R^{D1}$ |
| $L_{B1194}$ | $R^{D66}$ | $R^{D18}$ | $R^{D1}$ |
| $L_{B1195}$ | $R^{D66}$ | $R^{D19}$ | $R^{D1}$ |
| $L_{B1196}$ | $R^{D66}$ | $R^{D20}$ | $R^{D1}$ |
| $L_{B1197}$ | $R^{D66}$ | $R^{D21}$ | $R^{D1}$ |
| $L_{B1198}$ | $R^{D66}$ | $R^{D23}$ | $R^{D1}$ |
| $L_{B1199}$ | $R^{D66}$ | $R^{D24}$ | $R^{D1}$ |
| $L_{B1200}$ | $R^{D66}$ | $R^{D25}$ | $R^{D1}$ |
| $L_{B1201}$ | $R^{D66}$ | $R^{D27}$ | $R^{D1}$ |
| $L_{B1202}$ | $R^{D66}$ | $R^{D28}$ | $R^{D1}$ |
| $L_{B1203}$ | $R^{D66}$ | $R^{D29}$ | $R^{D1}$ |
| $L_{B1204}$ | $R^{D66}$ | $R^{D30}$ | $R^{D1}$ |
| $L_{B1205}$ | $R^{D66}$ | $R^{D31}$ | $R^{D1}$ |
| $L_{B1206}$ | $R^{D66}$ | $R^{D32}$ | $R^{D1}$ |
| $L_{B1207}$ | $R^{D66}$ | $R^{D33}$ | $R^{D1}$ |
| $L_{B1208}$ | $R^{D66}$ | $R^{D34}$ | $R^{D1}$ |
| $L_{B1209}$ | $R^{D66}$ | $R^{D42}$ | $R^{D1}$ |
| $L_{B1210}$ | $R^{D66}$ | $R^{D68}$ | $R^{D1}$ |
| $L_{B1211}$ | $R^{D66}$ | $R^{D76}$ | $R^{D1}$ |
| $L_{B1212}$ | $R^{D68}$ | $R^{D5}$ | $R^{D1}$ |
| $L_{B1213}$ | $R^{D68}$ | $R^{D6}$ | $R^{D1}$ |
| $L_{B1214}$ | $R^{D68}$ | $R^{D9}$ | $R^{D1}$ |
| $L_{B1215}$ | $R^{D68}$ | $R^{D10}$ | $R^{D1}$ |
| $L_{B1216}$ | $R^{D68}$ | $R^{D12}$ | $R^{D1}$ |
| $L_{B1217}$ | $R^{D68}$ | $R^{D15}$ | $R^{D1}$ |
| $L_{B1218}$ | $R^{D68}$ | $R^{D16}$ | $R^{D1}$ |
| $L_{B1219}$ | $R^{D68}$ | $R^{D17}$ | $R^{D1}$ |
| $L_{B1220}$ | $R^{D68}$ | $R^{D18}$ | $R^{D1}$ |
| $L_{B1221}$ | $R^{D68}$ | $R^{D19}$ | $R^{D1}$ |
| $L_{B1222}$ | $R^{D68}$ | $R^{D20}$ | $R^{D1}$ |
| $L_{B1223}$ | $R^{D68}$ | $R^{D21}$ | $R^{D1}$ |
| $L_{B1224}$ | $R^{D68}$ | $R^{D23}$ | $R^{D1}$ |
| $L_{B1225}$ | $R^{D68}$ | $R^{D24}$ | $R^{D1}$ |
| $L_{B1226}$ | $R^{D68}$ | $R^{D25}$ | $R^{D1}$ |
| $L_{B1227}$ | $R^{D68}$ | $R^{D27}$ | $R^{D1}$ |
| $L_{B1228}$ | $R^{D68}$ | $R^{D28}$ | $R^{D1}$ |
| $L_{B1229}$ | $R^{D68}$ | $R^{D29}$ | $R^{D1}$ |
| $L_{B1230}$ | $R^{D68}$ | $R^{D30}$ | $R^{D1}$ |
| $L_{B1231}$ | $R^{D68}$ | $R^{D31}$ | $R^{D1}$ |
| $L_{B1232}$ | $R^{D68}$ | $R^{D32}$ | $R^{D1}$ |
| $L_{B1233}$ | $R^{D68}$ | $R^{D33}$ | $R^{D1}$ |
| $L_{B1234}$ | $R^{D68}$ | $R^{D34}$ | $R^{D1}$ |
| $L_{B1235}$ | $R^{D68}$ | $R^{D42}$ | $R^{D1}$ |
| $L_{B1236}$ | $R^{D68}$ | $R^{D76}$ | $R^{D1}$ |
| $L_{B1237}$ | $R^{D76}$ | $R^{D5}$ | $R^{D1}$ |
| $L_{B1238}$ | $R^{D76}$ | $R^{D6}$ | $R^{D1}$ |
| $L_{B1239}$ | $R^{D76}$ | $R^{D9}$ | $R^{D1}$ |
| $L_{B1240}$ | $R^{D76}$ | $R^{D10}$ | $R^{D1}$ |
| $L_{B1241}$ | $R^{D76}$ | $R^{D12}$ | $R^{D1}$ |
| $L_{B1242}$ | $R^{D76}$ | $R^{D15}$ | $R^{D1}$ |
| $L_{B1243}$ | $R^{D76}$ | $R^{D16}$ | $R^{D1}$ |
| $L_{B1244}$ | $R^{D76}$ | $R^{D17}$ | $R^{D1}$ |
| $L_{B1245}$ | $R^{D76}$ | $R^{D18}$ | $R^{D1}$ |
| $L_{B1246}$ | $R^{D76}$ | $R^{D19}$ | $R^{D1}$ |
| $L_{B1247}$ | $R^{D76}$ | $R^{D20}$ | $R^{D1}$ |
| $L_{B1248}$ | $R^{D76}$ | $R^{D21}$ | $R^{D1}$ |
| $L_{B1249}$ | $R^{D76}$ | $R^{D23}$ | $R^{D1}$ |
| $L_{B1250}$ | $R^{D76}$ | $R^{D24}$ | $R^{D1}$ |
| $L_{B1251}$ | $R^{D76}$ | $R^{D25}$ | $R^{D1}$ |
| $L_{B1252}$ | $R^{D76}$ | $R^{D27}$ | $R^{D1}$ |
| $L_{B1253}$ | $R^{D76}$ | $R^{D28}$ | $R^{D1}$ |
| $L_{B1254}$ | $R^{D76}$ | $R^{D29}$ | $R^{D1}$ |
| $L_{B1255}$ | $R^{D76}$ | $R^{D30}$ | $R^{D1}$ |
| $L_{B1256}$ | $R^{D76}$ | $R^{D31}$ | $R^{D1}$ |
| $L_{B1257}$ | $R^{D76}$ | $R^{D32}$ | $R^{D1}$ |
| $L_{B1258}$ | $R^{D76}$ | $R^{D33}$ | $R^{D1}$ |
| $L_{B1259}$ | $R^{D76}$ | $R^{D34}$ | $R^{D1}$ |
| $L_{B1260}$ | $R^{D76}$ | $R^{D42}$ | $R^{D1}$ |

wherein $R^{D1}$ to $R^{D81}$ has the following structures:

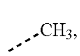

$R^{D1}$

-continued

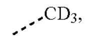

$R^{D2}$

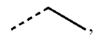

$R^{D3}$

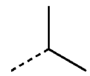

$R^{D4}$

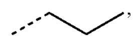

$R^{D5}$

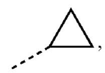

$R^{D6}$

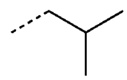

$R^{D7}$

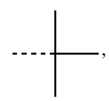

$R^{D8}$

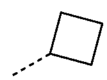

$R^{D9}$

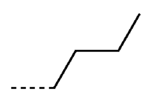

$R^{D10}$

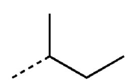

$R^{D11}$

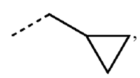

$R^{D12}$

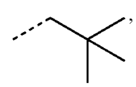

$R^{D13}$

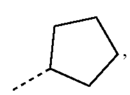

$R^{D14}$

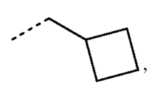

$R^{D15}$

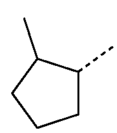

$R^{D16}$

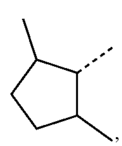

$R^{D17}$

-continued
$R^{D18}$
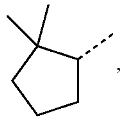
$R^{D19}$
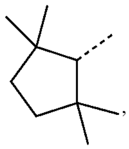
$R^{D20}$
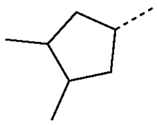
$R^{D21}$
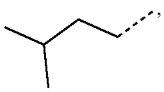
$R^{D22}$
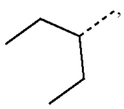
$R^{D23}$
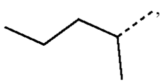
$R^{D24}$
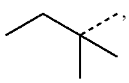
$R^{D25}$
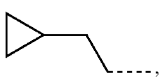
$R^{D26}$
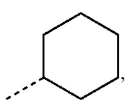
$R^{D27}$
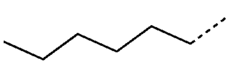
$R^{D28}$
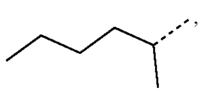
$R^{D29}$
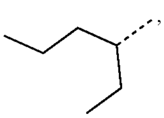
$R^{D30}$
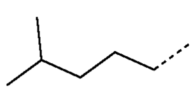
-continued
$R^{D31}$
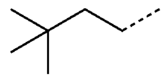
$R^{D32}$
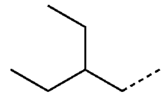
$R^{D33}$
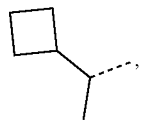
$R^{D34}$
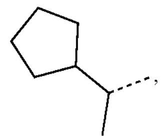
$R^{D35}$
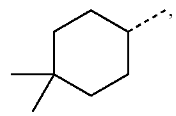
$R^{D36}$
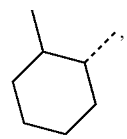
$R^{D37}$
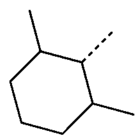
$R^{D38}$
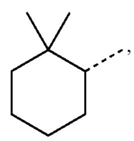
$R^{D39}$
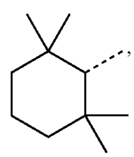
$R^{D40}$
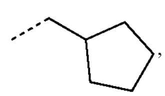
$R^{D41}$
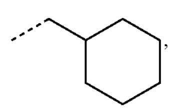
$R^{D42}$
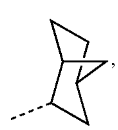

$R^{D43}$
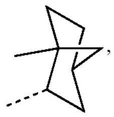
$R^{D44}$
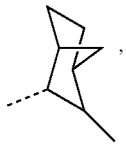
$R^{D45}$
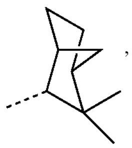
$R^{D46}$
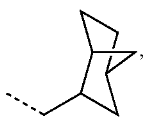
$R^{D47}$
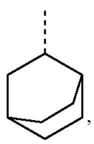
$R^{D48}$
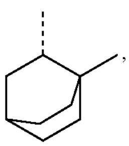
$R^{D49}$
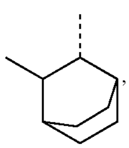
$R^{D50}$
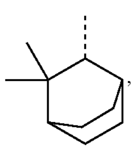
$R^{D51}$
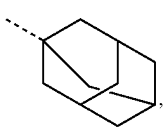
$R^{D52}$
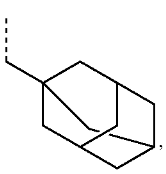
$R^{D53}$
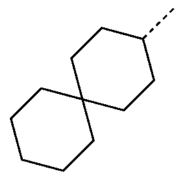
$R^{D54}$
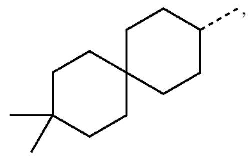
$R^{D55}$
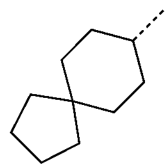
$R^{D56}$
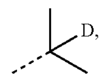
$R^{D57}$
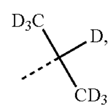
$R^{D58}$
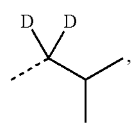
$R^{D59}$
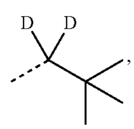
$R^{D60}$
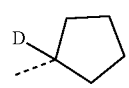
$R^{D61}$
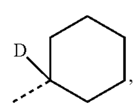
$R^{D62}$
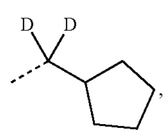
$R^{D63}$
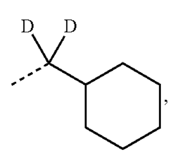
$R^{D64}$
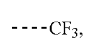

-continued $R^{D65}$

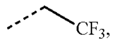

$R^{D66}$

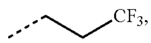

$R^{D67}$

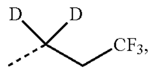

$R^{D68}$

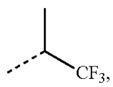

$R^{D69}$

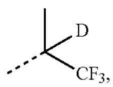

$R^{D70}$

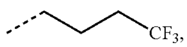

$R^{D71}$

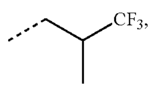

$R^{D72}$

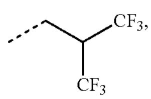

$R^{D73}$

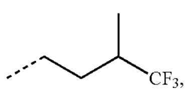

$R^{D74}$

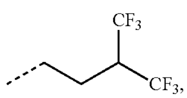

$R^{D75}$

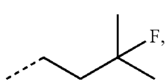

$R^{D76}$

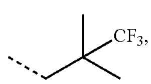

$R^{D77}$

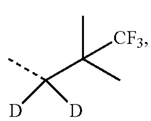

$R^{D78}$

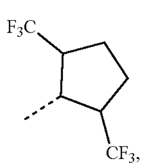

$R^{D79}$

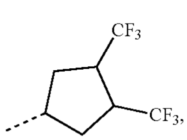

-continued $R^{D80}$

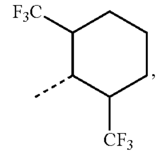

and $R^{D81}$

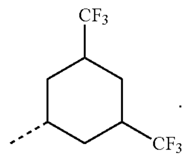

12. A formulation comprising the compound of claim 1.

13. A chemical structure selected from the group consisting of a monomer, a polymer, a macromolecule, and a supramolecule, wherein the chemical structure comprises the compound according to claim 1.

14. The compound of claim 1, wherein the $L_A$ is selected from the group XIX-$L_{A1189\text{-}S}$

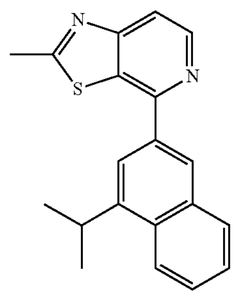

XIX-$L_{A1192\text{-}S}$

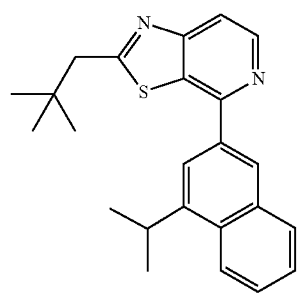

XIX-$L_{A1203\text{-}S}$

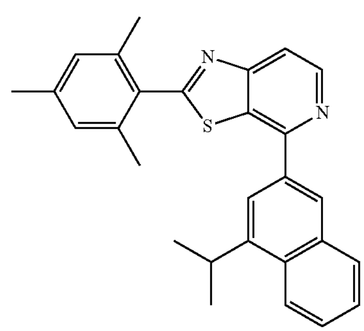

XIX-L$_{A1204\text{-}S}$
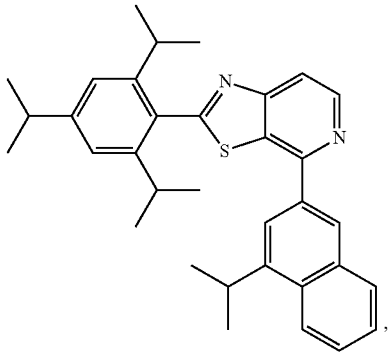
XIX-L$_{A1258\text{-}S}$
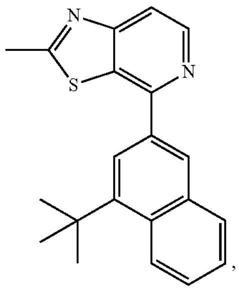
XIX-L$_{A1261\text{-}S}$
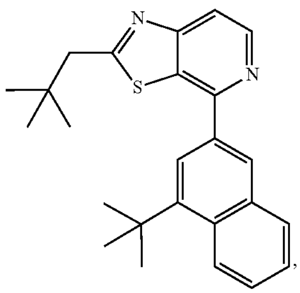
XIX-L$_{A1272\text{-}S}$
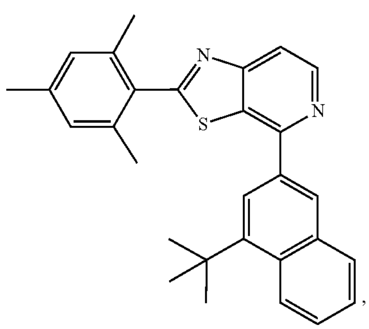
XIX-L$_{A1273\text{-}S}$
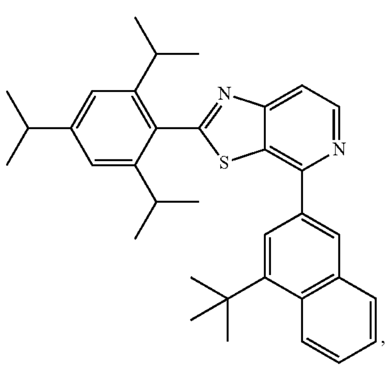
XIX-L$_{A1396\text{-}S}$
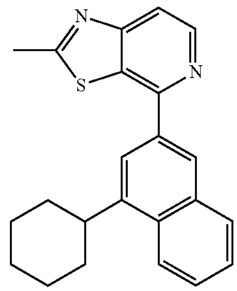
XIX-L$_{A1399\text{-}S}$
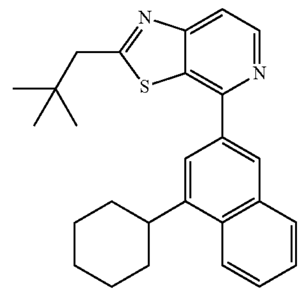
XIX-L$_{A1410\text{-}S}$
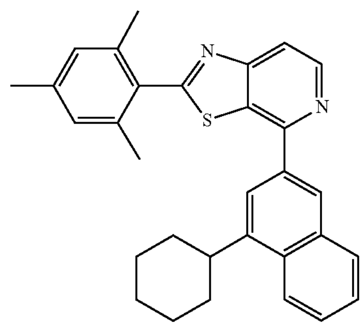
XIX-L$_{A1411\text{-}S}$
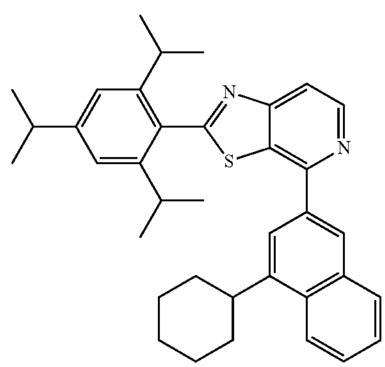
XIX-L$_{A1411\text{-}O}$
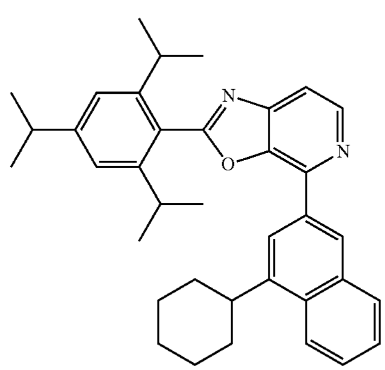

-continued
XX-$L_{A1206-S}$
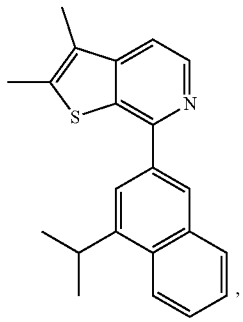
XX-$L_{A1226-S}$
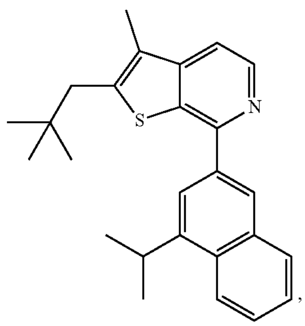
XX-$L_{A1237-S}$
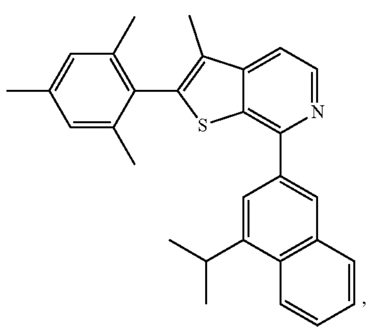
XX-$L_{A1238-S}$
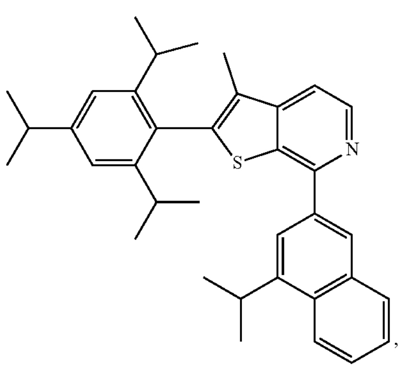
-continued
XX-$L_{A1275-S}$
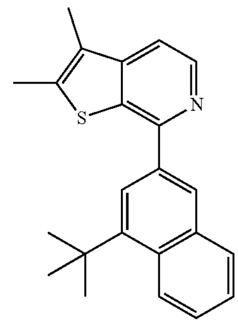
XX-$L_{A1295-S}$
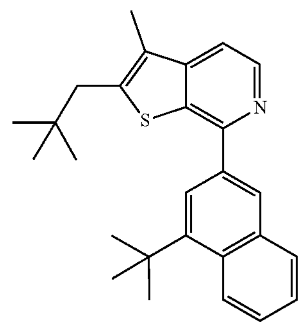
XX-$L_{A1306-S}$
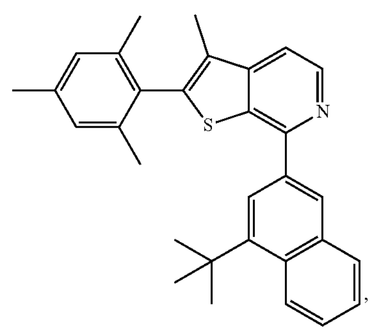
XX-$L_{A1307-S}$
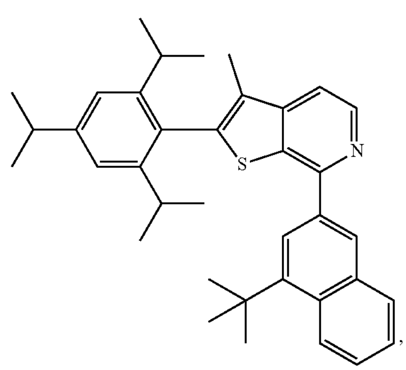

XX-$L_{A1430\text{-}S}$
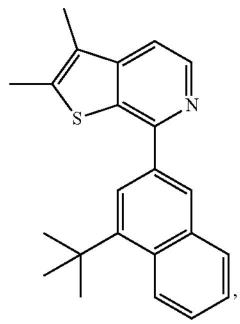
XX-$L_{A1433\text{-}S}$
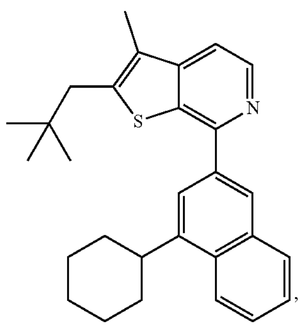
XX-$L_{A1444\text{-}S}$
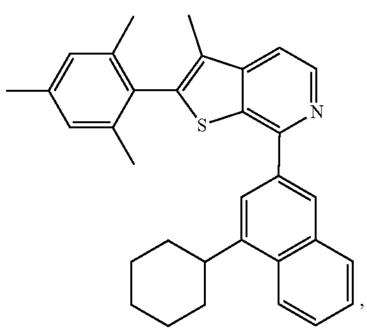
XX-$L_{A1445\text{-}S}$
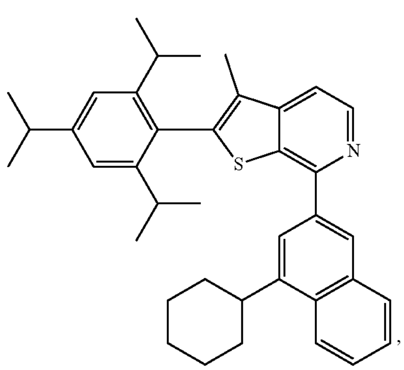
XX-$L_{A1219\text{-}S}$
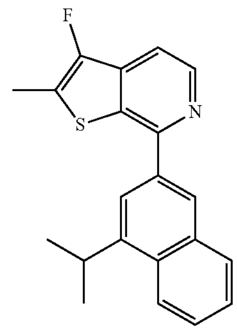
XX-$L_{A1288\text{-}S}$
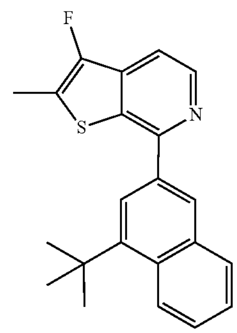
XX-$L_{A1426\text{-}S}$
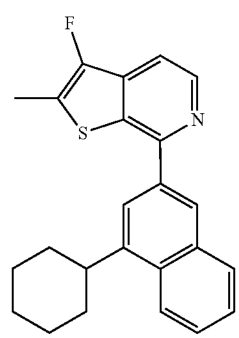
XX-$L_{A1218\text{-}S}$
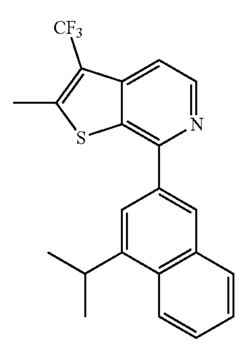

-continued
XX-$L_{A1287\text{-}S}$
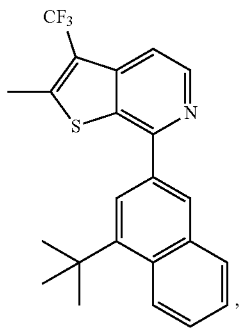
XX-$L_{A1425\text{-}S}$
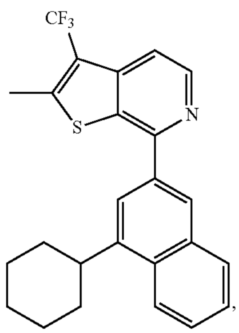
XXX-$L_{A1241\text{-}S}$
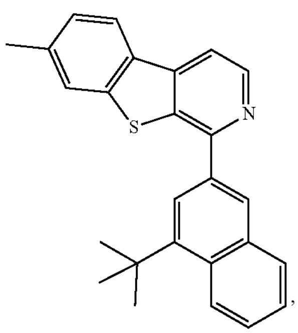
XXX-$L_{A1247\text{-}S}$
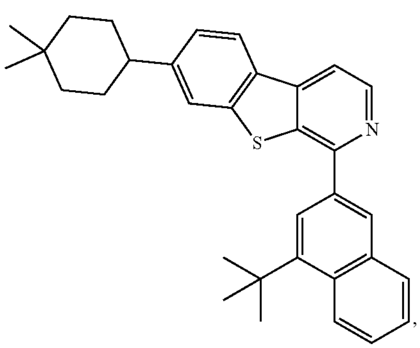
-continued
XXX-$L_{A1250\text{-}S}$
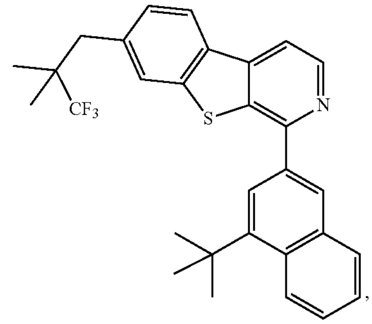
XXX-$L_{A1254\text{-}S}$
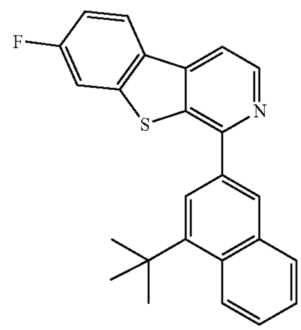
XXX-$L_{A1253\text{-}S}$
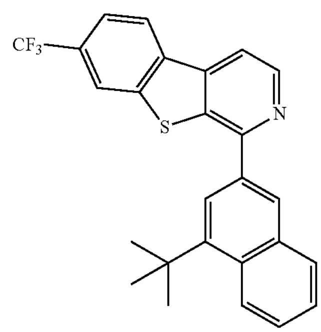
XXX-$L_{A1255\text{-}S}$
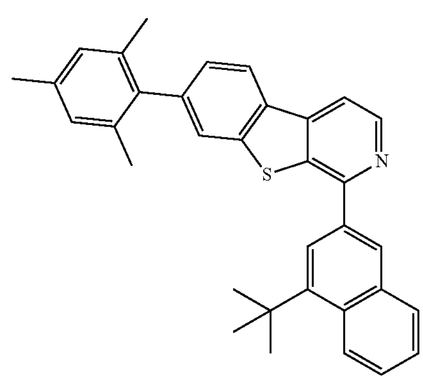

XXX-$L_{A1256\text{-}S}$
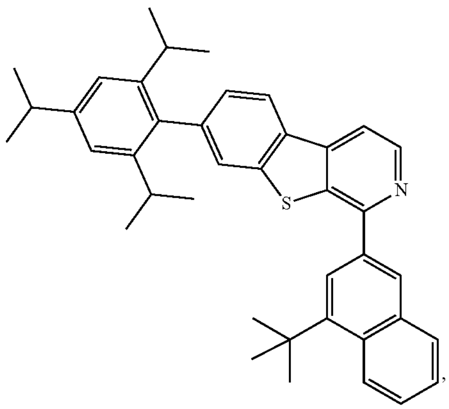
XXX-$L_{A1241\text{-}O}$
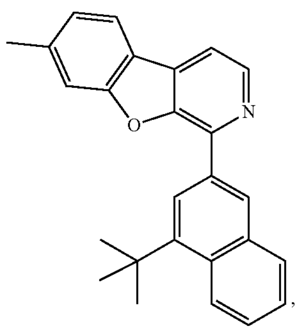
XXX-$L_{A1247\text{-}O}$
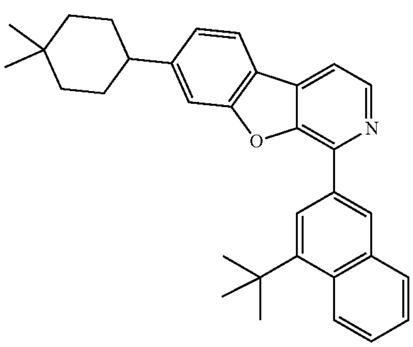
XXX-$L_{A1250\text{-}O}$
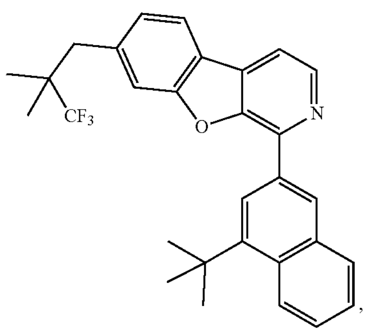
XXX-$L_{A1254\text{-}O}$
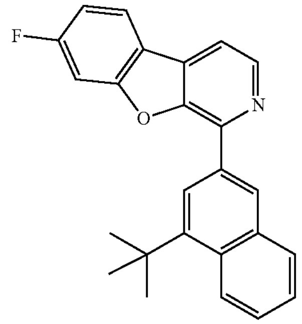
XXX-$L_{A1253\text{-}O}$
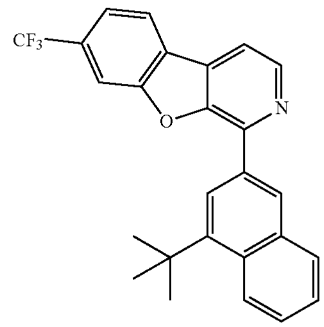
XXX-$L_{A1255\text{-}O}$
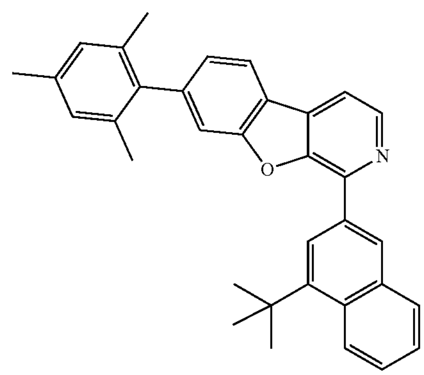
XXX-$L_{A1256\text{-}O}$
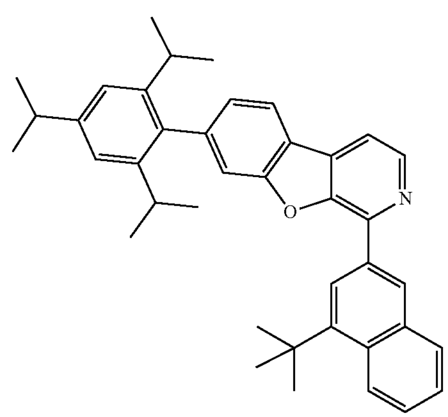

-continued
XXVIII-$L_{A1253-S}$
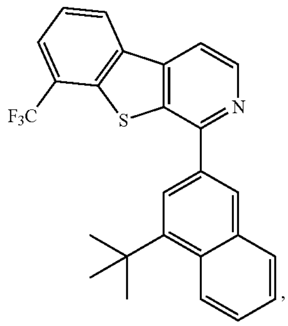
XXVIII-$L_{A1254-S}$
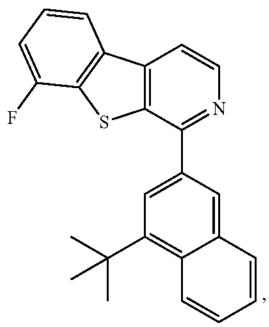
XXVIII-$L_{A1391-S}$
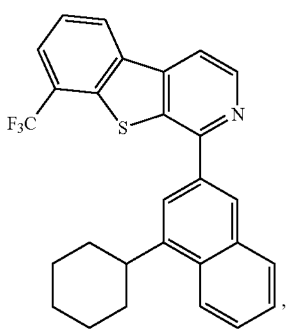
XXVIII-$L_{A1392-S}$
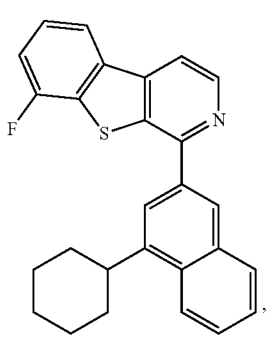
-continued
XXIX-$L_{A1253-S}$
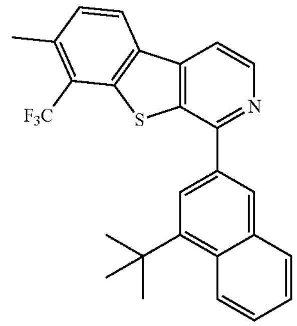
XXIX-$L_{A1254-S}$
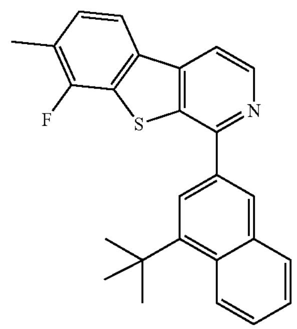
XXIX-$L_{A1391-S}$
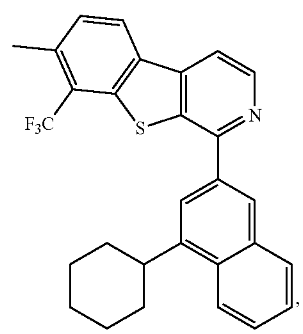
XXIX-$L_{A1292-S}$
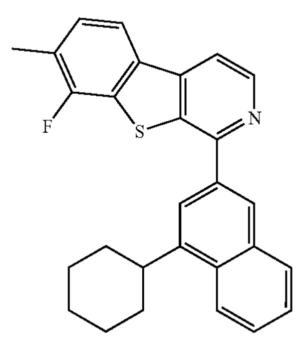

-continued
XXXI-$L_{A1253-S}$
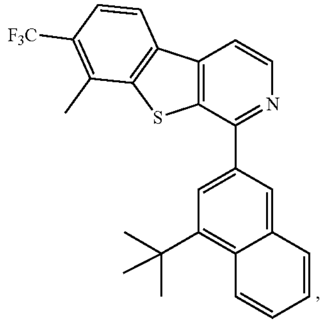
XXXI-$L_{A1254-S}$
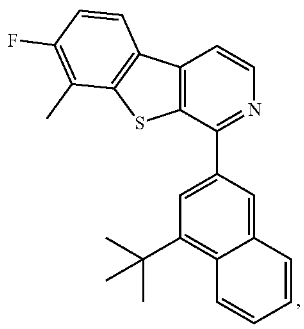
XXXI-$L_{A1391-S}$
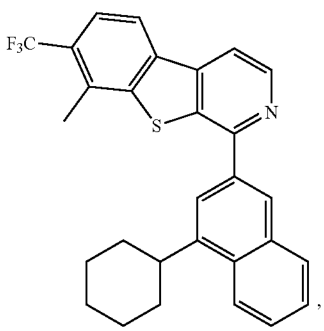
XXXI-$L_{A1392-S}$
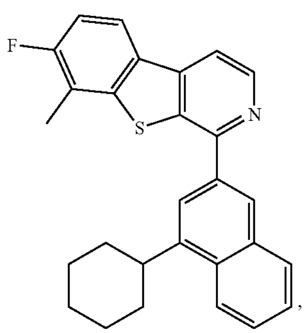
XX-$L_{A1275-S}$
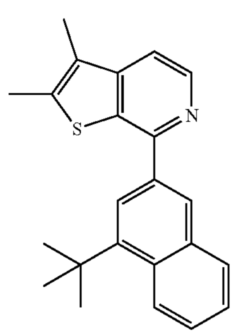
-continued
XX-$L_{A1301-S}$
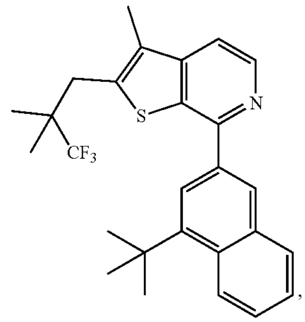
XX-$L_{A1306-S}$
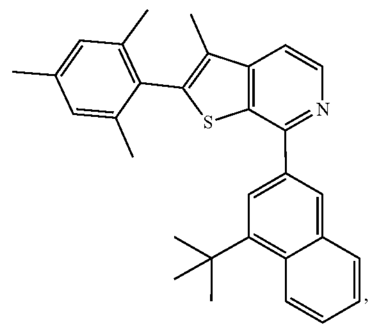
XX-$L_{A1307-S}$
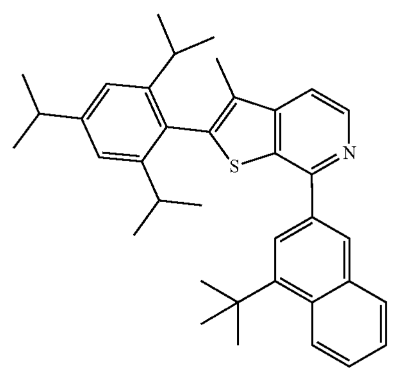
XX-$L_{A1308-S}$
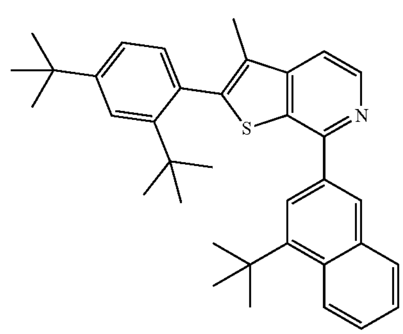

XX-$L_{A1181-S}$
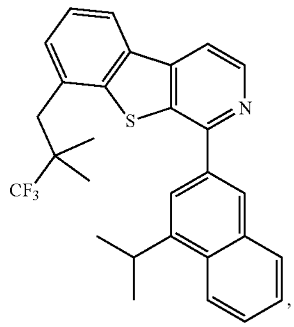
XXVIII-$L_{A1180-S}$
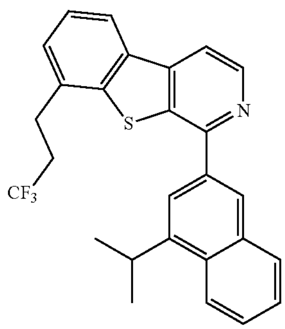
XXVIII-$L_{A1181-O}$
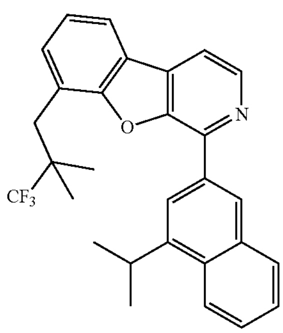
XXVIII-$L_{A1180-O}$
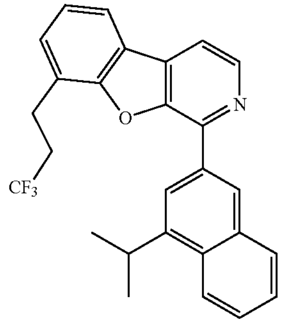
XXX-$L_{A1172-S}$
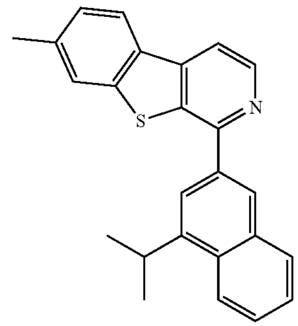
XXX-$L_{A1178-S}$
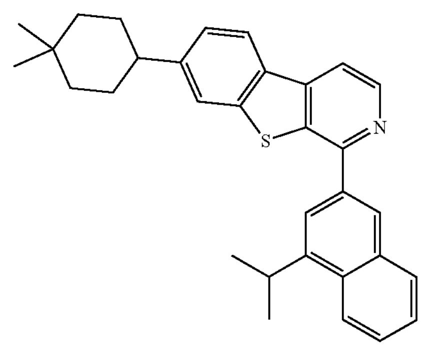
XXX-$L_{A1181-S}$
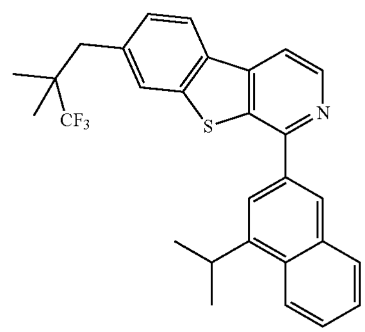
XXX-$L_{A1172-O}$
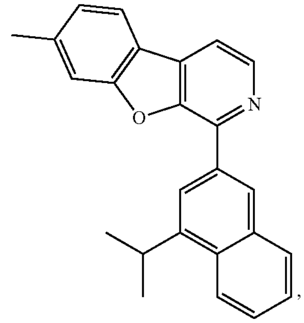

XXX-$L_{A1178-O}$
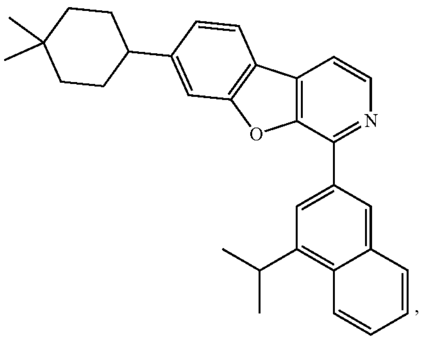
XXX-$L_{A1181-O}$
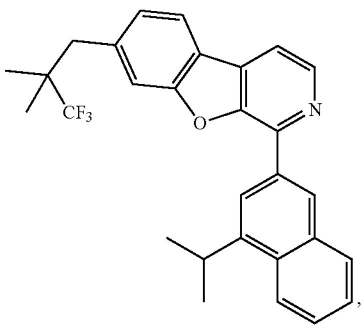
XXX-$L_{A1185-S}$
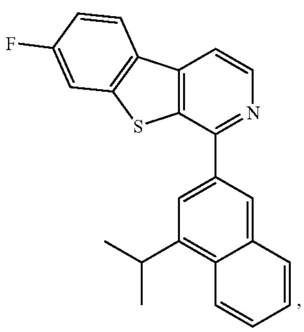
XXX-$L_{A1185-O}$
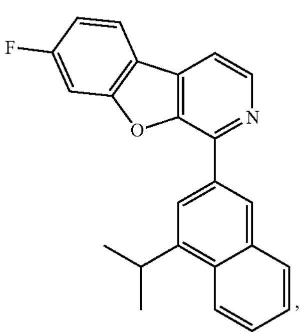
XXX-$L_{A1184-S}$
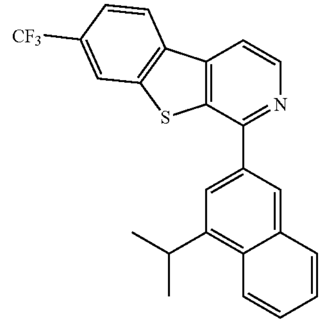
XXX-$L_{A1184-O}$
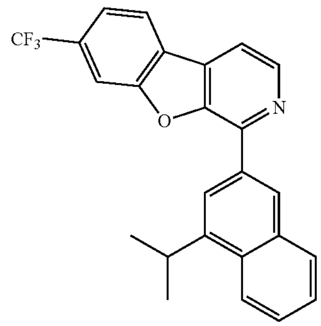
XXX-$L_{A1186-S}$
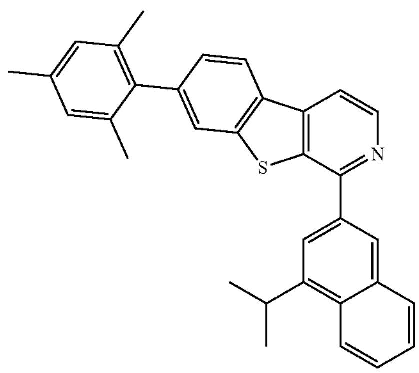
XXX-$L_{A1187-S}$
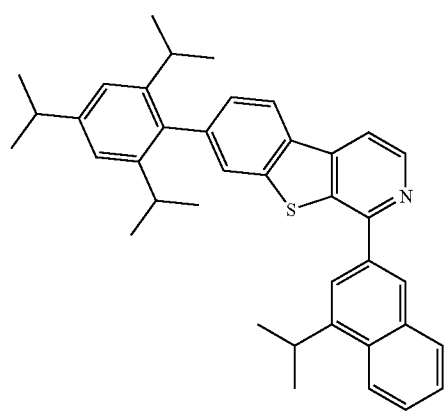

-continued
XXX-$L_{A1181\text{-}S}$
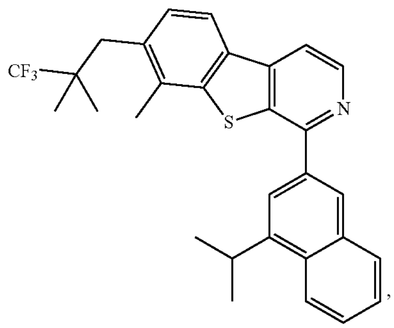
XXX-$L_{A1186\text{-}O}$
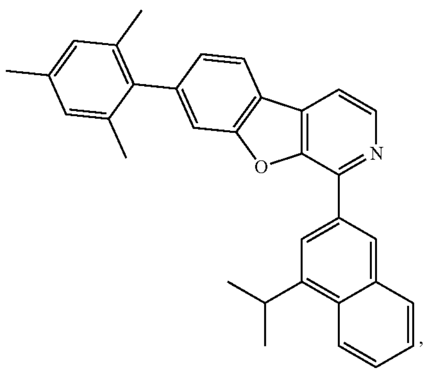
XXX-$L_{A1187\text{-}O}$
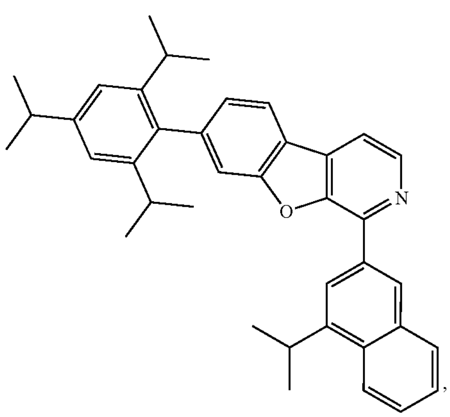
XXVIII-$L_{A1184\text{-}S}$
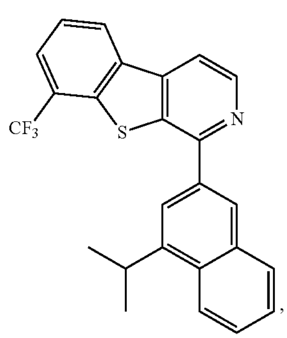
-continued
XXVIII-$L_{A1185\text{-}S}$
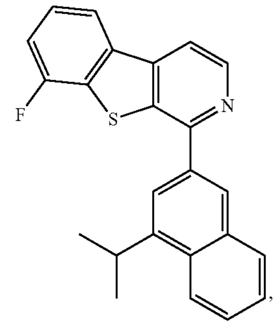
XXIX-$L_{A1184\text{-}S}$
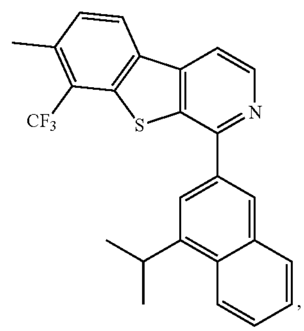
XXIX-$L_{A1185\text{-}S}$
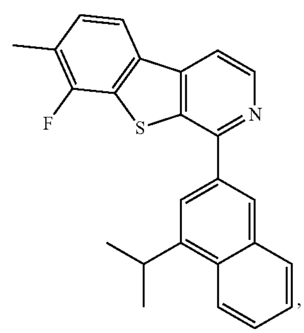
XXXI-$L_{A1184\text{-}S}$
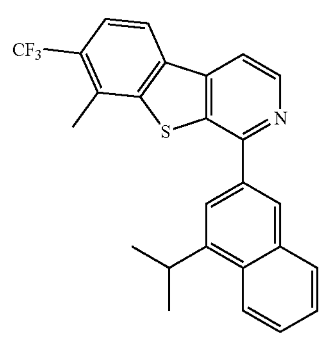
and -continued
XXXI-$L_{A1185-S}$
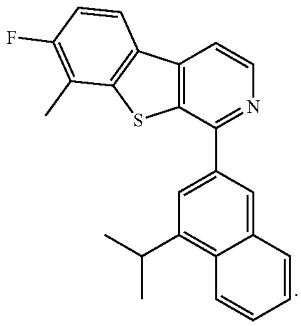
15. The compound of claim 1, wherein the compound is selected from the group consisting of:
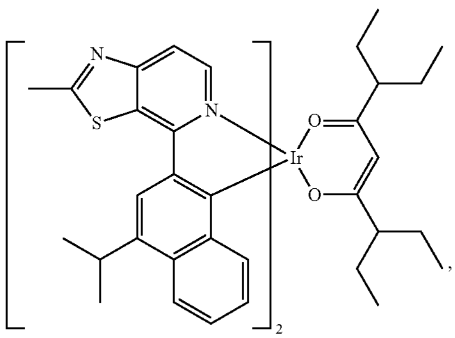
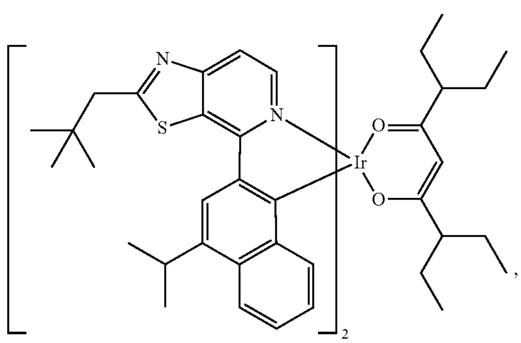
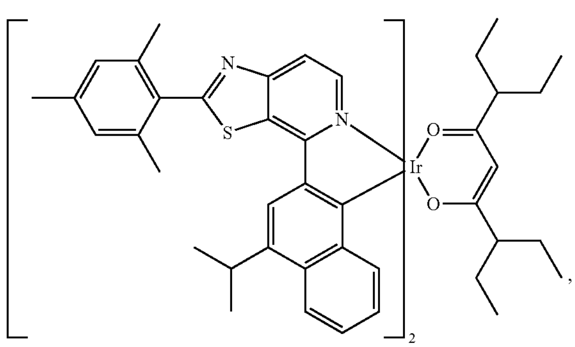
-continued
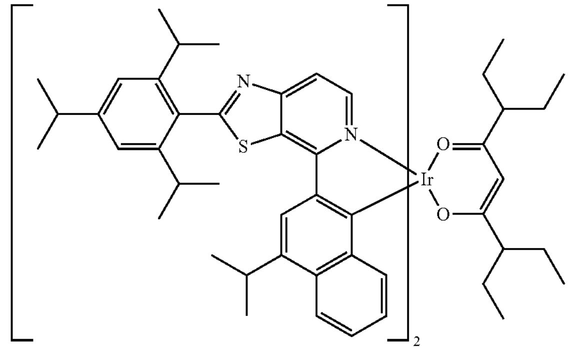
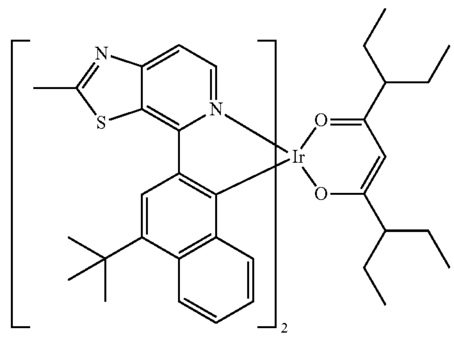
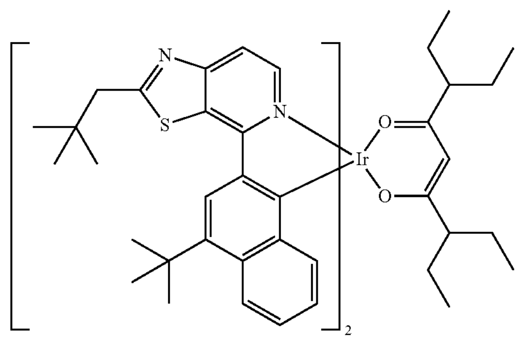
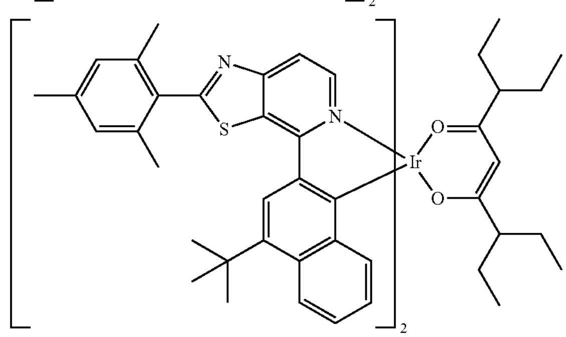
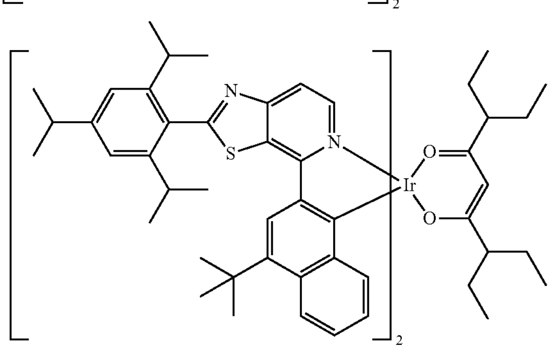

-continued
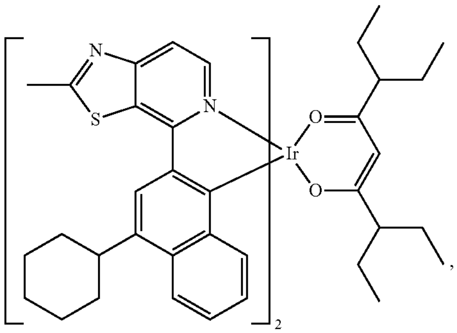
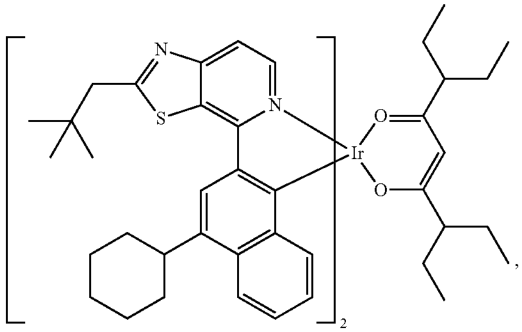
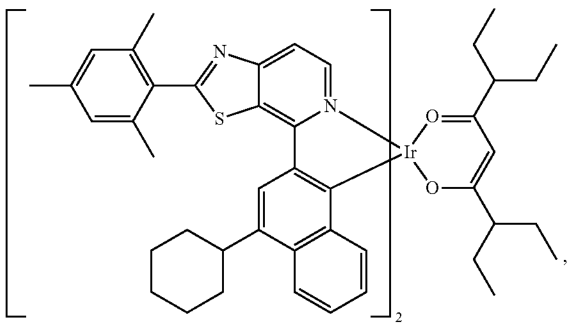
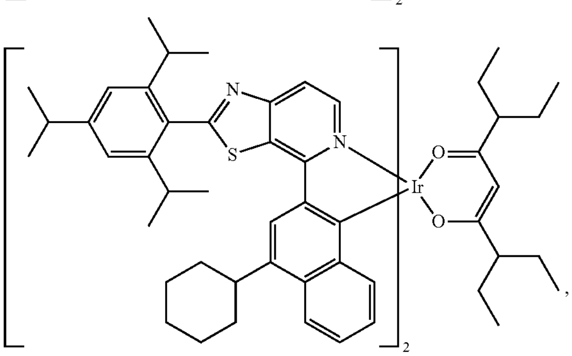
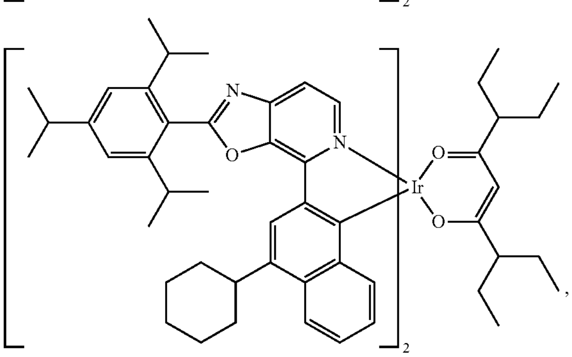
-continued
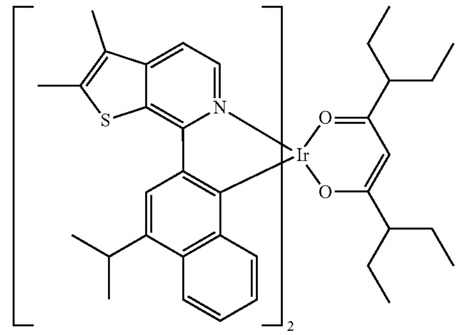
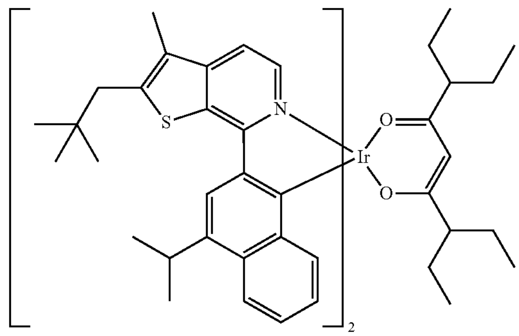
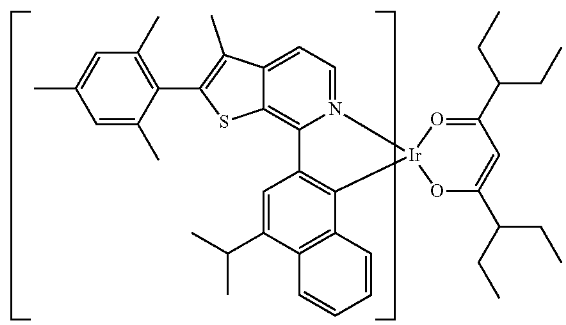
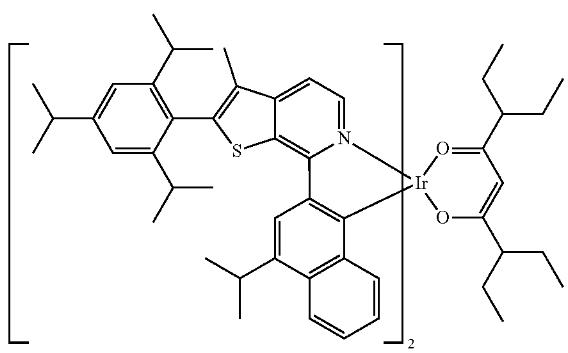
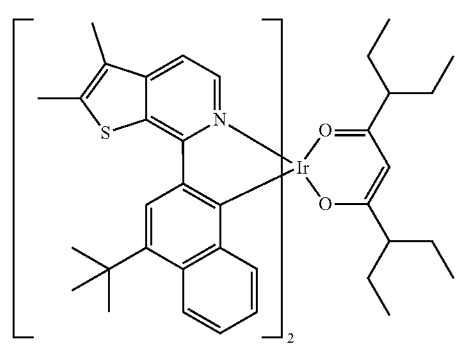

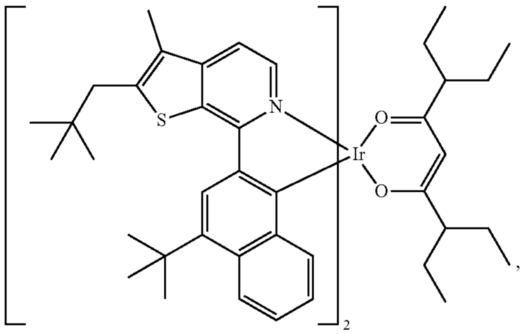
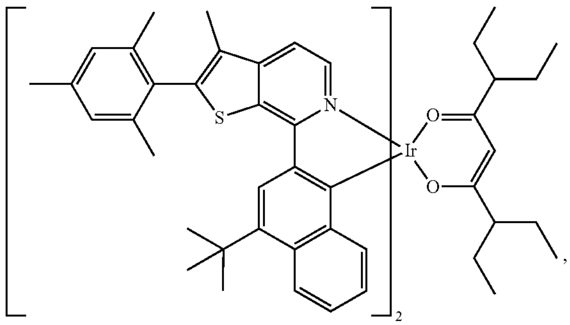
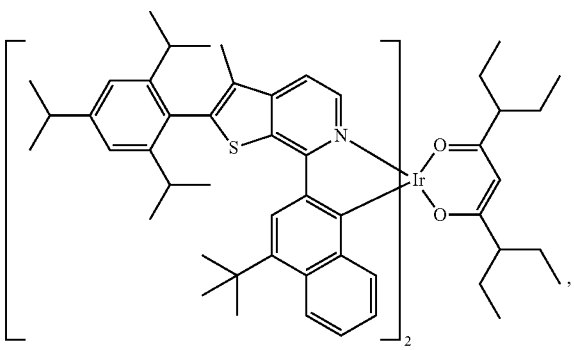
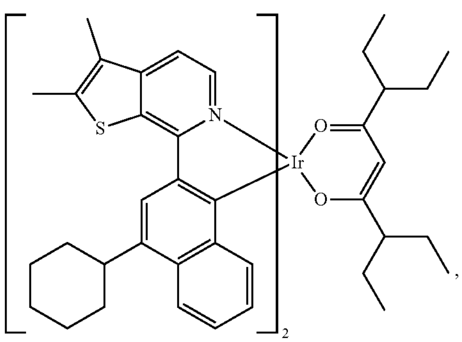
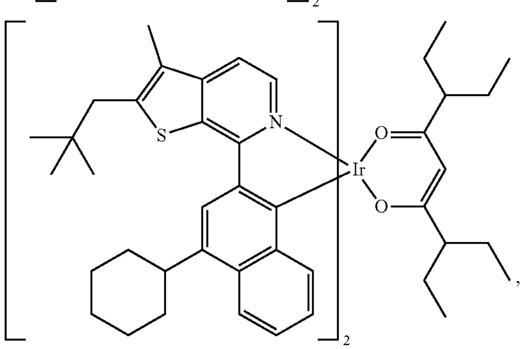
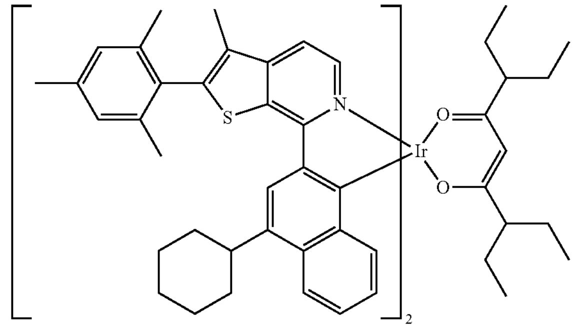
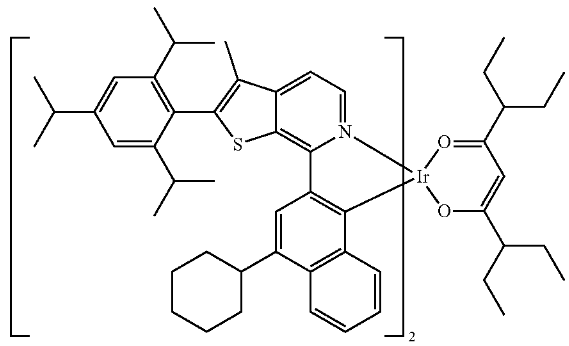
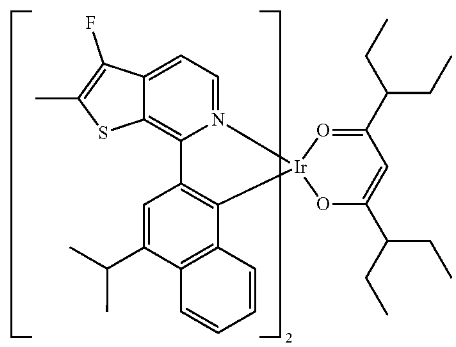
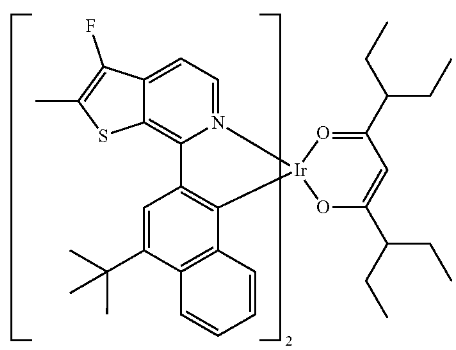
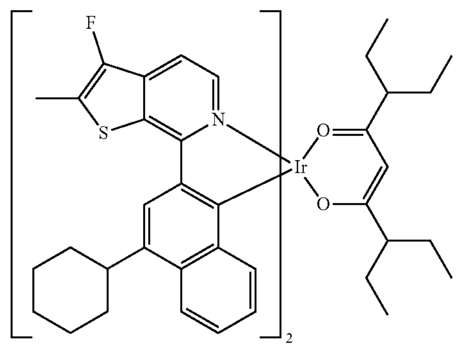

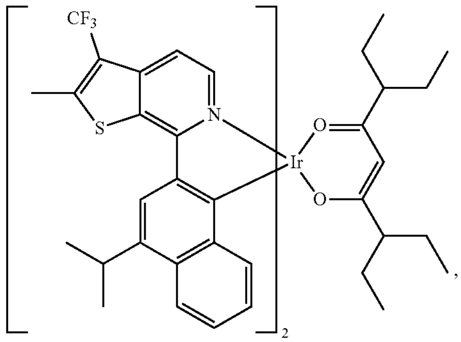
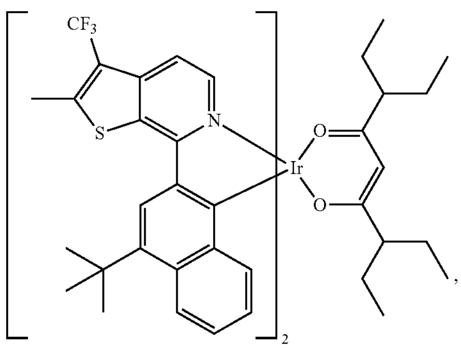
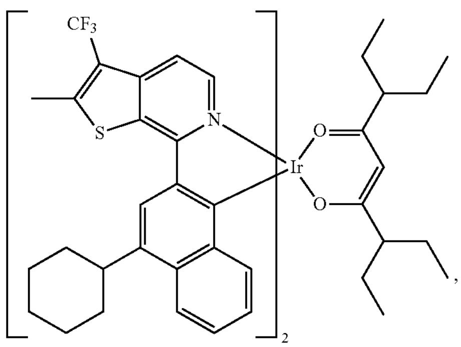
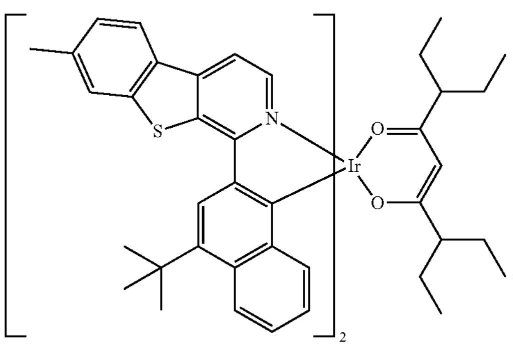
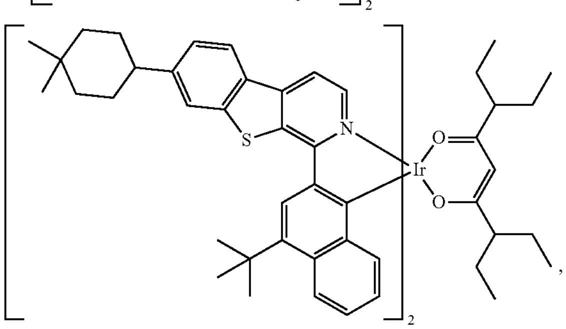
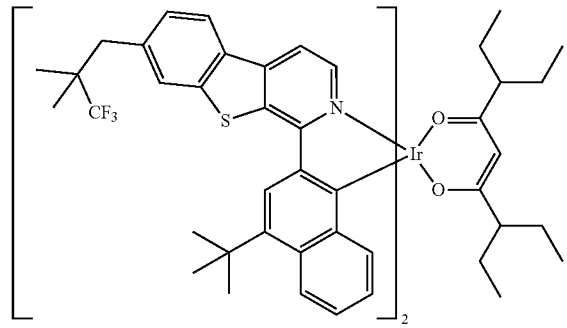
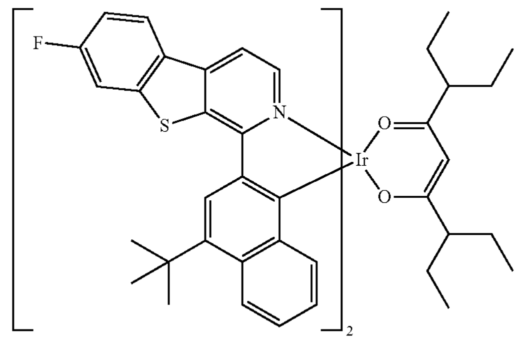
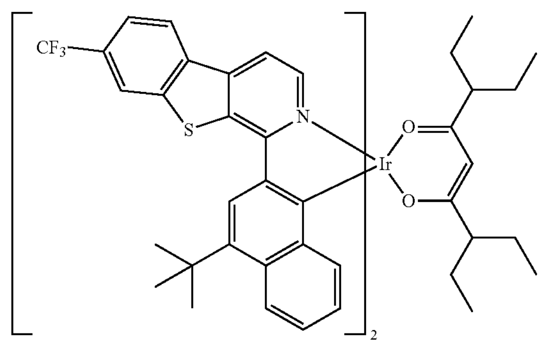
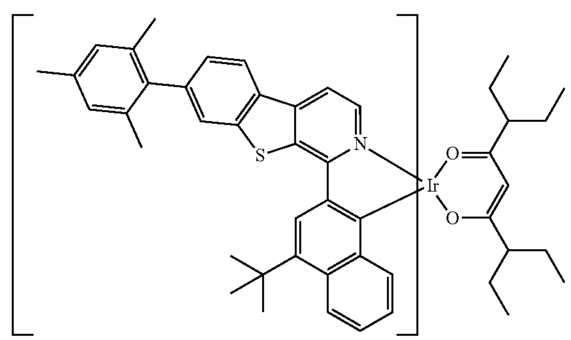
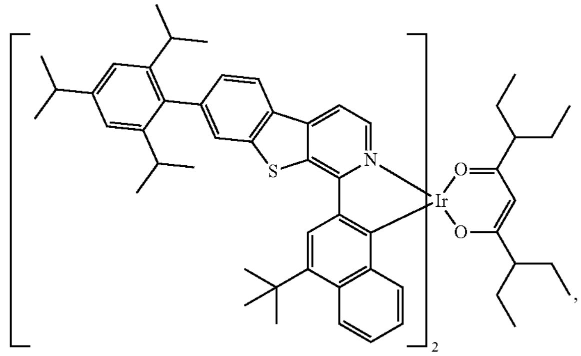

-continued
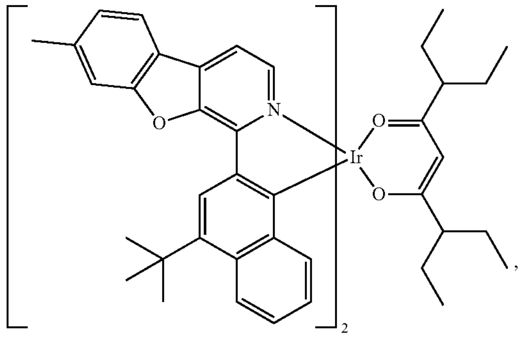
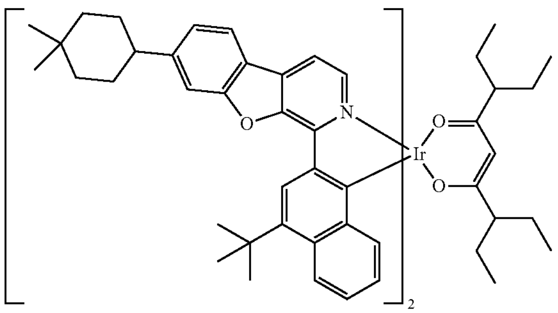
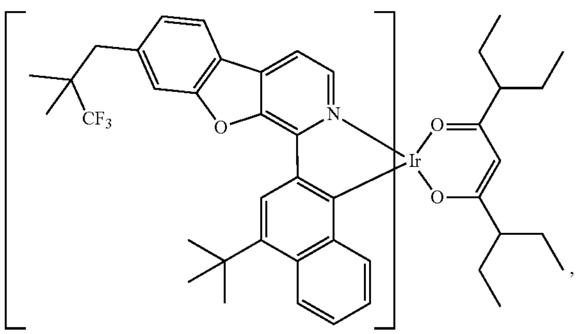
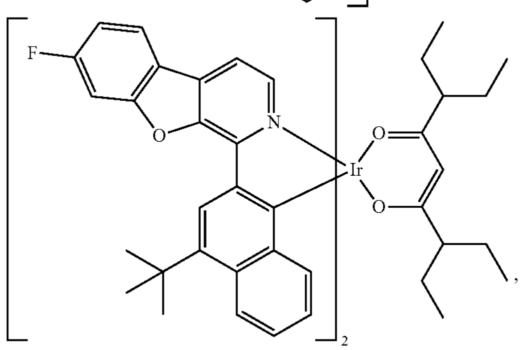
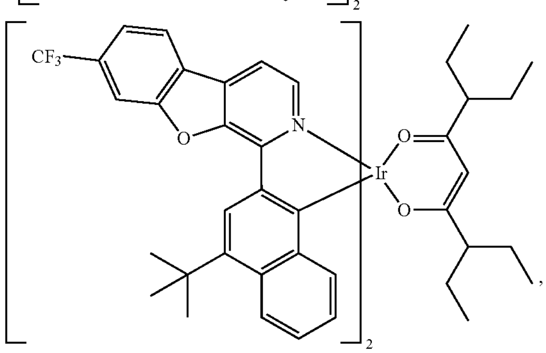
-continued
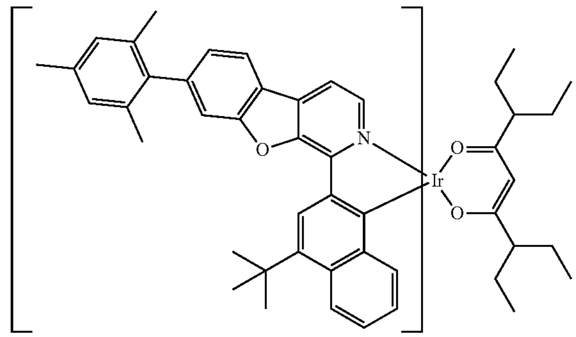
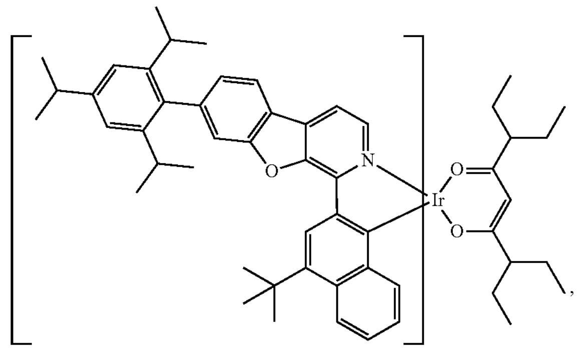
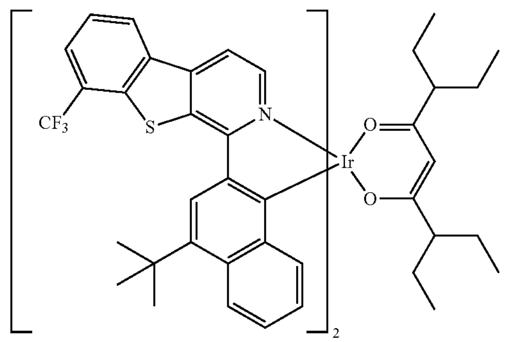
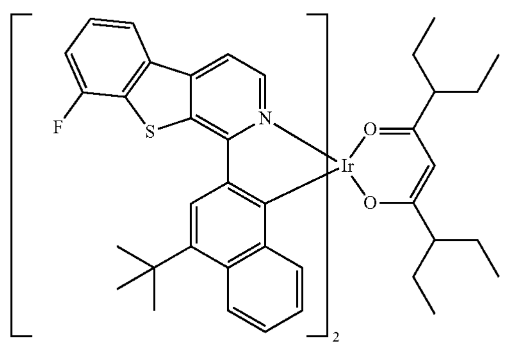
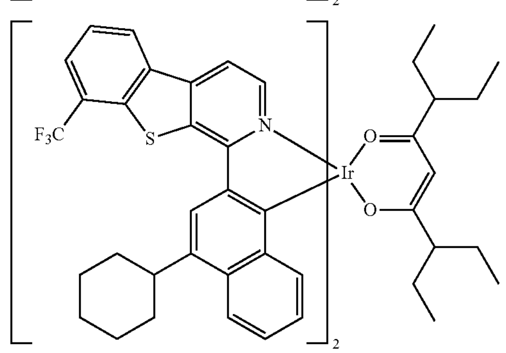

-continued
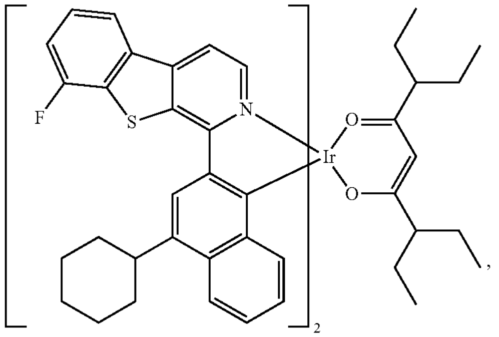
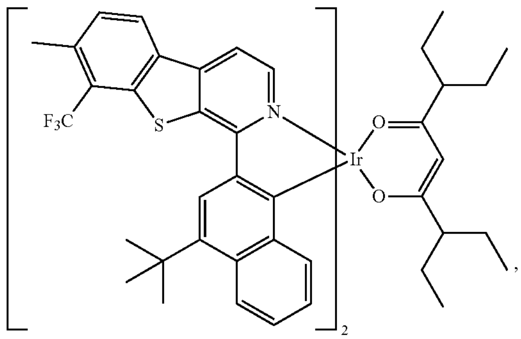
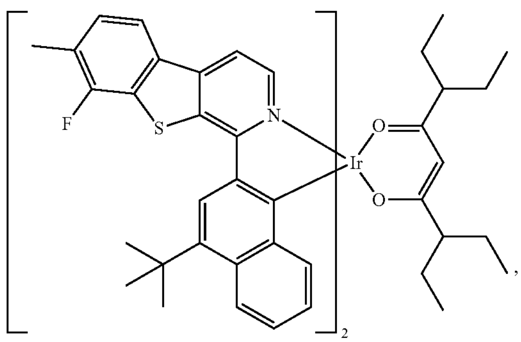
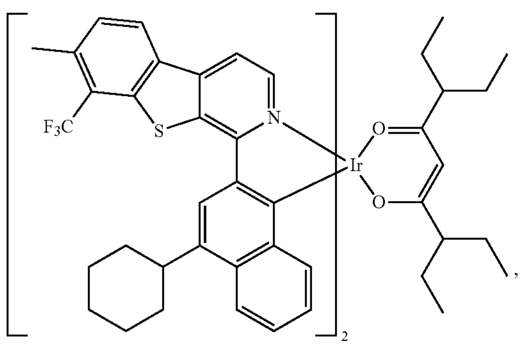
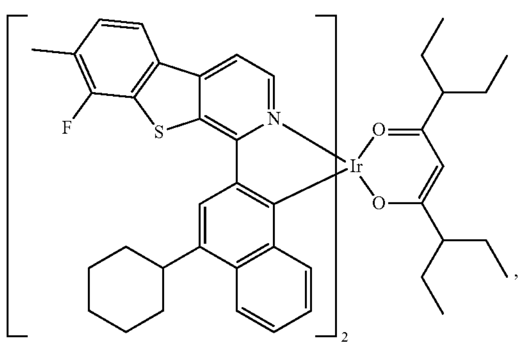
-continued
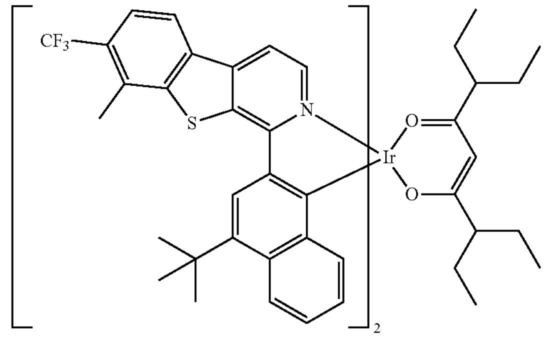
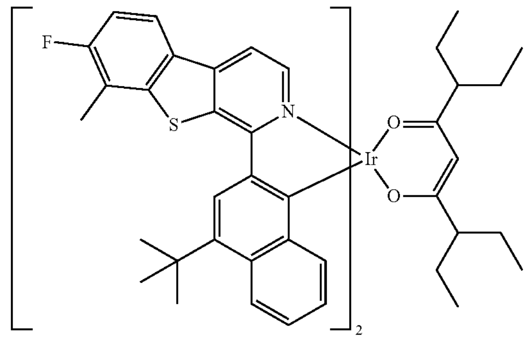
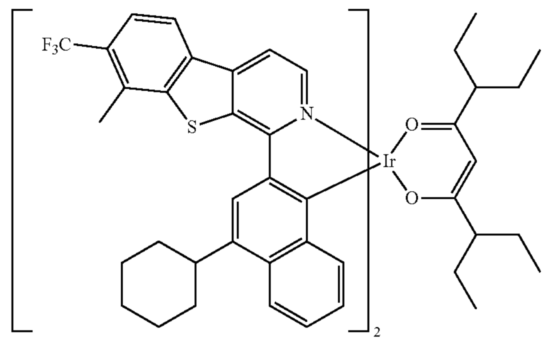
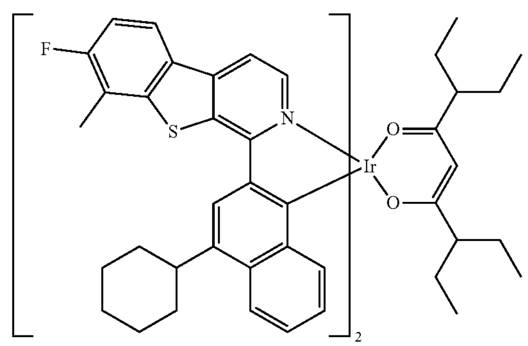
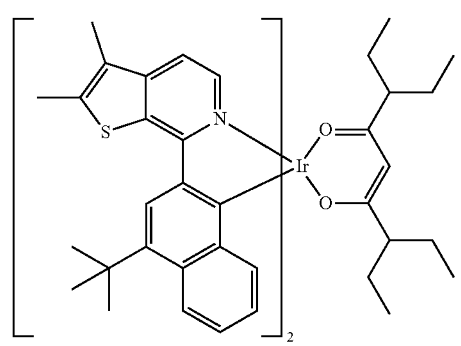

-continued
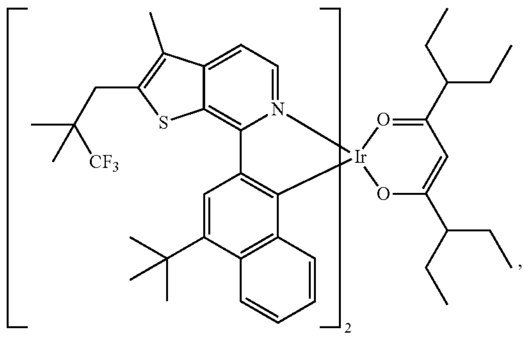
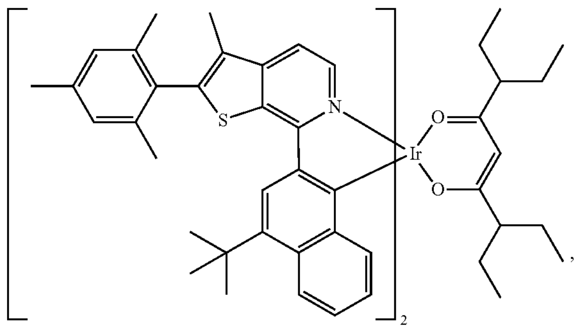
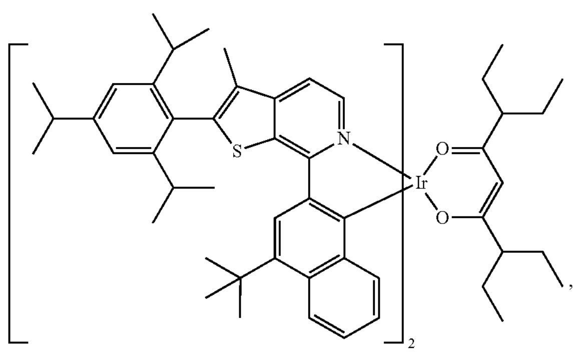
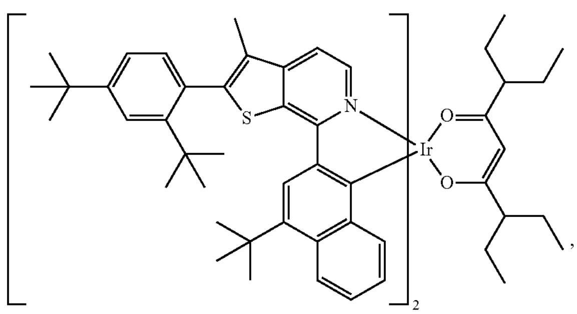
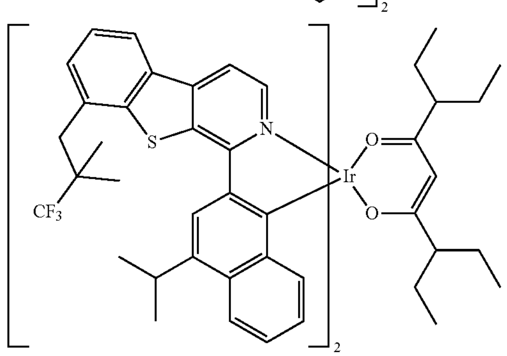
-continued
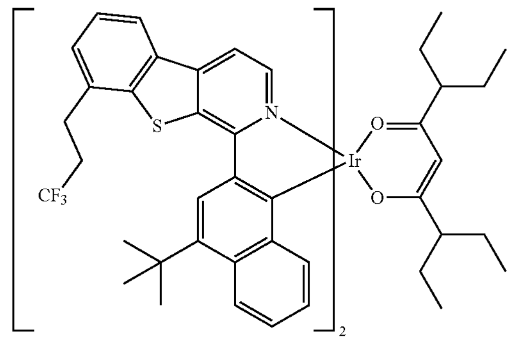
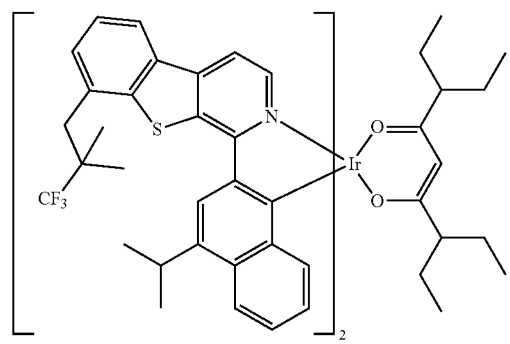
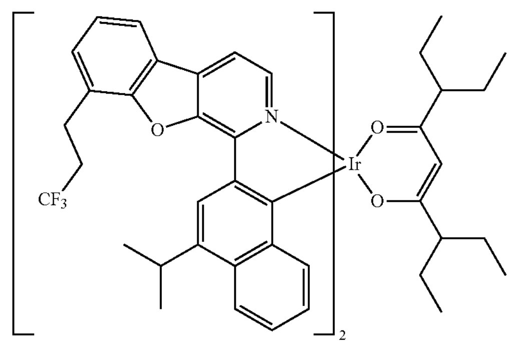
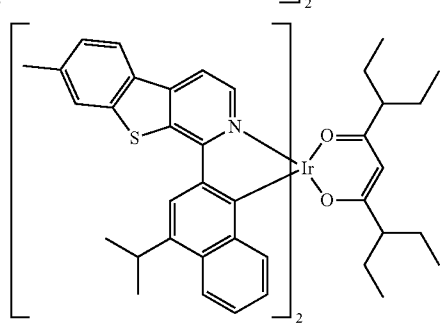
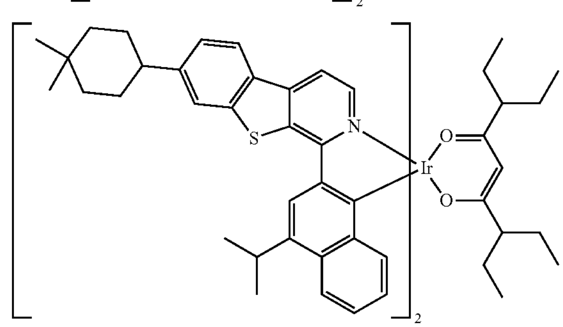

-continued
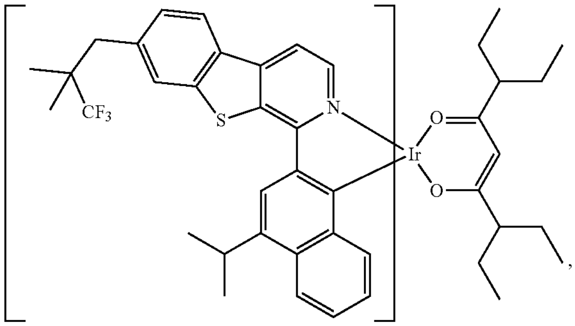
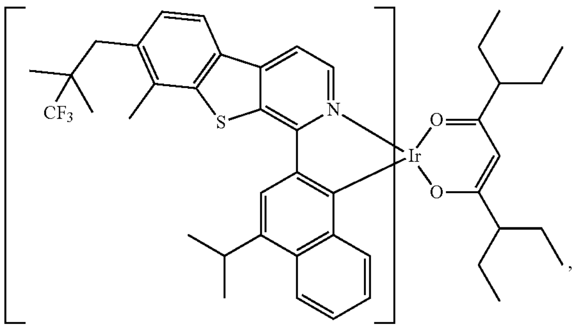
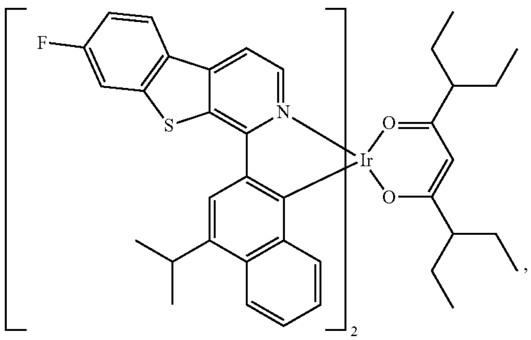
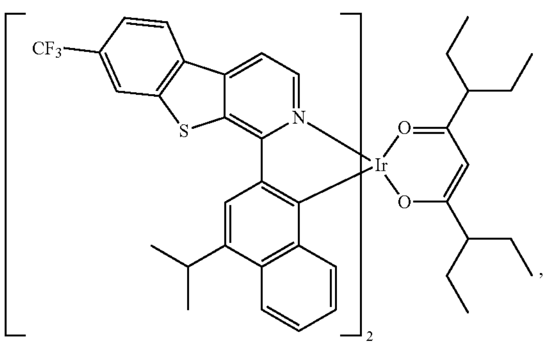
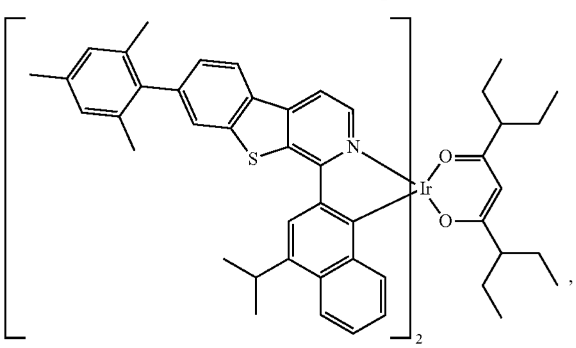
-continued
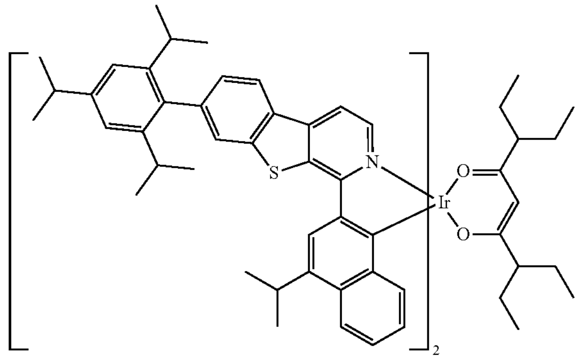
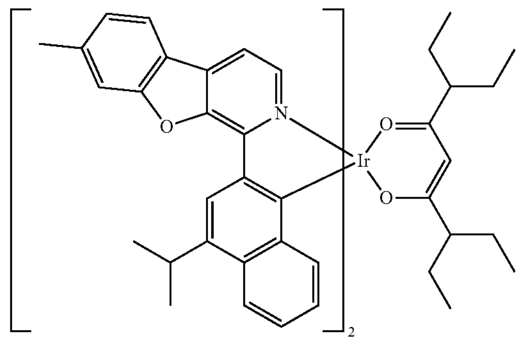
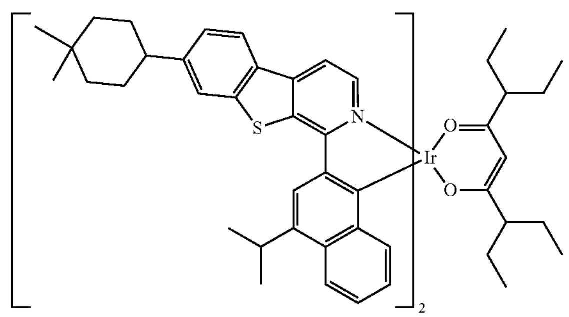
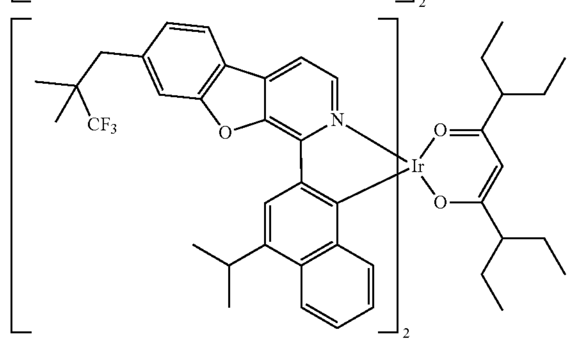
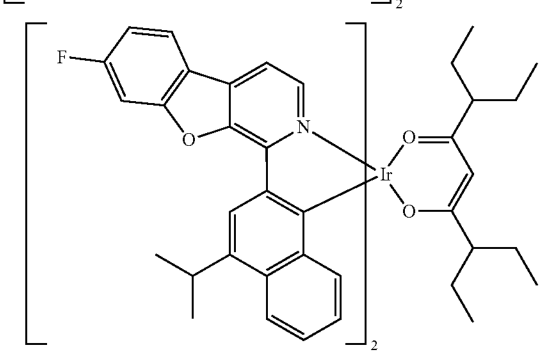

-continued
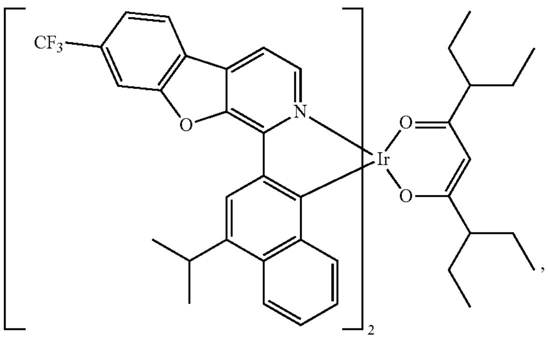
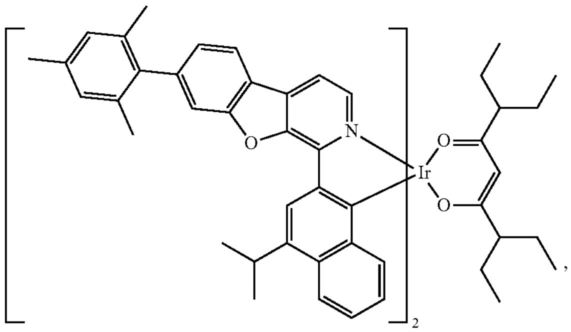
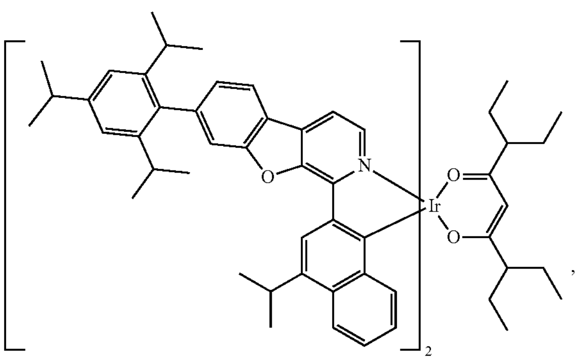
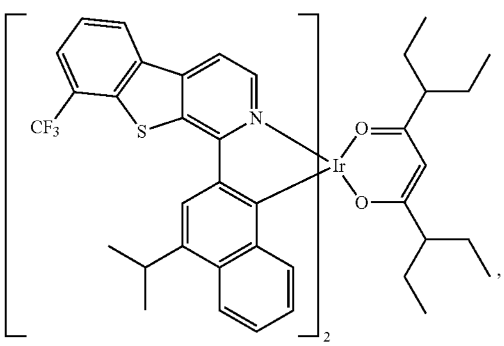
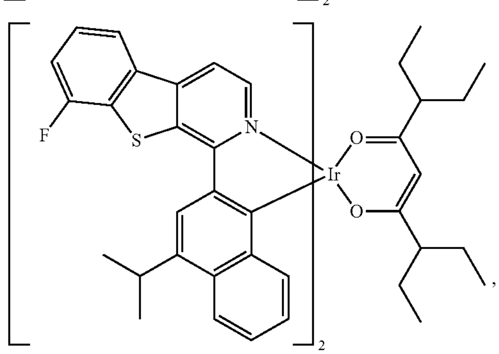
-continued
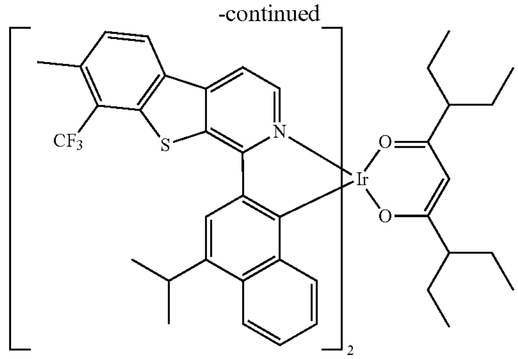
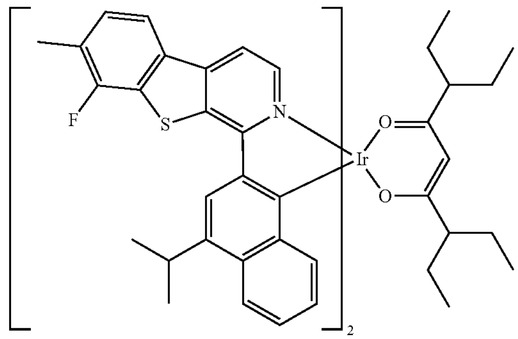
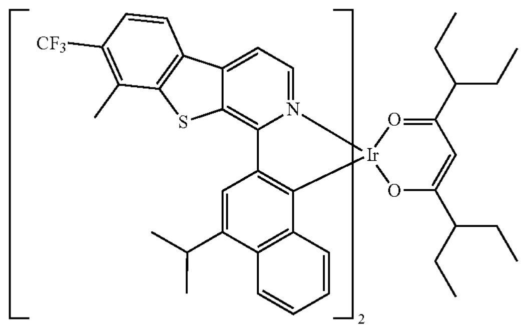
and
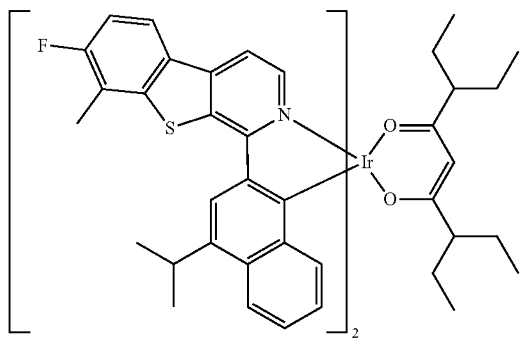
16. An organic light emitting device (OLED) comprising:
an anode;
a cathode; and
an organic layer, disposed between the anode and the cathode, comprising a compound comprising a ligand $L_A$ of Formula I:

Formula I

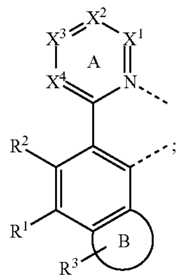

wherein Ring B represents a five- or six-membered aromatic ring;

wherein $R^3$ represents from none to the maximum number of substitutions;

wherein $X^1$, $X^2$, $X^3$, and $X^4$ are each independently a CR or N;

wherein at least two adjacent ones of $X^1$, $X^2$, $X^3$, and $X^4$ are CR and fused into a five-membered aromatic ring;

wherein $R^1$ is $CR^{11}R^{12}R^{13}$ or join with $R^2$ to form into a ring;

wherein R, $R^1$, $R^2$, $R^3$, $R^{11}$, $R^{12}$, and $R^{13}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein any two substituents among R, $R^1$, $R^2$, and $R^3$ are optionally joined to form into an aromatic ring;

wherein two substituents among $R^{11}$, $R^{12}$, and $R^{13}$ are optionally joined to form into a ring;

wherein $L_A$ is coordinated to a metal M;

wherein $L_A$ is optionally linked with other ligands to comprise a tridentate, tetradentate, pentadentate, or hexadentate ligand; and wherein M is optionally coordinated to other ligands.

17. The OLED of claim 16, wherein the organic layer is an emissive layer and the compound is an emissive dopant or a non-emissive dopant.

18. The OLED of claim 16, wherein the organic layer further comprises a host, wherein host comprises at least one chemical group selected from the group consisting of carbazole, dibenzothiophene, dibenzofuran, dibenzoselenophene, azacarbazole, aza-dibenzothiophene, aza-dibenzofuran, and aza-dibenzoselenophene.

19. The OLED of claim 16, wherein the organic layer further comprises a host, wherein the host is selected from the group consisting of:

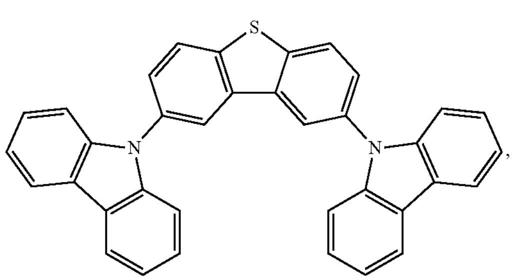

-continued

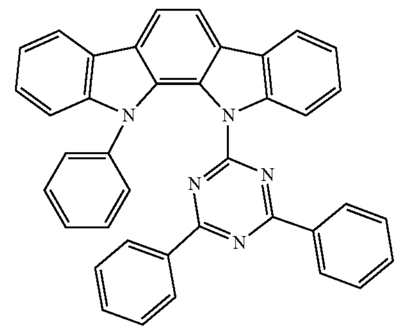

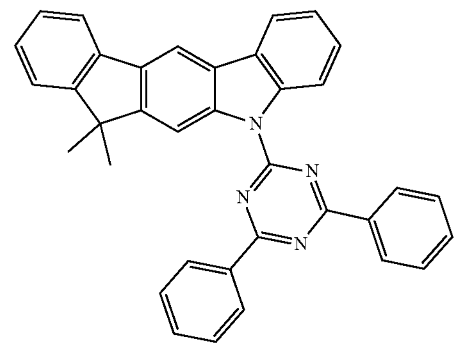

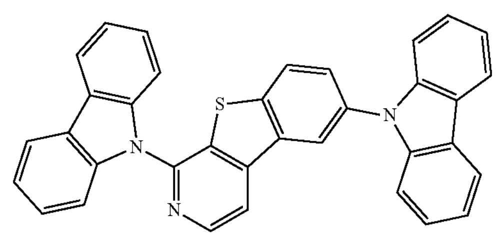

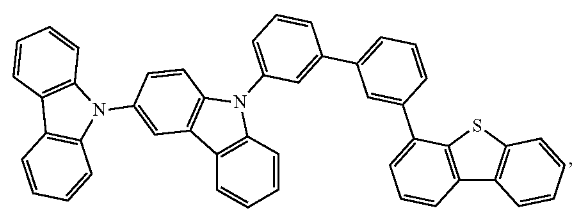

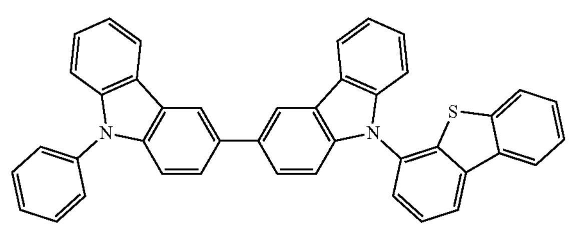

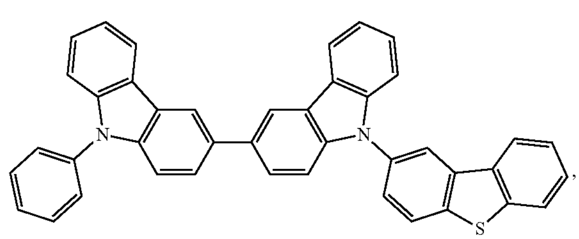

-continued
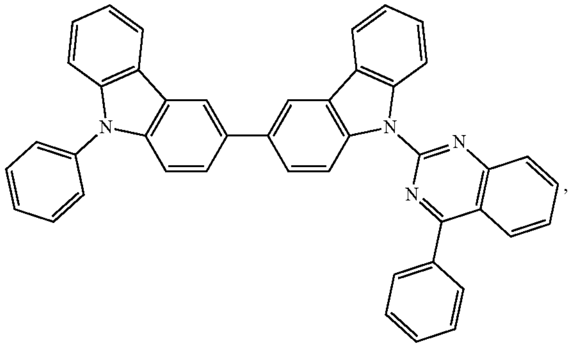
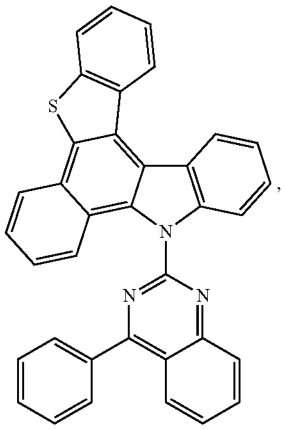
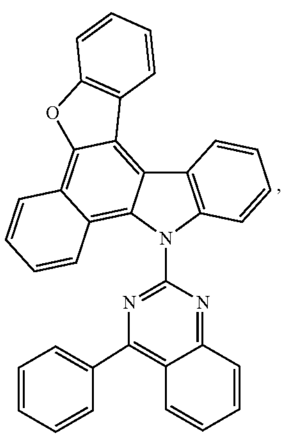
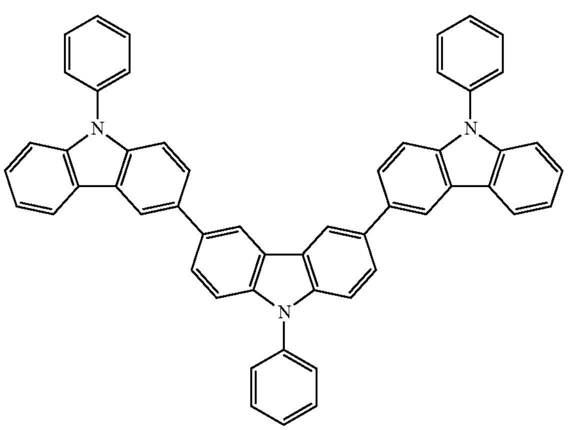
-continued
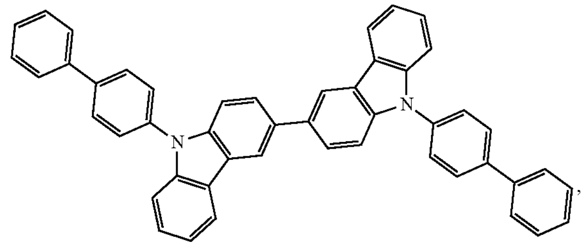
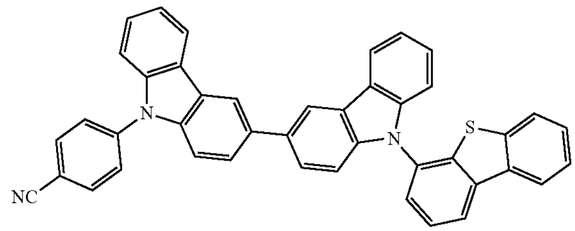
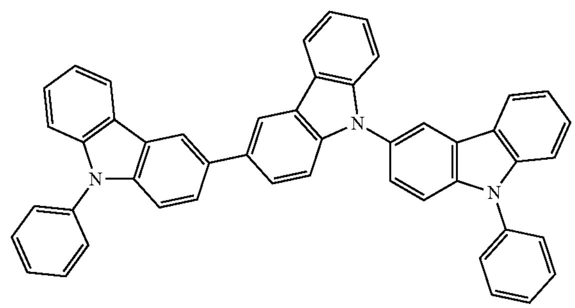
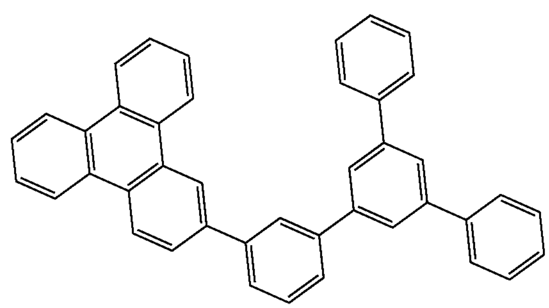
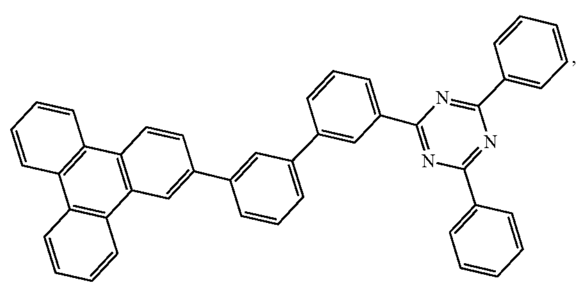
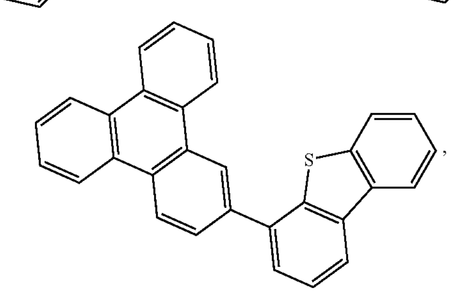

-continued

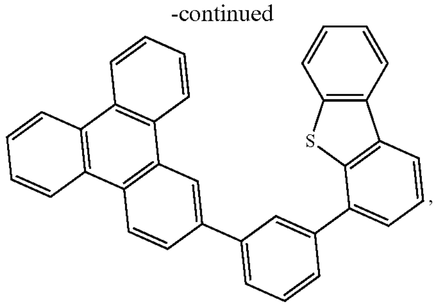

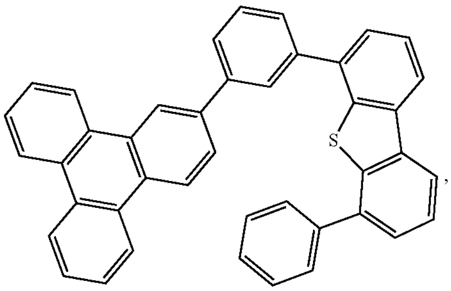

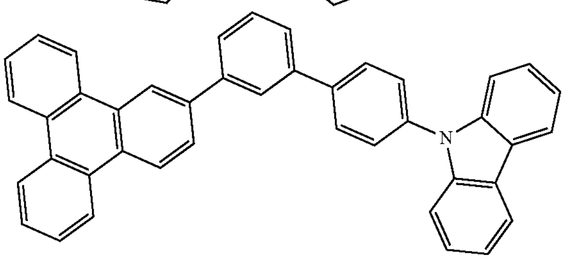

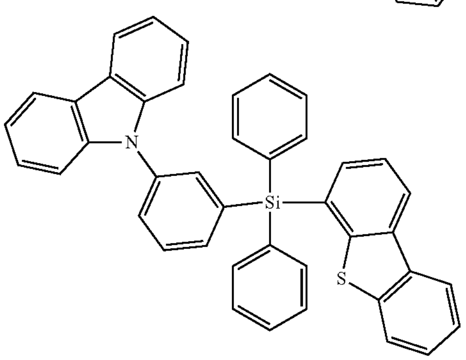

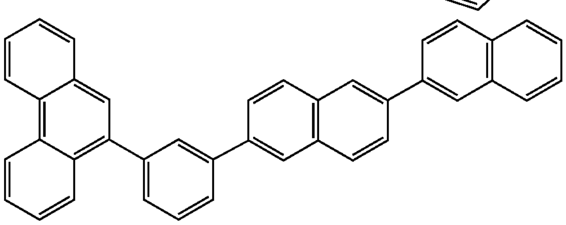

and combinations thereof.

20. A consumer product comprising an organic light emitting device comprising:

an anode;

a cathode; and an organic layer, disposed between the anode and the cathode, comprising a compound comprising a ligand $L_A$ of Formula I:

Formula I

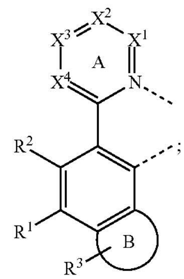

wherein Ring B represents a five- or six-membered aromatic ring;

wherein $R^3$ represents from none to the maximum number of substitutions;

wherein $X^1$, $X^2$, $X^3$, and $X^4$ are each independently a CR or N;

wherein at least two adjacent ones of $X^1$, $X^2$, $X^3$, and $X^4$ are CR and fused into a five-membered aromatic ring;

wherein $R^1$ is $CR^{11}R^{12}R^{13}$ or join with $R^2$ to form into a ring;

wherein R, $R^1$, $R^2$, $R^3$, $R^{11}$, $R^{12}$, and $R^{13}$ are each independently selected from the group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof;

wherein any two substituents among R, $R^1$, $R^2$, and $R^3$ are optionally joined to form into an aromatic ring;

wherein two substituents among $R^{11}$, $R^{12}$, and $R^{13}$ are optionally joined to form into a ring;

wherein $L_A$ is coordinated to a metal M;

wherein $L_A$ is optionally linked with other ligands to comprise a tridentate, tetradentate, pentadentate, or hexadentate ligand; and wherein M is optionally coordinated to other ligands.

* * * * *

UNITED STATES PATENT AND TRADEMARK OFFICE

CERTIFICATE OF CORRECTION

PATENT NO. : 11,711,969 B2
APPLICATION NO. : 17/343138
DATED : July 25, 2023
INVENTOR(S) : Pierre-Luc T. Boudreault, Bert Alleyne and Zhiqiang Ji It is certified that error appears in the above-identified patent and that said Letters Patent is hereby corrected as shown below:

In the Claims

In Claim 8, Column 300, Line 21, please delete "Formula XXVII" and insert --Formula XXVIII--

Signed and Sealed this
Twenty-eighth Day of November, 2023

Katherine Kelly Vidal

Katherine Kelly Vidal
*Director of the United States Patent and Trademark Office*